US008466533B2

(12) United States Patent
Tian et al.

(10) Patent No.: US 8,466,533 B2
(45) Date of Patent: Jun. 18, 2013

(54) MATERIALS, SYSTEMS AND METHODS FOR OPTOELECTRONIC DEVICES

(75) Inventors: Hui Tian, Cupertino, CA (US); Edward Sargent, Toronto (CA)

(73) Assignee: InVisage Technologies, Inc., Menlo Park, CA (US)

( * ) Notice: Subject to any disclaimer, the term of this patent is extended or adjusted under 35 U.S.C. 154(b) by 0 days.

(21) Appl. No.: 13/214,835

(22) Filed: Aug. 22, 2011

(65) Prior Publication Data

US 2012/0056074 A1 Mar. 8, 2012

Related U.S. Application Data

(63) Continuation of application No. 12/728,181, filed on Mar. 19, 2010, now Pat. No. 8,004,057, which is a continuation of application No. 12/106,256, filed on Apr. 18, 2008, now Pat. No. 7,923,801.

(60) Provisional application No. 60/912,581, filed on Apr. 18, 2007, provisional application No. 60/958,846, filed on Jul. 9, 2007, provisional application No. 60/970,211, filed on Sep. 5, 2007, provisional application No. 61/026,440, filed on Feb. 5, 2008, provisional application No. 61/026,650, filed on Feb. 6, 2008, provisional application No. 61/028,481, filed on Feb. 13, 2008, provisional application No. 61/046,379, filed on Apr. 18, 2008.

(51) Int. Cl.
*H01L 31/00* (2006.01)

(52) U.S. Cl.
USPC .... 257/440; 257/445; 257/463; 257/E31.111; 257/E27.132; 257/E27.139; 438/73; 438/74; 250/370.08

(58) Field of Classification Search
USPC .......... 257/440, 445, 463, E31.111, E27.132, 257/E27.139; 438/73, 74; 250/370.08
See application file for complete search history.

(56) References Cited

U.S. PATENT DOCUMENTS

| | | | |
|---|---|---|---|
| 4,644,406 | A | 2/1987 | Nishigaki et al. |
| 4,866,291 | A | 9/1989 | Shimada et al. |

(Continued)

FOREIGN PATENT DOCUMENTS

| | | | |
|---|---|---|---|
| JP | 2011528865 | A | 11/2011 |
| WO | WO-2008131313 | A2 | 10/2008 |
| WO | WO-2009129540 | A1 | 10/2009 |
| WO | WO-2010082955 | A1 | 7/2010 |

OTHER PUBLICATIONS

US 8,022,391, 9/2011, Sargent et al. (withdrawn).

(Continued)

*Primary Examiner* — Tu-Tu Ho
(74) *Attorney, Agent, or Firm* — Schwegman Lundberg & Woessner, P.A.

(57) ABSTRACT

A photodetector is described along with corresponding materials, systems, and methods. The photodetector comprises an integrated circuit and at least two optically sensitive layers. A first optically sensitive layer is over at least a portion of the integrated circuit, and a second optically sensitive layer is over the first optically sensitive layer. Each optically sensitive layer is interposed between two electrodes. The two electrodes include a respective first electrode and a respective second electrode. The integrated circuit selectively applies a bias to the electrodes and reads signals from the optically sensitive layers. The signal is related to the number of photons received by the respective optically sensitive layer.

2 Claims, 99 Drawing Sheets

U.S. PATENT DOCUMENTS 4,882,295 A 11/1989 Czubatyj et al.
5,057,682 A 10/1991 Michon et al.
5,202,579 A 4/1993 Fujii et al.
5,225,921 A 7/1993 Audas et al.
5,399,880 A 3/1995 Chand
5,462,898 A 10/1995 Chen et al.
5,567,956 A 10/1996 Yamanobe et al.
5,608,255 A 3/1997 Martin et al.
5,972,178 A 10/1999 Narasimhan et al.
6,163,029 A 12/2000 Yamada et al.
6,300,612 B1 10/2001 Yu
6,373,117 B1 4/2002 Thiel
6,483,116 B1 11/2002 Kozlowski et al.
6,657,195 B1 * 12/2003 Martin et al. ............ 250/339.01
6,660,381 B2 12/2003 Halas et al.
6,710,366 B1 3/2004 Lee et al.
6,794,265 B2 9/2004 Lee et al.
6,819,845 B2 11/2004 Lee et al.
6,878,871 B2 4/2005 Scher et al.
6,961,499 B2 11/2005 Lee et al.
7,005,669 B1 2/2006 Lee
7,020,372 B2 3/2006 Lee et al.
7,042,003 B2 5/2006 Jang et al.
7,099,056 B1 8/2006 Kindt
7,358,525 B2 4/2008 Lee
7,402,832 B2 7/2008 Lee
7,442,320 B2 10/2008 Lee
7,488,986 B2 2/2009 Yamazaki et al.
7,566,899 B2 7/2009 Chabinyc et al.
7,598,482 B1 10/2009 Verhulst et al.
7,641,815 B2 1/2010 Varadarajan et al.
7,816,866 B2 10/2010 Nakajima et al.
7,923,801 B2 4/2011 Tian et al.
8,004,057 B2 8/2011 Tian et al.
8,013,412 B2 9/2011 Tian
8,269,260 B2 9/2012 Tian et al.
8,269,302 B2 9/2012 Tian et al.
2001/0055008 A1 12/2001 Young et al.
2002/0005844 A1 1/2002 Kosaka et al.
2002/0177670 A1 11/2002 Kusakabe et al.
2002/0179930 A1 12/2002 Irwin et al.
2003/0063706 A1 4/2003 Ikeda et al.
2003/0071196 A1 4/2003 Seitz
2003/0103153 A1 6/2003 Fossum
2003/0146389 A1 8/2003 Busse et al.
2004/0046194 A1 3/2004 Kozuka et al.
2004/0108564 A1 6/2004 Mitra
2004/0118448 A1 6/2004 Scher et al.
2004/0150729 A1 8/2004 Nishizawa et al.
2005/0045910 A1 * 3/2005 Taylor et al. .................. 257/184
2005/0139966 A1 6/2005 Scarlete
2005/0201149 A1 9/2005 Duan et al.
2005/0205850 A1 9/2005 Whiteford et al.
2005/0205879 A1 9/2005 Fukunaga
2005/0205901 A1 9/2005 Suzuki
2005/0225655 A1 10/2005 Suzuki
2006/0044438 A1 3/2006 Mauritzson et al.
2006/0044554 A1 3/2006 Mertz et al.
2006/0172133 A1 8/2006 Nassani
2006/0181629 A1 8/2006 Miyashita et al.
2006/0196537 A1 9/2006 Narkis et al.
2006/0261331 A1 11/2006 Yukawa
2006/0261996 A1 11/2006 Augusto et al.
2006/0267054 A1 11/2006 Martin et al.
2007/0045514 A1 3/2007 Mckee et al.
2007/0052051 A1 3/2007 Osaka et al.
2007/0052055 A1 3/2007 McKee
2007/0108487 A1 5/2007 Inoue et al.
2007/0120045 A1 5/2007 Yokoyama
2007/0132867 A1 6/2007 Rhee et al.
2007/0153109 A1 7/2007 Lule
2007/0174939 A1 7/2007 Sargent et al.
2007/0216777 A1 9/2007 Quan et al.
2007/0236590 A1 10/2007 Harris
2007/0273775 A1 11/2007 Jiang
2008/0017845 A1 1/2008 Drndic et al.
2008/0035965 A1 2/2008 Hayashi et al.
2008/0067387 A1 3/2008 Mouttet
2008/0087800 A1 4/2008 Toda
2008/0142856 A1 6/2008 Sato et al.
2008/0156371 A1 7/2008 Locascio et al.
2008/0173964 A1 7/2008 Akram
2008/0296534 A1 12/2008 Lifshitz et al.
2009/0152664 A1 6/2009 Klem et al.
2009/0174022 A1 7/2009 Coe-Sullivan et al.
2009/0224351 A1 9/2009 Hsieh
2009/0257671 A1 10/2009 Fridrich et al.
2010/0019334 A1 1/2010 Ivanov et al.
2010/0019335 A1 1/2010 Ivanov et al.
2010/0044676 A1 2/2010 Sargent et al.
2010/0187404 A1 7/2010 Klem
2010/0187408 A1 7/2010 Klem
2011/0297815 A1 12/2011 Tian et al.
2011/0297915 A1 12/2011 Tian et al.
2011/0303897 A1 12/2011 Tian et al.
2011/0303898 A1 12/2011 Tian et al.
2011/0309236 A1 12/2011 Tian et al.
2011/0309238 A1 12/2011 Tian et al.
2012/0205624 A1 8/2012 Sargent et al.
2012/0280226 A1 11/2012 Ivanov et al.
2013/0001520 A1 1/2013 Sargent et al.

OTHER PUBLICATIONS

"U.S. Appl. No. 12/106,256, Non-Final Office Action mailed May 21, 2010", 14 pgs.
"U.S. Appl. No. 12/106,256, Non-Final Office Action mailed Jun. 11, 2010", 17 pgs.
"U.S. Appl. No. 12/106,256, Notice of Allowance mailed Nov. 3, 2010", 4 pgs.
"U.S. Appl. No. 12/106,256, Notice of Allowance mailed Dec. 2, 2010", 5 pgs.
"U.S. Appl. No. 12/106,256, Preliminary Amendment filed Mar. 19, 2010", 10 pgs.
"U.S. Appl. No. 12/106,256, Response filed Mar. 4, 2010 to Restriction Requirement mailed Feb. 5, 2010", 10 pgs.
"U.S. Appl. No. 12/106,256, Response filed May 7, 2010 to Restriction Requirement mailed Apr. 7, 2010", 7 pgs.
"U.S. Appl. No. 12/106,256, Response filed Oct. 8, 2010 to Non Final Office Action mailed Jun. 11, 2010", 16 pgs.
"U.S. Appl. No. 12/106,256, Restriction Requirement mailed Feb. 5, 2010", 4 pgs.
"U.S. Appl. No. 12/106,256, Restriction Requirement mailed Apr. 7, 2010", 6 pgs.
"U.S. Appl. No. 12/106,256, Supplemental Preliminary Amendment filed May 21, 2010", 14 pgs.
"U.S. Appl. No. 12/426,854 Non-Final Office Action mailed Nov. 2, 2010", 7 pgs.
"U.S. Appl. No. 12/426,854, Notice of Allowance mailed May 27, 2011", 5 pgs.
"U.S. Appl. No. 12/426,854, Notice of Allowance mailed Oct. 11, 2011", 6 pgs.
"U.S. Appl. No. 12/426,854, Preliminary Amendment filed Sep. 30, 2009", 3 pgs.
"U.S. Appl. No. 12/426,854, Response filed May 2, 2011 to Non Final Office Action mailed Nov. 2, 2010", 6 pgs.
"U.S. Appl. No. 12/506,233, Non Final Office Action mailed Jul. 13, 2011", 9 pgs.
"U.S. Appl. No. 12/506,233, Notice of Allowance mailed Apr. 4, 2011", 9 pgs.
"U.S. Appl. No. 12/506,233, Notice of Allowance mailed Oct. 21, 2011", 5 pgs.
"U.S. Appl. No. 12/506,233, Preliminary Amendment filed Oct. 5, 2009", 3 pgs.
"U.S. Appl. No. 12/506,233, Response filed Oct. 13, 2011 to Non Final Office Action mailed Jul. 13, 2011", 7 pgs.
"U.S. Appl. No. 12/506,236, Non Final Office Action mailed May 31, 2011", 9 pgs.
"U.S. Appl. No. 12/506,236, Notice of Allowance mailed Feb. 7, 2011", 7 pgs.
"U.S. Appl. No. 12/506,236, Notice of Allowance mailed Nov. 9, 2011", 5 pgs.

"U.S. Appl. No. 12/506,236, Preliminary Amendment filed Oct. 5, 2009", 3 pgs.
"U.S. Appl. No. 12/506,236, Response filed Oct. 28, 2011 to Non Final Office Action mailed May 31, 2011", 7 pgs.
"U.S. Appl. No. 12/728,181, Non-Final Office Action mailed Oct. 12, 2010", 16 pgs.
"U.S. Appl. No. 12/728,181, Notice of Allowance mailed Apr. 22, 2011", 5 pgs.
"U.S. Appl. No. 12/728,181, Response filed Apr. 12, 2011 to Non-Final Office Action mailed Oct. 12, 2010", 13 pgs.
"U.S. Appl. No. 12/728,184, 312 Amendment filed Jul. 21, 2011", 6 pgs.
"U.S. Appl. No. 12/728,184, Non-Final Office Action mailed Oct. 13, 2010", 13 pgs.
"U.S. Appl. No. 12/728,184, Notice of Allowance mailed Apr. 22, 2011", 5 pgs.
"U.S. Appl. No. 12/728,184, PTO Response to 312 Amendment mailed Jul. 26, 2011", 2pgs.
"U.S. Appl. No. 12/728,184, Response filed Apr. 12, 2011 to Non-Final Office Action mailed Oct. 13, 2010", 14 pgs.
"U.S. Appl. No. 12/728,184, Supplemental Notice of Allowability mailed Jun. 29, 2011", 3pgs.
"U.S. Appl. No. 13/209,264, Preliminary Amendment filed Sep. 19, 2011", 30 pgs.
"U.S. Appl. No. 13/209,264, Restriction Requirement mailed Jan. 13, 2012", 5pgs.
"U.S. Appl. No. 13/213,932, Non Final Office Action mailed Nov. 28, 2011", 11 pgs.
"U.S. Appl. No. 13/214,582, Notice of Allowance mailed Nov. 4, 2011", 8 pgs.
"U.S. Appl. No. 13/214,711, Non Final Office Action Mailed Jan. 17, 2012", 8 pgs.
"U.S. Appl. No. 13/214,898, Non Final Office Action mailed Nov. 7, 2011", 16 pgs.
"European Application Serial No. 08746379.0, Response filed Oct. 6, 2011 to Office Action mailed Mar. 11, 2011", 8 pgs.
"European Application Serial No. 11008006.6, Office Action mailed Oct. 28, 2011", 4 pgs.
"European Application Serial No. 08746379.0, Office Action mailed Mar. 11, 2011", 9 pgs.
"International Application Serial No. PCT/US2008/060947, International Search Report mailed Oct. 9, 2008", 4 pgs.
"International Application Serial No. PCT/US2009/041153, International Search Report mailed Aug. 19, 2009", 1 pg.
"International Application Serial No. PCT/US2009/041153, International Written Opinion mailed Aug. 19, 2009", 3 pgs.
"International Application Serial No. PCT/US2009/051186, International Preliminary Report on Patentability, mailed Feb. 3, 2011", 8 pgs.
"International Application Serial No. PCT/US2009/051186, International Search Report mailed Sep. 3, 2009", 3 pgs.
"International Application Serial No. PCT/US2009/051186, International Written Opinion, mailed Sep. 3, 2009", 7 pgs.
Borgefors, et al., "A Semiregular image grid", Journal of Visual Communication and image representation, vol. No. 1 No. 2, (Nov. 1, 1990), 127-136.
Cashman, R. J, "Film-Type Infrared Photoconductors", Proceedings of the IRE, 47(9), (1959), 1471-1475.
Fischbein, M. D, et al., "CdSe nanocrystal quantum-dot memory", Applied Physics Letters, 86, (2005), 193106-1-193106-3.
Takada, Shunji, et al., "CMOS Image Sensor with Organic Photoconductive Layer Having Narrow Absorption Band and Proposal of Stack Type Solid-State Image Sensors", Sensors, Cameras, and Systems for Scientific/Industrial Applications, VII, edited by Morley M. Blouke, Proc. of SPIE-IS&T Electronic Imaging, SPIE vol. 6068, 6068A, (2006), 6068A-1-6068A-8.
Ye, Zhengmao, et al., "InAs quantum dot infrared photodetectors with In0.15Ga0.85As strain-relief cap layers", Journal of Applied Physics, 92(12), (Dec. 15, 2002), 7462-7468.
"U.S. Appl. No. 13/218,761, Response filed Aug. 17, 2012 to Non Final Office Action mailed Feb. 21, 2012", 27 pgs.
"U.S. Appl. No. 13/214,898, Response to Rule 312 mailed Nov. 2, 2012", 2 pgs.
"U.S. Appl. No. 13/217,026, Non Final Office Action mailed Nov. 7, 2012", 31 pgs.
"U.S. Appl. No. 13/217,047, Non Final Office Action mailed Oct. 16, 2012", 15 pgs.
"U.S. Appl. No. 13/217,103, Non Final Office Action mailed Dec. 13, 2012", 23 pgs.
"U.S. Appl. No. 13/217,103, Restriction Requirement mailed Oct. 24, 2012", 5 pgs.
"U.S. Appl. No. 13/217,125, Non Final Office Action mailed Dec. 13, 2012", 15 pgs.
"U.S. Appl. No. 13/217,125, Restriction Requirement mailed Oct. 24, 2012", 5 pgs.
"U.S. Appl. No. 13/213,364, Non Final Office Action mailed Dec. 13, 2012", 23 pgs.
"U.S. Appl. No. 13/218,364, Restriction Requirement mailed Oct. 24, 2012", 5 pgs.
"U.S. Appl. No. 13/218,802, Response filed Dec. 5, 2012 to Restriction Requirement mailed Nov. 8, 2012", 14 pgs.
"U.S. Appl. No. 13/218,802, Restriction Requirement mailed Nov. 8, 2012", 5 pgs.
"U.S. Appl. No. 13/218,937, Non Final Office Action mailed Nov. 5, 2012", 9 pgs.
"European Application Serial No. 08746379.0, Summons to Attend Oral Proceedings mailed Dec. 3, 2012", 7 pgs.
"U.S. Appl. No. 13/209,264 , Response filed Jan. 3, 2013 to Non Final Office Action mailed Jul. 3, 2012", 37 pgs.
"U.S. Appl. No. 13/214,898, Ex Parte Quayle Action mailed Jan. 17, 2013", 5 pgs.
"U.S. Appl. No. 13/218,693, Ex Parte Quayle Action mailed Jan. 17, 2013", 5 pgs.
"U.S. Appl. No. 13/218,802, Non Final Office Action mailed Jan. 2, 2013", 11 pgs.
"U.S. Appl. No. 13/228,197, Non Final Office Action mailed Jan. 16, 2013", 10 pgs.
"U.S. Appl. No. 13/235,134 , Response filed Jan. 11, 2013 to Non Final Office Action mailed Jul. 12, 2012", 7 pgs.
"U.S. Appl. No. 13/473,020, Non Final Office Action mailed Jan. 16, 2013", 11 pgs.
"Chinese Application Serial No. 200880020973.4, Response filed Jan. 3, 2013 to Office Action mailed Jun. 18, 2012", 11 pgs.
"European Application Serial No. 11008006.6, Response filed Sep. 21, 2012 to Extended Search Report mailed Feb. 22, 2012", 28 pgs.
"U.S. Appl. No. 13/213,932, PTO Response to 312 Amendment mailed Aug. 30, 2012", 2 pgs.
"U.S. Appl. No. 13/214,898, Notice of Allowance mailed Sep. 26, 2012", 8 pgs.
"U.S. Appl. No. 13/218,401, Response filed Aug. 21, 2012 to Non Final Office Action mailed Feb. 22, 2012", 9 pgs.
"U.S. Appl. No. 13/218,401, Notice of Allowance mailed Oct. 3, 2012", 7 pgs.
"U.S. Appl. No. 13/218,693, Notice of Allowance mailed Sep. 14, 2012", 7 pgs.
"U.S. Appl. No. 13/218,761, Notice of Allowance mailed Oct. 3, 2012", 7 pgs.
"U.S. Appl. No. 13/235,159, Response filed Sep. 28, 2012 to Non Final Office Action mailed Jul. 11, 2012", 6 pgs.
U.S. Appl. No. 13/156,235, filed Jun. 8, 2011, Stable, Sensitive Photodetectors and Image Sensors Made Therefrom Including Circuits, Processes, and Materials for Enhanced Imaging Performance.
"U.S. Appl. No. 13/209,264, Notice of Allowance mailed Apr. 15, 2013", 8 pgs.
"U.S. Appl. No. 13/209,264, Response filed Apr. 1, 2013 to Ex Parte Quayle Action mailed Jan. 31, 2013", 6 pgs.
"U.S. Appl. No. 13/214,898, Notice of Allowance mailed Apr. 8, 2013", 6 pgs.
"U.S. Appl. No. 13/214,898, Response Filed Mar. 18, 2013 to Ex Parte Quayle Action mailed Jan. 17, 2013", 19 pgs.
"U.S. Appl. No. 13/217,026, Notice of Allowance mailed May 1, 2013", 6 pgs.
"U.S. Appl. No. 13/217,026, Response to Non Final Office Action mailed Nov. 7, 2012", 32 pgs.
"U.S. Appl. No. 13/217,047, Response filed Apr. 12, 2013 to Non Final Office Action mailed Oct. 16, 2012", 16 pgs.

"U.S. Appl. No. 13/218,401, Non Final Office Action mailed Feb. 7, 2013", 8 pgs.
"U.S. Appl. No. 13/218,401, Response filed May 2, 2013 to Non Final Office Action mailed Feb. 7, 2013", 14 pgs.
"U.S. Appl. No. 13/218,693 Response Filed Mar. 18, 2013 to Ex Parte Quayle Action mailed Jan. 17, 2013", 16 pgs.
"U.S. Appl. No. 13/218,693, Notice of Allowance mailed Apr. 22, 2013", 6 pgs.
"U.S. Appl. No. 13/218,761, Ex Parte Quayle Action mailed Feb. 7, 2013", 5 pgs.
"U.S. Appl. No. 13/218,802, Notice of Allowance mailed Mar. 20, 2013", 8 pgs.
"U.S. Appl. No. 13/218,802, Response filed Feb. 22, 2013 to Non Final Office Action mailed Jan. 2, 2013", 15 pgs.
"U.S. Appl. No. 13/218,937, Notice of Allowance mailed Apr. 23, 2013", 6 pgs.
"U.S. Appl. No. 13/218,937, Response filed Mar. 5, 2013 to Non Final Office Action mailed Nov. 5, 2012", 15 pgs.

* cited by examiner

Colloidal PbS Nanocrystals with Size-Tunable Near IR Emission

FIG.3m
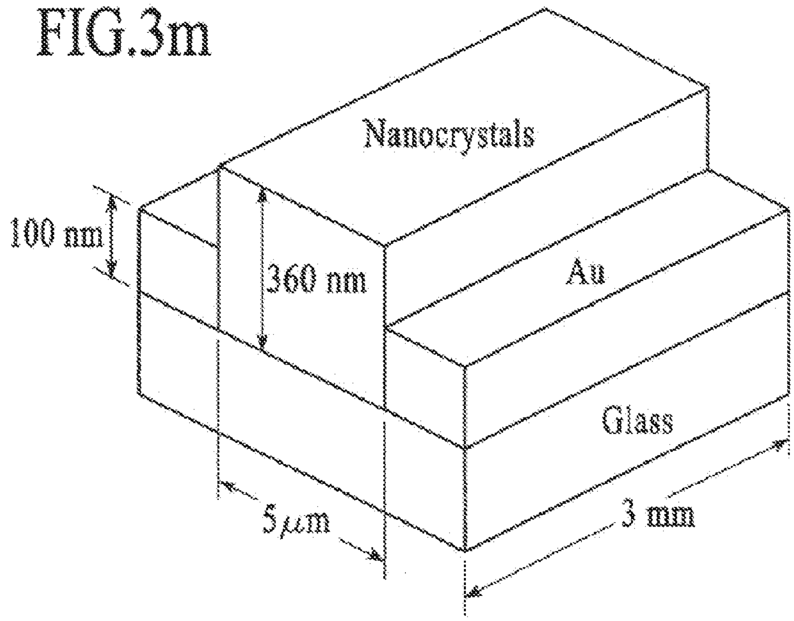
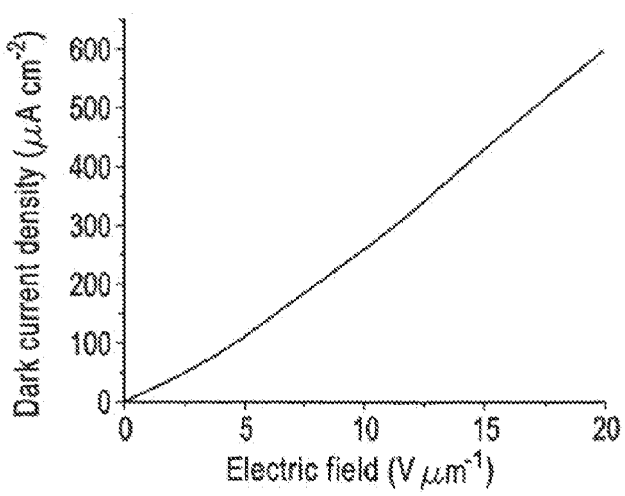
FIG.3n

| | Voc (mV) | Jsc (mA/cm$^2$) | $\eta$p (%) | EQE (%) |
|---|---|---|---|---|
| 1340 nm device no sintering | 170 | 0.2 | 0.02 | 2.1 |
| 1340 nm device 150 C sintering | 400 | 1.0 | 1.3 | 10 |
| 1590 nm device no sintering | 70 | 0.02 | 0.003 | 0.2 |
| 1590 nm device 130 C sintering | 85 | 1.5 | 0.3 | 16 |

FIG.3p

Side View

Side View

Side View

Top

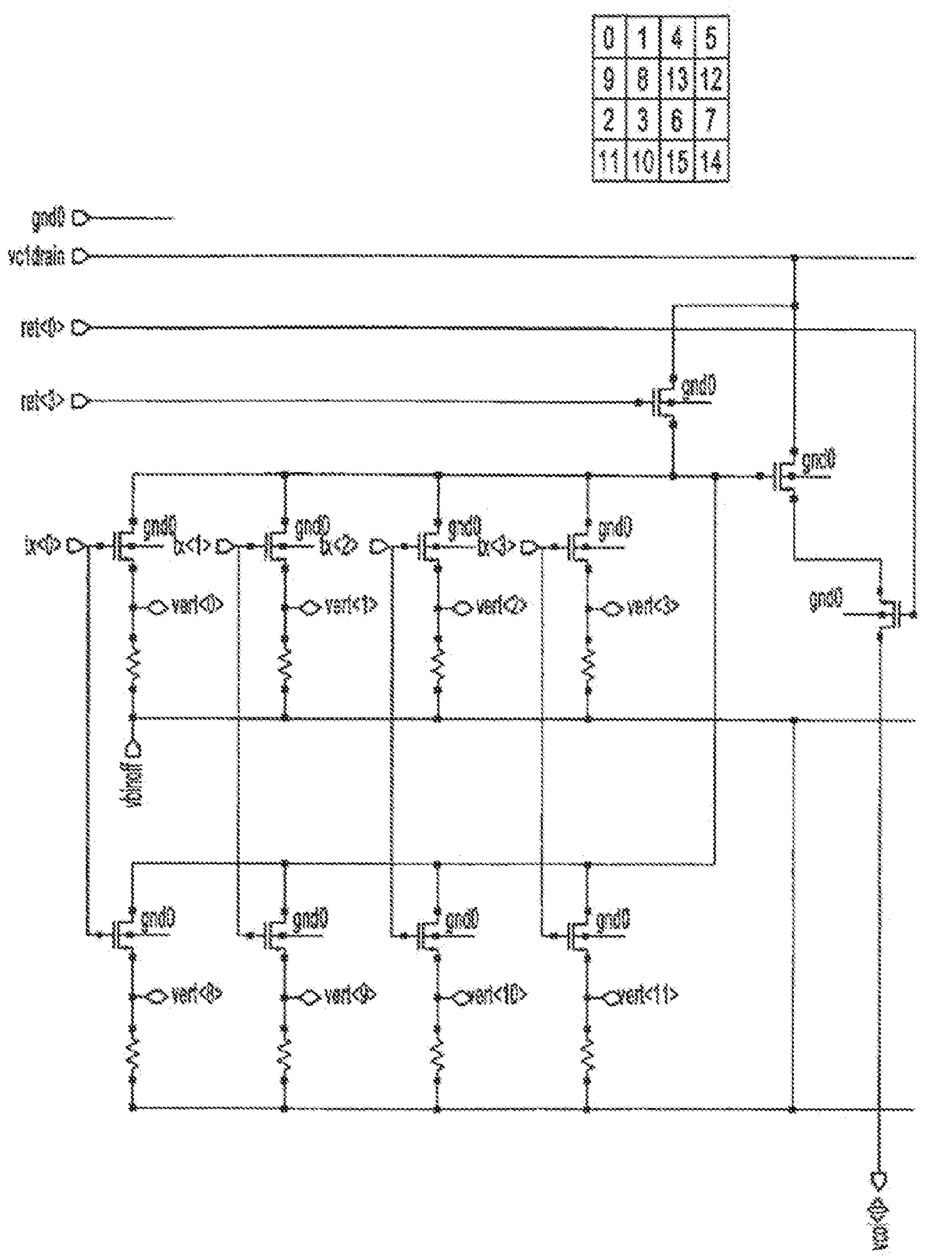
FIG.20a/1

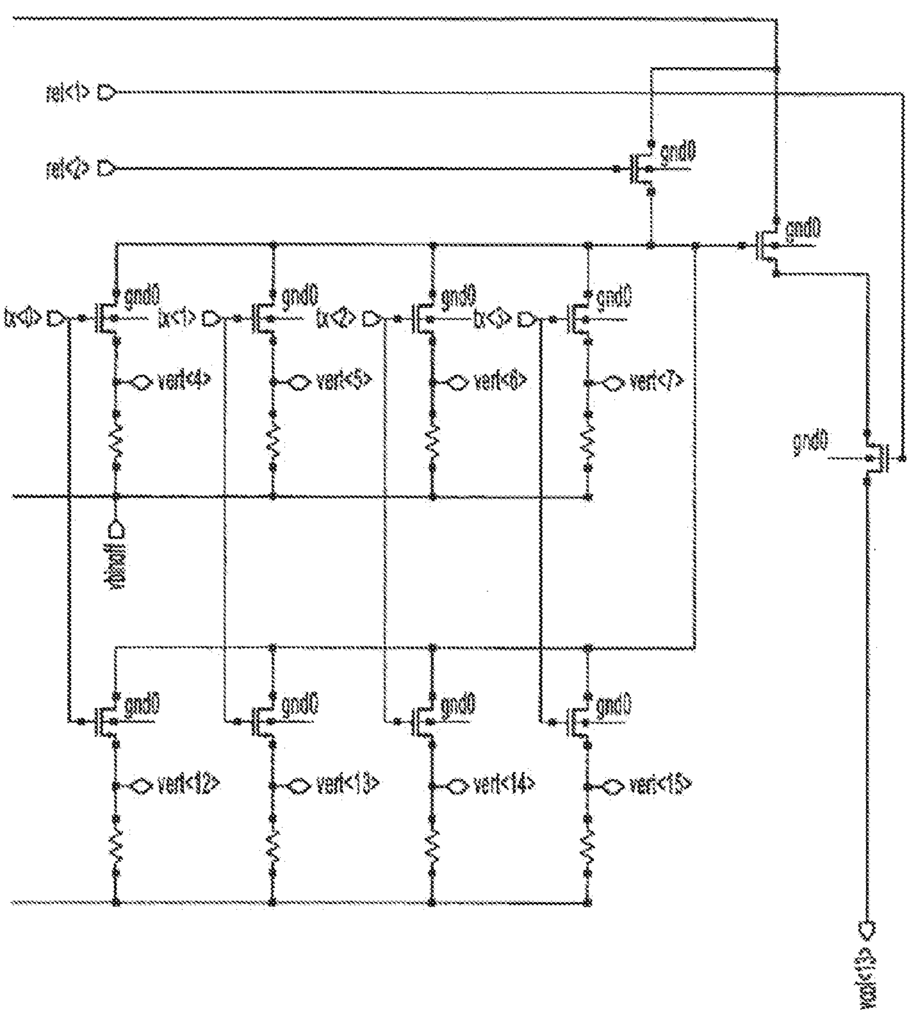
FIG.20a/2

300
310
311
312
320
315
330
340
350
360
370
RT
T
RS
F
CD
CS 301
4T, C
Fn
CD
CS
380
381
382
383
390
391
392
393
394
p
n 400
410
411
420
430
440
450
460
470
RTF
F
T
RT
RS
CD
CS 401
4T + 1D, C
RTF
F
CD
CS
p+
NW
n
484
485
480
481
482
483
490
491
492
493

| Treatments | Oxides | Time constants |
|---|---|---|
| Original | $PbSO_3$<br>Pb-carboxylate<br>$PbSO_4$ | |
| Butylamine | $PbSO_3$<br>Pb-carboxylate<br>$PbSO_4$ | ~ 60 ms<br>~ 300 ms<br>~ 2 s |
| Ethanethiol | $PbSO_3$ | ~ 27 ms |
| ET +aging in ambient | $PbSO_3$<br>$PbSO_4$ | ~ 38 ms<br>~ 3 s |
| Formic acid | $PbSO_3$<br>Pb-carboxylate | ~ 33 ms<br>~ 420 ms |

FIG.45

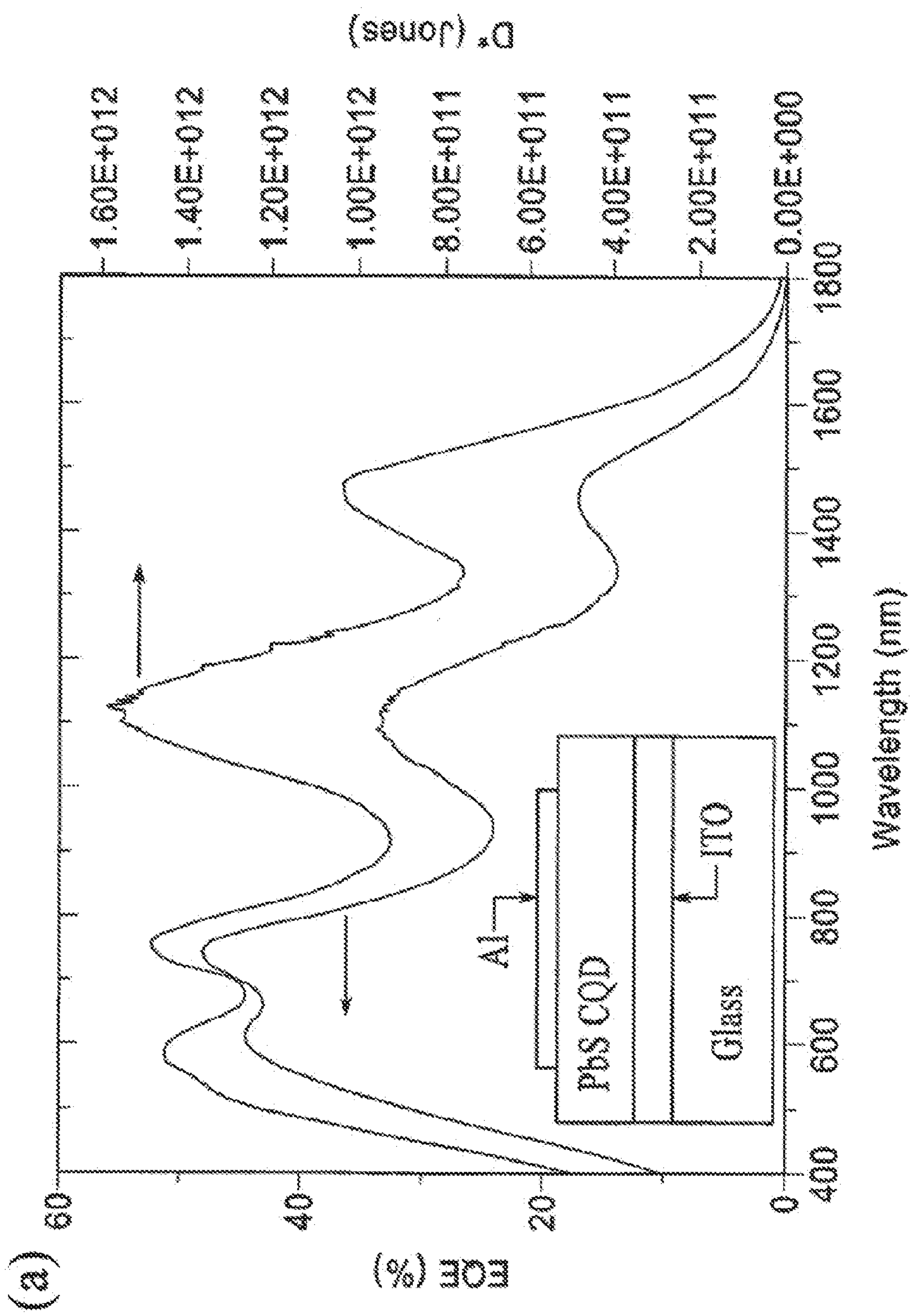
FIG.53/1

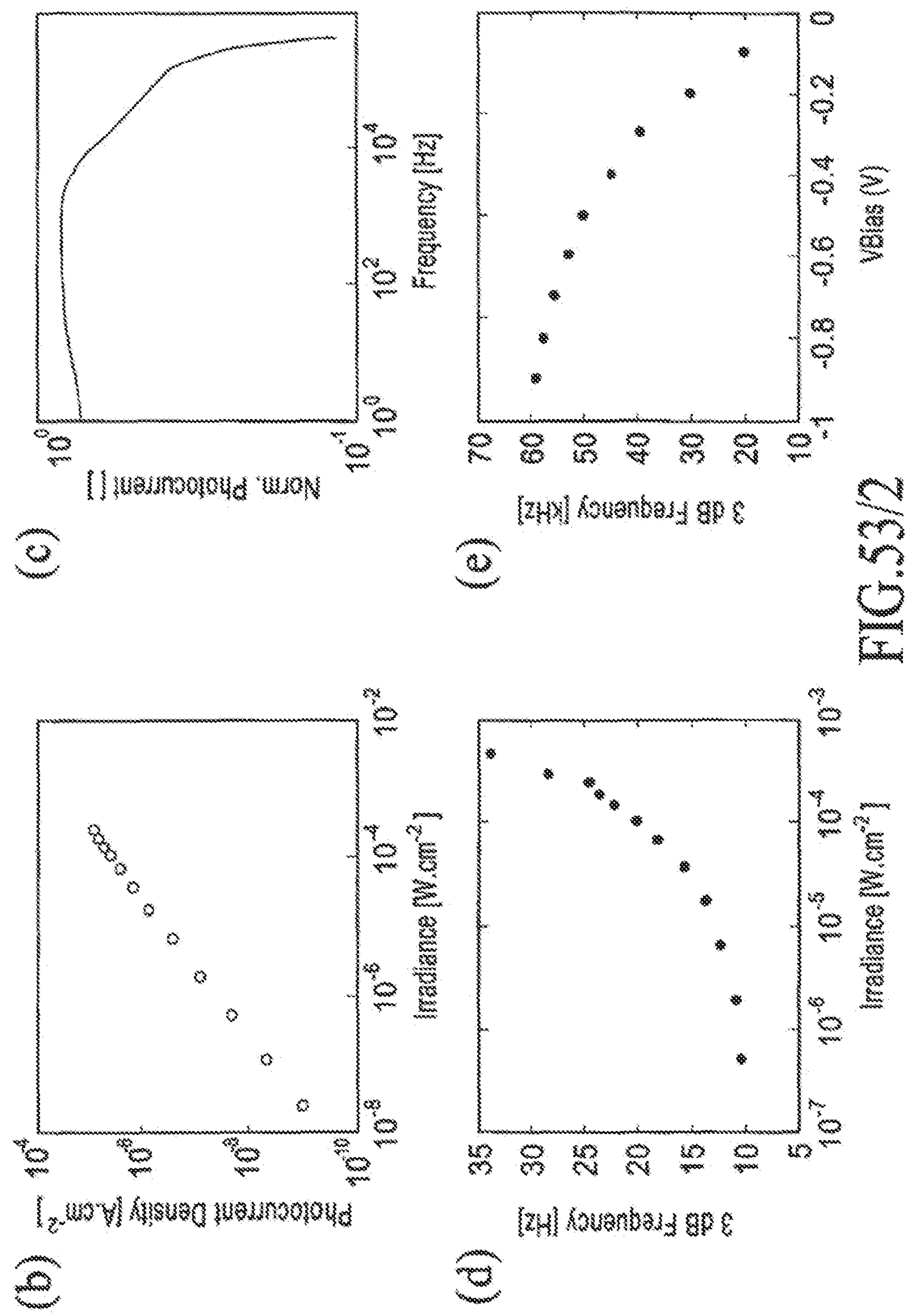
FIG.53/2

| Parameter | Symbol | Measurement Method | Measurement Value | Value used in model |
|---|---|---|---|---|
| CQD Film Thickness [nm] | $d$ | profilometer | 340 | 340 |
| Depletion Region Thickness [nm] | $w_{DR}$ | capacitance-voltage | 240<br>305<br>320 | 170 at Vbias = 0.0<br>200 at Vbias = -0.5<br>250 at Vbias = -1.0 |
| Quasi-Neutral Region Thickness [nm] | $w_{QNR}$ | calculated from $d$- $w_{DR}$ | 100<br>35<br>20 | *170 at Vbias = 0.0*<br>*140 at Vbias = -0.5*<br>*90 at Vbias = -1.0* |
| Built-in Potential [V] | $V_{bi}$ | capacitance-voltage | 0.20 | 0.20 |
| Absorption Coefficient [$cm^{-1}$] | $\alpha$ | absorption | 1.05e4 | 1.05e4 |
| Internal Quantum Efficiency [ ] | $\eta$ | absorption | | 0.30 at Vbias = 0.0<br>0.41 at Vbias = -0.5<br>0.44 at Vbias = -1.0 |
| Carrier Lifetime [s] | $\tau$ | $V_{oc}$ transient | (see SOM Section 5.0) | (see SOM Section 5.0) |
| Static Dielectric Permittivity [ ] | $\varepsilon_r$ | CELIV | 19.2 | 19.2 |
| Hole Mobility [$cm^2.V^{-1}.s^{-1}$] | $\mu_h$ | CELIV | 1.1e-4 | 1.1e-4 |
| Electron Diffusivity [$cm^2.s^{-1}$] | $D_e$ | SSPG | | 3.4e-6 |

FIG.64

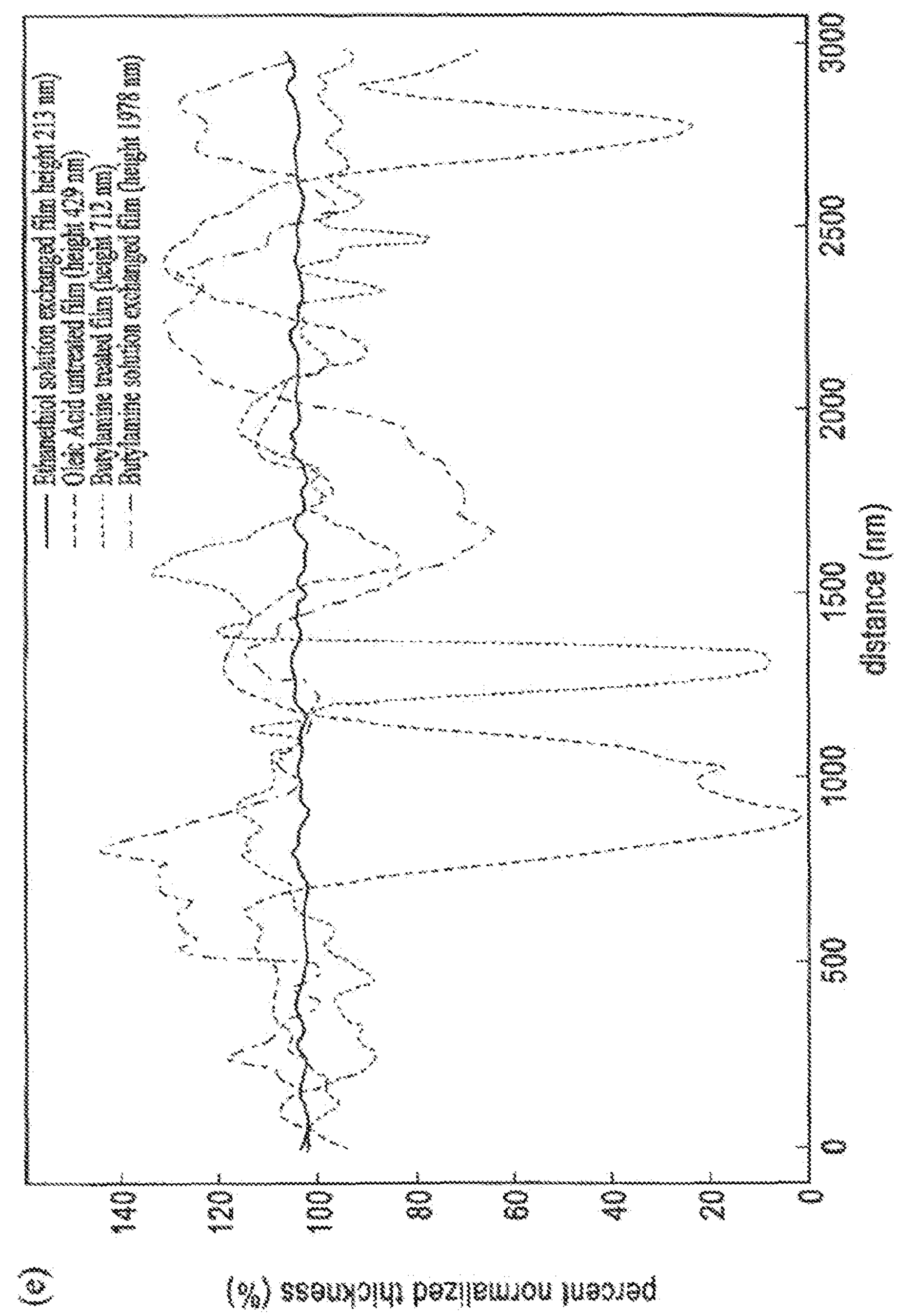
FIG.67/2

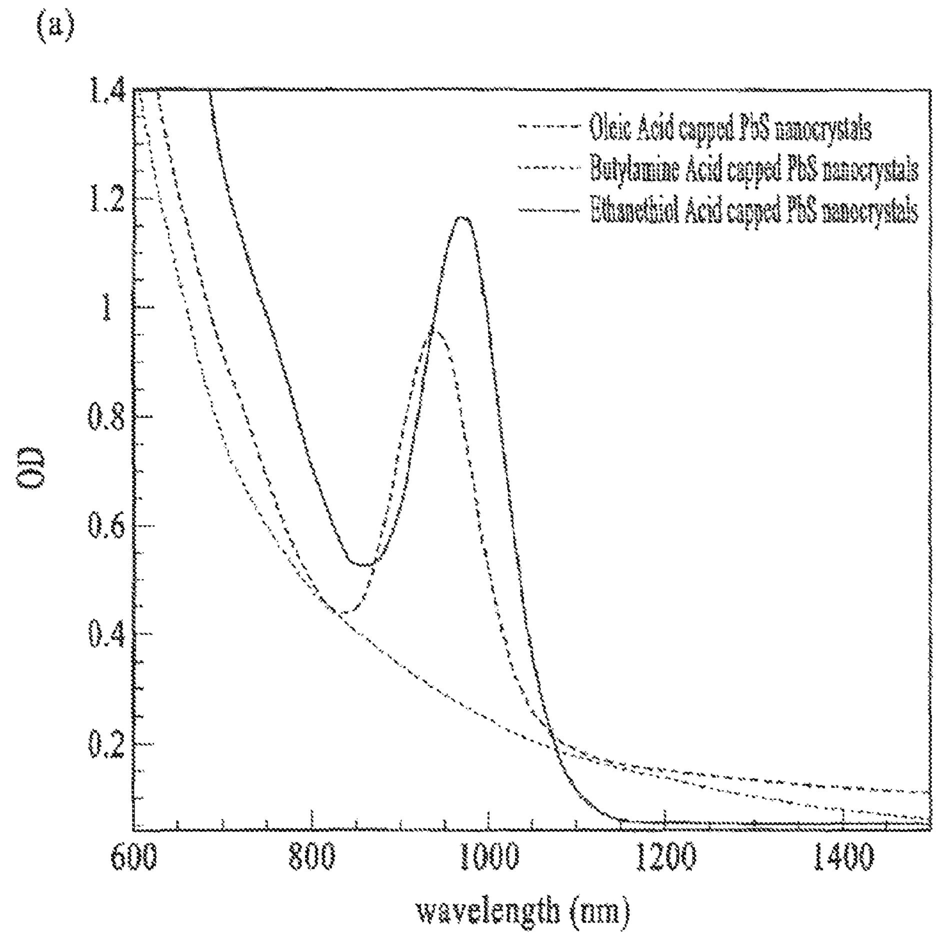
FIG.68/1

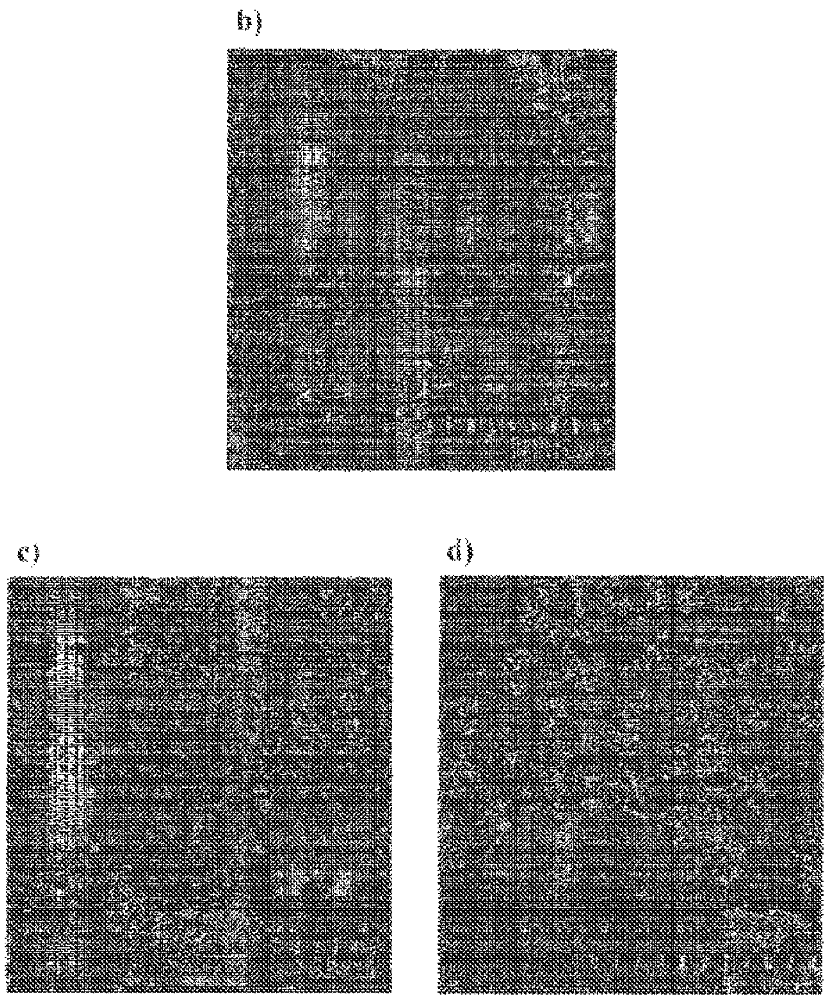
FIG. 68/2

MATERIALS, SYSTEMS AND METHODS FOR OPTOELECTRONIC DEVICES

CROSS REFERENCE TO RELATED APPLICATIONS

This application is a Continuation of U.S. application Ser. No. 12/728,181, filed Mar. 19, 2010 now U.S. Pat. No. 8,004, 057, which is a Continuation of United States (US) patent application Ser. No. 12/106,256, filed Apr. 18, 2008 issued as U.S. Pat. No. 7,923,801, both of which are incorporated herein by reference in their entireties.

U.S. patent application Ser. No. 12/106,256 claims the benefit of the following applications: (US) Patent Application No. 60/912,581, filed Apr. 18, 2007;

U.S. Patent Application No. 60/958,846, filed Jul. 9, 2007;

U.S. Patent Application No. 60/970,211, filed Sep. 5, 2007;

U.S. Patent Application No. 61/026,440, filed Feb. 5, 2008;

U.S. Patent Application No. 61/026,650, filed Feb. 6, 2008;

U.S. Patent Application No. 61/028,481, filed Feb. 13, 2008; and

U.S. Patent Application No. 61/046,379, filed Apr. 18, 2008, all of which are incorporated herein by reference in their entireties.

TECHNICAL FIELD

The present invention generally relates to optical and electronic devices, systems and methods that include optically sensitive material, such as nanocrystals or other optically sensitive material, and methods of making and using the devices and systems.

BACKGROUND

Optoelectronic device, such as image sensors and photovoltaic devices, may include optically sensitive material. Example image sensors include devices that use silicon both for the sensing function and for the read-out electronics and multiplexing functions. In some image sensors, optically sensitive silicon photodiodes and electronics may be formed on a single silicon wafer. Other example image sensors may employ a distinct material, such as InGaAs (for short-wave IR sensing), or amorphous selenium (for x-ray sensing), for the sensing (photon to electron conversion) function. Example photovoltaic devices include solar cells that use crystalline silicon wafers for photon to electron conversion. Other example photovoltaic devices may use a separate layer of material such as amorphous silicon or polycrystalline silicon or a distinct material for photon to electron conversion. However, these image sensors and photovoltaic devices have been known to have a number of limitations.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF FIGURES

The systems and methods described herein may be understood by reference to the following figures:

FIG. 3*l* shows spectral responsivity of the stacked device shown in the inset for dual-spectral detection. The small-quantum dot (QD) layer detects effectively the short wavelength light, whereas the longer wavelengths are detected from the large-quantum dot (QD) layer. The responsivity of the large-quantum dot device before the stacking is also shown for comparison. The responsivities of the large-quantum dot device in both cases have been normalized to their exciton peak value at 1230 nm. The structure shown in the inset consists of gold electrodes with length 3 mm, width 20 μm and height 100 nm. The spacing between the electrodes is 20 μm and the applied bias was 100V.

FIG. 3*m* shows the device structure. PbS quantum dots were spincoated from solution on a pre-patterned interdigitated electrode. The electrodes were fabricated using standard photolithography on a gold-coated F45 glass substrate—0.5 mm in thickness—from Schott. 10 nm of chromium were evaporated prior to 100 nm gold sputtering to achieve adhesion of gold to the glass substrate. The width of the gold stripes is 20 μm, the length is 3 mm and the spacing is 5 μm.

FIG. 3*n* shows the dark current density as a function of the applied field of the reported device. The applied field is considered as the applied voltage over the device width of 5 μm.

FIG. 3*p* shows a table of the effects sintering treatment has on the performance of photovoltaic devices. All measurements performed under 12 mW/cm$^2$ 975 nm illumination

FIG. 20 shows an optical micrograph of a light sensitive layer formed on an electronic read-out chip;

FIG. 20*a* is a schematic diagram for a 16-to-2 shared pixel circuit;

FIGS. 41 through 45, 46*a*, 46*b*, 47, 48*a*, 48*b*, 49*a*, 49*b*, 50*a*, 50*b*, and 51 illustrate embodiments that include controlling temporal response of photoconductive photodetectors via selective introduction of surface trap states;

FIGS. 52, 53/1, 53/2, and 54 through 66 illustrate an embodiment including fast, spectrally-tunable solution-processed photodetectors;

Figure 1:
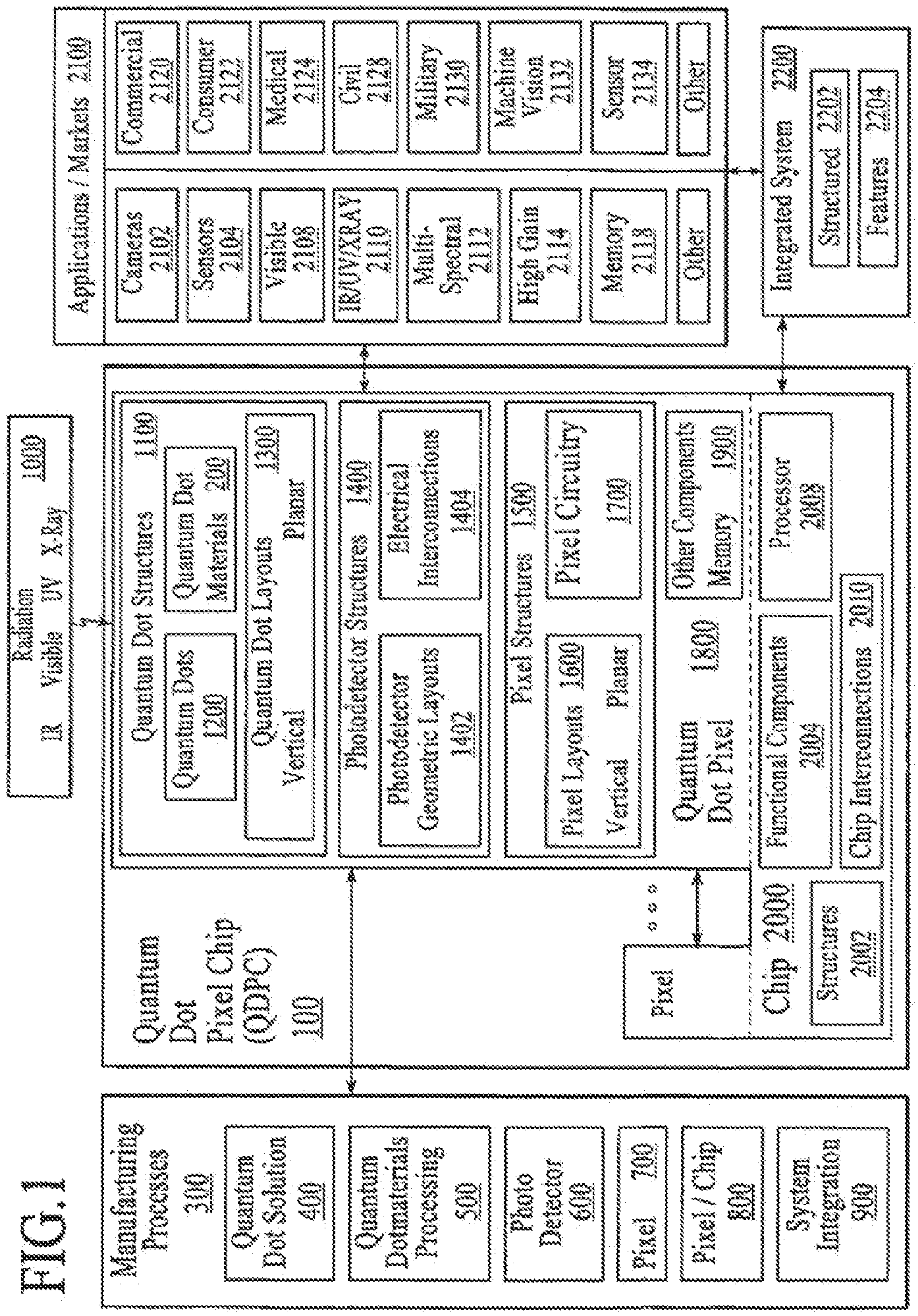
FIG. 1 shows overall structure and areas according to an embodiment.

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

Image sensors incorporate arrays of photodetectors. These photodetectors sense light, converting it from an optical to an electronic signal. It is often desired that such photodetectors possess the following features, individually or in combination(s):

be readily integrable with other circuitry related to the image sensing function, such as circuits which store charge, circuits which relay signal levels to the periphery of the array, circuits which manipulate these signal levels in the analog domain, circuits which convert analog into digital signals, and circuits which process image-related data in the digital domain.

provide a maximum of sensitivity to light within the wavelength band, or bands, of interest. Sensitivity is often quantified using the measure signal-to-noise (SNR) at a given level of illumination. Signal is maximized when the responsivity, quantum efficiency, or gain of the device is maximized. Noise is minimized when random fluctuations in electronic signals are minimized, subject to the limits prescribed by natural fluctuations in electrical currents and voltages at a given temperature. Relatedly, noise and other uncontrolled or difficult-to-predict variations in background signal are generally minimized when the magnitude of dark current is minimized. For this and other reasons, photodetectors having high sensitivity and low dark current are desired.

provide a response in time that is suitably fast. Applications such as video imaging and shutterless still-image acquisition typically require photodetectors whose signal levels change substantially completely in response to a transient within fewer than 100 milliseconds (10 frames per second), or fewer than 33 milliseconds (30 frames per second), or even 1 millisecond (1/1000 second exposure of a still image).

provide for the detection of a wide range of light intensities in a manner that can conveniently be processed by available electronic circuitry. This feature is known as providing high dynamic range. One means of providing high dynamic range is to compress the measured electronic response as a function of the incident optical stimulus. Such compression may be referred to as a sublinear, i.e. a nonlinear with decreasing slope, dependence of electrical signal on incident intensity. High dynamic range may also be facilitated by employing a photodetector whose gain may be controlled, such as through the selection of a voltage bias known to produce a specific gain.

provide for the convenient discrimination among different spectral bands of electromagnetic radiation. Of particular interest are the x-ray, ultraviolet, visible (including blue, green, and red), near-infrared, and short-wavelength infrared bands.

Herein are discussed means of creating, integrating with circuits, and exploiting in a variety of applications photodetectors, and arrays of photodetectors, that possess many of these properties in combination. Specifically:

the photodetectors described herein can readily be integrated with other portions of the image sensor circuit and system by straightforward, low-cost methods such as spin-coating, spray-coating, drop-coating, and self-assembly. Embodiments include exchanging ligands passivating nanoparticle surfaces for shorter ligands that will provide for appropriate charge carrier mobilities once films are formed. Embodiments include solution-phase exchanges which enable the realization of smooth-morphology films necessary to the realization of image sensors having acceptable consistent dark currents and photoresponses across an array.

The photodetectors described herein provide a maximum of sensitivity through a combination of means. They maximize signal by providing photoconductive gain. Typical values for photoconductive gain range from 1-10, resulting in responsivities in, for example, the visible wavelengths ranging from 0.4 A/W to 4 A/W. In embodiments, the photodetectors described herein minimize noise by fusing nanocrystal cores such as to ensure substantially non-noise-degrading electrical communication among the particles making up the optically sensitive layer through which current flows. In embodiments, the photodetectors described herein minimize dark current by minimizing the net doping of the active layer, thus ensuring that the dark carrier density, and thus the dark conductance, of these optically sensitive materials is minimized. In embodiments, the photodetectors described herein minimize dark current by providing an electrode-to-nanocrystalline-layer electrical connection that blocks typically one type of carrier, including potentially the majority carrier at equilibrium. In embodiments, cross-linking molecules are employed that utilize chemical functionalities that remove oxides, sulfates, and/or hydroxides responsible for p-type doping. Thus, in embodiments, a more intrinsic or even n-type optically sensitive layer may be provided, leading to lowered dark currents. In embodiments, many steps in quantum dot synthesis and/or processing and/or device packaging may be performed in a controlled environment such as a Schlenk line or Glove Box; and optically sensitive layers may be encapsulated using substantially impermeable layers such as oxides, oxynitrides, or polymers such as parylene, or epoxies, in order to prevent reactive gases such as oxygen or water from significantly permeating the optically sensitive layer. In this manner, desired combinations of properties such as gain, dark current, and lag may be preserved over the desired useful lifetime of an image sensor.

The photodetectors described herein provide a time-domain response that can be as rapid as sub-100-milliseconds, sub-30-milliseconds, and sub-1-millisecond. In embodiments, this is achieved by providing gain-providing (and persistence-providing) trap states associated with the optically sensitive layer that trap at least one type of carrier for only a limited time period such as 100 milliseconds, 30 milliseconds, or 1 millisecond. In embodiments, PbS nanoparticles are decorated with PbSO3, an oxide of PbS, which is shown to have a trap state lifetime in the vicinity of 20-30 milliseconds, providing for a transient response suited to many video imaging applications. In embodiments, photodiodes are instead provided based on colloidal quantum dot layers, wherein two electrical contacts having appreciably different work functions are employed to contact the active layer. In embodiments, dark currents may be minimized through operation of such devices without the application of an appreciable external voltage bias. In embodiments, cross-linking moieties such as benzenedithiol, a bidentate linker, may be employed to remove and/or passivate certain trap states that may be present, or may develop, in such materials.

The photodetectors described herein provide a means of enhancing dynamic range by producing a sublinear dependence of electrical signal (such as photocurrent). Over a region of low to middling intensities, trap states are available to become filled, and escape occurs following some moderate persistence, or trap state, lifetime, such as 30 milliseconds for example. At higher intensities, these trap states become substantially filled, such that charge carriers experience shorter lifetimes, or persistence times, corresponding to lower differential gains. As a result these devices exhibit substantially constant gains over a range of low to middling intensities, followed by a gentle roll-off in gain at higher intensities. Put another way, at low to middling intensities, photocurrent depends approximately linearly on intensity, but at higher intensities, photocurrent exhibits sublinear dependence on intensity. In embodiments, photodetectors are provided wherein photoconductive gain depends on the bias applied to a device. This arises because gain is proportional to carrier lifetime divided by carrier transit time, and transit time varies in inverse proportionality with applied field. In embodiments, circuits are developed that exploit this dependence of gain on bias to increase dynamic range.

In embodiments, photodetectors described herein may readily be altered, or 'tuned', to provide sensitivity to different spectral bands. One means of tuning is provided through the quantum size effect, whereby nanoparticle diameter is decreased, in cases through synthetic control, to increase the effective bandgap of the resulting quantum dots. Another means of tuning is provided through the choice of materials composition, wherein the use of a material having a larger bulk bandgap generally facilitates the realization of a photodetector with responsivity onset at a higher photon energy. In embodiments, photodetectors having different absorption onsets may be superimposed to form vertical pixels, wherein pixel(s) closer to the source of optical signal absorb and sense higher-energy bands of electromagnetic radiation, whereas pixel(s) further from the source of optical signal absorb and sense lower-energy bands.

FIG. 1 shows structure of and areas relating to quantum dot pixel chip structures (QDPCs) 100, according to example embodiments. As illustrated in FIG. 1, the QDPC 100 may be adapted as a radiation 1000 receiver where quantum dot structures 1100 are presented to receive the radiation 1000, such as light. The QDPC 100 includes, as will be described in more detail herein, quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. From an electrical viewpoint, the pixel circuitry 1700 may be in communication with other electronics (e.g. chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The chip 2000 also includes physical structures 2002 and other functional components 2004, which will also be described in more detail below.

The QDPC 100 may be manufactured using a number of manufacturing processes 300 such as quantum dot solution processing 400, quantum dot materials processing 500, photodetector processing 600, pixel processing 700, pixel/chip processing 800, overall system integrations 900, and other such processes. The QDPC 100 may also be incorporated into integrated systems 2200 where the integrated systems 2200 may be structured 2202 and have various features 2204. The structures 2202 and features 2204 may be adapted to serve particular applications and/or markets 2100. An integrated product may include conventional pixel structures (e.g. CCD or CMOS) along with quantum dot pixel structures 1800 in certain embodiments.

The photoconductive layer of the QDPC may have a resistance that changes in response to changes in radiation 1000. In embodiments, the QDPC is an image detector that monolithically sits on top of a semiconductor. The photoconductive coating (e.g. quantum dot material 200) may be transferred (e.g. spin coated) on top of the integrated circuit. A photon generates an electron-hole pair. The hole can participate in conduction. An electron is trapped for a trap time ranging from nanoseconds to microseconds to milliseconds depending on the nature of the traps. The hole is transported during a period on the order of microseconds. The increase in conductivity thus persists over many multiples of the transit time for the hole across the devices. As a result, multiple charges are, over the measurement interval, measured in an external circuit for a given absorbed photon. In an alternative embodiment, the electron is transported, with the increase in conductivity persisting over many multiples of the transit time for the electron across the device. In some embodiments, the QDPC is a generally linear device, which can benefit from a change in resistance for an extended period, generally ranging, on an order of magnitude, from one microsecond to one second with desirable periods in the range of approximately 100 microseconds to approximately one millisecond. In other embodiments, the current across the quantum dot material 200 has a non-linear relationship to the intensity of light absorbed by the optically sensitive layer of quantum dot material 200. In some embodiments, analog or digital circuitry on the chip 2000 or on another chip associated with the QDPC may be used to linearize the signals read from the pixel regions in order to produce digital pixel data that can be used by a digital camera or other system in which the QDPC is used. Embodiments described herein relate to measuring the persistent resistance change associated with the photoconductive layer. Certain of these embodiments involve low cost, largest dynamic range, most efficient, least noisy, etc. methods by which to measure this resistance. In some embodiments, the QDPC 100 consists of a photoconductive material contacted by at least two generally different contacts. Either of these contacts may be ohmic, or may form a Schottky contact. Upon absorption of a photon, an electron-hole pair is created. This may contribute to the photoconductive gain described above. In addition, both the electron and the hole may be electrically transported to some degree, either under an applied or no applied external bias. The electron and the hole may be transported, with generally different efficiencies, to their respective contacts, depending on the biasing of the device. The device may exhibit a generally nonlinear relationship between current and voltage in some embodiments. In certain biasing regimes it may produce photoconductive gain, and in other regimes the same device may not. In certain biasing regimes the device may produce much lower dark currents than in others. In some embodiments, there are regimes of significant photoconductive gain (e.g. 1, 10, or 100) but with low dark current (e.g. 1 nA/cm2, or 1 uA/cm2).

Radiation 1000

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation", "radiation", "electromagnetic spectrum", "spectrum", "radiation spectrum", and the like are used interchangeably, and the term color is used to depict a select band of radiation 1000 that could be within any portion of the radiation 1000 spectrum, and is not meant to be limited to any specific range of radiation 1000 such as in visible 'color'.

Quantum Dot 1200

A quantum dot 1200 may be a nanostructure, typically a semiconductor nanostructure, that confines a conduction band electrons, valence band holes, or excitons (bound pairs of conduction band electrons and valence band holes) in all three spatial directions. The confinement can be due to electrostatic potentials (e.g., generated by external electrodes, doping, strain, impurities), the presence of an interface between different semiconductor materials (e.g., in core-shell nanocrystal systems) or a semiconductor and another material (e.g., a semiconductor decorated by organic ligands; or by a dielectric such as an oxide such as PbO, a sulfite such as PbSO3, a sulfate such as PbSO4, or SiO2), the presence of a semiconductor surface, or a combination of one or more of these. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 2A:
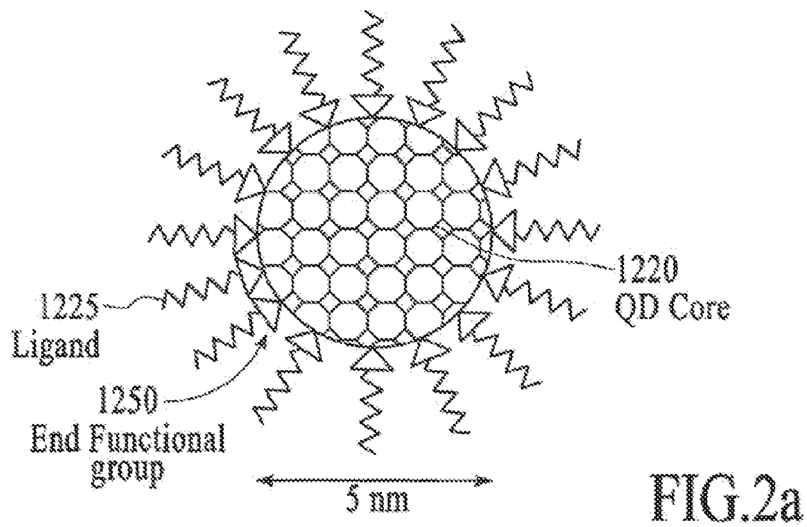
FIG. 2*a* shows an example of a quantum dot 1200.

FIG. 2*a* shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In some embodiments, the cores 1220 of adjacent QDs may be fused together to form a continuous film of nanocrystal material with nanoscale features. In other embodiments, cores may be connected to one another by linker molecules. In some embodiments, trap states may be formed on the outer surface of the nanocrystal material. In some example embodiments, the core may be PbS and trap states may be formed by an oxide such as PbSO3 formed on the outer surface of core 1220.

Figure 2B:
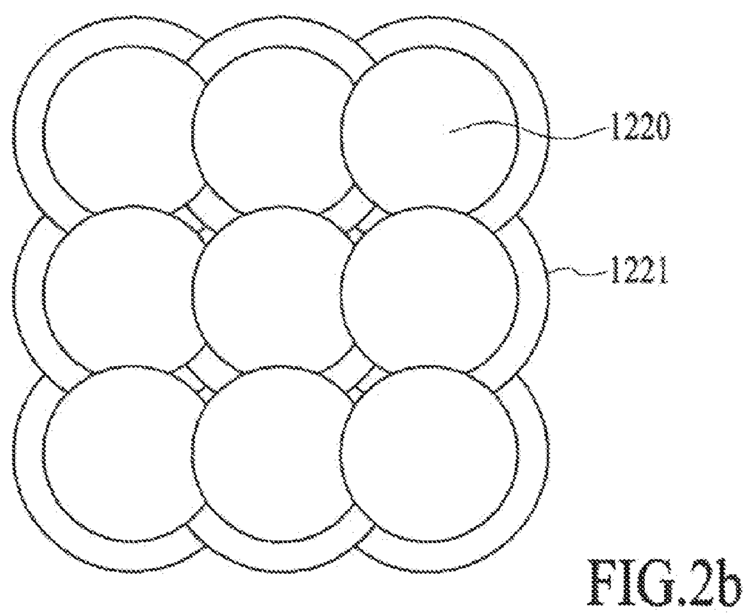
FIG. 2*b* shows an array of quantum dots 1200.

FIG. 2*b* shows a two-dimensional representation of a portion of a QD layer. The layer includes a continuous network of fused QD cores 1220, having outer surfaces 1221 that are of a different composition than that in the core, e.g., oxidized core material such as PbSO3, or a different kind of semiconductor. The individual QD cores in the film are in intimate contact, but continue to exhibit many of the properties of individual quantum dots. For example, a lone (unfused) quantum dot has a well-characterized excitonic absorbance wavelength peak that arises from quantum effects related to its size, e.g., 1-10 nm. The excitonic absorbance wavelength peak of the fused QDs in the film is not significantly shifted from the central absorbance wavelength the was present prior to fusing. For example, the central absorbance wavelength may change by about 10% or less when fused. Thus, the QDs in the film retain their quantum effects, despite the fact that they may be an integral part of a macroscopic structure.

Current is not generally thought of as "flowing" through a lone (unfused and unlinked) QD; instead, electrons simply occupy well-known quantum energy states in the quantum dot core. If two lone (unfused) QDs are brought near each other, current can flow between them by electron or hole hopping between the QDs. Current more readily flows between fused QD cores, even though the cores themselves generally retain their quantum energy states. Because the cores are in contact, electrons can more easily move between them. It may also be said that the wavefunctions of the quantum-confined electron or hole states in adjacent dots see increased overlap as the quantum dots are brought close together to form a fused quantum dot-based solid, while at the same time not fusing the QDs to such an extent that they lose their "identity," namely their individual characteristics that provide quantum confinement, in turn resulting in their excitonic feature manifest in their absorption spectrum. In embodiments, mobilities may range from $10^{-7}$ $cm^2/Vs$ to $10^2$ $cm^2/Vs$. It is also possible to "overfuse" QDs, in which case they no longer exhibit many of the normal properties of individual quantum dots. In the overfused case, the cores of the QDs do not generally have their own quantum energy levels, but the energy levels are instead distributed over multiple QD cores. This results in a film with a very low electrical resistance, but which in many ways is effectively a bulk semiconductor material. "Overfused" QDs can also be recognized experimentally by their relatively large shift (e.g., greater than about 10%) to the red (longer wavelengths) in their absorption and/or emission spectra. Complete fusing, and complete loss of quantum confinement properties, may be recognized when the solid approaches taking on the absorption spectral characteristics of a bulk material, e.g. absorption begins near the bulk materials' bandgap.

In some embodiments, QD cores are linked by linker molecules as described further below. This allows current to flow more readily than through unlinked, unfused QDs. However, the use of linker molecules to form a continuous film of QDs instead of fusing the cores may reduce the dark current for some photoconductor and image sensor embodiments.

In certain embodiments the QD layer is exceptionally radiation 1000 sensitive. This sensitivity is particularly useful for low-radiation 1000 imaging applications. At the same time, the gain of the device can be dynamically adjusted so that the QDPC saturates, that is, additional photons continue to provide additional useful information that can be discerned by the read-out electronic circuit. Tuning of gain can be conveniently achieved by changing the voltage bias, and thus the resultant electric field, across a given device, e.g., a pixel. As discussed in greater detail below, photoconductive photovoltaic gain, and correspondingly the responsivity in A/W, can be made to vary approximately linearly with bias and field. Thus, in a given device, a bias of about 1 V may result in a gain of about 10, while a bias of about 10 V may result in a gain of about 100.

Some embodiments of QD devices include a QD layer and a custom-designed or pre-fabricated electronic read-out integrated circuit. The QD layer is then formed directly onto the custom-designed or pre-fabricated electronic read-out integrated circuit. The QD layer may additionally be patterned so that it forms individual islands. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation 1000 on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes.

In many embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Details of QD deposition and further processing are provided below. Because the QD layer need not require exotic or difficult techniques to fabricate, but can instead be made using standard CMOS processes, the QD optical devices can be made in high volumes, and with no significant increase in capital cost (other than materials) over current CMOS process steps.

Figure 2C:
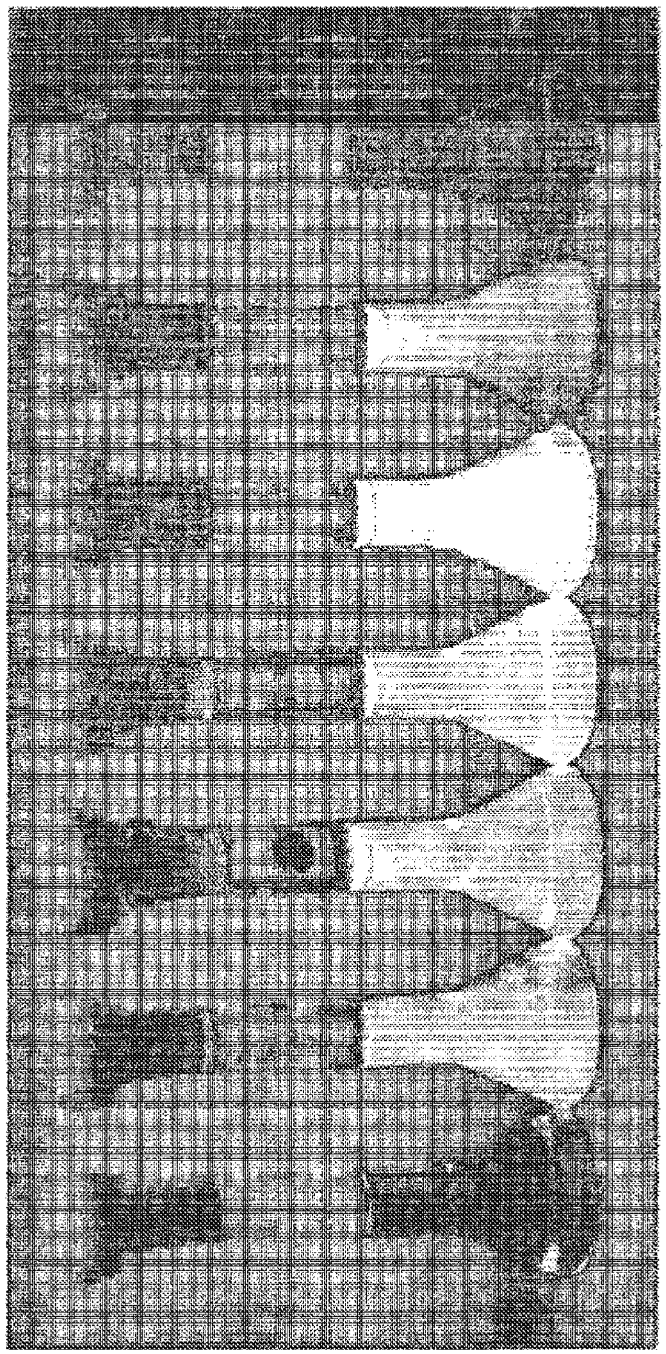
FIG. 2*c* shows colloidal quantum dots in an illustration taken from the Wikipedia website. Ultraviolet light is incident on various sizes of Cadmium selenide (CdSe) quantum dots 1200, resulting in fluoresence.
Figure 2D:
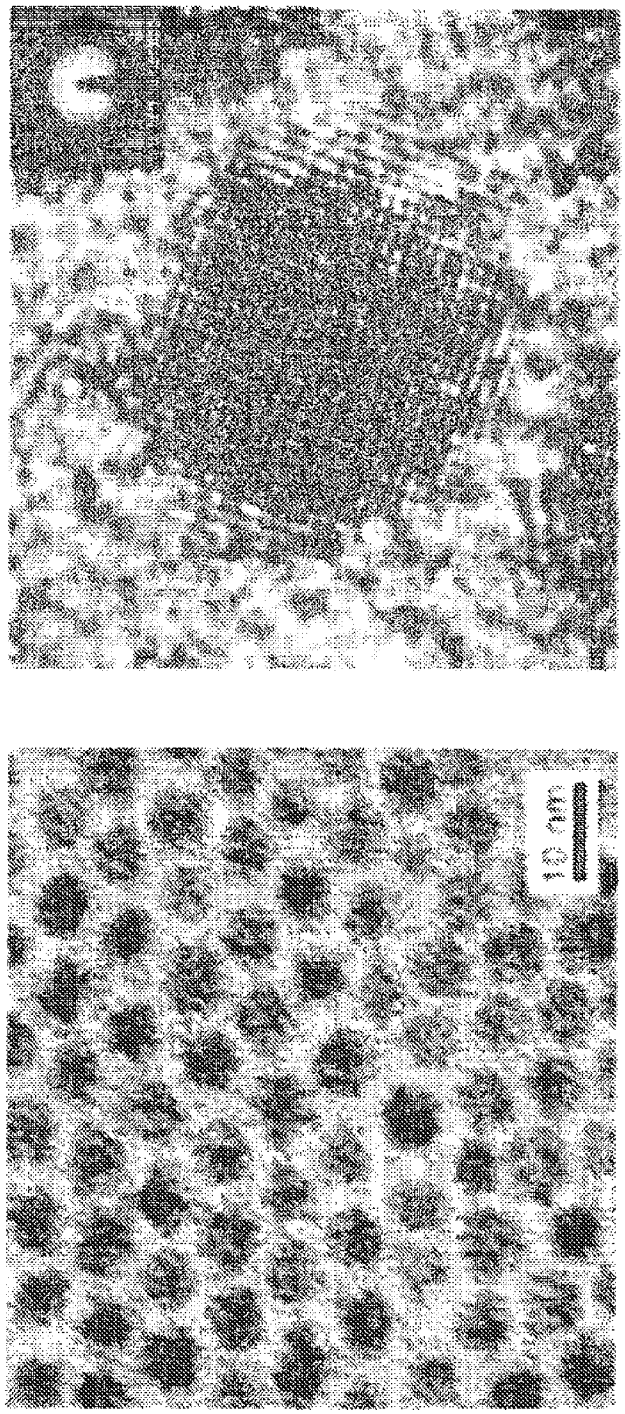
FIG. 2*d* shows various quantum dots 1200 arrayed in a quantum dot material 200.
Figure 2E:
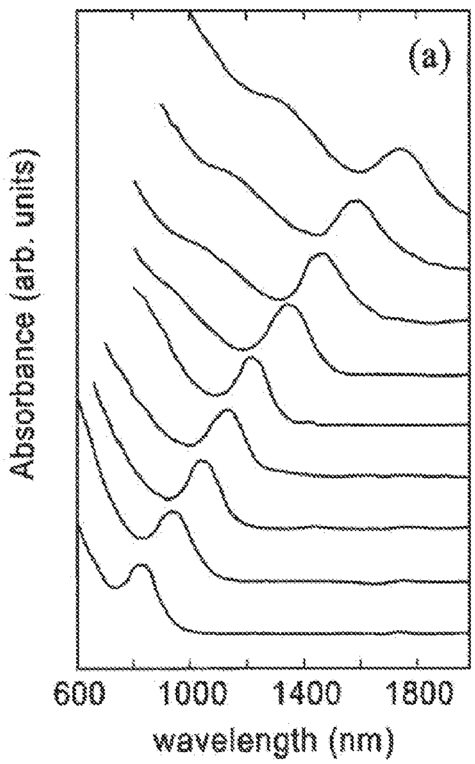
FIG. 2*e* further illustrates the absorbance of colloidal quantum dot material 200.

FIG. 2*e* further illustrates the absorbance of some example colloidal quantum dot materials 200.

Example nanocrystal materials that may be used as optically sensitive layers of QDs in example embodiments are described further below as well as methods for making the same, including those with fused or linked cores and trap states. These nanocrystal materials can be used to provide QD layers with photoconductive in example embodiments. Example embodiments of the QDPC 100 shown in FIG. 1 may use any of these nanocrystal materials as an optically sensitive layer to form a pixel region of a photosensor array. These nanocrystal materials may also be used to form the optically sensitive layer in embodiments of the other example image sensors, pixel regions and photoconductors described in this specification. In particular embodiments, the optically sensitive layer of the pixel regions is formed from compound semiconductor nanocrystal cores, such as PbS or other materials described below, that are fused or linked and oxides of the core material, such as PbS03, are formed on the outer surface to form trap states to provide photoconductive gain. These are examples only and other QDs or optically sensitive layers may be used in the pixel regions in other embodiments. In some embodiments, other optically sensitive layers such as silicon photodiodes may be used in combination with or instead of QDs for pixel regions or for particular layers in pixel regions.

Quantum Dot Structures 1100

An aspect of the example embodiment in FIG. 1 relates to quantum dot structures 1100. Quantum dot structures 1100 generally include quantum dots 1200, quantum dot materials 200 and quantum dot layouts 1300.

Example embodiments provide quantum dot (QD) 1200 devices and methods of making nanoscale crystalline material devices. Many embodiments are optical devices that possess enhanced gain and sensitivity, and which can be used in optical, including radiation 1000 imaging applications, photovoltaic applications, among other applications. The term "quantum dot" or "QD" is used interchangeably herein with the term "nanocrystal," and it should be understood that the present embodiments are not limited exclusively to standalone quantum dots but rather to any nanoscale crystalline material, including continuous films having nanoscale features, such as those formed by networks of fused or linked nanocrystal cores.

The term 'nanocrystal film' is used to describe a material that includes crystalline components that can typically range in size from 0.5 nm to 10 nm, and wherein the constituent nanocrystals' axes of symmetry (or of periodicity) in their repetition of atoms is, in generally, not well-ordered across the film, i.e. from nanocrystal to nanocrystal. The term 'colloidal quantum dot film' is used to describe nanocrystalline films wherein the constituent nanocrystals are approximately same-sized, such as a film in which the nanocrystals are on average 2 nm and have a standard deviation in diameter of less than 0.5 nm. There exists another category of quantum dots, known as epitaxial, or Stranski-Krastanow-grown quantum dots, that are not encompassed in the term 'nanocrystal film or 'colloidal quantum dot film' as defined herein. Epitaxial quantum dot solids are generally lattice-matched, and thus the constituent crystals possess approximately the same lattice orientation as one another.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, or as large as 30 by 30 microns or more or any range subsumed therein.

In many embodiments, the optically sensitive QD layer includes a plurality of QDs that have been specially processed to give the layer an enhanced gain and sensitivity. Specifically, a plurality of QDs may be fabricated using the methods described below, and in some embodiments may include a core as well as an outer surface that includes a plurality of ligands. The ligands may be exchanged for shorter ligands, in certain cases volatile ligands, and then the ligand-exchanged QDs are solution-deposited onto a substrate to form a QD precursor layer in some embodiments. Other methods for forming and/or depositing nanocrystal materials may also be used as described below. The substrate itself may include one or more electrodes, or the electrodes may be deposited in a later step. Subsequently, the short ligands are removed from the QD precursor layer in some embodiments. This may bring the QDs in the QD precursor layer into very close proximity. In embodiments, at least some of the QDs may make contact with their neighbors. This contact between QDs may be referred to as "necking." Bringing the nanoparticles closer together may produce an increased ease of movement of electrons and/or holes between nanoparticles, thus improving the mobility for charge carries traversing the electrical path within the layer.

In some embodiments, necked QDs may be annealed, which may fuse the necked QDs together. In this instance, the QD precursor layer may be maintained in an inert atmosphere after ligand removal, so that the outer surfaces of the individual QDs do not oxidize until annealing is complete. While two given fused QDs in the annealed QD layer retain a large portion of their original shape, and thus remain individually recognizable, after annealing the QDs may no longer be physically distinct from each other. Instead, the cores of the QDs together may form a continuous electrical path, which may thus further improve the conductivity of the electrical path within the layer. Thus, if many adjacent QDs neck, or fuse together into an annealed QD layer, they may form an electrical pathway with a physical extent that is substantially greater than that of the individual QDs, and through which current will readily flow. In some embodiments, a QD film may have a macroscopic extent, though the QDs themselves are nanoscopic. In some embodiments, the finished QD layer may essentially be considered a continuous inorganic film having nanoscale features. The general shapes of the individual QDs may still be recognizable, but their cores form a continuous electrical pathway that is mechanically robust. For example, a micrograph of the finished QD layer would show the general shape and size of the individual QDs from which the layer is formed, as well as robust joints between many adjacent QDs. In some embodiments, the nanocrystal cores may be linked by other molecules rather than fused together.

In many embodiments, the fused QD layer is subsequently processed to modify its outer surfaces. For example, a material such as a semiconductor shell can be coated on the outer surfaces of the fused quantum dots. Or, for example, defect states can be formed on the exposed outer surfaces of the QDs, e.g., by oxidizing the fused QDs layer. These defect states effectively trap electrons excited by photons, so that they recombine with holes far less readily and thus greatly enhance the amount of current that a given photon generates in the finished QD layer. This greatly enhances the photoconductive gain of the device. The fused QD cores, and the juncture between them, will generally not have defect states, so current will flow readily between them, in certain embodiments. Photoconductive gain occurs because the persistence of the trap state is longer than the transit time of carriers across the layer of nanocrystal material.

Photodetector Structures 1400

An aspect of the example embodiment in FIG. 1 relates to photodetector structures 1400. Photodetector structures 1400 generally include electrical connections 1404 that are connected to the quantum dot structures 1100 and adapted to carry an electric signal or charge from the quantum dot structures 1100 to be communicated to associated pixel circuitry 1700. The electrical interconnections 1404 may be laid out in a photodetector geometric layout 1402 that corresponds with a quantum dot layout 1300 as described herein. For example, if the quantum dot layout is a closed interdigitated pattern 1438 then the layout of the electrical interconnections may be laid out in a similar pattern such that the electrical charge or signal from the nodes can be transferred from the dots to the pixel circuitry 1700. In other embodiments, the electrical interconnections may be laid out in a particular pattern and the quantum dot structures 1100 may be laid out in another pattern (e.g. dispersed in a continuous film) such that the electrical interconnections 1404 draw charge or signal from only a portion of the quantum dot structure 1100.

In embodiments the photodetector structure includes a semiconductor film contacted with some number of electrodes. While many of the embodiments disclosed herein describe the use of photodetectors structures with image detection systems, it should be understood that the photodetector may be a photodiode (e.g., photovoltaic with gain or no gain) or a photoconductor in some embodiments. The photoconductor may generally pass holes and stop or fail to pass electrons. Some of the energetic relationships include Fermi energy, work function, valence energy, and conduction band edge. Photodetector structures 1400 may contain material combinations such as including or containing two or more types of quantum dots. In some example embodiments, the photodetector structures may form a unipolar device in which the transport of one carrier type (electrons or holes) predominates over the transport of the other type (holes or electrons). For example, in PbS photoconductive colloidal quantum dot detectors described herein, holes may be the flowing carrier and may have a mobility of at least 10× greater than electrons. For example, the hole mobility may equal 1E-4 cm2/Vs while the electron mobility may be inferior to 1E-5 cm2/Vs.

The photodetector structure 1400 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure 1100. In an embodiment, the electrical interconnections 1404 may include a KDP electric field detector or other field detection system. Once an electrical connection is made with the quantum dot structure and made available, it may be read through contact (e.g. charge, voltage, current, power, resistance) or non-contact (e.g. magnetic field, electric field, capacitance, inductance) measurement methods.

In embodiments, the photodetector structure 1400 may include multiple layers of quantum dot material 200, spin-coated on top of one another. There may be insulating materials laid down between these layers in order to reduce crosstalk between the layers. In embodiments, this material may be a very thin dielectric material, with a thickness of 1000 angstroms for instance. The application of this dielectric may involve process steps to assure that the dielectric does not interfere with the electrical contacts intended to connect with the layers of quantum dot material 200, such as by masking off or removal from the electrical connections. For instance, removal may involve an etching process. In embodiment, the dielectric may be laid down vertically to avoid making contact with the top of the electrodes.

In an embodiment, post-processing may involve sensitization of a photodetector 1400 by a combination of illumination and temperature. The photodetector 1400 sensitivity may freeze in place as long as there is uniform illumination; all other parameters may reach an equilibrium value. For example, a photodetector 1400 may be sensitized by heating to a temperature for a period of time. A combination of time and temperature may affect the sensitivity. Power from the photodetector 1400 may be dissipated on a pixel-by-pixel basis. Power may be inversely proportional to the response. Dissipation may normalize the response. Post-processing may involve illumination with a flat field that results in a consistent photodetector response across an array. The self-flattening may involve uniform illumination of the whole sensor: if there were pixels not having the desired level of gain, the uniform illumination will serve to increase their gain. Large currents may go through "hot" pixels, which may diminish their response. If the sensor is exposed to a uniform optical field, it may anneal to a flat response.

The quantum dot structures 1100 may also have planar layouts in some embodiments. The planar layouts may be provided to increase the sensitivity of a QDPC to a certain wavelength or range of wavelengths for example. Patterns of quantum dot structures in the horizontal plane may be provided for a number of reasons including, for example, increasing the sensitivity to a wavelength, decreasing the sensitivity to a wavelength, and compensating for the absorption, refraction, reflection or other properties associated with the materials.

In embodiments, a charge region is produced in the quantum dot structure 1100 such that charges produced in the charge region as a result of incident radiation 1000 are isolated from those associated with adjacent charge regions, and the effect of illumination only over the region of interest can be measured. This method can be used to create a map of charge response areas that define the pixels or portions of the pixels. For example, within a layer of quantum dot structure 1100 it may be desired to define areas (e.g., millions of areas) that may be used as separate pixel portions. A matrix or set of positively biased electrodes and ground plane or negatively charged electrodes may be associated with the layer (e.g. through a set or matrix of electrical interconnects). When radiation 1000 to which the layer is responsive falls on the sub portion of the layer a charge in a corresponding area develops and is moved towards the positively biased electrode in the area. By monitoring the electrodes the area of activity can be identified, and the intensity can be measured and associated with a particular pixel or group of pixels. Several planar electrical interconnection patterns are illustrated in FIGS. 3*b*-3*e* including examples of such patterns. Each of the patterns presented in FIGS. 3*b*-3*e* illustrates a positively biased electrical interconnection 1452 and a ground or negatively biased interconnection 1450 as an example of how such an arrangement may operate, but other configurations and biases may be used in other embodiments.

Figure 3:
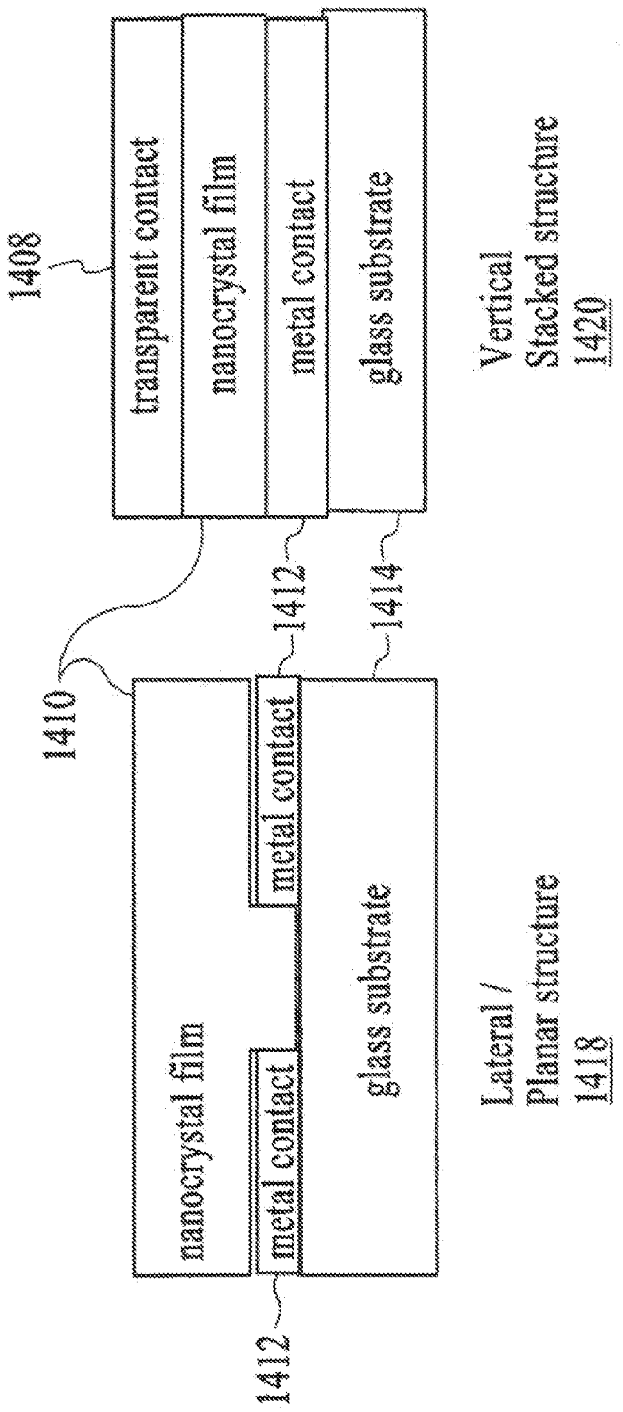
FIG. 3 is a side view of a portion of an embodiment of imaging configured in a lateral planar structure.
Figure 3A:
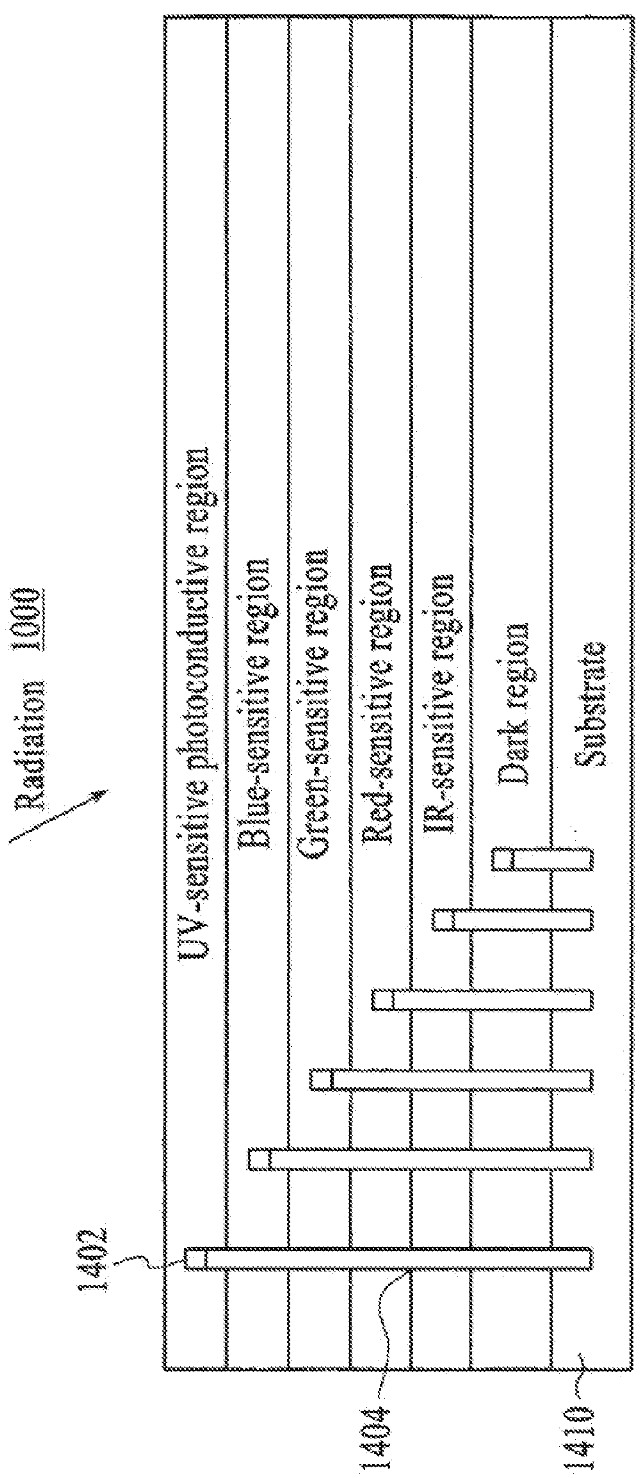
FIG. 3*a* shows radiation entering pixel layouts.
Figure 3B:
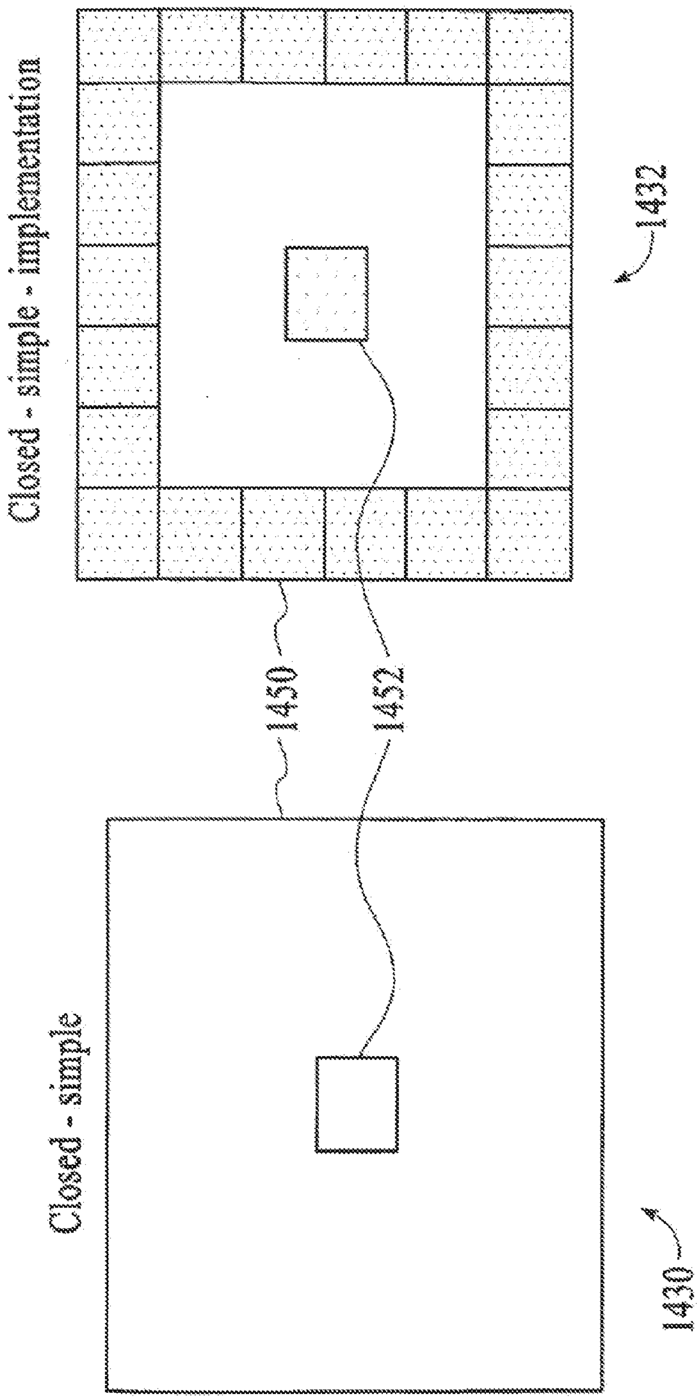
FIG. 3*b* shows an aspect of a closed simple geometrical arrangement of pixels.

FIG. 3*b* represents closed—simple patterns 1430 (e.g., conceptual illustration) and 1432 (e.g., vias used to create photodetector structures). In the closed-simple illustrations 1430-1432 the positively biased electrical interconnect 1452 is provided in the center area of a grounded contained square electrical interconnect 1450. Square electrical interconnect 1450 may be grounded or may be at another reference potential to provide a bias across the optically sensitive material in the pixel region. For example, interconnect 1452 may be biased with a positive voltage and interconnect may be biased with a negative voltage to provide a desired voltage drop across a nanocrystal material in the pixel region between the electrodes. In this configuration, when radiation 1000 to which the layer is responsive falls within the square area a charge is developed and the charge is attracted to and move towards the center positively biased electrical interconnect 1452. If these closed-simple patterns are replicated over an area of the layer, each closed simple pattern forms a portion or a whole pixel where they capture charge associated with incident radiation 1000 that falls on the internal square area. In example embodiments, the electrical interconnect 1450 may be part of a grid that forms a common electrode for an array of pixel regions. Each side of the interconnect 1450 may be shared with the adjacent pixel region to form part of the electrical interconnect around the adjacent pixel. In this embodiment, the voltage on this electrode may be the same for all of the pixel regions (or for sets of adjacent pixel regions) whereas the voltage on the interconnect 1452 varies over an integration period of time based on the light intensity absorbed by the optically sensitive material in the pixel region and can be read out to generate a pixel signal for each pixel region. In example embodiments, interconnect 1450 may form a boundary around the electrical interconnect 1452 for each pixel region. The common electrode may be formed on the same layer as interconnect 1452 and be positioned laterally around the interconnect 1450. In some embodiments, the grid may be formed above or below the layer of optically sensitive material in the pixel region, but the bias on the electrode may still provide a boundary condition around the pixel region to reduce cross over with adjacent pixel regions.

Figure 3C:
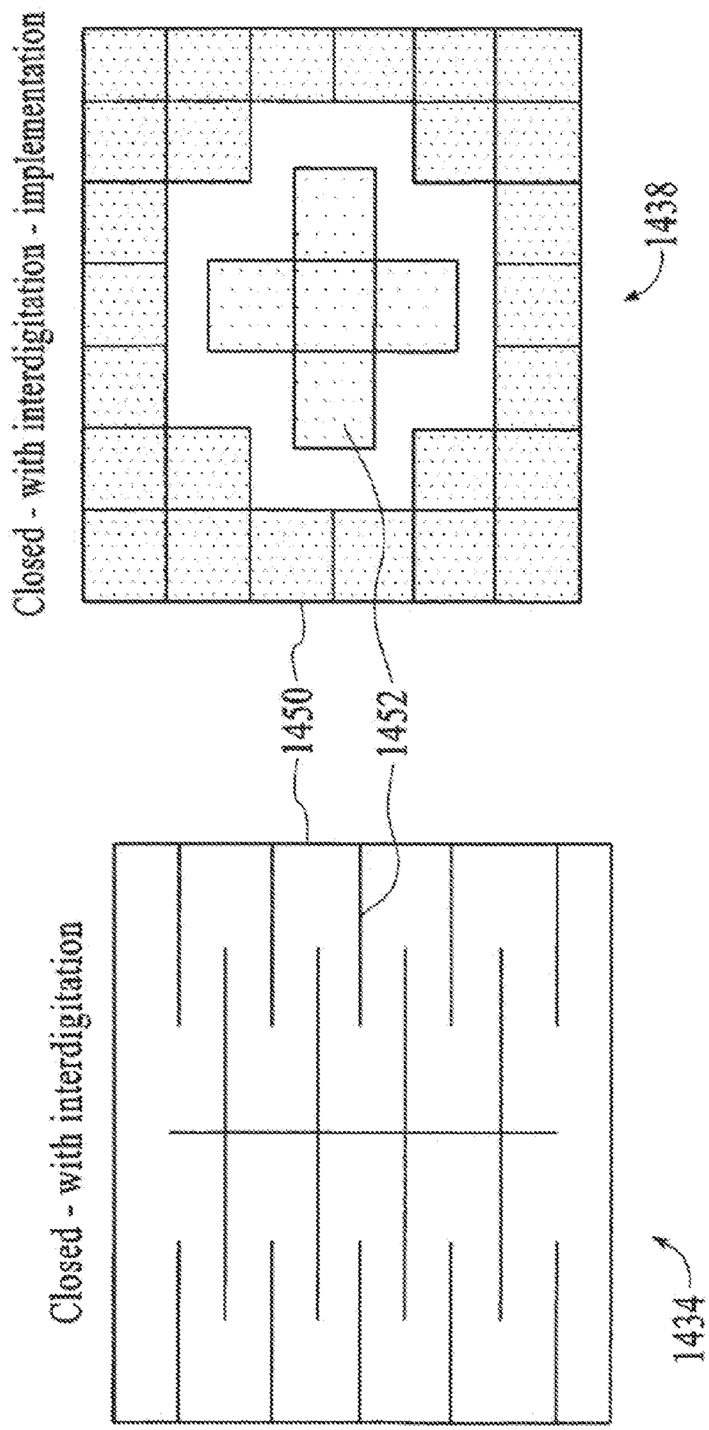
FIG. 3*c* shows an aspect of a closed with interdigitation geometrical arrangement of pixels.

FIG. 3*c* illustrates closed patterns of electrical interconnections with interdigitation 1434 (e.g., conceptual illustration) and 1438 (e.g., vias used to create photodetector structures). The interdigitation creates a pattern where the electrical interconnections are intertwined in some manner. Similar to the closed-simple patterns, these closed patterns may be used to capture charge within the confines of the outer grounded electrical interconnect 1450 and move the charges to the positively biased electrical interconnect 1452. As with FIG.

3*b*, outer electrical interconnect 1450 may be grounded or be at some other reference potential and may form a common electrode around an array of pixels or set of adjacent pixels.

Figure 3D:
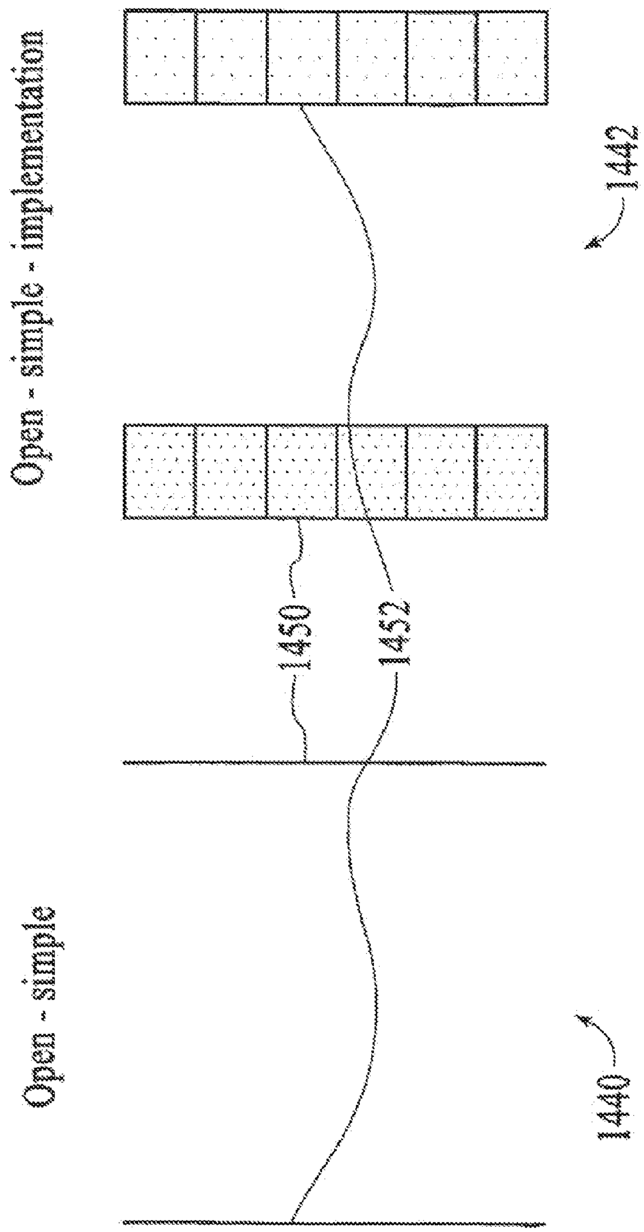
FIG. 3*d* shows an aspect of a open simple geometrical arrangement of pixels.

FIG. 3*d* illustrates open simple patterns of electrical interconnects. The open simple patterns do not, generally, form a closed pattern. The open simple pattern does not enclose a charge that is produced as the result of incident radiation 1000 with the area between the positively biased electrical interconnect 1452 and the ground 1450; however, charge developed within the area between the two electrical interconnects will be attracted and move to the positively biased electrical interconnect 1452. An array including separated open simple structures may provide a charge isolation system that may be used to identify a position of incident radiation 1000 and therefore corresponding pixel assignment. As above, electrical interconnect 1450 may be grounded or be at some other reference potential. In some embodiments, electrical interconnect 1450 may be electrically connected with the corresponding electrode of other pixels (for example, through underlying layers of interconnect) so the voltage may be applied across the pixel array. In other embodiments, the interconnect 1450 may extend linearly across multiple pixel regions to form a common electrode across a row or column.

Figure 3E:
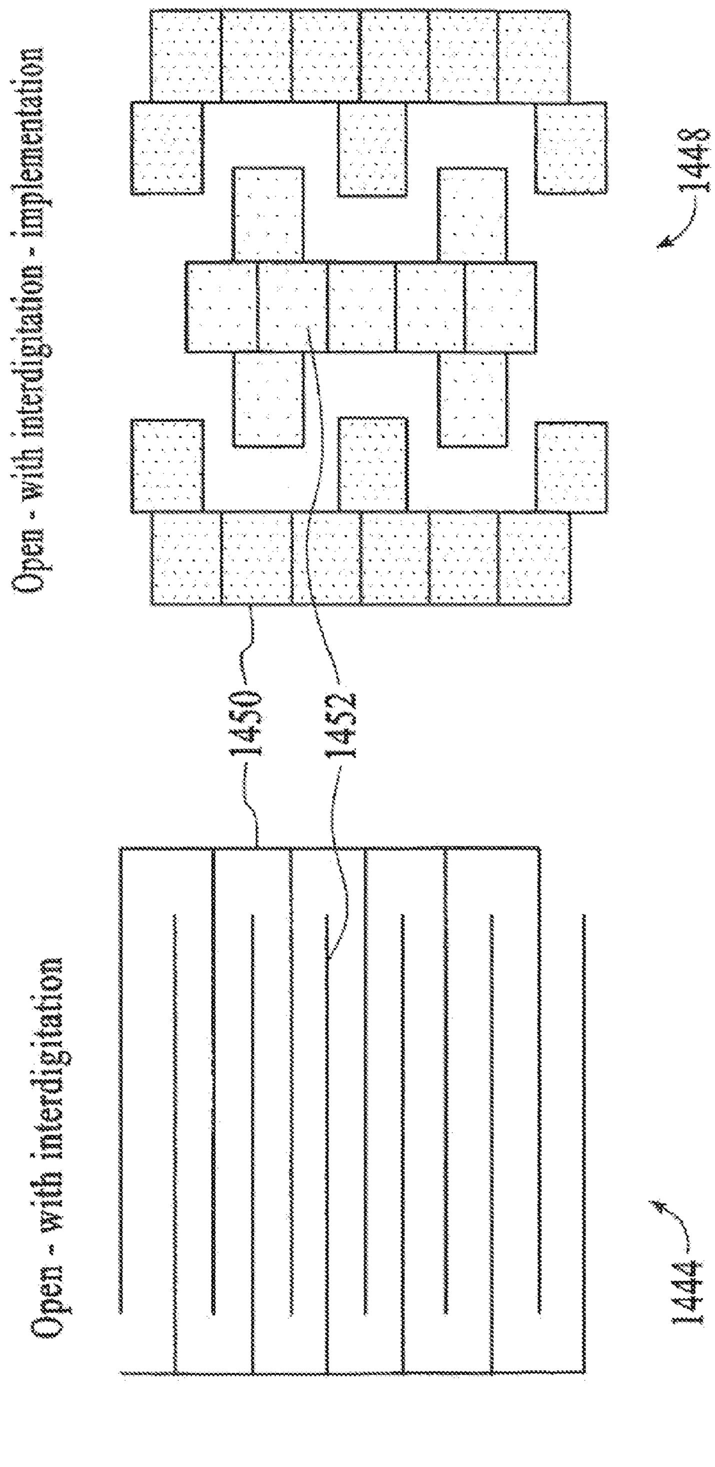
FIG. 3*e* shows an aspect of an open with interdigitation geometrical arrangement of pixels.

FIG. 3*e* illustrates open interdigitated patterns where the patterns do not generally form a closed pattern and possess some form of interdigitation. The open interdigitated patterns may include a positive interconnection 1452 and ground (or other reference potential) interconnection 1450. This configuration may capture charge developed within the area between the two electrical interconnects and attract and move the charge to the positively-biased electrical interconnect 1452. An array including separated open interdigitated structures may provide a charge isolation system that may be used to identify a position of incident radiation 1000 and therefore corresponding pixel assignment. As above, the interconnect 1450 may form a common electrode with adjacent pixel regions in some embodiments.

Figure 3F:
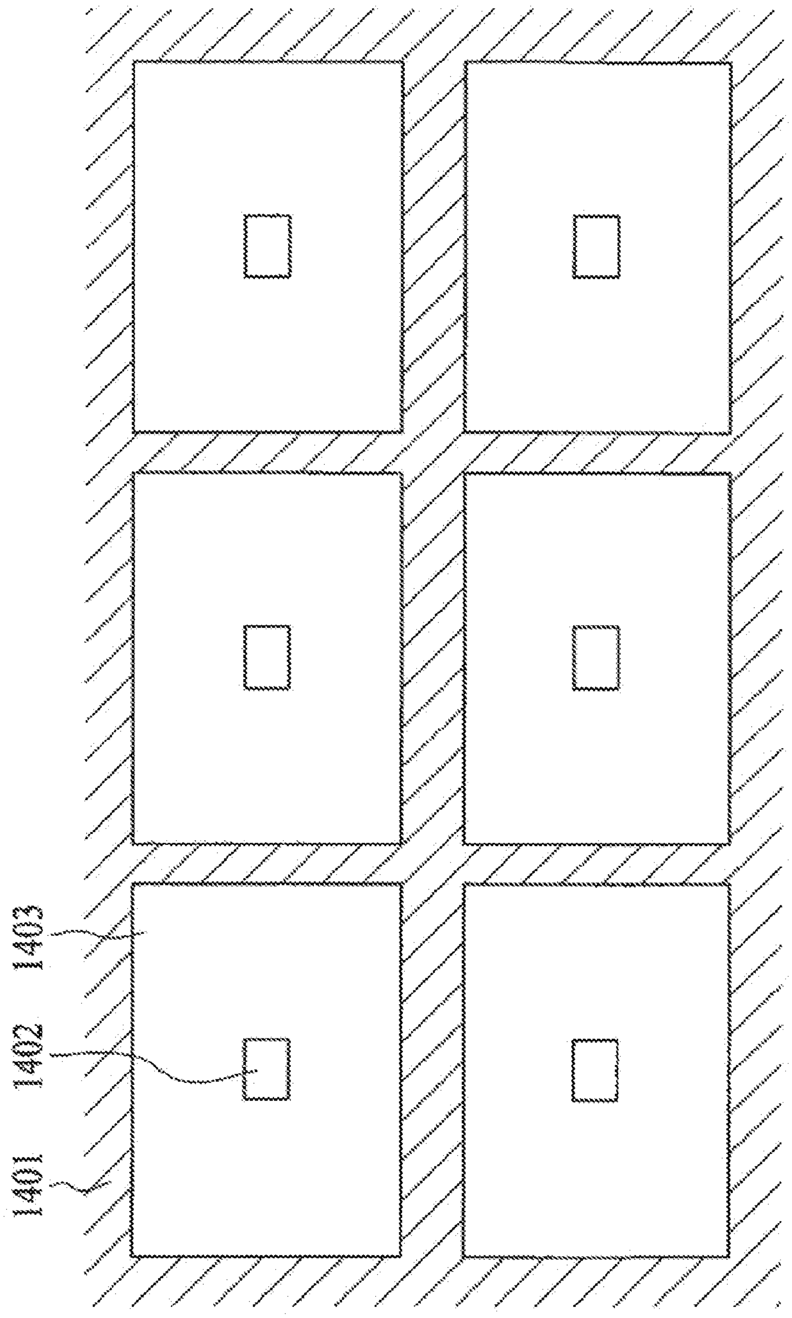
FIG. 3*f* shows a two-row by three-column sub-region within a generally larger array of top-surface electrodes.
Figure 3G:
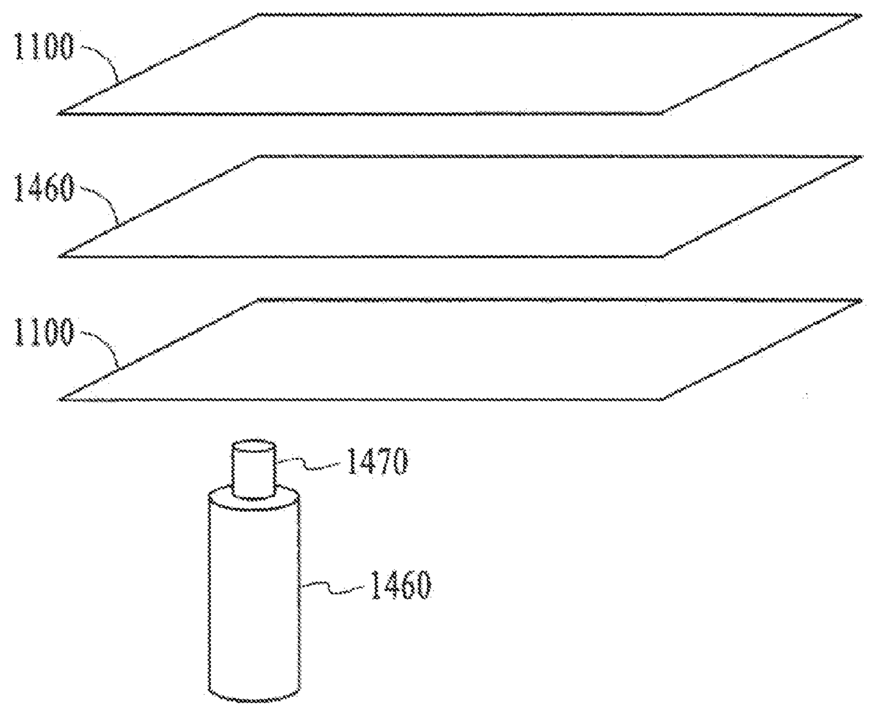
FIG. 3*g* shows a quantum dot structure stack involving two separate layers of quantum dot materials and a layer of dialetric material between the two separate layers of quantum dot materials.

FIG. 3*f* shows a two-row by three-column sub-region within a generally larger array of top-surface electrodes. The array of electrical contacts provides electrical communication to an overlying layer of optically sensitive material. 1401 represents a common grid of electrodes used to provide one shared contact to the optically sensitive layer. 1402 represents the pixel-electrodes which provide the other contact for electrical communication with the optically sensitive layer. In embodiments, a voltage bias of −2 V may be applied to the common grid 1401, and a voltage of +2.5 V may be applied at the beginning of each integration period to each pixel electrode 1402. Whereas the common contact 1401 is at a single electrical potential across the array at a given time, the pixel electrodes 1402 may vary in time and space across the array. For example if a circuit is configured such that the bias at 1402 varies in relation to current flowing into or out of 1402, then different electrodes 1402 may be at different biases throughout the progress of the integration period. Region 1403 represents the non-contacting region that lies between 1401 and 1402 within the lateral plane. 1403 is generally an insulating material in order to minimize dark current flowing between 1401 and 1402. 1401 and 1402 may generally consist of different materials. Each may for example be chosen for example from the list: TiN; TiN/Al/TiN; Cu; TaN; Ni; Pt; and from the preceding list there may reside superimposed on one or both contacts a further layer or set of layers chosen from: Pt, alkanethiols, Pd, Ru, Au, ITO, or other conductive or partially conductive materials.

In example embodiments using the above structures, interconnect 1452 may form an electrode in electrical communication with a capacitance, impurity region on the semiconductor substrate or other charge store. In some embodiments, a voltage is applied to the charge store and discharges due to the flow of current across the optically sensitive film over an integration period of time. At the end of the integration period of time, the remaining voltage is sampled to generate a signal corresponding to the intensity of light absorbed by the optically sensitive layer during the integration period. In other embodiments, the pixel region may be biased to cause a voltage to accumulate in a charge store over an integration period of time. At the end of the integration period of time, the voltage may be sampled to generate a signal corresponding to the intensity of light absorbed by the optically sensitive layer during the integration period. In some example embodiments, the bias across the optically sensitive layer may vary over the integration period of time due to the discharge or accumulation of voltage at the charge store. This, in turn, may cause the rate of current flow across the optically sensitive material to also vary over the integration period of time. In addition, the optically sensitive material may be a nanocrystal material with photoconductive gain and the rate of current flow may have a non-linear relationship with the intensity of light absorbed by the optically sensitive layer. As a result, in some embodiments, circuitry may be used to convert the signals from the pixel regions into digital pixel data that has a linear relationship with the intensity of light absorbed by the pixel region over the integration period of time. The non-linear properties of the optically sensitive material can be used to provide a high dynamic range, while circuitry can be used to linearize the signals after they are read in order to provide digital pixel data. Example pixel circuits for read out of signals from pixel regions are described further below.

In some embodiments, the optically sensitive material in each pixel region is a nanocrystal material and has symmetric properties when the polarity of the bias is reversed. In some embodiments, the voltage on interconnect 1450 (which may be a common electrode for the pixel array) may be varied during the read out cycle rather than held at ground or a constant reference potential. For example, the voltage may be varied to reset or control the pixel circuit during transitions of the read out cycle as described further below.

The above photoconductor structures are examples only and other structures may be used on other embodiments.

Some of the properties and characteristics of example embodiments of photodetectors will now be described. These properties and characteristics may be tailored based on the nanocrystal materials that are used, the bias that is applied and the size and geometry of the pixel regions. Example nanocrystal materials and methods of making the same are described further below. Example embodiments may include any of these optically sensitive layers used in the photodetector structures described above or elsewhere in this specification and the resulting photodetector structures may be used in example embodiments with any of the pixel circuits and system circuitry described below in this specification. These combinations are examples only and the nanocrystal materials and photodetector structures may be used in other embodiments as well.

In some example embodiments, photodetectors of the type described above may have one or more of the following properties:

be readily integrable with other circuitry related to the image sensing function, such as circuits which store charge, circuits which relay signal levels to the periphery of the array, circuits which manipulate these signal levels in the analog domain, circuits which convert analog into digital signals, and circuits which process image-related data in the digital domain.

provide a maximum of sensitivity to light within the wavelength band, or bands, of interest. Sensitivity is often quantified using the measure signal-to-noise (SNR) at a given level of illumination. Signal is maximized when the responsivity, quantum efficiency, or gain of the device is maximized. Noise is minimized when random fluctuations in electronic signals are minimized, subject to the limits prescribed by natural fluctuations in electrical currents and voltages at a given temperature. Relatedly, noise and other uncontrolled or difficult-to-predict variations in background signal are generally minimized when the magnitude of dark current is minimized. For this and other reasons, photodetectors having high sensitivity and low dark current may be desired in many embodiments.

provide a response in time that is suitably fast. Applications such as video imaging and shutterless still-image acquisition typically require photodetectors whose signal levels change substantially completely in response to a transient within fewer than 100 milliseconds (10 frames per second), or fewer than 33 milliseconds (30 frames per second), or even 1 millisecond (1/1000 second exposure of a still image).

provide for the detection of a wide range of light intensities in a manner that can conveniently be processed by available electronic circuitry. This feature is known as providing high dynamic range. One means of providing high dynamic range is to compress the measured electronic response as a function of the incident optical stimulus. Such compression may be referred to as a sublinear, i.e. a nonlinear with decreasing slope, dependence of electrical signal on incident intensity. High dynamic range may also be facilitated by employing a photodetector whose gain may be controlled, such as through the selection of a voltage bias known to produce a specific gain.

provide for the convenient discrimination among different spectral bands of electromagnetic radiation. Of particular interest are the x-ray, ultraviolet, visible (including blue, green, and red), near-infrared, and short-wavelength infrared bands.

Example embodiments may provide photoconductors and arrays of photodetectors, that possess one or more of these properties in combination as follows:

the photodetectors in example embodiments can readily be integrated with other portions of the image sensor circuit and system by straightforward, low-cost methods such as spin-coating, spray-coating, drop-coating, and self-assembly. Embodiments include exchanging ligands passivating nanoparticle surfaces for shorter ligands that will provide for appropriate charge carrier mobilities once films are formed. Embodiments include solution-phase exchanges which enable the realization of smooth-morphology films necessary to the realization of image sensors having acceptable consistent dark currents and photoresponses across an array.

The photodetectors in example embodiments can provide a maximum of sensitivity through a combination of means. They maximize signal by providing photoconductive gain. Typical values for photoconductive gain range from 1-10, resulting in responsivities in, for example, the visible wavelengths ranging from 0.4 A/W to 4 A/W. In embodiments, the photodetectors described herein minimize noise by fusing nanocrystal cores such as to ensure substantially non-noise-degrading electrical communication among the particles making up the optically sensitive layer through which current flows. In embodiments, the photodetectors described herein minimize dark current by minimizing the net doping of the active layer, thus ensuring that the dark carrier density, and thus the dark conductance, of these optically sensitive materials is minimized. In embodiments, the photodetectors described herein minimize dark current by providing an electrode-to-nanocrystalline-layer electrical connection that blocks typically one type of carrier, including potentially the majority carrier at equilibrium. In embodiments, cross-linking molecules are employed that utilize chemical functionalities that remove oxides, sulfates, and/or hydroxides responsible for p-type doping. Thus, in embodiments, a more intrinsic or even n-type optically sensitive layer may be provided, leading to lowered dark currents. In embodiments, many steps in quantum dot synthesis and/or processing and/or device packaging may be performed in a controlled environment such as a Schlenk line or Glove Box; and optically sensitive layers may be encapsulated using substantially impermeable layers such as oxides, oxynitrides, or polymers such as parylene, or epoxies, in order to prevent reactive gases such as oxygen or water from significantly permeating the optically sensitive layer. In this manner, desired combinations of properties such as gain, dark current, and lag may be preserved over the desired useful lifetime of an image sensor.

The photodetectors in example embodiments provide a time-domain response that can be as rapid as sub-100-milliseconds, sub-30-milliseconds, and sub-1-millisecond. In embodiments, this is achieved by providing gain-providing (and persistence-providing) trap states associated with the optically sensitive layer that trap at least one type of carrier for only a limited time period such as 100 milliseconds, 30 milliseconds, or 1 millisecond. In some embodiments, PbS nanoparticles are decorated with PbSO3, an oxide of PbS, which is shown to have a trap state lifetime in the vicinity of 20-30 milliseconds, providing for a transient response suited to many video imaging applications. In some embodiments, photodiodes are instead provided based on colloidal quantum dot layers, wherein two electrical contacts having appreciably different work functions are employed to contact the active layer. In some embodiments, dark currents may be minimized through operation of such devices without the application of an appreciable external voltage bias. In some embodiments, cross-linking moieties such as benzenedithiol, a bidentate linker, may be employed to remove and/or passivate certain trap states that may be present, or may develop, in such materials.

The photodetectors in example embodiments provide a means of enhancing dynamic range by producing a sublinear dependence of electrical signal (such as photocurrent). Over a region of low to middling intensities, trap states are available to become filled, and escape occurs following some moderate persistence, or trap state, lifetime, such as 30 milliseconds for example. At higher intensities, these trap states become substantially filled, such that charge carriers experience shorter lifetimes, or persistence times, corresponding to lower differential gains. As a result these devices exhibit substantially constant gains over a range of low to middling intensities, followed by a gentle roll-off in gain at higher intensities. Put another way, at low to middling intensities, photocurrent depends approximately linearly on intensity, but at higher intensities, photocurrent exhibits sublinear dependence on intensity. In embodiments, photodetectors are provided wherein photoconductive gain depends on the bias applied to a device. This arises because gain is proportional to carrier lifetime divided by carrier transit time, and transit time varies in inverse proportionality with applied field. In embodiments, circuits are developed that exploit this dependence of gain on bias to increase dynamic range.

In example embodiments, photodetectors may readily be altered, or 'tuned', to provide sensitivity to different spectral bands. One means of tuning is provided through the quantum size effect, whereby nanoparticle diameter is decreased, in cases through synthetic control, to increase the effective bandgap of the resulting quantum dots. Another means of tuning is provided through the choice of materials composition, wherein the use of a material having a larger bulk bandgap generally facilitates the realization of a photodetector with responsivity onset at a higher photon energy. In embodiments, photodetectors having different absorption onsets may be superimposed to form vertical pixels, wherein pixel(s) closer to the source of optical signal absorb and sense higher-energy bands of electromagnetic radiation, whereas pixel(s) further from the source of optical signal absorb and sense lower-energy bands.

In a particular example embodiment of a photodetector 1400, a solution-processed route to ultrasensitive photodetectors 1400 (e.g., D* ~$10^{13}$ Jones) comprises synthesizing PbS colloidal quantum dots, exchanging their organic capping ligands in solution, forming thin film photodetectors by spin-coating, and implementing a developing step to modify conductivity and modify trap states, resulting in photoconductive gains such as 1.5, 2, 5, 10, 20, 50, or 100 (See for example: Konstantatos, G. et al. Ultrasensitive solution-cast quantum dot photodetectors. Nature 442, 180-183 (2006)). The photodetector 1400 may employ an infrared or a visible bandgap.

In another embodiment of a photodetector 1400, a thin-film photodetector 1400 may be coated onto a chip. The thin-film photodetector 1400 may be more sensitive than example silicon photodiodes and may provide built-in gain which may simplify read-out circuit design. The use of a bias-dependent and/or intensity-dependent gain may enable enhanced dynamic range. The photodetector 1400 may employ colloidal quantum dots 1200 which may offer an advantage over conventional bulk semiconductors, such as crystalline, amorphous, or organic, in that the quantum dots are quantum size-effect tunable. The thin-film photodetector 1400 may comprise a stacked multi-spectral pixel which may incorporate use of the quantum size-effect tenability of the quantum dots 1200. The thin-film photodetector 1400 may be formed from quantum dot materials 200 subject to a post-film-formation treatment wherein long, insulating ligands may be exchanged for short ones, which may lead to highly sensitive visible photodetectors 1400. Thin-film post-processing may enable the integration of top-surface thin-film photodetectors 1400 with crystalline silicon. The photodetector 1400, across the entire visible spectrum, may exhibit a normalized detectivity D* ~$10^{13}$ Jones. The photodetector 1400 may exhibit photoconductive gains greater than unity, and ranging from 1.5 to 100, facilitating high-fidelity electronic read-out. The photodetector 1400 may enable between 3 dB and 20 dB greater dynamic range than provided in a constant-gain photodetector. The photodetector 1400 exploits quantum size effect tunability to demonstrate a stacked multicolor pixel.

The thin-film photodetector 1400 of example embodiments may meet demanding performance requirements including but not limited to sensitivity, gain, tunability, and dynamic range to name a few. The performance characteristics of some example embodiments are described in turn below.

Regarding sensitivity, a top-surface visible-wavelength photodetector 1400 for visible imaging may ideally meet or exceed silicon's sensitivity. One measure of sensitivity may be the noise-equivalent power NEP, the minimum incident optical power that a device can distinguish from noise. However, since noise current in a photodetector may not scale linearly with area, a quantity known as the normalized detectivity D*, with units of $cmHz^{1/2}W^{-1}$ ("Jones"), is defined. The figure of merit D* is equal to the square root of the optically active area of the detector divided by its noise equivalent power (NEP). D* enables comparison between photodetectors of different areas.

Regarding gain, example silicon photodiodes may provide up to one electron's worth of current per incident photon. Under low-light conditions, and especially in small pixels, this may necessitate the use of extremely low-noise electronic amplifying circuits. Ideally, a photodetector would provide built-in gain, allowing for multiple carriers to be collected in pixel circuitry per absorbed photon, thus lessening demands on read-out circuitry. For example, in photoconductive photodetectors 1400, the creation of an electron-hole pair upon absorption of a photon may result in an increase in conductivity that persists for the excited carrier lifetime.

As for tunability, quantum size-effect tuning may enable selecting the semiconductor bandgap according to the needs of the application. For visible imaging, the optimal-bandgap sensor material would absorb only visible light, obviating the need for an infrared cutoff filter and, by maximizing bandgap, minimizing recombination-generation noise. A tunable materials system also enables a stacked pixel architecture, wherein a large-bandgap photodetector senses, and also filters out, higher-energy light, passing only the longer-wavelength light to the independently-read pixel elements beneath. Such architectures offer improved low-light sensitivity compared to (lossy) absorbent color filter arrays.

For dynamic range, the ratio of full-well capacity of CMOS image sensors to the number of dark electrons limits dynamic range to about 3 orders of magnitude in intensity (conventionally expressed as 60 dB in imaging). A photodetector 1400 may provide at least this much dynamic range. A photodetector 1400 may, by virtue of its bias-tunable gain and/or its intensity-dependent gain, allow controlled signal compression for dynamic range enhancement.

Nanocrystal material exhibiting the above properties and methods of making the same are described in further detail below.

Quantum Dot Pixel 1800

In the example embodiment of FIG. 1, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, potential to bin, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

Figure 7A:
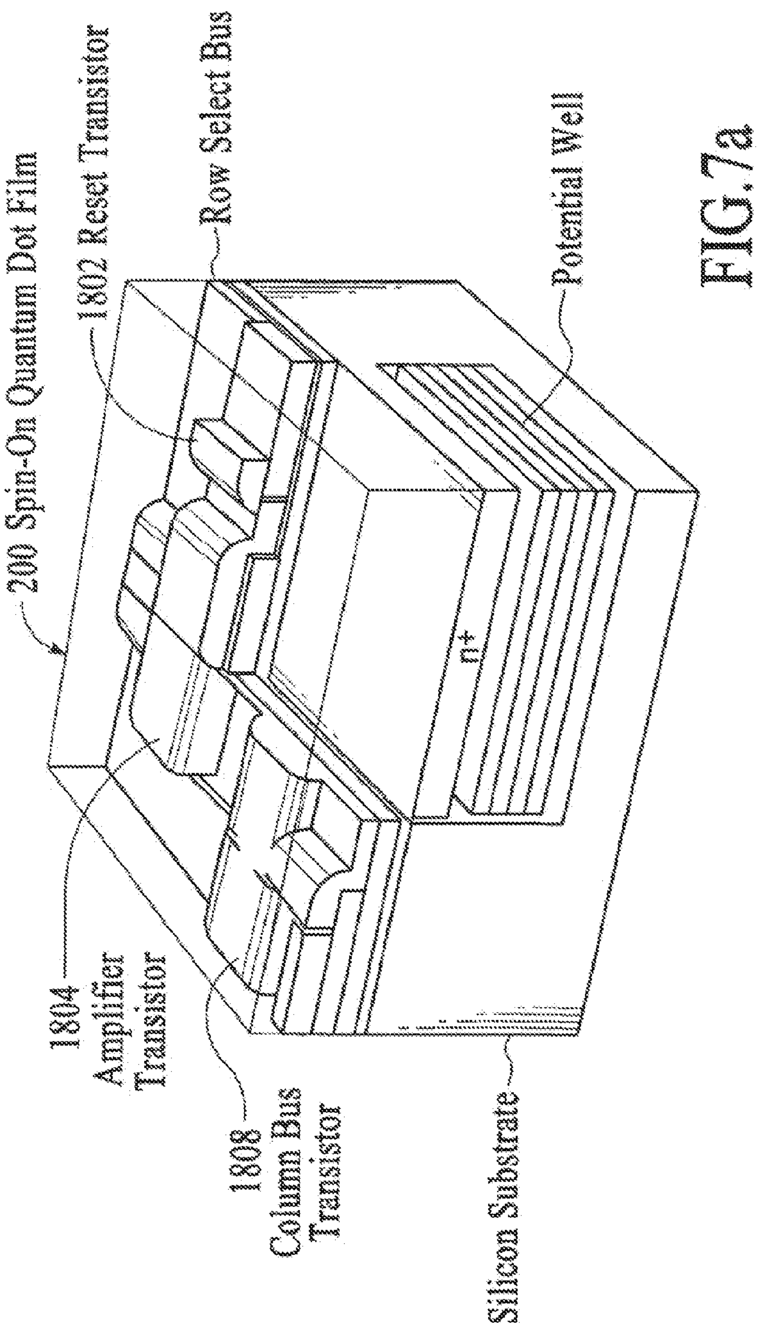
FIG. 7*a* shows a quantum dot pixel 1800 structure according to an aspect of the present embodiment.
Figure 7B:
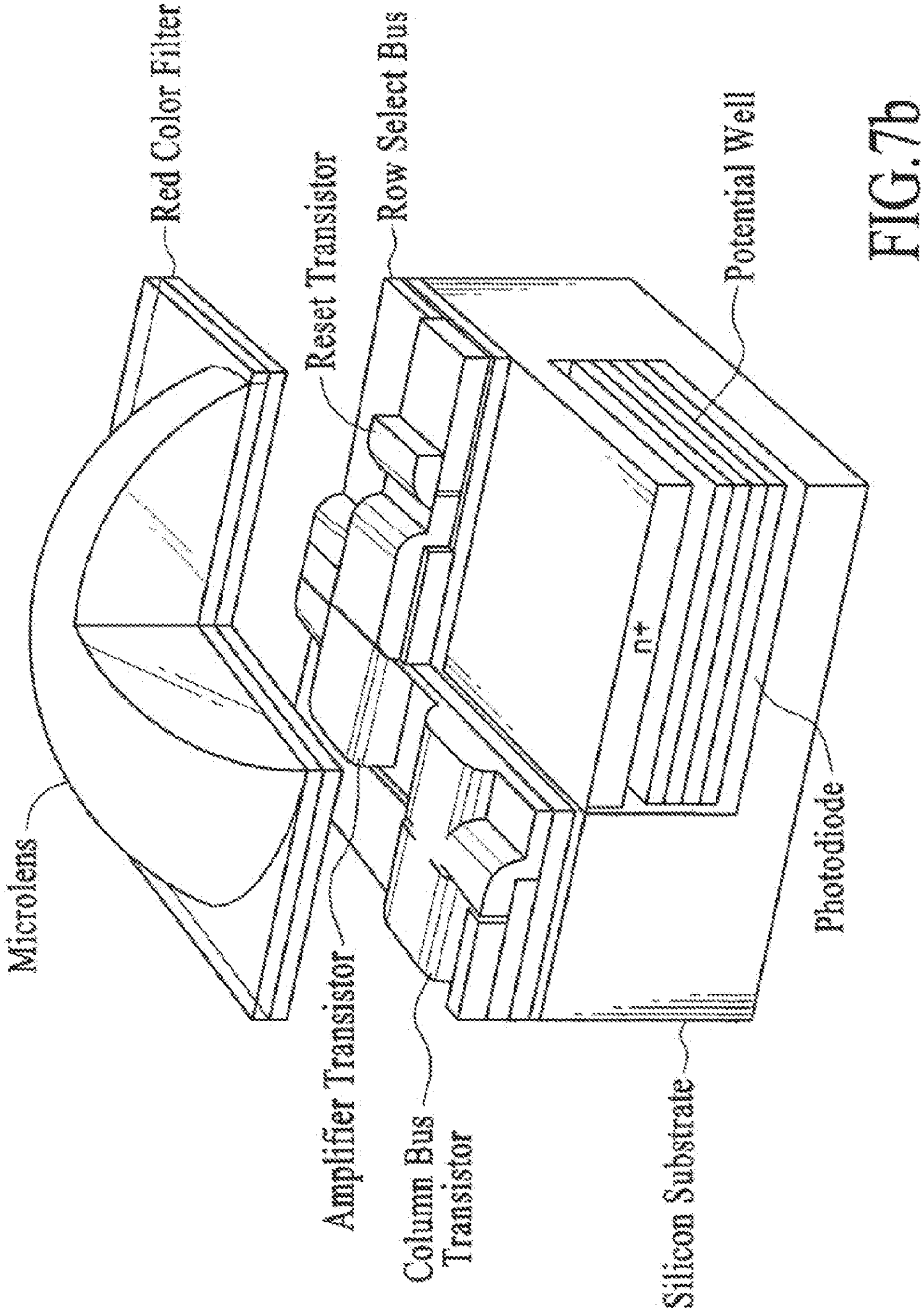
FIG. 7*b* shows an example of an alternative (non-quantum dot) arrangement.
Figure 7C:
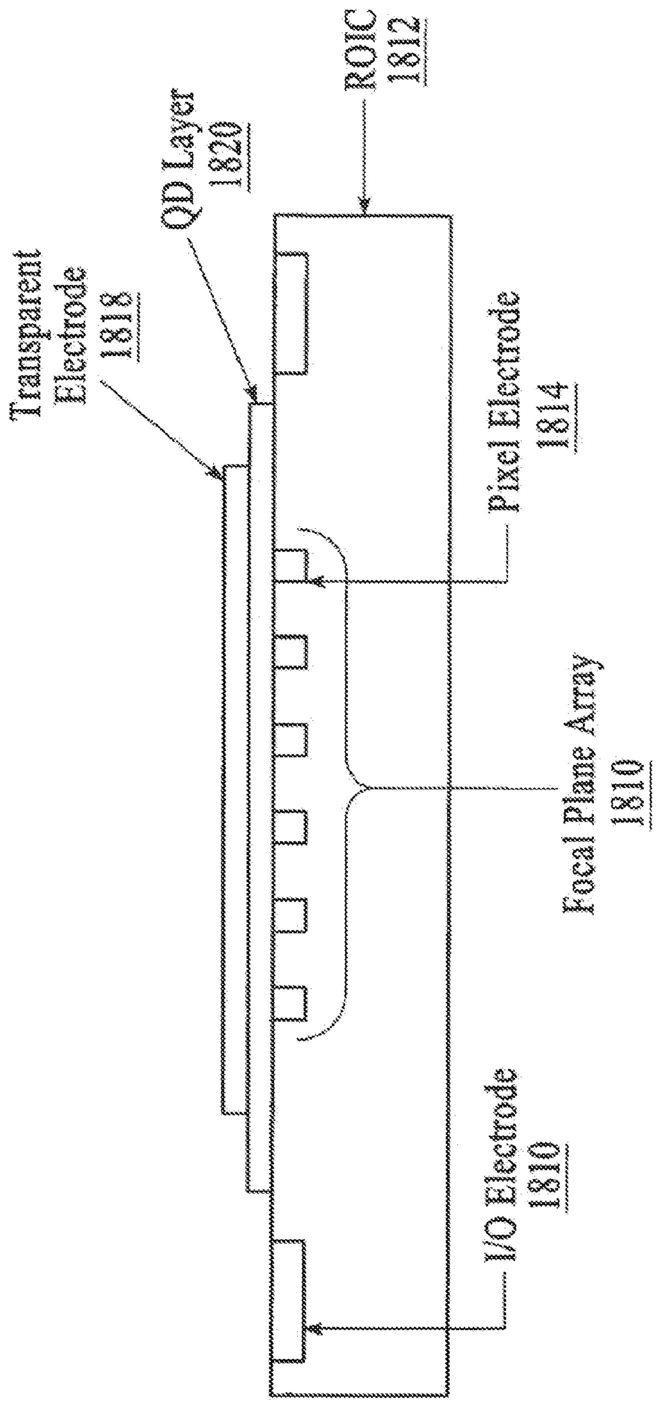
FIG. 7*c* shows a focal plane array with a side view of an imaging system which includes an integrated circuit with an array of electrodes located on the top surface thereof.
Figure 8:
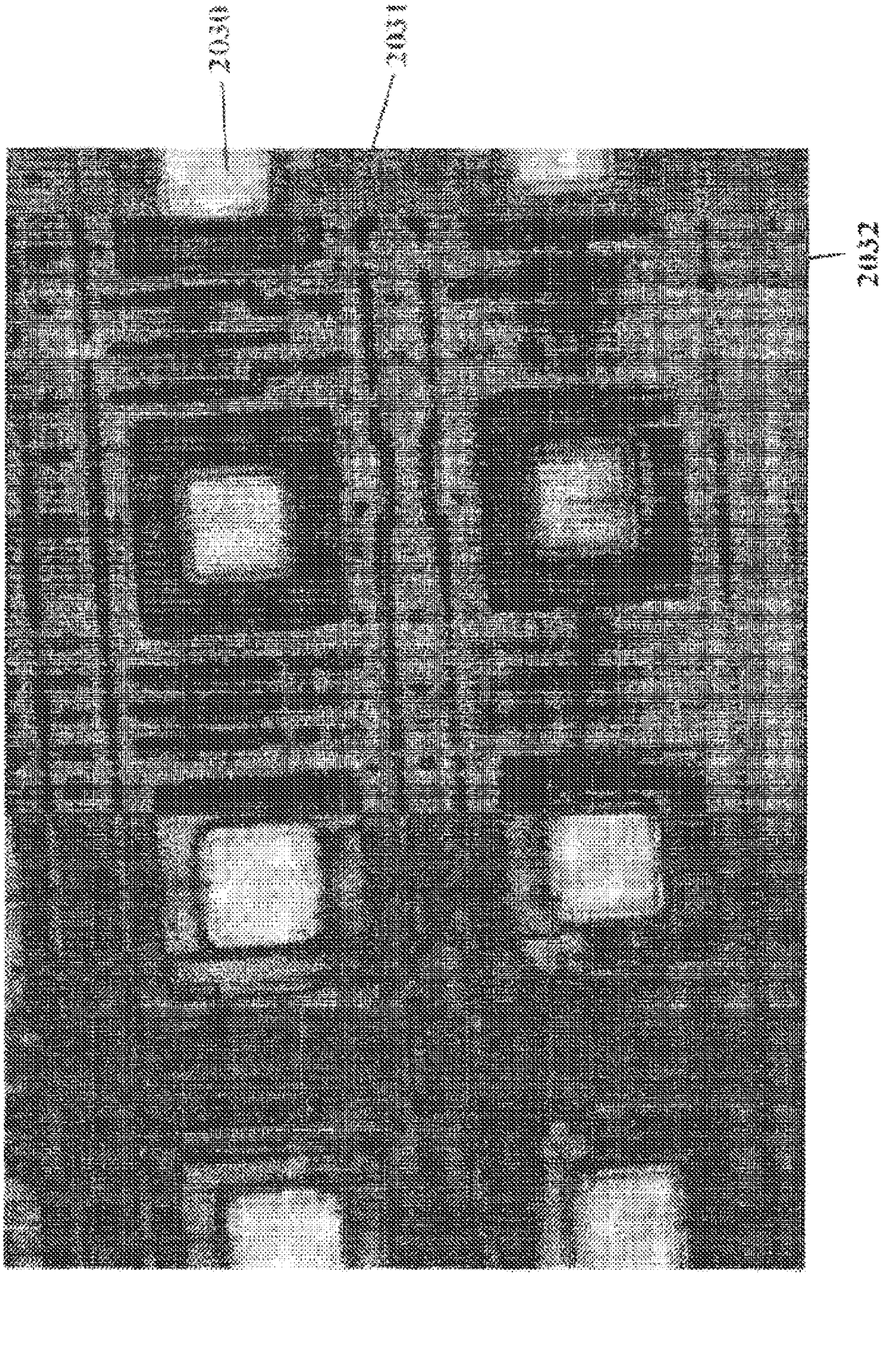
FIG. 8 shows an arrangement of quantum dot chip interconnections 2010.

FIG. 7c shows a schematic cross-section of an example imaging system shown in FIG. 8. In an example embodiment, the QD Layer 1820 may include a continuous film of cross-linked nanocrystal cores, such as linked PbS nanocrystal cores, with trap states formed using oxidized core material, such as PbSO3. The QD Layer 1820 may provide photoconductive gain and have a non-linear relationship between the rate of current flow through QD Layer 1820 and the intensity of light absorbed by the QD Layer 1820.

In example embodiments, the imaging system of FIG. 7*c* includes a read-out structure that includes a substrate 1812, an optically sensitive layer 1820, e.g., QD layer 1820 and a transparent electrode 1818. Substrate 1812 includes a read-out integrated circuit (ROIC) having a top surface with an array of pixel electrodes 1814 located in the top surface thereof with counter-electrodes 1818 located outside the array, i.e., transparent electrode 1818 overlaying QD layer 1820. Electrodes 1814 shown in FIG. 7*c* correspond to square electrode pads 300 shown in FIG. 8. The array of electrodes 1814, which together form focal plane array 1810, provide voltages for biasing and current collection from a given pixel 1814 of the array, and convey signals from the array to an input/output electrode 1812 (connection not shown). Optically sensitive layer 1820, e.g., QD layer, is formed on the top surface of the integrated circuit. More specifically, QD layer 1820 overlays the array of pixel electrodes 1814 on the top surface of the integrated circuit. The optically sensitive layer 1820 defines an array of imaging pixels for collecting radiation 1000 incident thereon.

In the imaging system of FIG. 7*c*, QD layer 1820 is monolithically integrated directly onto the electronic read-out chip.

Figure 7D:
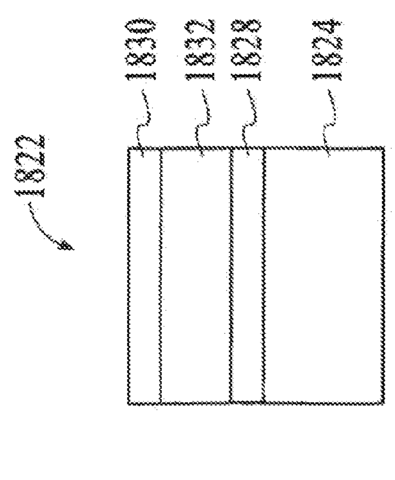
FIG. 7*d* shows a side view of a portion of an optical device configured in a vertical sandwich structure.
Figure 7E:
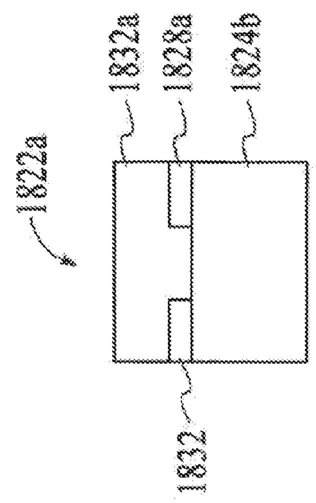
FIG. 7*e* shows a side view of a portion of an optical device configured in a lateral planar structure.
Figure 7F:
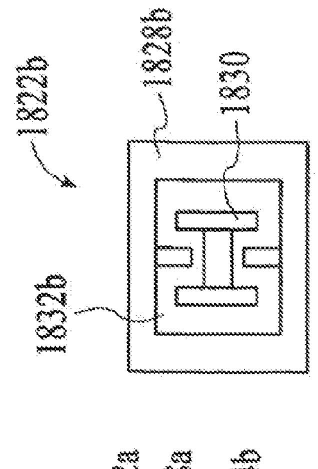
FIG. 7*f* shows a plan view of a portion of an optical device configured in a lateral interdigitated structure.

Referring now to FIG. 7*d*, there is shown at 1822 a side view of a basic optical device structure, which in certain embodiments can be used as an individual pixel in the completed integrated array shown in FIGS. 7*d-f*. Device 1822 includes substrate 1824, which may be glass or other compatible substrate; contact/electrode 1828; optically sensitive layer, e.g., QD layer 1832; and at least partially transparent contact 1830 that overlays the QD layer. As above, QD layer 1832 may be a continuous film of cross-linked nanocrystal cores with trap states formed using oxidized core material in example embodiments. Contacts 1828 and 1830 may include, e.g., aluminum, gold, platinum, silver, magnesium, copper, indium tin oxide (ITO), tin oxide, tungsten oxide, and combinations and layer structures thereof, and may include band-pass or band-block filters that selectively transmit or attenuate particular regions of the spectrum which are appropriate to the end use of the device. The device has an overall "vertical sandwich" architecture, where different components of the device generally overlay other components. In operation, the amount of current that flows and/or the voltage between contact 1830 and contact 1828 is related to a number of photons received by QD layer 1832. In operation, current generally flows in the vertical direction. The embodiment shown in FIG. 7*d* may also include one or more additional optional layers for electron/hole injection and/or blocking. The layer(s) allows at least one carrier to be transported, or blocked, from an electrode into the QD layer. Examples of suitable layers include a QD layer including QDs of a different size and/or composition, semiconducting polymers, and semiconductors such as ITO and Si.

Referring now to FIG. 7*e*, there is shown at 1822*a* a side view of a basic device structure that has a different configuration than each pixel in the completed integrated array shown in FIGS. 7*d*-7*f*, but which could be used to form a similarly functioning optical device. As above, the QD layer 1832*a* may be a continuous film of cross-linked nanocrystal cores with trap states formed using oxidized core material in example embodiments. The configuration in FIG. 7*e* corresponds to a lateral planar structure in which the optically sensitive layer 1832*a* is deposited across two spaced contacts/electrodes 1828*a* and 1832. Contacts 1828 and 1832 are deposited on a substrate, e.g., glass substrate 1824*b*. The integrated circuit, including contacts 1828*a*, 1832, and substrate 1824*b* may include any appropriate system with which the optically sensitive material is compatible (e.g., Si, glass, plastic, etc.). Contacts 1828*b* and 1832 may include aluminum, gold, platinum, silver, magnesium, copper, tungsten, tantalum, tungsten nitride, tantalum nitride, indium tin oxide (ITO), tin oxide, tungsten oxide, or combinations or layer structures thereof. The device has an overall "lateral planar" architecture, where at least some of the components of the device are generally laterally displaced from other components, forming a planar electrode structure. In operation, the amount of current that flows and/or the voltage between contact 1828*a* and contact 1832 is related to a number of photons received by the QD layer 1832*a*. In operation, current generally flows in the lateral direction.

FIG. 7*f* shows a plan view of another basic device structure 1822*b* that includes interdigitated electrodes, and which also can be used to form an optical device. The materials may be selected from those provided above regarding FIGS. 7*d*-7*e*. As above, QD layer 1832*b* may be a continuous film of crioss-linked nanocrystal cores with trap states formed using oxidized core material in example embodiments.

Each basic device 1822, 1822*a*, and 1822*b* as shown in FIGS. 7*d*-7*f*, among other possible architectures, can be thought of as representing a single device or an element in a larger device, such as in a linear array or a two-dimensional array. The basic devices can be used in many kinds of devices, such as detection and signal processing, as discussed above, as well as in emission and photovoltaic devices. Not all embodiments need be optical devices. Many QD layers have optical characteristics that can be useful for optical devices such as one or more of: image sensors useful in one or more radiation 1000 bands of the electromagnetic spectrum; optical spectrometers including multispectral and hyperspectral; communications photodetecting optical receivers as well as free-space optical interconnection photoreceivers; and environmental sensors. Some QD layers also have electrical characteristics that may be useful for other kinds of devices, such as transistors used in signal processing, computing, power conversion, and communications.

In one embodiment, the underlying electrodes on the integrated circuit define imaging pixels in an imaging device. The QD layers formed on the electrodes supply optical-to-electrical conversion of incident radiation 1000.

In another embodiment, in addition to the definition of pixels via electrodes on the integrated circuit, further patterning of the optically sensitive layers, e.g., QD layers, provides further definition of pixels, including of which pixel is read by which electrodes on the integrated circuit. This patterning may also be accomplished with well-known CMOS techniques such as photolithography. Other options include self-assembly of QD layers onto pre-patterned metal layers, such as Au, to which the QDs and/or their ligands have a known affinity. Patterning may also be achieved by depositing a conformal QD layer onto a topologically-variable surface, e.g., including "hills" (protrusions) and "valleys" (trenches) and subsequently planarizing the QD film to remove material accumulated on the "hills" while preserving that in the "valleys."

Further layers may be included in the layers atop the structure, such as electrical layers for making electrical contact (e.g. an at least partially transparent contact such as indium tin oxide, tin oxide, tungsten oxide, aluminum, gold, platinum, silver, magnesium, copper, or combinations or layer structures thereof), antireflection coatings (e.g. a series of dielectric layers), or the formation of a microcavity (e.g. two mirrors, at least one formed using nonabsorbing dielectric layers.), encapsulation (E.G. a substantially transparent dielectric such as silicon nitride (Si3N4) or silicon dioxide, or e.g. an epoxy or other material to protect various materials from environmental oxygen or humidity), or optical filtering (e.g. to allow one radiation 1000 band to pass and a second radiation 1000 band not to)

The integrated circuit may include one or more semiconducting materials, such as, but not limited to silicon, silicon-on-insulator, silicon-germanium layers grown on a substrate, indium phosphide, indium gallium arsenide, gallium arsenide, or semiconducting polymers such as MEH-PPV, P3OT, and P3HT. The integrated circuit may also include one or more semiconducting organic molecules, non-limiting examples being end-substituted thiophene oligomers (e.g. alpha,w-dihexyl hexathiophene (DH6T)) and pentacene. Polymers and organic molecules can be useful as a substrate in the QD devices because they may be flexible, and thus allow "bendable" and "conformable" devices to be made that are thus non-planar.

Other appropriate substrates may include, e.g., plastic and glass.

The above quantum dot pixels are examples only and other embodiments may use other pixel structures.

Pixel Circuitry 1700 (including Other Components 1900)

Pixel circuitry that may be used to read out signals from the photoconductive pixel regions will now be described. As described above, in embodiments, pixel structures 1500 within the QDPC 100 of FIG. 1 may have pixel layouts 1600, where pixel layouts 1600 may have a plurality of layout configurations such as vertical, planar, diagonal, or the like. Pixel structures 1500 may also have embedded pixel circuitry 1700. Pixel structures may also be associated with the electrical interconnections 1404 between the photodetector structures 1400 and pixel circuitry 1700.

In embodiments, quantum dot pixels 1800 within the QDPC 100 of FIG. 1 may have pixel circuitry 1700 that may be embedded or specific to an individual quantum dot pixel 1800, a group of quantum dot pixels 1800, all quantum dot pixels 1800 in an array of pixels, or the like. Different quantum dot pixels 1800 within the array of quantum dot pixels 1800 may have different pixel circuitry 1700, or may have no individual pixel circuitry 1700 at all. In embodiments, the pixel circuitry 1700 may provide a plurality of circuitry, such as for biasing, voltage biasing, current biasing, charge transfer, amplifier, reset, sample and hold, address logic, decoder logic, memory, TRAM cells, flash memory cells, gain, analog summing, analog-to-digital conversion, resistance bridges, or the like. In embodiments, the pixel circuitry 1700 may have a plurality of functions, such as for readout, sampling, correlated double sampling, sub-frame sampling, timing, integration, summing, gain control, automatic gain control, off-set adjustment, calibration, offset adjustment, memory storage, frame buffering, dark current subtraction, binning, or the like. In embodiments, the pixel circuitry 1700 may have electrical connections to other circuitry within the QDPC 100, such as wherein other circuitry located in at least one of a second quantum dot pixel 1800, column circuitry, row circuitry, circuitry within the functional components 2004 of the QDPC 100, or other features 2204 within the integrated system 2200 of the QDPC 100, or the like. The design flexibility associated with pixel circuitry 1700 may provide for a wide range of product improvements and technological innovations.

Pixel circuitry 1700 within the quantum dot pixel 1800 may take a plurality of forms, ranging from no circuitry at all, just interconnecting electrodes, to circuitry that provides functions such as biasing, resetting, buffering, sampling, conversion, addressing, memory, and the like. In embodiments, electronics to condition or process the electrical signal may be located and configured in a plurality of ways. For instance, amplification of the signal may be performed at each pixel, group of pixels, at the end of each column or row, after the signal has been transferred off the array, just prior to when the signal is to be transferred off the chip 2000, or the like. In another instance, analog-to-digital conversion may be provided at each pixel, group of pixels, at the end of each column or row, within the chip's 2000 functional components 2004, after the signal has been transferred off the chip 2000, or the like. In addition, processing at any level may be performed in steps, where a portion of the processing is performed in one location and a second portion of the processing is performed in another location. An example may be the performing analog-to-digital conversion in two steps, say with an analog combining at the pixel 1800 and a higher-rate analog-to-digital conversion as a part of the chip's 2000 functional components 2004.

In embodiments, different electronic configurations may require different levels of post-processing, such as to compensate for the fact that every pixel has its own calibration level associated with each pixel's readout circuit. The QDPC 100 may be able to provide the readout circuitry at each pixel with calibration, gain-control, memory functions, and the like. Because of the QDPC's 100 highly integrated structure, circuitry at the quantum dot pixel 1800 and chip 2000 level may be available, which may enable the QDPC 100 to be an entire image sensor system on a chip. In some embodiments, the QDPC 100 may also be comprised of a quantum dot material 200 in combination with conventional semiconductor technologies, such as CCD and CMOS.

Figure 6A:
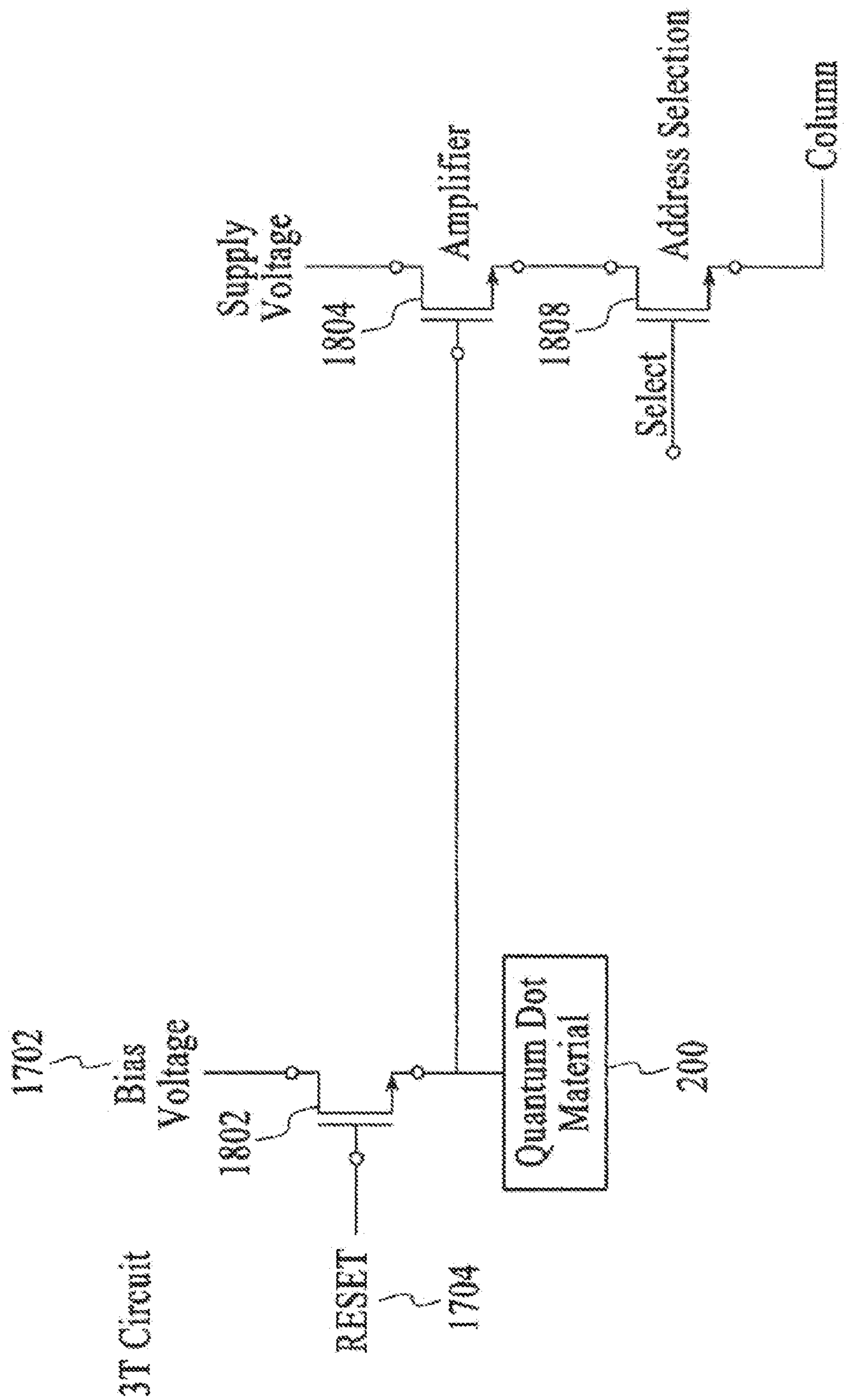
FIG. 6*a* illustrates the 3T transistor configuration for interfacing with the quantum dot material.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the photoconductive photovoltaic quantum dot material 200 may act as a resistor that changes its resistance in response to radiation 1000. As such, the quantum dot pixel 1800 may require bias circuitry 1700 in order to translate the resistance to a readable signal. This signal in turn may then be amplified and selected for readout. One embodiment of a pixel circuit shown in FIG. 6a uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the photoconductive photovoltaic quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit.

In embodiments, the impedance of the quantum dot material 200 may be very high, such as in the one teraohm range, making integration times for a dark scene in the milliseconds range, while the integration times for a bright scene may be in the microseconds range. Additionally, the response curve may not be linear, resulting in an S-shaped response curve. This type of response curve may require modification of how the 3T circuit is used, relative to what is conventional for a photodiode configuration. For instance, a conventional 3T reset is digital, with the reset off during integration and the totally on during reset. The reset of the QDPC 100 3T circuit, is analog, varying in voltage, for example in some embodiments from 0V to 1.8V continuously, biasing to get a particular shape and optimization of response. Reset for the QDPC 100 circuit may also be turned on harder during reset, and weaker during integration, but may always be supplying a bias voltage, which may provide greater control of the circuit. Also, as mentioned previously, a photodiode may have a very large capacitance, say 50-100 femtofarads, with a gain of less than unity. The QDPCs 100 quantum dot material 200 has a very low capacitance, say less than one femtofarad, with a large range of gain, say between 0.1 and 10,000, depending on the bias.

Control timing of the conventional 3T circuit is characterized by fixed voltages and timing, such as the reset voltage turning on hard and then back down to zero at the end of a frame interval, and the timing between frames being fixed. In the QDPC 100 3T circuit, reset voltages may vary. Also, the timing is variable for the QDPC because the quantum dot material 200 response curve is not linear as it is for a photodiode, where the slope is directly dependent on the amount of radiation 1000 and saturation can be reached. In the quantum dot material 200 response, the relationship is exponential, where strong radiation 1000 may produce a sharp decay and a weak radiation 1000 may produce a very slow decay. Because of this response, there is not voltage level where saturation is reached, and thus there is no limit on the dynamic range. For instance, over a range of one nanowatt to one milliwatt of radiation 1000 intensity, the QDPC 100 may experience a 360 millivolt output range, which is easy to read.

Figure 6B:
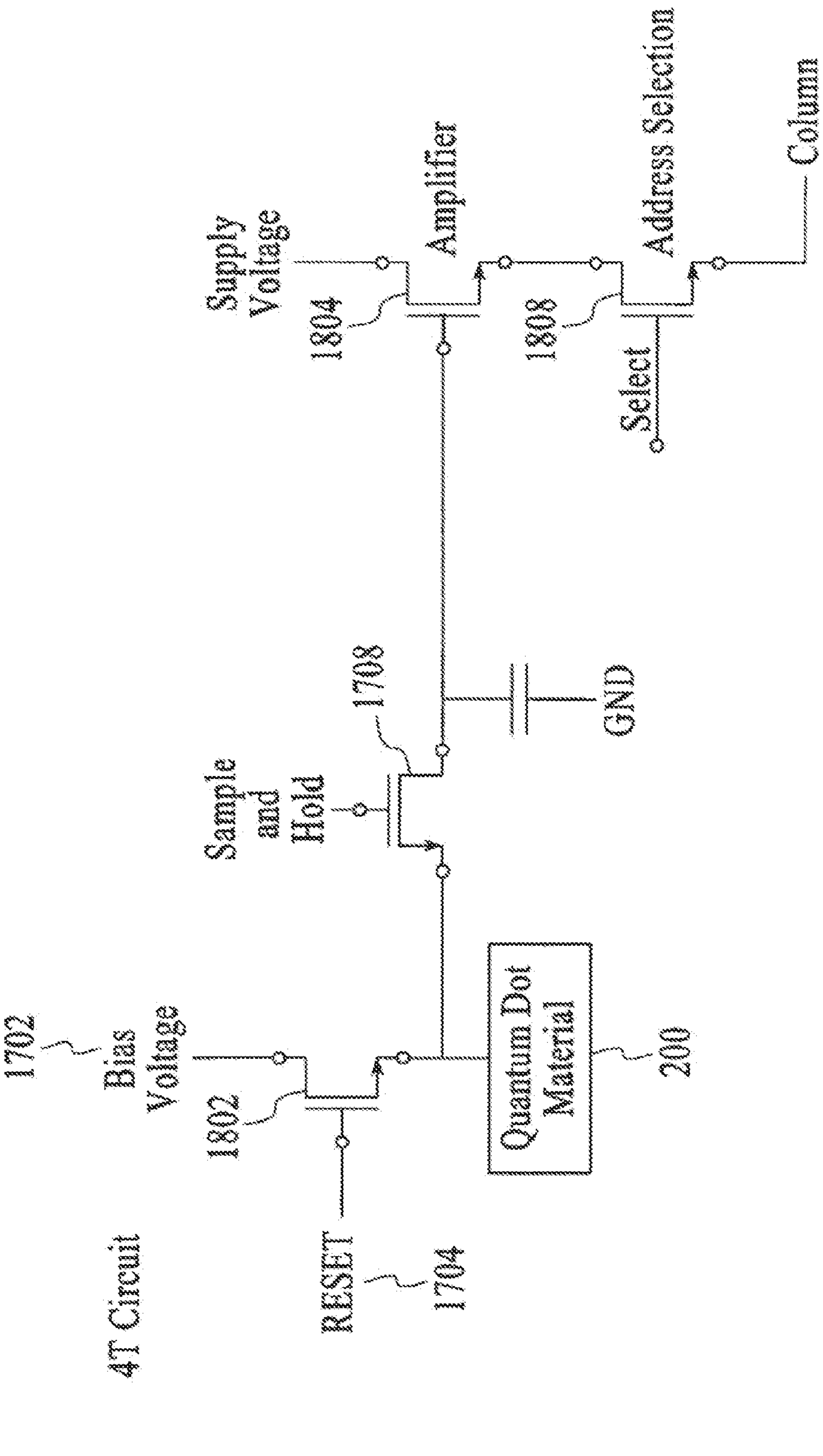
FIG. 6*b*; illustrates the 4T transistor configuration for interfacing with the quantum dot material.

Although additional circuitry may not be required for the low noise operation of the QDPC 100 in some embodiments, a fourth transistor circuit group may be added to increase sensitivity. FIG. 6*b* shows a QDPC 100 4T circuit, with the fourth transistor 1708 configured as a sample and hold. This configuration may also be referred to as a global shutter, where the entire pixel 1800 array may be sampled at the same time, but not necessarily at a fixed time, where the time of sampling may be a function of radiation 1000 conditions. The sample and hold may implement a correlated double sampling, where the signal value of each pixel is transferred to the output, and the output is reset to a reference value. The final value assigned to this pixel may be the difference between the reference value and the transferred signal. Correlated double sampling may yield the best representation of the true value associated with each pixel. From an electronics standpoint, there may be different methods for accomplishing this, such as digital, analog sample and hold, integration, dual slope, and the like. Differences in effectiveness may become evident with ultra low noise systems of less than 4 or 5 electrons, depending on the overall design of the system. In an embodiment, two sample and holds may be used, holding two values in order to utilize the difference between them. In addition, the QDPC 4T circuit may also have a separate pixel reset, which may be distinct from the circuit reset. The two resets may be used simultaneously, or at different times. In embodiments, the QDPC 100 circuits may have varied voltages, time profiles, lengths of reset times, sampling schemes, and the like, that my enable innovative product solutions not capable with conventional designs.

In embodiments, the biasing of the photodetector may be time invariant or time varying. Varying space and time may reduce cross-talk, and enable a shrinking the quantum dot pixel 1800 to a smaller dimension, and require connections between quantum dot pixels 1800. Biasing could be implemented by grounding at the corner of a pixel 1800 and dots in the middle. Biasing may occur only when performing a read, enabling either no field on adjacent pixels 1800, forcing the same bias on adjacent pixels 1800, reading odd columns first then the even columns, and the like. Electrodes and/or biasing may also be shared between pixels 1800. Biasing may be implemented as a voltage source or as a current source. Voltage may be applied across a number of pixels, but then sensed individually, or applied as a single large bias across a string of pixels 1800 on a diagonal. The current source may drive a current down a row, then read it off across the column. This may increase the level of current involved, which may decrease read noise levels.

In embodiments, current flow may be vectored, flowing down through a series of layers, for example. Applying a voltage or a current, collecting across a different set, referencing differential measurements, that is the differences between pairs of electrodes, and resulting in DC offsets that are proportional to the offset signal.

In embodiments, configuration of the field, by using a biasing scheme or configuration of voltage bias, may produce isolation between pixels. For example, even if there were photoconductive photovoltaic material above, current may flow in each pixel so that only electron-hole pairs flow within that pixel. This may allow electrostatically implemented inter-pixel isolation and cross-talk reduction, without physical separation. This could break the linkage between physical isolation and cross-talk reduction. This type of scheme may be implemented with a checkerboard, non-contiguous grouping. In a Cartesian system bias could be create orientations that are opposite one another, so carriers may see a potential minimum at the collection region, and scatter to the center of the pixels.

In embodiments, the pixel circuitry 1700 may include circuitry for pixel readout. Pixel readout may involve circuitry that reads the signal from the quantum dot material 200 and transfers the signal to other components 1900, chip functional components 2004, to the other features 2204 of the integrated system 2200, or to other off-chip components. Pixel readout circuitry may include quantum dot material 200 interface circuitry, such as the 3T and 4T circuits shown in FIGS. 6*a* and 6*b* for example. Pixel readout may involve different ways to readout the pixel signal, ways to transform the pixel signal, voltages applied, and the like. Pixel readout may require a number of metal contacts with the quantum dot material 200, such as 2, 3, 4, 20, or the like. These electrical contacts may be custom configured for size, degree of barrier, capacitance, and the like, and may involve other electrical components such a Schottky contact. Pixel readout time may be related to how long the radiation 1000-induced electron-hole pair lasts, such as for milliseconds or microseconds. In embodiments, this time my be associated with quantum dot material 200 process steps, such as changing the persistence, gain, dynamic range, noise efficiency, and the like.

Readout of the quantum dot pixel 1800 may be performed with a plurality of signal transformation techniques, such as resistance-to-voltage, resistance-to-current, resistance-to-charge, feedback mode, combining dark-current, or the like. Resistance-to-voltage may utilize a resister divider, where the quantum dot material 200 represents one resister and the other is a dark resistor. In this scheme, a bias voltage is place across the pair, and the output voltage at the node between them is monitored. In embodiments, the output response may be non-linear, and may be a function of pixel 1800 size. Bias voltages may be a plurality of values, including 1.8V, 2.5V, 3.3V, and the like, where it may be desirable to use the largest voltage available in some embodiments. In some embodiments, these voltages may be filtered, regulated, conditioned, or the like.

In embodiments, pixel readout may be performed with a resistance-to-current scheme, such as a constant current approach. In low radiation 1000, with constant current, resistance may start low, then increases higher on the slop transfer function. In embodiments, a constant current scheme may require transistor circuits in the implementation, translating into a greater amount of circuitry required than other schemes, such as with constant voltage where only resistors are involved. With transistor configurations there may also be issues of transistor matching and offsets. A reference may also be required, such as a self-reference, mirror circuit, self-reference switching, or the like. Switching may improve charge rejection and switching noise effects. In embodiments, the constant current approach may represent an improved method for interfacing with a non-linear device, such as the quantum dot material 200, where radiation 1000 in low radiation 1000 may represent a low slope, midrange the greatest slope, and bright radiation 1000 back to a low slope again, a so called S-curve.

In embodiments, pixel circuitry may accommodate different ways to acquire the image, such as integration, sampling, or the like. Integration may involve exposures on the order of milliseconds, and possibly involve the entire pixel 1800 array over an entire frame period. With large ranges of radiation 1000 intensity only generating small voltages, such as 480 mV, there may be no need for gain, although automatic gain control may still be implemented. In embodiments, exposure values may provide different mapping between optical intensity and sample voltage. The RC constant associated with dark resistance may determine longest exposure times. In embodiments, more conventional architectures may be utilized in combination with new techniques to achieve longer exposure times.

In an alternate embodiment, the image may be sampled multiple times during a frame period, which may take advantage of the constant integration that occurs in the quantum dot structures 1100. Sampling may be for time periods on the order of microseconds, sampling one pixel, column, or cluster in secession during the frame period, which may be on the order of a millisecond. This may result in a large number of samples taken during the frame period, such as a thousand samples per frame period. In embodiments, the noise bandwidth may be larger, but with increased noise due to the increased number of reads. However, simplicity may be gained, and may be traded against the additional noise depending upon the application. In embodiments, all that may be needed is a single switch on each pixel 1800. Biasing may be applied the whole time, but with only a brief sample, or biasing may be a limited period of time. Sampling may utilize techniques similar to correlated double sampling, reducing the total noise by subtracting off signal and background. This may help avoid low 1/f noise. In embodiments, various integration and sampling schemes may be applied to the operation of the QDPC 100, which may result in operational flexibility in the development of new product applications.

In embodiments, there may be calibration circuitry associated with the pixel circuitry 1700, such as performing or not performing dark current subtraction. Dark current subtraction may be performed with the use of resistance bridges, or in circuitry at the end of rows or columns, or at each individual pixel. Associated dark resistors may be covered and located at the end of rows, at the end of columns, at individual pixels, at the center of pixel groupings, within an area bounded be a group of pixels, or the like. Calibration may then be performed by characterizing the dark verses the regular pixel(s) in the appropriate ratios, and with respect to resistance and geometry. The ratio of the covered dark resistor to the not covered pixel(s) may be referred to as fill factor, and may be minimized in order to maximize the exposed radiation 1000 sensitive quantum dot material 200. Fill factors may be minimized by tiling groups of pixels, and may be configured in a plurality of orientations, such as orthogonal or non-orthogonal. Shielding of the dark resistor may be implemented by covering the dark resistor with a metal or other material. In an alternate embodiment, photodetecting surfaces may be fabricated that are not sensitive to radiation 1000, or are desensitized or otherwise conditioned during fabrication, such as by masked UV radiation. In embodiments, areas may be made radiation 1000 sensitive though exposure to masked radiation, such as UV radiation. In embodiments, dark references may be determined as the signals are read out of the array.

In embodiments, no dark current subtraction may be required. This may be enabled if the change in resistance of one photon is greater than the dark current, then the dark current may be ignored. This may speed up readout, groups may perform their own self-calibration by measuring the resistance of each neighbor, because small groups may have similar illumination or be smaller than the resolution of the optics in the system. Differences may be due to dark current, gain offsets between pixels, transfer function for the optics, or the like. Resistance bridges may still be used, but now they may be used within the self-calibration group. This type of system may allow for dynamic, continuous adjustment, that may be user defined or set at the production or user level. In embodiments, the use of techniques that enable calibration without the need for dark resistors may create smaller, faster product applications.

In embodiments, calibration may involve the adjustment of pixel outputs with respect to preset calibration levels, gain calculations, comparison with neighboring pixels 1800, controlled sensitivity, power levels, or the like. For instance, there may be areas of higher sensitivity and lower sensitivity within the quantum dot structure 1100 and it may be desirable to calibrate, heighten the sensitivity, or reduce the sensitivity in certain areas to create a more flat response from the photodetector. In embodiments, processing 2008 may have the ability to monitor hot spots, exposure, sensitivity, or the like, across the pixel 1800 array, and make adjustments through pixel circuitry 1700. Pixels 1800 may be self-tuning, where they are able to optimize themselves to some criteria. This criteria may be preset, or adjusted continuously through on-chip processing 2008. Pixels 1800 may be able to adjust power levels, where dissipated power may be inversely proportional to the response, but dissipation normalizes the response. Pixels may be able to adjust their gain, timing, reset, or the like. In embodiments, the ability of a pixel 1800 to be adjusted, or perform self-adjustment, may be enabled through the presence of pixel electronics 1700.

Finally, the signal may be sent through decoding circuitry resident in the pixel circuitry. This circuitry may be simpler because radiation does not have to pass through the substrate of the QDPC 100, and circuits may perform better in darkness. The circuitry may be easier to accommodate because of the availability of a larger number of layers and increased circuit resources due to the increase integration density of the QDPC 100. In embodiments, decoding circuitry may be resident in the pixel circuitry, in the functional components 2004 within the underlying chip 2000, or in the integrated system 2200, at the edges of the array, or scattered in various locations within the array. In embodiments, flexibility of where to place the decoder circuitry, or other components 1900 such as memory, may allow for more flexible custom product applications.

In embodiments, pixel binning may be employed, wherein the signal corresponding to a multiplicity of smallest-patterned-pixels may be accumulated within a single superpixel. The accumulation can be achieved in digital domain, in analog domain, or at film level. Take the example of accumulating the signal corresponding to a 2×2 array into a single superpixel: It can be achieved using film binning by applying a bias across the entire set of 2×2 pixels and integrating into a single capacitor. It can also be achieved using analog binning by sum up the charge stored in the 4 individual capacitors, or using digital binning after the signal is digitized.

In embodiments, the photocurrent passing through the photoconductive layer, and collected in a given pixel, may have a nonlinear relationship with the intensity impinging on that pixel. In embodiments, this nonlinear relationship may be sublinear, thus the photoconductive gain may diminish with increasing intensity. In embodiments, it may be desired to provide an estimate of the intensity impinging on the pixel during the integration period based on the collected current. In embodiments, it may be desirable to estimate the functional relationship between intensity and photocurrent, Photocurrent=f(Intensity), and to determine, or estimate, the inverse of this function, Intensity=$f^{-1}$(Photocurrent). In embodiments, the functional relationship between intensity and photocurrent may be characterized during production or assembly and a representation be stored on or off device for use by a post processing digital algorithm that will invert ($f^{-1}$) the intensity-photocurrent mapping function(f). In embodiments, a signal proportional to the inferred intensity may be generated, by the implementation of an analog function that approximately inverts ($f^{-1}$) the intensity-photocurrent mapping function (f).

In embodiments, the voltage spacing among the levels of an analog-to-digital converter may be manipulated, including being made nonuniform, such as to compensate for the nonlinear photocurrent vs. intensity relationship mentioned above. In some embodiments, analog-to-digital converters may be provided on the semiconductor substrate under the array of pixel region and in electrical communication with the respective pixel circuits. In some embodiments, analog-to-digital converters may be provided on the semiconductor substrate in a region adjacent to the photosensor array. In some embodiments, the analog-to-digital converters may compensate at least partially for the nonlinear photocurrent vs. intensity relationship mentioned above. In other embodiments, the analog-to-digital converters do not include compensation for nonlinearity. In some embodiments, compensation for nonlinearity may be provided in digital circuitry after analog-to-digital conversion or by software on a digital processor on the same chip (for example, a system-on-chip) or an another chip in the digital camera or other system in which the image sensor is used.

In embodiments, further arithmetic operations may be implemented in the digital domain to produce a revised digital estimate of the impinging intensity based on the observed digital estimate of the photocurrent or accumulated photocharge.

Additional example embodiments of pixel circuits will now be described. FIGS. 12-19 illustrate aspects of additional pixel circuits that may be used in embodiments in combination with the example photoconductors and pixel regions described herein.

Figure 12:
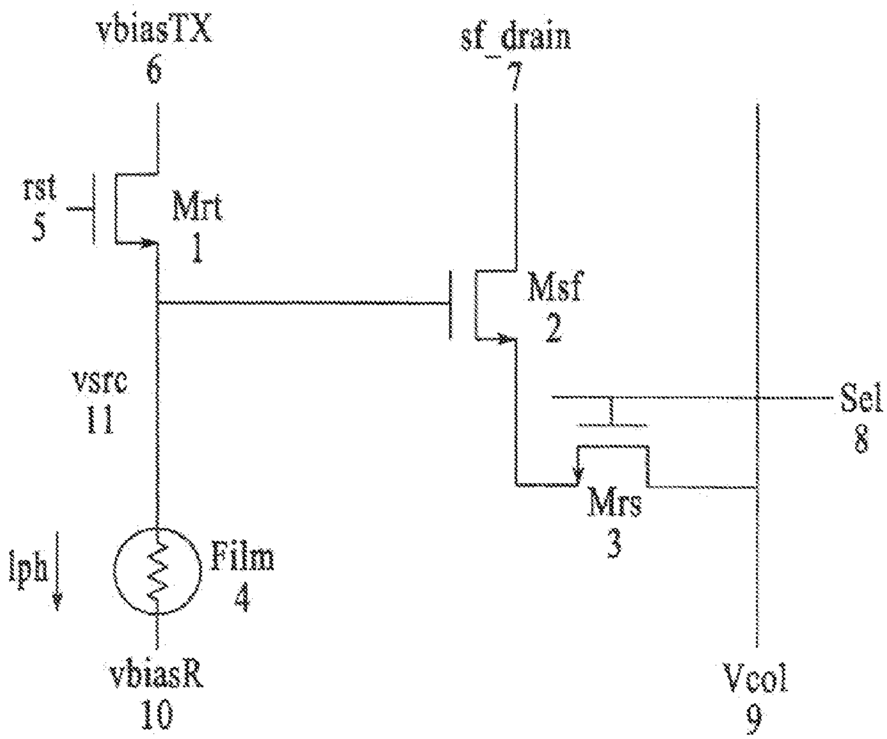
FIGS. 12-19 illustrate a "standard" single pixel shutter arrangement according to an embodiment.

FIG. 12 is a circuit diagram of a 3T pixel circuit according to an embodiment. FIG. 12 is further explained with reference to the legend below.

Bias Voltages:
vbiasTX=nominal 2.8V-fixed
sf_drain=nominal 2.8V-fixed
vbiasR=adjustable: −2V to 2.8V
Signal Voltages:
vsrc=1.5V→2.5V
Vcol=1.5V→0.5V
Timing Control Signals:
sel=row select; 0→4 2.8V
rst=reset; 0→4V
Mrt=reset transistor
Msf=read-out buffer
Mrs=row-select transistor The above biases, signal voltages and timing control signals are examples only and other embodiments may use other values. In this example embodiment, the Film 4 may be a photoconductor with an optically sensitive nanocrystal material as described above. In example embodiments, the current across Film 4 has a non-linear relationship with light intensity absorbed by the Film 4. Vsrc 11 is applied to the Film 4 at one electrode and vbiasR is applied to the Film 4 at the other electrode, which results in a voltage difference across the Film 4. In example embodiments, the Film 4 provides photoconductive gain when this bias is applied across the Film 4 as described above. The electrodes may be in any of the photoconductor configurations described above or in other configurations. In some embodiments, this circuit may be used to read out one layer of a multi-layer or multi-region color pixel as described further below.

When the example pixel circuit shown in FIG. 12 is operating, in order to capture the photo current generated on Film (4), Iph, the reset transistor 1 is turned on by setting node 5 high enough (up to 4V, through an on-chip charge-pump/regulator circuit) so that node 11 will be charge to a voltage equal to vbiasTX (node 6) which is typically set to the supply rail: 2.8V. This is the reset phase. Once this ‘reset’ operation is completed, Node 5 is being set to 0V to turn off the reset transistor Mrt (1). In doing so, charge injection and parasitic capacitive feedthrough effects will cause node 11, now becoming a floating node, to drop by approximately 300 mV. Therefore after the ‘reset’ operation the actual ‘reset’ voltage value at node 11 is approximately 2.5V.

At this time, the photo current s is being generated within Film (4), and the amount of photo current (photo sensitivity) generated is dependent on the voltage across the Film (4), i.e. (vsrc-vbiasR). With vbiasR being able to be set arbitrarily to any voltage level from −2V to 2.8V, the light sensitivity of the pixel can be adjusted.

The photo current from Film (4) discharges the parasitic capacitance at the vsrc node (11) and its voltage level drops at a rate dependent on the value of the parasitic capacitance at vsrc (node 11) as well as the equivalent conductance of the Film during the integration time.

After a specific integration time, the resulting integrated voltage at node 11 will be read out through transistors Msf (2) and Mrs(3), the source-follower buffer transistor and the Row-select transistor by setting the node Sel (8) to a high level (2.8V).

In this example embodiment, the charge store that is discharged at node 11 comprises parasitic capacitance of one or more of the transistors that are in electrical communication with the electrode of the pixel region at vsrc (node 11). The electrode at vsrc (node 11) can be in electrical communication with the gate of a transistor, such as Msf 2, which provides a parasitic capacitance. In one example embodiment, the charge store may be provided at least in part by a parasitic capacitance between the gate and drain of the source follower transistor, Msf 2, and a parasitic capacitance between the source and substrate of the reset transistor, Mrt 1. These are parasitic capacitances between the structures on the semiconductor substrate (poly, n-well and substrate) on which or in which the pixel circuit is formed. In an example embodiment, these parasitic capacitances may be in the range of about 1-2 Femto Farads or more generally in the range of about 0.5 to 3 Femto Farads or any range subsumed therein. The pixel region, optically sensitive nanocrystal layer and electrodes may be formed in different layers above the regions of the semiconductor substrate used to form the transistors Mrt 1, Msf 2 and Mrs 3. In an alternate embodiment, the polarity of the bias could be reversed and the parasitic capacitance at vsrc could be charged instead of discharged during the integration period.

Figure 13:
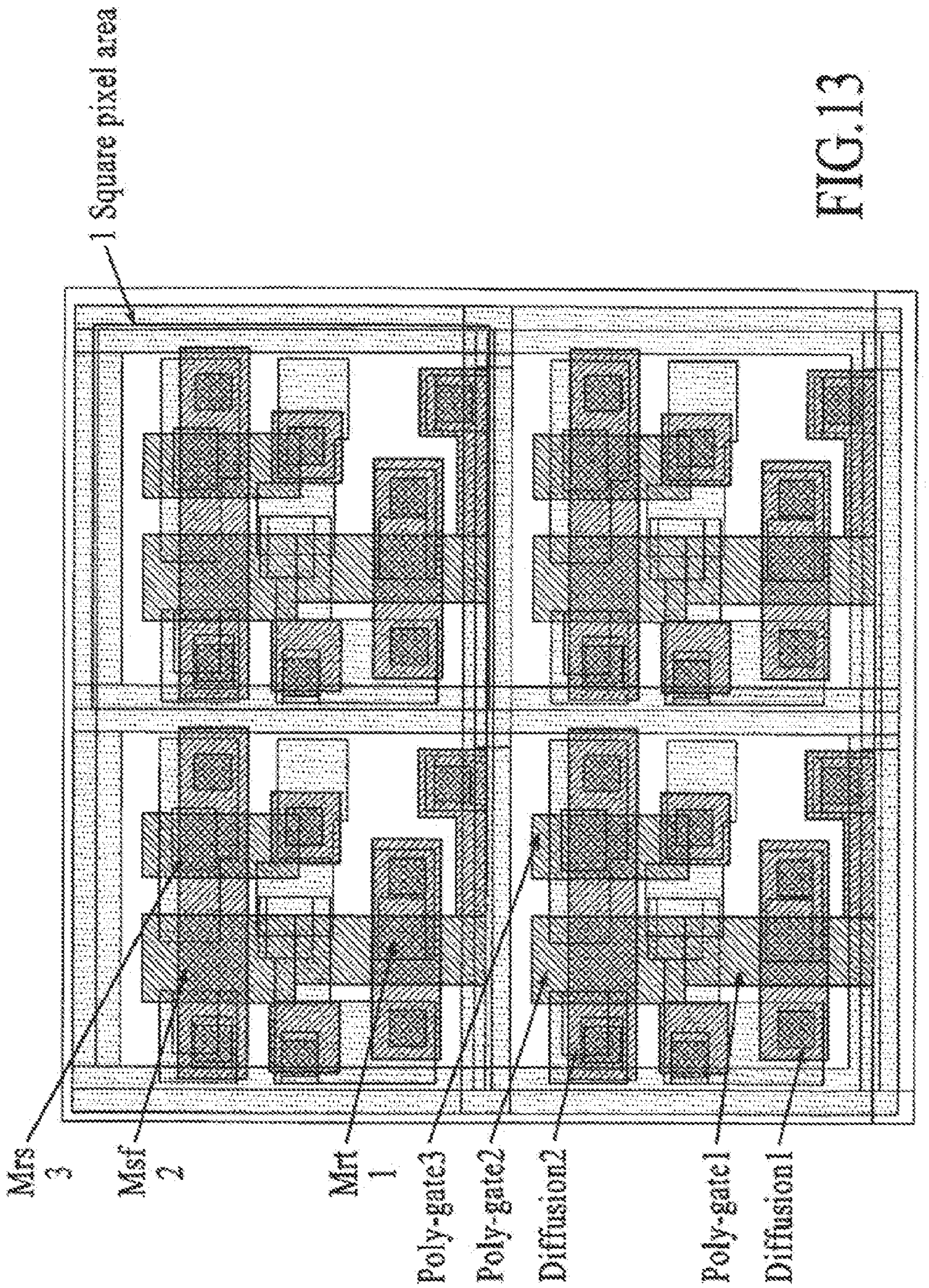

FIG. 13 is a layout diagram showing a 4×4 pixel layout with illustrations of the location of the 3 transistors within the pixel read-out circuit described above. In the illustration, the geometries labeled as poly-gate1 and diffusion1 combine to form the reset transistor Mrt. The geometries labeled as poly-gate 2 and diffusion2 combine to form the source-follower buffer transistor Msf. The geometries labeled as poly-gate3 and diffusion2 combine to form the row-select transistor Mrs. The grid forming four squares over FIG. 13 is a common electrode that provides vbiasR for all four electrodes. In the center of each square is the pixel electrode at vsrc for each pixel region. An optically sensitive nanocrystal material is coated over and in contact with these electrodes to form the four pixel regions. These pixel regions are formed in layers above the semiconductor substrate in which or on which the pixel circuit transistors (Mrt, Msf and Mrs) are formed. Vias and interconnect layers of the integrated circuit device may be used to provide the electrical connection between the pixel circuit and the electrodes of the pixel regions.

Figure 14:
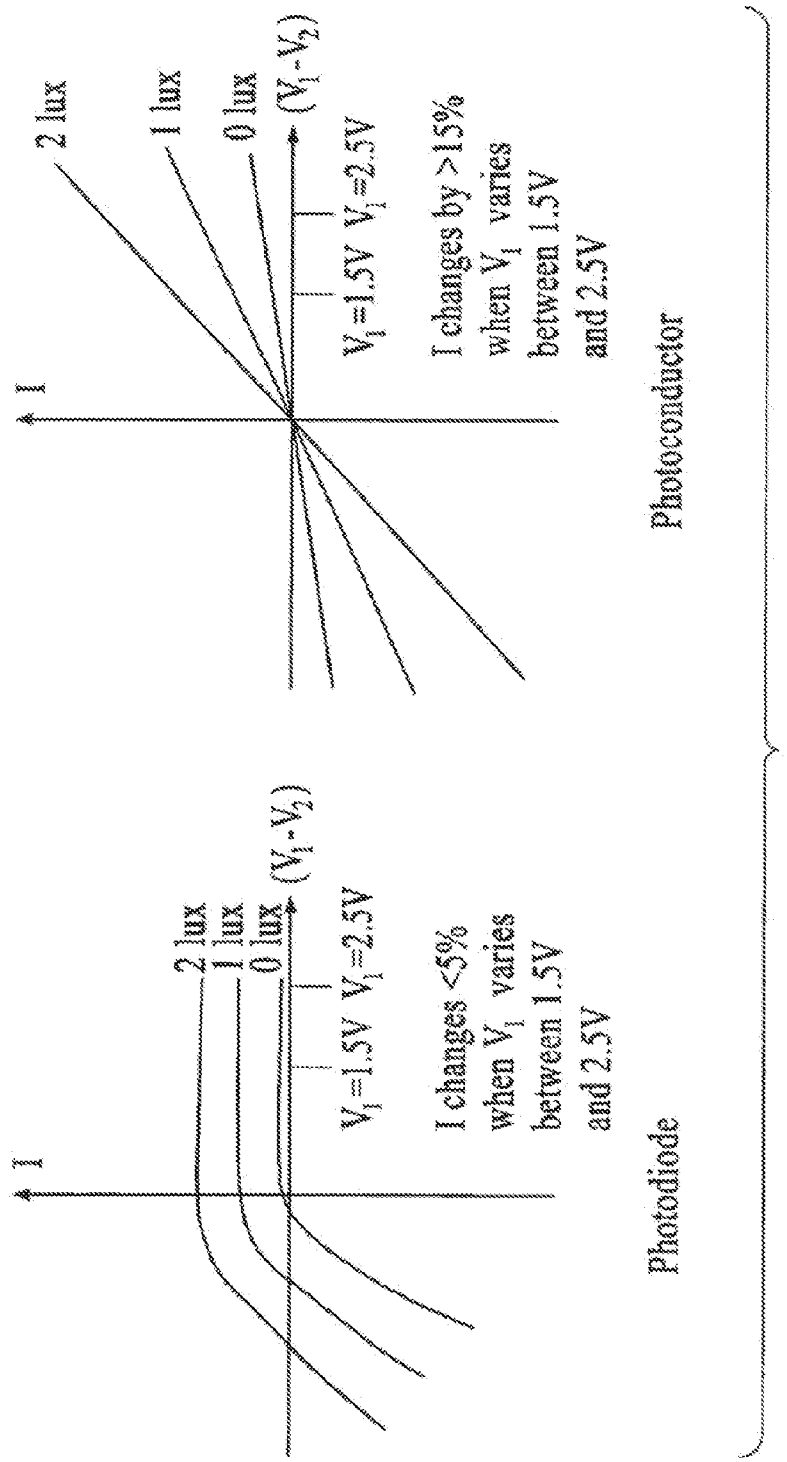

FIGS. 14(*a*) and 14(*b*) depict the current-voltage dependencies of the optoelectronic devices that are read in image sensor(s) based on conventional photodiodes vs. (b) image sensors disclosed herein based on photoconductive optically sensitive layers. The optically sensitive layers (b) may be, in example embodiments, nanocrystal materials having photoconductive gain, such as PbS cores fused or linked in a continuous film with PbSO3 forming trap states on the outer surfaces of the cores to provide persistence as described herein).

Especially under no illumination, the asymmetry in the current vs. voltage dependence of the conventional photodiode of (a) is clear. When positive bias is applied to the p-type side (deeper work function) side of a p-n junction device, the current grows much more rapidly than if a bias of the same amplitude, but of the opposite polarity, were applied. This feature is known as rectification.

In contrast, the symmetric current-voltage characteristic of a photoconductor made using two contacts having similar work functions as one another is illustrated in (b). This device is nonrectifying: the amplitude of the flowing current is essentially invariant with the polarity of bias.

Photodiodes are usually operated in reverse-bias mode. Under illumination, they typically provide a current of less than or equal to unit of current (electron) per photon incident (Quantum Efficiency is <=100%). Photoconductive photodetectors can, in contrast, exhibit gain, wherein the additional current that flows upon illumination can exceed one unit of current (electron) per photon incident. This is represented conceptually in the diagram (b) by the greater spacing between the 0 lux, 1 lux, and 2 lux light levels in (b) (especially at higher bias) compared to (a).

It should also be noted that the responsivity of the photodiode is substantially the same irrespective of the amplitude of the reverse-bias applied to it; and, in general, does not exceed unity, even at high bias. In contrast, the responsivity, and the gain, of the photoconductive photodetector increases approximately linearly with bias in the illustration of (b). This fact is exploited in certain circuits described herein in order to increase the dynamic range of the light-sensing system.

Figure 15:
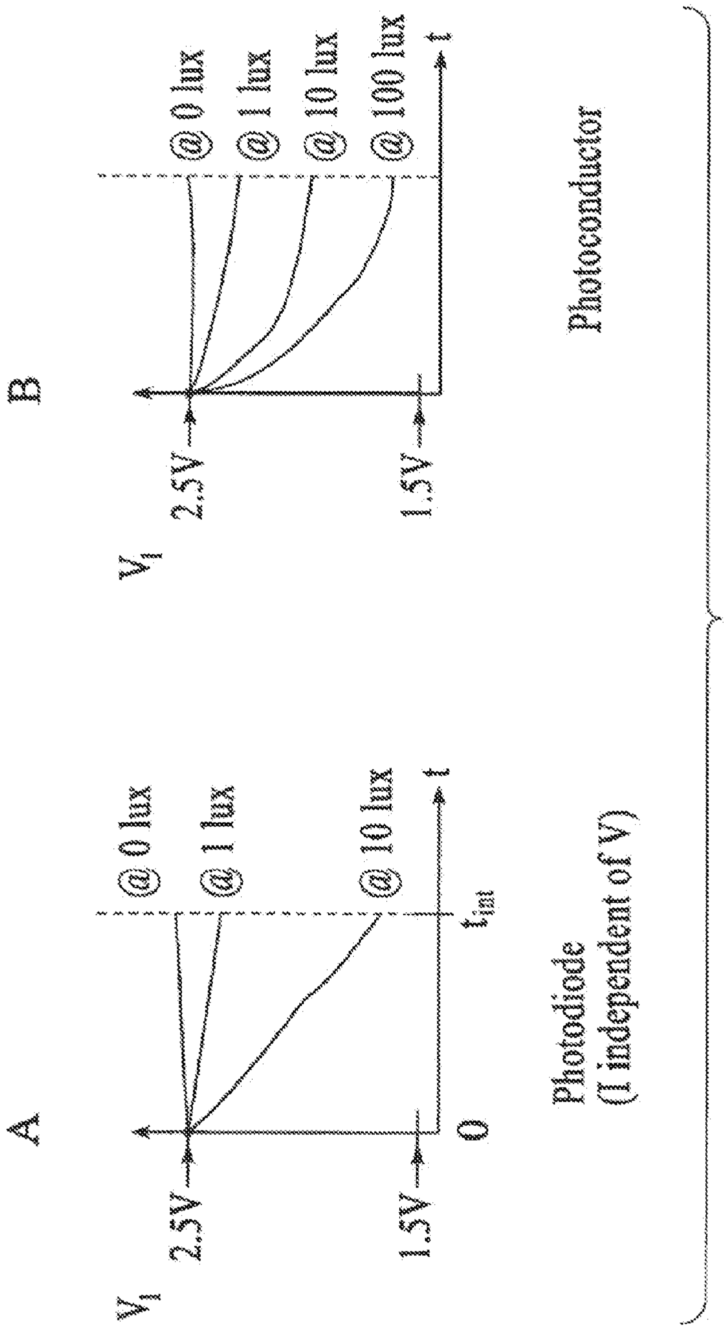

FIGS. 15(*a*) and 15(*b*) show the voltage at vsrc (node 11 of FIG. 12) as a function of time for two cases: (a) A photodiode or (b) A photoconductive with bias-dependent gain. In (a), because the quantum efficiency is irrespective of bias, even as the capacitor discharges and the voltage at vsrc decreases, decreasing the bias across the photodiode, the rate of discharge remains fixed for a given illumination level. In contrast, in (b), because the gain depends on bias, as the capacitor discharges and the voltage at vsrc decreases, decreasing the bias across the photoconductor, the rate of discharge decreases for a given illumination level.

As a consequence, in (a), in the example, only light levels 0-10 lux can be contained within the (typical) 1 V output swing of the read-out circuit which feeds into an analog-to-digital converter having 1 V input swing. In contrast, in the example, light levels 0-100 lux are contained within the 1 V output swing of the read-out circuit which feeds into an analog-to-digital converter having 1 V input swing.

Figure 16:
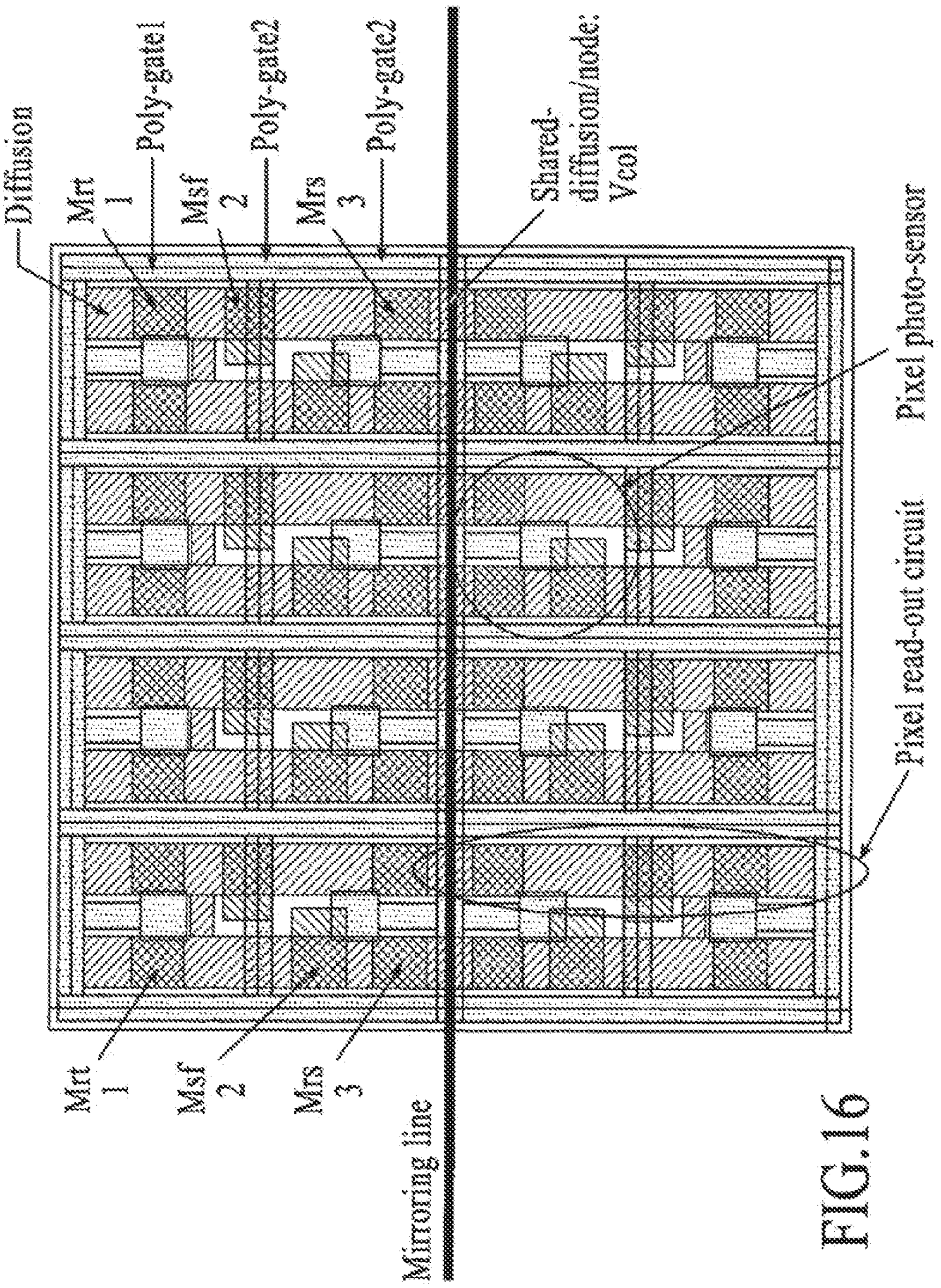

FIG. 16 is a layout diagram for a 3T1.4 um rectangular pixel according to an embodiment. This pixel has the same schematic diagram and circuit operational description as the 3T 2.4 um pixel of FIG. 12. In order to achieve a much smaller pixel pitch, the underlying pixel read-out circuit is laid-out in a rectangular fashion. Layout-mirroring is also used to further reduce the layout area. The following layout diagram of a 4×4 pixel array illustrates this. Note that the photo-sensor pixel is a 4×4 array while the underlying pixel-read out circuit is arranged in an 8×2 fashion. The mirroring line is also shown in the layout, where the mirroring happens by mirroring the layout of the 8 pixels above this line about the 'mirroring line' to form the bottom 8 pixel layout.

In FIG. 16 the geometries labeled as poly-gate1 and diffusion combine to form the reset transistor Mrt. The geometries labeled as poly-gate2 and diffusion combine to form the source-follower buffer transistor Msf. The geometries labeled as poly-gate3 and diffusion combine to form the row-select transistor Mrs.

Although this pixel is typically considered to be a non-sharing pixel, in which there is no transistor sharing between pixels, the mirroring results in a 'shared-diffusion' where the diffusion representing node vcol (9) is shared between pixels above and below the mirroring line. This is where the area savings come about through mirroring. All the vcol nodes from all the pixels along the same column are electrically connected.

Figure 20B:
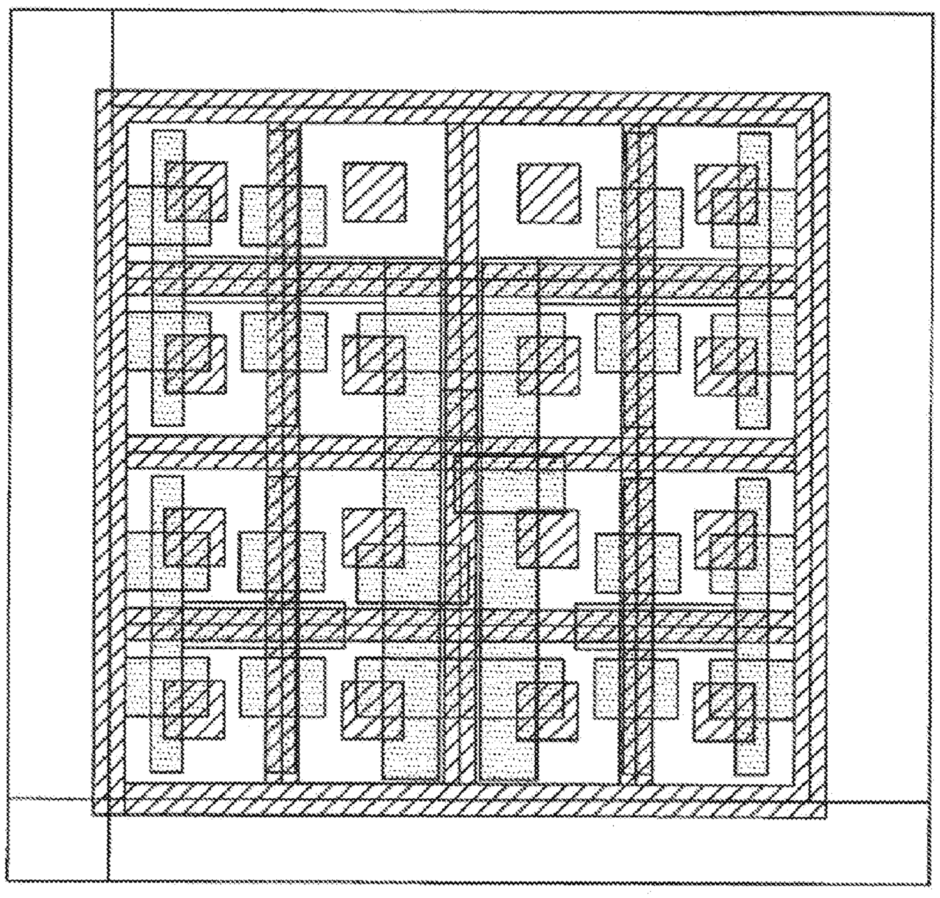
FIG. 20*b* is a layout for the 16-to-2 shared pixel circuit of FIG. 31*a;*
Figure 20C:
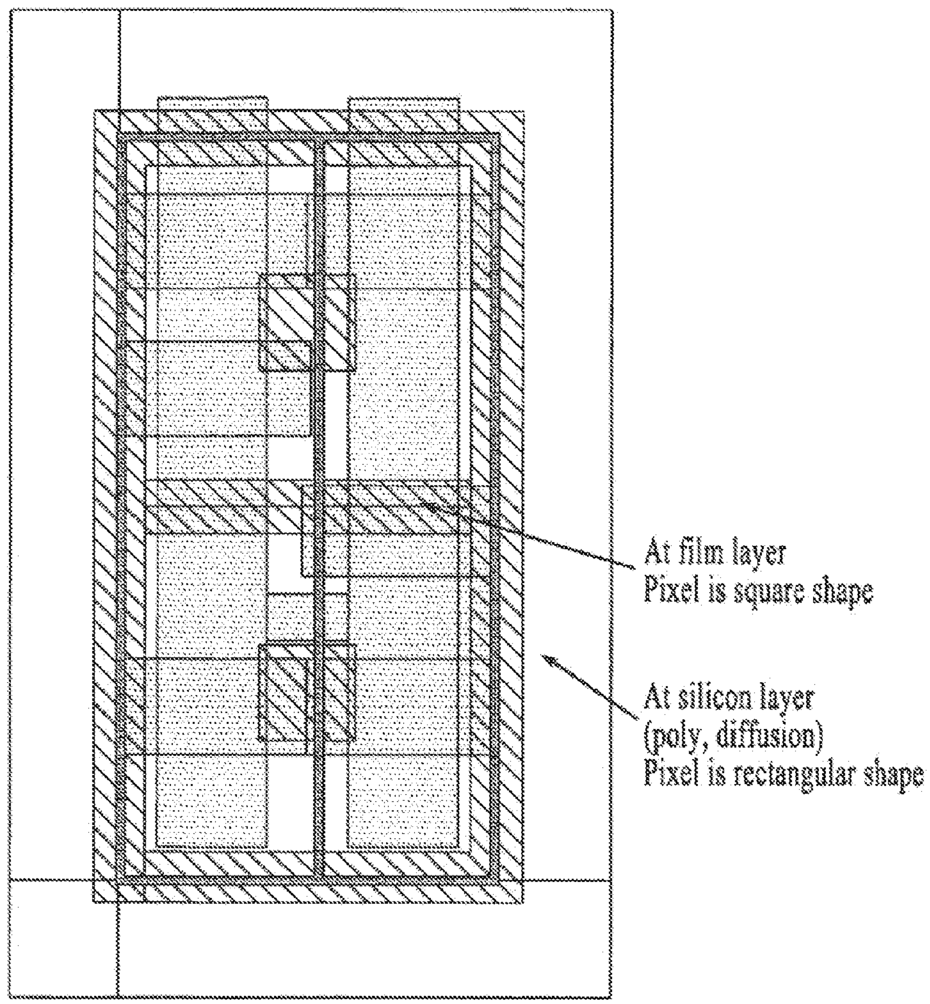
FIG. 20*c* shows a layout for pixel circuits for two pixel regions where each pixel circuit extends below both pixel regions.
Figure 22B:
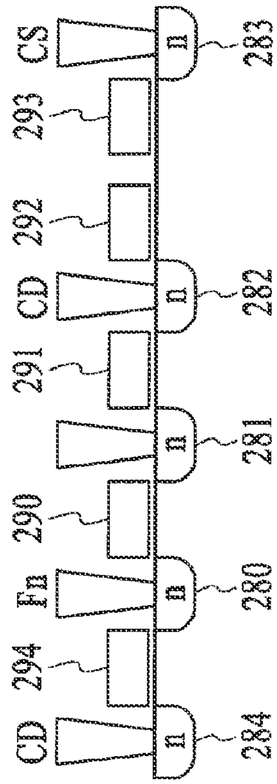

FIG. 20*c* shows a layout for two pixel circuits. The top square in FIG. 20*c* is one pixel region and the bottom square is the other pixel region. The pixel circuit is formed on the semiconductor substrate under the pixel regions. The side-by-side rectangular regions on the right and left of FIG. 20*c* outline the layout of the pixel circuit for each pixel region. In this embodiment, the pixel circuit for each pixel region extends under one half of each pixel region. This layout, in which the pixel circuits are not confined to the space below the corresponding pixel region, allows for more flexibility in layout and may provide for a more compact pixel circuitl layout.

Figure 17:
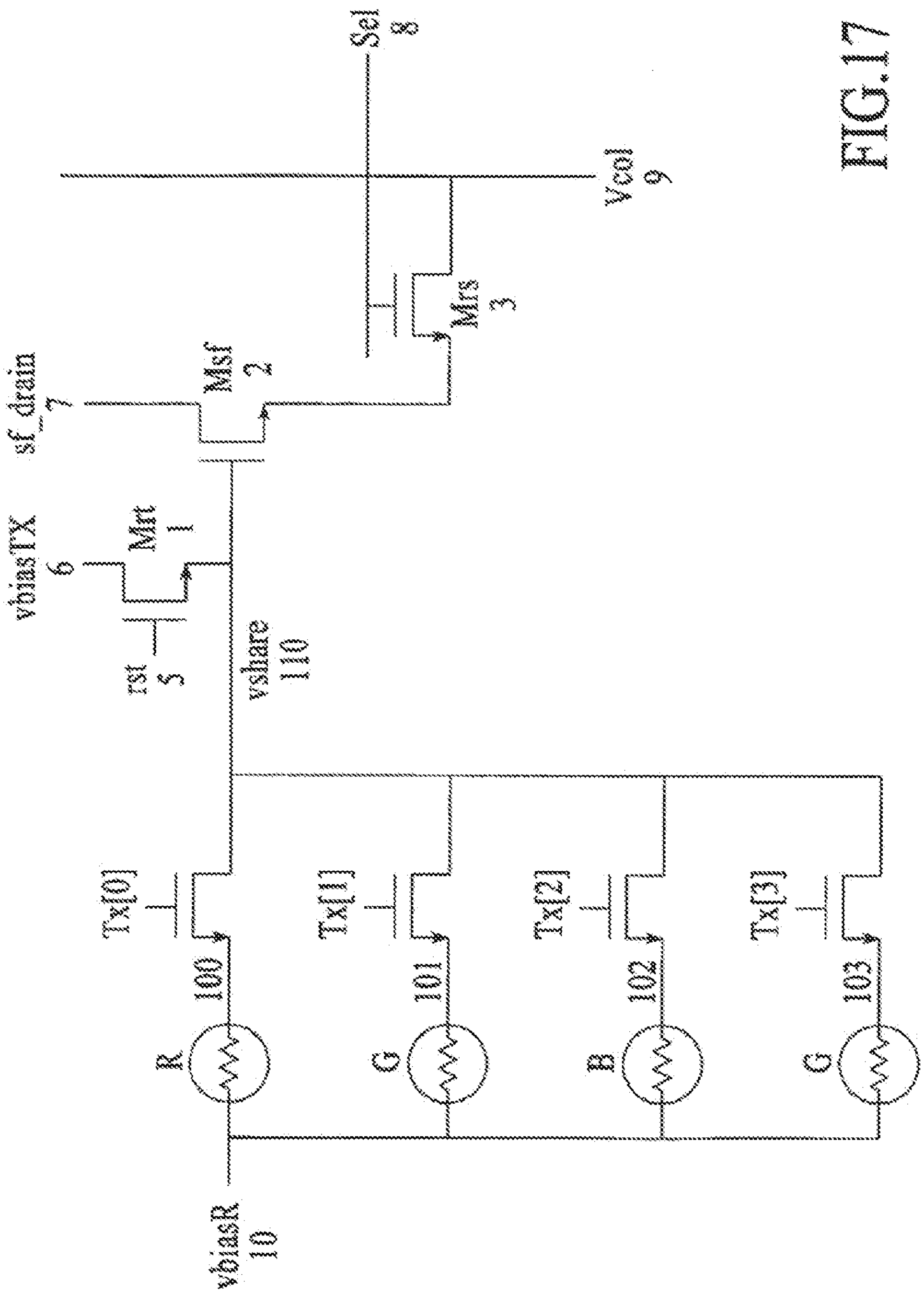

FIG. 17 is a circuit diagram of a pixel according to another embodiment. The diagram is further explained with reference to the legend below.

Bias Voltages:
vbiasTX=nominal 2.8V-fixed
sf_drain=nominal 2.8V-fixed
vbiasR=adjustable: −2V to 2.8V
Signal Voltages:
vshare=1.5V→2.5V
Vcol=1.5V→0.5V
Timing Control Signals:
sel=row select; 0→2.8V
rst=reset; 0→4V
tx[0:4]=transfer switches; 0→4V
Mrt=reset transistor
Msf=read-out buffer
Mrs=row-select transistor The operation of the circuit of FIG. 17 is similar in principal to that of the 3T 2.4 um pixel of FIG. 12. In this particular design, the transistors Mrt, Msf, Mrs are shared between 4 pixels. The TX[0:4] transistors are switches that isolate the 4 different pixels from the shared 'floating diffusion' or '-vshare (110).

The group of 4 pixels shown consists of 2 G(reen) pixels and 1 R(ed) and B(lue) pixels each, compatible to a Bayer pattern.

During the reset phase of each of the 4 pixels, for example the 'R' pixel', node rst (5) and Tx[1] is set to a high voltage (in one embodiment up to 4V, through an on-chip charge-pump/regulator circuit) so that node 110 and 101 will be charged to a voltage equal to vbiasTX (node 6) which is typically set to the supply rail: 2.8V. Once this 'reset' operation is completed, Node 5 and Tx[1] are being set to 0V. Due to parasitic capacitance effects, the 'reset' voltage at node 101 will be settled to ~2.5V.

At this time, the photo current s is being generated within the pixel R, and the amount of photo current (photo sensitivity) generated is dependent on the voltage across the pixel, (e.g., 101-vbiasR). With vbiasR being able to be set arbitrarily to any voltage level from −2V to 2.8V, the light sensitivity of the pixel can be adjusted.

The photo current discharges the parasitic capacitance at 101 and its voltage level drops at a rate dependent on the value of the parasitic capacitance at node 101 as well as the equivalent conductance of the Film during the integration time.

After a specific integration time, the integrated voltage at node 101 will be read out by 'charge-sharing' between node 110 and 110 through turning on Tx[1]. In order to achieve that during a read-out, node rst (5) is first set to a high value (up to 4V) to set the node 110 to the 'reset' voltage value (2.5V). Tx[1] will then be set to a high voltage (up to 4V), connected the nodes 101 and 110 to enabling the 'charge-sharing' operation, through which integrated voltage at 101 will rise whereas the voltage at node 110 will drop until they equalize. This resulting voltage level is then read out through transistors Msf (2) and Mrs(3), the source-follower buffer transistor and the Row-select transistor by setting the node Sel (8) to a high level (2.8V).

The read-out operation is the same for the other 3 pixels in the group of 4 pixels.

Figure 18:
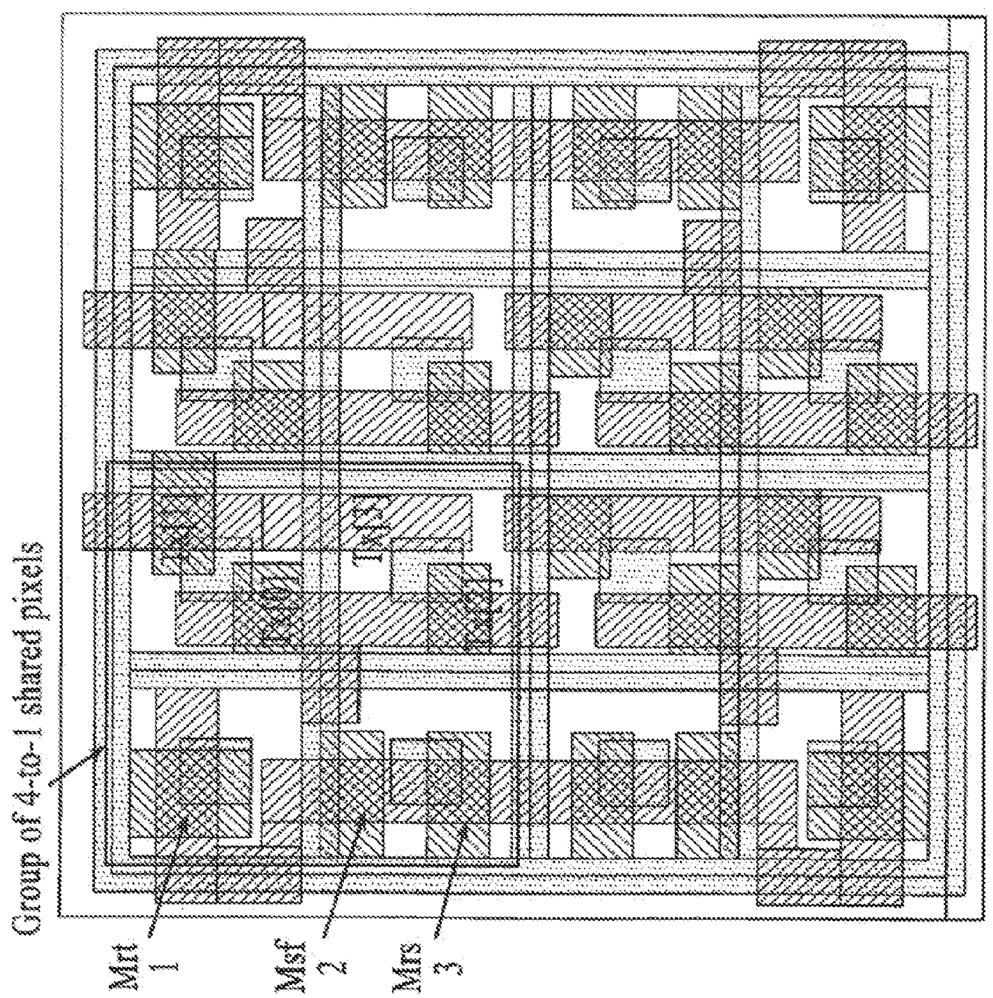

FIG. 18 is a layout illustrating a 4×4 pixel array according to an embodiment. One group of 4-to-1 shared pixel as described above is referenced in FIG. 16.

In some embodiments, pixel can change shapes from one layer to another layer, while maintaining the same pixel area. For example, in quantum film layer the pixel region can have square shape while in silicon layer for the pixel circuit has rectangular shape. As another example, if the film layer pixel is 2 um×2 um, the silicon layer pixel can be 4 um×1 um: so putting together 4 silicon layer pixels in a row gives a total area of 4 um×4 um, which corresponds to 2×2 array of film layer pixels. Utilizing this pixel shape flexibility one can achieve very high pixel sharing such as 16-to-2 sharing, which means 16 pixels can be read out using 2 sets of readout transistors. FIG. 20*b* shows the layout for a 16-2 shared pixel circuit in which transistors are shared among two sets of eight pixels.

Figure 19:
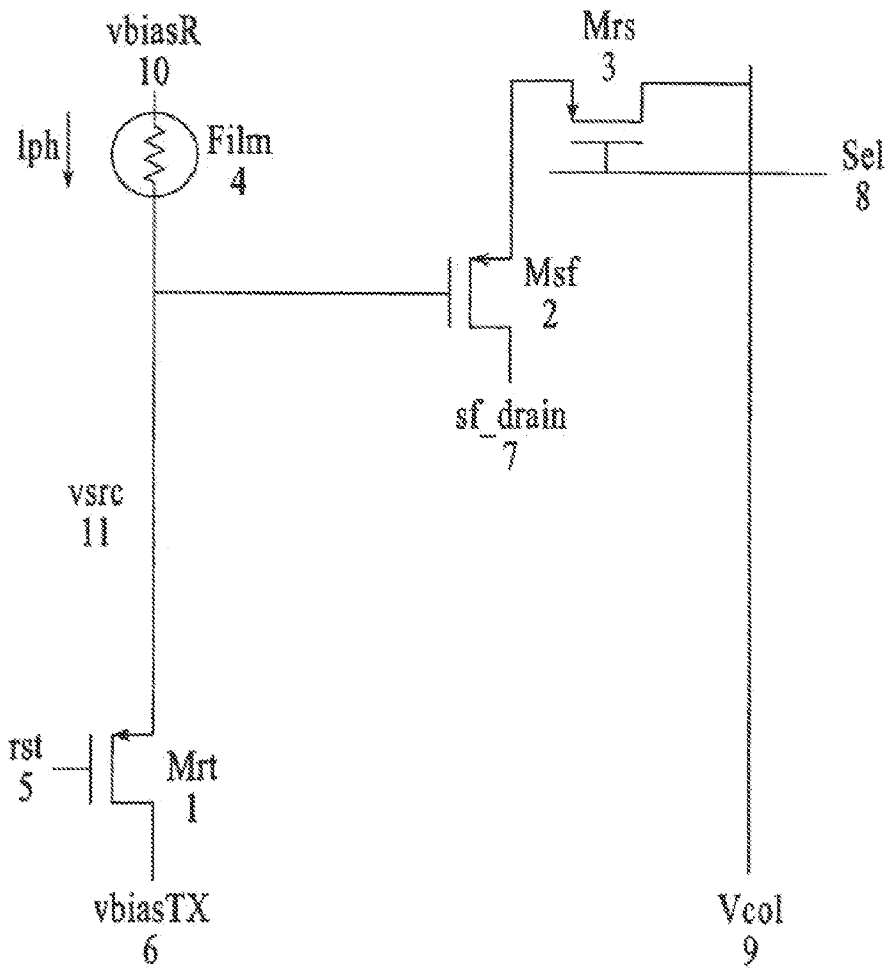

FIG. 19 is a circuit diagram of a pixel according to another embodiment. The diagram is further explained with reference to the legend below.

Bias Voltages:
vbiasTX=nominal 0V-fixed
sf_drain=nominal 0V-fixed
vbiasR=adjustable: 0 to 4V
Signal Voltages:
vsrc=0.3V→1.3V
Vcol=1.3V→2.3V
Timing Control Signals:
sel=row select; 0→2.8V
rst=reset; 0→4V
Mrt=reset transistor
Msf=read-out buffer
Mrs=row-select transistor To capture the photo current generated on Film (4), Iph, the reset transistor 1 is turned on by setting node 5 low (0V) so that node 11 will be charge to a voltage equal to vbiasTX (node 6) which is typically set to ground: 0V. This is the reset phase. Once this 'reset' operation is completed, Node 5 is being set to 2.8V to turn off the reset transistor Mrt (1). In doing so, charge injection and parasitic capacitive feedthrough effects will cause node 11, now becoming a floating node, to rise by approximately 300 mV. Therefore after the 'reset' operation the actual 'reset' voltage value at node 11 is approximately 0.3V.

At this time, the photo current s is being generated within Film (4), and the amount of photo current (photo sensitivity) generated is dependent on the voltage across the Film (4), i.e. (vsrc-vbiasR). With vbiasR being able to be set arbitrarily to any voltage level from 0V to 4V (generated through an on-chip charge-pump/regulator circuit), the light sensitivity of the pixel can be adjusted.

The photo current from Film (4) charges up the parasitic capacitance at the vsrc node (11) and its voltage level rises at a rate dependent on the value of the parasitic capacitance at vsrc (node 11) as well as the equivalent conductance of the Film during the integration time.

After a specific integration time, the resulting integrated voltage at node 11 will be read out through transistors Msf (2) and Mrs(3), the source-follower buffer transistor and the Row-select transistor by setting the node Sel (8) to ground.

T operation of this pixel is similar in principal to that of the 3T 2.4 um NMOS pixel with all the transistors and voltage polarity 'flipped'. The same technique can be used for all other embodiments of pixels as described herein.

FIGS. 21-36 show additional pixel circuits including a "global" shutter arrangement. A global shutter arrangement allows a voltage for multiple pixels or the entire array of pixels to be captured at the same time. In example embodiments, these pixel circuits may be used in combination with small pixel regions that may have an area of less than 4 micrometers squared and a distance between electrodes of less than 2 micrometers in example embodiments. The pixel regions may be formed over the semiconductor substrate and the pixel circuits may be formed on or in the substrate underneath the pixel regions. The pixel circuits may be electrically connected to the electrodes of the pixel regions through vias and interconnect layers of the integrated circuit. The metal layers may be arranged to shield the pixel circuits (including transistors or diodes used for global shutter) from light incident on the optically sensitive layers in the pixel regions, as father described below.

Some embodiments of global shutter pixel circuits have a single global shutter capture in which all of the rows are read out before a new integration period is commenced. Other embodiments have a continuous global shutter that allows integration of a new frame to occur simultaneously with the read out of a previous frame. The maximum frame rate is equal to the read out rate just as in the rolling shutter. The single global shutter may require the read out to be stalled while the pixel integrates. Therefore, the maximum frame rate may be reduced by the additional integration time.

Embodiments of global shutter pixel circuits described below include several variations of 5T, 4T, 3T, 2T, and 1T pixels that achieve global shutter using quantum dot film. In an example embodiment, the quantum dot film may be a photoconductor with an optically sensitive nanocrystal material as described above. In example embodiments, the current across the film has a non-linear relationship with light intensity absorbed by the nanocrystal material. A bias is applied across the nanocrystal material by electrodes as described above, which results in a voltage difference across the film. In example embodiments, the film provides photoconductive gain when this bias is applied across the film as described above. The electrodes may be in any of the photoconductor configurations described above or in other configurations. In some embodiments, these circuit may be used to read out one layer of a multi-layer or multi-region color pixel as described further below.

In example embodiments of global shutter pixel circuits some or all of the following may be used:

- The film can be configured as a current source or current sink
- A charge store may be independent from the film in the pixel region and isolated from the radiation source.
- A separation element (including non-linear elements, e.g. a diode or a switch) between the film interface and the storage element. may be used
- A readout transistor, configured as an amplifier that may operate independently of the other commonly connected devices may be used. The amplifier is typically operated as a source follower, but other embodiments may also be used.
- Implicit or parasitic diodes that can be used to either reset the film or control the readout transistor in some embodiments.
- The array of pixel regions may have one common electrode shared between all pixel regions (or sets of adjacent pixels) and each pixel region may have one independent electrode isolated from the others. The common electrode can be positive or negative and does not have to be bound by CMOS rails or ESD devices in some embodiments. The common electrode can accept dynamic signaling in some embodiments.
- For continuous shuttering with simultaneous readout, a mechanism to reset the film independent from the charge store is used in example embodiments.

The following FIGS. 21-26 illustrate global shutter pixel circuits according to example embodiments. FIGS. 21-36A are each pixel schematic circuit diagrams of a particular embodiment. Corresponding FIGS. 21-36B are each device cross-section diagrams illustrating a physical arrangement of the corresponding circuit in an integrated circuit device.

Abbreviations used to describe the various embodiments are explained as follows: 4T indicates 4 transistors are used; C indicates "continuous"; NC indicates "non-continuous"; 2D indicates 2 diodes; and +1pD indicates 1 parasitic (or essentially "free") diode.

Figure 21B:
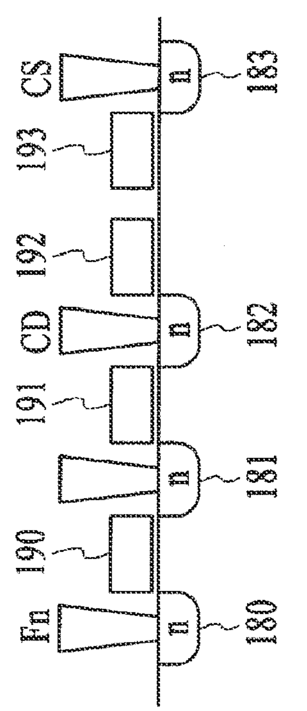
Figure 21A:
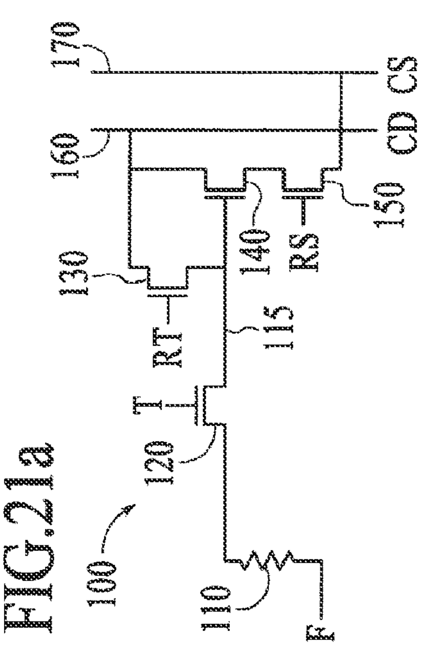

4T, NC Global Shutter Circuits:

The operating concept of the 4T is the basis for the other designs as well. FIG. 21A is a circuit diagram of a pixel/cross-section/layout for an embodiment of a 4T, NC device 120. Device 120 is the isolation switch which enables the global shutter. The pixel is reset with RT high and T high. After the exposure expires, T is switched low and the film no longer integrates onto the gate of 140. RS is switched high and INT is sampled at CS.

Next RT and T are switched high and then low, in the appropriate order. The signal RESET is sampled. The pixel value is RESET-INT. The dark level of the pixel is adjusted by setting CD to the desired value which may be different from the value of CD during global reset. Double sampling serves the purpose of removing threshold variation and setting the dark level offset. The film at 110 acts as a current sink Device 150 acts as a switch for the source current for the follower at 140. Device 130 resets the storage node and the film. The storage node is at 115.

Figure 22A:
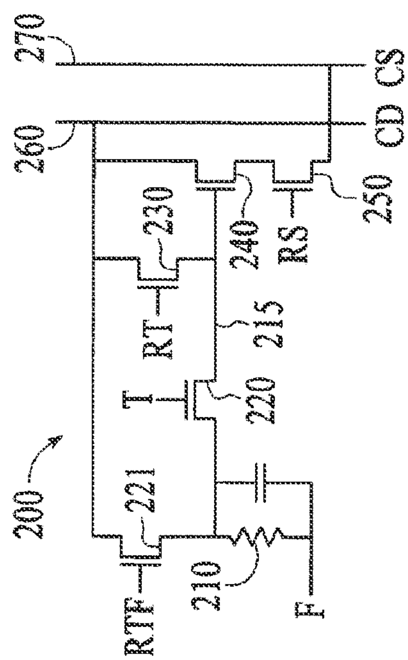

5T, C Global Shutter Circuit:

FIG. 22A is a circuit diagram of a pixel/cross-section/layout for an embodiment of a 5T, C device. In order to achieve continuous global shuttering shown in FIG. 22A, the film 210 is reset independently of the storage element 215. The 5th transistor 221, as shown in FIG. 22A enables this. The film with parasitics is then considered a self contained integrator. It is reset by 230 and charge is transferred with 220. The sampling scheme is identical to the 4T design except for the fact that the storage element at 215 is now reset independently from the film, that is, signal T is low when RT is brought high.

Figures 23A, 23B, 24A, 24B:
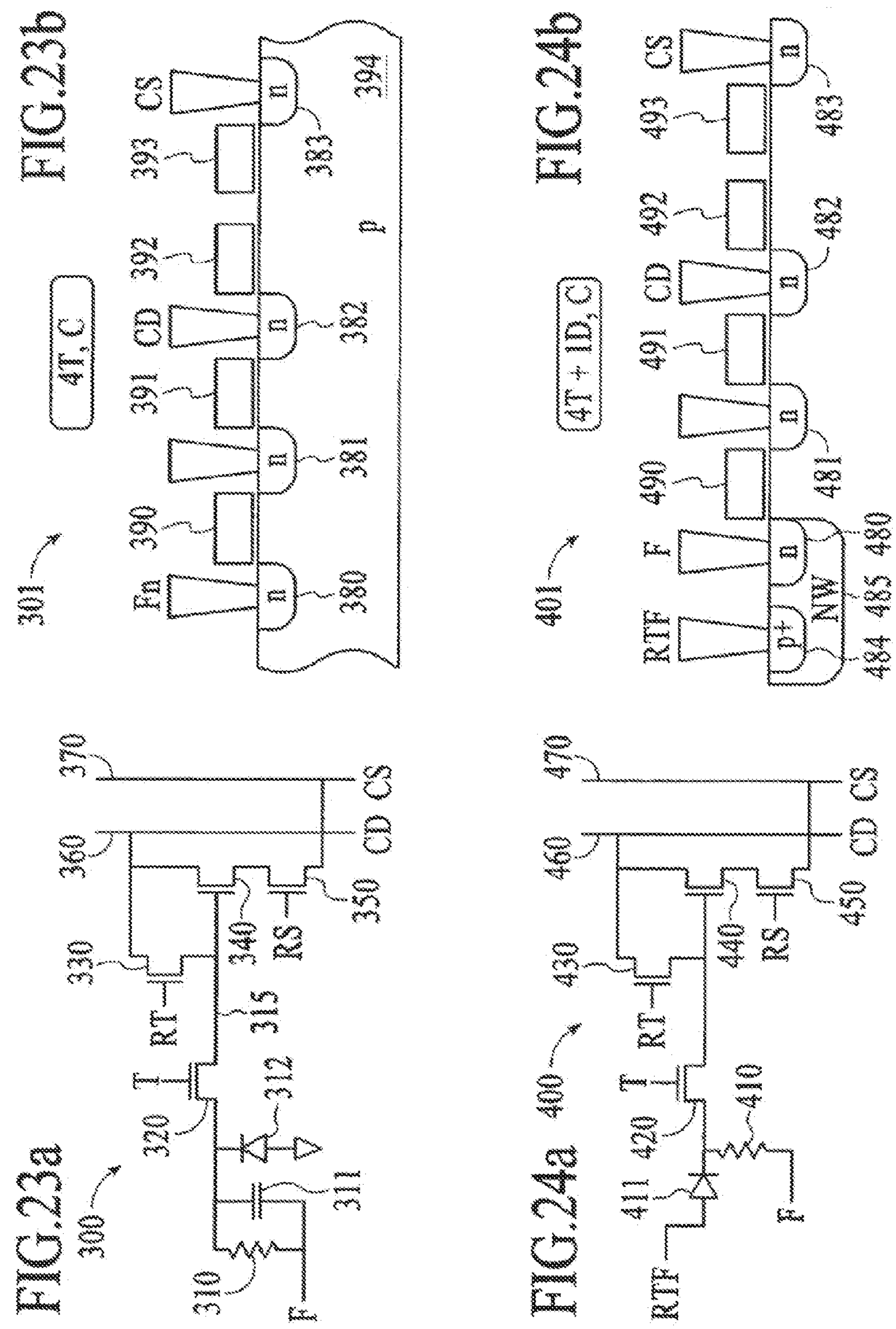

4T (+1 Pd), C Global Shutter Circuit:

FIG. 23A is a variation of the circuit for the 4T as in FIG. 22A with the addition of parasitics. These parasitics can be used to achieve continuous global shuttering with only 4T in this embodiment. The parasitic diode 312 now allows reset of the film 310. The common film electrode F is brought negative such that 312 turns on and resets the film to the desired level. This charges the parasitic film capacitor 311 (not necessarily in the film). The F electrode is now brought back up to a new, higher level and the film is left to integrate. The film can now be reset as many times as desired without affecting the storage element at 315.

4T (+1D), C Global Shutter Circuit:

Continuous shuttering shown in FIG. 24A is achieved in 4T with the addition of a diode 411. The diode is created with a PN junction inside an Nwell region 485. The operation is the same as the 5T shown in FIG. 22A. The main different is that the reset device is replaced with a diode. When RTF is high, current can flow to pull the film at 410 to the reset level. Later RTF falls to allow integration at the film node. Parasitic capacitance provides the primary storage node.

Figure 25A:
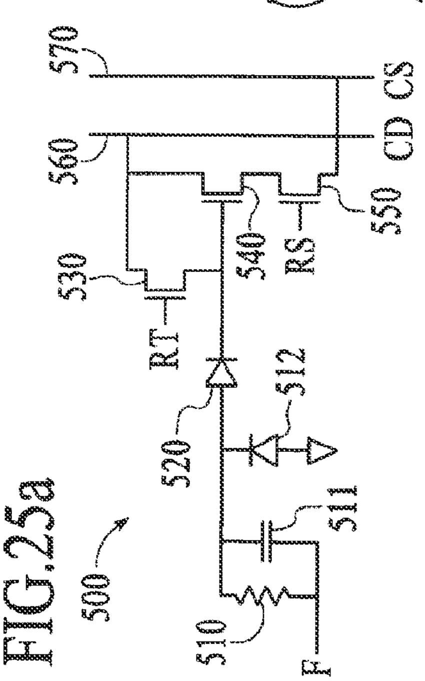
Figure 25B:
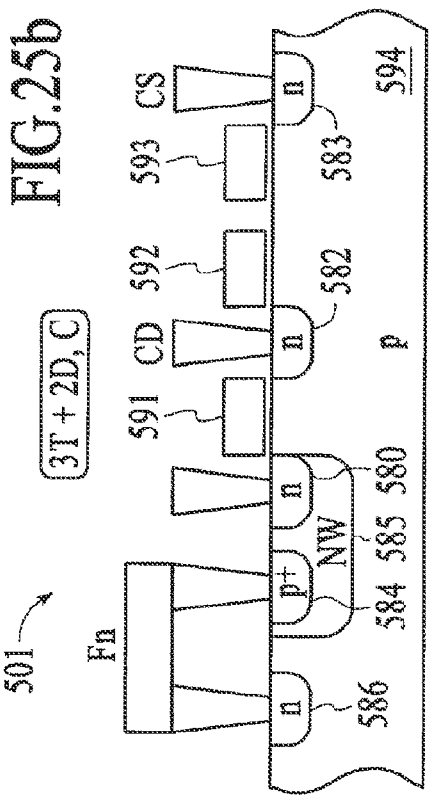

3T (+2D), C Global Shutter Circuit:

FIG. 25A shows a 3T configuration where diode 520 replaces the transistor from 320. The parasitic diode 512 is used to reset the film 510 independently of the storage node at the gate of 540. This is achieved by pulsing the F node to a negative value such that the diode 512 turns on. After charge is integrated at 511, it is transferred by driving F to a high voltage. This turns on diode 520.

Figure 26A:
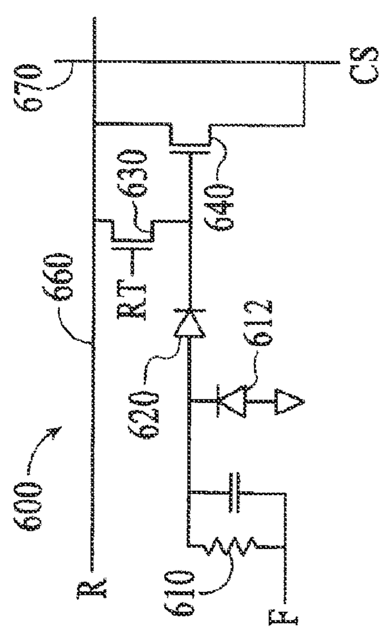
Figure 26B:
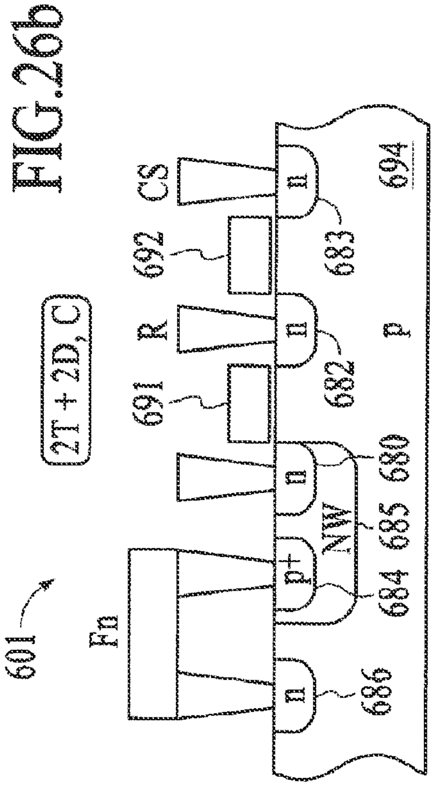
Figure 28B:
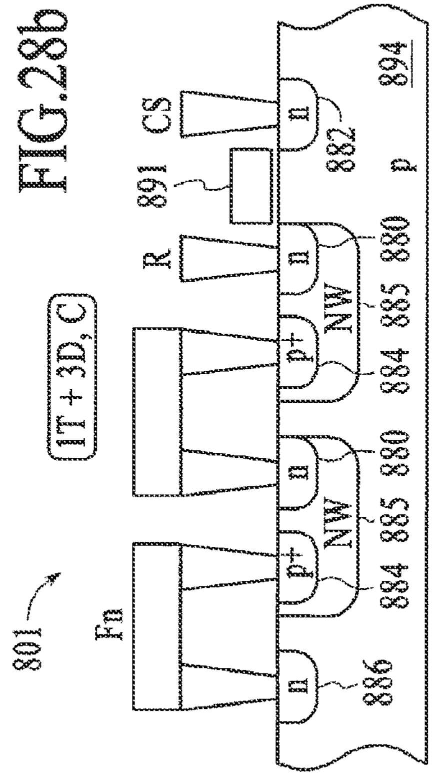

2T (+2D), C Global Shutter Circuit:

FIG. 26A shows a 2T pixel capable of continuous global shuttering. The 2 diodes at 612 and 620 act to reset the pixel and transfer charge as described in section 6. Now the row select device at 550 is eliminated. The pixel works with a single column line 670 and a single row line 660. With the addition of the RT line, a total of 2 horizontal wires and 1 vertical wire are needed for operation. This reduces the wiring load necessary for each pixel. The pixel works by resetting the storage node at the gate of 640 to a high voltage and then dropping R to the lowest value. This turns off the source follower at 640. In order to read the pixel, R is brought high. The parasitic capacitance at the pixel, particularly at Drain/Source of 630 causes the storage node to boost to a higher level as R is brought high. In this "winner-take-all" configuration, only the selected row will activate the column line.

Figure 27B:
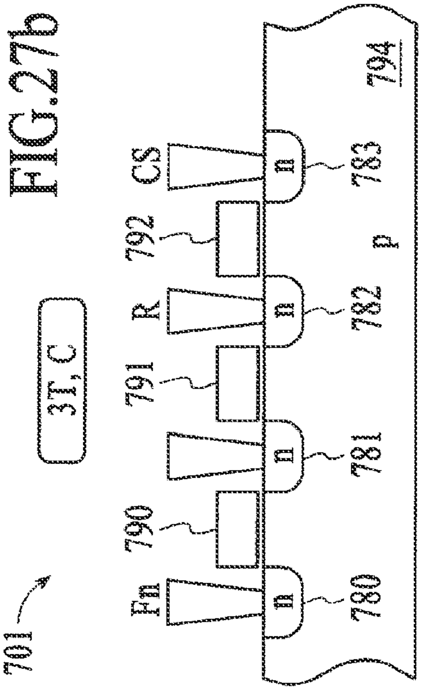
Figure 27A:
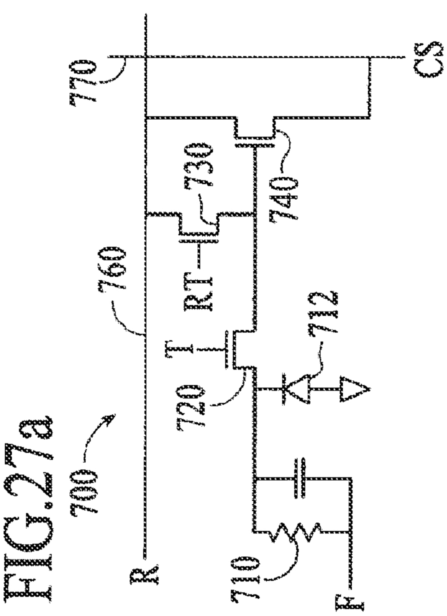

3T (+1 pD), C Global Shutter Circuit:

Another embodiment of the 3T continuous pixel is shown in FIG. 27A. Here, the row select device as described above is eliminated. One advantage of this 3T is that there are no explicit diodes. The parasitic diode at 712 resets the pixel independently from the storage node. The cross section of the device in bulk 794 shows that a small layout is possible.

Figure 28A:
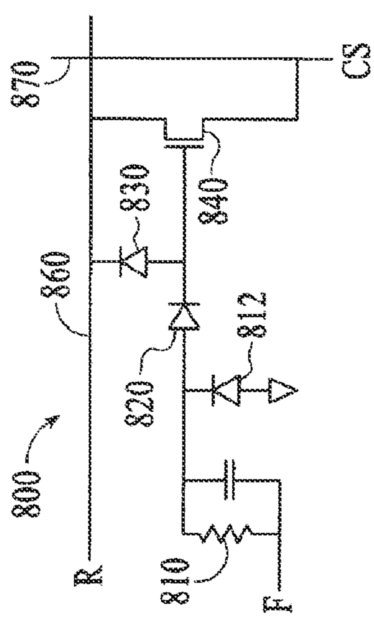

1T (+3D) Global Shutter Circuit:

A 1T version of the pixel where diodes replace critical transistors is shown in FIG. 28A. First the film 810 is reset by bringing F negative. Next integrate by bringing F to an intermediate level. Finally, transfer charge by bringing F high. The scheme is such that even under saturation, bringing F high pushes charge onto the storage node. The storage node is reset by bringing R low. Since charge is always pushed onto the storage node, we guarantee that the reset function properly sets the initial charge.

Figure 29A:
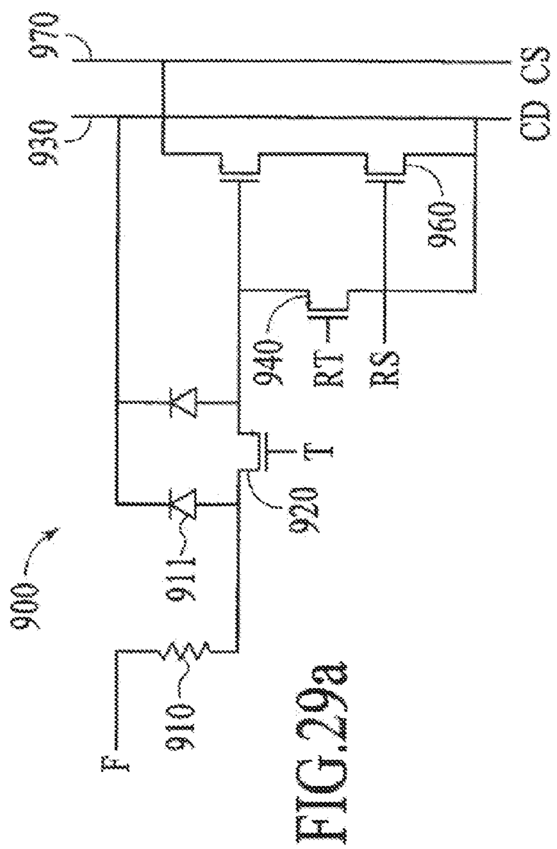
Figure 29B:
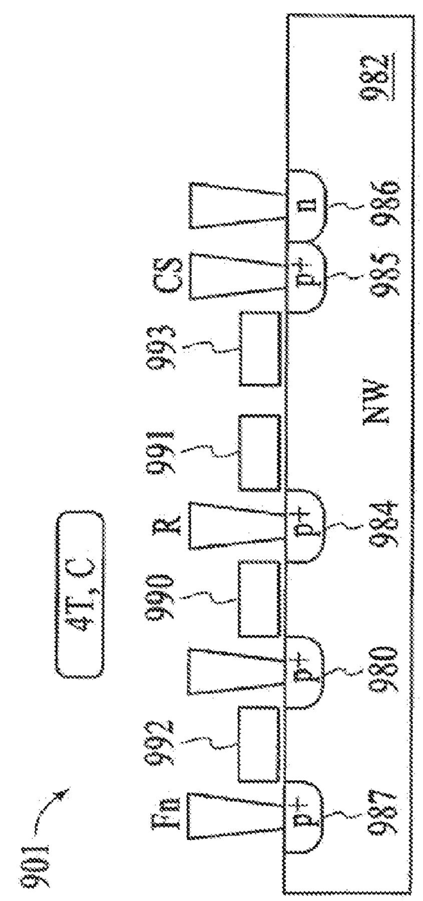

4T, PMOS Global Shutter Circuit:

A PMOS version of the 4T is shown in FIG. 29A. This operates similar to the 4T NMOS version except that continuous shuttering is feasible with the P+/NWell diodes 911. By bringing CD low enough, the film 910 reset through the diode to CD.

Figure 30A:
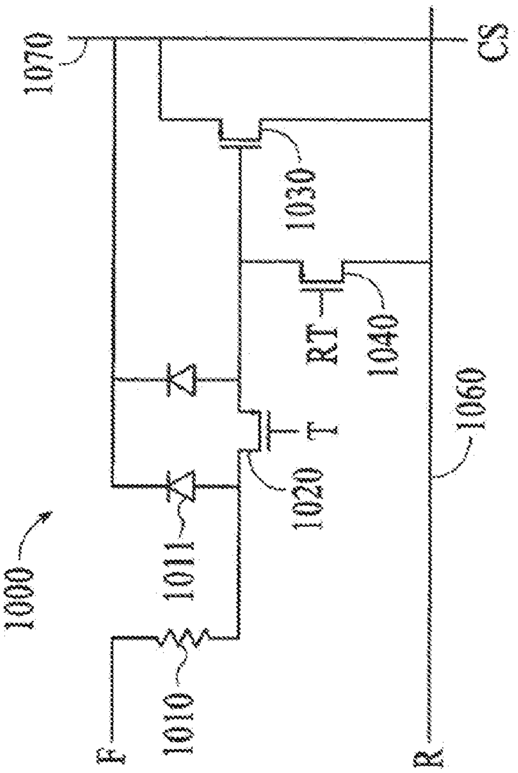
Figure 30B:
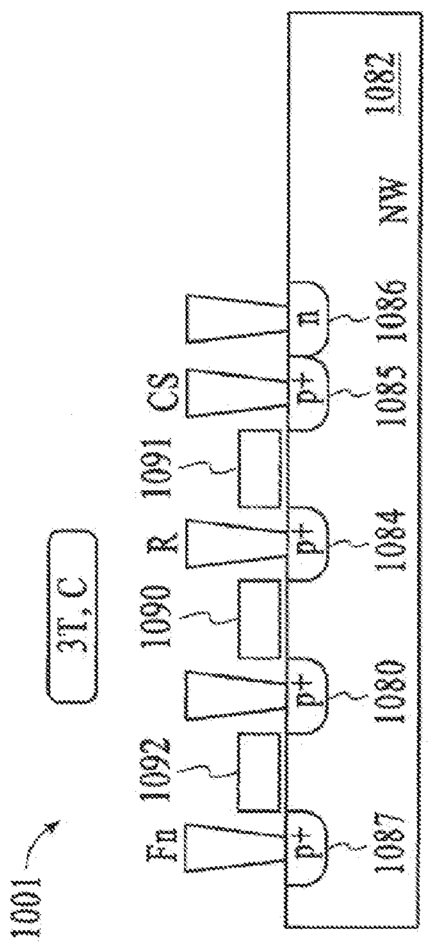

3T, PMOS Global Shutter Circuit:

A PMOS version of the 3T is shown in FIG. 30A. The row select device is now eliminated and a compact layout is formed.

Figure 31A:
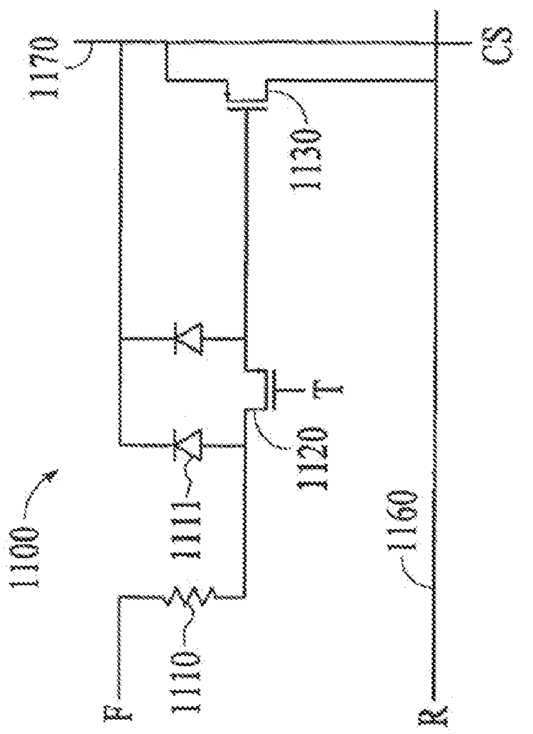
Figure 31B:
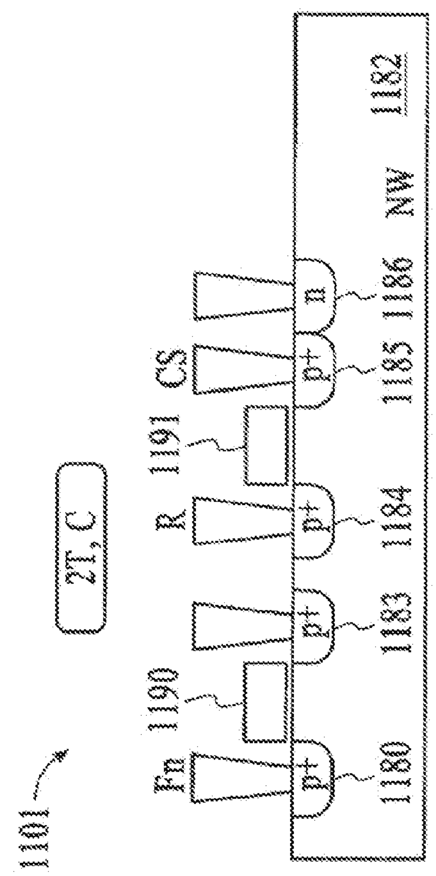

2T, PMOS Global Shutter Circuit:

A PMOS version of the 2T is shown in FIG. 31A. This works by resetting the film globally by bringing CS low. Charge is then transferred across 1120.

Figure 32A:
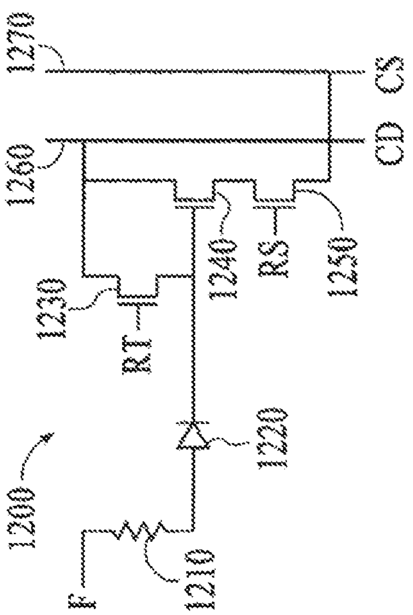
Figure 32B:
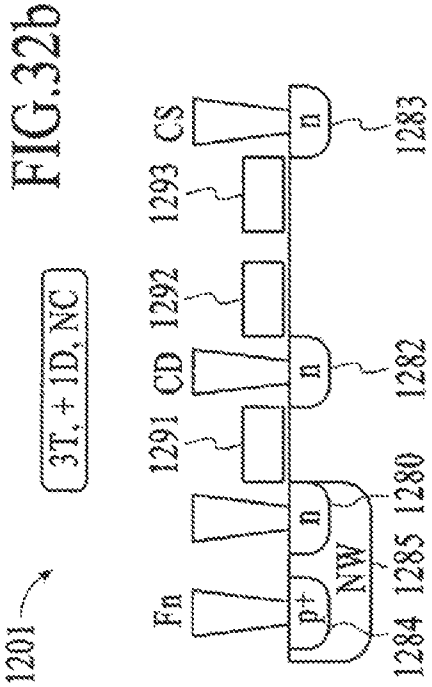

3T (+1D), NC Global Shutter Circuit:

FIG. 32A shows a 3T version of the pixel where the film 1210 sources current rather than sink it. The pixel integrates with F high. When F is forced low the diode 1220 turns off. Once the diode turns off, no more charge is accumulated.

Figure 33A:
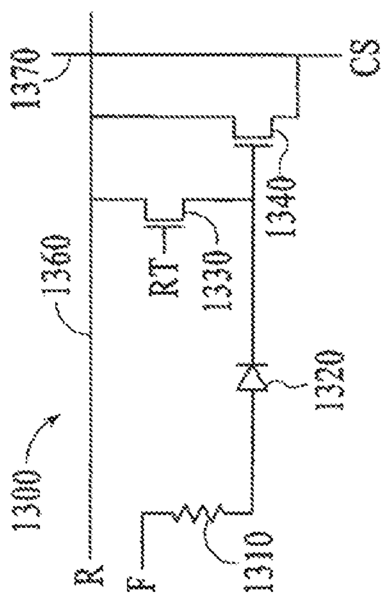
Figure 33B:
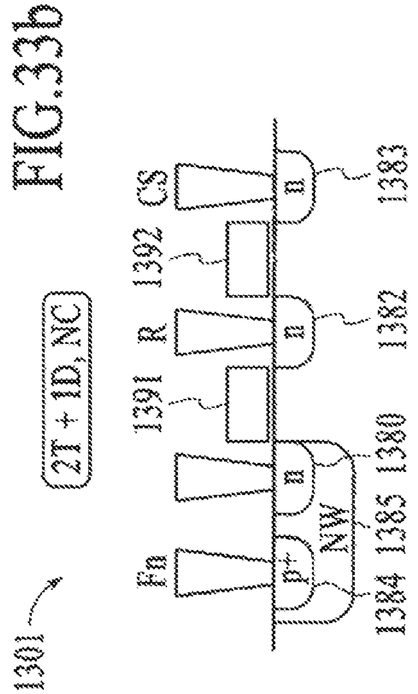

2T (+1D), NC Global Shutter Circuit:

FIG. 33A shows the 2T version where the row select device is eliminated. This saves some area from the 3T but reduces the pixel range.

Figure 34A:
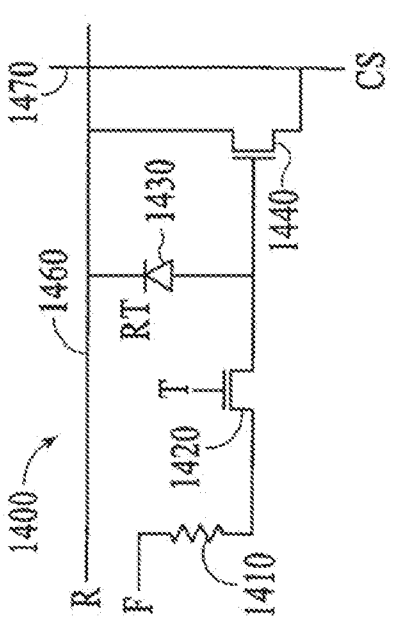
Figure 34B:
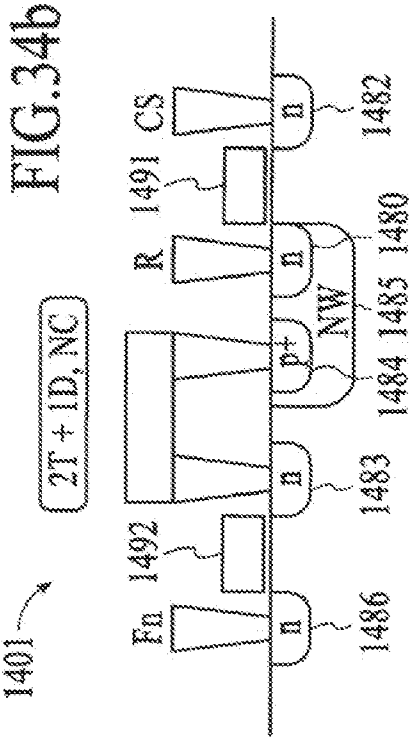

2T (+1D) alt, NC Global Shutter Circuit:

FIG. 34A shows an alternative layout for the 2T where a diode is used as the reset device.

Figure 35A:
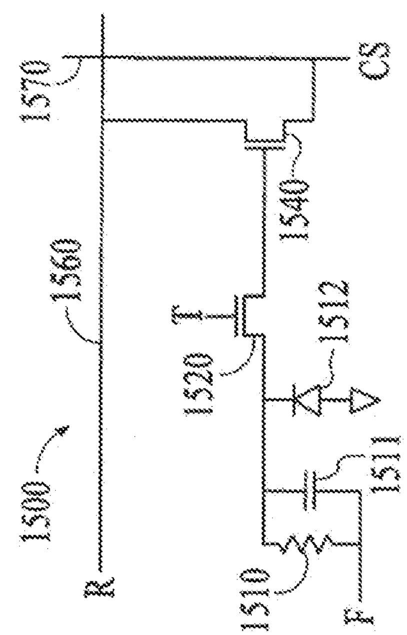
Figure 35B:
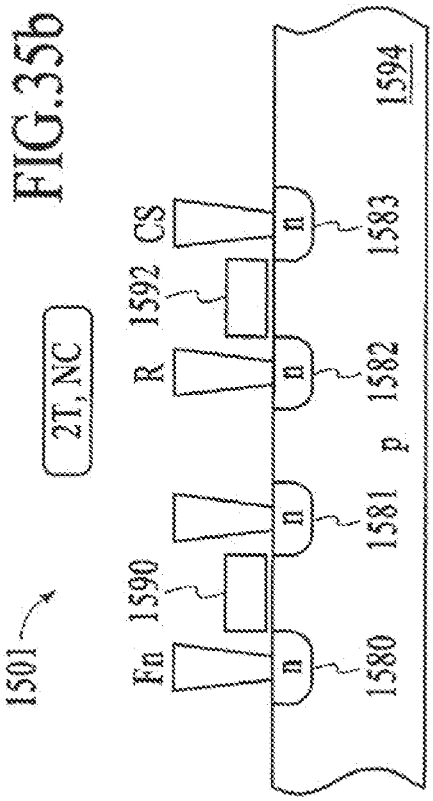

2T (+1 pD), NC Global Shutter Circuit:

FIG. 35A eliminates the reset device and makes use of the parasitic diode 1512 to reset the film.

Figure 36B:
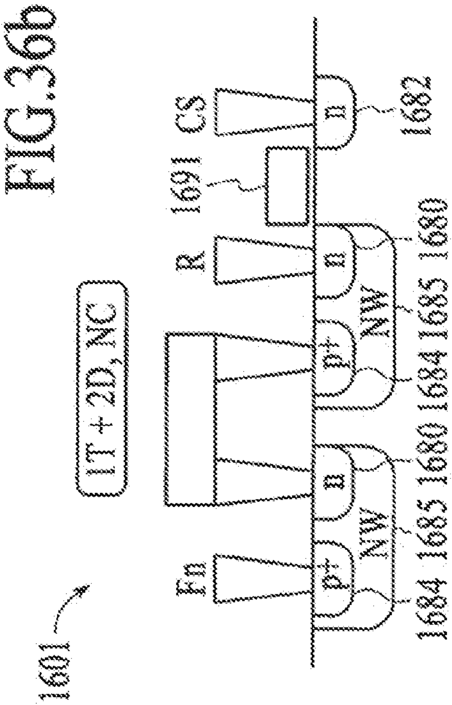
Figure 36A:
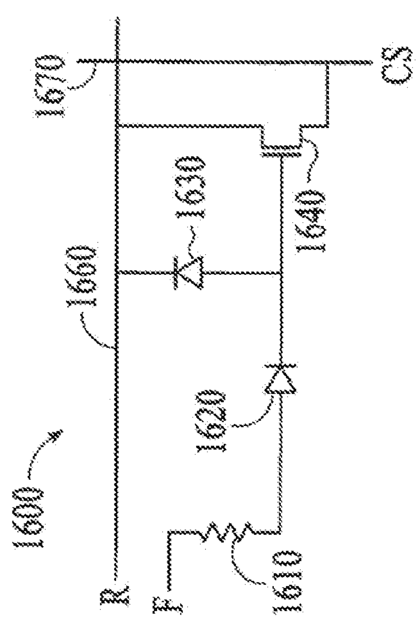

1T (+2D), NC Global Shutter Circuit:

The 1T with 2 diodes produces a compact layout as shown in FIG. 36A. If global shuttering is not needed, then it is possible to create a 1T with 1 diode. The diode in this case is very small. This 1T+1D pixel removes the diode 1620 between the film 1610 and the source follower gate 1640 and makes a direct connection from the film to the source follower gate. The operation of this pixel can be deduced from the description of the 1T+2D which follows. First reset the pixel by bring F high and R low. The film resets through the 2 diodes down to the low voltage at R (eg. gnd). Next drive R to 1V. This causes the film to start integrating. The voltage at the source follower gate starts to increase. If the voltage increase starts to exceed 1V, it will stay clamped by the voltage at R. This is the saturation level. For non-saturating pixel the gate will increase in voltage by less than 1V. To stop integrating charge, F is driven low. This cuts off the path for current to flow into the storage node because of the diode action. When the pixel is to be read out, R is driven up to 3V while the R at every other row is held at 1V. This causes the storage element to boost in voltage by as much as 1V. R provides the drain current for the source follower and the column line is driven by the activated row and no other rows because the source follower is in a winner take all configuration. The INT value is sampled. Next R is dropped to the low level and then pulled high again. This resets the storage node and then the RESET level is sampled. It is possible to set a dark level offset by selecting the appropriate R level in relation to the level used while resetting the film.

The above pixel circuits may be used with any of the photodetector and pixel region structures described above. In some embodiments, the above pixel circuits may be used with multi-region pixel configurations by using a pixel circuit for each region (such as a red, green and blue regions of optically sensitive material). The pixel circuit may read the signals into a buffer that stores multiple color values for each pixel. For example, the array may read out the pixels on a row-by-row basis. The signals can then be converted to digital color pixel data. These pixel circuits are examples only and other embodiments may use other circuits. In some embodiments, the film can be used in direct integration mode. Normally the film is treated as a photo-resistor that changes current or resistance with light level. In this direct integration mode, the film is biased to be a direct voltage output device. The voltage level direct indicates the incident light level.

In some embodiments, the quantum film signal can be read out using transistors that have high noise factors. For example, thin oxide transistors can be used to read out quantum film signal, with the presence of large leakage current and other noise sources of the transistors themselves. This becomes possible because the film has intrinsic gain which helps suppress the transistor noise.

Electrical Interconnections 1404

Referring to FIG. 1, embodiments herein provide interconnection schemes between the quantum dot structures 1100 and the pixel circuitry 1700. The interconnections 1404 include systems and methods to take a signal from each layer of quantum dot material 200 and communicate it to the pixel circuitry 1700 (e.g. a transistor in the circuit). Embodiments involve providing highly non-planar initial surface (i.e. posts of varying heights that will later connect to the appropriate layer of quantum dot structure 1100). In embodiments, an interconnection may be a conductive post (e.g. metal posts) with insulator(s) at desired locations to prevent contact with layers that from which contact is not desired. Nanoparticles may be deposited with a high degree of planarity over the non-planar substrate (i.e. they are planarizing). Connection with the electrical connections is achieved by flow of the nanoparticles around small objects such as posts during quantum dot application. In embodiments, tungsten via levels are used, which are small compared to the flow patterns of the quantum dot materials 200, and provide a good degree of uniformity around the electrical connections. The flowing quantum dot materials may provide a certain degree of planarization over some length scale. Contact to the electrical interconnections is achieved with the aid of adhesion to the electrical interconnections 1404. In embodiments, films are planarized following fabrication using methods such as chemo-mechanical polishing.

Embodiments may enable the addressing of multiple vertical layers of electrically-independent (or nearly-electrically-independent) photoconductive layers using a multiplicity of posts that contact this material substantially from the side. Regions of each post may be electrically conductive to enable electrical contact to the film; while other regions are masked using an insulating layer such as an oxide or nitride to avoid contacting layers to which electrical contact by these posts is not desired. In embodiments, these contacting posts may be formed using vias formed in prior CMOS process layers. In embodiments, the insulating layer or layers protecting the vias may be selectively etched to reveal portions of the via for electrical contacting to a subsequently-deposited photoconductive layer. In embodiments, selective etching of the insulating material only may result in a layer of exposed via metal posts. These may then be covered using a conformal coating of a subsequently-deposited insulating layer. This may result in exposing a portion of each metal post, such as the top, while leaving the sides protected. In this embodiment, the sidewalls are protected, while the tops are open and available for electrical contact. In this embodiment, those posts that have been used to contact lower layers may be used to provide electrical access to a dark (or darker) reference. Those metal posts that are only deprotected on top instead contact an upper layer which forms the strongly-illuminated top pixel. In embodiments, instead of providing independently-addressed light pixels with dark references beneath, the same method of selective deprotection and contacting of different vertically-stacked pixel layers may be employed to address differently spectrally-sensitive (e.g. color) stacked pixels.

In embodiments, quantum dot materials 200 may be electrically interconnected 1404 to pixel circuitry 1700 utilizing a plurality of contact configurations, such as in a lateral planar structure 1418, a vertical stacked structure 1420, a combination of planar and vertical structures, or the like, as shown in FIG. 3. In the lateral planar structure 1418 metal contacts 1412 are laid out in the same layer of the photodetector structure 1400, in this case on top of a glass substrate 1414 and overlaid with the quantum dot material 200. In a similar lateral planar structure 1418, the metal contacts 1412 could have been laid on top of the quantum dot material 200. In a vertical stacked structure 1420 metal contacts 1412 are laid out in different layers of the photodetector structure 1400, in this case with a metal contact between the glass substrate 1414 and the quantum dot material 200, and a transparent contact such as ITO on top of the quantum dot material 200. In embodiments, the electrical connections 1412 are a variety of electrical interconnections 1404, and may be one or more of a plurality of different conductors, such as gold, aluminum, tungsten, copper, tantalum titride (TaN), titanium nitride (TiN), Indium, Aluminum capped with TaN or TiN, or the like. These configurations represent only two of a plurality of possible electrical interconnection 1404 contact configurations, and other configurations will be obvious to one skilled in the art.

An aspect of the present embodiments relates to the layout of the metal contacts relative to the semiconductor photodetector. The electrical interconnections 1404 relate to flow of electricity in several directions. Flow directions generally involve vertical structures (i.e. predominantly up-down current flow) or lateral structures (i.e. planar architecture devices with lateral current flow) or combinations of vertical and lateral structures (i.e. control element in vertical dimension and current flow in lateral dimension or build up lateral structures in a vertical dimension—monolithic integration in the vertical axis).

An aspect of the present embodiments relates to pattern of contacts. In embodiments there may be a lateral presentation of contacts. For example, a row of five along two edges of a square with one bias, an array of edges with ground and positive voltage in the middle, a serpentine pattern, etc. Within one pixel, the system could ground at the bottom of a column and bias at the top of the next column. The pattern could be serpentine, discretized serpentine, interspersed, etc. In embodiments squares can be filled in with circles that lead to useful biasing regimes. For example a plus/minus checkerboard (equivalent to diagonal rows) could be useful. Another pattern could be fill factor dimension: filling in space from a bird's eye view of the pixel. The contacts may be co-planar. With respect to the percentage area that is covered metal from above, one might want to minimize it or one might not want to minimize (e.g., maximize to increase reflectance—thickness is less but still get all radiation 1000 and same quantum efficiency). There may be implications such as making a film of medium thickness relative to the absorption length, conductance versus depth through material, conductance contour versus spatial dimension, current went up from one contact and then down to the other. In embodiments, the dimension is small, surface conductivity is large and routing of current flow from contact to contact may mean fill factor cannot be reduced; the less-illuminated dimension is to be smaller than the lateral dimension to provide this.

In embodiments intentionally induced cracking in the film could produce sub-critical dimension breaks in the film (e.g. cracks where the metal bounds the cracks). In this instance, surface preparation may affect the crack propagation. Embodiments may involve putting down metal patterns, such as in pentagons, hexagons, squares, or the like, and then layering film onto the metal. When processed the film may form cracks, producing an electrical isolation between parts. In embodiments, the cracks may be self-aligned along the metal patterns, or there may be a patterned metal template where there is a minimum dimension gap between the patterned metal regions. In embodiments, a material, such as ITO or similar material, could be applied into the cracks formed in the gaps The electrical interconnections may be made of a variety of metals. The metals may form the contacts to the quantum dot structures 1100. In the case of lateral devices, they may constitute the electrodes. In vertical devices, they may be the bread of a vertical sandwich and the quantum dot structures 1100 are the middle layer. In embodiments the metals may be Pt, Au, Ni, tungsten, aluminum, copper, gold, TaN (tantalum nitride), TiN (titanium nitride), indium, aluminum capped with TaN or TiN or other suitable material.

Embodiments involve a planar architecture shape for the electrical interconnects with a four-point probe architecture. It may use outer pair of contacts to apply a positive voltage bias and to read current flows or resistance changes. In an alternate embodiment, the configuration may have an inner biased pair that is used to measure. The arrangement could include electrical interconnects formed by dots, lines, rings, circles, squares, etc. The electrical interconnects may be provided and this may involve tiling the interconnects in different ways (e.g. hexagonal, fractal tilings, column pitch, etc.). This may provide a fundamental advantage from a space perspective. A four-point probe architecture may involve the use of an outer pair of contacts to apply voltage bias and an inner pair for measurements. Each electrode could be addressed off chip. Embodiments involve a variety of electrical interconnect patterns: hexagonal, fractal, column pitch, rows/columns, hexagonal, or others and there may be various groups, they may be distributed beneath array, and these things may provide increased flexibility by decoupling array from circuitry.

There may be a degree of planarity (pre and post-quantum dot structure addition) associated with the layout of the electrical interconnects of focal plane arrays. Embodiments may provide electrical interconnects that are polished (e.g. so the tops aligned with a passivation layer). The electrical interconnects could have plugs of metal sticking up above the planar level (e.g. this could be desirable in order to enable different degrees in stacked architectures). The electrical interconnects could have valleys in metal and the valleys may be filled in with a material to provide an internally dark region. A dark reference electrical interconnect may be provided internal to the main electrical interconnect to make a dark reference measurement. They could have a valley, which could bring radiation 1000 in, propagate and bring radiation 1000 back out again. They could have a lateral structure. Embodiments may have dielectrics that could bring the metal out, involving the building of an interference filter out of the layers. Embodiments may involve an intentionally sacrificial layer (e.g., of metal) that may enable a spectral shaping allowing a flattening of the gain curve (e.g. such as for enhanced red response, etc.). Embodiments may involve making a six-layer interference coating and manipulating thicknesses of the layers to change the spectral response (such as to boost red response, or blue response, etc.).

Before applying the quantum dot structures 1100 the electrical interconnections 1404 may be formed. The interconnections may come polished and have its tops aligned with passivation outside. It may involve plugs of metal sticking up above planar level and this may enabling stacked architectures. There may be valleys in metal and there may be fill in materials and have dark references where material is blocked by absorption of radiation 1000. The valleys may bring radiation 1000 in, propagate and bring radiation 1000 back out again. The interconnections may include dielectrics that bring the metal out. An embodiment may be an interference filter and the interference filter may be a six layer interference coating where moves may be made around in color by changing the thickness of the layers. This may be used to boost red response, boost blue response or alter other spectral properties. Embodiments may include a sacrificial layer (e.g., of the metal) in each of the right places. This may involve spectral shaping (e.g. to flatten the gain curve), which may be used to alter a spectral response (e.g. enhanced red response).

In embodiments the optical properties of the pixel may be altered by the materials and processing between silicon base and the quantum dot structures 1100. The optical properties may be reflectance, spectral characteristics, directional properties (e.g. normal and cavity) and creating scattering structures (e.g. scatter to film to increase path length).

Following the application of the quantum dot structures 1100 the materials may be put through a process to smooth, roughen, cause specular/reflecting properties, cause scattering properties (e.g. affect chief ray angle), alter the refractive index of the quantum dot structures 1100, alter index matching (e.g. influence internal ray angle which has implications for cross-talk), make viscosity adjustments or the like.

In embodiments, a passivation layer is provided on top of the photosensitive quantum dot structure 1100. The passivation layer may ensure that there are not undesired changes in photosensitive layer properties owing to interdiffusion among the materials making up the photosensitive layer. The passivation layers may be stoichiometrically matched, in at least one chemical constituent, to the quantum dot structure layer 1100 on which it is provided. For example, PbS may be passivated using As2S3 (arsenic trisulfide), in view of the matching of the sulfur compounds in the active layer and the passivation layer. In embodiments the passivation layer(s) may be used for encapsulation to ensure that substantially no molecules contained in the environment above the chip's top surface penetrate into the region in which the photosensitive layer and its associated materials (e.g. the quantum dot structure layer 1100) reside; and, similarly, that atoms or molecules associated with the operation of the photosensitive device don't escape from the region in which the device is contained. These encapsulation layers contribute to ensuring that the device is substantially unchanged in its performance over the product's lifetime. In embodiments the passivation layer(s) may be used for compatibilization to ensure that, following processing of the photosensitive material (e.g. the quantum dot structures 1100), the chip may be returned into a conventional commercial fabrication facility, for example for the subsequent incorporation of color filter arrays, and/or for the subsequent realization of camera modules. A compatibilization layer includes for example Si3N4, silicon nitride. Foundries are acquainted with the processing of substrates which are Si3N4-capped; thus the layer can serve as compatibilization layer. In embodiments the compatibilization and encapsulation layers may be one and the same if a single layer, or layer structure, simultaneously serves both purposes.

In embodiments other layers are included for index-matching of the photosensitive layer or ancillary layers (e.g. passivation, encapsulation, compatibilization), color-filters for implementing color filter arrays, and passivation of the color-filter arrays.

Embodiments may also include layers for the purpose of increasing the scattering of radiation 1000. These scattering layers, instead of being index-matching, provide a significant index mismatch between layers above and/or below. Their purpose may be to increase the absorbance of radiation 1000 by providing photons with repeated possibilities of traveling through the photosensitive layer, thereby increase absorbance for a given thickness of absorbing material.

FIG. **3*a* illustrates an electrical interconnection according to principles of the present embodiment. In this embodiment, conductive posts 1404 are provided in connection with a supporting substrate 1410. The 1410 post may have an insulating material on the outer surface to prevent electrical conductivity with unwanted portions of the device. The post 1410 may also have a section (e.g. at the top of the post) that has an exposed conductive layer such that it can electrically connect with the quantum dot structures 1100 (depicted as the various regions in FIG. 3*a***). In this embodiment, posts of varying heights are provided such that each one electrically connects with at least one of the active layers of the device. In embodiments, the post has an electrically exposed portion at a position other than at the top (e.g. at some mid-point). This may be to facilitate electrical connection with one of the mid-level regions (e.g. to provide many posts of similar height but for various active layers). The posts generally have an exposed electrical region at the bottom (e.g. the substrate end) to make electrical connection with circuitry (e.g. pixel circuitry or a chip processor).

In embodiments several quantum dot structures 1100 will be layered on top of one another (e.g. through several spin-coatings as described herein) to form a multi-layered quantum dot structure 1100, as described above. The multi-layered quantum dot structure may include layers of similar quantum dot materials or different quantum dot materials as described herein (e.g. two different color receptors may be used in the two separate layers). The total stack height may be approximately one micron with a lateral dimension of approximately two microns. In embodiments, the two layers may communicate with one another through their electrical interconnections. The layers may be provided with insulating properties to prevent such communications. For example, a very thin 1000 angstrom dielectric layer may be applied between the separate quantum dot structures 1100. In the manufacturing process, the tops of vertical electrical interconnectors (e.g. posts) may have to be cleaned to expose an electrically conductive area after the dielectric layer is applied. In embodiments, the dielectric is sin coated onto a sub-layer of quantum dot material and then a light etch is applied to clean the top of the posts to remove the dielectric and to expose the electrically conductive area such that it can communicate electric charges from a quantum dot structure laying on top of the dielectric layer. In another embodiment, the vertical electrical interconnections (e.g. posts) are not coated with dielectric material during the dielectric material coating process. This may be achieved by masking the electrical interconnects during the dielectric coating process, for example.

In embodiments, there may be a known, measurable or assumed level of crosstalk between the separate layers of quantum dot structures 1100. The crosstalk may be the result of a lack of dielectric between the layers, imperfect application of a dielectric layer, over-etching or cleaning of certain areas (e.g. over-etching the dielectric around the posts and creating electrical contact areas at the posts between the layers) or for other reasons. In embodiments compensations or adjustments may be made due to the crosstalk. For example, the pixel circuitry 1700 may be used to alter the signal that is received from the quantum dot structures 1100 and/or the chip processor 2008 may be used to make such compensations.

FIG. **3*g* illustrates a quantum dot structure 1100 stack involving two separate layers of quantum dot materials 1100 and a layer of dielectric material 1460 between the two separate layers of quantum dot materials 1100. A vertical electrical interconnect in the form of a post is provided. The post includes an outer layer of dielectric material 1460 and in inner layer of electrically conductive material 1470. The inner layer of conductive material 1470 is exposed at the top, in this embodiment, to form an electrical interconnection with the top layer of quantum dot structure 1100. In other embodiments, the inner conductive layer 1470 may be exposed at an intermediate location on the post to form an electrical interconnection with another corresponding layer. A bottom portion of the inner conductive material of the post may also be exposed to facilitate electrical communication with other circuitry (e.g. pixel circuitry 1700 and/or chip processor 2008**).

Figure 3H:
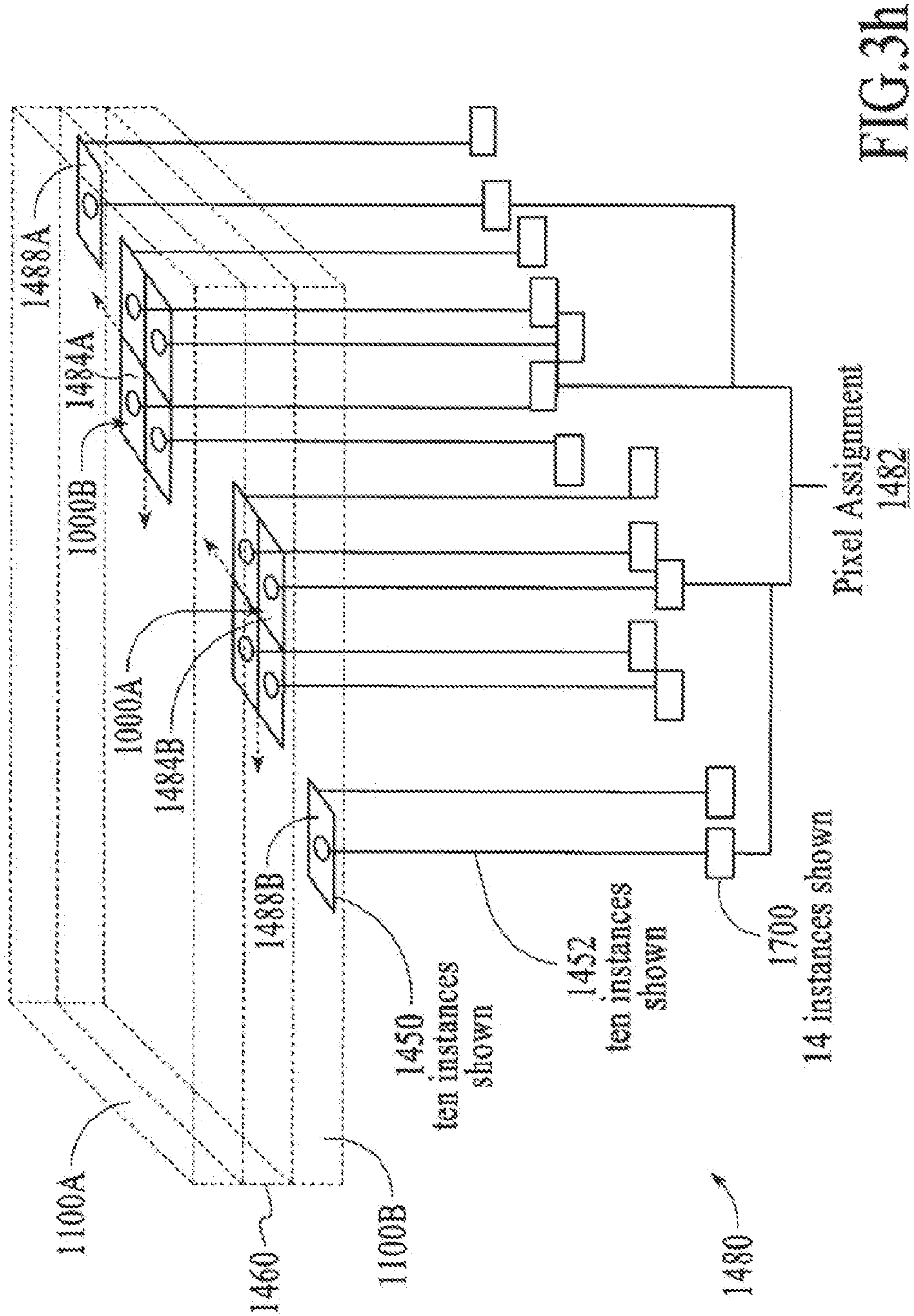
FIG. 3*h* shows an example a multi-layered quantum dot structure with electrical interconnections and pixel circuitry.

In embodiments, the QDPC 100 may combine a plurality of different pixel layouts 1600, electrical interconnections 1404, and pixel circuitry 1700, as discussed herein, in the implementation of an image sensor. As an illustration of how these elements may interrelate, FIG. **3*h* provides one example of a multi-layered quantum dot structure 1480, with electrical interconnections 1450 and 1452, pixel circuitry 1700 and pixel assignment 1482. FIG. 3*h* provides a single illustrating example, and is not meant to be limiting with regard to the plurality of planar interconnection, vertical interconnection, pixel layout 1600**, and dark pixel layouts discussed herein.

Referring to the specific example provided in FIG. **3*h*, the multilayered quantum dot structure 1480 is shown to include two separate quantum dot structure layers 1100 with a dielectric layer 1460 between the two quantum dot structure layers to provide electrical isolation between the active layers. As discussed elsewhere herein, embodiments of a multi-layered stack of quantum dot structures 1480 may not require the dielectric layer 1460. A photodetecting quantum dot pixel segment 1484A and a dark quantum dot pixel segment 1488A are shown located within the first quantum dot structure layer 1100A. In this embodiment, the photodetecting quantum dot pixel segment 1484A is located proximate to the top surface layer of the first quantum dot structure layer 1100A, and the dark quantum dot pixel segment 1488A is located proximate to the bottom of the first quantum dot structure layer 1100A. With this arrangement, the photodetecting quantum dot segments, including segment 1484A, are positioned near the most active region of the quantum dot structure 1100A so they can pick up signal changes in the structure 1100 that are due to radiation 1000** falling on the structure's surface.

A matrix of photodetecting segments may be provided across a surface of the structure 1100 such that incident radiation 1000 on the surface can be addressed and read out. The dark quantum dot pixel segment 1488A is positioned proximate the bottom of the structure so it is shielded from the most active portions of the structure so it can be used to make dark measurements as described elsewhere herein. As discussed elsewhere herein, the dark quantum dot pixel segment may be positioned at other points within the photoconductive structure or in another location.

The quantum dot pixel structures 1484 may be constructed using planar electrical interconnections as described herein (e.g. such as those described in connection with FIGS. **3*b*-3*e*). These planar electrical interconnection structures may be in a plane substantially parallel with the incident radiation 1000 plane, as indicated in FIG. 3*h*. Vertical electrical interconnections may be associated with the planar interconnections at one end and pixel circuitry 1700 at the other to bring the signal to the pixel circuitry, and/or measure resistance or other electrical property of the quantum dot pixel structure 1100. In this embodiment, a simple-closed planar electrical interconnection is shown and the simple closed planar electrical interconnection has its center electrical connection 1452 held at a positive bias and its outer square ring electrical interconnection 1450** used as a ground plane.

Each pixel segment 1484 is associated with its own positively biased electrical interconnection 1452 and its own or a common ground plane electrical interconnection 1450. When radiation 1000B, to which structure 1100A is responsive, strikes the photodetecting quantum dot pixel segment 1484A, electron-hole pairs are created in the pixel segment 1484A, and caused to flow due to the associated positively biased electrical interconnection 1452. While only four photodetecting quantum dot pixel segments are shown as associated with an upper surface of the quantum dot structure 1100A, it should be understood that this is for simplification in providing this explanation and that it is envisioned that such an electrical interconnection pattern would be replicated many times across the upper surface of the quantum dot pixel structure 1100A. Similarly, only one dark quantum dot pixel segment 1488A is shown with respect to the structure 1100A; however, there could be many such dark segments and the dark segments may be associated with other layers.

The second quantum dot structure 1100B is illustrated with electrical interconnections that are similar to that of the first quantum dot structure 1100A. The second structure 1100B has a matrix of photodetecting quantum dot pixel segments, including segment 1484B, and a dark quantum dot pixel segment 1488B. This arrangement is similar in construction in this illustration but it should be understood that the second layer 1100B could have a different configuration. For example, one of the other illustrated planar electrical interconnection schemes could be provided on the second layer 1100B. However, for simplification of the explanation, a similar construction has been presented. Generally speaking, the second layer 1100B is adapted to respond to a different wavelength of radiation as compared to the first layer 1100A to form a multi-spectral system. For example, the photodetecting quantum dot pixel segment 1484B may include quantum dots that are responsive to red light while the photodetecting quantum dot pixel segment 1484A may include quantum dots that are responsive to blue light. The red light would be transmitted through the first layer 1100A to the second layer 1100B where the second layer 1100B would develop an electrical signal and read by the matrix of electrical interconnections. This electrical signal would then be processed in turn by the associated pixel circuitry such that it could be quantified and located.

In embodiments, the electrical interconnections 1450 and 1452 of a quantum dot pixel segments 1484 and 1488 may have a plurality of different layouts or configurations. FIG. **3*h* shows a layout similar to the simple-closed layouts of 1430 and 1432 of FIG. 3*b*, where one electrical interconnect 1450 is configured as a rectangle around the pixel segment area where the effective area of the pixel segment is defined by the rectangle. Although FIG. 3*h*** shows this particular electrical interconnection configuration, it is understood that this is only for explanatory purposes, and does not limit the configuration to any of the plurality of configurations that are encompassed by the present embodiment.

Continuing to refer to the multi-layered stack of quantum dot structures 1480 in FIG. **3*h*, a pixel assignment 1482 may be made by selecting one or more photodetecting quantum dot pixel segments 1484 to be included in a pixel definition. For example, pixel segment 1484A and 1484B may be selected to form a pixel. When pixel segment 1484A responds to radiation 1000 that it receives, the segment will generate an electrical signal that flows in response to pixel segment's associated positively biased electrical interconnection 1452. The associated pixel circuitry may then interpret the signal (e.g. by measuring a resistance change to estimate the amount of incident radiation 1000). This may result in a first pixel segment radiation 1000 contribution. Since the type of quantum dot structure that makes up the layer 1100A in known, this segment radiation 1000 contribution can be attributed to a particular wavelength of radiation 1000. At substantially the same time that the first pixel segment radiation 1000 contribution is determined, a second radiation 1000 contribution may be determined by monitoring the pixel circuitry associated with pixel segment 1484B. If radiation 1000 to which the structure 1100B has been received by pixel segment 1484B, then signal will be read via the interconnection 1452 that is associated with the pixel segment 1484B so the pixel circuitry can read the activity. The activity readings from the two pixel segments 1484A and 1484**B may then be combined per an assignment protocol. As will be appreciated, any number of pixels segments could be combined to form a pixel.

When the pixel circuitry 1700 determines the amount of resistance change or incident radiation 1000 fallen on a pixel segment 1484, it may take into account a dark reading obtained from one or more of the dark pixel segments 1488. For example, when a resistance change is interpreted by pixel circuitry associated with pixel segment 1484B, the resistance change associated with dark pixel segment 1488B may be interpreted. If the dark pixel 1488B shows a change of equal magnitude to the active pixel segment 1488A, a determination may be made that no radiation 1000 was received by the active pixel segment 1488A. Similarly, the dark reference may be used to subtract an amount representing noise from the active signal, or other such compensation algorithms may be applied.

In embodiments, regions of a photoconductive layer are electrically contacted by an array of electrodes. It is important to achieve consistent, robust mechanical and electrical contact between the photoconductive layer and the electrical contacts. Following fabrication of the electrical contacts, there may exist residual oxides, oxynitrides, or organic materials. In embodiments, it may be important to remove the organic materials; this may be accomplished using an oxygen plasma etch, an acid-alkaline clean, an alkaline-acid clean, or combinations thereof. In embodiments, it may be important to remove the oxides and/or the oxynitrides; this may be accomplished using a dry etch or a wet etch. thin barrier layer atop the electrical contacts, prior to the deposition of the photoconductive layer.

In embodiments, it may be important to achieve electrical contact through a thin barrier layer between the electrical contacts mentioned above and the photoconductive layer. In this instance, it is important to remove oxides, oxynitrides, and/or organic materials of unknown or uncontrolled thickness; and then to deposit, or otherwise form, a controlled thin barrier layer atop the electrical contacts, prior to the deposition of the photoconductive layer.

In embodiments, in order to achieve robust mechanical and electrical contact of the photoconductive layer to the electrical contacts, an adhesion material may be employed. This material may include a moiety having an affinity to the materials at the surface of the electrical contacts, and another moiety having an affinity to the materials at the surface of the constituents of the photoconductive layer. As one example, if the electrical contacts are terminated with TiN (titanium nitride) or an oxynitride thereof, then one moiety in the adhesion layer may be an amine functional group. As another example, if the photoconductive layer includes a metal such as Pb, Cd, Cu, In, or Bi, then one moiety in the adhesion layer may be a thiol functional group. Such an adhesion, or anchor, layer may be applied by spin-casting, dip-coating prior to, during, or following deposition of some or all of the photoconductive layer.

In embodiments, electrical contacts having a deep work function are used, as described in detail herein. Deep work function is used herein to include a work function lower than 4.4 eV or 4.6 eV or 4.8 eV below the vacuum level. If a binary alloy such as TiN (titanium nitride) is employed, the work function may be deepened by controlling the ratio of Ti to N during formation of the alloy. For example, a high ratio (greater than 1:1) of N to Ti may be used.

In embodiments, electrical contacts work function may be influenced through control over the incorporation of oxygen. Ternary alloys such as $TiO_xN_y$ (titanium oxynitride) may be employed, and the work function may thereby be determined by the ratio of O to N. For example, the use of a higher ratio of O to N may be employed.

In embodiments, electrical contacts having a specific work function may be desired. The work function of an already-patterned set of electrical contacts may be modified by first depositing a thin layer of another material, such as, for example, a 10 nm layer of Au, Pd, Pt, or Ni; and the continuity of this deposited layer may then be deliberately disrupted using a selective lift-off technique wherein deposited metals covering a region where the metals are not desired are lifted off through selective etching of the non-contacting material (e.g. buffered oxide etching of an oxide in the non-contacting regions).

In embodiments, electrical contacts having a specific work function may be desired. The work function of an already-patterned set of electrical contacts may be modified by (1) treating the sample, through spin-coating, dip-coating, spray-coating, or other method, with a material that adheres selectively to materials over which electrical contact is not desired; (2) depositing a thin layer of another material, such as, for example, a 10 nm layer of Au, Pd, Pt, or Ni; and (3) then cleaning the wafer to lift off the deposited layer in regions where contact is not desired.

Figure 9:
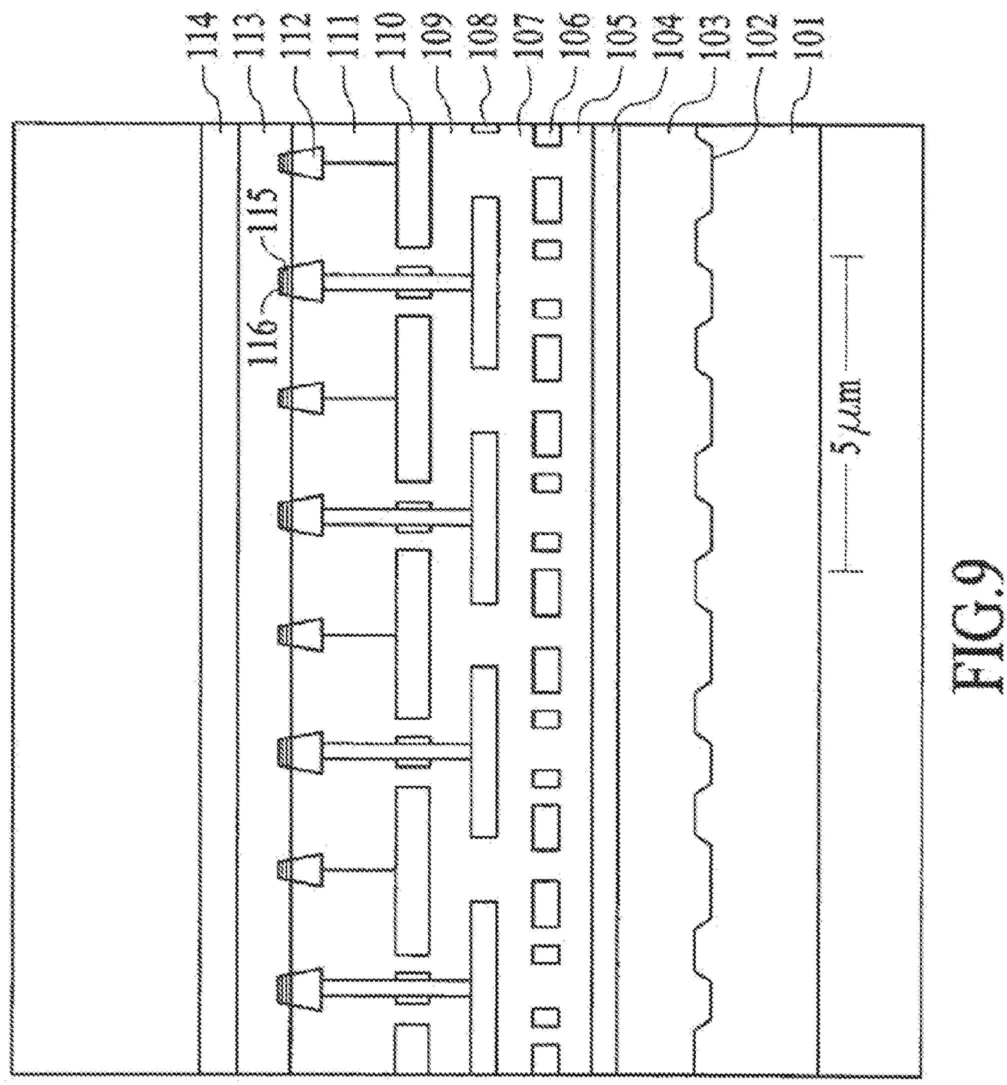
FIG. 9 is an diagrammatic illustration of a scanning electron micrograph of an integrated circuit in which an optically sensitive film.

Integration of combinations of the various quantum dot structures, pixels, interconnects, and circuitry, as described above, results in an integrated circuit (IC), under an embodiment. FIG. 9 is a diagrammatic illustration of a scanning electron micrograph of an integrated circuit in which an optically sensitive film has been spin-coated onto a CMOS integrated circuit produced in a CMOS foundry, under an embodiment. The optically sensitive film of this example includes PbS colloidal quantum dots possessing a substantially single-time-constant trap state resulting from the presence of Pb503 on their surface. The depicted components of the integrated circuit, individually described in detail herein, are now described in detail.

Layer 101 is silicon as the semiconductor substrate on which the integrated circuit is formed. Various impurities have been implanted and/or annealed into the substrate to form diodes, transistors, wells, resistive/conductive regions, and the like. Layer 102 is the transistor and gate level and contacts. Material such as poly-silicon, dielectric, and metals are incorporated in these layers in order to form a variety of electronic devices enabling electronic circuit realization.

Layers 103, 104, 106, 108, 110 each include metals providing interconnection in the substrate-plane among transistors and other circuit elements on the integrated circuit. Layers 105, 107, 109, 111 are vias providing interconnection perpendicular to the substrate-plane among the various metal layers.

Layer 112 is the top metal layer. It provides electric contact with the optically sensitive layer (Layer 113) made using PbS colloidal quantum dots. In this example, an optically sensitive layer conformally coats the top metal. Although the top surface of the substrate prior to deposition of the optically sensitive layer is not completely planar (~100 nm surface height variation), the top surface of the optically sensitive layer is substantially planar (<10 nm surface height variation) owing to the planarizing properties of the particular process employed.

Layer 114 is an encapsulation layer that encapsulates the optically sensitive layer (Layer 113). The purpose of the encapsulation layer, in an embodiment, includes the avoidance of interdiffusion with subsequent layers (e.g., color filter arrays, microlenses, wafer-level optics, etc.) and also the prevention of penetration into the optically sensitive layer (Layer 113) by gases such as H2O, O2, CO2, and liquids such as H2O and organic solvent used in subsequent processing. Layers 115 and 116 are thin metal layers.

Figure 10:
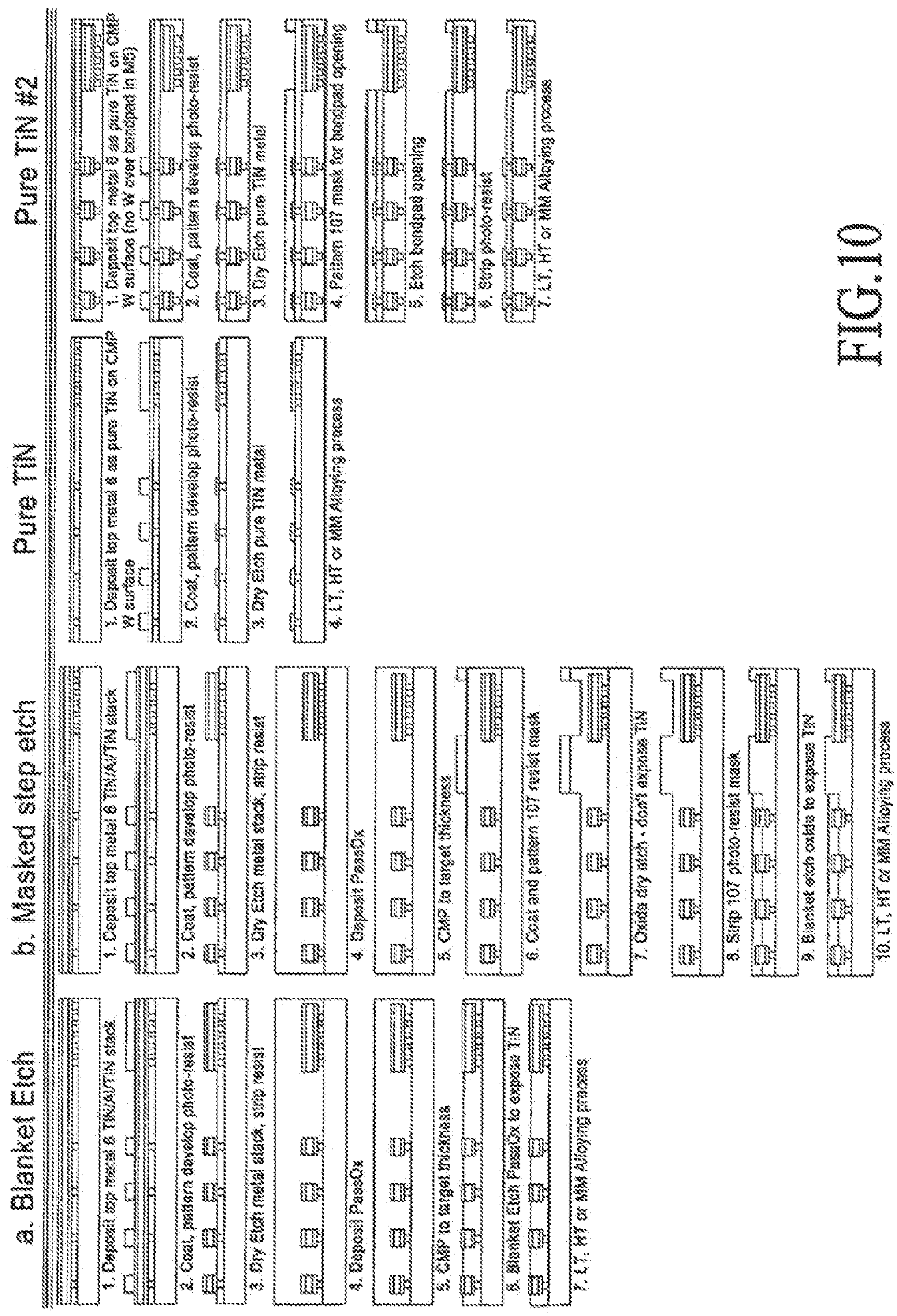
FIG. 10 illustrates 4 process flows (a, b, c, and d) that may be employed to produce integrated circuits similar to those described in FIG. 21.

FIG. 10 illustrates four process flows (a, b, c, and d) that can be used to produce integrated circuits similar to those shown in FIG. 9 and described herein. The four process flows of an embodiment include, but are not limited to, a blanket etch process, a masked step etch process, a first pure TiN process, and a second pure TiN process, each of which is described in turn.

FIG. 10(*a*) shows the blanket etch process flow, under an embodiment. Blanket Etch describes a means of producing a substantially planar top contact layer (top of layer 112 (e.g., Metal 6) in FIG. 9). In this illustration, the top contact layer will provide pixellated electrical contact to the optically sensitive layer, and will also provide for bond pads for electrical communication with optical system elements off-chip (power, control and data in/out). In step 1, the material that will ultimately serve as top metal, a stack consisting in this example of TiN followed by Al followed by TiN, is deposited. In step 2, photoresist is applied and lithographically patterned. In step 3, a dry etch is employed to etch the regions unprotected by photoresist and thus transfer the photoresist's pattern to the TiN/Al/TiN stack beneath. In step 4, a passivating oxide is deposited, and in step 5, it is chemomechanically polished to produce a smooth top surface of a desired thickness. In step 6, a blanket etch is employed to etch completely through the thickness of passivation oxide residing above the patterned TiN/Al/TiN, thus exposing at a minimum the top surface of the TiN in the stack. In step 7, an alloying process is employed to complete the process flow.

FIG. 10(*b*) shows the masked step etch process flow, under an embodiment. Masked step etch describes a means of producing a top contact layer (top of layer 112 (e.g., Metal 6) in FIG. 9) in which substantially only the region that will form the image sensor array, and the regions that will form bond pads, become exposed via removal of passivation oxide. In this illustration, the top contact layer will provide pixellated electrical contact to the optically sensitive layer, and will also provide for bond pads for electrical communication with optical system elements off-chip (power, control and data in/out). In step 1, the material that will ultimately serve as top metal, a stack consisting in this example of TiN followed by Al followed by TiN, is deposited. In step 2, photoresist is applied and lithographically patterned. In step 3, a dry etch is employed to etch the regions unprotected by photoresist and thus transfer the photoresist's pattern to the TiN/Al/TiN stack beneath. In step 4, a passivating oxide is deposited, and in step 5, it is chemomechanically polished to produce a smooth top surface of a desired thickness. In step 6, photoresist is applied and lithographically patterned to expose the area of the imaging area and the bond pads. In step 7 a first etch of the photoresist-patterned wafer is employed to remove some, but not all, of the passivation oxide covering the pixel electrodes and bond pads. In step 8, the photoresist mask is stripped. In step 9, the entire wafer is etched, revealing the pixel electrodes and bond pads as a result of the prior patterned etching step. In step 10, an alloying process is employed to complete the process flow.

FIG. 10(*c*) shows the first pure TiN process flow, under an embodiment. Pure TiN describes a means of producing a top contact layer (top of layer 112 (e.g., Metal 6) in FIG. 9) in which substantially only the region that will form the image sensor array, and the regions that will form bond pads, become exposed via removal of passivation oxide. In this illustration, the top contact layer will provide pixellated electrical contact to the optically sensitive layer, and will also provide for bond pads for electrical communication with optical system elements off-chip (power, control and data in/out). In step 1, the material that will ultimately serve as top metal, TiN, is deposited. In step 2, photoresist is applied and lithographically patterned. In step 3, a dry etch is employed to etch the regions unprotected by photoresist and thus transfer the photoresist's pattern to the TiN. In step 4, an alloying process is employed to complete the process flow.

FIG. 10(*d*) shows the second pure TiN process flow, under an embodiment. The second pure TiN process describes a means of producing a top contact layer (top of layer 112 (e.g., Metal 6) in FIG. 9) in which substantially only the region that will form the image sensor array, and the regions that will form bond pads, become exposed via removal of passivation oxide. In this illustration, the top contact layer will provide pixellated electrical contact to the optically sensitive layer, and will also provide for bond pads for electrical communication with optical system elements off-chip (power, control and data in/out). In step 1, the material that will ultimately serve as top metal, TiN, is deposited. The wafer presented prior to this deposition provides W (tungsten) vias for pixel electrodes, but does not provide W (tungsten) contacts to the regions where bondpads will subsequently be formed. In step 2, photoresist is applied and lithographically patterned: regions where TiN is to remain, and thus which will electrically contact the optically sensitive layer, are protected, while all other regions (including those residing above future bond pads) are exposed. In step 3, a dry etch is employed to etch the regions unprotected by photoresist and thus transfer the photoresist's pattern to the TiN. In step 4, photoresist is applied and lithographically patterned: regions in which photoresist is absent following patterning define what will later constitute bondpads. In step 5, the oxide protecting the bondpad in Metal 5 is opened via a dry etch. In step 6, the photoresist is removed. In step 7, an alloying process is employed to complete the process flow.

Figure 11:
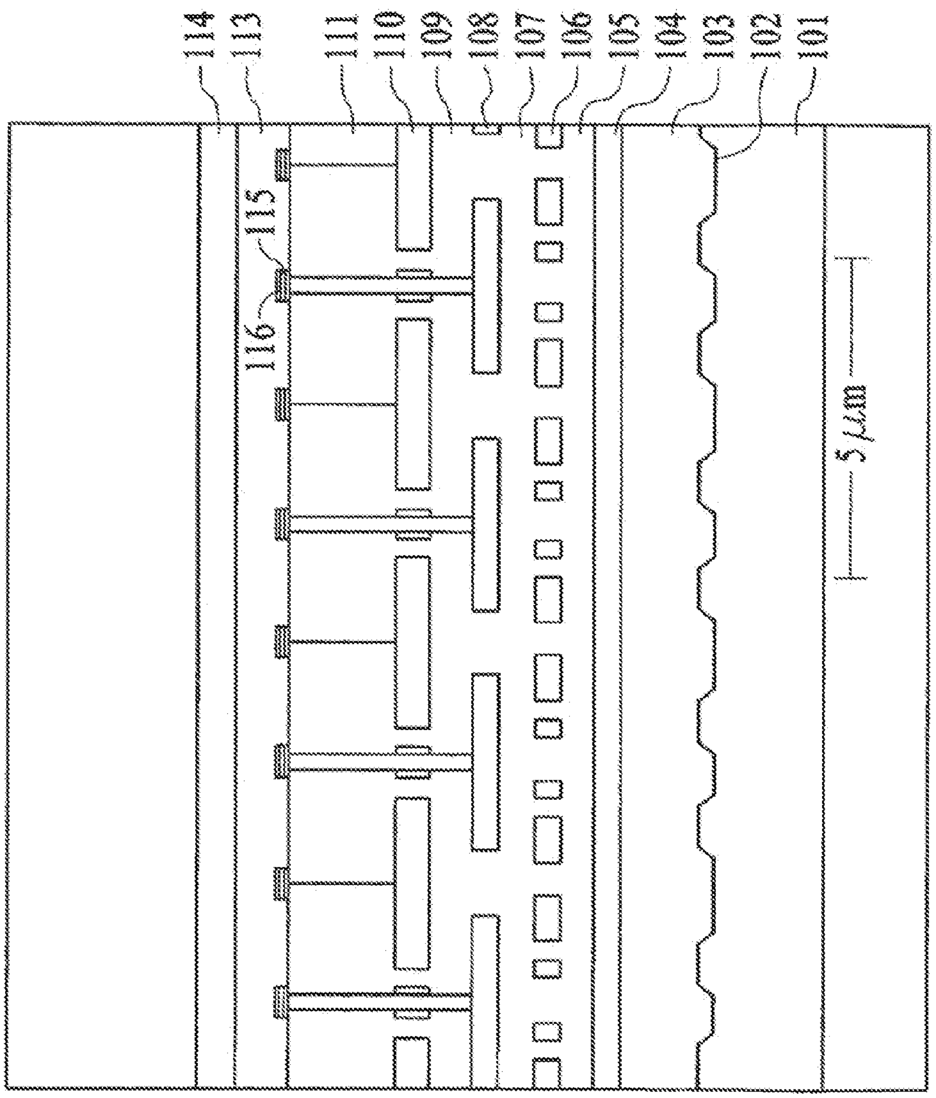
FIG. 11 is a diagram of an alternative embodiment a scanning electron micrograph of an integrated circuit in which an optically sensitive film.

FIG. 11 shows a scanning electron micrograph of an integrated circuit in which an optically sensitive film has been spin-coated onto a CMOS integrated circuit produced in a CMOS foundry, under an alternative embodiment. In this alternative embodiment, metal layer 112 is not present, but thin coating layers 115 and 166 are present.

In general, FIGS. 9-11 are illustrations of an optoelectronic device comprising an optically sensitive layer; a CMOS integrated circuit comprising a silicon substrate, at least one diffusion layer, at least one polysilicon layer and at least two metal interconnect layers, including at least a first metal layer and a second metal layer; an optically sensitive layer in electrical communication with the second metal layer; wherein the at least one polysilicon layer and the at least one diffusion layer forming a plurality of transistors in electrical communication with the optically sensitive layer through at least the second metal layer.

In embodiments, the thickness of the top electrode is in the range 10-50 nm, whereas the lateral dimensions of the top electrode are in the range 200-400 nm, and thus the width: height aspect ratio of the top electrode is in the range 40:1 to 4:1. In embodiments, the use of a thin top electrode in the range 10-50 nm provides a simplified means of realizing a substantially planar (surface height variation less than 100 nm) top surface of the wafer prior to application of the optically sensitive layer.

In embodiments, TiN of thickness 10-50 nm is used as the top electrode which is in electrical communication with the optically sensitive layer. In other embodiments, TiN of thickness 10-40 nm capped with TiOxNy of thickness 2-20 nm is used as the top electrode which is in electrical communication with the optically sensitive layer.

In embodiments, the top metal level includes TiN but excludes Aluminum. In embodiments, the etching of the top electrode in order to form a lateral pattern may avoid the generation of aluminum oxides and related materials by avoiding the use of aluminum as part of the top-metal composition.

In embodiments, the top electrode may include platinum (Pt), a deep-work-function noble metal known to provide for consistency of contact, including ohmic contact to the valence band of PbS colloidal quantum dot films. The use of such a top electrode may also provide a degree of blocking of electron injection into, or electron escape from, the optically sensitive layer in view of an energetic barrier formed at and near the contact-to-optically-sensitive-layer interface.

In embodiments, the top electrode may include palladium (Pd), a deep-work-function noble metal known to provide for consistency of contact, including ohmic contact to the valence band of PbS colloidal quantum dot films. The use of such a top electrode may also provide a degree of blocking of electron injection into, or electron escape from, the optically sensitive layer in view of an energetic barrier formed at and near the contact-to-optically-sensitive-layer interface.

In embodiments, the top electrode may include gold (Au), a deep-work-function noble metal known to provide for consistency of contact, including ohmic contact to the valence band of PbS colloidal quantum dot films. The use of such a top electrode may also provide a degree of blocking of electron injection into, or electron escape from, the optically sensitive layer in view of an energetic barrier formed at and near the contact-to-optically-sensitive-layer interface.

In embodiments, the top electrode may employ indium tin oxide (ITO), a substantially transparent conductive oxide that provides electrical contact to PbS colloidal quantum dot films. In embodiments, the top electrode may include zinc oxide (ZnO), a substantially transparent conductive oxide that provides electrical contact to PbS colloidal quantum dot films.

In embodiments, the top electrode may employ a stack of materials such as, but not limited to, the following: TiN/Al/TiN with constituent X; TiN with constituent X; TaN with constituent X; Ni with constituent X; and, Cu with constituent X. Constituent X includes any of Pt, Pd, Au, ITO, or ZnO. In consideration of the above material combinations for the top electrode, thicknesses of the top electrode include, but are not limited to, the following: 10-50 nm thickness for TiN, TaN, Ni, Cu; 2-50 nm thickness for Pt, Pd, Au; and, 5-100 nm thickness for ITO, ZnO, or other conductive oxides.

Thus, in general, multilayer contacts may be provided according to the teachings herein in which a variety of metals and/or other conductive materials are in physical contact. For example, W may be used as a via metal; TiN may be used to protect that via; and a deep-work-function metal may be contacted to the TiN in order to provide a deep-work-function electrical connection to the optically sensitive layer.

Figure 37:
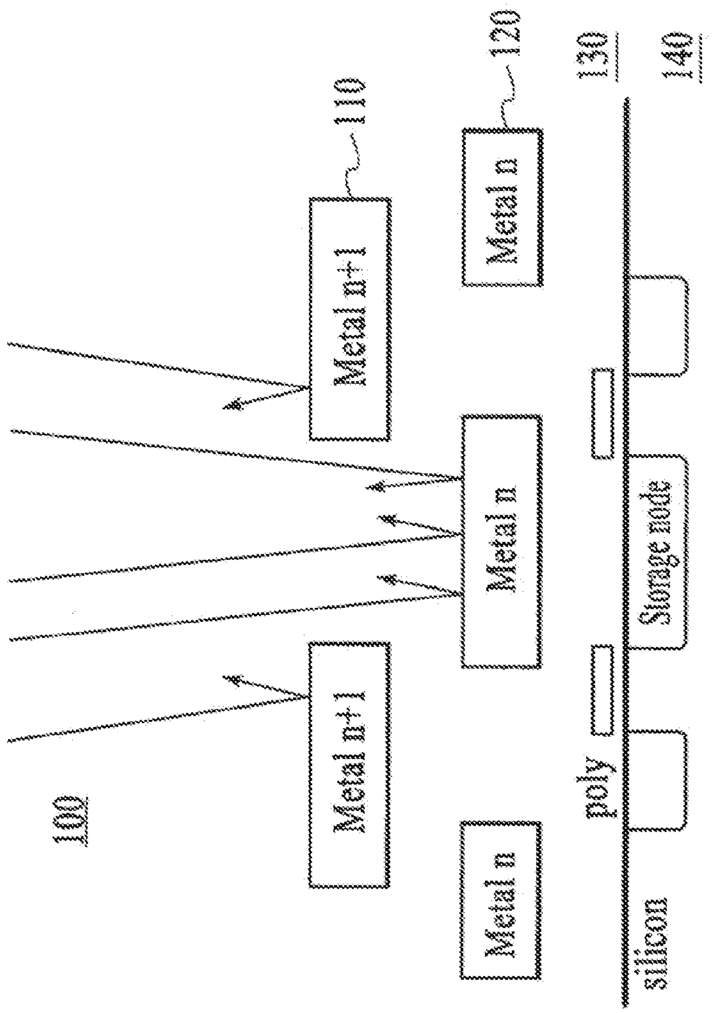
FIG. 37 shows the vertical profile of an embodiment where metal interconnect layers of an integrated circuit shield the pixel circuitry on the semiconductor substrate from incident light.
Figure 38:
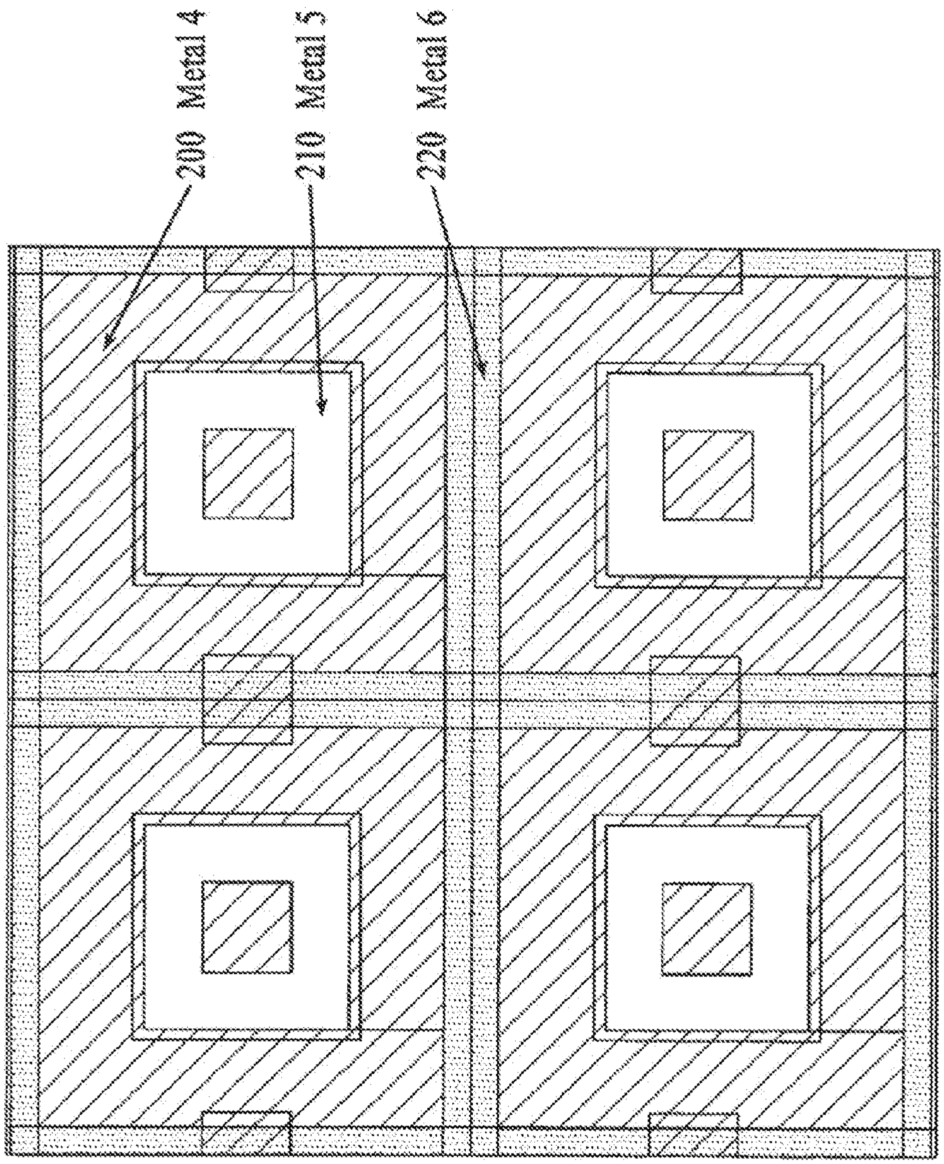
FIG. 38 shows a layout (top view) of an embodiment where metal interconnect layers of an integrated circuit shield the pixel circuitry on the semiconductor substrate from incident light.

As described above, metal and/or metal contacts in a vertical stacked structure can be laid out in different layers of the photodetector structure and used as contacts and/or as shielding or isolation components or elements. In embodiments, for example, one or more metal layers are used to isolate or shield components (e.g., charge store or charge store devices) of underlying circuitry or other components of the IC. FIGS. 37 and 38 show an embodiment in which a conductive material is positioned between the charge store of the respective pixel region such that the respective charge store is isolated from the light incident on the optically sensitive layer. At least a portion of the conductive material is in electrical communication with the optically sensitive layer of the respective pixel region. The metal regions or layers shown and described in FIGS. 37 and 38 can be used as electrical contacts, as described herein, in addition to their function as isolation elements.

FIG. 37 shows the vertical profile of a metal-covered-pixel. The pixel includes a silicon portion 140, a poly silicon layer 130, and metal layers 120 and 110. In this embodiment 120 and 110 are staggered to completely cover the silicon portion of the pixel. Some of the incident light 100 is reflected by 110. The rest of incident light 100 is reflected by metal layer 120. As a result no light can reach silicon 140. This complete improves the insensitivity to incident light of storage node (141).

FIG. 38 shows a layout (top view) of a metal-covered-pixel. In this embodiment three metal layers (e.g., metal 4/5/6 corresponding to layers 108, 110, and 112 in FIG. 9) are used to completely cover the silicon portion of a pixel. Region 200 is metal 4, region 210 is metal 5, and region 220 is metal 6. Regions 200/210/220 cover approximately the entire pixel area, and thus prevent any light from reaching the silicon portion of the pixel below.

Chip 2000 (Including 2002, 2004, 2008, and 2010)

The above described pixel regions and pixel circuits may be formed on an integrated circuit and connected through metal inteconnect layers as described above. In the example embodiment of FIG. 1, the QDPC 100 may have quantum dot pixels 1800 structured on top of an underlying substrate with structures 2002, functional components 2004, and processing 2008 capabilities. This underlying substrate, and its functional capabilities, may be referred to as a chip 2000 or semiconductor chip 2000. Together with the quantum dot pixels 1800 above, the chip may provide a plurality of functions such as high-speed readout, signal multiplexing, decoding, addressing, amplification, analog-to-digital conversion, image sensor processing (ISP), and the like. The functional components 2004 and processing 2008 capabilities may interface with the pixel circuitry 1700 and with the integrated system 2200. In embodiments, the chip 2000 may represent an integrated photodetector processing element within the QDPC 100 that provides high-speed low noise readout, small die area, ability to use larger process geometries, combined analog and digital circuitry, higher levels of integration, image processing, low power, single voltage supply, and non-planar chips 2000.

The underlying structure 2002 of the chip 2000 may include layers of integrated electronics and electrical interconnects 2010, where the integrated electronics provide the functional components 2004 of the underlying chip, and the electrical interconnections 2010 provide the interconnections between these functional components 2004, the pixel circuitry 1700, and interface connections to off-chip components. FIG. 8 shows an example of row and column interconnections between an array of quantum dot pixels 1800, where row and column interconnects lie in different layers within the underlying structure 2002. In embodiments, these row and column traces may be in the upper layers of the underlying chip semiconductor, and functional components 2004 may be in the lower layers. The ability for the additional structures 2002 beneath the pixel array may provide on-chip processing capabilities that enable innovate product solutions.

In embodiments, the underlying structure 2002 of the chip, along with the pixel structures 1500 and photodetector structures 1400 above, may be manufactured as a monolithic integrated circuit, also known as an IC, microchip, microcircuit, silicon chip, chip, or the like. The integrated circuit may have been manufactured in the surface of a thin substrate of semiconductor material. In embodiments, the quantum dot structures 1100 may be applied on top of this integrated circuit portion to produce the QDPC 100. In this manner, the QDPC 100 maintains the design flexibility inherent in the tunable, stackable quantum dot structures 1100, with industry standard processes available to integrated circuit technologies. The combination of quantum dot structures 1100 and integrated circuit structures may enable the QDPC 100 to become a low cost, single element image detection system, fully integrated on a single chip 2000. In embodiments, the QDPC 100 may also be a hybrid integrated circuit, constructed of individual semiconductor devices, as well as passive components, integrated onto a substrate or circuit board. In embodiments, the photodetector structures may be applied to any other underlying structure or technology known to the art.

In embodiments, a hybrid integrated circuit of the QDPC 100 may utilize commercially available fabrication techniques. FIG. 8 shows an optical micrograph of a radiation 1000 sensitive layer formed on a commercially available electronic read-out integrated circuit (ROIC) chip. In many embodiments, the radiation 1000 sensitive layer includes a plurality of QDs, as described in greater detail below. The radiation 1000 sensitive layer, e.g., the QD layer, overlays and conforms to the features of the underlying chip. As can be seen in FIG. 8, the electronic read-out chip, e.g., a CCD or CMOS integrated circuit, includes a two-dimensional array of rows 2031 and columns of electrodes 2032. The electronic readout chip also includes a two-dimensional array of square electrode pads 2030 which together with the overlying QD layer and other circuitry form a two-dimensional array of pixels. The row electrodes 2031 and column electrodes 2032 allow each pixel (including square electrode pad 2030 and overlying QD layer) to be electronically read-out by a read-out circuit (not shown) that is in electrical communication with the electrodes. The resulting sequence of information from the ROIC at the read-out circuit corresponds to an image, e.g., the intensity of radiation 1000 on the different regions of the chip during an exposure period, e.g., a frame. The local optical intensity on the chip is related to a current flow and/or voltage bias read or measured by the read-out circuit.

In embodiments, a highly integrated image detection system, such as a QDPC 100 consisting of a lower integrated circuit of processing functional components 2004 and pixel circuitry 1700, and upper quantum dot structure 1100 consisting of stacked quantum dot pixels 1800, may require testing at the chip 2000 level that more comprehensive than a typical detector. Testing of the QDPD 100, because of its highly integrated and multifunctional nature, may be more akin to a combination of testing for an application specific integrated circuit (ASIC) and optical testing for a photodetector. In addition, because stacked, or layered, quantum dot structures 1100 may include what is in essence, multiple integrated detector layers, optical testing may be need to be performed in stages during the fabrication process in order to fully characterize interacting parameters, such as cross-talk through insulating dielectric layers between multiple quantum dot materials 200. In embodiments, the testing of the QDPC 100 may require unique techniques in order to ensure quality and reliability.

In embodiments, functional components 2004 such as multiplexers and decoders may provide the on-chip 2000 capabilities to transfer the data from the quantum dot pixel 1800 out the edge of the chip 2000, providing the addressing of the array. Analog circuitry at the end of the column may include amplifiers, providing gain and corrections, or analog multiplexing within the column circuit. Columns may be combined, where column signals are serially multiplexed. In embodiments analog-to-digital conversion may be provided in order to convert the signals to the digital domain, where other processing components 2008 may perform data manipulation, and provides an interface between the image array and image processing.

In embodiments, the functional components 2004 may include image sensor processing (ISP), providing facility for image scanning. For instance, image scanning may allow the examination of a first exposure at low resolution, determine how to use it, perform a rapid second scan, and process on the difference. The luminance signal may have high bandwidth information and chrominance has low bandwidth information. In another instance, a first exposure may be at low frequency, then a second at high resolution, such as red-to-red comparison running across the screen as a normalization on the derivative signal, similar to JPEG compression. The low frequency could be run as the high-resolution image is being taken, taking the sensitivity to low radiation 1000 from the big pixels and spatial information from the small pixels. The best information may be taken from the high frequency and the low frequency in order to produce the best possible image, such as to leverage for the sake of speed, simplify and implement algorithm to compress the data, collect less analog data, or the like. Individual pixels may come off as deviation from a background value, where the background value comes quickly with a rough scan. In embodiments, ISP may provide innovative solutions that may be performed directly on the chip.

In embodiments, processing techniques may be implemented, such as for spatial differentiation, which could result in a power advantage as well as an improved signal-to-noise advantage. Spatial differentiation may use motion to some advantage, as in the way the human eye utilizes motion in processing the scene. This technique could help compensate for the inherent shaking of a cell phone or a camera, and may help eliminate pattern noise, because pattern noise may not differentiate. Processing may also be performed across the entire array, with a delta-alarm that triggers an increase in sharpness. Processing for edge detection for auto-focus may also be facilitated, with regions determining local sharpness. A direct signal may be fed into a feedback loop to optimize the degree of sharpness. The use of on-chip processing may provide localized processing, allowing for a reduction in power and overall size of a product.

In embodiments, processing my include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure.

In embodiments the chip may have functional components that enable high-speed readout capabilities, which may facilitate the readout of large arrays, such as 5 Mpixels, 6 Mpixels, 8 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. However, shrinking chip size may mean, for a given number of pixels, smaller pixels. In existing approaches, since radiation 1000 must propagate through the interconnect layer onto the monolithically integrated silicon photodiode lying beneath, there is a fill-factor compromise, whereby part of the underlying silicon area is obscured by interconnect; and, similarly, part of the silicon area is consumed by transistors used in read-out. One workaround is micro-lenses, which add cost and lead to a dependence in photodiode illumination on position within the chip (center vs. edges); another workaround is to go to smaller process geometries, which is costly and particularly challenging within the image sensor process with its custom implants.

In embodiments, the technology discussed herein may provide a way around these compromises. Pixel size, and thus chip size, may be scaled down without decreasing fill factor. Larger process geometries may be used because transistor size, and interconnect line-width, may not obscure pixels since the photodetectors are on the top surface, residing above the interconnect. In the technology proposed herein, large geometries such as 0.13 um and 0.18 um may be employed without obscuring pixels. Similarly, small geometries such as 90 nm and below may also be employed, and these may be standard, rather than image-sensor-customized, processes, leading to lower cost. The use of small geometries may be more compatible with high-speed digital signal processing on the same chip. This may lead to faster, cheaper, and/or higher-quality image sensor processing on chip. Also, the use of more advanced geometries for digital signal processing may contribute to lower power consumption for a given degree of image sensor processing functionality.

Figure 70:
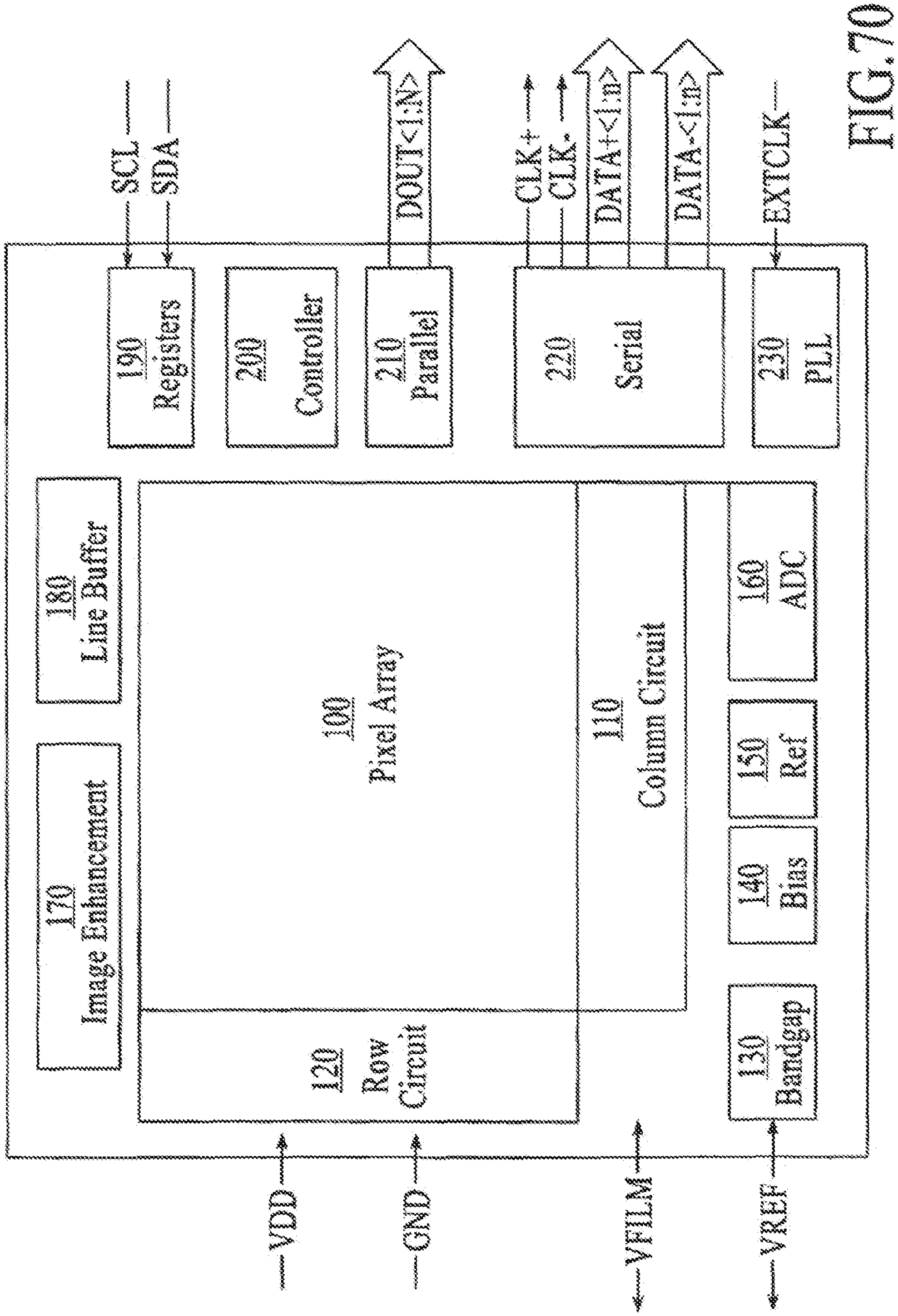
FIG. 70 is a block diagram of an example system configuration that may be used in combination with embodiments described herein.

An example integrated circuit system that can be used in combination with the above photodetectors, pixel regions and pixel circuits will now be described in connection with FIG. 70. FIG. 70 is a block diagram of an image sensor integrated circuit (also referred to as an image sensor chip). The chip includes:

a pixel array (100) in which incident light is converted into electronic signals, and in which electronic signals are integrated into charge stores whose contents and voltage levels are related to the integrated light incident over the frame period;

row and column circuits (110 & 120) which are used to reset each pixel, and read the signal related to the contents of each charge store, in order to convey the information related to the integrated light over each pixel over the frame period to the outer periphery of the chip analog circuits (130, 140, 150, 160, 230). The pixel electrical signal from the column circuits is fed into the analog-to-digital conver (160) where it is converted into a digital number representing the light level at each pixel. The pixel array and ADC are supported by analog circuits that provide bias and reference levels (130, 140, & 150).

digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip.

IO circuits (210 & 220) support both parallel input/output and serial input/output. (210) is a parallel IO interface that outputs every bit of a pixel value simultaneously. (220) is a serial IO interface where every bit of a pixel value is output sequentially.

a phase-locked loop (230) provides a clock to the whole chip.

The input/output pins are described as follows:

VDD is the power supply from which biases on various transistors and other elements are obtained GND is ground, used in concert with voltage biases to provide potential differences across circuit elements VFILM is the quantum film bias voltage used to provide a potential difference across the optically sensitive layer VREF is the bandgap reference voltage, used to provide a reference voltage level for other analog circuits on chip. This reference level is temperature-, voltage-, and process-insensitive.

SDA is a serial control data, used to send in the input data for serial control port. Serial control port can write directly to the on-chip registers, or perform some simple tasks such as resetting the digital circuits.

SCL is a serial control clock. This is the input clock for serial control port.

DOUT<1:N>—parallel output port, N channels. Here N is typically larger than 8. Every channel is single ended with full digital voltage swing. It is used to output the pixel data with a wide bus at relatively slow speed.

CLK+/−—serial IO clock, fully differential. This is the clock lane for the high speed serial output port.

DATA+/−<1:n>—serial output port, n lanes. Here n is typically less than 4. Each lane is fully differential with low voltage swing. Pixel data are sequentially sent out through the lanes.

EXTCLK external clock, used to provide a clock input to the on-chip PLL to generate internal clock for the whole chip.

In example embodiments, the pixel array (100) is implemented by coating at least one optically-sensitive nanocrystalline layer atop the read-out integrated circuit array. The layer is extremely sensitive to light, in part by virtue of its provision of photoconductive gain, wherein for every photon striking a pixel, a plurality of electrons can be collected into the read-out circuit that resides beneath the optically sensitive layer. The photoconductive layer may be a nonrectifying device, thus it may provide substantially the same magnitude of current for same-magnitude biases of opposite polarity.

In an example embodiment, the electrodes providing voltage bias may be laterally opposed to one another, that is to say they may reside within the same plane. In this case the predominant direction of current flow within the photosensitive layer is in the lateral direction. The electrodes may be configured in a pattern such that, even if the optically sensitive layer is continuous across the entire array, the current that is collected within each pixel electrode is related predominantly to the illumination intensity striking that pixel region only. Electrode configurations that accomplish this substantial isolation between pixels include those of a closed geometry, wherein a grid (such as one that repeats an array of squares, triangles, hexagons, or other closed shapes) provides a first bias, and electrodes residing at the centre of each grid repeat unit provide a second bias, and these electrodes providing a second bias collect the current flowing substantially within each closed grid repeat unit. The electrodes biasing the device need not be transparent but may be optically reflective and absorptive in some embodiments. These configurations are examples only and other configurations may be used in other embodiments, including vertically stacked electrodes, transparent electrodes and other electrode and photoconductor configurations described herein. For example, the electrodes may, in an alternative embodiment, be vertically opposed to one another, such that the flow of photocurrent is substantially in the vertical direction.

In a particular example embodiment, when 0.11 um CMOS technology node is employed, the periodic repeat distance of pixels along the row-axis and along the column-axis may be 900 nm, 1.1 um, 1.2 um, 1.4 um, 1.75 um, 2.2 um, or larger. The implementation of the smallest of these pixels sizes, especially 900 nm, 1.1 um, and 1.2 um, may require transistor sharing among pairs or larger group of adjacent pixels.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

Since gain may be provided by the optically sensitive layer, such that (for example) each photon incident on an optically-sensitive region may result in the collection of (for example) 10 electrons, a highly sensitive image sensor may be realized even using simplified pixel read-out circuits that employ a small number of transistors. Even using a circuit employing only three transistors (of which at least one may be shared with other pixels), high sensitive to light may be obtained.

For example, in a conventional pixel based on a photodiode having an overall quantum efficiency of 50%, and on which an intensity of 1 nW/cm2 is incident, then in a 1/15 second integration period, a 1.1 um×1.1 um pixel would supply an average of 1 electron's worth of photocurrent to be read by the read-out circuit. If the overall circuit read noise were 3 electrons, then this level of intensity would essentially be undetectable by this pixel and its read-out circuit.

In contrast, in the case of a pixel having the same area and integration time, but having 90% quantum efficiency and a gain of 5, an average of 10 electrons' worth of photocurrent would be available to be read by the read-out circuit. If this overall circuit read noise were 3 electrons, then this level of intensity would be detectable by this pixel and its read-out circuit. What is more, even if a simpler and/or smaller circuit were built that provided a worse read-out noise equivalent to 6 electrons, this low level of intensity would still be detectable by this pixel and its read-out circuit.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack. In the case of conventional CMOS image sensors, this presents an additional constraint in the routing of interconnect. This often reduces the extent to which a transistor, or transistors, can practically be shared. For example, 4:1 sharing is often employed, but higher sharing ratios are not. In contrast, a read-out circuit designed for use with a top-surface optically-sensitive layer can employ 8:1 and 16:1 sharing.

The photoconductive layer may possess a bias-dependent gain, such that at higher bias, the gain is higher, and that at lower bias, the gain is lower. Read-out circuits associated with each optically sensitive region integrate, store, and participate in relaying to the chip's periphery an electrical signal related to the light intensity that struck the pixel primarily during the electronic integration period. The read-out circuits may be configured such that the bias across the optically sensitive layer decreases throughout the integration period, resulting in a decrease in gain throughout the integration period. The decrease in gain throughout the integration may be more pronounced when a larger current is flowing, i.e. when more light is striking the pixel. Thus the effective gain may be lower when the optically sensitive region being read is more strongly illuminated. As a consequence, for a given range of voltage (such as a span of 1V) on an electrical node that provides a signal related to the integrated light intensity, corresponding for example to the input range of an analog-to-digital converter, a greater range of light intensities may be represented. For example, an 80 dB range or greater range in light intensities may be represented over a 1V swing.

Spectral information may be obtained from the pixel array by forming a patterned color filter array above the optically sensitive layer: different color filters ensure that different spectral bands of light are incident on the photoconductive pixels beneath.

In an alternative embodiment, color-selective stacked pixels may be formed in which a plurality of optically-sensitive layers are superimposed in the vertical direction. The upper layer or layers are selected to have a larger bandgap than the lower layers. As a consequence the upper layer or layers provide sensing of shorter-wavelength light and block this shorter-wavelength light, such that the lower layer or layers primarily sense longer-wavelength light.

Spectral information in any of the embodiments mentioned above may include X-ray, UV, visible (including particular colors within the visible such as red, green, and blue), near-infrared, and short-wavelength infrared. It is of interest to produce multicolor, multispectral, or hyperspectral images that provide aligned, or fused, images wherein different pixels (colored or false-colored) present overlaid versions portraying the spectral content within distinct spectral bands.

Row/column circuitry (110 & 120) provides for reset of each pixel and reading of the signal related to the contents of each charge store. This permits conveyance of the information relating to the integrated light striking each pixel over the frame period to the outer periphery of the chip. One means of reading out the array includes use of a number of row circuits approximately equal to the number of rows in the pixel array; and a number of column circuits approximately equal to the number of columns in the pixel array. For example a 300×200 pixel array will be read out using 200 rows and 300 columns. The row and column circuits are then pitch-matched to the pixel array row and column.

In another embodiment known as row/column swap, the row and column circuits are designed with greater flexibility. To read out a 300×200 pixel array, 600 column circuits and 100 row circuits may be employed. Since the row circuits are complex, this may provide an advantage such as making available a larger area to the design of the row circuits. If column circuits are particularly complex, in this example one could design 150 column circuits and 400 row circuits, giving more area to the column circuits.

Column circuitry may incorporate a fixed current sources employed to provide current to read out each pixel's source-follower. In an alternative embodiment, known as flexible column, the column circuit may instead incorporate a voltage source or floating node. This enables feedback during reset and saves power during readout, resulting in noise reduction and power saving. The flexible column can also be used as testing point to provide known input to the downstream circuits such as ADC. This may assist or improve the calibration process. The result may be less noisy column readout and/or improved uniformity.

The bias block (140) contributes to providing biasing of the optically sensitive layer. Embodiments may include provision of negative voltage to one node of the optically sensitive layer in order to provide sufficient electric field between the two electrodes such that an appropriate level of photoconductive gain may be provided. Embodiments may include provision of a variety of possible voltages to the optically sensitive layer in order to select the level of gain provided by the optically sensitive layer. The bias block (140) may therefore include both negative voltage, including more-negative values than −1 V (e.g. −1.5 V, −1.7 V, −2 V), and also provision of programmable voltages.

The provision of gain within the optically sensitive layer also has implications on the design of the A/D block (160). Normally, gain is required in front of the analog-to-digital converter in order to preserve signal-to-noise across the signal chain. Gain inherent in the optically-sensitive layer lessens the requirement for high gain in front of the analog-to-digital converter.

Analog-to-digital converters in conventional image sensors often employ constant differences (measured in mV) between the levels that represent unity-increasing digital-number values output by the analog-to-digital converter. This arises from the fact that conventional image sensors employ constant-quantum-efficient photodetectors, so that differences in light levels incident on a photodetector translate linearly into differences in currents produced by photodiodes, and thus result in linearly proportional differences in the voltage on the node to be read by a column circuit. However, optically sensitive layers having gain may produce a photocurrent which depends in a nonlinear dependence of photocurrent on intensity. For example, for a given bias, $$I=a*L-b*L\hat{}2$$

where I is the photocurrent is L is the intensity of light incident on the pixel. This is an example of a simple polynominal relationship approximating the photocurrent.

In this case, the light level may be inferred from knowledge of the measured current and the coefficients a and b and by inverting the known approximately polynomial relationship.

The inversion of the relationship may be accomplished in one of a number of ways, including in combination:

An analog circuit may be employed prior to the conveyance of the signal into the analog-to-digital converter that inverts or partially inverts the functional relationship between I and L.

The relationship between analog levels input to the analog-to-digital converter, and digital numbers output from the analog-to-digital converter, may be rendered nonlinear in such a manner as to invert the functional relationship between I and L.

A digital circuit and algorithm may be deployed, either on an image sensor system-on-chip or on a separate chip, to implement inversion of the functional relationship between I and L mathematically in the digital domain.

Block (170) (image enhancement) represents one on-chip location in which linearization of the nonlinear response of the film may be implemented in the digital domain.

Also in Block (170) may be implemented the adjustment of reported pixel channels which are offset or linearly scaled or both as a consequence of the layout of the underlying read-out circuit. For example, read-out circuits may be designed such that adjacent (e.g. odd- and even-numbered) columns employ at least one transistor whose implant profile is mirrored relative to the adjacent column. As another example, read-out circuits may share transistors. In each case, slight offsets in alignment between CMOS circuit layers (such as an implant layer and a metal layer) may results in slight differences in dark current, gain, or both, that repeat periodically across the array. The image enhancement block (170) may be used to correct these offsets and invert these scaling factors.

Quantum Confinement

An embodiment of the photodetector 1400 exhibits the simultaneous attainment of sensitivity, gain, tenability, and wide dynamic range in a visible-wavelength-sensitive spin-cast photodetector 1400. An optimally-processed photodetector 1400 may provide D* of $10^{13}$ Jones across the entire visible spectrum, compared with silicon photodiodes' ~2 $10^{12}$ Jones at 970 nm and even lower in the visible. Photoconductive gains may lie between 1 and 100, and configurations of the photodetector 1400 can exhibit photoconductive gains exceeding 100 A/W.

Figure 3I:
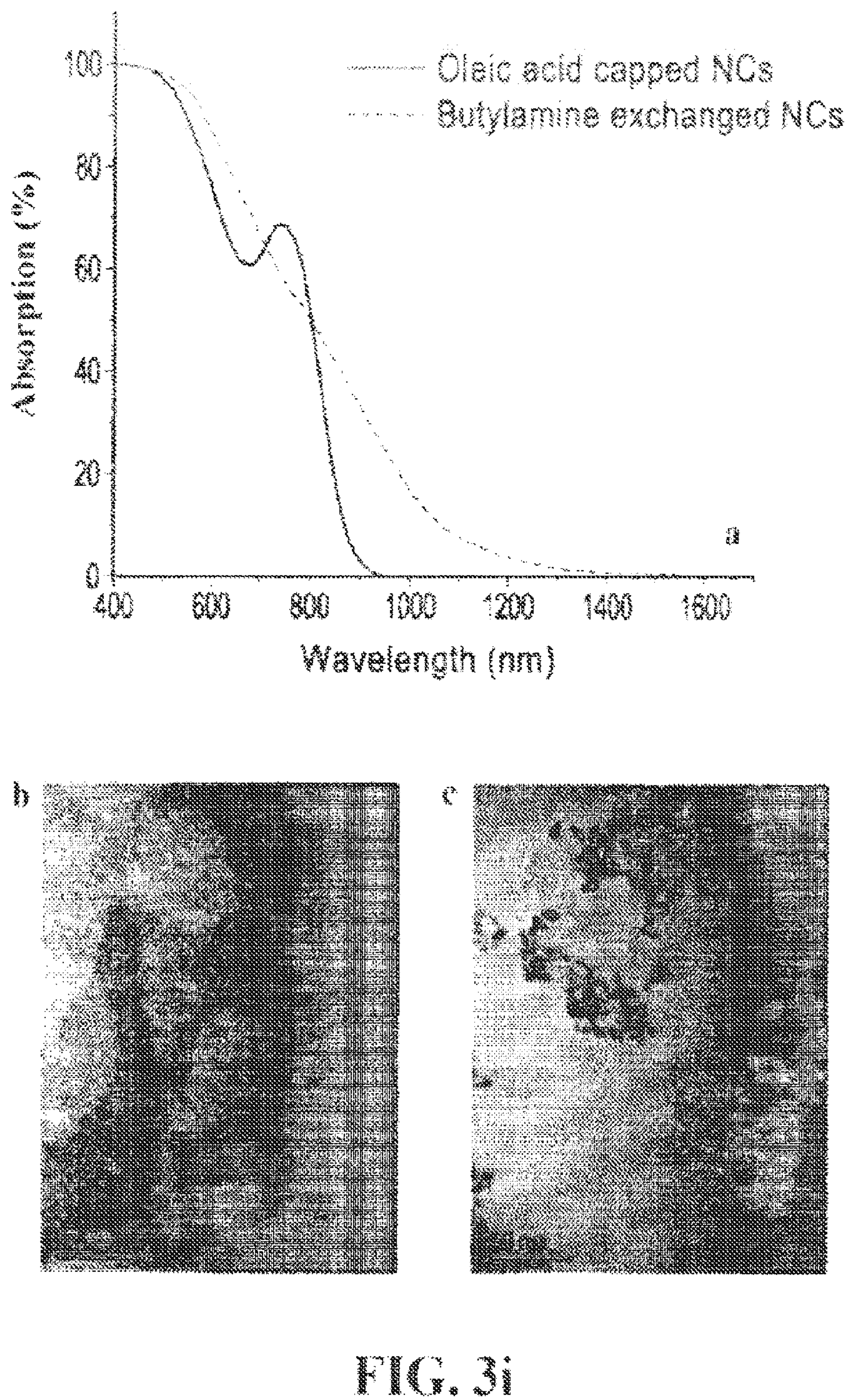
FIG. 3*i* shows absorption and TEM graphs of small PbS nanocrystals. (a) Absorption of solution of as-synthesized oleic acid capped nanocrystals and of solution of the nanocrystals after butylamine ligand exchange, the extended absorption into the infrared is due to loss of high confinement followed by the formation of nanorods. (b) TEM of oleic acid capped nanocrystals shows the synthesis of small nanocrystals with diameter ~3 nm. (c) After ligand exchange the nanocrystals conglomerate to form nanorods.

Bulk PbS may have a bandgap of approximately 0.4 eV, and the quantum dot materials described herein increase dramatically the degree of quantum confinement in the quantum dot materials 200 to make the visible-only colloidal quantum dot photoconductive detector 1400 described herein. The synthetic procedures of an embodiment enable the synthesis of quantum dots 1200 with absorption onset below 800 nm, as described herein. FIG. 3*i*(a) shows the absorption spectrum of the resultant quantum dots, under an embodiment. FIG. 3*i*(b) shows that the nanoparticles can have diameters of 3 nm and exhibit faceting, under an embodiment. As synthesized, the nanocrystals of an embodiment can be stabilized with oleic acid, a configuration expected and observed to impede carrier transport due to the oleate ligand's long insulating chain. Exchanging to shorter ligands such as butylamine may result in a dramatic increase in conductivity. Whereas in the case of larger 4-6 nm nanoparticles, monodispersity and excitonic features are preserved after ligand exchange in solution phase, in the small nanocrystal case, the procedure may lead, instead, to the formation of nanostrings (see, for example, FIG. 3*i*(c) and the related description elsewhere herein) as previously seen for PbSe nanoparticles (Cho, K. S. Talapin, D. V. Gaschler, W. Murray, C. B. Designing PbSe Nanowires and Nanorings through Oriented Attachment of Nanoparticles Journal of the American Chemical Society 127, 7140-7147 (2005)); and, a loss of an abrupt absorption onset resulting from irreversible aggregation (see, for example, FIG. 3*i*(a) (dashed curve) and the related description herein).

An approach that preserves a sharp, short-wavelength absorption onset is described below. Ligand exchange in the solid state, once thin films are formed, may limit the number of nanocrystal reattachment sites and dramatically improve conductivity without dramatically altering quantum-confined energy levels. PbS nanocrystals dispersed in toluene can be spincoated onto glass substrates with gold interdigitated electrodes with a 5 μm spacing (shown in FIG. 3*l*) to form a solid state film with thickness of 360 nm. The film is then treated in a mixture of 20% butylamine in acetonitrile over approximately two days. Following this solid-phase ligand exchange, the film may exhibit conductivity with dark current density 600 μA $cm^{-2}$ at applied field of 20 V $\mu m^{-1}$ (shown in FIG. 3*n*). Untreated samples or samples treated with acetonitrile alone may not exhibit measurable conductivity.

Figure 3J:
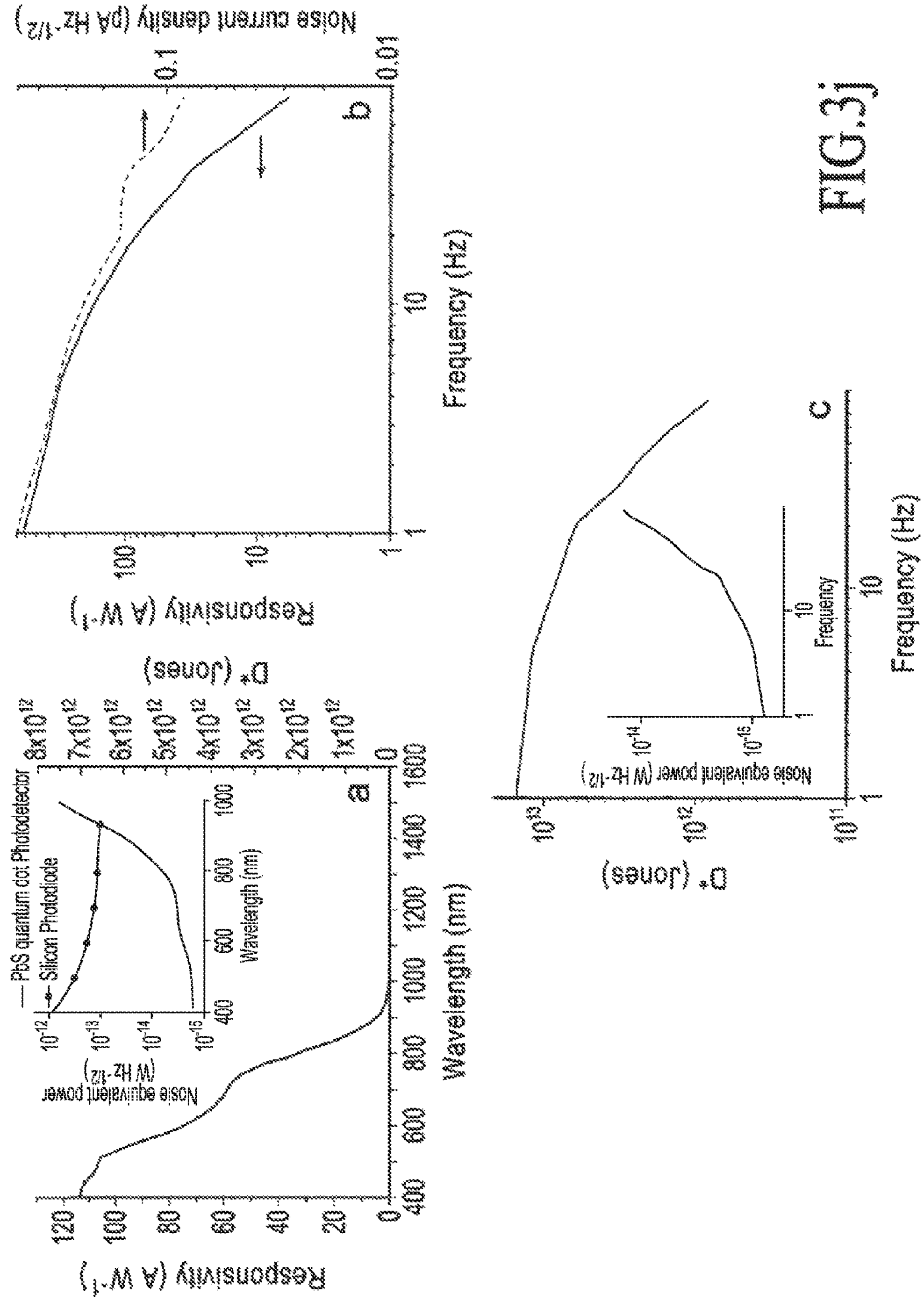
FIG. 3*j* shows performance of the PbS small nanocrystal photodetector. (a) Spectral responsivity and normalized detectivity D* taken at 15 Hz of modulation frequency. The inset shows the noise equivalent power of the 0.0015 $mm^2$ detector in the visible range for modulation frequency of 15 frames per second. The NEP of a typical silicon photodiode of similar surface area is plotted for comparison. (b) Responsivity and noise current density versus modulation frequency. (c) The detector exhibits D* $\sim 10^{13}$ Jones for modulation frequency up to 5 Hz whereas it has D* greater than $10^{12}$ Jones up to 50 Hz at wavelength of 400 nm. The inset shows the resultant NEP of the detector at 400 nm with active area 0.0015 $mm^2$ as a function of modulation frequency.

The photodetectors 1400 of an embodiment can be characterized for dark current, responsivity, and noise current as described in detail herein. FIG. 3*j* shows the optoelectronic performance of the photodetectors of an embodiment. FIG. 3*j*(a) exhibits spectral responsivity and normalized detectivity. The photoconductive gain may reach a maximum at wavelength 400 nm of ~113 A $W^{-1}$ at 15 Hz. In contrast, conventional silicon photodetectors exhibit a maximum responsivity at ~970 nm which may drop in the visible spectral range. The quantum dot photodetector 1400 of an embodiment exhibits an increasing responsivity at shorter wavelengths and optimal response in the visible spectrum. With respect to sensitivity, FIG. 3*j*(a) shows a direct comparison between a typical silicon photodetector (as in Electro Optics Technology, biased silicon detector model ET-2000) of area similar to the solution-processed thin-film photodetector 1400 of this embodiment. Across the entire visible spectra range, the quantum dot photodetector 1400 exhibits at least an order of magnitude better noise-equivalent power (NEP) than its crystalline silicon counterpart.

The measured noise current spectrum for the photodetector 1400 of the embodiment is shown in the inset of FIG. 3*j*(b). At low frequencies noise current density follows closely the responsivity curve, suggesting that the carrier traps responsible for high-gain may also contribute to noise, while at higher frequencies, white noise may dominate. The Johnson noise of the detector may be estimated by $(4kTB/R)^{1/2}$ to be ~0.9 fA $Hz^{-1/2}$ whereas the shot noise limit $(2qI_dB)^{1/2}$ is found 0.04 pA $Hz^{-1/2}$ where k is Boltzman's constant, T the temperature, R the resistance of the detector in dark, B the noise bandwidth, q the electron charge and $I_d$ the dark current. The photodetector 1400 of the embodiment may approach the shot noise limit to within 3-dB at 80 Hz.

The quantum dot photodetector 1400 of an embodiment exhibits greater sensitivity when compared to silicon beyond 50 Hz, as shown in FIG. 3*j*(c), where D* is plotted as function of frequency (the inset also shows the NEP versus the modulation frequency). At low frequencies (<5 Hz) the detector may exhibit D* ~$10^{13}$ Jones.

Figure 3K:
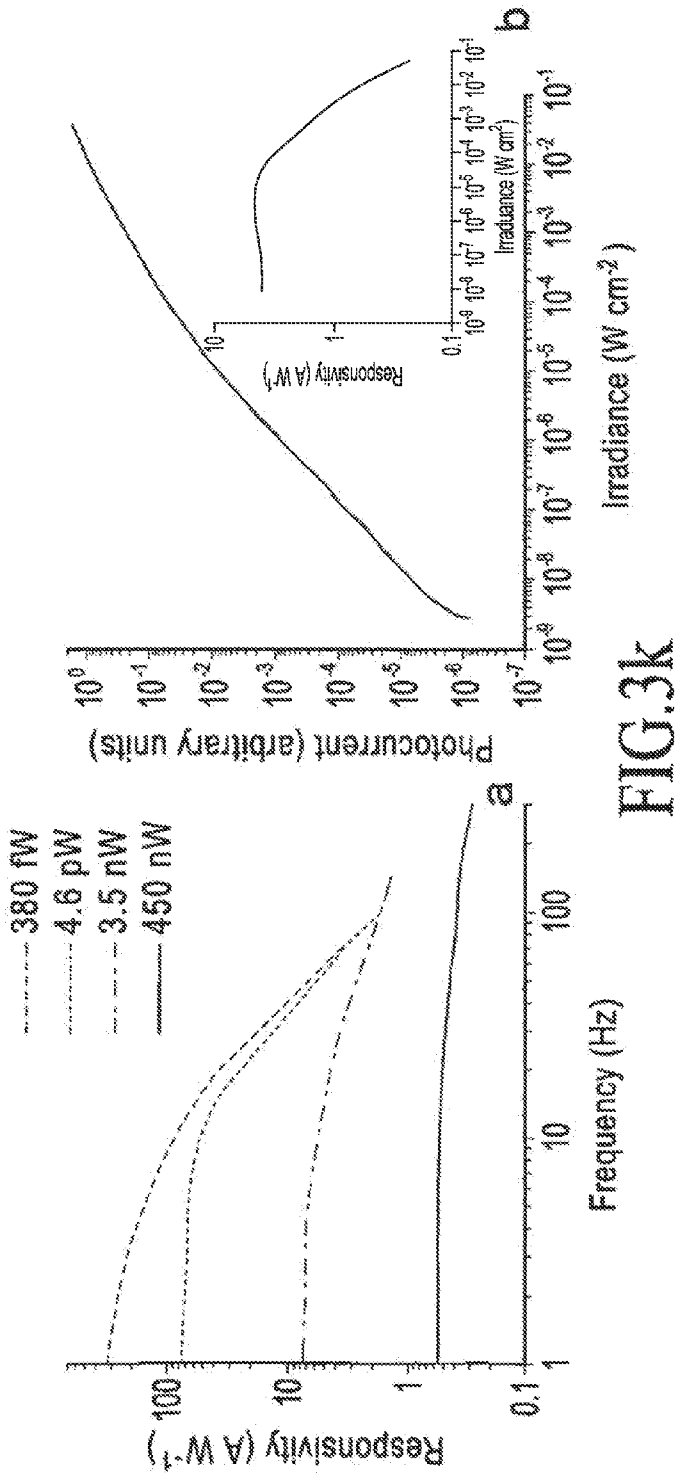
FIG. 3*k* shows effects of the trap states on the photodetector performance. (a) Responsivity vs. modulation frequency at various illumination levels measured at optical wavelength of 632 nm. The long lived trap states dominate at low optical powers to provide with high photoconductive gain. As higher power impinges on the detector the effective traps are filled leading to decrease of the photoconductive gain and increase of the 3-dB bandwidth. The 3-dB bandwidth increases from 8 Hz at low power to over 300 Hz at high optical power. This phenomenon could provide the detector with a self-limiting gain mechanism to avoid electronic saturation at high power levels. (b) The photocurrent versus optical illumination reveals a dynamic range of 75-dB. The inset shows the responsivity as a function of optical intensity. The responsivity drops beyond $10^{-5}$ W $cm^{-2}$ due to the filling of the high gain trap states to enable the self-limiting mechanism of gain. This measurement was taken with light at 830 nm.
Figure 31:
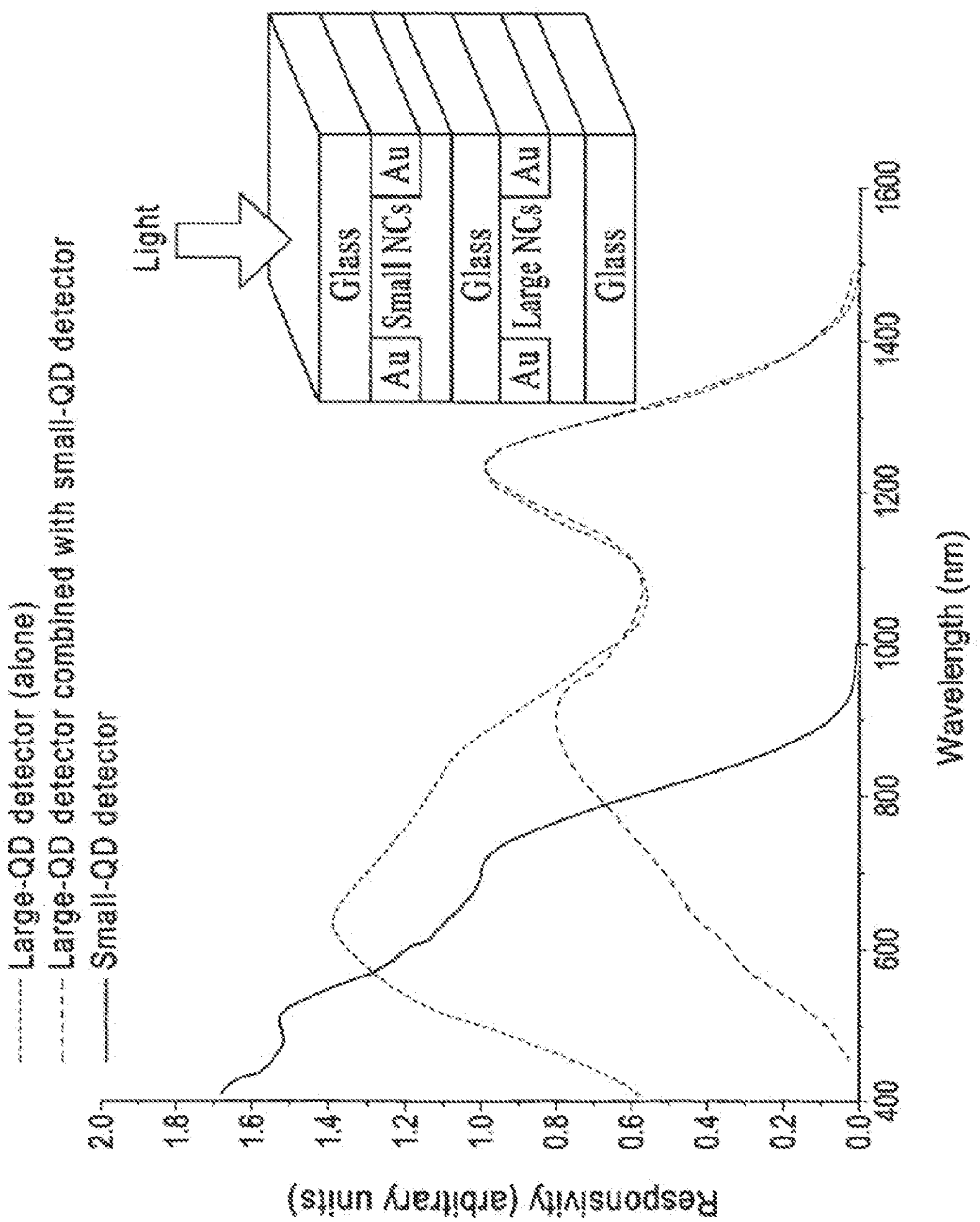
FIGS. 21*a*, 21*b*, 22*a*, 22*b*, 23*a*, 23*b*, 24*a*, 24*b*, 25*a*, 25*b*, 26*a*, 26*b*, 27*a*, 27*b*, 28*a*, 28*b*, 29*a*, 29*b*, 30*a*, 30*b*, 31*a*, 31*b*, 32*a*, 32*b*, 33*a*, 33*b*, 34*a*, 34*b*, 35*a*, 35*b*, 36*a*, and 36*b* illustrate a "global" pixel shutter arrangement.

The trap states of the quantum dot photodetector of an embodiment responsible for photoconductive gain are characterized, for example, with reference to FIG. 3*k*(a). FIG. 3*k*(a) shows the measured responsivity as a function of modulation frequency for a number of different optical power levels incident on the device is shown. The responsivity of the detector may decrease as the optical power may be increased. This may be attributed to filling of the lowest-lying, longest-lived trap states that provide the highest photoconductive gain at low intensities. This may be confirmed by the fact that, at high intensities, the 3 dB bandwidth may extend to higher electrical frequencies.

In order to characterize the impact of high-gain trap state filling on the dynamic range of the solution processed detector, the dependence of photocurrent on optical intensity at a modulation frequency of 30 Hz is measured. A monotonic, though at high intensities sublinear, dependence of photocurrent on intensity over more than 7.5 orders of magnitude in incident intensity corresponding to over 75 dB of intensity dynamic range may be observed (FIG. 3*k*(b)). The inset of FIG. 3*k*(b) shows the onset of responsivity decrease due to the filling of the high gain trap states at higher intensities that may be responsible for gain compression.

The teachings herein relating to the photodetector 1400 of the embodiment illustrate improvements in one or more of sensitivity, dynamic range, and gain when compared to typical crystalline silicon photodiodes. While the materials and processes of an embodiment are used to generate or produce quantum dot photodetectors, quantum dot pixels or devices can be produced that incorporate or integrate the quantum dot photodetectors.

A multi-color device (e.g., two-color, etc.) or pixel, also referred to herein as a quantum dot pixel, is produced under the teachings herein by stacking a small-quantum-dot 1200, larger-bandgap photodetector 1400 atop a large-dot, small-bandgap (exciton peak at 1230 nm) device as illustrated in the inset of FIG. 3*l*, and as described in detail below in the description on geometric layouts. FIG. 14*j* also shows the measured spectral responsivity of each detector in the stack, under an embodiment. The spectral responsivity of the small-bandgap detector prior to stacking is also shown to demonstrate the achieved suppression of responsivity in the visible by over 10-dB at 400 nm. Thus, the value of quantum size-effect tenability inherent to colloidal quantum dots 1200 under an embodiment is depicted in FIG. 3*l*.

Photodetector Geometric Layouts 1402

Figure 5A:
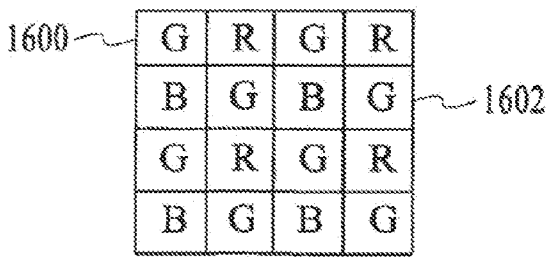
FIG. 5*a* shows a Bayer filter pattern.
Figure 5B:
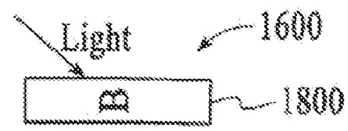
FIG. 5*b-f* show examples of some alternative pixel layouts.
Figure 5C:
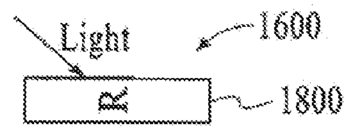
Figure 5D:
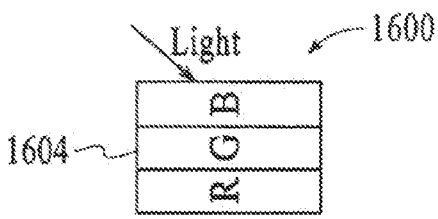
Figure 5E:
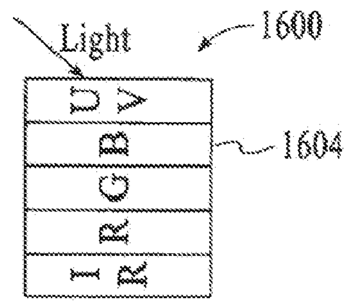

The quantum dot pixels 1800 described herein can be arranged in a wide variety of pixel layouts 1600. Referring to FIGS. 5*a-p* for example, a conventional pixel layout 1600, such as the Bayer filter layout 1602, includes groupings of pixels disposed in a plane, which different pixels are sensitive to radiation 1000 of different colors. In conventional image sensors, such as those used in most consumer digital cameras, pixels are rendered sensitive to different colors of radiation 1000 by the use of color filters that are disposed on top of an underlying photodetector, so that the photodetector generates a signal in response to radiation 1000 of a particular range of frequencies, or color. In this configuration, mosaic of different color pixels is referred to often as a color filter array, or color filter mosaic. Although different patterns can be used, the most typical pattern is the Bayer filter pattern 1602 shown in FIG. 5*a*, where two green pixels, one red pixel and one blue pixel are used, with the green pixels (often referred to as the luminance-sensitive elements) positioned on one diagonal of a square and the red and blue pixels (often referred to as the chrominance-sensitive elements) are positioned on the other diagonal. The use of a second green pixel is used to mimic the human eye's sensitivity to green light. Since the raw output of a sensor array in the Bayer pattern consists of a pattern of signals, each of which corresponds to only one color of light, demosaicing algorithms are used to interpolate red, green and blue values for each point. Different algorithms result in varying quality of the end images. Algorithms may be applied by computing elements on a camera or by separate image processing systems located outside the camera. Quantum dot pixels may be laid out in a traditional color filter system pattern such as the Bayer RGB pattern; however, other patterns may also be used that are better suited to transmitting a greater amount of light, such as Cyan, Magenta, Yellow (CMY). Red, Green, Blue (RGB) color filter systems are generally known to absorb more light than a CMY system. More advanced systems such as RGB Cyan or RGB Clear can also be used in conjunction with Quantum dot pixels.

In one embodiment, the quantum dot pixels 1800 described herein are configured in a mosaic that imitates the Bayer pattern 1602; however, rather than using a color filter, the quantum dot pixels 1800 can be configured to respond to radiation 1000 of a selected color or group of colors, without the use of color filters. Thus, a Bayer pattern 1602 under an embodiment includes a set of green-sensitive, red-sensitive and blue-sensitive quantum dot pixels 1800. Because, in embodiments, no filter is used to filter out different colors of radiation 1000, the amount of radiation 1000 seen by each pixel is much higher.

In contrast to conventional pixels, quantum dot pixels 1800 may be rendered sensitive to varying wavelengths of radiation 1000. Referring to FIGS. 5*b* through 5*f*, quantum dot pixels 1800 may be made sensitive to one color of radiation 1000, such as the blue pixel of FIG. 5*b* and the red pixel of FIG. 5*c*. Such pixels may be used in a wide range of layouts, such as the Bayer pattern 1602 of FIG. 5*a*. As described in this disclosure and in the documents incorporated by reference herein, quantum dot pixels 1800 may also be made sensitive to more than one color of radiation 1000. Referring to FIG. 6*d*, a quantum dot pixel may include a set of vertical layers of quantum dot material 200 or a single layer of quantum dot material 200 that is differentially sensitive, so that a single planar location on a chip may be sensitive to multiple colors of radiation 1000, such as red, green and blue, as depicted in FIG. 5*d* or UV, blue, green, red and infrared, as depicted in FIG. 5*e*. Thus, a multispectral quantum dot pixel 1604 may be used in various pixel layouts 1600. Quantum dot materials 200 may be made that are sensitive to a wide range of colors within the color gamut, including specific colors or groups of colors. While a standard RGB pixel has advantages in its ability to be used with conventional circuit designs, improved sensors and displays may be provided with more colors in the gamut. To use such colors, it is advantageous in embodiments to stack layers of quantum dot material 200 vertically in order to create multi-spectral pixels that are sensitive to more colors of radiation 1000. Being able to capture a larger part of the spectrum of radiation 1000, both visible and non-visible to the human eye, will allow for a much higher information density per given pixel, which in turn allows for a much higher resolution sensor within a given footprint. For example, a ¼ inch optical format device with 1 million pixels that capture either R or G or B with each pixel is typically viewed as having a resolution of a "megapixel". A ¼ inch optical format sensor with 1 million pixels, each pixel capable of capturing R and G and B, would thus have triple the resolution. This may be a critical differentiator in imaging systems where cost and size are critical.

Figure 5F:
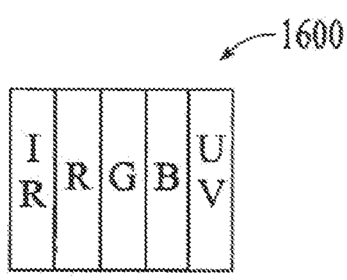

Referring to FIG. 5*f*, a multispectral pixel element 1604 may also be created by locating quantum dot materials 200 at different positions on a plane, in various configurations and patterns.

Figure 5G:
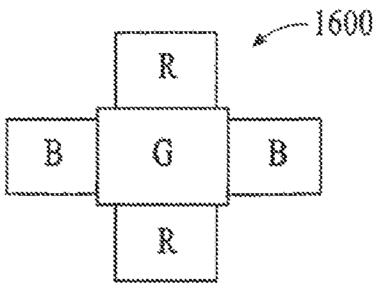
FIG. 5*g-l* show pixels of different sizes, layouts and types used in pixel layouts.

Referring to FIG. 5*g*, pixels 1800 of different sizes may be used in a given pixel array 1600. For example, a large green element may be surrounded by smaller red and blue elements. Any range and combination of colors may be used in such configurations.

Figure 5H:
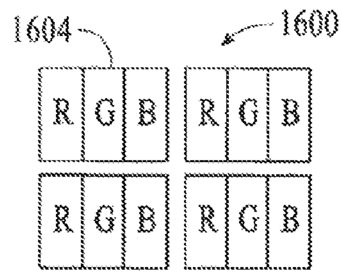

Referring to FIG. 5*h*, multi-spectral pixels 1604 may be arranged in various patterns different from a Bayer pattern 1602, such as a simple rectangular arrangement where each position in the array is filled with a multi-spectral pixel 1604. The full image information may be stored directly with the pixel, such as with a memory element located proximal to or on the pixel, so that compression algorithms, such as, or analogous to, JPEG and TIFF algorithms, can be applied without (or with minimal) separate processing.

Figure 5I:
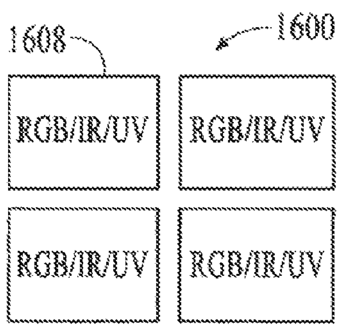

Referring to FIG. 5*i*, multi-spectral pixels 1604 may include full-spectrum, multi-spectral quantum dot pixels 1608, such as with sensitivity to IR and UV information, in addition to color information. Thus, any of the arrays described herein may include one or more full-spectrum, multi-spectral quantum dot pixels 1608.

Figure 5J:
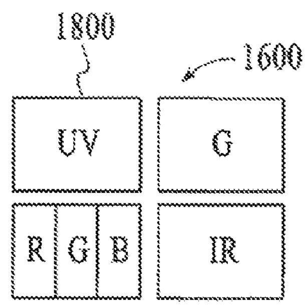
Figure 5K:
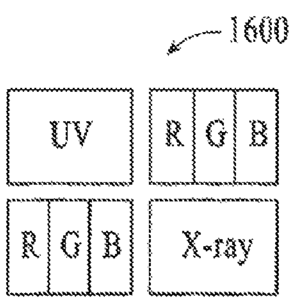
Figure 5L:
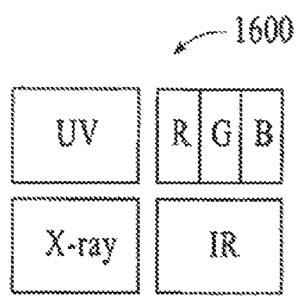
Figure 51:
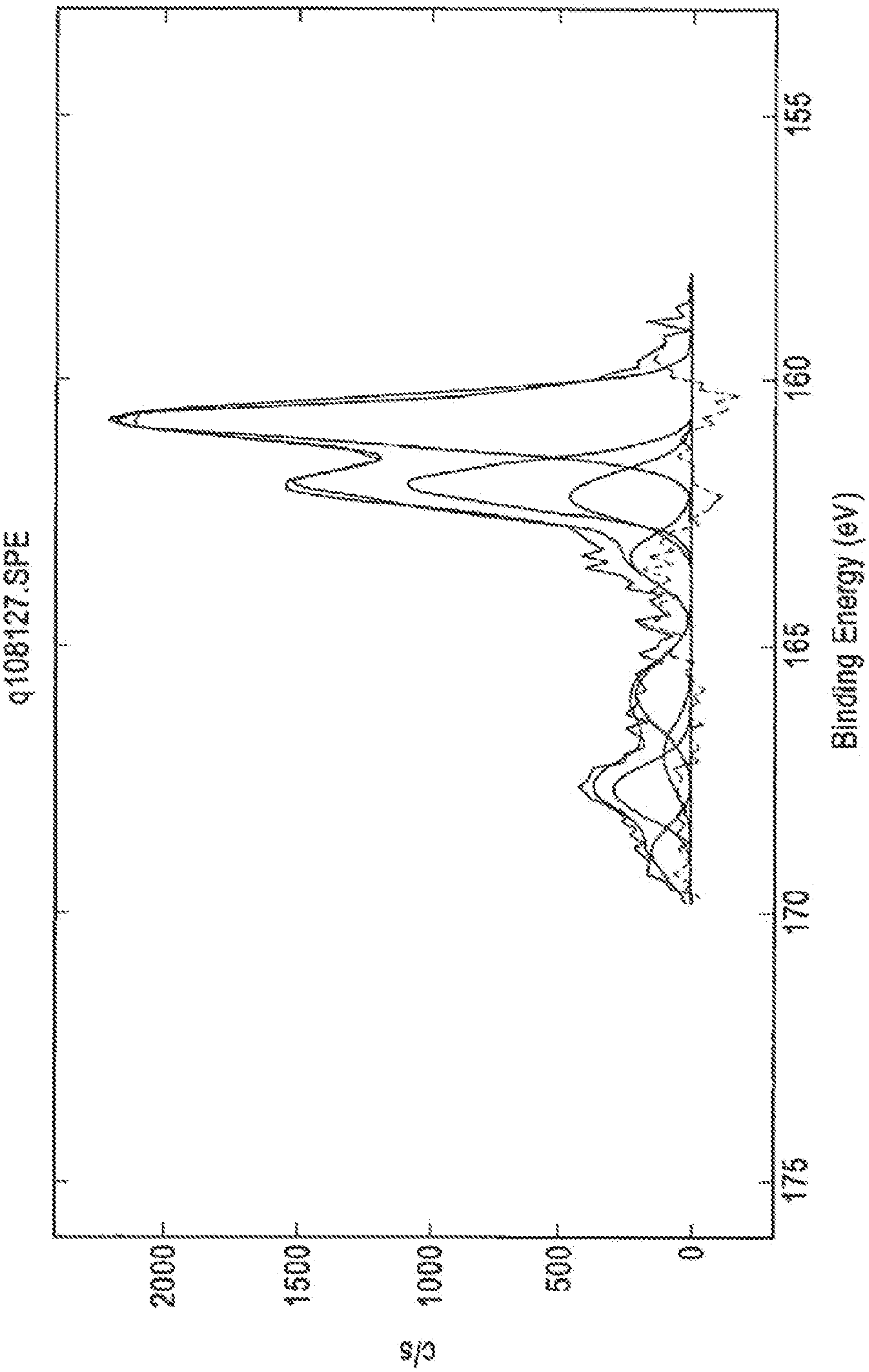

Referring to FIG. 5*j*, a quantum dot pixel layout 1600 may also include pixels of different sensitivities, such as those sensitive to single wavelengths of radiation 1000 (such as green, those sensitive to a collection of visible colors (such as red, green and blue), those sensitive to IR and those sensitive to UV. Thus, a pixel array 1600 may be a mix of multi-spectral pixels 1604, single-spectrum pixels, and specialized pixels such as those sensitive to non-visible wavelengths. In addition, pixel arrays may include planar pixels as well as pixels with vertical elements, such as vertical, multi-spectral pixels 1604. FIG. 5*k* and FIG. 51 show other arrangements of quantum dot pixels 1800, including various mixes of pixels of different spectral sensitivities.

Figure 5M:
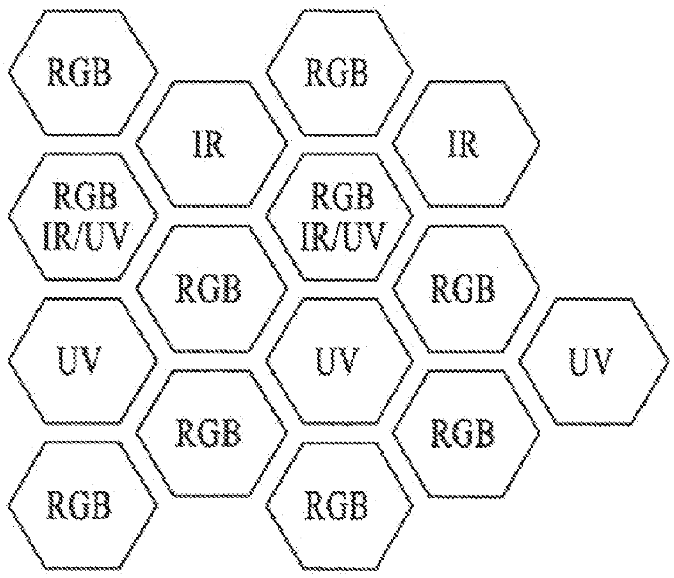
FIG. 5*m* shows pixel layouts with different shapes, such as hexagons.
Figure 5N:
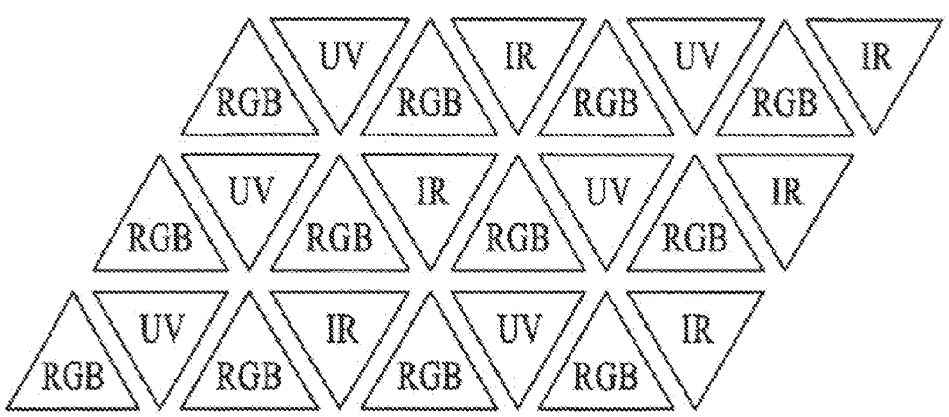
FIG. 5*n* shows pixel layouts with different shapes, such as triangles.

Referring to FIG. 5*k*, pixel layouts 1600 may be constructed of pixels of different planar shapes, including the rectangular pixels of the Bayer pattern 1602, but also other shapes such as hexagons (as depicted in FIG. 5*m*) or triangles (as depicted in FIG. 5*n*). There is benefit to approximate the point-spread function of a given lens system, which would typically image a point source of radiation 1000 more in a circular pattern than a square pattern, thus being able to approximate circular patterns (e.g. through the use of a hexagonal shape), fuller use of the resolving capability of a lens system may be attained. Pixel layouts 1600 may also be provided with offset rows and columns, rather than strictly rectangular layouts 1600. It should be noted that in order to maximize fill factor (the percentage of planar array covered by image sensors, as compared to dark space or other elements), shapes that fill a plane may be preferred, such as squares, rectangles, hexagons and triangles. However, with the high sensitivity made possible in various embodiments disclosed herein, it may also be preferable to adopt other geometries, as adequate performance may be obtained without filling an entire plane, particularly in pixel layouts 1600 that have vertical dimensions. Thus, space in a pixel layout 1600 might be reserved for other components, such as components used for dark references, components used to generate power (such as through photovoltaic effects), and other components.

Figure 5O:
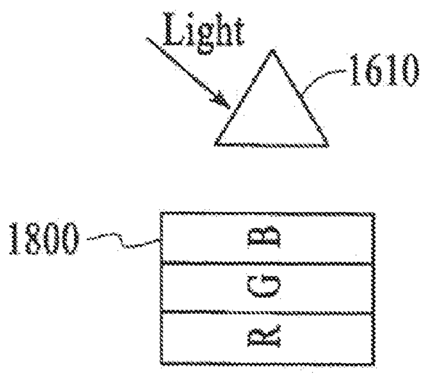
FIG. 5*o* shows a quantum dot pixel, such as a multi-spectral quantum dot pixel or other pixel, provided in association with an optical element.
Figure 5P:
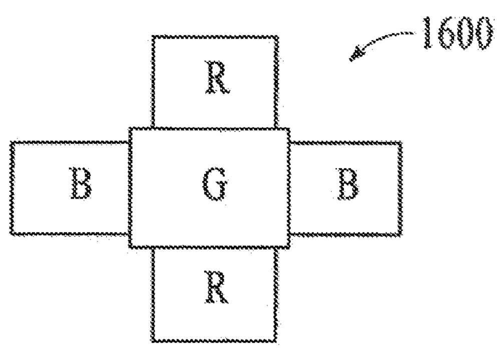
FIG. 5*p* shows an example of a pixel layout.

Referring to FIG. 5*o*, a quantum dot pixel 1800, such as a multi-spectral quantum dot pixel 1604 or other pixel, may be provided in association with an optical element 1610, such as a prism, filter, lens, microlens or the like. Thus, pixel arrays 1600 may be created that include elements that use approaches used in filter-based or lens-based approaches, such as used in conventional image sensors, CCD arrays, or the like. In such embodiments, a pixel 1800, such as a multi-spectral pixel 1604, can be thought of as a spectrometer, with an optical element configured to distribute radiation 1000 to sub-pixels below. Since the pixels 1800 disclosed herein can be produced with a very large chief ray angle, it may be possible to provide an optical element, such as a grating spectrometer, that separates spectral components. Such a grating may be created by placing a high refractive index polymer over the pixel 1800, masking a portion of the polymer, and removing the unmasked portion to leave a grating. Other techniques may be used to produce a dispersive element, such as putting a diffraction grating below a quantum dot material layer 200, allowing radiation 1000 to pass through and bouncing a portion of the radiation 1000 to detectors underneath the layer. In various embodiments a grating spectrometer could separate different color components of radiation 1000 with absorbing the radiation 1000; therefore, it would allow differential color sensitivity without losing power in the incoming radiation 1000. Thus, this approach would allow color sensitivity in low radiation 1000 situations where filters remove too much of the signal.

Pixel layouts 1600 such as those described herein may be configured to achieve color images with very small pixels relative to those used in conventional image sensors. Traditional methods start to reach a limit at 1.2 microns in pixel size, while the pixels 1800 described herein can be provided at much smaller sizes and can provide much better color fidelity even at large sizes. Thus, the pixels 1800 and pixel layouts 1600 described herein allow for high image quality on small, inexpensive chips that have large numbers of pixels.

Among other things, the layouts 1600 described herein also allow an increase in the angle at which the image sensors can receive and thus sensitively detect radiation 1000. This allows making very thin pixels 1800 and very thin camera systems that absorb desired wavelengths of radiation 1000 without the negative effects that can arise out of optical crosstalk, where one pixel receives radiation 1000 information that should have been captured by a neighboring pixel.

With reference to FIG. 1, the pixel layouts 1600 of an embodiment can be associated with suitable pixel circuitry 1700 to allow a pixel to be read with any of a range of conventional pixel readout electronics, such as the electronics used to read Bayer mosaic pixels, vertically-stacked pixels, CCD arrays, and other image sensor arrays. For example, a pixel layout 1600 may be associated with circuitry 1700 that allows for use of standard row- and column-based readout circuitry, which in turn allows the quantum dot pixel chip 100 to be used in a wide range of hardware and devices, without requiring special integration techniques.

The pixel layouts 1600 described herein generally remove any requirement for a separate, light-absorbing color filter. With continuing reference to FIG. 1, as rays traverse the layers of a conventional image sensor, stray radiation 1000 can hit the photodetecting element without first passing through the filter, producing crosstalk between neighboring sensor elements that have different companion color filters. The pixels 1800 disclosed herein can eliminate the need for the filter and reduce the parallax problem. In embodiments, pixel layouts 1600 could be associated with elements that block stray radiation 1000 that impinges upon neighboring pixels, or image data can be processed in a way that allows resolution of crosstalk among pixels. Thus, processing of image data from the pixel layouts 1600 can be simplified relative to geometries that require resolving spatial differences between a filter or other optical element and the image sensor.

Pixel layouts 1600 disclosed herein include pixels having various sensitivities to different bands of the electromagnetic spectrum. In embodiments, color sensitivity is based on absorption onset as radiation 1000 penetrates quantum dot materials 200. For example, a layer may be sensitive to blue, a deeper layer may be sensitive to blue and green, and a deeper layer may be sensitive to blue, green and red. If the blue layer is placed on top, it may absorb much of the blue radiation 1000, allowing the blue-green layer to respond primarily to green radiation 1000. Similarly, the blue-green sensitive layer may absorb the remaining blue radiation 1000, and the green radiation 1000, leaving primarily red radiation 1000 for the next lower layer. Thus, reading signals from the different layers may result in obtaining relative levels of red, green and blue radiation 1000. This approach may be generalized to other colors of radiation 1000, with layers in the appropriate order. In embodiments, signals from different layers may be manipulated, such as by subtracting, to determine a relative signal from different layers, in order to infer an intensity of each color.

The various embodiments disclosed herein allow for creating a single sensor that allows taking images across a wide range of electromagnetic radiation 1000. Thus, a single detector can provide multiple functions, such as a color camera in combination with a night vision device, a color camera combined with an x-ray, or the like. Thus, the pixel layouts 1600 disclosed herein potentially overlay images in different spectral regimes, allowing, for example, a single camera to use one radiation 1000 band for imaging during the day and use the same pixels for imaging in a second radiation 1000 band. For example, at night, or in low radiation 1000, IR-sensitive components of a pixel layout 1600 may be used to produce a black and white image at very high sensitivity. Multi-spectral pixel layouts 1600 may thus be used in multi-spectral products such as cameras used to inspect aircraft wings, medical image sensors (such as for x-rays or cancer detection), image sensors used to detect laser targeting while providing an image of an environment (such as in military applications), or a wide range of other applications.

Multiple layers of quantum dot structures 1100 may be vertically stacked (i.e. one on top of another) as described herein, wherein the vertical stack creates a multi-spectral pixel. In creating a vertically-stacked multi-spectral pixel, the upper layers may absorb and simultaneously detect certain wavelengths of radiation 1000; transmitting other wavelengths for subsequent detection in lower layers. It is desirable for each layer to achieve substantially complete absorption within the spectral region for which it is designed to be responsive. Outside of this band, and within the band(s) for which lower-down layers are responsive for the detection of radiation 1000, this upper-lying pixel should be substantially transmissive.

In embodiments the pixels of each vertically stacked quantum dot layer are separately electrically connected to their respective pixel circuit elements 1700. The vertically stacked quantum dot structures 1100 may be separately addressed electrically such that the portion of the radiation 1000 received by each layer of the stack is independently read once it is converted to an electrical signal. In embodiments vertically-stacked quantum dot structures 1100 and its associated pixels may be read laterally. Each active layer may be biased using contact arrays on the sides of each layer, for example. In embodiments, the layers are substantially electrically isolated from one another. For example, each active layer may be separated in the vertical dimension and there may be a substantially electrically insulating material provided between the active layers. In another embodiment, the biasing and reading of the vertically-stacked quantum dot structures 1100 involves the use of vertically-stacked electrodes contacting each photodetector layer. In these embodiments, whether the electrical interconnects are laterally or vertically arrayed, the electrodes are connected to vias that convey electronic signals down to the read-out circuit layer beneath (e.g., pixel circuitry 1700.) In embodiments where vertically stacked quantum dot layers are provided, the spectral characteristics of the several layers needs to be considered in determining which layer is to be provided on top of another. In embodiments the upper layer is substantially transparent to the wavelengths of radiation 1000 that are to be received by the layers beneath. While embodiments stack the quantum dot layers in an order that provides at least partial transmission of radiation 1000 to the lower layers, other embodiments may not be so limited.

The formation of the photosensitive layer near the top surface of the image sensor chip, rather than within the silicon crystal that is used to implement transistors and other electronics for read-out, carriers a number of advantages. The top surface can be more nearly filled with photosensitive material (e.g. near 100% fill factor). The increased fill factor provides both improved sensitivity at low radiation 1000 levels and higher signal to noise at all radiation 1000 intensities. The direct incidence of radiation 1000 upon the photosensitive layer (e.g. quantum dot structure 1100) can be achieved without requiring optical manipulation (such as achieved using microlenses) to convey radiation 1000 down into the bottom of a high-aspect-ratio stack of interconnect in dielectrics. The use of this top-surface detector achieves the maximal conveyance of light to the light-sensitive device, providing for a maximum of sensitivity, and also minimizes optical crosstalk. While certain embodiments may use lenses or microlenses, the general elimination of the requirement for microlenses improves the quality of the photodetector. Generally, the use of microlenses in the conventional photosensor systems limits the chief ray angle and also requires shifting of microlenses across the image sensor, rendering the image sensor design tightly coupled to micoroptics design. In embodiments a photosensor according to the principles described herein have top-surface detectors that achieve high sensitivity at low radiation 1000; top-surface detectors that substantially preserve optical signal-to-noise ratios at higher intensities; detectors and read-outs that together achieve a high dynamic range; and detectors and read-out circuits that together implement acceptably low image lag such that the appearance of memory effects, or ghosting, in images is avoided.

In embodiments described herein, the use of multi-spectral pixels 1604 may allow for the use of pixels in other spectral domains. One such embodiment may include use of pixels in the pixel layouts 1600 for optical time-of-flight measurements, such as laser scanning or pixel readouts that are synchronized with pulsed radiation 1000 sources. Thus, a pixel layout 1600 may include one or more time-of-flight pixels as well as image sensing pixels. In such embodiment the readout architecture would include elements suitable for reading image sensing pixels as well as elements suitable for reading time-of-flight data used in laser scanning or other time-of-flight techniques. Since time-of-flight approaches do not necessarily require high spatial resolution, a layout may include tightly spaced multi-spectral pixels 1604 with loosely spaced time-of-flight pixels.

In embodiments pixels 1800 of various types may be stacked in vertical architectures. For example, pixels 1800 configured in a planar layout 1600 may be arranged to sense an image within a radiation 1000 band, while a different pixel layout 1600 may be placed above or below the initial layer, such as to perform other sensing, such as for obtaining time-of-flight data for 3D spatial resolution.

An aspect of the present embodiment relates to fill factors (i.e. the areas of the photodetection layer that are not consumed with quantum dots 1200). There is typically a fractional area of the surface that is occupied by metal, or other non-photosensing material, as opposed to photosensing material. Embodiments minimize the amount of area filled by metal, as described herein. In embodiments, the metal-covered area is functional (e.g. it provides blockage for dark current readings).

In embodiments, the fill area or metal area deliberately obscures some of the photosensing material; the top layer may partially obscure an underlying structure. This may render some of the material as not radiation-sensitive (i.e. an insensitive reference, rather than a dark reference). An electrode from an electrical interconnection 1404 may be placed in a dark region under one of the shaded areas to make dark measurements.

In embodiments the underlying metallic layer occupies a large fraction of the photodetection area and custom designs of the metal may be used to create certain advantages. For example, one may want squares, points, or other shape with metal layer.

Aspects that can be altered in a pixel 1800 under the teachings herein include pattern, fill factor, sensitivity, shape of pattern, contact design, contact materials, infill between the pixels, contacts out of multi-layered structures, transparent layers, sharing of components, top contact pattern and the like. Embodiments may not require a top electrical contact.

The top electrical contact may not need to be transparent; or may be transparent only within a certain spectral band or within certain spectral bands.

In embodiments, a multiplicity of adjacent or near-adjacent pixels share transistors and/or other circuits and/or circuit components among pixels.

In embodiments, a multiplicity of adjacent or near-adjacent pixels share dark-reference photoconductors, or references made using insensitive-conductors, among pixels.

In embodiments the photodetector geometric layout 1402 includes a patterned top contact. The top contact layer may be a grid, and the grid can incorporate holes for the penetration of radiation 1000.

Embodiments include those that provide optical resonance structures. In an optical resonance structure the thickness of a quantum dot structure layer corresponds to an integer multiple of a quarter-wavelength of radiation 1000 is deemed of interest. This approach modulates the effective absorbance of this color of radiation 1000 relative to all others. For example, this optical resonance approach can achieve an increased absorbance of some colors of radiation 1000 compared to what would be obtained via a single pass of radiation 1000 through that material.

Embodiments involve setting an electrical interconnection deep or in a shaded area of the quantum dot structure 1100. A contact may be buried deep enough in the material or under an occlusion (e.g. under a metal piece, under a non-transparent dielectric, etc.). A dark measurement could then be made by measuring the charge associated with the 'dark contact.' Another electrical interconnection 1404 may make electrical contact with and read charge from a more active region of the quantum dot structure 1100 to make the radiation 1000 readings. The radiation 1000 readings can then be compared to the dark measurement to create a referenced radiation 1000 reading. In embodiments the quantum dot structure 1100 is stacked or layered so a dark reference electrical interconnection can be buried in a lower portion of the quantum dot structure 1100. The thickness of the quantum dot structure may itself provide enough darkness for a dark measurement. In this embodiment one electrical interconnection 1404 is close to the radiation 1000 and other (i.e. dark reference) is farther from radiation 1000. The closer interconnection is close to the photosensitive part of quantum dot structure 1100. The dark interconnection is farthest from radiation 1000, which is farther from the photosensitive layer of the quantum dot structure 1100. Embodiments use an electrical scheme to sense the difference between the two structures. In embodiments, the two electrical interconnections are at or near the same potential to prevent top to bottom conductivity.

Embodiments involve a self-referenced dark reference. This may involve two levels of contacts: one level close to the radiation 1000 and another farther from radiation 1000. The contact closest to radiation 1000 is close to photosensitive part of film and the farthest from radiation 1000 is farther from photosensitive film. An electrical scheme may be employed that senses the difference between the two structures. Under no illumination (i.e. in the dark) the resistors associated with the dark references and the active materials have the same resistance. A circuit is configured (e.g., a Wheatstone bridge, etc.) in which the output signal is related to the difference in resistances between the separate referenced electrical interconnects. Thus, under dark conditions, the signal output is zero. Under illumination, more radiation 1000 is absorbed by the photodetector which is struck first by the radiation 1000, since following radiation 1000 passage through this first photodetector, the optical intensity is attenuated. As a result, the incidence of radiation 1000 changes the top, more strongly-illuminated photodetector than it does change the bottom one. As a result, the difference in resistance between the two photodetectors, now both illuminated, but differently-illuminated), is proportional to the optical intensity. The same signal, related to a resistance difference between the top and bottom layers, provides an output signal that is directly related to optical intensity.

In embodiments, multispectral quantum dot structure pixels are provided. In embodiments the multispectral nature of the pixel is provided by providing different spectral response quantum dots within a given pixel (e.g. arranged to respond to R, G, B and IR). In embodiments the multispectral nature of the pixel is provided by providing different spectral response quantum dots spread between different pixels (e.g. one pixel is an R response and one is B response, etc.). The separate pixel structures could effectively mimics a pixel layout (e.g. an RGB or CMY pattern). In embodiments the multispectral nature of the pixel is provided by providing different spectral response quantum dots spread between different pixel layers.

Stacked Multilayer Pixels

Multiple layers of quantum dot structures 1100 may be vertically stacked, as described herein, to generate a multi-spectral pixel. In creating a vertically-stacked multi-spectral pixel, the upper layers may absorb and simultaneously detect certain wavelengths of radiation, transmitting other wavelengths for subsequent detection in lower layers. While each layer may achieve substantially complete absorption within the spectral region for which it is configured to be responsive, the embodiments are not so limited. Outside of this band, and within the band(s) for which lower-down layers are responsive for the detection of radiation 1000, this upper-lying pixel should be substantially transmissive.

A multicolor, multilayer photodetector of an embodiment includes the following components or elements, as described in detail herein, but is not so limited: an integrated circuit; at least two optically sensitive layers, a first optically sensitive layer and a second optically sensitive layer, the first optically sensitive layer over at least a portion of the integrated circuit and the second optically sensitive layer over the first optically sensitive layer; each optically sensitive layer interposed between two electrodes, a respective first electrode and a respective second electrode; the integrated circuit configured to selectively apply a bias to the electrodes and to read out a signal from the optically sensitive layers related to the number of photons received by the respective optically sensitive layer.

An image sensor may be produced which comprises an array of such multilayer photodetectors, each representing a pixel, wherein the electrical signal in each layer within each pixel region is independent registered and is conveyed to other regions of the integrated circuit. In embodiments, such a multilayer photodetector may accomplish color sensing by using a top layer that is sensitive to blue light, having a typical cutoff of absorption at approximately 490 nm; and a lower layer that is sensitive to blue and green light, having a typical cutoff of absorption at approximately 560 nm.

While the lower layer is sensitive to both blue and green light, the stacked photodetector of an embodiment can be configured such that the top layer substantially absorbs blue light. The light impinging on the lower photodetector is therefore substantially lacking in blue light. As a result the photocurrent produced in the lower photodetector will be determined predominantly by the intensity of green light striking the stacked pixel.

In embodiments, sensing of red and near-infrared light may be accomplished with a conventional pinned silicon photodiode integrated within the CMOS integrated circuit.

In embodiments, a multilayer photodetector accomplishes color sensing using a structure including a top layer, a middle and a lower layer. The top layer is sensitive to blue light and has a typical cutoff of absorption at approximately 490 nm. The middle layer is sensitive to blue and green light and has a typical cutoff of absorption at approximately 560 nm. The lower layer is sensitive to blue and green and red light, and has a typical cutoff of absorption lying beyond 650 nm, typically at 650 nm, 700 nm, or 750 nm.

While the middle layer is sensitive to both blue and green light, the stacked photodetector may be configured such that the top layer substantially absorbs blue light. The light impinging on the middle photodetector is therefore substantially lacking in blue light. As a result the photocurrent produced in the middle photodetector will be determined predominantly by the intensity of green light striking the stacked pixel.

Similarly, while the bottom layer of this embodiment is sensitive to both blue and green and red light, the stacked photodetector may be configured such that the top layer substantially absorbs blue light; and the middle layer substantially absorbs green light. The light impinging on the bottom photodetector is therefore substantially lacking in blue and in green light. As a result the photocurrent produced in the bottom photodetector will be determined predominantly by the intensity of red light striking the stacked pixel.

In an alternative embodiment, a multilayer photodetector accomplishes color sensing using a structure including a top layer, a middle and a lower layer. The top layer is sensitive to blue light, for example, and has a typical cutoff of absorption at approximately 490 nm. The middle layer is sensitive to blue and green light, having a typical cutoff of absorption at approximately 560 nm. The lower layer is sensitive to blue and green and red and infrared light, and has a typical cutoff of absorption lying beyond 700 nm, 800 nm, 900 nm, 1000 nm, 1300 nm, 1650 nm, 3 um, or 5 um wavelength.

In systems constructed to include and use such stacked pixels, an infrared cutoff filter may be selectively deployed such that, at high light, and for the purposes of visible color imaging, the infrared filter prevents infrared light from impinging on the sensor layer. Under low-light, including nighttime, conditions, the filter is removed from the optical path, such that the bottom layer provides a combination of red and infrared sensitivity. Embodiments include imaging systems which achieve low-light sensitivity; which achieve imaging using active infrared illumination; and/or which achieve imaging based on the nightglow emissions that provide substantially infrared illumination of a scene.

In other alternative embodiments, a multilayer photodetector accomplishes color sensing, including infrared sensing, through use of a structure including a top layer, an upper middle layer, a lower middle layer, and a lower layer. The top layer is sensitive to blue light, and exhibits a typical cutoff of absorption at approximately 490 nm. The upper middle layer is sensitive to blue and green light, and exhibits a typical cutoff of absorption at approximately 560 nm. The lower middle layer is sensitive to blue and green and red light, and exhibits a typical cutoff of absorption lying beyond 630 nm, typically at 630 or 650 or 670 or 700 nm. The lowest layer is sensitive to blue and green and red and infrared light, having a typical cutoff of absorption lying at 800 nm, 900 nm, 1000 nm, 1300 nm, 1650 nm, 3 um, or 5 um wavelength.

Embodiments include imaging systems which achieve low-light sensitivity; which achieve imaging using active infrared illumination; and/or which achieve imaging based on the nightglow emissions that provide substantially infrared illumination of a scene.

The optically sensitive materials making up some or all of the layers of a multilayer pixel can include photoconductive photodetectors having gain. They may employ films made from colloidal quantum dots in which one carrier type is the flowing carrier, and the other carrier type is substantially blocked, or trapped, or both. For example, if PbS (lead sulfide) is employed as a colloidal quantum dot materials system, it may be that holes serve as the flowing carrier; whereas electrons are trapped. Organic ligands may be employed at various phases in materials and device fabrication in order to provide a stable colloid when the particles are in the solution phase. Some or all of these organic ligands may be removed or replaced during processing, both in solution-phase processes and also in the formation of solid films. Such modification of the presence of ligands may be exploited to improve and/or control the flow of charge carriers in the devices.

Semiconductor nanoparticles may be employed whose dimensions, along at least one spatial axis, are comparable to or less than the Bohr exciton radius of bound electron-hole pairs within the nanoparticle. For example, in PbS, the Bohr exciton radius is typically reported in the range 18-25 nm. When the nanoparticle diameter is chosen, typically through synthetic conditions at the time of nanoparticle manufacture, to lie below the Bohr exciton radius, the effective bandgap of the resulting set of colloidal quantum dots may lie well in excess of the bulk bandgap of the constituent semiconductor. For example, in PbS, the bulk bandgap is approximately 0.4 eV. When nanoparticles of approximately 8 nm diameter are produced, the absorption onset may lie closer to 0.7-0.8 eV. When nanoparticles of approximately 4 nm diameter are produced, the absorption onset may lie closer to 0.9-1.0 eV. When nanoparticles of approximately 0.5-2 nm diameter are produced, the absorption onset may lie in the range 2-3 eV. It is worth noting that, in this example, the effective bandgap of the quantum-confined material may be more than double (when measured in energy units, electron volts, eV) the bulk bandgap of the bulk material of which the nanoparticles are materially constituted.

In embodiments, the multiple (two-or-more) stacked photosensitive layers described above, each having a different effective bandgap, may comprise semiconductor materials having the same composition; but the diameter of the particles in the upper layer(s) will have smaller diameters than those in the lower layer(s) in order to achieve a shorter-wavelength cutoff in the upper layer(s) compared to in the lower layer(s).

In embodiments, the multiple (two-or-more) stacked photosensitive layers described above, each having a different effective bandgap, may comprise semiconductor materials having a generally differing composition, and also a generally differing diameter. In producing a three-color visible (blue, green, red) pixel, for example, the top (blue) layer may be constituted of In2S3 having diameter 2 nm; the middle (green) layer may be constituted of In2S3 having diameter 4 nm; and the bottom (red) layer may be constituted of PbS having diameter 2 nm.

In embodiments that employ different materials in some of the layers, the nanoparticles in the lower layers may thus have smaller bandgaps, but also smaller diameters, than those in the upper layers.

Examples of materials making up the optically sensitive layers include PbS, PbSe, In2S3 In2Se3, Bi2S3, Bi2Se3, InP, Si, Ge. Nanoparticle diameters may typically range from 0.5 nm to 10 nm.

Highly monodispersed colloidal quantum dots are often reported to exhibit an excitonic peak in the absorption spectrum, wherein a local maximum (often a pronounced one) is observed in the absorption spectrum at energies approximately 0.05–0.5 eV above the absorption onset. This feature may assist in providing the color discrimination desired herein. In embodiments, no defined local maximum in the absorption spectrum near its onset may be observed. In embodiments, only an absorption edge may be observed.

In embodiments, one or more of the layers in the multilayer photodetector may provide photoconductive gain. This may be accomplished through the use of a layer that substantially absorbs light in the spectral regime of interest (for example, blue in a top layer)—for example, the absorbance (also known as quantum efficiency) in this spectral regime may exceed 50%; and through the use of a medium in which the transit time for the flowing carrier (such as holes) is less than the lifetime of that carrier; and in which the other carrier (such as electrons) either exhibits a low mobility (much lower than that of the flowing carrier, typically 10× or a greater multiple lower mobility) or is blocked (such as by using an electron-blocking layer) or both.

In embodiments, photoconductive gain may be equal to unity or greater. When combined with absorption of 50% or greater, the number of electrons flowing per second through the pixel may exceed 0.5 times the number of photons impinging on the pixel per second. For light at the wavelength 550 nm, for example, this corresponds to a Responsivity in excess of 0.22 A/W.

In embodiments, the responsivity may be of at least 0.4 A/W. Typical desired ranges of Responsivity range from 0.4 A/W to 10 A/W. Photoconductive gains resulting in responsivities of 100 A/W or 1000 A/W have been shown experimentally as reported herein; and may in embodiments be employed.

Such responsivities may be achieved using voltage biases of 0.5 V or 1 V or 1.2 V or 1.5 V.

In embodiments including multiple (two-or-more) stacked photosensitive layers, the first optically sensitive layer comprises a nanocrystal material having photoconductive gain and a responsivity in the range of about 0.4 A/V to 100 A/V; and the second optically sensitive layer comprises a nanocrystal material having photoconductive gain and a responsivity in the range of about 0.4 A/V to 100 A/V that is greater than the first photoconductive gain; and the multilayer photosensor further comprises circuitry to generate image data, including circuitry configured to compensate for the difference in photoconductive gain between the first optically sensitive layer and the second optically sensitive layer. In embodiments, the renormalization for the differing gains in the different optically sensitive layers may be achieved using an image sensor processor and/or using software.

In embodiments, the materials compositions and layer thicknesses of the two-or-more optically sensitive layers in the stacked pixel may be selected such that the responsivities in the color ranges of interest to each optically sensitive layer may be rendered approximately equal in value. For example, compositions and thicknesses may be selected such that a top layer provides a responsivity of approximately 3 A/W in middle of the blue; the middle layer provides a responsivity of approximately 3 A/W in the middle of the green; and the bottom layer provides a responsivity of approximately 3 A/W in the middle of the red.

In embodiments, the materials compositions and layer thicknesses of the two-or-more optically sensitive layers in the stacked pixel may be selected such that the product of Absorbance and Photoconductive Gain within each optically sensitive layer may be rendered approximately equal in value. For example, compositions and thicknesses may be selected such that a top layer provides an Absorbance*Photoconductive Gain product of approximately 6 in the middle of the blue; a middle layer provides an Absorbance*Photoconductive Gain product of approximately 6 in the middle of the green; and a bottom layer provides an Absorbance*Photoconductive Gain product of approximately 6 in the middle of the red. In embodiments, the absorbance of each layer will exceed 70%, and may range from 70%-95%, at the peak of the spectral regime of interest. For example, the Absorbance of a top layer may be approximately 80% in the middle of the blue; the Absorbance of a middle layer may be approximately 80% in the middle of the green; and the Absorbance of a bottom layer may be approximately 80% in the middle of the red. In embodiments, the Photoconductive Gain of each layer may be similar, such as taking on a value of 7.5, or another value within a range of approximately 1-10.

In embodiments, an image sensor may be realized using an array of stacked pixels wherein at least one pixel in the array is substantially obscured, preventing the incidence of light. Such substantially obscured pixel or pixels may be termed 'black pixels.' The current flowing in each photosensitive layer of the black pixel will thus correspond approximately to the dark current associated with that photosensitive layer. If the photosensitive layers making up the stacked pixels are made to be of substantially similar thickness, carrier density, lateral dimensions, and carrier transport properties across the array, then the dark current associated with each sensitive layer, as provided by the black pixel(s), may be used as a basis to subtract off the effect of the dark current in the (non-obscured) light-sensing pixels making up the remainder of the array. Simple dark-current-subtracting analog circuits may be employed to remove the offset, or black level, associated with each photosensitive layer.

In embodiments, an upper layer may be more strongly absorbing (per unit length, with absorbance per unit length measured in units of cm−1) in its wavelength of interest than a lower layer. For example, an upper layer may absorb in the blue with an absorption of alpha=60,000 cm−1, while a lower layer may absorb in the green with an absorption of alpha=50,000 cm−1. To absorb approximately 80% of blue light, the upper layer may thus be made to be approximately 250 nm thick. To absorb approximately 80% of green light, the lower layer may thus be made to be approximately 300 nm thick. In this example, the dark currents flowing in the upper and lower layers may thus be generally different. If biased to the same potential difference, and if constituted of materials having essentially similar mobilities and carrier densities, then if the biasing electrodes are configured at a distance equal to the material thickness (such as in a vertical pixel) then the thinner upper layer may provide a higher dark current; or, if the biasing electrodes are configured along an axis perpendicular to the film thickness (such as a lateral electrode configuration), then thinner upper layer may provide a lower dark current. In the former case, a black-level subtraction circuit will subtract a larger current from signals corresponding to upper-layer photosensitive regions; whereas in the latter case, a black-level subtraction circuit will subtract a smaller current from signals corresponding to upper-layer photosensitive regions.

Embodiments include stacked pixels wherein at least one of the optically sensitive layers is employed to produce an essentially unipolar device. In the unipolar device, the transport of one carrier type (electrons or holes) predominates over the transport of the other type (holes or electrons). For example, in PbS photoconductive colloidal quantum dot detectors described herein, holes may be the flowing carrier and may have a mobility of at least 10× greater than electrons.

For example, the hole mobility may equal 1E-4 cm2/Vs while the electron mobility may be inferior to 1E-5 cm2/Vs.

Embodiments include the use of at least one optically sensitive layer that consists of substantially monodispersed nanoparticles. For example, an optically sensitive layer may consist substantially of nanoparticles having average diameter 1.5 n, and ranging in diameter from 1-2 nm.

Embodiments include the use of at least one optically sensitive layer that consists of nanoparticles whose cores are in physical proximity (separated by less than 0.5 nm) and substantial electrical communication with one another (achieving hole mobility of 1E-5 cm2/Vs or greater).

Embodiments include the use of at least one optically sensitive layer that consists of nanoparticles whose cores are bridged by bidentate linker molecules (such as ethanedithiol or benzenedithiol).

Embodiments include the use of at least one optically sensitive layer in which the dark current density is in the range of 10-500 nA/cm2 and which provides a noise-equivalent exposure of between 3 pJ/cm2 and 30 pJ/cm2.

Embodiments include electrode configurations wherein each optically sensitive layer comprises a continuous film of interconnected nanocrystals in contact with the respective first electrode and the respective second electrode; wherein the second electrode is at least partially transparent and is positioned over the respective optically sensitive layer; and wherein the flowing-carrier transit time is less than the carrier lifetime, a.k.a. the persistence time. For example, the flowing-carrier transit time may be less than 15 milliseconds; while the carrier lifetime or persistence time may be approximately 30 milliseconds. In general the flowing carrier lifetime may range from 1 microsecond to 30 milliseconds; and the carrier lifetime or persistence time may range from 2 microseconds to 60 milliseconds.

Figure 3O:
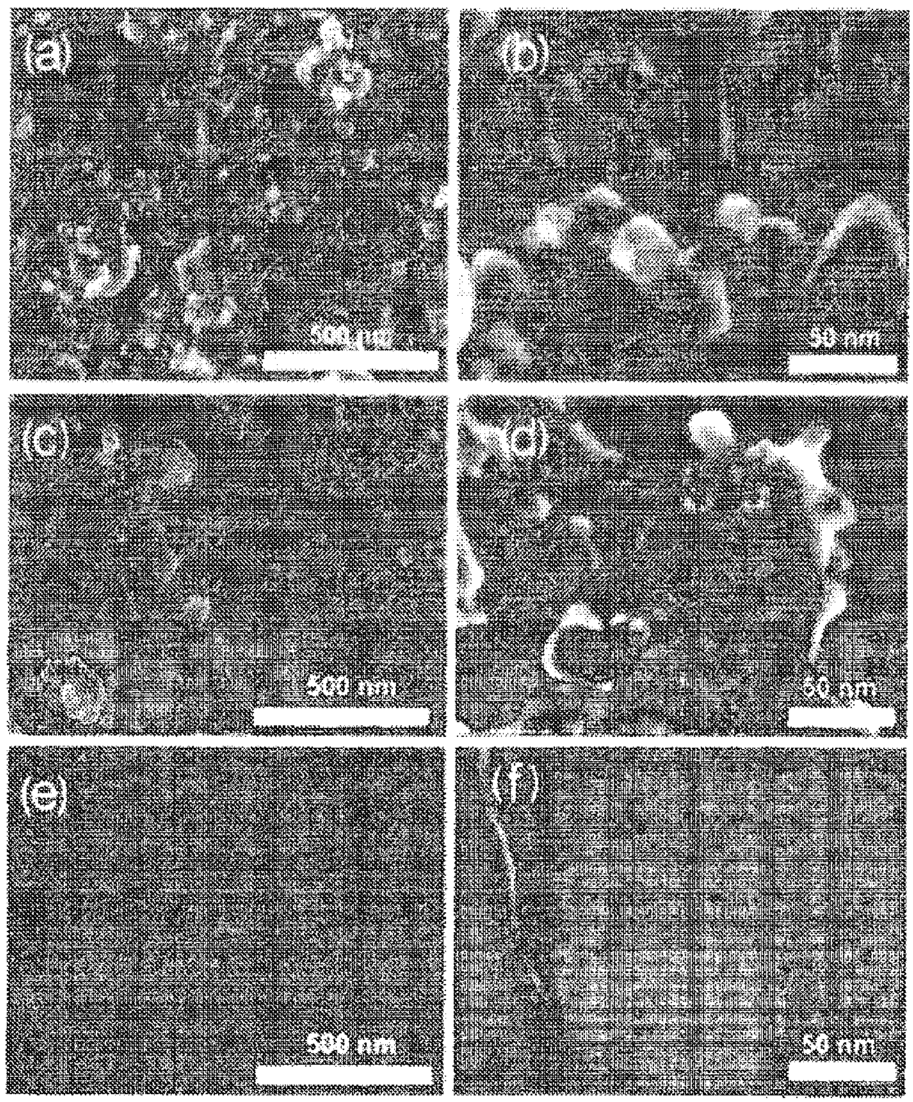
FIG. 3*o*(a-f) shows scanning electron microscope (SEM) images of the surface of a textured indium tin oxide (ITO) substrate before nanocrystal deposition and the surface of a ITO substrate after nanocrystal deposition with and without the use of cross-linking molecules. a-b, Bare textured ITO substrate. c-d, textured ITO after nanocrystal deposition without cross-linker showing the exposed ITO which leads to short-circuited devices. Individual nanocrystals can be seen clustered in the crevices between sintered ITO particles. e-f, Surface of functional devices after nanocrystal deposition utilizing cross-linkers to obtain a continuous nanocrystal over-coating.
Figure 3Q:
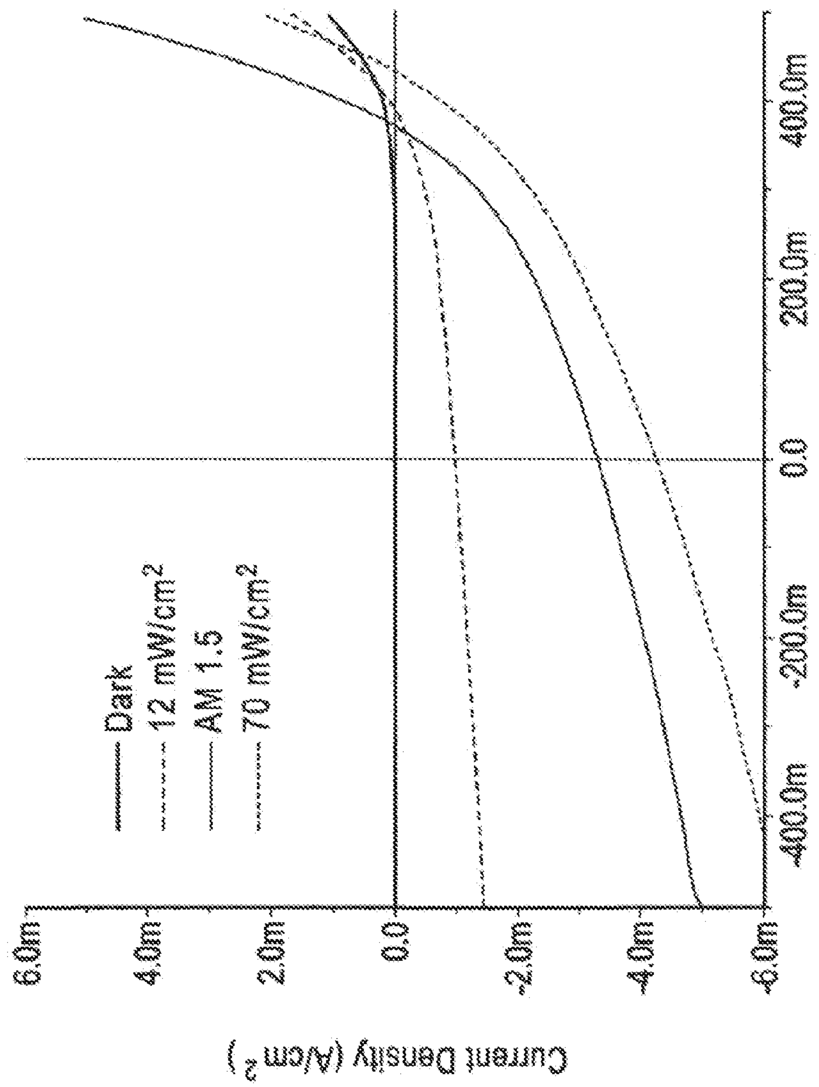
FIG. 3*q* shows current-voltage curves of sintered device made with nanocrystals having a first excitonic transition at 1340 nm. The AM 1.5 illumination intensity was 100 mW/cm$^2$. Monochromatic illumination intensities of 12 and 70 mW/cm$^2$ were with 975 nm light.
Figure 3R:
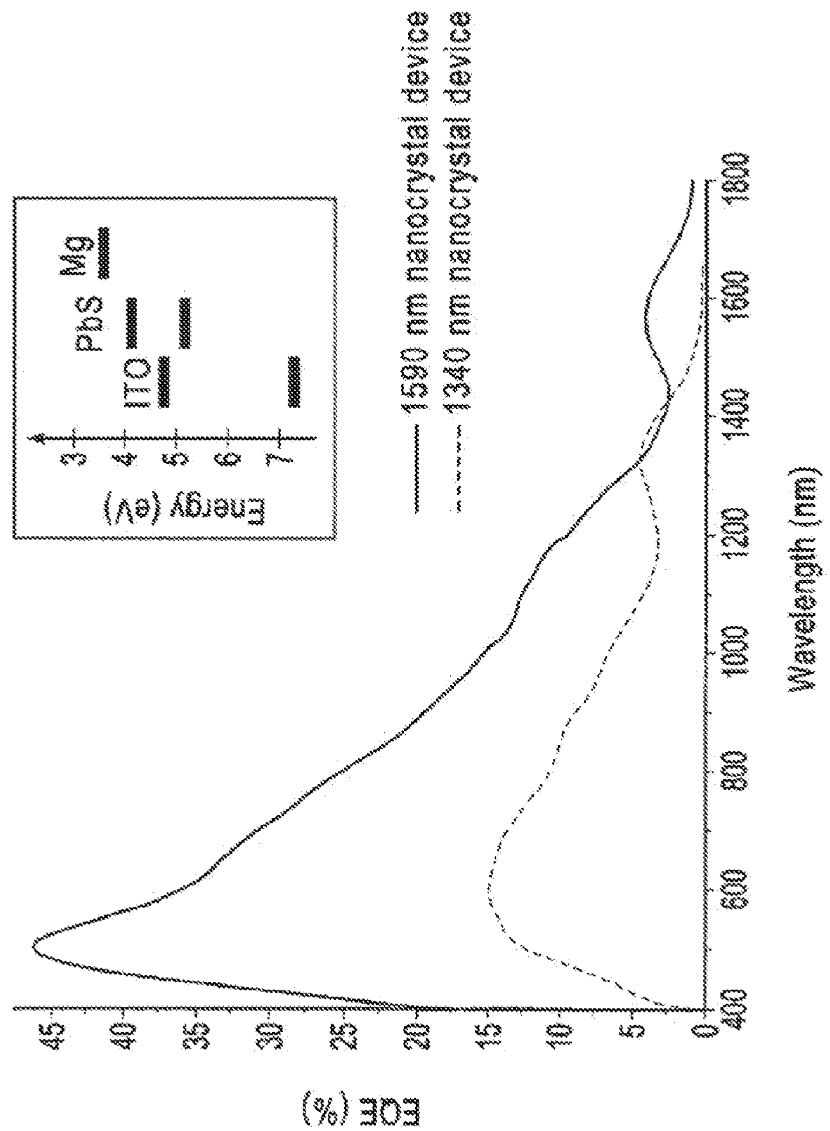
FIG. 3*r* shows external quantum efficiency of sintered devices. Inset shows schematic of band positions of the materials used in devices. PbS conduction and valence bands are drawn for 1 eV first excitonic transition nanocrystals by employing the effective mass approximation to modify bulk energy levels.
Figure 3S:
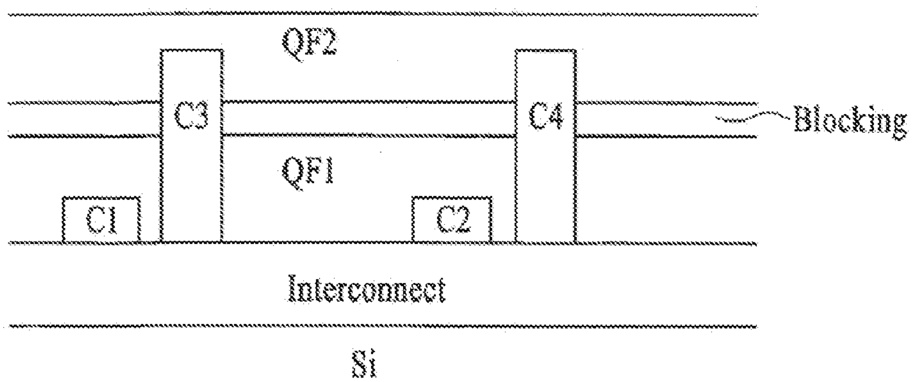
FIG. 3*s* is a stacked multilayer pixel having an electrode configuration wherein each respective first electrode (C1) is positioned laterally to at least a portion of the respective second electrode (c2), under an embodiment.
Figure 3T:
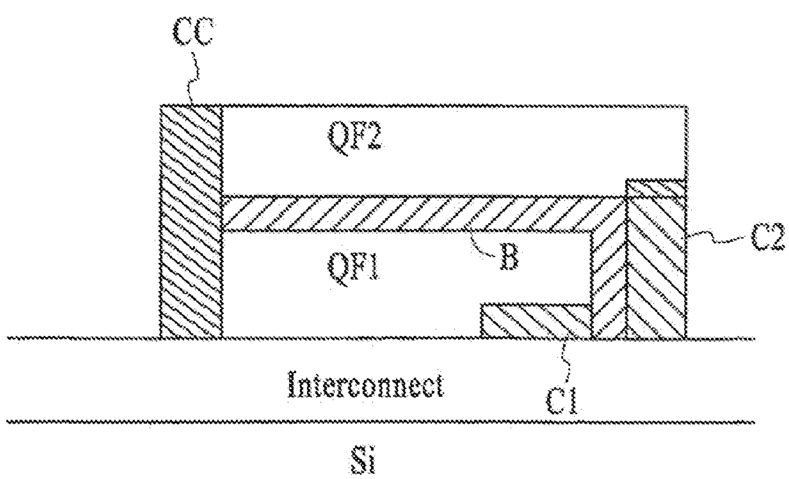
FIG. 3*t* is a stacked multilayer pixel having an electrode configuration wherein one common electrode (CC) extends in the vertical direction over the height of more than one of the photosensitive layers (QF1+QF2); and wherein separate, electrically independent, electrodes (C1 AND C2) are used to bias and collect current substantially independently from the photosensitive layers (QF1 AND QF2), under an embodiment.

FIG. 3*s* is a stacked multilayer pixel having an electrode configuration wherein each respective first electrode (C1) is positioned laterally to at least a portion of the respective second electrode (c2), under an embodiment. Put another way, the region of physical and electrical contact between a first electrode (C1) and the portion of film (QF1) that this electrode touches is at substantially the same elevation (measured relative to the top surface of the silicon chip, for example) as the region of physical and electrical contact between a second electrode (C2) and the portion of film that this electrode touches.

FIG. 3*r* is a stacked multilayer pixel having an electrode configuration wherein one common electrode (CC) extends in the vertical direction over the height of more than one of the photosensitive layers (QF1+QF2); and wherein separate, electrically independent, electrodes (C1 AND C2) are used to bias and collect current substantially independently from the photosensitive layers (QF1 AND QF2), under an embodiment. Embodiments include a current blocking layer (B) which substantially prevents electrical crosstalk between the layers (QF1 and QF2).

Figure 3U:
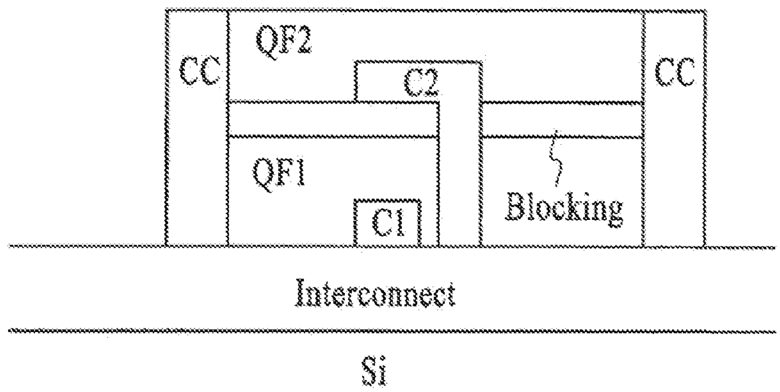
FIG. 3*u* and FIG. 3*v* is a side and top view, respectively, of a stacked multilayer pixel having an electrode configuration wherein a common electrode (CC) is disposed around an electrode (C1) in electrical contact with a first photosensitive layer (QF1); and the common electrode (CC) is disposed around an electrode (C2) in contact with a second photosensitive layer (QF2), under an embodiment.
Figure 3V:
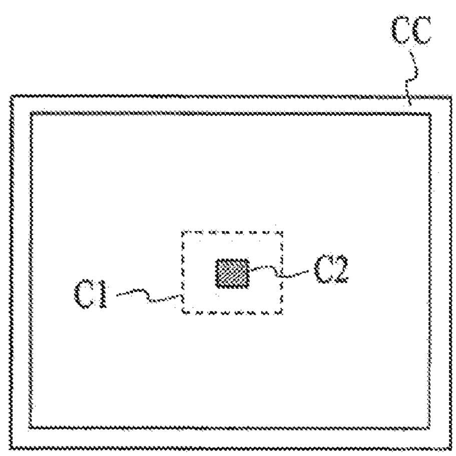

FIG. 3*u* and FIG. 3*v* is a side and top view, respectively, of a stacked multilayer pixel having an electrode configuration wherein a common electrode (CC) is disposed around an electrode (C1) in electrical contact with a first photosensitive layer (QF1); and the common electrode (CC) is disposed around an electrode (C2) in contact with a second photosensitive layer (QF2), under an embodiment. Embodiments include those that employ an electrically insulating (Blocking) layer to provide substantial electrical isolation between the photosensitive layers.

Figure 3W:
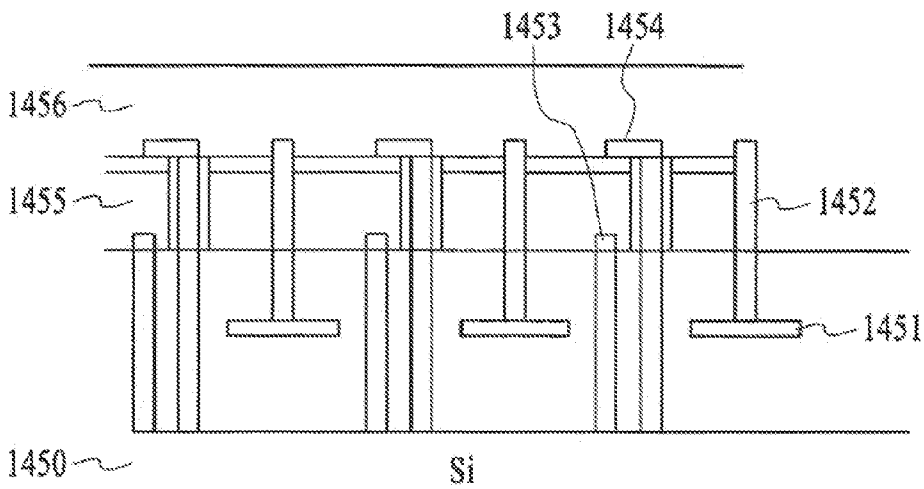
FIG. 3*w* depicts an image sensor, in cross-section, showing by illustration how two layers of optically sensitive material, stacked atop one another, can be independently read out electrically.

FIG. 3*w* depicts an image sensor, in cross-section, showing by illustration how two layers of optically sensitive material, stacked atop one another, can be independently read out electrically. 1450 is the silicon substrate which forms part of the read-out integrated circuit and the eventual image sensor. 1451 is a metal layer within the interconnect stack that connects to a bias available elsewhere on the chip. 1451 is electrically connected to 1452, the common posts that reach up vertically to provide one of the electrodes contacting the optically sensitive layer. In this particular instance, 1452 is in electrical communication with both quantum film layers 1455 and 1456: thus it provides a contact common to each layer. 1453 is one pixel electrode that provides electrical communication between the lower quantum film layer 1455 and circuitry on the substrate 1450. 1454 is another electrically independent pixel electrode that provides electrical communication between the upper quantum film layer 1456 and circuitry on the substrate 1450. It is shown visually that the post 1454 is clad on its sides by an insulating layer which prevents significant electrical communication between 1454 and the lower optically sensitive layer 1455. In this way electrical communication among pixel electrodes and optically sensitive layers is unique to the pair {1453, 1455} and independently {1454, 1456}. As a result the light level absorbed in 1456 is communicated to its corresponding read-out circuit substantially without regard for the light level incident on 1455; and, similarly, the light level absorbed in 1455 is communicated to its corresponding and separate read-out circuit substantially without regard for the light level incident on 1456. It will be understood that 1456 and 1455 may generally be made using materials having different spectra of optical sensitivity. 1456 could for example be made of the same constituent semiconductor material, but smaller-diameter, semiconductor quantum dots than 1455, in which case 1456 would absorb and sense higher-energy photons, while 1455 would absorb and sense primarily lower-energy photons. Because of the substantial electrical independence of their connection to their respective read-out circuits, the spectral information absorbed in 1456 versus the spectral information absorbed in 1455 can be substantially distinguished from one another.

Embodiments include electrode configurations wherein the respective second electrode for the first optically sensitive layer and the second optically layer comprises a mesh between the vertically stacked pixel and an adjacent vertically stacked pixel. Embodiments include an array of vertically stacked pixels with multiple layers each having a first electrode, a mesh interposed between the vertically stacked pixels and configured to provide a common electrode for each layer in the vertically stacked pixels.

Embodiments include a photosensor array wherein the fill factories at least 80%, with typical range being 80%-100%. Fill factor is taken to mean the ratio of the unobscured, absorbing area of each pixel to the total area of each pixel, but can have other meanings as appropriate and understood by one skilled in the art.

Embodiments include a system-on-chip wherein the photosensor array is combined with circuitry to compensate for different properties—such as dark current and responsivity—for different optically sensitive layers. System-on-chip implementations are described elsewhere herein. The circuitry combined with the sensors of an embodiment can include any circuitry appropriate to a chip or application implementation of the sensor. For example, embodiments include circuitry (analog, digital, or a combination thereof) that implements a demosaicing algorithm to report a corrected color matrix (e.g. blue, green, red) for a particular composite stacked pixel in view of the Responsivity and Absorbance spectrum of each photosensitive layer in the stack. As another example, embodiments include circuitry (analog, digital, or a combination thereof) that subtracts from the electrical signal reported from a lower pixel an electrical signal that is related to the electrical signal reported from an upper pixel, or upper pixels, in order to reduce color crosstalk in the extracted color signals.

Photodetectors compatible with video frame rates, and possessing photoconductive gain, are now discussed. Embodiments described herein include a photoconductive photodetector in which substantially a single chemical species has associated with it a substantially single energy depth and thus, at a given temperature, a substantially single trap state lifetime, and thus a substantially single temporal component associated with the rise and fall of photocurrent during incident optical transients. Embodiments include photoconductive photodetectors where the single chemical species is PbSO3 (lead sulfite); the single energy depth is approximately 0.1 eV; at room temperature the substantially single trap state lifetime is ~30 milliseconds; the substantially single temporal component associated with the rise and fall of photocurrent is ~30 milliseconds. In embodiments the following are not substantially included into the photoconductive medium: lead sulfate PbSO4, having depth 0.3 eV or greater, and having transient component of order seconds; lead carboxylate, having depth 0.2 eV or greater, and having transient component of order half a second or more.

Methods used to obtain and characterize certain embodiments of the photodetector 1400 will now be described. A typical synthesis of PbS NCs with an excitonic peak between 700 nm and 800 nm may involve injection of 2.0 mmoles of bis(trimethylsilylsulfide) into a reaction flask containing 4.0 mmol of lead oxide (0.9 g), 9.5 mmol of oleic acid (2.67 g), and 18.8 mmol of octadecene (4.73 g) at 80° C. After the injection the reaction may be quenched by moving the flask to an ice-water bath. The synthesis may be carried out under inert conditions using a Schlenk line. The final PbS oleate-capped NCs may be isolated from any remaining starting materials and side products by precipitating with acetone. The precipitate may then be redispersed in toluene and precipitated again with acetone. The final nanocrystals may be redispersed in toluene for device fabrication.

Since bulk PbS may have a bandgap of approximately 0.4 eV, it may be necessary to increase dramatically the degree of quantum confinement in the quantum dot materials 200 to make the visible-only colloidal quantum dot photoconductive detector 1400 of the embodiment. An improvement in the synthetic procedure may enable the synthesis of quantum dots 1200 with absorption onset below 800 nm, as described herein. FIG. 3*i*(a) may illustrate the absorption spectrum of the resultant quantum dots. As seen in FIG. 3*i*(b), the nanoparticles may have diameters of 3 nm and exhibit faceting. As synthesized, these nanocrystals may be stabilized with oleic acid, a configuration expected and observed to impede carrier transport due to the oleate ligand's long insulating chain. Exchanging to shorter ligands such as butylamine may result in a dramatic increase in conductivity. Whereas in the case of larger 4-6 nm nanoparticles, monodispersity and excitonic features may be preserved after ligand exchange in solution phase, in the small nanocrystal case, the procedure may lead, instead, to the formation of nanostrings (FIG. 3*i*(c)) as previously seen for PbSe nanoparticles (Cho, K. S. Talapin, D. V. Gaschler, W. Murray, C. B. Designing PbSe Nanowires and Nanorings through Oriented Attachment of Nanoparticles Journal of the American Chemical Society 127, 7140-7147 (2005)); and, more problematically, a loss of an abrupt absorption onset (dashed curve, FIG. 3*i*(a)) resulting from irreversible aggregation.

Thus, an approach that would instead preserve a sharp, short-wavelength absorption onset may be preferred. Ligand exchange in the solid state, once thin films may already be formed, may limit the number of nanocrystal reattachment sites and dramatically improve conductivity without dramatically altering quantum-confined energy levels. PbS nanocrystals dispersed in toluene may be spincoated onto glass substrates with gold interdigitated electrodes with a 5 μm spacing (shown in FIG. 3*m*) to form a solid state film with thickness of 360 nm. The film may then be treated in a mixture of 20% butylamine in acetonitrile over two days. Following this solid-phase ligand exchange, the film may exhibit conductivity with dark current density 600 $\mu A\ cm^{-2}$ at applied field of 20 $V\ \mu m^{-1}$ (shown FIG. 3*n*). Untreated samples or samples treated with acetonitrile alone may not exhibit measurable conductivity.

Quantum dots may, for example, be synthesized to provide a typical absorption maximum of approximately 730 nm. The fabrication may be carried out as a batch process. These nanomaterials may be soluble in organic solvents such as chloroform, toluene or tetrahydrofuran. The synthesis may be divided into steps. The first two steps require the use of an inert atmosphere by using a Schlenk technique and N2 glove box. One step involves preparation of Pb precursor, such as Pb oleate dissolved in a mixture of 1-octadecene and oleic acid. Another step involves preparation of S precursor, such as Bis(trimethylsilyl)sulfide dissolved in 1-octadecene. A further step includes fast injection of (2.) into (1.) to form PbS QD in a single event. When the Pb precursor has reached a temperature well above room temperature, the S precursor is entirely injected within a few seconds through the septum. The solution turns from a colourless to a dark orange/black solution. A further step includes purification and storage. The reaction solution is poured into the acetone; a brown suspension with black precipitate is formed, leaving a black residue on the bottom of the flask. The entire beaker content is centrifuged. After centrifugation the clear/light brown supernatant is removed. Chloroform is used to bring the remaining precipitate into solution. A Vortex mixer helps to completely dissolve the nanomaterials into chloroform. In order to wash the nanoparticles and remove unwanted by products, the chloroform solution is brought into a beaker with fresh acetone (four fold volume of the chloroform/QD solution). A brown suspension with dark brown precipitate is formed. A final centrifugation step is carried out, and the clear supernatant is separated from the dark brown residue. The remaining nanomaterials are dried for several hours in vacuum.

In many embodiments, the QDs are fabricated using known techniques, but in substantially inert, anhydrous environments, e.g., environments that are substantially free of water and oxygen. Syntheses may be performed using Schlenk line methods in which ambient gases such as oxygen and water in the air are excluded from the system, and the syntheses are instead performed in the presence of substantially inert gases such as nitrogen and/or argon, or in a vacuum.

Quantum dot 1200 synthesis may be affected by a number of factors. Temperature may affect quantum dot 1200 synthesis. For example, the temperature of the synthetic materials may be modified by placement in an ice bath. The temperature may also be modified by placing the solution into a cooling tube with an evacuated flask on one end and a blocker with pressure on one side that pushes the solution through. The solvent type may affect quantum dot 1200 synthesis, such as for example, a hydrous solvent versus an anhydrous solvent. After synthesis, the quantum dots 1200 may be precipitated (through the additional of methanol, acetonitrile, ethyl acetate, isopropanol, propanol), and centrifuged. The supernatant may be decanted and excess precipitating-nonsolvent (listed in previous sentence)may be evaporated or otherwise removed.

Means of realizing solid-state devices using colloidal quantum dots such as those described above is now discussed. Solution-phase-dispersed colloidal quantum dots provided through syntheses described herein may be formed into photodetectors using processes such as the following. A solution-phase exchange is carried out to replace as-synthesized ligands (such as oleic acid) with shorter ligands (such as ethanethiol, butanethiol, hexanethiol, dodecanethiol, or combinations thereof). This may aid in achieving efficient transport of charge carriers in the optically sensitive layer and thus in providing for useful levels of photoconductive gain. A film may be produced by spin-coating quantum dots from solution onto a substrate, such as a silicon integrated circuit. The film may be further treated such as through exposure to short ligands in solution (such as ethanethiol, propanethiol) and/or through exposure to linkers (such as ethanedithiol, butanedithiol, hexanedithiol).

In an embodiment, quantum dots 1200 may be post-synthetically processed. Post-synthetic processing may involve precipitation and redispersion. Post-synthetic processing may involve drying the quantum dots 1200 which may have been previously soaking, redispersing them in a solvent, filtering the solution, concentrating the solution, then spinning the solution or depositing the quantum dots 1200 in another manner as described herein. This process may result in a concentration of a particular size of quantum dots 1200. Redispersion may involve soaking the precipitated quantum dots 1200 in a solvent, such as butyl amine, toluene, and the like to provide for ligand exchange, as described below. Non-toluene soaks may provide faster redispersion. After ligand exchange, the quantum dots 1200 may need to be re-precipitated and redispersed into a solvent such as chloroform. To prepare the quantum dots 1200 for spinning, they may need to be dried, re-filtered, re-dispersed, and concentrated down. The quantum dots 1200 may need to mature for a time period, such as in the range of five days.

In an embodiment, there may be additional quantum dot 1200 post-synthetic solution-based treatments.

Referring to FIG. 2*a*, the synthesized quantum dot 1200 may include attached ligands 1225. As shown in FIG. 2*a*, attachment of the ligand to the quantum dot 1200 may be through a ligand functional group 1250. Referring to FIG. 2*b*, vials containing variations of quantum dots are shown. The variations result in differences in radiation emission, as depicted in FIG. 2*d* for visible light. Referring to FIG. 2*c*, an SEM image of a single quantum dot 1200 and an array of quantum dots 1200 is shown.

In some embodiments, the QDs include any one or combination of PbS, InAs, InP, PbSe, CdS, CdSe, ternary semiconductors, and a core-shell type semiconductors in which the shell is one type of semiconductor and the core is another type of semiconductor. For example, the ternary QDs may be $In_xGa_{1-x}As$ nanocrystals or (Cd—Hg)Te nanocrystals. For example, the core-shell quantum dot nanocrystals may be ZnSe(PbS), ZnS(CdSe), ZnSe(CdS), PbO(PbS), or $PbSO_4$ (PbS).

In embodiments, before depositing the QD precursor layer on the integrated circuit or substrate, the QDs are ligand exchanged to substitute the as-fabricated ligands with pre-selected ligands, e.g., ligands that are considerably shorter than the as-fabricated ligands. The pre-selected ligands are selected to be sufficiently short to enable closer packing of the QDs in the precursor layer. Closer packing allows the QDs to fuse together in a subsequent step, thereby greatly increasing the electrical conductivity between the QDs. The pre-selected ligands may also be selected to be relatively volatile, so that they can be vaporized during a subsequent step to provide a film consisting mainly of QDs and being substantially free of ligands. This allows the QDs to get much closer to each other, which may enhance the conductivity in the final device. For example, the QDs may be fabricated with a first set of ligands with carbon chains that are more than 10 carbons long; the first set of ligands is then substituted with a second set of ligands with carbon chains that are between 1-10 carbons long. In some circumstances, the ligands of the second set of ligands are less than about 1 nm long. This can bring the QDs closer, e.g., more than 50% closer, more than 75% closer, or even more than 90% closer, than they could get before ligand exchange. The second set of ligands may generally have an affinity for attachment to the QDs that is at least competitive with the affinity of the first set of ligands to attach to the QDs, otherwise the first set of ligands may not sufficiently exchange with the first set of ligands. The second set of ligands may also generally have an affinity for attachment to the QDs which allows them to be removed during a later step. This affinity is related to the end functional group on the ligand, which is illustrated in FIG. 2*a*. Amines, thiols, carboxylates, and sulfones, among other end functional groups, many of which will have free electron pairs, are generally suitable for use in the second (pre-selected) set of ligands.

In embodiments, the ligand exchange involves precipitating the as-synthesized QDs from their original solution, washing, and redispersing in a liquid that will dissolve and thus dissociate the original ligands from the outer surfaces of the QDs, and which either is or contains the ligands to be substituted onto the QDs. In some embodiments the liquid is or includes primary, secondary, or tertiary-butylamine, pyridine, allylamine, methylamine, ethylamine, propylamine, octylamine, or pyrrolidine or a combination of these organic solvents, which substitute the ligands previously on the QDs. In other embodiments, the liquid is or includes pyridine, which substitutes the ligands previously on the QDs. Leaving the QDs in this liquid for between 24 and 120 hours either at room temperature or at an elevated temperature is generally sufficient for ligand exchange, although in some circumstances longer or shorter times will be sufficient. In an illustrative example, the ligand exchange process was performed under an inert atmosphere to prevent the QDs from oxidation. QDs having oleate ligands and dissolved in methanol were precipitated, dried, and redispersed in n-butylamine at a concentration of 100 mg/ml (nanocrystals by weight/butylamine by volume). The solution was left for 3 days under inert conditions. The oleate ligands had a length of about 2.5 nm, and the exchanged butylamine ligands had a length of about 0.6 nm, bringing the QDs to about 25% of their original distance from each other.

In embodiments, two or more types of QDs are separately fabricated in coordinating solvents. Each kind of QD is then precipitated, washed, and dispersed in a liquid that is or contains the ligands to be substituted onto the QDs. This exchanges the ligands on the two or more types of QDs as discussed above. Then the two types of QDs are mixed in solution to create a heterogeneous QD mixture, which is spin-cast or otherwise deposited as thin films on a substrate to form a heterogeneous QD precursor layer. The order in the heterogeneous QD precursor layer is controlled through separate selection of QD size and ligand for each type of QD and additional treatment with solvents and heating.

Examples of ligands include amine-terminated ligands, carboxyl-terminated ligands, phosphine-terminated ligands and polymeric ligands. The amine-terminated ligands may include any one or combination of pyridine, allylamine, methylamine, ethylamine, propylamine, butylamine, octylamine, and pyrrolidine. The carboxyl-terminated ligands may include any one or combination of oleic acid, stearic, capric and caproic acid. The phosphine-terminated ligands may include guanosine triphosphate. The ligand may be one or more of DNA, an oligonucleotide, a polymer such as polythiophene or MEH-PPV, or an oligomer such as oligothiophene. As mentioned above, it can be useful to substitute short and volatile ligands, e.g., pyridine, allylamine, methylamine, ethylamine, propylamine, butylamine, octylamine, or pyrrolidine, onto the QDs so that the QDs can be brought into closer proximity in later steps.

After the QDs are fabricated and ligand-exchanged, e.g., as described above, they may be deposited onto a substrate such as an integrated circuit. This forms a "QD precursor layer," which may be subsequently processed to form a finished QD layer for use in a device. Both the QD precursor layer and finished QD layer may be used interchanagbly with the term quantum dot materials 200. In an embodiment, quantum dot materials may exhibit one or more of uniformity, ease of integration, low cost, stackability, monolithic integrability, photoconductive photovoltaic gain, temperature invariance, low noise, high sensitivity, high dynamic range, mix and match capabilities, customizability of sensors, spectral extensibility, and the like. Quantum dots may be processed to form quantum dot materials. Quantum dots may be processed to form a quantum dot solution. Processing may involve a number of factors, such as temperature, time, reagents, agitation, atmospheric makeup and pressure, and the like. The quantum dots may be colloidal. The quantum dot materials may comprise a film. The film may be formed by one or more of spin coating, puddle casting, electrodeposition, vapor deposition, air brush spraying, growth from solution, hydrophobic systems, acceleration/evaporation in gas phase, photocopying, ink jet printing, and the like. The film may be patterned. The film may be continuous or discontinuous. The film may be monolithic or multi-layered. The film may be of a particular thickness. The film may crack or not crack. The film may undergo post-film formation treatment. The film may undergo quantum dot materials processing. The film may be post-processed. The film may be encapsulated.

The QD precursor layer may be formed by solution-depositing it directly on the surface of a read-out integrated circuit or other substrate, for example using spray-coating, dip-casting, drop-casting, evaporating, or blade-casting. Another method of depositing the QD precursor layer is spin coating the QD precursor layer, which once spin-coated onto the surface may be further processed to form the optically sensitive QD layer as described below. In many embodiments, the QD layer has a thickness selected to absorb most or even substantially all of the radiation 1000 incident on it, in the wavelength region the device is intended to operate in. Typically this thickness will range between about 50 nm and 2 μm, though thinner or thicker films can be used according to the desired functionality of the device. Spin-coating can allow the process of covering circuitry with a QD layer to be performed at lower temperatures without vacuum processing and alignment and bonding issues. In an embodiment, quantum dot materials may be processed to form a film by spin coating. Quantum dot materials may be spin-coated onto a substrate to form a film.

Means of measuring the response of optically sensitive layers to light, and of characterizing thereby the transduction of optical signals into the electronic domain, are now discussed. The responsivity may be measured using a variety of methods. For a first method of measuring responsivity, 2 mm radius beam from a 975 nm laser may be incident, first through a series of optical attenuators of known transmittance, and through a glass substrate, onto the device from the backside. On the top surface, infrared-opaque interdigitated gold electrodes may be separated by 5 μm over a 3 mm path length. The optical power incident on the device may be obtained by integrating the intensity profile of the laser over the unobstructed area of the device. Current-voltage characteristics may be acquired using an Agilent 4155 semiconductor parameter analyzer. The responsivity at different frequencies may be measured by electrical modulation of the laser. In a second method of measuring responsivity, bias may be applied to the sample connected in series with a 2 Mohm load resistor. Illumination may be provided by a white light source (ScienceTech Inc. TH-2) dispersed by a Triax 320 monochromator and mechanically chopped at the frequency of interest. Optical filters may be used to prevent grating overtones from illuminating the sample. The voltage across the load resistor may be measured using a Stanford Research Systems SR830 lock-in amplifier. The intensity transmitted through the monochromator at each wavelength may be measured separately using calibrated Ophir PD-300 Si and Ge photodetectors to cover the range from 400-1600 nm. The optical power impinging on the active area of the detector may be taken by dividing the active area of the device by the collimated beam area and multiplied by the total power measured with the calibrated detectors. The photocurrent at each wavelength may be subsequently scaled according to this system calibration. The same setup may enable measurement of spectral responsivity by using a variable attenuator programmed to fix the optical power at each wavelength. The recorded photocurrent vs. wavelength may yield the spectral responsivity. The results of the two aforementioned techniques may generally agree to within less than 10%.

Dark current noise in the photodetector 1400 may be measured using a Stanford Research SR830 lock-in amplifier. The devices may be biased using batteries, and testing carried out in an electrically-shielded and optically-sealed probe station, on a floating table to minimize vibrational noise. The reported noise current, normalized to the measurement bandwidth, divided by the responsivity under the same measurement conditions may yield the noise equivalent power (NEP). The normalized detectivity D* may be obtained as a function of wavelength, applied bias, and center frequency by dividing the square root of the optically active area of the device by the NEP.

The same setup as used in spectral responsivity measurement, described above, may be employed. The wavelength may be fixed at 830 nm and a variable attenuator combined with neutral density filters may be used to vary the light intensity from pW up to 4 μW. For higher intensities, a semiconductor laser at 830 nm may be employed to provide optical powers up to 10 mW.

Having described the methods used to obtain and characterize this embodiment of the photodetector, certain findings relating to the photodetector will now be described. This embodiment of the photodetector exhibits the simultaneous attainment of sensitivity, gain, tenability, and wide dynamic range in a visible-wavelength-sensitive spin-cast photodetector. An optimally-processed photodetector may provide D* of $10^{13}$ Jones across the entire visible spectrum, compared with silicon photodiodes' ~2 $10^{12}$ Jones at 970 nm and even lower in the visible. The photodetector may exhibit photoconductive gains exceeding 100 A/W. Photoconductive gains may lie between 1 and 100.

The photodetectors may be characterized for dark current, responsivity, and noise current as described in detail above. FIG. 3$j$ shows the optoelectronic performance of the photodetectors. FIG. 3$j$(a) exhibits spectral responsivity and normalized detectivity. The photoconductive gain may reach a maximum at wavelength 400 nm of ~113 A $W^{-1}$ at 15 Hz. For comparison, silicon photodetectors exhibit a maximum responsivity at ~970 nm which may drop in the visible. The quantum dot photodetector 1400 may have an increasing responsivity at shorter wavelengths and optimal response in the visible spectrum. With respect to sensitivity, FIG. 3$j$(a) shows a direct comparison between a typical silicon photodetector (as in Electro Optics Technology, biased silicon detector model ET-2000, http://www.eotech.com/store/products.php?categoryParentName=Photodetectors&categoryName=Biased+Silicon+Detectors) of area similar to the solution-processed thin-film photodetector of this embodiment. Across the entire visible spectra range, the quantum dot photodetector may exhibit at least an order of magnitude better noise-equivalent power (NEP) than its crystalline silicon counterpart.

The measured noise current spectrum for the photodetector of the embodiment is shown in the inset of FIG. 3$j$(b). At low frequencies noise current density may follow closely the responsivity curve, suggesting that the carrier traps responsible for high-gain may also contribute to noise, while at higher frequencies, white noise may dominate. The Johnson noise of the detector may be estimated by $(4kTB/R)^{1/2}$ to be ~0.9 fA $Hz^{-1/2}$ whereas the shot noise limit $(2qI_dB)^{1/2}$ is found 0.04 pA $Hz^{-1/2}$ where k is Boltzman's constant, T the temperature, R the resistance of the detector in dark, B the noise bandwidth, q the electron charge and $I_d$ the dark current. The photodetector 1400 of the embodiment may approach the shot noise limit to within 3-dB at 80 Hz.

The quantum dot photodetector 1400 may exhibit sensitivity superior to silicon well beyond 50 Hz, as shown in FIG. 3$j$(c), where D* is plotted as function of frequency (the inset also shows the NEP versus the modulation frequency). At low frequencies (<5 Hz) the detector may exhibit D* ~$10^{13}$ Jones.

The trap states responsible for photoconductive gain may be characterized. In FIG. 3$k$(a), the measured responsivity as a function of modulation frequency for a number of different optical power levels incident on the device is shown. The responsivity of the detector may decrease as the optical power may be increased. This may be attributed to filling of the lowest-lying, longest-lived trap states that provide the highest photoconductive gain at low intensities. This may be confirmed by the fact that, at high intensities, the 3 dB bandwidth may extend to higher electrical frequencies.

In order to characterize the impact of high-gain trap state filling on the dynamic range of the solution processed detector, the dependence of photocurrent on optical intensity at a modulation frequency of 30 Hz may be measured. A monotonic, though at high intensities sublinear, dependence of photocurrent on intensity over more than 7.5 orders of magnitude in incident intensity corresponding to over 75 dB of intensity dynamic range may be observed (FIG. 3$k$(b)). The inset of FIG. 3$k$(b) shows the onset of responsivity decrease due to the filling of the high gain trap states at higher intensities that may be responsible for gain compression.

Figure 4:
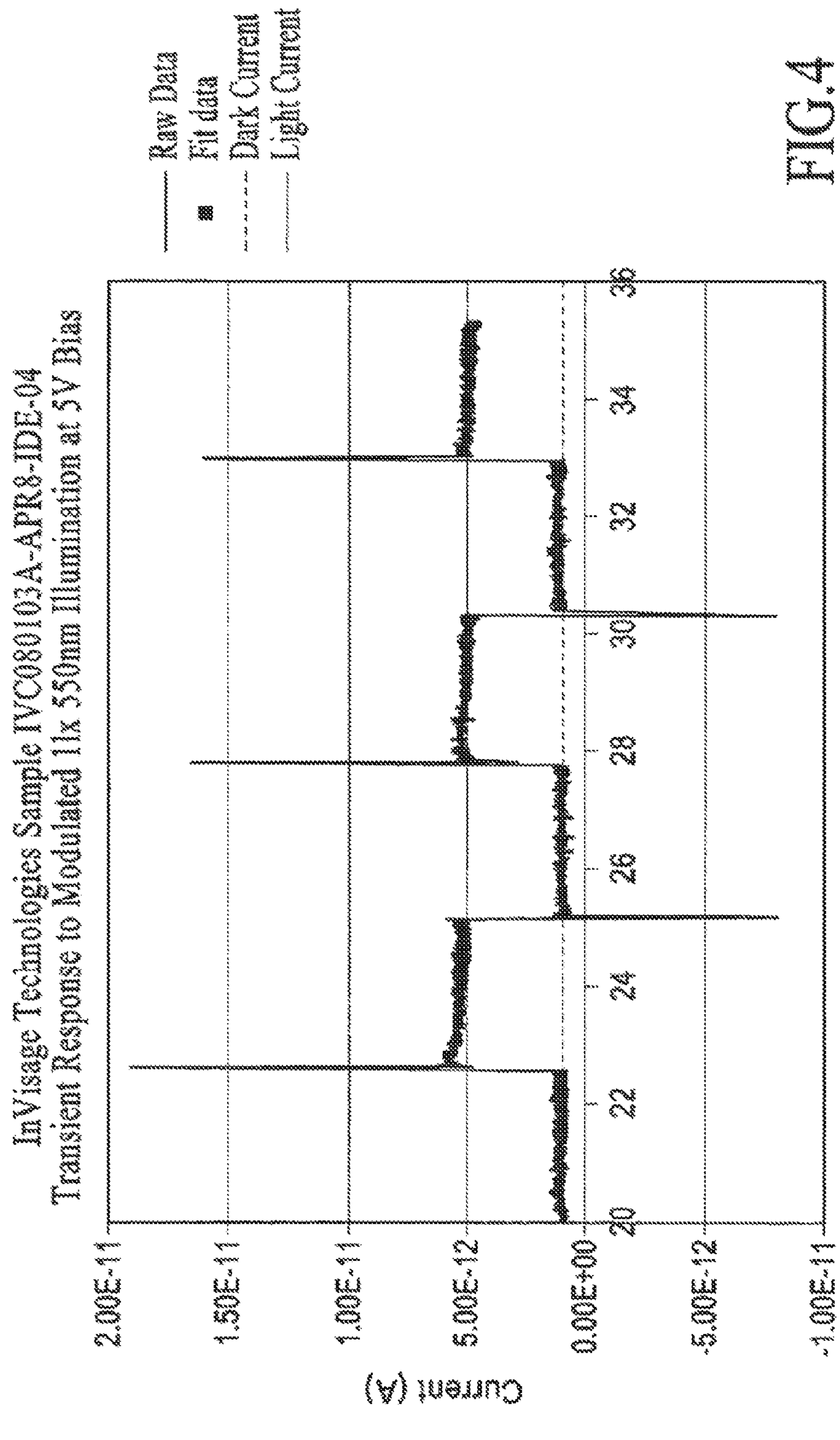
FIG. 4 is a diagram illustrating a transient response to modulated illumination at a 5V bias.

In embodiments, photodetectors having transient responses compatible with video applications are desired. Optically sensitive layers providing video-compatible temporal responses, or lags, or persistence times, are now discussed. With reference to FIG. 4, a transient response to modulated 11×550 nm illumination at a 5V bias is shown. The measurements are made on colloidal quantum dot films that have been spin-cast and treated using the methods described herein onto planar electrode pairs. These consist of gold or other metal linear that run parallel over a length such as 0.5 millimeters, 1 millimeter, or 3 millimeters. The electrodes are separated by a constant 2.5 um or 5 um gap along their entire parallel length. Measurements are taken with a bias of 1V, 5 V, or 10 V applied across the adjacent Au electrodes. In studies of photoresponse, the illumination source is typically a green light-emitting diode with a spectral emission peak near 550 nm. Square-wave modulation is provided varying from 0 lux (dark) to 1 lux. This illumination level is measured at the position of incidence onto the test pixel sample. The illumination is calibrated using a Newport Optical Power meter. Current measurements are made using Keithley model 6485 PicoAmmeters. LED and sample biases are applied using Keithley model 2400 SourceMeters. Measurements performed in a clean nitrogen atmosphere. In the figure, the current in one such device is shown as a function of time. During the period ~22.4 seconds to 25.3 seconds, for example, the illumination source is turned on at the 1 lux level. Thus the current flowing during this interval represents the sum of dark current+photocurrent at 1 lux, where the latter component may also be thought of as equal to the responsivity (in A/W) times the optical power received over the active area (optical power measured in Watts). Typical responsivities range from 0.4 A/W to 10 A/W. During the period 20 to 22.4 seconds, for example, the illumination is turned off. The current flowing in this interval thus represents the dark current. Typical values on these test structures correspond to 0.1 pA to 3 pA. In view of the aspect ratios of these samples, dark currents correspond to 1E-8 to 2E-6 A/cm2. Spikes at 22.4 seconds, 25.3 seconds, etc. are not properties of the photodetector but result from electrical transients relating to surrounding electronics and biasing circuitry and can be neglected for the purposes of the present discussion. The rise and fall of the photocurrent, ignoring these spikes, are of interest. In photoconductive devices, the value of the current following a turn-off transient in illumination, will only turn off and reach the dark-current value only after some persistence time. In certain photoconductive devices having undesirably long-lived trap states, this persistence time may be 0.1 seconds, or 0.5 seconds, or 1 second, or longer. Such persistence times result in ghosting or lag artifacts in both still images and video. The devices realized herein are photoconductive and possess photoconductive gain; however, their persistence times are of order 20-40 milliseconds, such that on the typical imaging timescale, the effects of this persistence are not manifest. Thus the advantages of photoconductive gain are obtained, but the downside of lag is avoided.

Colloidal quantum dots provide a ready means of discriminating among different spectral bands through quantum-size-effect tuning. The findings described herein relating to the photodetector 1400 of the embodiment illustrate sensitivity, dynamic range, and gain all better than typical crystalline silicon photodiodes. A simple two-color device may be produced by stacking a small-quantum-dot 1200, larger-bandgap photodetector 1400 atop a large-dot, small-bandgap (exciton peak at 1230 nm) device as illustrated in the inset of FIG. 3$l$. The main body of FIG. 3$l$ illustrates the measured spectral responsivity of each detector in the stack. The spectral responsivity of the small-bandgap detector prior to stacking is also shown to demonstrate the achieved suppression of responsivity in the visible by over 10-dB at 400 nm. Thus, the value of quantum size-effect tenability inherent to colloidal quantum dots 1200 may be depicted in FIG. 3$l$.

Means of forming optically sensitive layers, including on integrated circuits capable of providing photodetector readout, are now discussed. In an embodiment, quantum dot materials 200 may be processed to form a film by puddle casting. Puddle casting may comprise depositing a metered amount of quantum dot materials 200 onto a substrate and allowing solution to evaporate. The resultant films may or may not crack.

In an embodiment, quantum dot materials 200 may be processed to form a film by electrodeposition. Electrodeposition may involve vacuum and quantum dots 1200. Electrodeposition may be similar to xerography. An electropowder coating may be used to charge the quantum dots 1200. The assembly of electropowder and quantum dots 1200 may then be placed in a system that is similar to a photocopier. The electropowder coating may provide accelerating potential without the carrier gas. Electrodeposition may involve applying a voltage across an electrode controlled by a circuit. The circuit may be able to sense using deposited quantum dot materials 200. Electrodeposition may result in a detector and feedback within itself as quantum dot pixel 1800 growth proceeds. The available photocurrent for electroplating may decrease as photocurrent from the nascent and growing quantum dot pixel 1800 increases.

In an embodiment, quantum dot materials 200 may be processed to form a film by vapor deposition.

In an embodiment, quantum dot materials 200 may be processed to form a film by air brush spraying. Air brush spraying may involve processing from gas. Air brush spraying may involve entrainment in a solvent.

In an embodiment, quantum dot materials 200 may be processed to form a film by growth from solution. Growth from solution of a film may involve cross-linking Crosslinkers may be attached to at least a portion of a substrate to crosslink quantum dots 1200. When the substrate with attached crosslinker is dipped into a quantum dot solution 400, the quantum dots 1200 may become crosslinked and grow at locations on the substrate where crosslinker was attached in a process that may be similar to seeded crystal growth. Since growth occurs at locations where crosslinker has been attached, patterned film formation on a substrate may be achieved by depositing crosslinker along the substrate in a pattern. For example and without limitation, a dithiol may be used as a crosslinker. The two thiol heads of the molecule may be attached to two different quantum dot 1200 surfaces and therefore yield a mobility increase. This crosslinking process may provide photodetection with photoconductive photovoltaic gains on the order of, such as and without limitation, tens A/W and detectivity on the order of, such as and without limitation $10^{12}$ Jones. There may be a significant improvement in persisting photocurrent which may enable high performance video imaging at frame rates up to 60 Hz.

In an embodiment, quantum dot materials 200 may be processed to form a film by a hydrophobic system. The hydrophobic system may enable depositing a monolayer film of quantum dots. The monolayer film may be deposited in a pattern.

In an embodiment, quantum dot materials 200 may be processed to form a film by acceleration or evaporation in a gas phase.

In an embodiment, quantum dot materials 200 may be processed to form a film by a photocopying method.

In an embodiment, quantum dot materials 200 may be processed to form a film by an ink jet printing method.

Ligand exchange during film formation may apply to any film formation method described herein. Ligand exchange may enable improved film formation and improved packing of quantum dots. The duration of ligand exchange may alter the films wavelength absorbance characteristics. In an embodiment, ligand exchange may involve exchanging long, insulating ligands capping the quantum dot for short ligands, which may enable the formation of conductive quantum dot materials and highly sensitive radiation photodetectors. Ligand exchange may occur in the solid state. Films may first be formed by solution-processing, as described herein. A new ligand, such as and without limitation benzenedithiol or methanethiol, may be dispersed in a solvent, such as and without limitation acetonitrile, methanol, or toluene. The sample containing the film may be placed in the ligand-containing solvent. The ligand may be chosen to have an end functional group that competes effectively with that of the existing ligand. For example, thiols may bind more strongly than carboxylic group binding, such as and without limitation oleic acid, or amine binding, such as and without limitation butylamine. For example and without limitation, a spincoated film may be driven into an inert atmosphere or kept at ambient conditions where it may be dipped into a bath of a mixture of acetonitrile (MeCN) and ethanethiol (ET), ethanedithiol (EDT) or benzenedithiol (BDT). Acetonitrile may be used as a solvent for the new ligand, ET, EDT, or BDT, to replace oleic acid while it acts as a non-solvent for the quantum dot material film impeding dissolution. The ratio of MeCN:ET, EDT or EDT may vary, such as and without limitation, from 1%-10%. The duration of the bath may range from 10 minutes to one hour. After the bath, the film may be isolated, washed with MeCN to remove excess ET, EDT, or BDT and any remaining oleic acid, and may be dried under vacuum.

In an embodiment, ligand exchange may occur in parallel with film formation. First, the substrate on which the film is to be formed may be immersed in a liquid that may include a ligand which may later replace the ligand initially on the quantum dots. The substrate may be removed, and a coating of the new ligand may remain on the sample. Films may then be formed through dip-coating, wherein the sample on which the film is to be deposited may be immersed in a solvent in which the quantum dots 1200 are suspended. During this process, the ligand added in the first step serves to cause the quantum dots 1200 to aggregate, in controlled fashion, onto the sample surface. This method of parallel ligand exchange and film formation may ensure that no dramatic change in the volume of an already-formed film be imparted. Such a dramatic change may lead to film cracking. The present method may ensure the formation of smooth, crack-free films by parallelizing deposition and exchange.

In an embodiment, quantum dot materials may be processed to form a film by bridging quantum dots 1200 irreversibly during the layer growth from the solution phase. Quantum dots may be linked together to form a continuous film through the use of bi-dentate ligands. These linker molecules may bind to one quantum dot with one end while the other end binds with another quantum dot, thus producing a chain of quantum dots that may prevent shorting of the device. Possible bidentate ligands may include dithiols, diamines, dicarboxylic acids, combinations thereof, such as ethanedithiol, thioglycolic acid, and the like. Although the end members of the bi-dentating ligand should have a binding ability, the rest of the molecule may be of different lengths and functionality. Short molecules may be preferred as it may enable electrical communication between quantum dots that is not hindered by the linker molecule. Linker molecules may be introduced to a quantum dot pixel chip (QPDC) 100 through various means. For example and without limitation, a QPDC 100 may be placed into an organic solvent containing the linker molecule at a variety of concentrations, such as in a range from 0.1 to 10%, 1%, and the like. After treating the QPDC 100 for a time frame, such as from 5-60 minutes, the QPDC 100 may then have quantum dots 1200 introduced via methods as described herein, such as dip, spray, spin, and the like. The quantum dots 1200 may then bind to the linker and after a subsequent treatment in linker, the quantum dot 1200 may crosslink to other quantum dots 1200. Another quantum dot 1200 deposition may be performed to increase the concentration of quantum dots 1200 within the QPDC 100. This quantum dot 1200 crosslinking strategy may produce a continuous overlayer coverage of quantum dots 1200 on either a smooth or rough electrode surface.

Absorption spectra of lead sulphide QD nanocrystals as the ligands are exchanged from oleic acid to primary butylamine may reveal a shift to the blue with increasing exchange time. TEM images exhibit the dramatic decrease of inter-QD spacing following ligand exchange and nonsolvent treatment. When the shift is less than that associated with the removal of a monolayer of Pb atoms (roughly 170 nm), the size distribution remains roughly constant. After this point the polydispersity increases.

The QDs were precipitated, washed using a nonsolvent, redispersed in $CHCl_3$, and treated again using a nonsolvent ("nonsolvent" refers to a material that is not a solvent for the nanocrystals, but that may be a solvent for the ligands). As-grown (untreated) QD nanocrystals show well-ordered patterns with interdot spacing determined by ligand length. Exchanged and washed QDs exhibit a drastic reduction in interdot spacing and preferential formation of clusters instead of well-ordered arrays. Prior to treatment, the nanocrystal films can be redispersed using organic solvents, while after treatment, nanocrystal films can no longer be readily redispersed.

The combination of ligand exchange, nonsolvent treatment, and thermal processing at temperatures such as up to about 150° C. (typically) and potentially as high as 450° C., removes at least a portion of the QDs' ligands, and enables the QDs to fuse, providing mechanically robust films with vastly increased electrical conductivity, as reported below.

An exemplary photoconductive photovoltaic detector was made using a single layer of PbS QD nanocrystals spin-cast directly from a chloroform solution onto an interdigitated electrode array. The device structure is illustrated in FIG. 7A, and is analogous to the basic device of FIG. 4B. The parallel gold electrodes are supported by a glass substrate and have a height, width, and separation of 100 nm, 3 mm, 5 μm, respectively. The thickness of the QD layer was controlled through the concentration of the chloroform-QD solution and the spin-casting parameters. In studies carried out by the inventors the thickness ranged from 100 nm up to 500 nm.

The treatment of the surfaces of the QDs was an important determinant of photodetector performance. Devices made directly from QDs capped with oleic acid, as synthesized through an organometallic route, did not exhibit any measurable conductance, as the 2 nm-long oleate ligand inhibits carrier transport among QDs. A post-synthesis ligand exchange was therefore used to replace the as-synthesized oleate ligands with much shorter butylamine ligands. To this end, the QDs were redispersed in butylamine for a period of three days. Butylamine is a four-carbon-atom chain with an amine head as the functional group to attach to the QD surface. The ligand exchange was monitored for blue shift in QD absorption resulting from a decrease in QD effective diameter as ligands remove Pb atoms during exchange The absorbance spectra of QD nanocrystals before ligand exchange (oleate-capped), after ligand exchange (butylamine-capped), and following soaking in methanol for 2 hours to remove the butylamine ligands, may be compared. The progressive blueshift across these treatments is consistent with surface modification following exchange and partial surface oxidation (also confirmed by XPS and FTIR). TEM micrographs of the nanocrystals before and after ligand exchange indicate a reduction in inter-particle distance is attributed to the replacement of the oleic acid ligands with butylamine ligands.

FTIR spectra of the neat solvent n-butylamine, the neat solvent chloroform, and n-butylamine-exchanged QDs dispersed in chloroform may be obtained. N-H stretching and bending vibrations are tabulated to lie between 3200-3600 $cm^{-1}$ and 1450-1650 $cm^{-1}$ respectively. Carbonyl stretching vibration of pure oleic acid is tabulated to be found at 1712 $cm^{-1}$. FTIR measurements indicate that oleate ligands originally attached to the PbS QDs have been replaced by n-butylamine, indicated by the absence of carbonyl stretching vibration, a significant shift of the N-H stretching vibrations after exchange from 3294 and 3367 $cm^{-1}$ ($\Delta$=73 $cm^{-1}$) for n-butylamine to 3610 and 3683 cm−1 ($\Delta$=73 $cm^{-1}$), and the presence of N-H bending vibrations for the n-butylamine exchanged sample.

FTIR spectra may be obtained for inert-exchanged ligand-exchanged QDs with butylamine ligands before and after methanol wash, which substantially removes the ligands from the QDs. Following methanol wash, features attributable to butylamine (1400, 1126, 989, 837, and 530 $cm^{-1}$) are much less pronounced. N-H stretching vibrations are again much less pronounced following methanol wash.

Spectra obtained by X-ray photoelectron spectroscopy (XPS) may be taken to confirm the material modifications that occur to the PbS QDs throughout various processing steps. After background subtraction, the binding energy was reference to the C1*s* hydrocarbon line at 285.0 eV. The curves were fitted by applying Gaussian-Lorenzian functions and the atomic ratios were obtained by integrating the areas under the signals. The nanocrystals immediately after exchange to butylamine ligands demonstrate a S2−peak at 160.7 eV corresponding to lead sulfide. No lead sulfate ($PbSO_4$) signal was detected. Nanocrystals that were precipitated in air exhibit an $SO_4^{-2}$ at 167.5 eV characteristic of $PbSO_4$ formation. This oxide may be associated with the role of barrier to conduction among nanocrystals. The ratio of PbS/$PbSO_4$ for this case was found to be about 3.4:1. XPS of the inert-precipitated QDs after methanol soaking exhibits also formation of lead sulfate. The PbS/$PbSO_4$ ratio in this case was 18.6:1. Further annealing of this film in air at 120° C. for 1 hour dramatically increased the amount of sulfate and the PbS/$PbSO_4$ ratio was 2.44:1.

FTIR spectra may be taken of ligand-exchanged QDs precipitated in inert conditions (butylamine-called QDs) and precipitated in air-ambient conditions (oxidize-then-neck QDs). The inert-precipitated exchanged QD layer after 2 hours of methanol wash (neck-then-oxidize QDs) may be compared. The broad feature around 1147 $cm^{-1}$ is attributed to $PbSO_4$ (lead sulfate). Spectra show that ligand-exchanged QDs precipitated in inert conditions do not show this feature; methanol wash introduces some oxidation; ligand-exchanged QDs precipitated under an air ambient show evidence of strong oxidation. These results agree with the XPS data above.

Some performance characteristics of various representative devices having different kinds of QD nanocrystal layers (e.g., neck-then-oxidize, oxidize-then-neck, butylamine-capped, and neck-then-overoxidize) were measured. The general device structure is generally similar to that of FIG. 7*e*. The device included a transparent glass substrate; two gold electrodes having a length of about 3 μm, a width of about 5 μm, and being spaced from each other by about 5 μm; and a QD nanocrystal of variable thickness between the electrodes.

Photoconduction was studied with the aid of optical excitation through the glass substrate, with excitation radiation 1000 being transmitted through the space separating interdigitated electrodes, i.e., where the QD layer was formed. The current-voltage characteristics for two different QD nanocrystal layer thickness were acquired, specifically the I-V characteristic for a "thin" 100 nm and a "thick" 500 nm QD nanocrystal layer devices. Photocurrents and dark currents respond linearly to applied bias. The responsivity of the thick device reached 166 A/W. The linear I-V characteristic indicates an ohmic electrode-nanocrystal contact and suggests not a tunneling but a strong, direct conductive connection between QD nanocrystals. Photocurrent in the thick device is significantly higher than the photocurrent of the thin device by virtue of greater absorbance in the thick device.

In order to determine optical power incident over the detector area and to calculate the responsivity R, a 2 mm radius beam from a 975 nm laser was incident, first through a series of optical attenuators of known transmittance, and thence through the glass substrate, onto the device from the back side. On the top surface, infrared-opaque interdigitated gold electrodes were separated by 5 μm over a 3 mm path length. The optical power incident on the device was obtained by integrating the intensity profile of the laser over the unobstructed area of the device. Current-voltage characteristics were acquired using an Agilent 4155 semiconductor parameter analyzer. The optical power impinging on each device was about 80 pW.

The responsivity as a function of applied bias of devices made with different kinds of QD nanocrystal layers was acquired. Here, the nanocrystal layers were about 800 nm thick. The "neck-then-oxidize" QD device, corresponding to a device having a layer of fused QDs with defect states on their outer surfaces, can clearly be seen to have a significantly higher responsivity than the other devices. The "oxidize-then-neck" QD device, in which the ligands are removed from the QDs, and the QDs are fused, but in which the QDs are not maintained in an inert atmosphere between the steps of ligand removal and QD fusing, has defect states in the regions in which the QDs are joined that reduces their responsivity, as compared with the "neck-then-oxidize" device, in which the QDs are maintained in an inert atmosphere between the steps of ligand removal and QD fusing. All of the "necked" devices have a significantly higher responsivity than the device having butylamine capped QDs, in which the butylamine ligands block facile conduction of electrons between QDs.

In general, the responsivity of QD devices (particularly the "neck then oxidize" QD devices) as measured in A/W is at least about 10 A/W, 100 A/W, 1000 A/W, or even more than about 10000 A/W. The responsivity is a function in part of the bias voltage applied, with a greater responsivity at higher bias. In some embodiments, the QD devices (particularly the "neck then oxidize" QD devices provide a substantially linear responsivity over 0-10 V with a bias applied across a distance of 0.2 to 2 μm width or gap.

With respect to responsivity, "necked" devices have a significantly higher dark current density than the device having butylamine capped QDs. Devices made using QDs exposed to oxygen before necking ("oxidize-then-neck") show a superlinear I-V behavior characteristic of field-assisted transport. In contrast, devices made using QDs fused before oxidation ("neck-then-oxidize") exhibit linear (field-independent) behavior. Further oxidation of neck-then-oxidize devices ("neck-then-overoxidize) leads to a decrease of conductivity owing to excessive oxide formation.

Noise current was measured as a function of the measured dark current for the devices described. "Neck-then-oxidize" devices exhibited the lowest noise current, approaching within 3 dB the shot noise limit. "Oxidize-then-neck" devices had the highest noise current, consistent with multiplicative noise. "Neck-then-overoxidize" QD devices showed lower noise levels than the oxidize-then-neck QD devices although they contained larger amounts of oxide. This indicates the role of the oxidation step in the fabrication process. The Johnson noise limit, the shot-noise limit, and the fundamental background-limited thermodynamic (BLIP) noise current of the best-performing device (neck-then-oxidize) are also plotted for comparison.

Normalized detectivity D* was acquired as a function of applied bias. The normalized detectivity D* is measured in units of Jones ($cmHz^{1/2}W^{-1}$). D* is given as $(A\Delta f)^{1/2}R/I_n$, where A is the effective area of the detector in $cm^2$, Δf is the electrical bandwidth in Hz, and R is the responsivity in $AW^{-1}$ measured under the same conditions as the noise current $i_n$ in A. The material figure of merit D* allows comparison among devices of different powers and geometries. The device figure of merit, noise equivalent power (NEP)—the minimum impinging optical power that a detector can distinguish from noise—is related to D* by $NEP=(A\Delta f)^{1/2}/D^*$. The normalized detectivity D* is the highest for the "neck-then-oxidize" device, and the lowest for the "oxidize-then-neck" device. In other words, allowing the QDs to be exposed to oxygen after ligand removal and before necking or fusing significantly affects the normalized detectivity of the finished device. In the example devices shown, the normalized detectivity of the "neck-then-oxidize" device is more than an order of magnitude higher than that for the "oxidize-then-neck" device. The highest detectivity was found at a modulation frequency of 30 Hz, and reached $1.3\times10^{13}$ jones at 975 nm excitation wavelength. In embodiments, detectivity may reach $1.3\times10^{14}$ jones.

The spectra of responsivity and the normalized detectivity D* were obtained for the "neck-then-oxidize" device at an applied bias of 40 V and an electrical frequency of 10 Hz. D* was measured to be $1.8\times10^{13}$ jones at the excitonic peak wavelength. The 3-dB bandwidth of the detector is about ~18 Hz, consistent with the longest excited-state carrier lifetime in the device. High sensitivity ($D^*>10^{13}$ jones) is retained at imaging rates of about 30 frames per second.

The photocurrent temporal response following excitation of the QD layer of the "neck-then-oxidize" was obtained, where the excitation was a 7 ns pulse centered at 1064 nm, at a frequency of 15 Hz. This allows investigation of the transit time and distribution of carrier lifetimes in the device. The response of the detector to the optical pulse was found to persist over tens of milliseconds, attributable to the longest-lived population of trap states introduced by oxidation. The response exhibits multiple lifetime components that extend from microseconds (though shorter components may exist they are not observable in this measurement) to several milliseconds. Decay components were found at about 20 μs, about 200 μs, about 2 ms, about 7 ms, and about 70 ms. A transit time of about 500 ns was obtained for a bias of about 100 V, revealing that transit time depends linearly on bias with a slope corresponding to a mobility of about 0.1 $cm^2V^{-1}s^{-1}$. The ratio of the longest component of carrier lifetime to the transit time was thus on the order of about 10,000. The observed responsivity of about 2700 A/W in this example could thus be explained by photoconductive photovoltaic gain, given the films absorbance of 0.3 at an optical wavelength of 975 nm. This high responsivity was observed under low-level optical power conditions relevant to ultrasensitive detection. In general, in some embodiments, as illumination intensity was increased, the longest-lived trap states became filled, and shorter lived, so lower-gain trap states began to account for a significant component of carrier lifetime. The devices of these embodiments were thus highly sensitive under low-radiation 1000 conditions, and exhibit intrinsic dynamic-range-enhancing gain compression under increasing illumination intensity.

For determining the photocurrent spectral response, a bias of 50 V was applied to the sample connected in series with a 100 Ohm load resistor. Illumination was provided by a white light source dispersed by a Triax 320 monochromator and mechanically chopped at a frequency of ~100 Hz. Filters were used to prevent overtones of the monochromator's grating from illuminating the sample. The voltage across the load resistor was measured using a Stanford Research Systems SR830 lock-in amplifier. The intensity through the monochromator at each wavelength was measured separately using a calibrated Ge photodetector. The photocurrent at each wavelength was subsequently scaled accordingly. After the photocurrent spectral shape was determined in this way, the absolute responsivity at 975 nm was used to obtain the absolute spectral response 800 nm-1600 nm.

For measurement of noise current and calculation of NEP and D*, the photoconductive photovoltaic device was placed inside an electrically-shielded and optically-sealed probe station and connected in series with a Stanford Research SR830 lock-in amplifier. Alkaline batteries were used to bias the device for the measurement of the noise current in order to minimize noise components from the source. The lock-in amplifier measured the current in the photodetector and reported noise current in $A/Hz^{1/2}$. Special care was taken in choosing an appropriate passband in order to acquire stable and meaningful measurements of noise current at various frequencies. This measurement revealed a significant increase in the noise current below 5 Hz which is attributed to 1/f noise, while white noise patterns are observed above 50 Hz. The noise current divided by the responsivity under the same measurement conditions of applied bias and frequency modulation yielded the noise equivalent power (NEP). The normalized detectivity, D*, was obtained as a function of wavelength, applied bias, and frequency by dividing the square root of the optically active area of the device by the NEP.

To validate the NEP values obtained using this technique, the identical procedure was preformed using a commercial Si detector with known NEP. The system described above reported NEP values of the same order of magnitude, but typically somewhat larger than, the specified NEPs. The NEP and D* determination procedure used herein thus provides a conservative estimate of these figures of merit.

Spectral dependence of responsivity and normalized detectivity D* were obtained for biases of 30, 50, and 100 V, under 5 Hz optical modulation and 0.25 nW incident optical power. The responsivity shows a local maximum near 1200 nm corresponding with the exciton absorption peak of the nanocrystal solid-state films. The responsivity increases with voltage (but not as rapidly as does the noise current, resulting in higher D* at lower biases) and reaches 180 A/W at 800 nm. For 30 and 50 V of applied bias, D* is $2\times10^{11}$ Jones and is more than double the detectivity of commercial polycrystalline PbS detectors which have benefited from 50 years of science and technology development. Though the responsivity is higher at 100 V, the bias-dependence of the measured noise current results in D* being maximized at the lower bias of 30 V. In embodiments, processing steps may produce detectivity orders of magnitude greater, such as $10^{13}$ Jones, or even $10^{14}$ Jones.

Figure 6C:
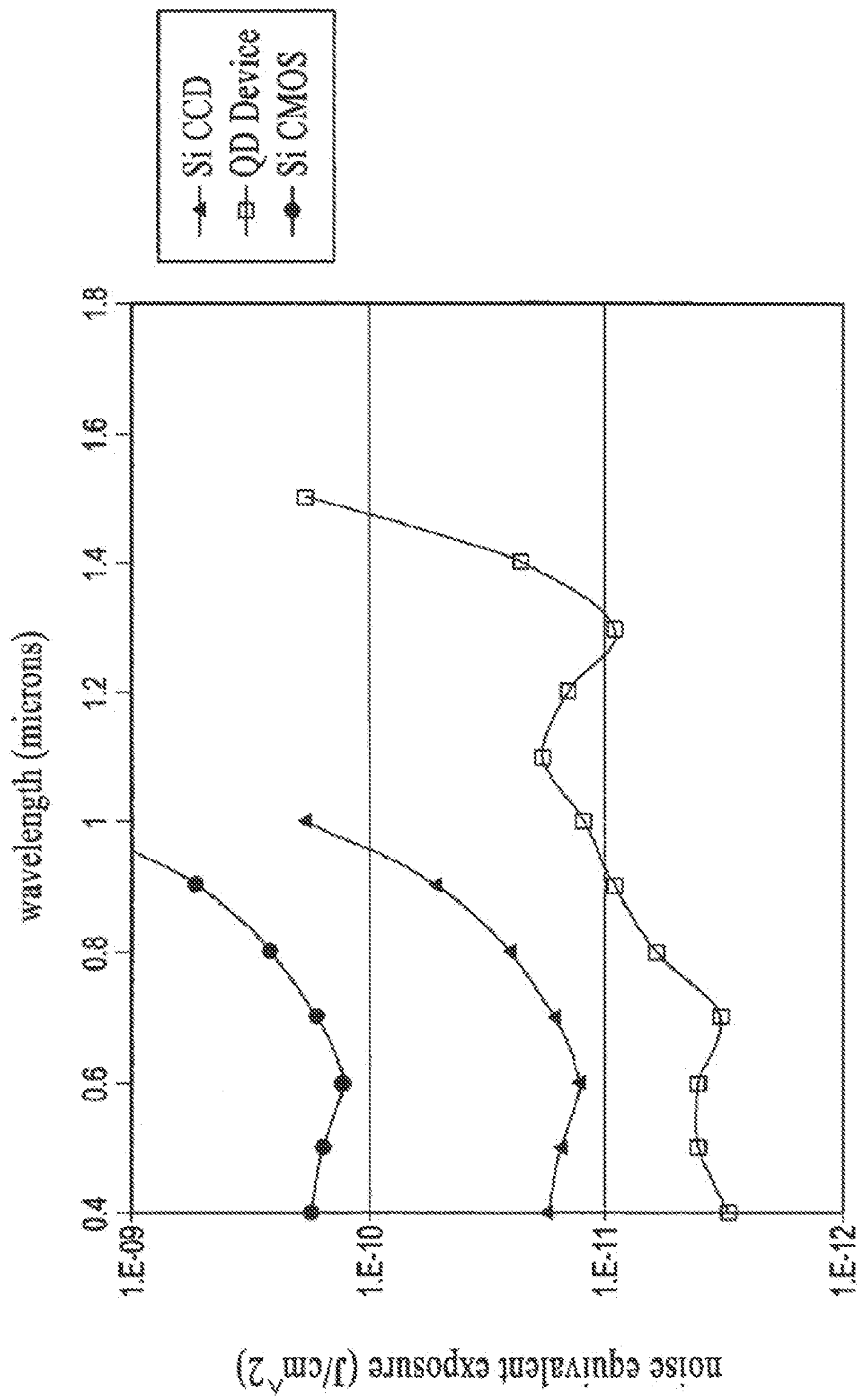
FIG. 6*c* shows the noise equivalent exposure of a QD layer device as compared with conventional Si CCD and CMOS sensor devices.

The frequency dependence of responsivity and normalized detectivity were acquired for three values of applied bias at 975 nm and 0.25 nW of incident optical power. The 3 dB bandwidth of the device responsivity was 15 Hz for 100 V and 50 V and 12 Hz for 30 V. The measurements were taken with optical excitation from a 975 nm laser and incident optical power 0.2 nW. The noise current was also measured for the three different biases throughout the frequency range. The noise current was significantly higher at frequencies below 20 Hz, while frequency-independent white noise was observed at higher frequencies. Noise equivalent exposure, or NEE, is another way of expressing the lowest amount of radiation 1000 detectable by a detector. NEE is defined to be the number of joules of optical energy that can create a signal at the detector that is equivalent in magnitude to the noise on the detector, and is calculated to be the RMS noise on the detector, divided by the responsivity of the detector. FIG. 6*c* shows the NEE of a QD device having a layer of fused QDs with defect states (e.g., oxidation) on their outer surface, as compared with the NEE of a conventional Si CCD detector as well as a conventional Si CMOS detector. The QD device has an NEE of less than $10^{-11}$ $J/cm^2$ at wavelengths of 400 to 800 nm, and further less than $10^{-10}$ $J/cm^2$ at wavelengths of 400 to 1400 nm. The NEEs of the conventional Si devices are significantly higher than that of the QD device, in some cases more than an order of magnitude higher. Again, in embodiments, processing steps may produce detectivity orders of magnitude greater, such as $10^{13}$ Jones, or even $10^{14}$ Jones.

The figures of merit obtained from the quantum dot detectors presented herein result from a combination of processing procedures. First, the shortening of the distance between QDs via exchange to a much shorter organic ligand provided enhanced inter-QD conduction. Post-deposition treatment using a nonsolvent and exposure to elevated temperatures in an oxygen-rich atmosphere enabled further ligand removal, QD fusing, and the formation of a native oxide on the QD surface. This oxide has previously been shown in polycrystalline PbS devices to be useful in achieving high D* in photoconductors. However, chemical bath-grown polycrystalline devices with 200 nm domain sizes do not allow refined control over interfaces. In contrast, using pre-fabricated, highly monodisperse, individually single-crystal QDs with highly-controlled ligand-passivated surfaces to fabricate optical devices allows exceptional control over interface effects compared with polycrystalline-based devices. The quantum dot optical devices described herein are superior across many figures of merit to conventional grown-crystal semiconductor optical devices. At the same time the fabrication of the devices is strikingly simple, while maintaining optical customizability based on the quantum size effects of quantum dots.

When QDs are fabricated they typically include a plurality of relatively long ligands attached to their outer surfaces.

Then, the QDs are ligand-exchanged e.g. by substituting shorter ligands for those used during fabrication of the QDs. This step may allow the QDs to pack more closely in subsequent processing steps.

Then, the QDs are deposited on a suitable substrate), e.g., on an electronic read-out integrated circuit. This step may be accomplished with various solution-based methods, many of which are compatible with standard CMOS processes such as spin-coating.

Then, the precursor layer is washed to remove the ligands on the QDs, and to cause necking (i.e. touching) between at least some adjacent QDs).

Then, the necked QD layer is annealed, which fuses necked QDs together.

Then, defect states are created in the fused QD layer, e.g., by oxidizing the layer.

In general, when fabricating a device intended to have multiple pixels, the QD layer may then optionally be patterned, e.g., using photolithography, to separate the continuous layer into a plurality of pixels.

The resulting QD layer can be incorporated into devices such as those described herein.

Activation of the film may proceed with a methanol dip, however, this may associated with cracking of the film. An air bake of the film may activate the film without cracking. The air bake may operate with ambient air. There may be no need for special gas treatment, such as and without limitation, a nitrogen purge. Anhydrously prepared quantum dot materials 200 may activate with an air bake, but not with methanol. Hydrous quantum dot materials 200, such as those stored in chloroform, may not activate with an air bake, but they may activate with methanol. The baking temperature may vary, such as within a range from about 90 degrees Celsius to 130 degrees Celsius. The baking time may vary, such as within a range from 60 to 180 minutes.

In an embodiment, a post-film formation treatment may involve a methanol dip. The methanol dip may occur in ambient air. The methanol dip may occur at room temperature. Activation may not be optimal in an anhydrous environment with anhydrous drying, however, doing the methanol dip in an environment such as that of a glove box and then evaporating the methanol in room air may activate the film. Methanol dip may involve activation after removal of ligand. After methanol dip, the device may be brought out to air for controlled exposure. The mechanism by which the oven operates may not be limiting for this embodiment. In an embodiment, the butyl amines are removed first and then the film is oxidized. Alternatively, the film may be oxidized first, and then the butyl amines are removed.

In an embodiment, the quantum dot materials may be patterned. Patterning may involve forming a non-homogeneous layer. Patterning may involve carving out rows and columns that are electrically independent. Patterning may involve enabling passivation of a portion or portions of the film. Patterning may enable a self-assembly quantum dot pixel 1800. Patterning may enable a self-isolated quantum dot pixel 1800. Patterning may be used on a coarse scale. Patterning may involve patterning the substrate. Patterning of the substrate may contribute, in part, to patterning of a film disposed on the substrate. Patterning may assist in choosing a bias level to obtain a desired sensitivity of the QPDC 100. Patterning may provide feedback on deviations as multiple layers are formed. There may be multiple techniques for patterning, including dry etching, chlorine or fluorine etching of sulfides, and masking Patterning may involve self-assembly. Crosslinkers may enable self assembly of patterns, such as ligand exchange in real time. Bi-functional linkers may facilitate self-assembly of patterns. One end of a bi-functional linker may be attached to the substrate and another to the quantum dot 1200. Bi-functional linkers may be designed to sequentially link quantum dots 1200 to substrate, and then quantum dots 1200 to quantum dots 1200.

Methods of producing optically sensitive layers, including those patterned to form regions of material, are now discussed. Methods of growth for self assembly of pattern may involve methods analogous to epitaxial growth, but where the atomic or molecular species employed in epitaxy are replaced in the analogy with the quantum dots. Growth may involve a nucleation point which leads to a large single crystal, such as single crystal formation, or polycrystalline-type growth. The growth method may depend on how the linker attaches to the substrate. A pattern that begins with a single monolayer may continue as subsequent monolayers are deposited on the substrate, similar to epitaxial growth. There may be ranges for epitaxial growth. For example, only where there are atoms of the right kind of crystal will growth occur. There may be three modes for selective area epitaxy. One mode may be molecular beam epitaxy (MBE). With MBE, there may be good crystal on crystal growth. The thickness of what grows on crystal is what would have grown with no mask. With MBE, materials for growth may adhere anywhere along a substrate. Another mode may be metallorganic chemical vapor deposition (MOCVD). With MOCVD, growth only occurs on regions of crystal, but growth proceeds with a large effective width. With MOCVD, precursors deposited on a substrate may move around, crack, and adhere randomly. Another mode may be chemical beam epitaxy (CBE). With CBE, growth tends to occur only in the hole and may nominally be the same as if grown on a planar surface. With CBE, precursors deposited on a substrate may bounce off or, if at right place, crack and form a crystal. CBE may combine the best of MBE and MOCVD. It may be possible to combine a quantum dot 1200 with a delivery agent, such as a biomolecule. The combination of the two may approach the surface of the substrate. Attached to the substrate may reside a molecule that catalytically cleaves the bond between the biomolecule (carrier) and the quantum dot 1200 (payload). The quantum dot 1200 may then be released at the point of attachment to the substrate. The quantum dot 1200 may be fastened to the substrate through any of the means discussed herein, such as by linkers, self-aggregation, and the like.

For quantum dot 1200 precursors, growth may occur by any of the aforementioned techniques in varying environments, such as liquid, vacuum, and the like. For example, quantum dots 1200 may be provided, the excess may be disposed of, and the quantum dot 1200 may be maintained in place on the substrate. No transport cracking process may be needed. Quantum dot materials 200 may be locally activated. Activation may render the quantum dot materials sticky or reactive. The quantum dot materials 200 may be fed some non-solvent. Quantum dots 1200 may irreversibly activate after being centrifuged. Methanol may be applied locally at the surface that may cause quantum dots 1200 to precipitate down to the surface. A goal may be to deposit quantum dot materials 200 on the surface of a substrate. The system of ligands capping the nanoparticle may be designed such that, in the solution phase, far from the substrate, the nanoparticles remain dispersed. However, this same system of ligands may be designed such that, when the nanoparticle approaches the substrate, the nanoparticle's environment becomes asymmetric. This asymmetry may break the ligand cage surrounding the quantum dots 1200 and may result in aggregation of the quantum dots 1200 near to or onto the substrate.

In an embodiment, quantum dots 1200 may be post-processed. Post processing may involve precipitation and redispersion. Post-processing may be anhydrous. Post-processing may involve drying the quantum dots 1200, resuspending them in a solvent, filtering the solution, concentrating the solution, then spinning the solution. This method may be an improvement over simply evaporating the solvent by blowing off the solvent in an air stream which may generate quantum dots 1200 but may also cause splashes which may result in droplets. An improvement in nitrogen evaporation may comprise maintaining an enriched nitrogen environment. Another improvement may involve, when going from above, injecting nitrogen in to a drying chamber through a high velocity vent with little entrainment of air. This improvement may result in a more stable surface that may not splash to form droplets.

Another improvement may be to the drying chamber itself, such as applying a vacuum to a chamber, such as a glove box, maintaining a pressure differential between two needles in the chamber, and providing a pump with seals that may be operable with chloroform and able to pump in a nitrogen flow and pump out vapor through a fume hood. Redispersion may be soaking the precipitated quantum dots 1200 in a solvent, such as butyl amine, toluene, and the like to provide for ligand exchange. Non-toluene soaks may provide faster redispersion. The quantum dots 1200 may need to mature for a time period, such as in the range of five days.

In an embodiment, quantum dot materials 200 may be encapsulated. A film of quantum dots 1200 may be spin coated to a particular thickness on a processed wafer with electrodes at its planar surface. The surface of the wafer may be substantially planar. The film may be patterned to remove areas of wire bonds and electronics. Materials to which wire bonding is conventionally done include Al and Al capped ti TiN or TaN. Patterning may involve coating the film with a material which may or may not be an encapsulant. This material may be a mechanical and/or chemical buffer between quantum dots 1200. Then, photoresist may be put over this, such as with a dry etch, to take off the encapsulant or interface layer plus the quantum dots that are underneath it. Then, the photoresist may be removed or left behind. The etch rate of photoresist removal may be comparable on a thickness adjusted basis so it may be gone anyway. This process may provide an island of quantum dots 1200 in the middle of a chip. There may be material on top of this island of quantum dots 1200 that may remain in place. The island of quantum dots 1200 may be reencapsulated. The reencapsulant may be a hermetic material. The reencapsulant may touch the chip and travel up the sides of the island of quantum dots 1200 to encapsulate it fully. Reencapsulant around the outside that touches the wafer may be removed. If there are bond pads, holes may be opened only where needed. Alternatively, the bond pads may be processed.

In an embodiment, quantum dot materials 200 may include quantum dots 1200, as described herein. Quantum dot materials 200 may also include hard dielectrics, such as and without limitation, nitrides and oxides may be used. For example, graded transitions from nitrides to oxides with oxynitrides in between may be used. Certain parameters may be variable for the film, such as and without limitation, stress, grading, chemistry of the initial surface, chemistry of the final surface, the relationship to bond pads, and the like.

In an embodiment, quantum dot materials 200 may comprise a topology. The quantum dot materials 200 may be completely surrounded by material that may be impermeable to oxygen, such as for example, encapsulated silicon chips. In a topology, oxides may be followed by nitrides or vice versa. In an embodiment, nitrides may be placed close to quantum dots 1200. As long as the stress level on the first film is not exceeded, there may be variations in the order and thickness of the nitride and oxide. The final layer of quantum dot materials 200 should look like the final layer of a regularly processed chip going through the same foundry to maintain compatible chemistry. For example, the topology may start with nitride, oxide may be added, and then the layers may be finished off. The topological characteristics may include a chemistry for the bottom layer, stress management for the middle layer, and chemistry compatibility for the final layer.

In embodiments, colloidal quantum dots capped with organic ligands are processed in the solution phase in order to introduce a new organic ligand, or combination of ligands. For example, colloidal quantum dots may be introduced into a solution containing a mixture of shorter thiols (such as ethanethiol, butanethiol, or hexanethiol) and longer thiols (such as hexanethiol, octanethiol, or dodecanethiol). In embodiments, the solvent employed may be chloroform. In embodiments, the ratio of short to long thiols may be 6:1 or 7:1. In embodiments, the short thiol may be chosen to be hexanethiol and the longer thiol chosen to be dodecanethiol. In embodiments, the ratio of short to long thiols may be 3:1. In embodiments, the short thiol may be chosen to be ethanethiol and the longer thiol chosen to be hexanethiol.

In embodiments, a photoconductive film is implemented with the following properties: (1) A dark current density of less than 100 nA/cm2 under relevant electrical bias; (2) A photoconductive gain of between 1 and 20, with good values including 2, 3, 5, 10, and 15; (3) A single component to the temporal rise time and fall time that lies between 1 millisecond and 100 milliseconds, with 1, 2, 5, 10, 30, 50, 70, and 100 milliseconds being good values.

In embodiments, a photoconductive film is constituted from materials that, when combined to form the film, possess, for at least one carrier type (such as electrons), a substantially pure trap state, resultant from a substantially pure chemical species, that produces in the photoconductive film a temporal rise time and fall time that lies between 1 millisecond and 100 milliseconds, with 1, 2, 5, 10, 30, 50, 70, and 100 milliseconds being good values.

In embodiments, a photoconductive film consists of colloidal quantum dots, of substantially the same diameter, made principally of a semiconductor such as PbS (lead sulfide), having one or more ligands or linker molecules, and having a substantially single impurity, lead sulfite (PbSO3), substantially localized to its surface, that has at room temperature a substantially single time constant of about 25-35 milliseconds.

In embodiments, a photoconductive film consists of a semiconductor such as PbS that is decorated with substantially only one single class of impurity species, such as lead sulfite (PbSO3), and is substantially lacking in other impurities, such as Pb-carboxylate, lead sulfate (PbSO4), lead oxide (PbO).

In embodiments, a first film is proximate to the electrical contacts and serves to make an ohmic contact, or a low-barrier-voltage nonohmic contact; and is followed by a second film atop this first film that serves as the photoconductive layer.

In embodiments, a first film is proximate to the electrical contacts and serves to block the egress of one carrier type, such as electrons, while permitting the egress of the other carrier type, such as holes; and is followed by a second film atop this first film that serves as the photoconductive layer.

In embodiments, a photoconductive phototransistor is formed laterally atop an array of electrical contacts. A first film, having a larger bandgap, and being more strongly p-doped, is proximate to the contacts. This film may not extend continuously between the contacts, but may instead simply cover each contact and not span the space in between. A second film, having a smaller bandgap, and being n-type, or near-intrinsic, or more mildly p-type, resides atop the first (possibly non-continuous) film.

Embodiments include an array of photoconductive photodetectors wherein certain spatial regions of the array have a heightened sensitivity to certain bands of wavelengths, and a much lower sensitivity to other bands of wavelengths. For example, certain spatial regions may have a heightened sensitivity to blue colors compared to red, green, ultraviolet, and infrared. Embodiments include an array wherein said color sensitivity is achieved by combining photoconductive materials with wavelength-selective-optically-absorbing materials such as those used to form a color filter array.

Embodiments include pixels wherein two components—one a photoconductive material, the other a wavelength-selective-light-absorbing material—substantially phase-segregate in the course of processing, resulting in the top portion of the pixel being constituted principally of the wavelength-selective-optically-absorbing material, and the bottom portion of the pixel being constituted principally of the photoconductive material.

Means of producing optically sensitive layers, and of integrating them on a substrate, are now discussed. In an embodiment, puddle casting may be used to deposit quantum dot materials 1200 on a photodetector structure 1400. Puddle casting may comprise depositing a metered amount of quantum dot materials 200 onto a substrate and allowing solution to evaporate. The resultant films may or may not crack. Puddle casting may enable deposition of a certain number of quantum dots 1200 per planar square centimeter on a non-planar surface. Puddle casting may enable a conformal coating over photodetector structures 1400 without spin coating. Puddle casting may be similar to electrodeposition or metalorganic chemical vapour deposition (MOCVD) in that puddle casting may result in concentration grading or changes in concentration over time, rather than just a pattern. Puddle casting may proceed with materials that may undergo a phase change. A goal of puddle casting may be to set the inter-quantum dot 1200 spacing appropriately with species that may be managed appropriately in film form. A goal of puddle casting may be to appropriately distribute the quantum dots 1200 in an operable configuration and/or a user-defined way. A goal of puddle casting may be to obtain a spatially uniform film with desired dark conductivity, desired photoconductive photovoltaic gain, desired noise current, and the like. A goal of puddle casting may be to set the stage with deposition for later actions.

In an embodiment, quantum dot materials 200 for puddle casting may comprise a quantum dot 1200 in solvent or solvents. The solvents may be of varying degrees of volatility. For example, the solvent may be a combination of a high volatility solvent, such as n-hexane, with a low volatility solvent, such as octane. The solvent may be a "less" solvent, such as 2-propanol. The solvent may be a "good" solvent, such as toluene or chloroform. Quantum dot materials 200 may also comprise ligands. Ligands may be used to passivate the quantum dots 1200, such as butyl amine, benzenethiol, benzenedithiol, octylamine, pyridine. Quantum dot materials 200 may also comprise non-solvents. Non-solvents, such as methanol, ethyl acetate, acetonitrile, propanol, and iso-propanol, may cause precipitation and film formation. Quantum dot materials may also comprise cross-linkers, such as acetonitrile (MeCN), ethanethiol (ET), ethanedithiol (EDT) or benzenedithiol (BDT). The parameters that may be important in puddle casting film formation may be introduction of materials in the gas phase, temperature, pressure, and time. Puddle casting may enable obtaining a dense film with high mobility. Puddle casting may enable obtaining a smooth, uniform, uncracked film. Ligand exchange during film formation may be possible, as described herein. Ligand exchange may proceed at substantially the same time as film formation to obtain a high density, uniform film. Also as described herein, ligand exchange during film formation may also apply to film formation by growth from solution and ink jet printing. For example, in growth from solution, the wafer sample may be submerged in a quantum dot solution 400 and quantum dots 1200 in solution may self-deposit or aggregate on the wafer in response to an affinity for already deposited quantum dots 1200 or in response to chemical manipulation by a cross-linker, such as ligand exchange, or a non-solvent. Temperature may be a factor in the precipitation of the material onto the substrate. Crosslinkers or non-solvents may also be introduced into the quantum dot solution 400 or deposited as a layer on the wafer or substrate. It may be possible to have stable colloid solutions and have the process of deposition occurring accompanied by ligand exchange/cross-linkers. In any event, as volatile solvent evaporates from the puddle, highly concentrated quantum dots 1200 are left deposited on the substrate. A factor in puddle casting may be puddle confinement.

After forming the QD precursor layer, the QDs may be fused together to produce a QD film with enhanced optical and electrical characteristics, and which is suitable for use in a finished electronic or optoelectronic device.

In one embodiment, at least a portion of the QDs in the QD precursor layer are fused by annealing the layer at temperatures up to about 450° C., or between about 150° C. and 450° C. In other embodiments, the layer is treated at lower temperatures, for example between about room temperature up to about 150° C., or up to about 100° C., or up to about 80° C. In some embodiments, the QD precursor layer is not heated substantially above ambient (room) temperature. As mentioned above, the step of fusing brings the cores of adjacent QDs into direct physical and electrical contact. It is also possible to "overfuse" the QDs, in which case they may lose their individual characteristics and appear more like a bulk semiconductor material. It is desirable to prevent such overfusing through the parameters chosen for annealing or through monitoring to prevent an overfused condition. The annealing step will typically be performed in a vacuum or in an otherwise anhydrous environment to prevent the development of defect states (e.g., oxidation) on the outer surfaces of the QDs before the cores of the QDs fuse together. This way, there will be substantially no defect states in the regions where the QDs are joined together, but these regions instead will have a substantially homogeneous composition and crystalline structure. In other embodiments the fusing step may be performed in an oxygen-rich environment, or an oxygen environment in which the partial pressure of oxygen is regulated.

The ligands in the QD precursor layer are also typically removed, either before or concurrently with the fusing step. For example, if the ligands in the QD precursor layer are volatile, they may easily be removed during annealing because they will simply volatilize from the heat. Or, for example, if the ligands in the QD precursor layer are not volatile, they can be removed from the QD precursor layer by soaking the layer in a solvent that dissolves and thus dissociates the ligands from the QDs but which does not generally disrupt the arrangement of QDs in the QD layer. In general, it is preferable that removing the ligands does not significantly change the volume of the QD layer, e.g., by less than about 30%; a large volume change may crack or otherwise damage the finished QD film.

In many embodiments, particularly those suitable for optical applications, defect states are created on the outer surfaces of the fused QDs. By "defect state" it is meant a disruption in the otherwise substantially homogeneous crystal structure of the QD, for example, the presence of a dislocation or a foreign atom in the crystal lattice. In many cases this defect state will exist on the outer surface of the QDs. A defect state can be created by, e.g., oxidizing the QDs after fusing and ligand removal. During operation, if an electron-hole pair is generated within the QD film, one or more holes may be trapped by the defect state; this will preclude rapid recombination of holes with electrons, which will then allow the electrons to flow for a much longer time through the film. This can positively affect photoconductive photovoltaic gain, among other things.

In general, the outer surface of the fused QDs can be coated or otherwise treated so it has a different composition than the cores of the fused QDs. For example, the outer surface can include a semiconductor or insulator shell.

In embodiments, colloidal quantum dots capped with organic ligands are processed in the solution phase in order to introduce a new organic ligand, or combination of ligands. For example, colloidal quantum dots may be introduced into a solution containing a mixture of shorter thiols (such as ethanethiol, butanethiol, or hexanethiol) and longer thiols (such as hexanethiol, octanethiol, or dodecanethiol). In embodiments, the solvent employed may be chloroform. In embodiments, the ratio of short to long thiols may be 6:1 or 7:1. In embodiments, the short thiol may be chosen to be hexanethiol and the longer thiol chosen to be dodecanethiol. In embodiments, the ratio of short to long thiols may be 3:1. In embodiments, the short thiol may be chosen to be ethanethiol and the longer thiol chosen to be hexanethiol.

In embodiments, a photoconductive film is implemented with the following properties: (1) A dark current density of less than 100 nA/cm2 under relevant electrical bias; (2) A photoconductive gain of between 1 and 20, with good values including 2, 3, 5, 10, and 15; (3) A single component to the temporal rise time and fall time that lies between 1 millisecond and 100 milliseconds, with 1, 2, 5, 10, 30, 50, 70, and 100 milliseconds being good values.

In embodiments, a photoconductive film is constituted from materials that, when combined to form the film, possess, for at least one carrier type (such as electrons), a substantially pure trap state, resultant from a substantially pure chemical species, that produces in the photoconductive film a temporal rise time and fall time that lies between 1 millisecond and 100 milliseconds, with 1, 2, 5, 10, 30, 50, 70, and 100 milliseconds being good values.

In embodiments, a photoconductive film consists of colloidal quantum dots, of substantially the same diameter, made principally of a semiconductor such as PbS (lead sulfide), having one or more ligands or linker molecules, and having a substantially single impurity, lead sulfite ($PbSO_3$), substantially localized to its surface, that has at room temperature a substantially single time constant of about 25-35 milliseconds.

In embodiments, a photoconductive film consists of a semiconductor such as PbS that is decorated with substantially only one single class of impurity species, such as lead sulfite ($PbSO_3$), and is substantially lacking in other impurities, such as Pb-carboxylate, lead sulfate ($PbSO_4$), lead oxide (PbO).

In embodiments, a first film is proximate to the electrical contacts and serves to make an ohmic contact, or a low-barrier-voltage nonohmic contact; and is followed by a second film atop this first film that serves as the photoconductive layer.

In embodiments, a first film is proximate to the electrical contacts and serves to block the egress of one carrier type, such as electrons, while permitting the egress of the other carrier type, such as holes; and is followed by a second film atop this first film that serves as the photoconductive layer.

In embodiments, a photoconductive phototransistor is formed laterally atop an array of electrical contacts. A first film, having a larger bandgap, and being more strongly p-doped, is proximate to the contacts. This film may not extend continuously between the contacts, but may instead simply cover each contact and not span the space in between. A second film, having a smaller bandgap, and being n-type, or near-intrinsic, or more mildly p-type, resides atop the first (possibly non-continuous) film.

Embodiments include an array of photoconductive photodetectors wherein certain spatial regions of the array have a heightened sensitivity to certain bands of wavelengths, and a much lower sensitivity to other bands of wavelengths. For example, certain spatial regions may have a heightened sensitivity to blue colors compared to red, green, ultraviolet, and infrared. Embodiments include an array wherein said color sensitivity is achieved by combining photoconductive materials with wavelength-selective-optically-absorbing materials such as those used to form a color filter array.

Embodiments include pixels wherein two components—one a photoconductive material, the other a wavelength-selective-light-absorbing material—substantially phase-segregate in the course of processing, resulting in the top portion of the pixel being constituted principally of the wavelength-selective-optically-absorbing material, and the bottom portion of the pixel being constituted principally of the photoconductive material.

Embodiments include sensitive, low-dark-current photodetectors based on films made using colloidal quantum dots. Embodiments include pixels whose composition gives them desirable photoconductive photodetector characteristics, including high sensitivity, where sensitivity implies ability to detect low light, and high signal-to-noise ratio. Other desirable characteristics of the pixels include speed, or low lag, which allows photos or videos to be captured without ghosting effects. The pixels described are also very responsive. Responsiveness is related to sensitivity, but is not the same thing. As used herein, responsiveness implies a relatively large amount of electrical signal for a given amount of optical signal. The pixels described further achieve a low background level. The pixels described are readily integrated with a completed or partially-completed electronic integrated circuit that achieves low-noise read-out of a signal that is related, in a known way, to the integrated photon flux received during a specific integration period, and that conveys the resultant electronic signal to other portions of the integrated circuit such as amplifiers, analog-to-digital converts, digital logic processing, and memory.

Embodiments of photoconductive photodetectors including the pixels described herein retain high levels of signal-to-noise at low light levels.

Embodiments of photoconductive photodetectors including the pixels described herein also reduce by many orders of magnitude the amount of current flowing in these devices when they are in the dark (the dark current), thereby dramatically improving the signal-to-background ratio for a given level of illumination.

Embodiments of photoconductive photodetectors including the pixels described herein also ensure that the device exhibits response to light, and recovery from light, that is sufficiently fast to allow blur-free imaging with brief exposures (millisecond to second) and the capture of satisfactory video (e.g. 60 fps, 30 fps, 15 fps).

Embodiments including material compositions and method of manufacture described herein are applicable to the previously described architectures. In general, the device architectures include electrodes that make an ohmic contact with a photoconductive material. This forms a simple circuit, for example a variable resistor when operated at constant voltage. In this example, there is a current through the variable resistor in the presence of light. The conductivity of the material ultimately determines the resistance, and is proportional to the mobility and the carrier density. The mobility, or ease of carrier flow, and the carrier density describes the number of carriers that are available. The fact that these two numbers are non-zero means even in the dark there is some density of charge carriers (electrons, holes, or both) that will flow and create a background. Upon illumination, there is an increase in conductivity; presumably the propensity of the carriers to flow will be substantially unchanged but the number of carriers will be different and an "excess carrier density" will exist. Change in current in response to the change in light which is attributable to a change in carrier density is what is sought to be sensed.

A challenge in this simple photoconductor in prior devices is that the signal to background ratio is equal to the change in the conductivity divided by the conductivity and these mobility numbers are canceled, yielding a constant. This leaves a ratio of the change in carrier density to the underlying dark carrier density. The fact of not having sufficient signal to background in this architecture is related to the fact that there is a single type of carrier flow in this device. In order to overcome this, embodiments employ a novel photodetector structure based on creating a phototransistor that allows entry into a new regime of sensitivity. A phototransistor can be pictured as a bipolar junction transistor, which involves three contacts, each one to an emitter, a base, and a collector. Instead of having an electrical base, light is the source of the third "signal". Light is the signal that is amplified, similarly to the base signal in a bipolar junction transistor. More particularly, the electrical signal that is induced from the absorption of light is amplified.

Embodiments include a novel phototransistor instantiated in a colloidal quantum dot film as the photoconductive layer. Further embodiments include various choices of the contacts, and the method of making the device, and elements of the physical device architecture.

Embodiments of the phototransistor take advantage of the fact that there are two types of carriers flowing, which provides opportunities to improve the ratio of signal to background in this device. For example, embodiments include a device in which the dark current flows in response to electrons, and in which the change in conductivity due to light flows in response to the excess holes. The mobilities do not cancel each other as before, rather there is a mobility ratio which can be manipulated.

Embodiment further include a photoconductive photodetector based on colloidal quantum dots in which, in the dark, one carrier type (e.g. electrons), is in the majority. Under illumination, even low light levels (e.g. <10 nW/cm2), the other carrier type (e.g. holes), provides the predominant contribution to current flow.

Embodiments further include a photoconductive photodetector, which is a sensor for light which provides gain based on trapping of one carrier type (e.g. Electrons) combined with flow of the other type (e.g. Holes).

Embodiments further include a photoconductive photodetector, in which holes are in the majority; and under illumination, electrons dominate current flow.

Embodiment also include a photoconductive photodetector made using N-type colloidal quantum dots. This is distinct from a photodiode, or photovoltaic, which employs a combination of n- and p-type materials).

Conversely, embodiments can include a P-type semiconductor, and a low-work-function metal (work function shallower than 4.5 eV, including Al, Mg, Ag, Ca, suitably-treated TiN, TaN).

Embodiments further include a topology comprising a film comprising a network of fused nanocrystals, the nanocrystals having a core and an outer surface, wherein the core of at least a portion of the fused nanocrystals is in direct physical contact and electrical communication with the core of at least one adjacent fused nanocrystal, and wherein the film has substantially no defect states in the regions where the cores of the nanocrystals are fused.

Embodiments also include the foregoing topology with an N-type semiconductor in which colloidal quantum dots make up the semiconductor.

Embodiments also include the foregoing topology with an N-type semiconductor in which colloidal quantum dots make up the semiconductor, wherein there is an absence of P-type semiconductor material.

Embodiments further include deep-work-function-contacts, which are metals having a work function deeper than 4.5 eV. Examples include Au, Pt, Pd, ITO, Cu, Ni, and suitably-modified TaN and TiN.

Embodiments further include deep-work-function-contacts in combination with the N-type semiconductor in which colloidal quantum dots make up the semiconductor. The deep-work-function-contact is described as Schottky, wherein an n-type semiconductor is contacted by a metal whose work function aligns more closely to its valence band (for holes) than to its conduction band (which conducts electrons). Schottky contacts have been made previously generally between semiconductors and metals (in contrast to such contacts to colloidal quantum dot films.)

Embodiments also include deep-work-function-contacts in combination with the N-type semiconductor in further combination with the topology described above.

Embodiments also include noble metal contacts in combination with the n-type semiconductor based on colloidal quantum dots.

As described below, there are various methods of implementing the phototransistor concept as stated above. For example, the choice of metal-semiconductor interface provides an opportunity to control the type of carrier that is flowing. Embodiments include a selective contact that injects or extracts holes, but not electrons. This provides access into a regime of discrimination between carrier types.

In other embodiments, the interface may not be a purely simple metal-semiconductor interface. The desired selectivity could come from an intervening layer as well as from metal choice. The intervening layer could be a semiconductor or an insulator. In addition, embodiments include devices in which there are a number of properties that are controlled through the photoconductive layer. One of these properties is the ratio of hole mobility to electron mobility in this medium. Another property is the equilibrium carrier density; essentially the net doping. For example, in a semiconductor, a net type can be achieved through so-called compensation.

Figure 39:
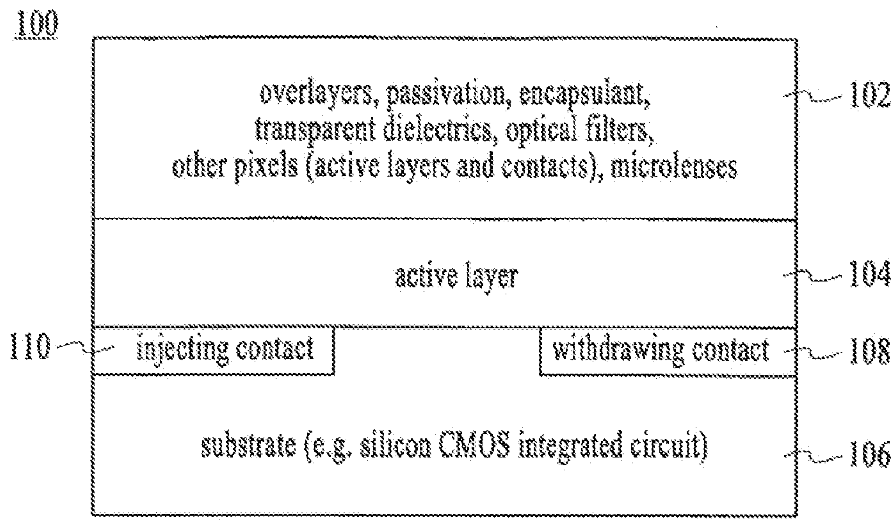
FIG. 39 is a block diagram of functional blocks of a lateral pixel according to an embodiment.
Figure 40:
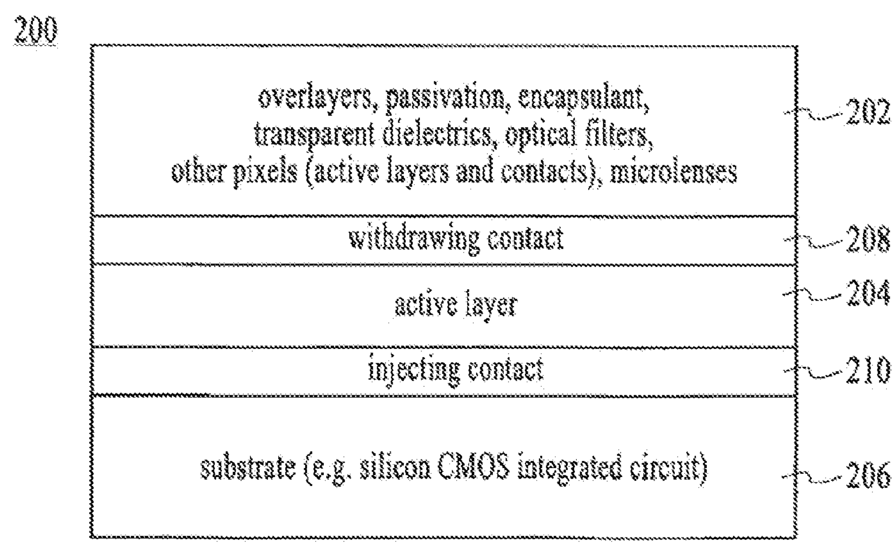
FIG. 40 is a block diagram of functional blocks of a vertical pixel according to an embodiment.

Another attribute of the photoconductive layer that is exploited to achieve sensitivity, and is also important in achieving low lag, is the carrier lifetime. As further described below, photoconductive layer materials and the colloidal quantum dots that make up this material are designed to achieve the desired characteristics of the phototransistor. FIG. 39 is a block diagram of functional blocks of a lateral pixel according to an embodiment. FIG. 40 is a block diagram of functional blocks of a vertical pixel according to an embodiment.

Aspects of various embodiments, including compositions of matter and methods of making will now be described with reference to FIGS. 39 and 40. While a wide variety of specific device geometries are possible within the scope of the claimed invention, various devices typically comprise materials that possess one or more of the attributes described below in various combinations. Referring the FIGS. 39 and

40, pixels 100 and 200 each include an active layer (104 and 204, respectively), comprising a photoconductive material. Pixels 100 and 200 further include overlayers 102 and 202 that include passivation layers, encapsulation layers, transparent dielectrics, optical filters, other pixels (active layers and contacts), and microlenses. Pixels 100 and 200 further include injecting contacts 110 and 210 and withdrawing contacts 108 and 208. Pixels 100 and 200 further include substrate layers 106 an 206, including silicon CMOS integrated circuits. Active layers 104 and 204 have one carrier type (e.g. holes) that is said to be the flowing carrier. The flowing carrier typically has a mobility of 1E-5 cm2/Vs or greater, with particularly desirable values including of 1E-4 cm2/Vs, of 2E-4 cm2/Vs, and of 1E-3 cm2/Vs. The other carrier type in active layers 104 and 204 (e.g. electrons), is said to be the trapped carrier.

In an embodiment, the trapped carrier possesses a mobility that is at least 10× less than that of the flowing carrier type, with particularly desirable values including 100× less than the flowing carrier and 1000× less than the flowing carrier. The trapped carrier further possesses a certain density of trap states having: lifetimes typically ranging from 1 microsecond to 1 second, with particularly desirable values including 1 millisecond, 6 milliseconds, 10 milliseconds, 30 milliseconds, and 50 milliseconds; and densities ranging from 1E12 cm-3 to 1E22 cm-3, with particularly desirable values including 1E14 cm-3, 1E15 cm-3, 1E16 cm-3, 1E18 cm-3, and 1E19 cm-3. The flowing carrier travels through the device without substantial addition of noise (such as multiplicative noise) beyond the shot noise and Johnson noise and generation-recombination noise proper to its operation as a resistor. If shot noise limits the device, then the number of noise electrons Q_n should not substantially exceed the square root of the number of dark electrons Q_d. If Johnson noise limits the device, then the noise current i_n should not significantly exceed Square Root (4 kB T Δf/R) where kB is Boltzmann's constant, T is the device temperature, Δf is the bandwidth, and R is the device's resistance.

In the absence of illumination, the volume-density of the flowing carrier is extremely small. If holes are the flowing carrier, then the hole density may be 10^12 cm-3, making the active layer a very-lightly-doped p-type material. The hole density can be lower still such as 10^6 cm-3, to make the active layer an effectively intrinsic material. The hole density can be yet lower still such as 10^0 cm-3 or lower, rendering the active layer an n-type material. This ensures that the majority carrier is the trapped, instead of the flowing, carrier.

Pixels 100 and 200 each include an injecting contact (110 and 210) and a withdrawing contact (108 and 208). Under the biasing conditions, the injecting contact injects the flowing carrier into the active layer with much greater efficiency than it withdraws the trapped carrier from the active layer into the contact. Under the biasing conditions, the withdrawing contact withdraws the flowing carrier from the active layer into the contact with much greater efficiency than it injects the trapped carrier into the active layer.

Biasing conditions include a bias on the injecting contact, relative to the withdrawing contact, typically of +0.1 V, +1 V, +1.8 V, or +2.8 V, if the flowing carriers are holes. The polarity is opposite if the flowing carriers are electrons.

Pixels 100 and 200 each include an active layer of photoconductive material (104 and 204). In an embodiment the active layer material consists of mutually-touching semiconductor nanoparticles, where the non-touching surfaces of the connected particles may be coated by one or more of: an inorganic material such as an oxide or sulfate; and an organic material such as an organic ligand.

The mutually-touching semiconductor nanoparticles may be made from crystalline semiconductors such as: PbS, PbSe, or PbTe; CdS, CdSe, or CdTe; Si, Ge, or C; In2Se3, In2S3, including either the alpha-phase or the beta-phase; InP; and Bi2S3.

The inorganic material coating the non-touching surfaces of the connected nanoparticles may include one or more of: PbSO4, PbO, PbSeO4, PbTeO4, and combinations thereof; SiOxNy in various proportions; In2O3 in various proportions; sulfur, sulfates, and sulfoxides; carbon and carbonates such as PbCO3; and metals or semimetals such as an excess of Pb, Cd, In.

The organic material coating the non-touching surfaces of the connected nanoparticles may include: Thiols such as ethanethiol, ethanedithiol, benzenethiol, benzenedithiol; Amines such as pyridine, butylamine, and octylamine; Hydrazine; and Carboxylates such as oleic acid.

The dimension of the active layer perpendicular to the direction of incident of light may typically be 100 to 3000 nm, with the thickness chosen such that the wavelengths of light of interest are substantially absorbed. For example, if PbS mutually-touching semiconductor nanoparticles are employed, and if their volume fill fraction is greater than 10%, then a thickness of between 150 and 350 nm will typically achieve the substantial absorption of visible light.

Pixels 100 and 200 each include an injecting contact (110 and 210) and a withdrawing contact (108 and 208). The injecting contact and the withdrawing contact are made using the same materials in embodiments, or are made using different materials from one another in other embodiments. The contacts may consist of a conductive material such as a metal or a degenerately-doped semiconductor, or of a combination of such materials.

If holes are the flowing carrier, the injecting contact may consist of Au, Pt, Pd, Cu, Ni, NiS, TiN, TaN, or p-type polysilicon or p-type amorphous silicon.

If electrons are the flowing carrier, the injecting contact may consist of Al, Ag, In, Mg, Ca, Li, Cu, Ni, NiS, TiN, TaN, or n-type polysilicon or n-type amorphous silicon.

The contacts may, in the alternative, consist of a combination of: a metal or a degenerately-doped semiconductor, or of a combination of such materials; and a semiconductor or even an insulator, e.g., a material having a bandgap. In the latter case, the second material (the semiconductor or insulator) is typically the material in direct physical contact with the active layer. Examples of the first layer composition are the same as listed above with reference to the contacts. Examples of the second layer (semiconductor or insulator) composition include a thin (e.g. 5-50 nm) layer of mutually-touching semiconductor nanoparticles, as described above in describing the active layer. However, in the case of the second layer, this thin layer will typically be made using a larger-bandgap material (e.g. smaller nanoparticles of the same materials composition as the active layer, or different nanoparticles having a larger bandgap than the active layer and also potentially a different size). In addition, this thin layer will typically be made using a more heavily-doped semiconductor. If holes are the flowing carrier in the active layer, then p-type doping of 1E16 cm-3, or 1E18 cm-3, or even 1E20 cm-3, may typically be used. The thin (e.g. 2-20 nm) layer may be of an amorphous or polycrystalline material such as: PbSnTe; As2S3; As2Se3; SiO2; Si3N4; or SiOxNY.

In various embodiments, the active layer may be made by the following processes: Synthesis: synthesizing colloidal quantum dots of generally the same size, with typical size being in the range 1-10 nm. Oxygen and water may be carefully excluded during the synthesis, typically through the use of a Schlenk line; or alternatively, one of oxygen and water may be introduced at various stages of the synthesis in a controlled fashion. Nanoparticle washing: Optionally, using a nonsolvent (such as acetone, isopropanol, methanol) to cause the quantum dots to precipitate; centrifuge including potentially at high rotational rates such as 10,000 or 13,000 rpm; redisperse in a new solvent (such as chloroform, toluene, hexanes, octane). Oxygen and water may be carefully excluded during the synthesis, typically through the use of a Schlenk line or a glovebox or other environmentally-controlled chamber; or alternatively, one of oxygen and water may be introduced at various stages of the synthesis in a controlled fashion. Solution-phase ligand exchange: Optionally, using a nonsolvent (such as acetone, isopropanol, methanol) to cause the quantum dots to precipitate; redisperse in a new solvent (such as acetonitrile, water, methanol, chloroform, toluene, hexanes, octane, butylamine, octylamine) that may incorporate at least one species (e.g. ethanethiol, ethanedithiol, benzenethiol, benzenedithiol, hexanethiol, soluble salts such as those containing Bismuth, Indium, Antimony, Sulfates such as Na2SO4); this new dispersion may then be left for a brief period (e.g. 1-5 minutes) or a more extended period (e.g. multiple days), typically either at room temperature or at elevated temperature (e.g. 60° C. or 80° C.), either in an inert environment (N2, Ar2) or an environment in which additional reagents (O2, H2O, H2S, vapor-phase thiols) have been introduced; and, following this period, may optionally be precipitated and redispersed (including multiple times) as in (2) nano-particle washing. Film Casting: A solution containing the colloidal quantum dots resulting from (1), or (1) followed by (2), or (1) followed by (3), or (1) followed by (2) followed by (3), may then be used to produce a thin solid film, or multiple sequential layers of thin solid films. Methods include spin-casting, where a droplet of the solution is dispensed onto a substrate or integrated circuit; optionally allowed to spread; and then induced to spread and dry through the rotation of the substrate on which it is placed, typically using a sequence of rotational acceleration, constant rotational velocity, and rotational deceleration, typically over minutes, and typically ranging from 500 to 10,000 rpm with 1000, 3000, and 5000 rpm being typical values. Film Treatment: The resultant film (and/or each of the layers making up the multiple layers of the final multilayer film) may then be exposed to certain solution environments and/or vapor-phase environments, in combination with (or preceded by, or followed by, or both) elevation in temperature. Typical temperatures include room temperature, 60° C., 80° C., 100° C., 130° C., 150° C., 180° C., 200° C., 250° C., 300° C., 350° C., and 400° C. Typical times for various steps, both temperature steps and chemical treatment steps listed below, include 30 seconds, 1 minute, 3 minutes, 5 minutes, 10 minutes, 30 minutes, 1 hour, 14 hours, and 3 days. Typical solution-phase treatments include: Immersing the substrate and film in a solution of anhydrous acetonitrile and anhydrous toluene or anhydrous chloroform containing 0.1%, 1%, 2%, 5%, 10%, 20%, or 30% by volume one or more of the following chemicals: butylamine, ethanethiol, ethanedithiol, benzenethiol, benzenedithiol, hexanethiol, pyridine, hydrazine, Na2SO4, bismuth salts. Passing over the substrate and film, either while it is in a solution such as in (5)a. or not, a gas such as vapor-phase thiol, H2S, O2, H2O, or forming gas (H2:Ar or H2:N2 in a ratio such as 3.5:97.5 or 5:95).

Methods of making contacts will now be discussed. The materials needed to form the conducting portion of the injecting and withdrawing components may be formed using a variety of processes. In the fabrication of an integrated circuit that combines a CMOS silicon portion with the photoconductive overlayers described herein, the contacts may be fabricated within a CMOS foundry (e.g. TSMC, SMIC, UMC) using preexisting, standard processes. The processes employed may include evaporation sputtering, electroless deposition, or electrodeposition. If a previous layer that provides the desired layout for the final contact is preexisting on the substrate, then electrodeposition or electroless deposition may be used to substantially reproduce this spatial pattern with additional layers deposited on top.

Methods of forming an optional top semiconducting or insulating layer will now be discussed. The materials needed to form the semiconducting or insulating portion of the injecting and withdrawing components, whose purpose is to enhance further the selectivity in favour of the flowing carrier and against the trapped carrier, may be formed using a variety of processes. In the fabrication of an integrated circuit that combines a CMOS silicon portion with the photoconductive overlayers described herein, the contacts may be fabricated within a CMOS foundry (e.g. TSMC, SMIC, UMC) using preexisting, standard processes. The processes employed may include evaporation sputtering, electroless deposition, or electrodeposition. If a previous layer that provides the desired layout for the contact is preexisting on the substrate, then electrodeposition or electroless deposition may be used to substantially reproduce this spatial pattern with additional layers deposited on top.

Photoconductive photodetector pixels are sought that provide sensitive detection of low levels of light include a pixel comprising: an injecting contact; a withdrawing contact; and a photoconductive material comprising a colloidal quantum dot film that is in contact with each of the injecting contact and the withdrawing contact to form a phototransistor, wherein two types of carriers flow in the photoconductive material comprising electron flow and hole flow, and wherein photoconductor material composition is designed to controlling flow of the two types of carriers and affect signal-to-noise ratios.

In an embodiment, dark current flows in response to electrons.

In an embodiment, light flow in response to excess holes is related to a change in conductivity of the photoconductive material In an embodiment, a composition of a metal-semiconductor interface between the contacts and the photoconductive material control which if the two types of carriers is a flowing carrier.

In an embodiment, a composition of the photoconductive material controls a ratio of electron mobility to hole mobility.

In an embodiment, composition of the photoconductive material controls equilibrium carrier density.

In an embodiment, composition of the photoconductive material determines carrier lifetime, which improves lag.

Embodiments further include a colloidal quantum dot film photoconductive photodetector pixel, comprising: a substrate layer; an active layer comprising photoconductive material, wherein the photoconductive material comprises two carrier types comprising a hole type carrier and an electron type carrier, wherein one of the types is a flowing carrier and the other type is a trapped carrier; and an injecting contact proximate the photoconductive material, wherein under biasing conditions, the injecting contact injects the flowing carrier into the active layer with much greater relative efficiency than it withdraws the trapped carrier from the active layer into the contact; a withdrawing contact proximate the photoconductive material, wherein under biasing conditions, the withdrawing contact withdraws the flowing carrier from the active layer into the contact with much greater efficiency than it injects the trapped carrier into the active layer; and one or more overlayers.

In an embodiment, the one or more overlayers is proximate the withdrawing contact.

In an embodiment, the one or more overlayers is proximate the active layer.

In an embodiment, the flowing carrier has a mobility of at least 1E-5 cm2/Vs.

In an embodiment, the trapped carrier has a mobility that is at least 10× less than that of the flowing carrier.

In an embodiment, the trapped carrier has a density of trap states having lifetimes of between 1 microsecond to 1 second.

In an embodiment, the trapped carrier has a density of trap states having densities ranging from 1E12 cm-3 to 1E22 cm-3.

In an embodiment, biasing conditions for the pixel include a bias on the injecting contact, relative to the withdrawing contact, of a value selected from a group comprising +0.1 V, +1 V, +1.8 V, and +2.8 V, when the flowing carriers are holes. The polarity is opposite if the flowing carriers are electrons.

In an embodiment, biasing conditions for the pixel include a bias on the injecting contact, relative to the withdrawing contact, of a value selected from a group comprising −0.1 V, −1V, −1.8 V, and −2.8 V, when the flowing carriers are electrons.

In an embodiment, the one or more overlayers comprise one or more of: a passivation layer; an encapsulation layer; transparent dielectrics; optical filters; other pixels comprising other active layers and other contacts; and microlenses.

In an embodiment, the photoconductive material of the active layer comprises mutually-touching semiconductor nanoparticles comprising non-touching surfaces, and wherein the non-touching surfaces may be coated by one or more coatings selected from a group comprising: an inorganic material comprising an oxide or sulfate; and an organic material comprising an organic ligand.

In an embodiment, the mutually-touching semiconductor nanoparticles comprise a crystalline semiconductor selected from a group comprising: PbS, PbSe, PbTe; CdS, CdSe, CdTe; Si, Ge, C; In2Se3, In2S3, comprising an alpha-phase or a beta-phase; InP; and Bi2S3.

In an embodiment, an inorganic material coating the non-touching surfaces of the nanoparticles comprises one or more materials selected from a group comprising: PbSO4, PbO, PbSeO4, PbTeO4, and combinations thereof; SiOxNy in various proportions; In2O3 in various proportions; sulfur, sulfates, and sulfoxides; carbon and carbonates such as PbCO3; and metals and semimetals comprising an excess of Pb, Cd, In.

In an embodiment, an organic material coating the non-touching surfaces of the nanoparticles comprises one or more materials selected from a group comprising: Thiols comprising ethanethiol, ethanedithiol, benzenethiol, benzenedithiol; Amines comprising pyridine, butylamine, and octylamine; Hydrazine; and Carboxylates comprising oleic acid.

In an embodiment, a dimension of the active layer perpendicular to a direction of incident of light comprises between 100 nm and 3000 nm, and wherein a thickness of the active layer is chosen such that wavelengths of light of interest are substantially absorbed.

In an embodiment, the injecting contact and the withdrawing contact are made of the same material.

In an embodiment, the injecting contact and the withdrawing contact are made of different materials.

In an embodiment, at least one of the injecting contact and the withdrawing contact comprise a conductive material that comprises one or more materials selected from a group comprising: a metal; a degenerately-doped semiconductor; and a combination of a metal and a degenerately-doped semiconductor.

In an embodiment, the flowing carrier comprises holes, and wherein the injecting contact comprises one or more materials selected from a group comprising: Au, Pt, Pd, Cu, Ni, NiS, TiN, TaN, p-type polysilicon, and p-type amorphous silicon.

In an embodiment, the flowing carrier comprises electrons, and wherein the injecting contact comprises one or more materials selected from a group comprising: Al, Ag, In, Mg, Ca, Li, Cu, Ni, NiS, TiN, TaN, n-type polysilicon, and n-type amorphous silicon.

In an embodiment, at least one of the contacts comprises: a first layer comprising one or more materials selected from a group comprising: a metal; a degenerately-doped semiconductor; and a combination of a metal and a degenerately-doped semiconductor; and a second layer comprising one or more materials selected from a group comprising: a semiconductor; and a material having a bandgap.

In an embodiment, the second layer comprises mutually-touching semiconductor nanoparticles, and wherein p-type doping is used when holes are the flowing carrier in the active layer.

In an embodiment, the second layer has a thickness of approximately 5 nm to 50 nm.

In an embodiment, the second layer has p-type doping of a concentration selected from a group comprising: 1E16 cm-3; 1E18 cm-3; and 1E20 cm-3.

In an embodiment, the second comprises one or more of an amorphous material and a polycrystalline material selected from a group comprising: PbSnTe; As2S3; As2Se3; SiO2; Si3N4; and SiOxNY.

Embodiments further include a method of making a photoconductive photodetector that achieves sensitive detection of low levels of light, the method comprising: forming an active photoconductive layer comprising synthesizing colloidal quantum dot having a size in a range of 1 nm to 10 nm; producing at least one thin solid film from a solution containing the colloidal quantum dots; treating the at least one thin solid film, comprising, exposure to at least one of solution-phase environments and vapor-phase environments; and elevation in temperature.

An embodiment further comprises forming contacts, including forming a conductive layer of the contacts by one or more processes selected from a group comprising evaporation sputtering, electroless deposition, and electrodeposition.

An embodiment further comprises forming a semiconducting layer of the contacts by one or more processes selected from a group comprising evaporation sputtering, electroless deposition, and electrodeposition.

An embodiment further comprises: nonparticle washing using a nonsolvent to cause the quantum dots to precipitate; centrifuging the quantum dots, comprising centrifuging at a high rotational rate; and redispersing the quantum dots in a new solvent.

In an embodiment, the high rotational comprises rates in a range of 10,000 rpm to 13,000 rpm.

An embodiment further comprises a solution-phase ligand exchange comprising: using a nonsolvent to cause the quantum dots to precipitate; redispersing the quantum dots in a new solvent that incorporates at least one species; and leaving the new dispersion for a period.

In an embodiment, the period comprises a brief period of 1 minute to 5 minutes, and a more extended period of multiple days, and wherein the new dispersion is left at a temperature comprising room temperature and elevated temperature comprising 60° C. and 80° C.

An embodiment further comprises: leaving the new dispersion in an environment comprising an inert environment, and an environment in which additional reagents have been introduced; and precipitating and redispersing the colloidal quantum dots.

In an embodiment, producing at least one thin solid film further comprises one or methods chosen from a group comprising spin-casting, wherein, a droplet of the solution is dispensed onto surface comprising one of a substrate and an integrated circuit; and the droplet is induced to spread and dry through the rotation of the surface.

In an embodiment, rotation of the surface comprises a sequence of rotational acceleration, constant rotational velocity, and rotational deceleration over minutes, wherein rotation rates range from 500 rpm to 10,000 rpm.

In an embodiment, elevation in temperature in treating the at least one thin solid film comprises one or more temperatures selected form a group comprising room temperature, 60° C., 80° C., 100° C., 130° C., 150° C., 180° C., 200° C., 250° C., 300° C., 350° C., and 400° C.

In an embodiment, elevation in temperature is for a period selected from a group comprising 30 seconds, 1 minute, 3 minutes, 5 minutes, 10 minutes, 30 minutes, 1 hour, 14 hours, and 3 days.

In an embodiment, exposure to solution-phase environments comprises immersing in a solution of anhydrous acetonitrile and one of anhydrous toluene and anhydrous chloroform containing 0.1%, 1%, 2%, 5%, 10%, 20%, or 30% by volume one or more of chemicals selected from a group comprising butylamine, ethanethiol, ethanedithiol, benzenethiol, benzenedithiol, hexanethiol, pyridine, hydrazine, Na2SO4, and bismuth salts.

In an embodiment, exposure to vapor-phase environments comprises passing over the thin solid film a gas comprising one or more of as vapor-phase thiol, H2S, O2, H2O, and forming gas, including H2:Ar or H2:N2 in a ratio comprising 3.5:97.5 or 5:95.

In an embodiment, the exposure to vapor-phase environments occurs while the thin film immersed in a solution of anhydrous acetonitrile and one of anhydrous toluene and anhydrous chloroform containing 0.1%, 1%, 2%, 5%, 10%, 20%, or 30% by volume one or more of chemicals selected from a group comprising butylamine, ethanethiol, ethanedithiol, benzenethiol, benzenedithiol, hexanethiol, pyridine, hydrazine, Na2SO4, and bismuth salts.

Photodetectors compatible with video frame rates, and possessing photoconductive gain, are now discussed. Embodiments described herein include a photoconductive photodetector in which substantially a single chemical species has associated with it a substantially single energy depth and thus, at a given temperature, a substantially single trap state lifetime, and thus a substantially single temporal component associated with the rise and fall of photocurrent during incident optical transients. Embodiments include photoconductive photodetectors where the single chemical species is PbSO3 (lead sulfite); the single energy depth is approximately 0.1 eV; at room temperature the substantially single trap state lifetime is ~30 milliseconds; the substantially single temporal component associated with the rise and fall of photocurrent is ~30 milliseconds. In embodiments the following are not substantially included into the photoconductive medium: lead sulfate PbSO4, having depth 0.3 eV or greater, and having transient component of order seconds; lead carboxylate, having depth 0.2 eV or greater, and having transient component of order half a second or more.

Note also that other chemical species may be present if they do not have associated with them trap states. For example PbS may be used as the basis for the photoconductive semiconductor medium; and organic ligands such as ethanethiol, ethanedithiol, butanethiol, butanedithiol, hexanethiol, hexanedithiol, dodecanethiol, and dodecanedithiol, and their complexes with Pb, may all be included.

FIGS. 41-51 illustrate embodiments that include controlling temporal response of photoconductive photodetectors via selective introduction of surface trap states.

Photoconductive photodetectors have recently been shown to exhibit high gains (>1000) and outstanding sensitivities ($D^* > 10^{13}$ Jones). One ostensible disadvantage to exploiting photoconductive gain is that the temporal response is limited by the release of carriers from trap states. Embodiments include introduction of specific chemical species on colloidal quantum dot surfaces that introduce only a single, desired trap state having a predetermined lifetime. Embodiments include devices that exhibit an attractive photoconductive gain (>10) combined with a response tie (~25 milliseconds) useful in imaging. Methods of achieving this include providing for a substantially single surface species—lead sulfite—while eliminating the presence of lead sulfate and lead carboxylate. Embodiments thus include photodetectors that preserve the outstanding sensitivity of these devices, achieving a specific detectivity of $10^{12}$ Jones in the visible, while generating a temporal response suited to imaging applications.

Temporal response is important in photodetection. If the response of a photodetector to an optical transient exceeds the frame period, then lag, or ghosting, will be perceptible in the image. Conventional imaging applications typically require frame rates in the range of 10, 15, 30, or 60 frames per second. Temporal responses having time constants in the range of tens of milliseconds are thus required.

There exists a high degree of interest in novel materials, and novel processing methods, for the realization of innovative imaging systems. Solution-processed optoelectronic materials offer large area at low cost[4]; the benefits of physical flexibility; the 100% fill factor associated with a top-surface photodetector technology[5]; and the capacity to sense wavelengths, such as those in the short-wavelength IR[6], not accessible to conventional electronic materials such as silicon.

Certain embodiments of colloidal quantum dot photodetectors have exhibited either superb sensitivities (D*>1E13 Jones) but slow response (hundreds of millisecond transients); or rapid response (MHz and above but low sensitivity ($D^* < 10^{10}$ Jones)[8].

Embodiments now described include careful control over materials composition that results in engineering of the temporal response of photoconductive photodetectors to achieve outstanding sensitivity and acceptable temporal response simultaneously.

Photoconductive gain is given by $\tau_c/\tau_t$, where $\tau_t$ is the time for the flowing carrier to transit the extent of the device, and $\tau_c$, is the carrier lifetime. From a sensitivity point of view alone, this argues for longer trap state lifetimes. However, the transient response is directly determined by the carrier lifetime. The challenge of practical photoconductive photodetector design is thus to establish a suitable balance between gain and transient response; and to control material composition with care to implement the resultant design.

Figure 41:
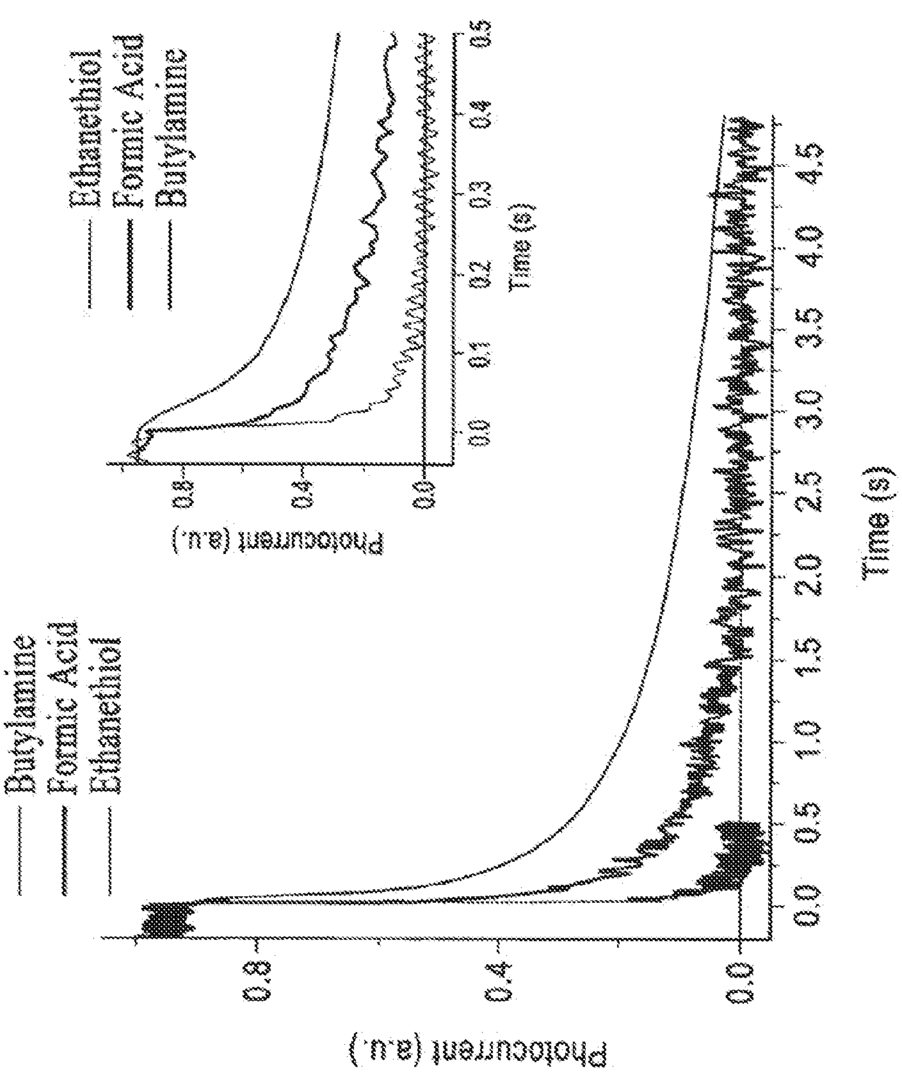
Figure 42:
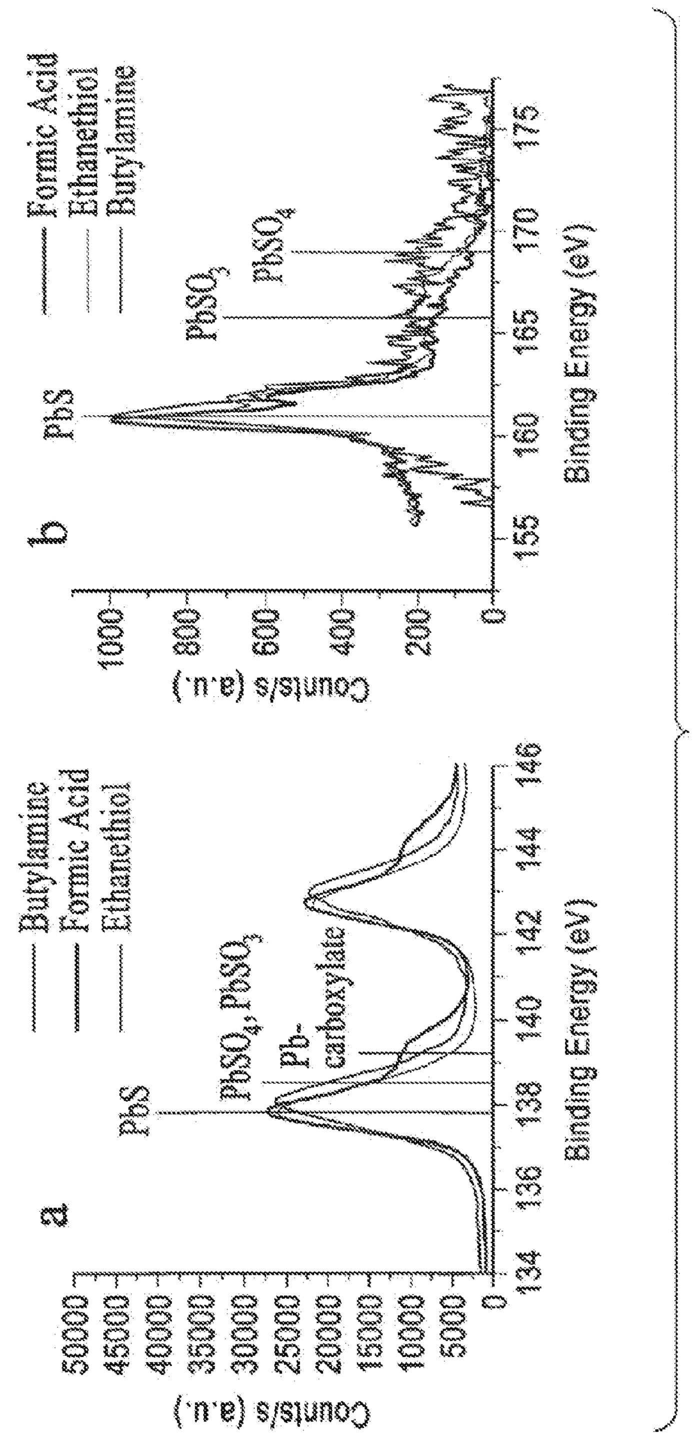
Figure 43:
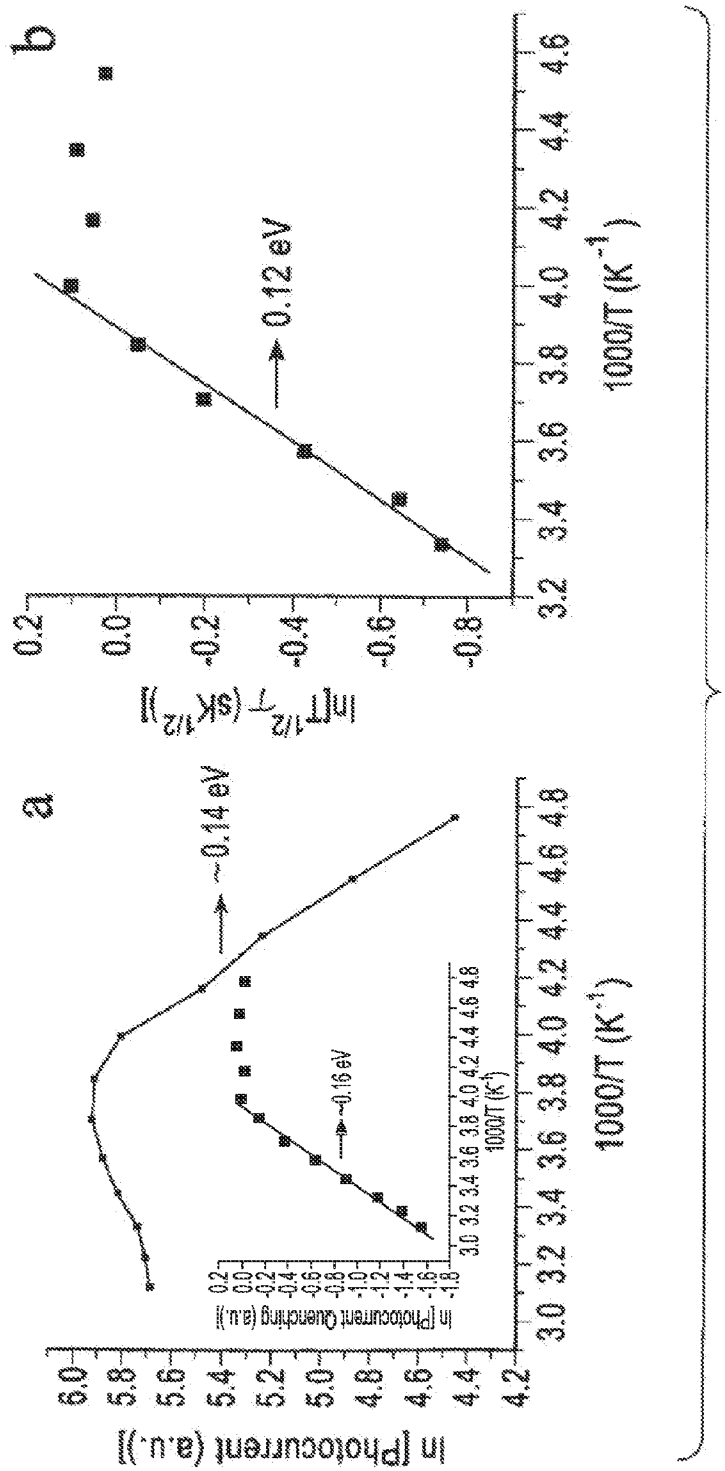
Figure 44:
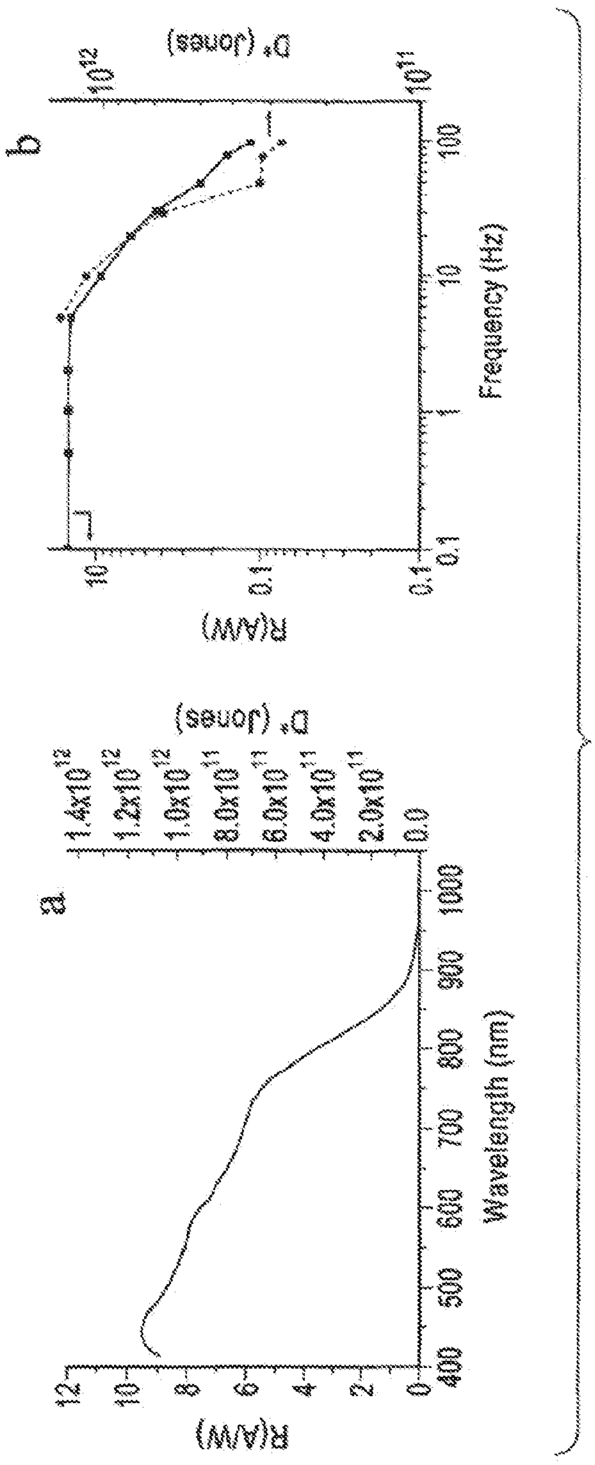

Energy levels associated with trap states in PbS colloidal quantum dot photodetectors having gains of order hundred A/W have been investigated. In cases, three sensitizing centers the energy levels of which resided approximately 0.1, 0.2 and 0.34 eV from the conduction band, resulted in carrier lifetimes of ~60 ms, 300 ms and 2000 ms (FIG. 41). Though the shortest lifetime of 30 ms is suited for many imaging applications, the longer ones, which dominate at lower optical intensities in view of their lower energies, introduce unacceptable lag.

In embodiments, photoconductive devices were fabricated by spincoating as-synthesized nanocrystals, the first excitonic peak of which was at 790 nm, capped with oleic acid on pre-patterned interdigitated gold electrodes. The thickness of the devices reported herein was kept constant around 250 nm. The active area of the device is determined by the 5 μm separation of the electrodes and multiplied by their 3 mm length. For illumination a red LED was used at 642 nm with optical intensity of 3.1 $\mu W/cm^2$ unless otherwise stated. The bias applied to the devices studied herein was 10 V, corresponding to an electric field of 2 V/μm. Photoconductive measurements were performed with devices loaded in a cryostat under vacuum conditions so that oxygen and moisture chem-absorption effects are eliminated.

XPS analysis of butylamine (BA) treated nanocrystals revealed the existence of lead sulfate ($PbSO_4$), lead sulfite ($PbSO_3$), and lead carboxylate attributable to oleic acid ligands attached to the nanoparticles' surfaces. XPS analysis of the S2p signal yields a peak at 165.5 eV attributable to $PbSO_3$ and a peak 167.8 eV resulting from $PbSO_4$ (FIG. 42*b*) whereas Pb4f signal analysis revealed oxidized states attributable to $PbSO_4$ and $PbSO_3$ at 138.5 eV and a highly oxidized state of Pb found at 139.1 eV attributable to Pb-carboxylate (FIG. 42*a*). To verify this last finding, we carried out XPS on Pb-oleate (the same used for PbS nanocrystal synthesis), revealing a single peak of Pb at 139.1 eV (see supplementary material for detailed analysis of XPS results).

Lead carboxylate peak (attributable to the oleic acid—Pb bond) was then correlated with a corresponding sensitizing trap state having a specific temporal response. We treated nanocrystal films with a 30% by volume solution of formic acid in acetonitirile to exchange the long oleic acid ligand with a shorter one. In so doing we reduced internanoparticle spacing while preserving the carboxylate moiety bound to Pb atoms on the nanocrystal surface. In this way, we transformed insulating devices into photoconductive detectors. Temporal measurements of photocurrent response revealed a main time constant of ~400 ms (FIG. 41) and also a faster component with time constant ~33 ms. XPS revealed an oxidized component to the Pb4f signal at 139.1 eV characteristic of the Pb-carboxylate group, as illustrated in FIG. 42*a* as well as a signal at 138.5 eV arising from the existence of $PbSO_3$ as verified by the S2p signal (FIG. 42*b*). This evidence suggests that either Pb-carboxylate or $PbSO_3$ serves as a sensitizing species having an (undesirably long-lived) ~420 ms time constant.

Complete removal of the oleate ligands is therefore required in order to assign the 400 ms time constant to a specific oxide species. We sought a ligand, short enough to promote transport, and lacking carboxylate functionality. To make the replacement of the carboxylate-terminated ligand thermodynamically favourable, we posited that we would require an endgroup that would bind to the Pb more strongly than Pb-carboxylate. We selected ethanethiol for its short length and thiol moiety expected to bind strongly with Pb. We treated the devices by dipping in 40% by volume ethanethiol in acetonitrile for approximately 5 minutes. We removed the device from solution, rinsed with acetonitrile, and dried.

From the absence of Pb4f peak at around 139.1 eV (FIG. 42*a*) we conclude that oleate ligands were indeed entirely removed from the nanocrystal surface. Thiol treatment also removed polysulfites and lead sulfate from the nanocrystal surface leaving $PbSO_3$ as the sole oxidized species (FIG. 42*b*). Transient photocurrent measurements showed that ET treated nanocrystal films exhibited a single transient component having a ~27 ms time constant at room temperature (FIG. 41).

We found that PbS nanocrystal films having lead sulfate ($PbSO_4$), lead sulfite ($PbSO_3$), and lead carboxylate manifested photocurrent decays having time constants ~2 s, 300 ms and ~60 ms. PbS nanocrystals possessing lead carboxylate and $PbSO_3$ exhibited a photocurrent decay with time constants ~420 ms and ~33 ms. Thiol treated nanocrystals on which only lead sulfite was present exhibited a single photocurrent relaxation time constant of ~27 ms. We confirmed the association between the sulfate and the long two-second time constant ageing a thiol-treated device in ambient for several hours. We found that a slow component emerged having the several-second time constant, and found using XPS that significant growth of lead sulfate had taken place (see supplementary material).

We sought to investigate in greater detail the energy level associated with the desired 25 millisecond trap state. FIG. 43*a* shows the photocurrent as a function of temperature. At low temperatures, where the sensitizing centers are not thermally quenched, and therefore the devices are fully sensitized, responsivity increases with temperature following the mobility thermal activation of 0.14 eV similarly reported for such materials. At elevated temperatures, photocurrent quenching takes place as a result of thermal deactivation of the sensitizing center. The slope of the quenching rate with temperature (inset of FIG. 43*a*) yields an activation energy 0.16 eV from the conduction band. This agrees well with previous reports of the shallowest center in butylamine treated PbS nanocrystal photodetectors. We ascertained the same activation energy using an independent method, investigating the dependence of the photocurrent transient on temperature[12]. Using this method we ascertained the sensitizing center's energy to be 0.12 eV below the conduction band, in reasonable agreement with the responsivity quenching results (FIG. 43*b*).

Results of full characterization of the thiol-treated device are now discussed, focusing on its applicability to imaging applications requiring the combination of sensitivity and acceptable temporal response. The spectral responsivity is reported in FIG. 43*a*. Responsivity was measured at intensity levels of ~300 $nW/cm^2$ using a 642 nm LED. The device was biased to 10 V. We measured the noise current in the device[15] and plot in FIG. 43*a* the detectivity, D*. Sensitivity is retained without compromise: D* greater than $10^{12}$ Jones is obtained across the visible spectrum. FIG. 43*b* also illustrates the device responsivity and detectivity as function of modulation frequency. The absence of long lived trap states is evident from the flat response of responsivity at frequencies below 5 Hz where the sensitizing centers associated with the ~400 ms and ~2 s time constants would determine the responsivity roll-off.

Embodiments described herein thus provide fine-tuning of device performance at the macroscopic level via careful manipulation of the existent material species on the nanocrystal surface. We showed that we can transform a very slow photoconductive photodetector with photocurrent decay taking place within several seconds to a faster photoconductor with photocurrent time constant in the order of 25 ms. We achieved this without sacrificing in photoconductive gain by further reducing the internanoparticle spacing. This work demonstrates also that thorough investigation and control of the nanocrystal surface materials enables tailoring of the optoelectronic properties that could find applications in progressing not only photoconductivity as illustrated herein but also optical emission or photovoltaics.

FIGS. 44*a* and 44*b* show spectral responsivity an detectivity of devices as labeled in the figure.

FIG. 45 is a summary of correlation between oxide species and photocurrent time as labeled in the figure.

Figure 46A:
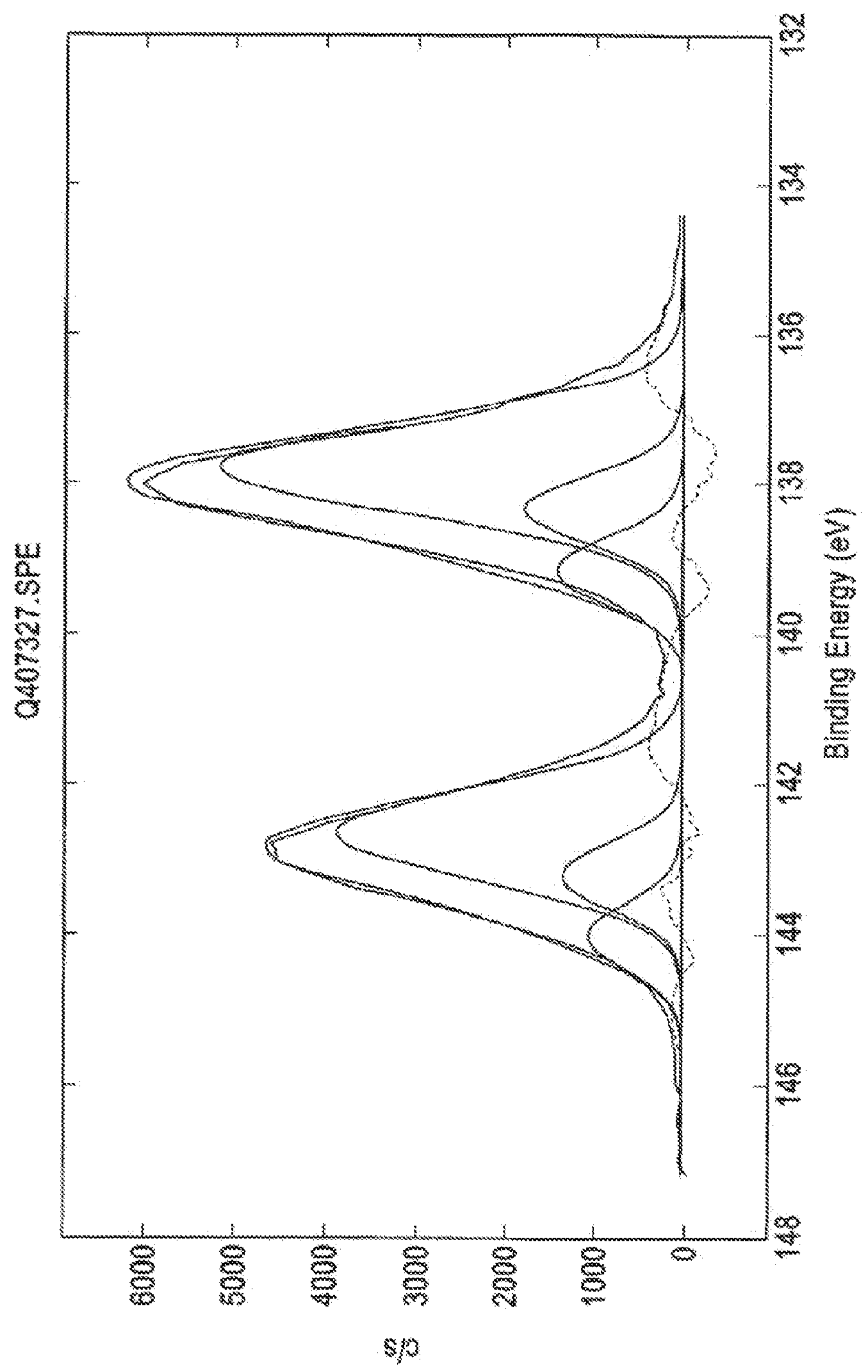
Figure 46B:
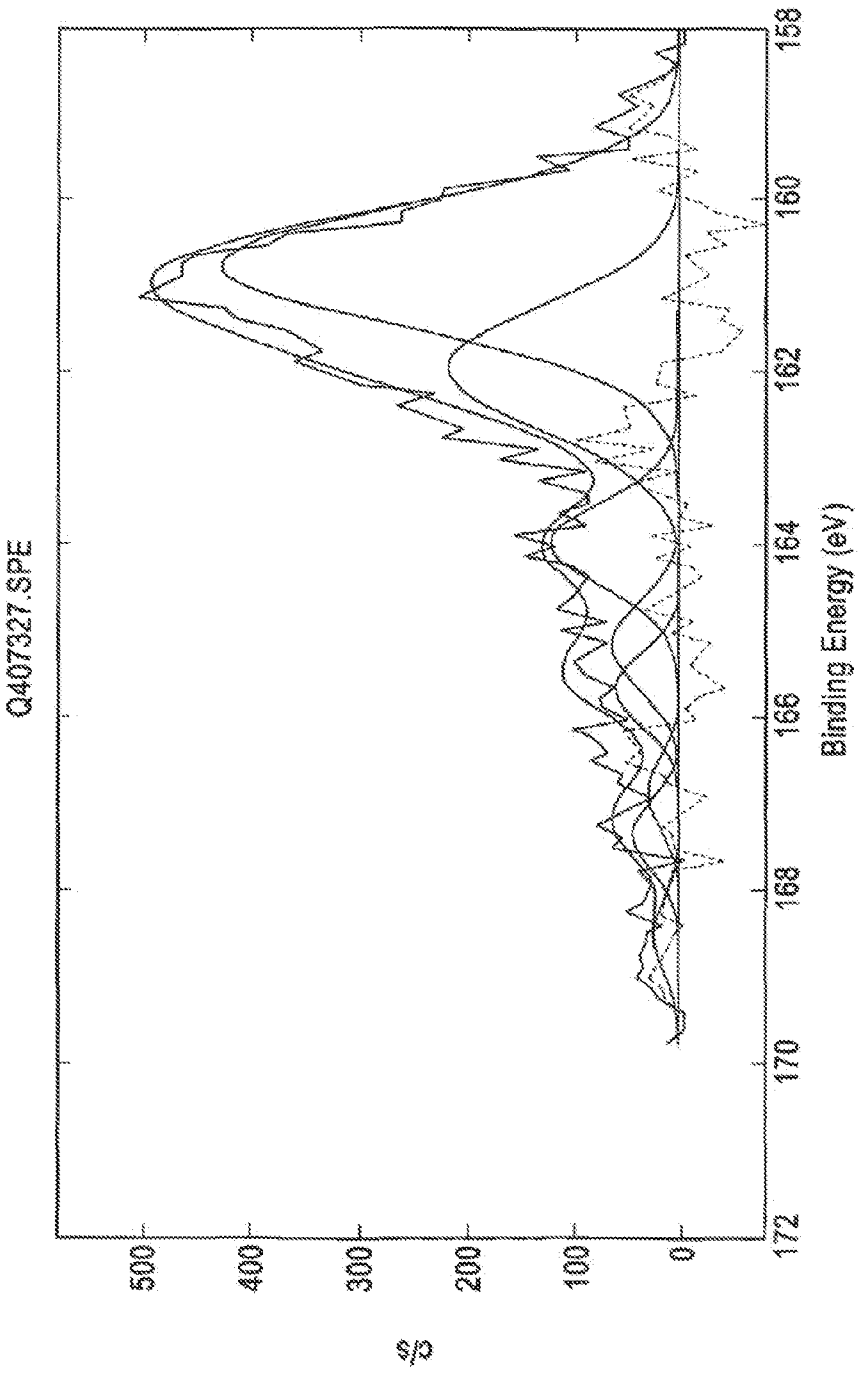

FIGS. 46*a* and 46*b* show XPS analysis of variously treated PbS nanocrystal films as labeled in the figure.

Figure 47:
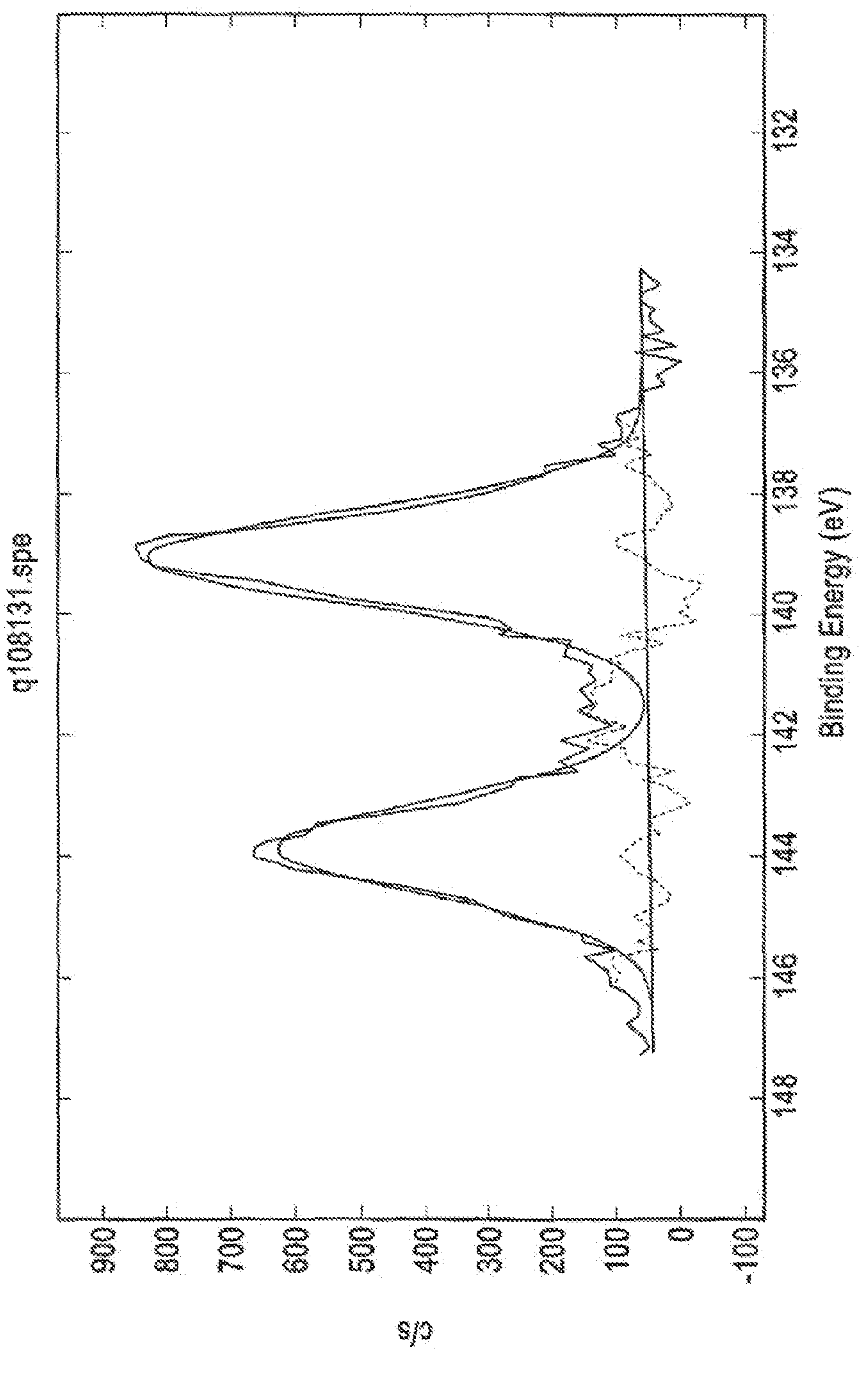

FIG. 47 is a diagram illustrating observed performance of a Pb-oleate embodiment as labeled in the figure.

Figure 48A:
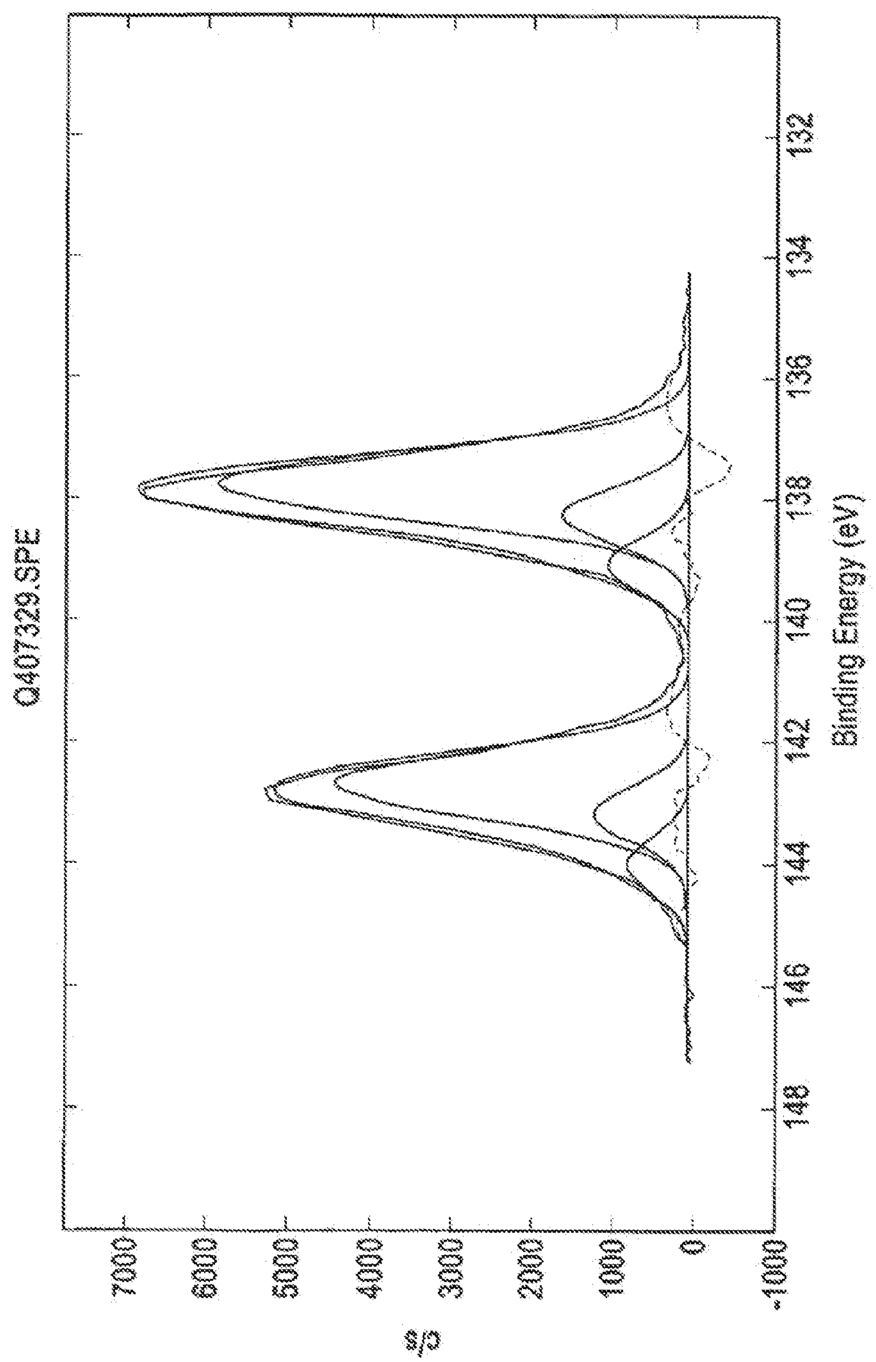
Figure 48B:
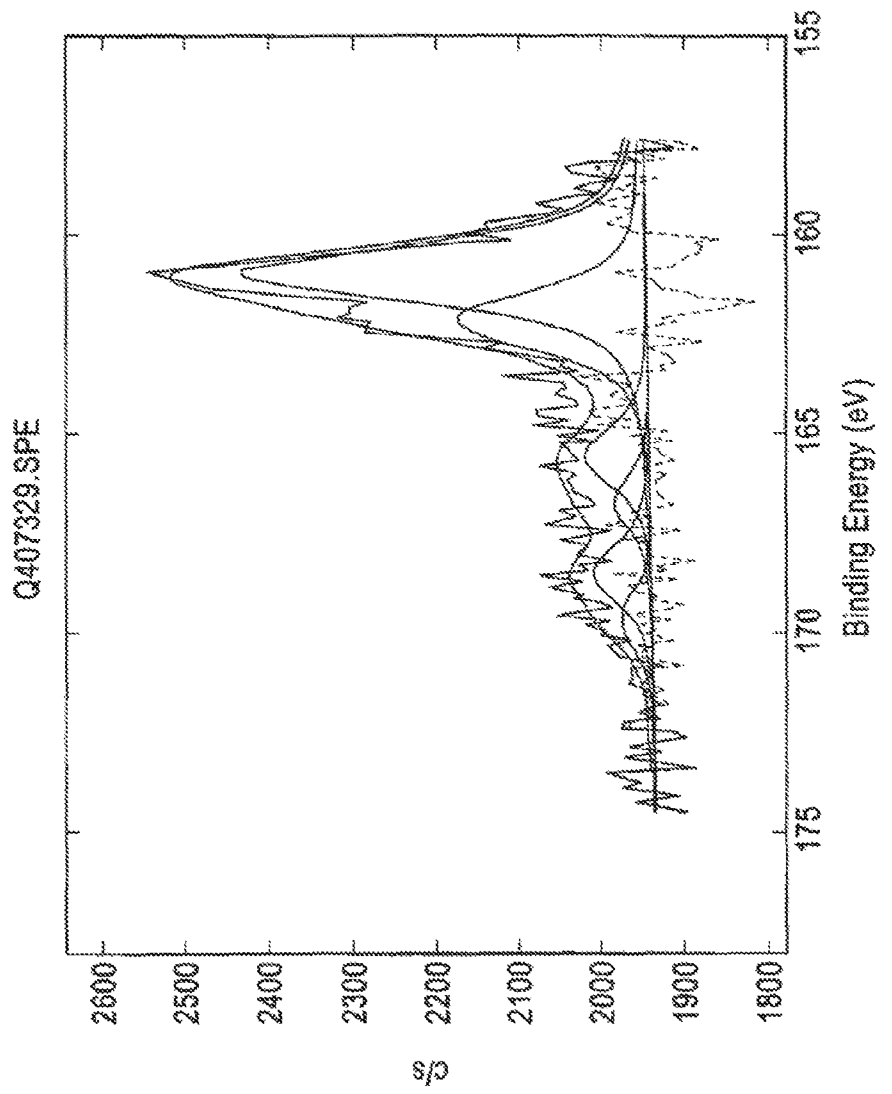

FIGS. 48*a* and 48*b* illustrate observed performance of Butylamine treated nanocrystals as labeled in the figure.

Figure 49A:
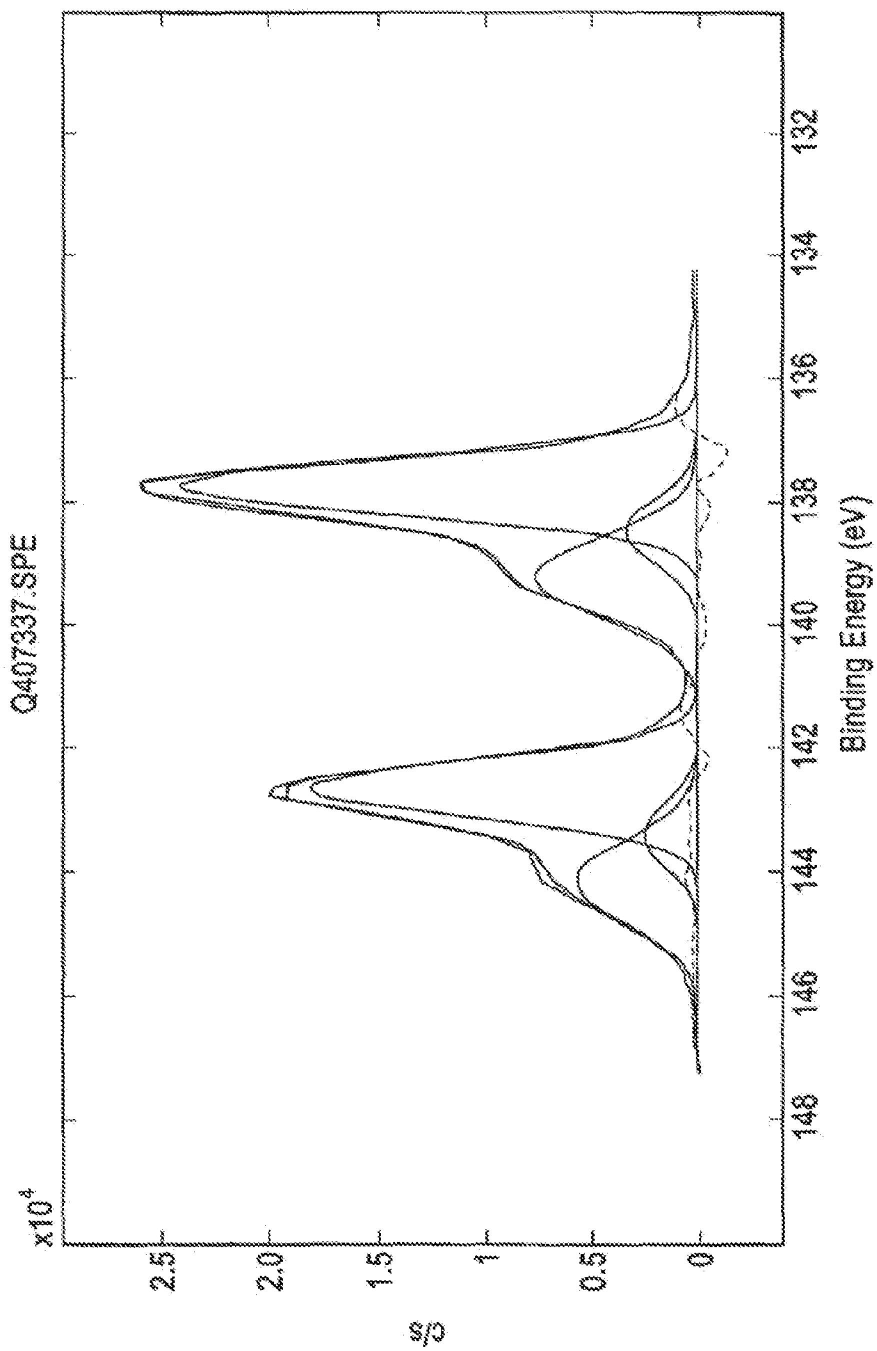
Figure 49B:
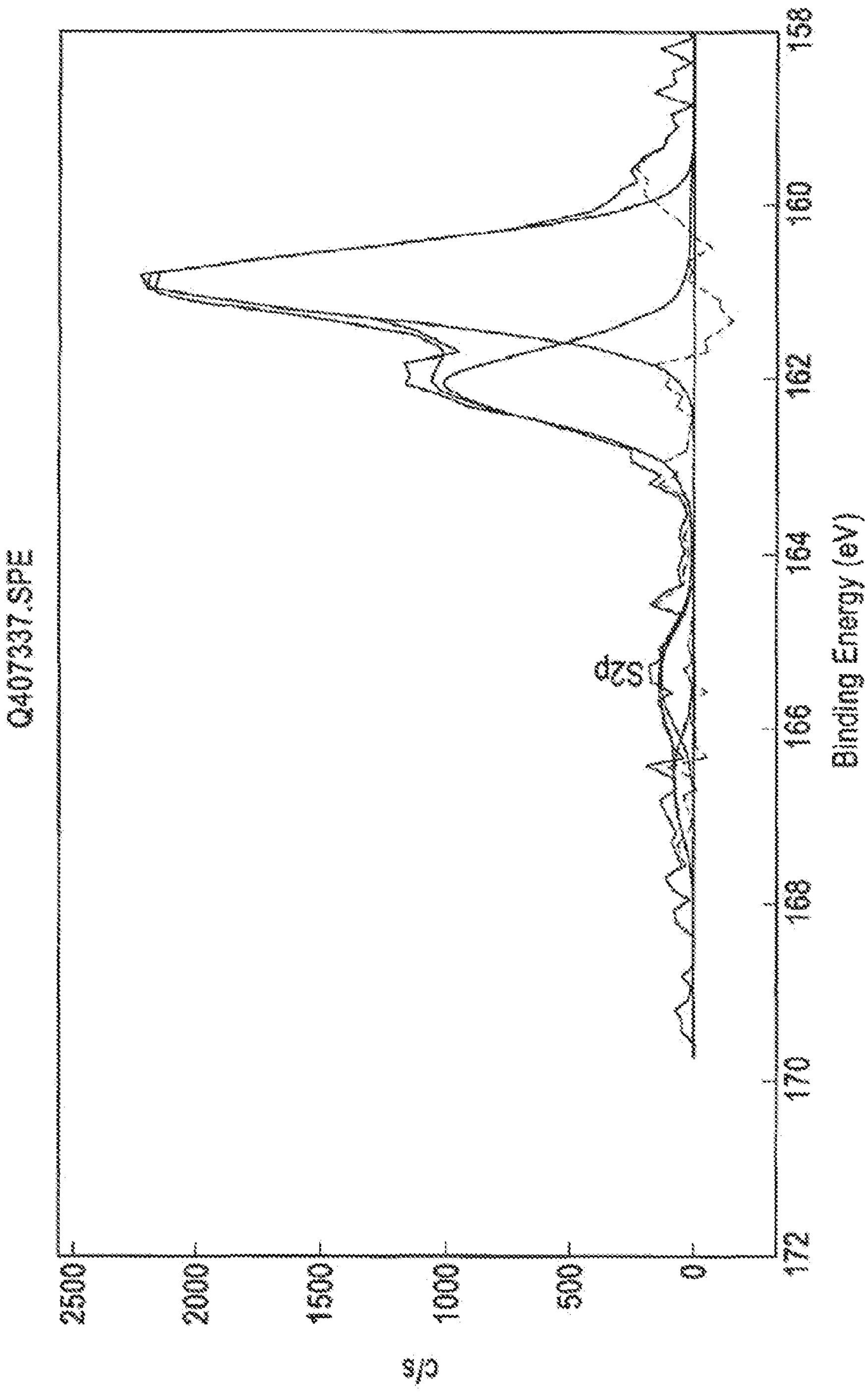

FIGS. 49*a* and 49*b* illustrate observed performance of Formic Acid treated nanocrystals as labeled in the figure.

Figure 50A:
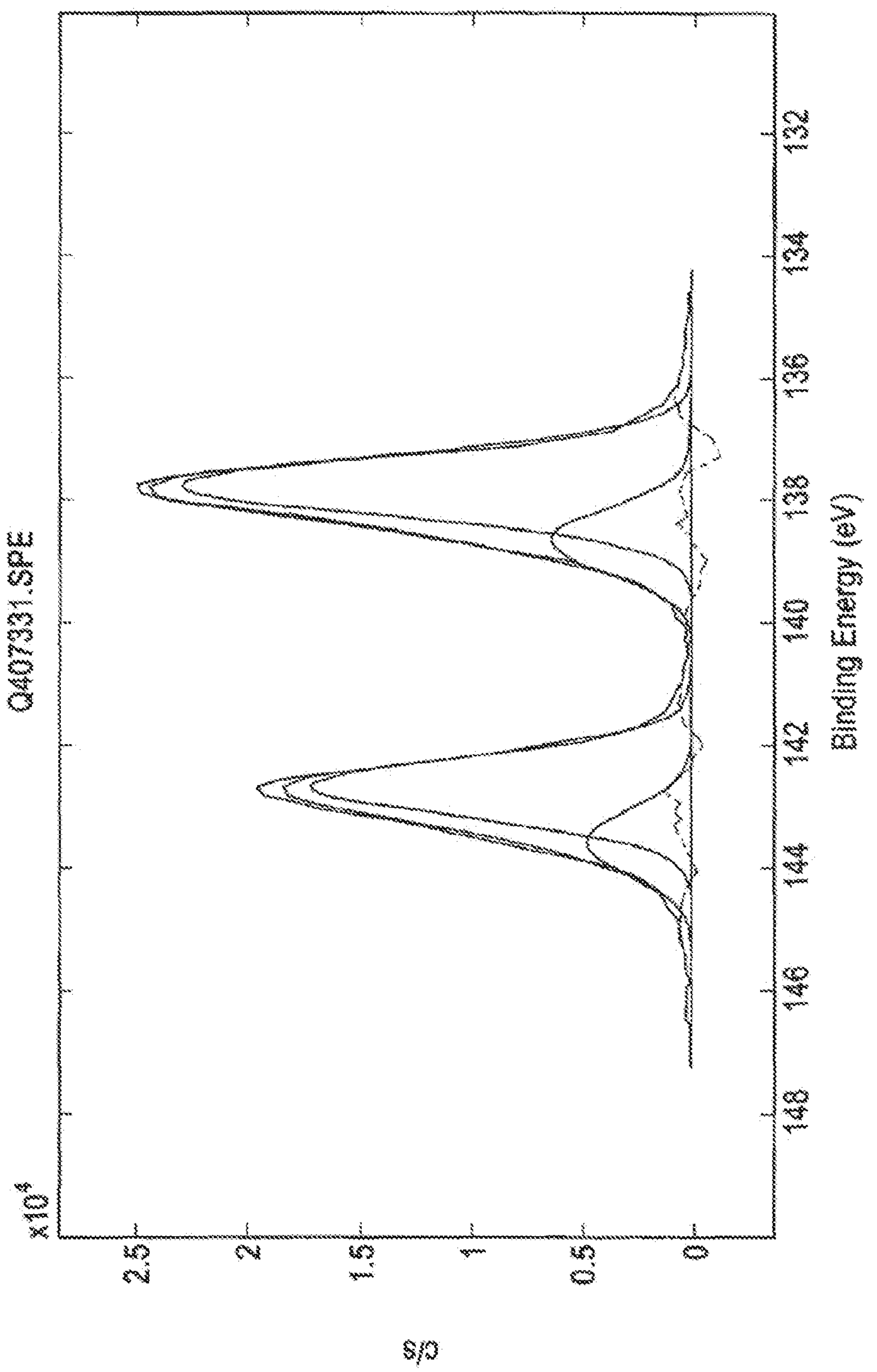
Figure 50B:
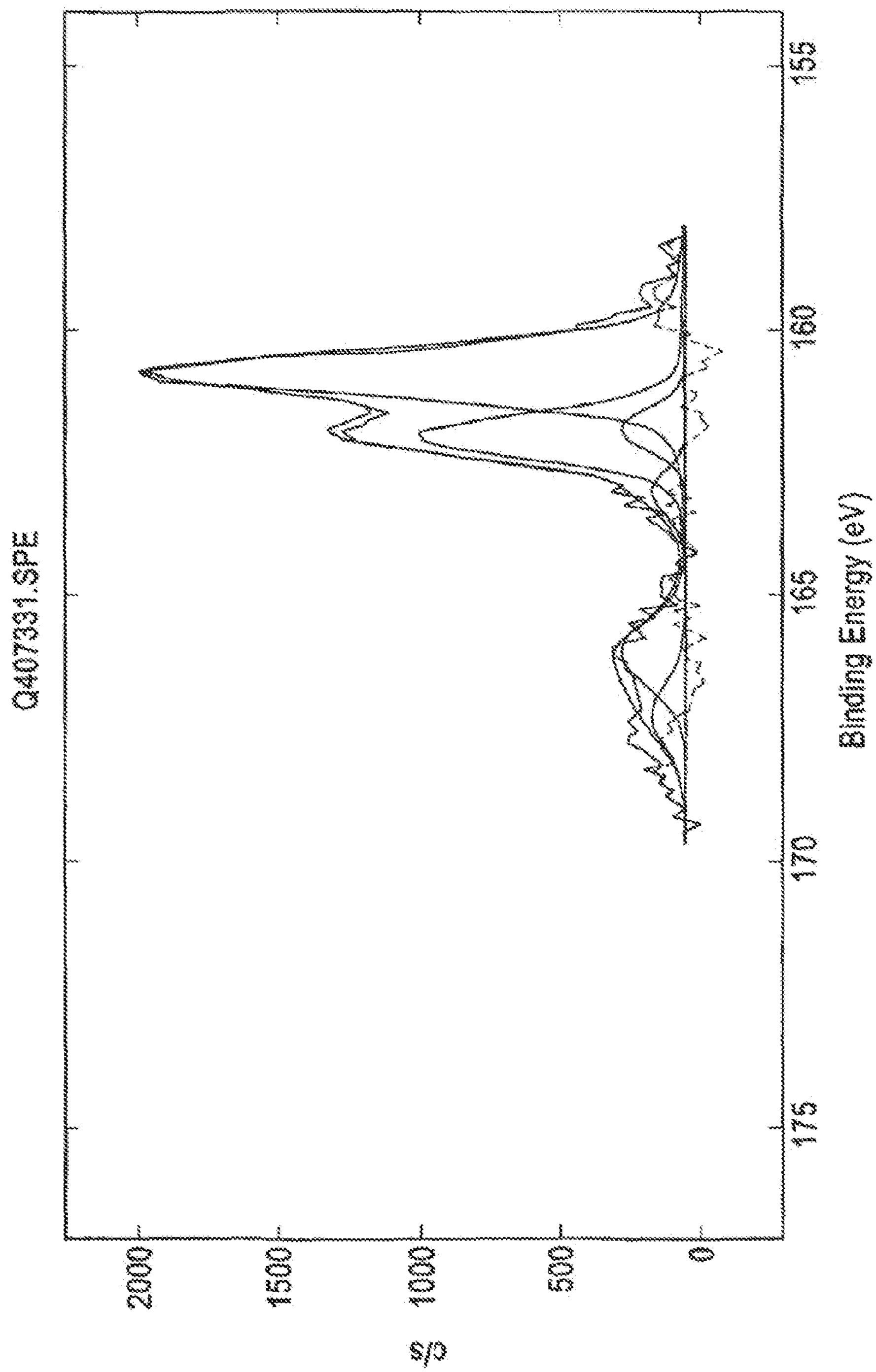

FIGS. 50*a* and 50*b* illustrate observed performance of Ethanethiol treated nanocrystals as labeled in the figure.

FIG. 51 is a diagram illustrating observed performance of Ethanethiol treated nanocrystals aged in ambient as labeled in the figure.

Alternative embodiments and methods of making high-performance solution-processed photodetectors for imaging applications are now discussed. Photoconductive photodetectors provide tremendous sensitivities to low light—D* (normalized detectivity) greater than 1E12 Jones have been shown—however they come at the expense of dark current.

Photodiodes, in contrast, can be operated unbiased, and thus can have essentially zero dark currents. Embodiments include a photodiode-based photodetector having high external quantum efficiency; low dark current (<0.1 nA/cm2); 3 dB bandwidth>1 kHz (already well-suited to imaging)

Embodiments include a device consisting of a stack of (a) A deep-work-function electrical contact; (b) A colloidal quantum dot solid; (c) A shallow-work-function electrical contact At least one of the two contacts is substantially transparent. Embodiments include the preceding devices where (a) Consists of Au, Pt, Pd, Ni, Cu, or Au-rich, Pt-rich, Pd-rich ITO, or deep-work-function ITO; where (b) Consists of colloidal quantum dots such as PbS, CdS, In2S3, In2Se3, Bi2S3, Bi2Se3, CuInGaSe; organic ligands such as oleic acid (or other carboxylic acids), benzenethiol (or other thiols), or butylamine (or other amines); bidentate organic ligands such as butanedithiol, benzenedithiol, ethanedithiol, hexanedithiol; oxides, sulfates, and hydroxides of the species making up the colloidal quantum dot; (c) Consists of Al, Mg, Ca, or deep-work-function ITO. Embodiments include devices wherein the colloidal quantum dot solid is substantially fully depleted. Embodiments include devices wherein the colloidal quantum dot solid contains a region that is substantially fully depleted; and also a region that is substantially quasi-neutral. Embodiments include devices where the external quantum efficiency is greater than 40%, or 60%, or 80%, or 90%; where the dark current density is approximately 0.1 nA/cm2, or 0.01 nA/cm2, or 1 pA/cm2, or 0.1 pA/cm2; where, following the turn-off of incident illumination, the device returns to its dark current value within 10 milliseconds, or 1 millisecond, or 0.1 milliseconds, or 10 microseconds, or 1 microsecond, or less; where, following the turn-on of incident illumination, the device rises to its steady-state light-current value within 10 milliseconds, or 1 millisecond, or 0.1 milliseconds, or 10 microseconds, or 1 microsecond, or less.

Embodiments include solution-processed photodiode photodetector with a >60 kHz bandwidth, D*>1e12 cm·$\sqrt{Hz}$·$W^{-1}$, and dark current density of 0.1 nA·$cm^{-2}$. This represents a >3300 fold improvement in response speed and >11 order-of-magnitude reduction in dark current density over the most sensitive solution-processed photodetectors, and a 100,000 fold improvement in sensitivity over the fastest spectrally-tunable solution-processed photodetectors. This performance was achieved through optimization of the inherently fast photodiode detector architecture for increased sensitivity. Device operation is examined in detail and explained in terms of photogenerated carrier transport.

Solution-processed semiconductors have demonstrated great potential for fabrication of highly-sensitive photoconductive photodetectors operating in both the visible and the infrared. However, these devices can often respond slowly to changes in illumination. Solution-processed photodetectors based on a photodiode architecture offer broad-bandwidth and highly-uniform frequency response, but are limited by low sensitivity.

Figure 52:
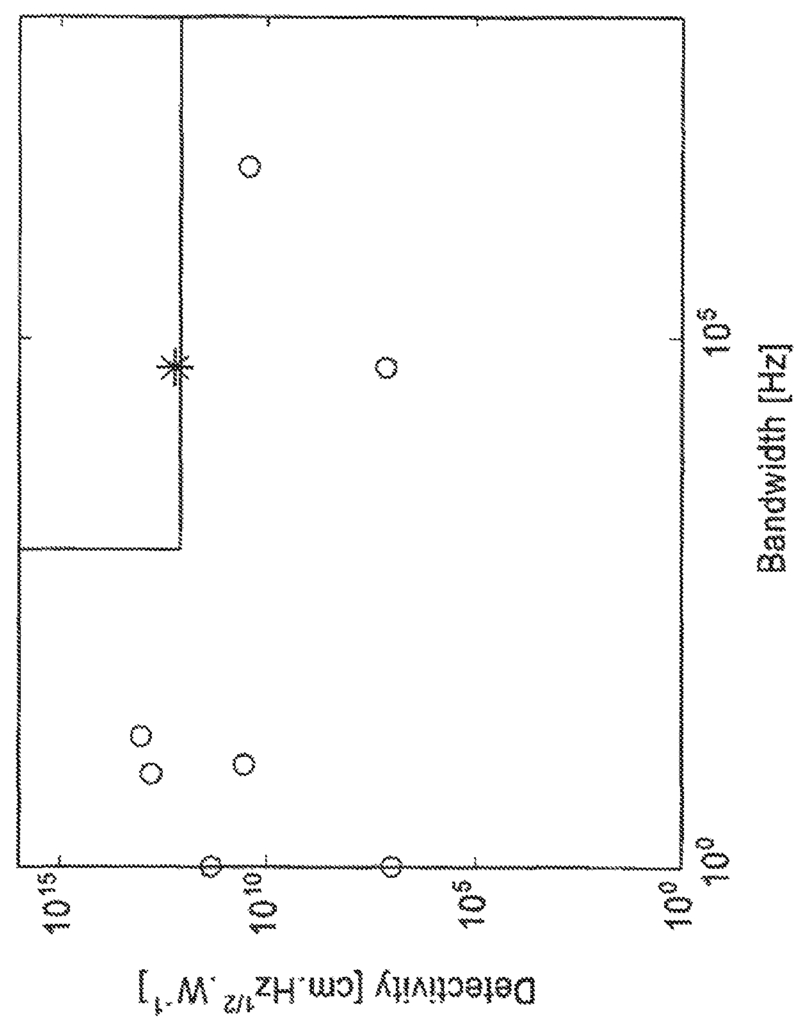

FIG. 52 shows the bandwidth and sensitivity of examples of the fastest and most-sensitive solution-processed photodetectors reported to date.

The use of colloidal quantum dots (CQD) offer benefits over organic solution processed semiconductors: spectral functionality spanning both the visible and infrared, and direct control over absorption onset through the quantum size effect. Operation at IR wavelengths allows detection of light transmitted through atmospheric, biological, and materials absorption windows, dramatically increasing the range of potential applications of a photodetector. As the absorption onset of a semiconductor is moved toward longer wavelengths, the rate of thermal noise generation increases, limiting the sensitivity of a photodetector. By tuning the absorption onset to include only the wavelengths of interest, thermal noise at longer wavelengths is rejected.

Additional benefits realized with the photodiode architecture include zero or low voltage operation, very low power dissipation, and a highly-linear signal response to changes in illumination intensity and modulation frequency. Low dark current allows CQD photodiodes to be used directly in place of crystalline detectors, as dark-current and photocurrent densities are very similar. In contrast, previously demonstrated photoconductive detectors have very large dark and photocurrent densities, requiring the development of new signal processing circuitry capable of extracting high quality signals from the large currents.

Solution-processable semiconductors offer low-cost, large-area, flexible structures, and compatibility with a wide range of substrates, enabling direct integration into emerging technologies such as integrated organic circuits, micro-fluidics, and integrated optical circuitry, as well as commercial microelectronics. Solution-processed semiconductors have demonstrated great potential for fabrication of highly-sensitive photodetectors operating in both the visible and the IR. However, these photoconductive devices respond very slowly to changes in illumination. In contrast, solution-processed photodetectors based on a photodiode architecture offer broad-bandwidth and highly-uniform frequency response, but are limited by low sensitivity.

The structural compatibility of solution-processed semiconductors with substrates ranging from flexible plastics to metals, glasses and other semiconductors arises from the absence of the crystal lattice matching requirements inherent in crystalline semiconductors. Solution-processed semiconductors include organic materials such as polymers and small-molecules, and organic-inorganic hybrids such as colloidal quantum dots.

The sensitivity of a detector describes its ability to resolve very low intensity optical signals. This limit is characterized by the noise equivalent power (NEP=$i_n/R_i$), in units of Watts, and is proportional to the total internal noise current ($i_n$) in the device divided by its responsivity ($R_i$)—the electrical current response to optical excitation. NEP represents the amount illumination required to generate a signal equal to the internal noise of the detector. The sensitivity of detectors is commonly reported as a normalized detectivity ($D^*=\sqrt{A\Delta f}/NEP$), in units of $cm\cdot\sqrt{Hz}\cdot W^{-1}$ (Jones), to allow direct comparison of detectors with different active areas (A) and noise bandwidths (Δf).

The bandwidth of a photodetector is typically characterized by its 3 dB frequency ($F_{3dB}$)—the illumination modulation frequency where the response of the detector is reduced to 50% of its maximum value. While a bandwidth of ~20 Hz is sufficient for the lowest bandwidth photodetector applications (i.e. video imaging arrays), it remains too slow for the majority of photodetector applications. Additionally, the non-uniformity of the frequency response of these slow photodetectors distorts broad-bandwidth signals during detection[6,7], limiting applications requiring quantitative signal analysis. The only report of a fast CQD detector ($F_{3dB}$~50,000 Hz) demonstrated a sensitivity of approximately 1e7 $cm\cdot\sqrt{Hz}\cdot W^{-1}$—five orders of magnitude lower than crystalline semiconductor photodetectors.

One disadvantage of certain existing sensitive CQD photodetectors is high dark current densities (>10 $mA\cdot cm^{-2}$). Combined with high operating biases (up to 100 V), photoconductive CQD detectors consume large amounts of power and require the development of specialized signal processing circuitry capable of extracting high-quality signals from the large currents. This may be a limiting factor in common photodetector application such active matrix imaging arrays, where complexity of the circuitry allocated to individual pixels is limited by the pixel area. In contrast, solution-processed photodiode detectors have significantly lower dark current densities (1 to 20 $nA\cdot cm^{-2}$) and operating voltages (0 to 6 V), allowing integration with existing signal processing circuitry.

The absorption onset of CQDs is limited only by the bulk bandgap of their constituent semiconductor material, and can be tuned through a continuous range of wavelengths through the quantum size effect. CQD absorption onsets have been demonstrated at wavelengths up to 2000 nm for PbS CQDs[11], and or 3000 nm for HgCdTe CQDs. In contrast, the absorption onset of organic semiconductors is fixed by their composition, and has so far been limited to wavelengths <1000 nm. Operation at IR wavelengths allows detection of light transmitted through atmospheric, biological, and other materials absorption windows, dramatically increasing the range of potential applications in remote sensing, imaging, metrology, and communications. The ability to limit spectral sensitivity is also important. As the absorption onset of a semiconductor is moved toward longer wavelengths (typically by reducing the energy bandgap), internal thermally generated noise in the increases, limiting the sensitivity of the photodetector. CQDs offer absorption over a wide range of wavelengths while maintaining precise control of absorption onset and long-wavelength thermal noise rejection, making them a compelling material for the fabrication of semiconductor photon detectors.

Figure 55:
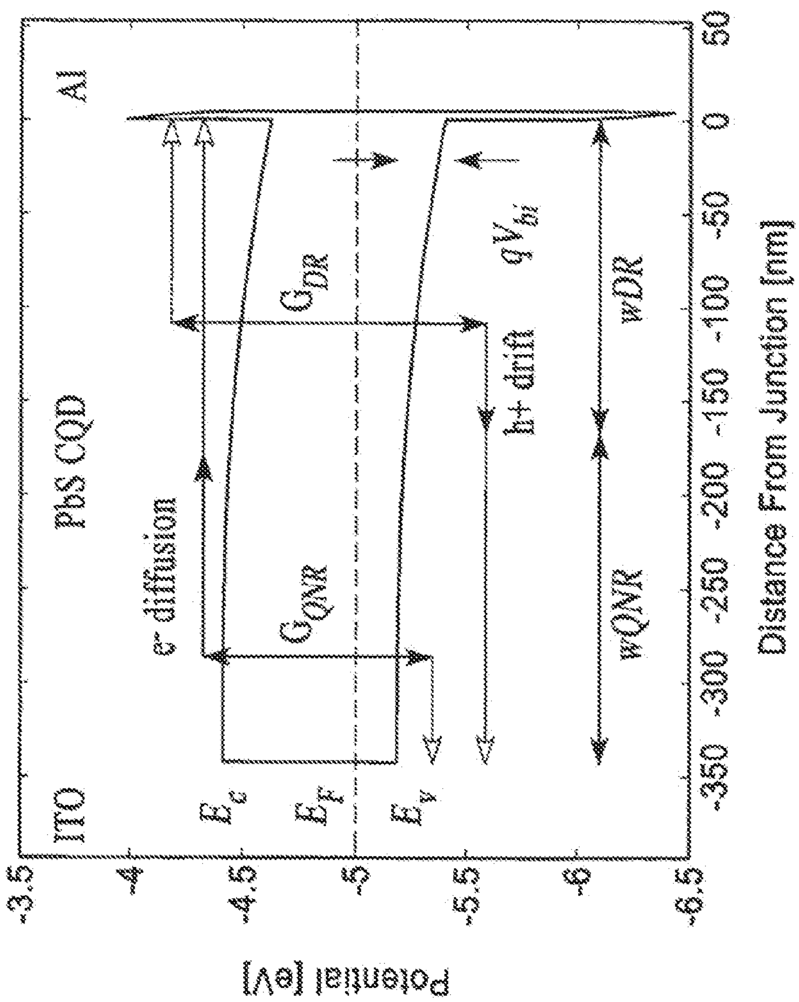

The photodetector presented in this report operates as a photodiode, unlike many previous CQD photodetectors, which operate as photoconductors. The CQD photodiode is composed of a thin film of PbS colloidal quantum dots sandwiched between planar ITO and Al electrodes, as shown in the inset of FIG. 53 (*a*). Light incident through the glass substrate and transparent ITO contact generates electrons and holes in CQD film which are collected at the Al and ITO contacts, respectively. The energy band diagram in FIG. 55 shows the Schottky barrier formed at the Al/PbS CQD interface, and the built-in potential derived from the difference in work function between the CQDs and the metal contact. Charge transfer between the semiconductor and the metal results in the formation of a wide depletion region (DR) in the CQD film, while the remaining volume of CQD film is a quasi-neutral region (QNR) of p-type semiconductor with no net charge or electric field. The large potential barrier in the valence band limits majority carrier (hole) injection from the Al contact, resulting in highly rectifying dark I-V characteristics. The built-in potential is the distinguishing feature between photodiode and photoconductive detectors, and provides efficient photocarrier collection at zero or low-bias operation, with minimal dark current.

We synthesized PbS CQDs with a diameter of ~6 nm, effectively increasing the energy bandgap of PbS from 0.42 eV to 0.86 eV through size quantization[10]. This effective bandgap corresponds to a ground-state excitonic absorption feature at 1450 nm and can be seen in the CQD film absorption spectra of FIG. 53 (*a*). As synthesized, the CQDs were capped with 2.5 nm long oleate ligands, which provided colloidal stability and passivated the nanocrystal surfaces. To reduce inter-particle spacing in films and improve carrier transport, the original ligands were partially exchanged in favor of shorter primary butylamine ligands using a solution phase ligand exchange[6]. CQD films (~350 nm thick) were deposited from solution by spin-casting. Following film deposition, a second, solid state ligand exchange was performed by immersing the films in a solution of benzene dithiol (BDT) in acetonitrile. This exchange eliminates excess butylamine in the CQD film, which was observed to be chemically reactive with the Al contact. Following BDT treatment, Al contacts were deposited by thermal evaporation and the complete device was exposed to an air atmosphere.

BDT treatment increased photodiode lifetime from approximately 4 hours to over 2 months and dramatically reduced short-circuit dark current densities from ~100 $nA\cdot cm^{-2}$ to 0.1 nA $nA\cdot cm^{-2}$. The noise associated with these dark currents previously limited the detectivity of the CQD photodiodes to ~1e10 $cm\cdot\sqrt{Hz}\cdot W^{-1}$. The BTD treatment also affected the Al/PbS CQD Schottky barrier, initially resulting in a substantial decrease in diode I-V characteristics. It was hypothesized that BDT chemically reduced the PbS CQDs, suppressing the p-type semiconductor characteristics derived from the oxidation of PbS[19], and consequently reduced the built-in potential of the Schottky barrier. Photodiodes subsequently exposed to an air atmosphere for several hours were found to maintain the highly reduced short-circuit dark current, while regaining diode I-V characteristics observed prior to BDT treatment. This observation suggested that re-oxidation of the PbS CQDs may occur following BDT treatment.

The external quantum efficiency (EQE) and normalized zero-bias shunt resistance (RoA) describe the fundamental components of photodiode performance—photogenerated carrier collection efficiency and internal noise. (In the absence of illumination or applied bias, noise in photodiodes originates entirely from thermal noise, and can be calculated, $i_n=\sqrt{4k_bT/R_o}$, based on the effective shunt resistance of the photodiode at zero bias ($R_o$), Boltzman's constant ($k_b$), and the temperature (T)). Starting with a CQD synthesis known to produce high RoA and EQE in untreated photodiodes, CQD batch preparation, BDT treatment time, and post-treatment air annealing time were controlled to optimize device performance.

Figure 54:
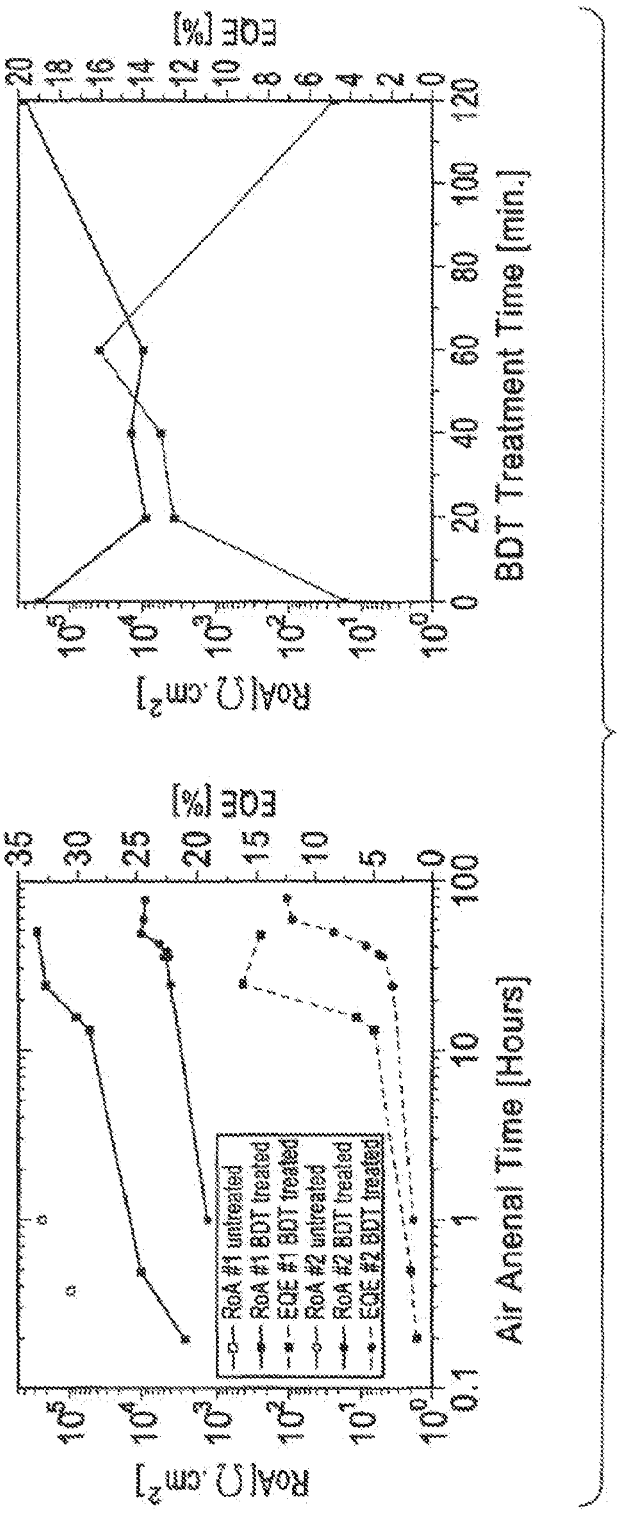

EQE was observed to increase steadily with air anneal time after BDT treatment in all CQD batches, as shown in FIG. 54. Further improvements in EQE were achieved using accelerated annealing in high-humidity conditions (started at 16 hours in Batch 1 and 44 hours in Batch 2), yielding ~15% EQE at the first excitonic absorption feature. To produce a highly sensitive photodiode, RoA must also be as large as possible. Untreated CQDs produced Schottky barriers with RoA ~1e5Ψ~cm$^2$. Immediately after BDT treatment, RoA decreased by approximately 2 orders of magnitude, as shown in FIG. 54. While air annealing improved EQE in all CQD batches, only batches with a recent (<7 days) ligand exchange demonstrated restoration of RoA with air annealing (Batch 1 in FIG. 54).

The effect of BDT treatment time was also examined. Increasing BDT treatment time continuously improved RoA, but EQE was optimized for 60 minute BDT treatments, as shown in FIG. 54. Further exposure to BDT resulted in a reduction of steady-state EQE. Analysis of the transient photocurrent of devices with 120 minute BDT treatments showed a rapid decay of the initial photocurrent, consistent with carrier recombination. This phenomenon was not observed in devices with shorter BDT treatment times.

We characterized the dark current, photocurrent response, and dark current noise of the optimized CQD photodiodes using illumination of varying wavelength, intensity, and modulation frequency, and over a range of operating temperatures.

FIG. 53 (*a*) shows external quantum efficiency (at 295 K) and normalized detectivity (at 250 K) as a function of wavelength. An EQE of 17% is achieved at 1450 nm and reaches a maximum of 52% at 580 nm. Photoresponse is measurable to 1800 nm, limited by the CQD absorption onset defined by quantum-size effect. D* is >1e12 Jones at 1450 nm for temperatures below 255K and >1e12 Jones at 1120 nm for temperatures below 280K. The shape of the EQE spectrum follows the net absorption spectrum of the CQD film (see FIGS. 57-66, for example). The peak in the absorption and EQE at 1450 nm corresponds to the first CQD excitonic absorption feature while peaks in the absorption and EQE at shorter wavelengths are the result of Fabry-Perot interference effects in the thin CQD film. The absorption coefficient at 1550 nm is 1.05e4 cm$^{-1}$, as calculated from the net CQD film absorption and film thickness. FIG. 53 (*b*) shows photocurrent density as function of irradiance. The response is linear within 6% over 4 decades of irradiance—an improvement over photoconductive CQD detectors where photoresponse depends on trap state occupancy and thus, illumination intensity.

Figure 56:
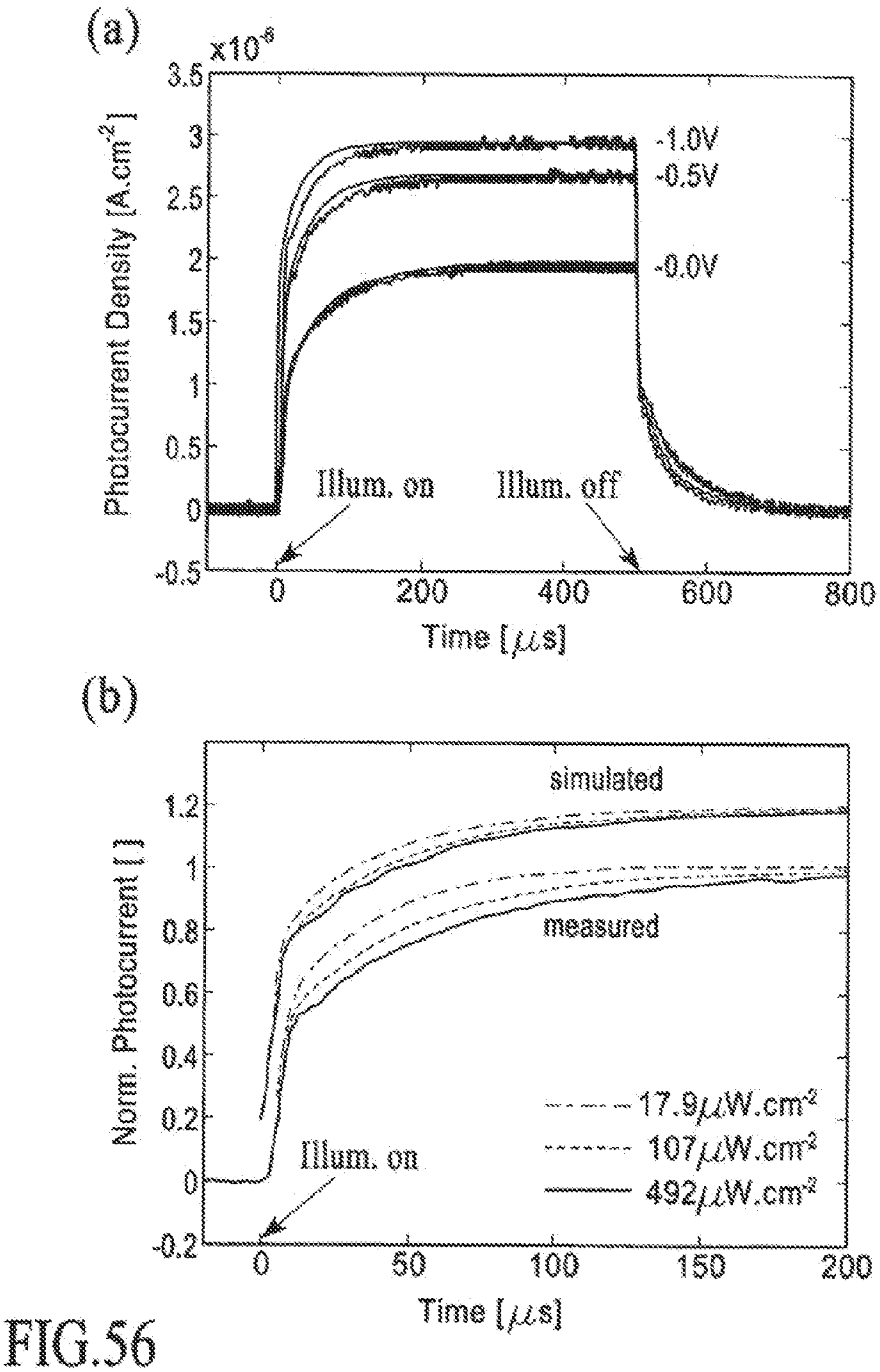

FIG. 53 (*c*) shows normalized photocurrent as a function of illumination modulation frequency. The 3 dB frequency is 10.7 kHz at zero bias and 1.95 μW·cm$^{-2}$. The response is nearly flat up to the appearance of a pole at 1 kHz. A second pole appears at 50 kHz. These poles correspond to the time required to reach the steady state in the QNR and the transit time of the DR, ~500 μs and ~10 μs, respectively, as shown in FIGS. 56 (*a*) and (*b*). FIGS. 53 (*d*) and (*e*) show an exponential dependence of the 3 dB frequency on irradiance and a sublinear dependence of the 3 dB frequency on reverse bias. The maximum observed 3 dB frequency was 61.2 kHz at −1.0 V bias and 17.9 μW·cm$^{-2}$ illumination.

The transient response to stepwise changes in illumination is used to elucidate the physics underlying the operation of the photodiode. FIG. 56 (*a*) shows the photocurrent response to a 500 μs square illumination pulse at photodiode biases of 0.0, −0.5, and −1.0V. At each bias, the transient response is composed of two distinct components—an initial, fast, linearly increasing component; and a slower, exponentially increasing component. The rise and fall characteristics of the photocurrent are symmetric.

A model may be derived for the photocurrent response based on classical carrier transport. The fast photocurrent component is attributed to carriers generated in the depletion region (DR) ($G_{DR}$ in FIG. 57) and quickly swept out by a drift current proportional to the built-in electric field (E). The total rise time of this component is equal to the DR transit time $t_{tr}=w_{DR}/(\mu_h E)$, where $\mu_h$ is the hole mobility. The slower component is attributed to electrons generated in the quasi-neutral region (QNR) ($G_{QNR}$ in FIG. 55) which must diffuse to the DR. The rise time of this component is the time required for generation, diffusion, and recombination processes in the QNR to reach a steady state, and is dependent on the width of the quasi-neutral region ($w_{QNR}$) and inversely dependent on the electron diffusion coefficient ($D_e$). A numerical model may be constructed to test the capacity of classical transport and the semiconductor continuity equations to describe the photoresponse of the CQD photodiode (see 68-76, for example). Using measured values for all physical parameters in the continuity equations, solutions for the electron and hole densities as a function of time and position were found, and used to calculate the electron diffusion and hole drift currents. As shown in FIG. 56 (*a*), with increasing reverse bias, both the measured and simulated responses show an increase in the magnitude of the fast photocurrent component and a decrease in the time required for the slow current component current to reach steady state. The magnitude of the fast component increases with reverse bias—a result of the increasing width of the depletion region ($w_{DR}$) with reverse bias, (see FIGS. 57-66, for example) and a concatenate increase in the number of photocarriers generated in the DR. An increase in $w_{DR}$ result in decrease of $w_{QNR}$ and a reduction in the time required to reach steady state in the QNR. Both measured and simulated photocurrent show increasing response speed in the slow current component—a trend consistent with the observations of increasing 3 dB frequency with increasing reverse bias, as shown in the second inset of FIG. 53 (*b*).

FIG. 56 (*b*) shows a detailed view of the fast and slow photocurrent response to the onset of irradiances of 17.9, 107 and 492 μW·cm$^{-2}$. The current response is normalized to allow comparison of the transient response at each irradiance. Both measured and simulated results show an increase in the response speed of the slow current component with increasing irradiance, while the fast current component remains essentially unchanged. Decreasing carrier lifetime with increasing irradiance, (see FIGS. 57-66, for example) reduces the time required for the QNR to reach steady state, thus increasing the response rate of the diffusive current component. This trend is consistent with the observations of increasing 3 dB frequency with increasing illumination, as shown in the first inset of FIG. 53 (*b*).

Means of realizing the aforementioned CQD photodetectors are now discussed. PbS CQDs with an excitonic peak ~1500 nm were prepared by injection of 2.0 mmol bis(trimethylsilylsulphide) into a reaction flask containing 4.0 mmol lead oxide (0.9 g), 9.5 mmol oleic acid (2.67 g) and 18.8 mmol octadecene (4.73 g) at 120 C. After the injection, the reaction was quenched by moving the flask to an ice-water bath. The synthesis was carried out under inert conditions using a Schlenk line. The final PbS oleate-capped CQDs were isolated from any remaining starting materials and side products by precipitating with acetone and re-dissolving in toluene, repeated 2×. Solution-phase ligand exchange required precipitating the CQDs with MeOH and redisolving in toluene 2× before a final precipitation with MeOH and res-dissolving in primary butylamine. The mixture was left for 3 days at room temperature, then precipitated with isopropanol and redispersed in octane. All processing was carried out in a glove box with an N2 atmosphere. Films (350 nm-thick) were formed by spin-coating CQDs suspended in octane onto commercial glass substrates coated with conductive indium-tin oxide (ITO). After film deposition, the CQDs were treated in a 5 mg/ml solution of benzene dithiol (BDT) in acetonitrile for up to 60 min. Aluminum contacts (100 nm thick, 1.96 $mm^2$ area) were deposited on top of this film by thermal evaporation at ~$10^5$ Torr. The complete devices were subsequently exposed to a high-humidity air atmosphere at 35 C for up to 12 hours to accelerate oxidation of the CQD film. CQD film deposition was carried out in an inert environment, while BDT treatment and subsequent handling was performed under ambient conditions.

Means of characterizing photoresponse are now discussed. Devices were illuminated through the glass substrate and ITO transparent contact. Uniform illumination was provided by a Roithner Lasertechnik 1550 nm LED array with an Agilent 33220A 20 MHz function generator used to supply a constant or modulated bias to the LEDs. The irradiance was calibrated using a Newport 2930C power meter and 918-IG calibrated photodetector placed at the position of the CQD photodiode. Steady-state current was measured with a Keithley 6430 sub-femptoamp SourceMeter and transient currents were measured with a Stanford Research SR570 low noise current preamplifier and a Tektronixs TDS 220 or TDS 5104 digital oscilloscope. Biases, if used, were supplied by the SourceMeter or current preamplifier. Frequency, wavelength, and illumination dependencies of the photocurrent were measured with a Stanford Research SR830 lock-in amplifier in current measurement mode. All measurements were performed in a dark, shielded enclosure at room temperature (295 K) in air, except for the temperature-controlled measurements which where measured in an $N_2$ atmosphere using a bath cryostat. Monochromatic illumination was provided by a Jobin Yvon Triax 320 monochrometer with a ScienceTech TH-PS white light source. Multimode optical fibers were used to direct the light to a collimator and the CQD photodiode. Incident irradiance was invariant within 4% from 400 to 1800 nm. The light was mechanically chopped at 100 Hz and the photocurrent response at zero bias was recorded with a Stanford Research SR830 lock-in amplifier. The spectral photocurrent was scaled to match the monochromatic response measured at 1550 nm. All measurements were performed in a dark, shielded enclosure at room temperature.

Noise measurements are now discussed. Noise was measured in the dark, at zero bias, using a Stanford Research SR830 Lock-in Amplifier in current measurement mode. Noise current was measured directly using the lock-in amplifier and normalized by the input bandwidth. All measurements were performed in a dark, shielded enclosure at room temperature (295 K) in air, except for the temperature-controlled measurements which where measured in an $N_2$ atmosphere using a bath cryostat.

Figure 57:
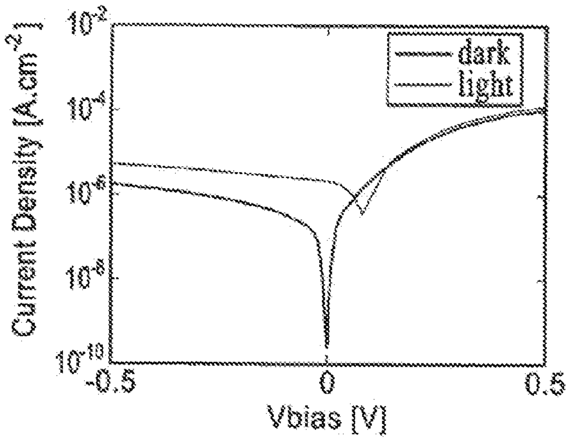
Figure 58:
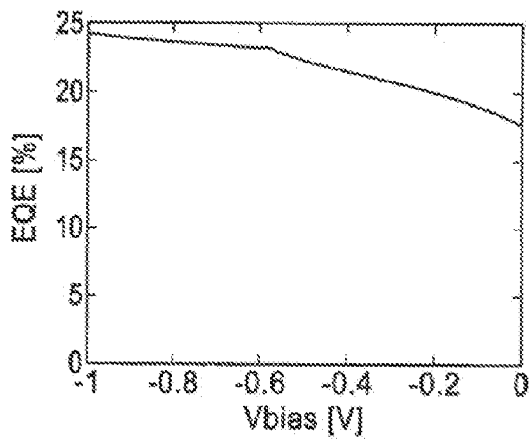

Current-voltage characteristics are now discussed. FIG. 57 shows the steady-state current-voltage (I-V) characteristics of the CQD photodiode in the dark and at 17.9 $\mu W \cdot cm^{-2}$ illumination at 1550 nm. The dark current characteristics are well described by a diffusion theory of emission over a potential barrier.[1] The dark current density is 0.1 $nA \cdot cm^{-2}$ at zero bias and 2.0 $\mu A \cdot cm^{-2}$ at −1.0 V bias. The zero bias shunt resistance of the photodiode (Ro) is determined from the dark current at biases of +/−0.02 V. Under illumination, a photocurrent is generated, in the direction opposite to the forward current of the diode, similar to conventional semiconductor diodes. The magnitude of the photocurrent is proportional to the reverse bias, resulting in a dependency of EQE on bias, as shown in FIG. 58.

Figure 59:
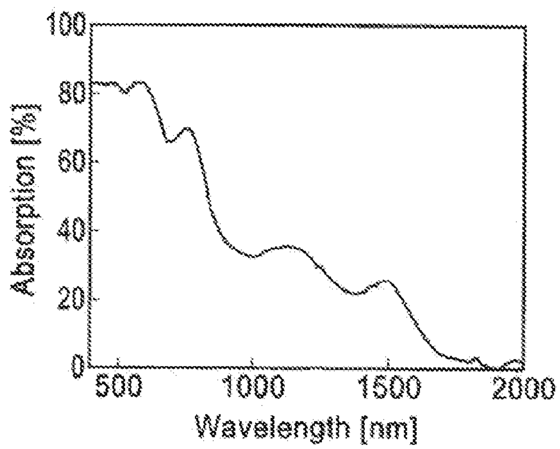

Characterization of absorption is now discussed. FIG. 59 shows net absorption in the CQD film as a function of wavelength, calculated from direct a direct measurement of total light absorption in the CQD photodiode structure. The photodiode was placed in an integrating sphere and illuminated directly using a calibrated source. All light reflected back by the various dielectric interfaces or the Al back contact was captured by the integrating sphere, yielding the net absorption of the complete device structure. By measuring, separately, the absorption of the complete photodiode, the glass/ITO substrate, and an isolated Al contact, the net absorption in the CQD film was calculated. All measurements were performed with a Varian CARY 500 UV-Vis-NIR spectrometer using an integrating sphere accessory module. Reflection mode was used for all measurements and both spectral and diffuse reflections were collected from the sample.

Figure 60:
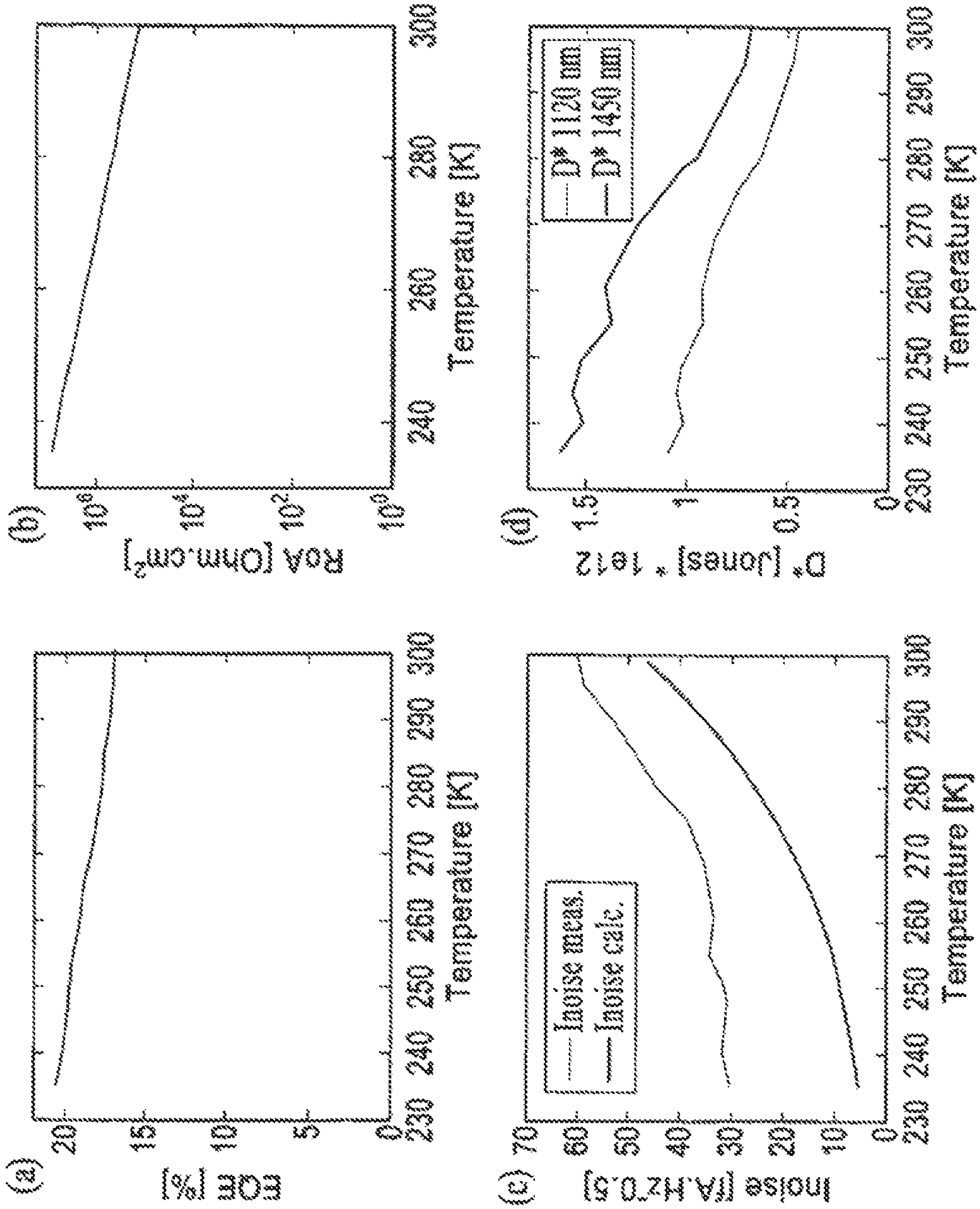

Temperature dependence of photodiode performance is now discussed. Photocurrent, current noise, and I-V characteristics were measured as a function of temperature to investigate performance improvements with decreasing temperature and the dependence of the noise current on RoA. FIG. 60 (*a*) shows EQE at 1450 nm as a function of temperature. EQE increases with decreasing temperature as a result of decreased thermal carrier concentrations and decreased recombination rate at reduced temperatures. FIG. 60 (*b*) shows RoA as function of temperature: 1.5e5 $\Omega \cdot cm^2$ at 295 increasing to 8.6e6 $\Omega \cdot cm^2$ at 235 K. RoA increases with temperature due to decreased thermal emission of carriers over the Schottky barrier at the Al/PbS CQD junction.[1] FIG. 60 (*c*) shows measured $i_{noise}$ and the thermal current noise limit as a function of temperature. In the absence of illumination or applied bias, noise in photodiodes originates entirely from thermal noise,[2,3] and can be calculated, $i_n = \sqrt{4k_b T/R_o}$, based on the effective shunt resistance of the photodiode at zero bias ($R_o$), Boltzman's constant ($k_b$), and the temperature (T). The measured current noise follows the thermal limit with decreasing temperature, but at magnitudes up to ~2 $fA \cdot Hz^{-0.5}$ greater. This excess noise may be attributed to a net dark current resulting from a small voltage overburden in the measurement equipment or environmental noise. FIG. 60 (*d*) shows normalized detectivity (D*) as a function of operating temperature. D* was calculated at 1450 nm, the first CQD excitonic feature, and 1120 nm, the CQD photocurrent response maximum wavelength. D* shows a linear dependence on temperature and is greater than 1e12 Jones at 1120 nm for temperatures below 280K, and greater than 1e12 Jones at 1450 nm for temperatures below 255K. Although measured using a cryostat, these temperatures are readily obtainable using low-cost solid-state cooling.

Figure 61:
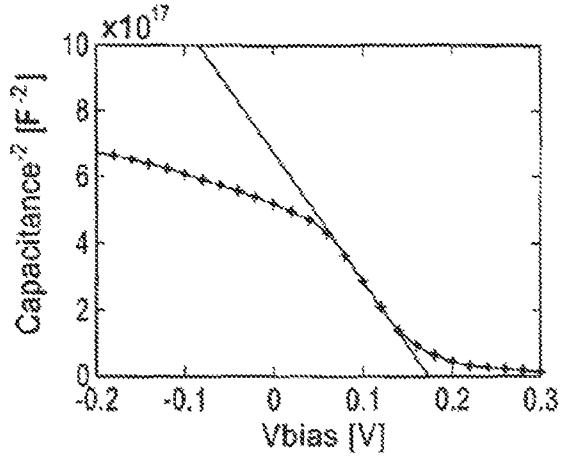
Figure 62:
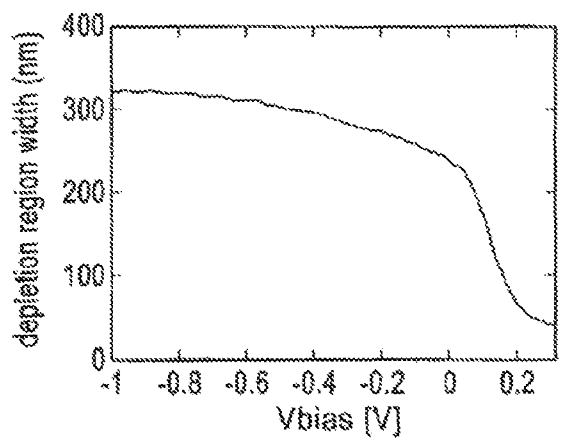

Depletion depth studies are now discussed. Capacitance measurements as a function of CQD photodiode bias were used to determine built-in potential and fixed charge density from a fit to the capacitance-voltage relationship based on the abrupt junction approximation. FIG. 61 shows the fit of measured capacitance values to the abrupt junction capacitance, revealing a built-in potential of 0.20 V, and a fixed charge (acceptor) density of 5.0e15 $cm^{-3}$. FIG. 62 shows the depletion region width calculated from the measured capacitance, using a relative dielectric permittivity of 19.2 (measured using the CELIV technique—see section 5.0 for details), and assuming a one-dimensional electric field distribution. The depletion width at zero bias is calculated to be 240 nm. Capacitance measurements were performed using an Agilent 4284A LCR meter with a 10 mV probe signal modulated at 20 Hz.

Figure 63:
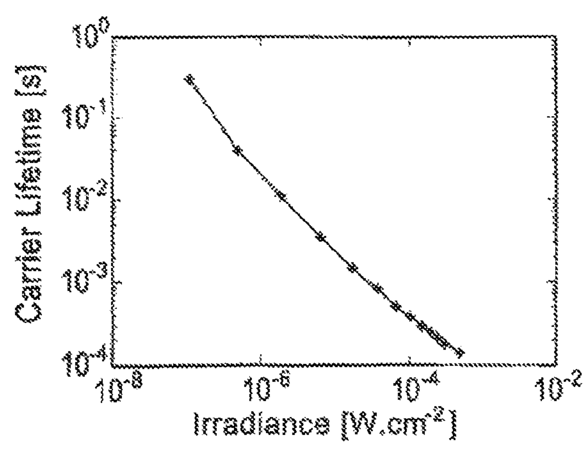
Figure 65:
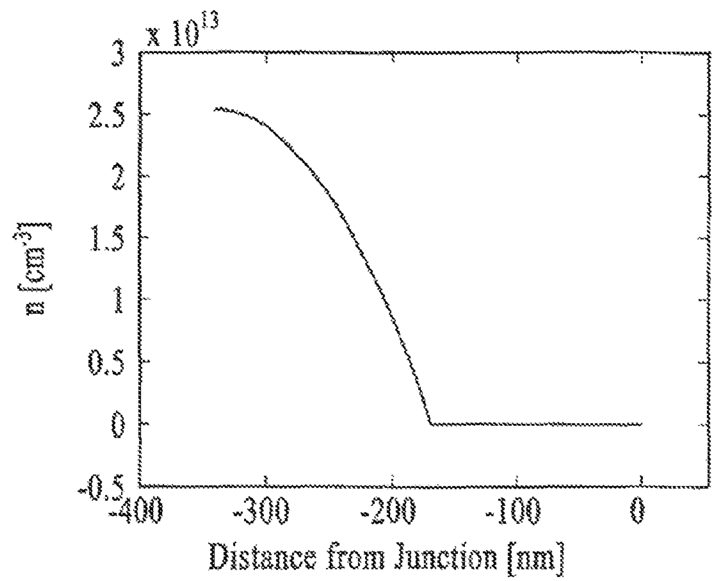
Figure 66:
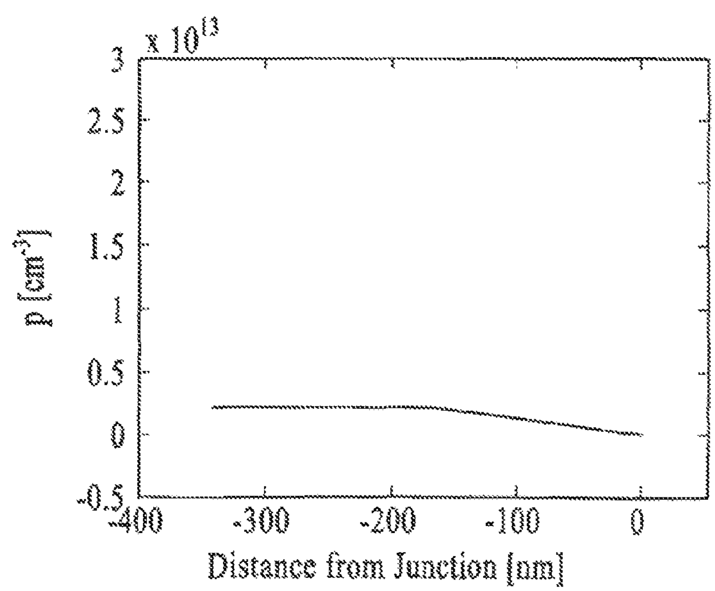

Measurement of carrier lifetime is now discussed. Carrier lifetime in the CQD film was calculated from the open circuit voltage ($V_{oc}$) transient response of the of the CQD photodiode as a function of irradiance. Under low-injection conditions, the carrier lifetime is inversely proportional to the rate of change of $V_{oc}$, allowing direct calculation from measured $V_{oc}$ transients.[4] FIG. 63 shows carrier lifetime as a function of irradiance at 1550 nm.

Charge carrier drift mobility was measured directly in the CQD photodiode structure using the Carrier Extraction by Linear Increasing Voltage (CELIV) technique.[5] Under rapid, linearly increasing reverse bias, the transient drift current of thermal equilibrium carriers extracted from the quasi-neutral region of a diode can be measured separately from the steady-state displacement current. A geometric relationship, based on the thickness of the semiconductor film, allows determination of the drift mobility from the arrival time of the transient current maximum. For semiconductors with low thermal equilibrium carrier concentrations, steady-state illumination of the semiconductor can be used to increase the steady-state carrier concentration.[5] The carrier generation rate in the semiconductor should be uniform, but if it not, this technique can be used to identify the polarity of the extracted carriers. Short wavelength illumination will generate more carriers closer to the illuminated surface of the semiconductor. Reduction of the time required to reach the transient current maximum indicates that the extracted carriers are generated closer to the illuminated contact of the device. For the case of the CQD photodiode, this corresponds to the ITO contact where holes are extracted under reverse bias. Thus confirming that CELIV is measuring the hole drift mobility—the majority carrier in p-type PbS CQDs. Measurements of optimally BDT treated and air annealed CQD photodiodes reveal a hole drift mobility of 1e-4 $cm^2 \cdot V^{-1} \cdot s^{-1}$.

FIG. 64 summarizes measured CQD parameters and the values used in the model presented.

Alternative embodiments of sensitive, fast, smooth-morphology photoconductive photodetectors are now presented.

Figure 67H:
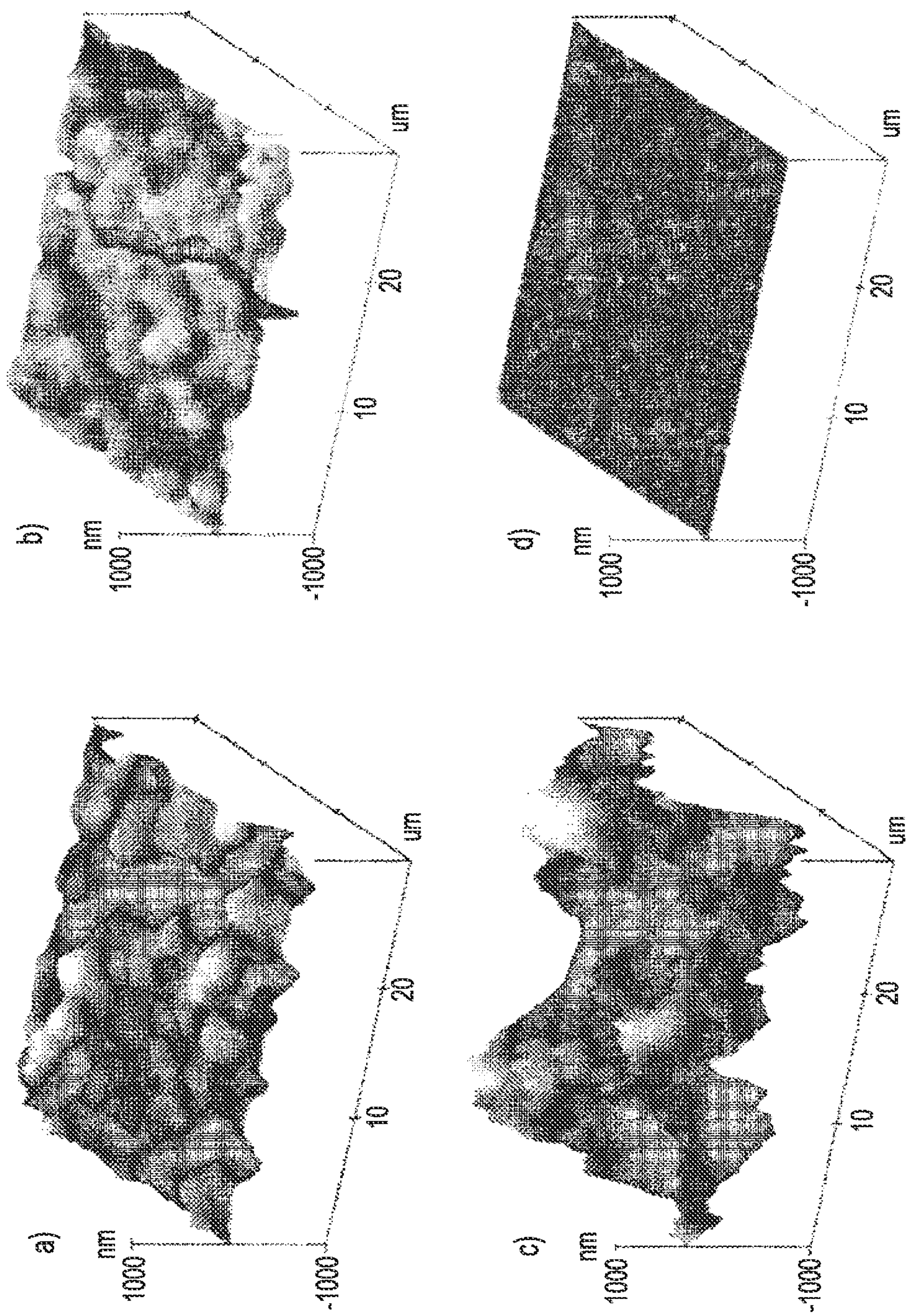
FIGS. 67/1, 67/2, 68/1, 68/2, and 69 illustrate an embodiment including smooth-morphology ultrasensitive solution-processed photoconductors.
Figure 69:
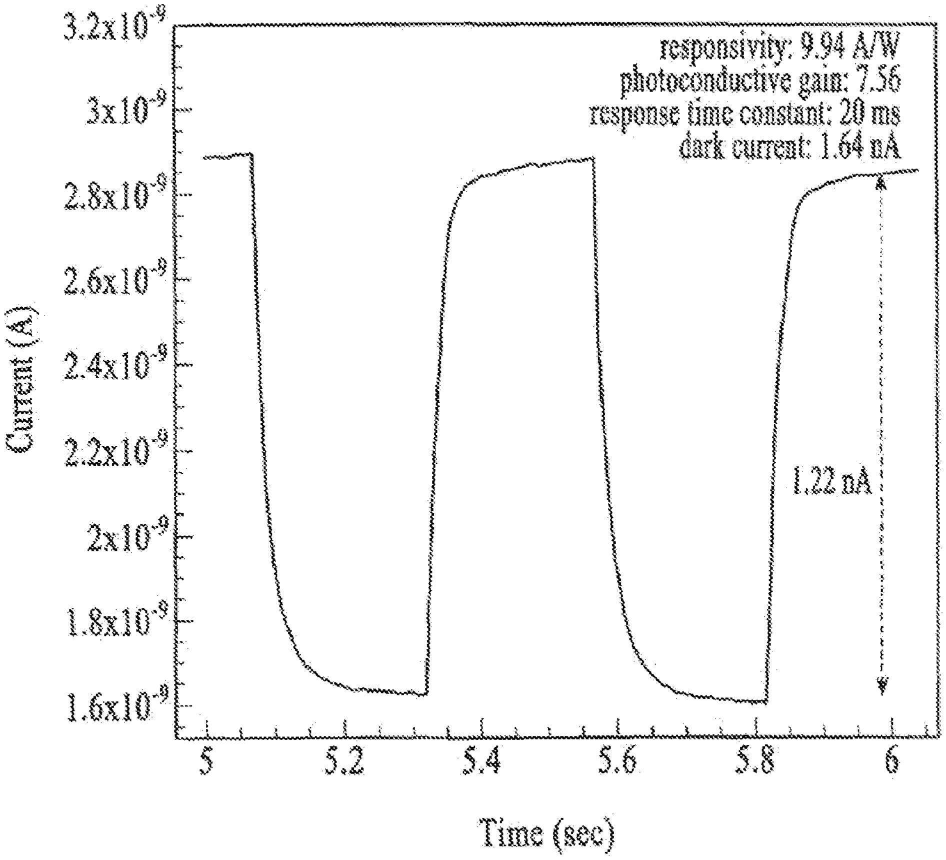

FIGS. 67-69 illustrate an embodiment including smooth-morphology ultrasensitive solution-processed photoconductors.

Solution-processed optoelectronic materials offer a route to low-cost, large-area solar cells, sensors, and integrated optical sources. While much progress has been made in organic and polymer spin-cast optoelectronics, colloidal quantum dots offer a distinct further advantage: convenient tuning of bandgap, and thus absorption onset, via the quantum size effect. Such tunability is relevant to diverse applications such as multispectral image sensors, high-efficiency multijunction solar cells, and multicolor and white light sources. Ultrasensitive photoconductive photodetectors have recently been reported, both in the visible and infrared, based on size-effect tuned colloidal quantum dots. These first reports relied on the removal or exchange of organic ligands that resulted in rough films incompatible with the realization of high-uniformity image sensors. In general such solid-state exchanges have shown great promise in enhancing electronic transport in colloidal quantum dot films, but have consistently been reported to generate cracking ascribed to their loss of volume during the exchange. Here we report a new route to high-performance photoconductive photodetectors, one that results in sub-1% roughness, as compared to >15% for past solid-state exchanged devices. The devices reported herein provide photoconductive gains evidenced in their typical 7 A/W responsivities. This new method reveals an added significant advantage: the devices respond with a single time constant of 20 milliseconds, compared to the multi-second and multi-time constant response of previously-reported devices. Single-time-constant temporal response below 100 ms is crucial to video-frame-rate imaging applications. Top surface photodetectors made using novel materials offer access to spectral regions unseen by fixed-bandgap silicon. Three crucial attributes must be exhibited by any top-surface detector technology intended for applications in imaging: sensitivity, spatial uniformity, and speed of response. Sensitivity may be described by the noise-equivalent power (NEP)—the lowest light level that can be distinguished from noise. D*, the normalized detectivity, enables comparison among pixels having different areas. Uniformity of gain and dark current across a pixel array are required to avoid the introduction of spatial noise into an image: photoresponse nonuniformity of less than 1% is required, mandating film thickness nonuniformity (TNU) of this same order. Finally, temporal response must be sufficiently rapid as to enable video frame-rate imaging. At a minimum, sub-100 ms time constants are required. Photoconductive photodetectors based on solution-processed colloidal quantum dots have, to date, exhibited remarkable sensitivities, with D* reaching into the 10ˆ12 and even 10ˆ13 Jones, comparable to that achieved by the best epitaxially-grown photodetectors.

Large photoconductive gains, as high as thousands of electrons collected per photon incident, have played a key role in achieving this sensitivity. These high gains relied on enhanced conduction in films achieved by applying further processing to already-cast films consisting of quantum dots passivated with insulating organic ligands. Ligand removal, ligand replacement, and film crosslinking all produce the desired increase in mobility that lead to increased sensitivity; but are accompanied by a significant loss of film volume. This film contraction causes these processes to lead to film cracking—often on multiple length scales ranging from nanometers to micrometers—that renders the resultant films unacceptable for applications that demand exceptionally uniform films.

Realization of useful levels of photoconductive gain and excellent morphology are not incommensurable. Relying on processes that produce large changes in film volume may complicate realization of excellent morphology. After they have been synthesized, colloidal nanoparticles are capped with long, insulating organic ligands. These serve a number of purposes. During synthesis, they bind the metal precursor—in our case, lead-oleate brings the metal to the reaction. Once the synthesis is complete, ligands remain on the surface, preventing aggregation and keeping the nanoparticles dispersible within a nonpolar solvent. The ligands also serve to passivate dangling bonds on the nanoparticle surface. While oleate ligands are very effective at preventing aggregation, one side effect of the use of long aliphatic chains is that a colloidal quantum dot solid made from such materials is highly insulating. A procedure that exchanges original ligands with shorter ligands is needed if electron and hole transport among the nanoparticles is to occur with reasonable efficiency. Recent work on photoconductive photodetectors reveal that such an exchange is indeed necessary to bring mobilities into the >1E 4 cm2/Vs regime needed to ensure that transit across the device occurs much more rapidly than ecombination. This is the prerequisite for photoconductive gain. However, these past works all employed solid-state treatments that led to poor morphology to achieve their high gains.

Ligand exchange implemented instead within the solution phase may be contemplated. Good transport requires extremely short ligands; but solution-phase exchange to such short ligands typically results in considerable nanoparticle aggregation. In this case, morphology is once again compromised, and excitonic features and thus size-effect tenability are lost. An approach to solving the aggregation problem is to avoid the use of weakly-bound ligands are used, such as amines; these labile ligands create many opportunities for irreversible aggregation during the course of the solution-phase exchange. Mercaptans, whose thiol group binds very strongly with Pb, may be exchanged onto the surface of PbS nanocrystals. Embodiments include beginning with oleate-capped PbS nanoparticles having a first excitonic feature at 950 nm, that were dispersed in toluene. We added to them an equal volume of ethanethiol. Embodiments include allowing the mixture to incubate for times ranging from 15 minutes to multiple hours. Ligands exchange may be terminated by precipitating the colloid using hexanes. Purely oleate-capped PbS nanoparticles are stable in n hexanes as well as in toluene; the effectiveness of this non-polar solvent in precipitating the exchanged nanoparticles suggests that the nanoparticle surface demonstrated a more polar character owing to the shorter ligands. We pelleted the colloid via centrifugation and resuspended the nanocrystals in chloroform. We constructed devices by spin-coating the exchanged materials onto planar glass test chips patterned with gold interdigitated electrodes. Having created a simple process that generates stable solutions of short-ligandcapped nanoparticles, we sought to investigate its impact on colloidal quantum dot film morphology, responsivity to light, and temporal response.

Atomic force microscopy and profilometry may be used to study the surface morphology and film thickness. We investigated: (a) Films made from unexchanged nanocrystals; (b) Films made by spin-casting unexchanged nanocrystals and subsequently treated with butylamine; (c) Films made by spin-casting nanocrystals previously exchanged to butylamine in the solution phase; (d) Films made by spin-casting nanocrystals previously exchanged to ethanethiol in the solution phase. We present in FIG. 67 the comparison of the results. Films made from unexchanged nanocrystals exhibit large regions of extensive cracking upon drying; their roughness is 25% of their thickness. When such films were subsequently treated with butylamine they continued to show cracks but their roughness was somewhat reduced to 9% of their thickness. Films made from nanoparticles exchanged to butylamine in the solution phase exhibited 15% roughness. In striking contrast, films made by spin-coating ethanethiol-exchanged quantum dots produced 0.6% roughness. Films of slightly over 200 nm thick are thickness for photodetector realization in view of the substantially complete absorption of visible light in films of this thickness.

Volume contraction readily explains the poor morphology of the oleate capped particle film treated from the solid state using butylamine. We sought to understand further why solution-exchange to butylamine also fails to produce good-morphology films. We compare in FIG. 68 transmission electron micrographs for original nanoparticles, butylamine-solution-exchanged nanoparticles, and ethanethiol-exchanged nanoparticles. The butylamine-solution-exchanged nanoparticles have aggregated considerably, some of them forming worm-like structures, with clusters of nanoparticles as large as 50-100 nm. In contrast, the ethanethiol-exchanged nanoparticles remain discrete and monodispersed dots. Comparison of oleate-capped with ethanethiol-exchanged nanoparticles reveals much closer interparticle spacing in the ethanethiol-exchanged case.

We anticipated that the extent of aggregation in butylamine-solution-exchanged particles would also be manifest in their absorption spectrum. A complete loss of excitonic structure is indeed revealed in FIG. 68 (*a*). In stark contrast, the ethanethiol capped nanoparticles preserve the sharp feature of the as-synthesized particles. Because the ethanethiol-exchanged films were optically smooth, we were able to use interference features in their absorption spectra to estimate their refractive index. We obtained a value of 2.38, compared with previous reports of 1.64 in oleic-acidcapped nanoparticle films. This finding is consistent with the considerably closer packing seen in the TEM images.

We now turn to the characterization of these devices as photoconductive photodetectors. At a bias of 10 volts across our 5 μm-wide lateral electrode gap the oleate-capped nanoparticles exhibited a dark current of less than 1 pA for an electrode width of 3 millimeters and no photoresponse. All three treatments result in orders of magnitude higher dark current. The photoconductive gain of the solid-state treated devices is in a practically useful regime (order 10), whereas butylamine-solution-exchange nanoparticles show gain of 150, likely to result in excessive photocurrent and presenting challenges in imaging applications requiring local integration of the photosignal within a finite-sized capacitor. Most striking is the difference in temporal response among the different photodetectors. Both butylamine treatments lead to multi-temporal-component responses that include a significant slow tail of response on the timescale of seconds. In contrast, ethanethiol-solution-exchanged devices exhibit a single 20 millisecond time constant. We show this temporal response in FIG. 69.

Thus, while photoconductive photodetectors do exploit trap states to achieve gain, it is possible to engineer the combination of transport and trap lifetime to achieve a compelling combination of gain and temporal response. Indeed the long-lived temporal response of the butylamine-treated film provides no advantage in gain over its ethanethiol-exchanged counterpart in exchange for its highly undesired long-tailed transient.

Experimental First, a mixture of PbO (0.9 g, 4.0 mmol), of oleic acid (2.67 g, 9.5 mmol), and of octadecene (4.73 g, 18.8 mmol) are degassed in nitrogen at 95° C. for 16 Hours, and labeled solution A. Next, hexamethyldisilathiane (210 μL) is mixed with octadecene (10 mL) in a nitrogen glove box and labeled solution B. Then, solution A(19.5 mL) is injected into a flask, under nitrogen, and the temperature of the solution is raised to 120° C., using a heating mantle, under heavy stirring. Solution B is then injected into the flask. After the injection, the heat mass of the heating mantle is used to slowly cool the reaction flask. When the temperature reaches □35° C. quench the reaction with distilled Acetone (40 mL). Wash with multiple suspensions in toluene and precipitations in Acetone while keeping only suspended phases. Film formation: films were formed by spin coating a ethanethiol exchanged solution (65 μL) of PbS nanocrystals at 700 rpm onto gold interdigitated electrodes on a glass chip that was previously, repeatedly, washed in acetone and water and then dried under nitrogen. A profilometer was used to measure PbS nanocrystal film thicknesses ranging from 213 nm for ethanethiol-solution-exchange, 712 nm for butylamine treated films, 1978 nm for butylamine-solution-exchange, and 429 nm for oleic acid unexchanged films. Absorption spectra were collected using a Cary model 500 spectrophotometer to characterize film excitonic features, and to study the Fabry-Perot effect of glassy ethanethiol solution exchanged PbS nanocrystal films. Electron miscroscopy images were acquired using the scattered-electron detectors of a Hitachi HD-2000 scanning transmission electron microscope operating at 200 kV.

Example Systems and Applications of Embodiments

In an embodiment, low-cost, large-area solar cells may offer the prospect of economically-sustainable clean energy capture. The best solid-state solution-processed solar cells have to date produced power conversion efficiencies in the range of 3-5%. One factor limiting their further improvement is solution-processed photovoltaics' transparency to the sun's infrared rays. Half of the sun's power reaching the earth lies beyond 700 nm, and one third beyond 1000 nm. However, the best reported inorganic thin-film nanocrystal-based devices absorb only to the blue of 800 nm, and organic polymer/$C_{70}$-derivative devices are effective out to about 1000 nm, with their peak efficiency lying at 800 nm.

For these reasons, there is a need to realize solution-processed short-wavelength infrared (SWIR) photovoltaic devices. In 2005 it was reported that spin-coated colloidal quantum dots, combined with a polymer matrix, produced a photovoltaic effect. However, these blend devices exhibited external quantum efficiencies less than 0.006% at 975 nm. Further development of bilayer devices has so far improved external quantum efficiencies to 0.4% at 975 nm.

Nearly a two-order-of-magnitude increase in the external quantum efficiency of solution-processed SWIR photovoltaics can be realized relative to previous reports. The approach described herein is supported by two recent findings in the electronic properties of solution-processed quantum dot films. First, it was recently shown that films of pure quantum dots—with no heterostructure matrix, and with insulating organic ligands modified or removed—can exhibit mobilities greater than 0.1 $cm^2/Vs$. Second, since the previous record exhibited transport-limited external quantum efficiencies, it was determined that a rough-interface architecture that increased absorbance while keeping exciton-separation efficiency high would be required.

A bottom (non-optically-absorbing) electron-accepting electrode high-surface-area nanoparticle ITO may be used. Solution-processible high-surface-area materials capable of forming a Type II heterojunction suitable for charge separation include ZnO, $SnO_2$, and ITO. The inset of FIG. 3*r* shows the expected Type-II energy band diagram formed between PbS and ITO. This material was selected to obtain conductivities up to 5 orders of magnitude higher than using ZnO or $SnO_2$.

PbS nanocrystals was synthesized using an organometallic route previously described. As-synthesized, the nanocrystals are capped with ~2.5 nm long oleic acid ligands. These impede charge transport, producing insulating thin films. To create conductive nanocrystals films, a solution-phase ligand exchange was used to replace oleate ligands with ~0.6 nm long butylamine ligands. Following ligand exchange, the butylamine capped nanocrystals exhibited linear I-V characteristics.

The ITO phase of the bulk heterojunction was fabricated by spin coating ITO particles, originally suspended in water, onto a glass substrate. The film was then baked in air at 310° C. for 30 minutes resulting in 3 μm thick films with resistivities on the order of 0.5 ohm*cm. FIG. 3*oa* and FIG. 3*ob* show the resulting high surface area film.

Devices were fabricated by soaking the ITO-coated substrate in a 5 mg/ml solution of butylamine-capped PbS quantum dots in chloroform for 10 minutes. An absorption spectrum of the device shows a nanocrystal spectral absorption characteristic indicating that the nanocrystals have indeed deposited. Subsequent deposition iterations were employed until saturation was observed in the growth of the nanocrystal absorption feature. Magnesium contacts capped by a layer of silver were then deposited via thermal evaporation; however, all of the devices fabricated using this method were found to result in short circuits when current-voltage (IV) curves were taken.

FIG. 3*oc* shows an area of the ITO-PbS quantum dot device before metal contacts were evaporated. The exposed bare ITO in the device led to direct contact with the deposited metal. FIG. 3*od* shows a higher magnification image of the exposed bare ITO. Here individual PbS nanoparticles can be seen clustered in the crevices formed between sintered ITO particles.

In identifying a technique to guarantee complete coverage of the rough, spiky ITO by the PbS quantum dot layer, a linker molecule, mercaptoacetic acid, that at one end attached to the ITO via a carboxylic group, and at the other end attached to PbS via a thiol group, could lead to complete coverage. Bifunctional linker molecules of this type are used for the attachment of monolayers of visible-sensitive quantum dots as sensitizers in metal oxide/liquid electrolyte photovoltaic cells. This method, too, led to short circuits due to an inability of this method to create a smooth, continuous film atop the rough shards emanating from the underlying nanoporous ITO electrode.

Techniques were sought in which the PbS quantum dots were not directly linked to the ITO; but instead to link PbS nanoparticles to one another. This could lead to lateral growth of the PbS film in such a way as to overgrow the faceted shards of ITO. This approach involved the use of a bridging molecule to facilitate interparticle-linking. Although bridging molecules have been used for monolayer deposition of semiconductor nanoparticles on metal electrodes, they were used instead herein to direct multilayer particle assembly in both lateral and vertical directions towards the realization of a planarized film on a rough substrate. Ethanedithiol was selected for two reasons. First, thiols possess a strong affinity for Pb atoms, leading to effective competition with the existing amines for ligand-binding sites. Second, ethanedithiol is short (~0.7 nm) enough that any thiols remaining after subsequent device processing would not significantly impede charge transport. Due to dual role of the quantum dots as both radiation 1000 absorber and hole transport medium our use of a cross-linker molecule additionally coincided with a desire to improve electrical transport properties. Previously the charge transport mobility in thin film transistors and conducting nanoparticle solids has benefited by the use of hydrazine and 1,4 phenylenediamine as cross-linking molecules.

Devices of an embodiment were fabricated using this cross-linker strategy by treating ITO in a 1% by volume solution of ethanedithiol in acetonitrile for 30 min. The ITO was then soaked in a nanocrystal solution for 10 min. This procedure was repeated three times. As seen in FIG. 3*oe* and FIG. 3*of*, this produced smooth, continuous films. It was found that once top metal contacts had been deposited these devices produced short-free IV characteristics.

A way was sought to demonstrate the value of quantum-size-effect tuning of quantum dot absorption onset by constructing classes of devices having two different excitonic spectral locations. One nanocrystal batch was selected with a first excitonic transition at 1340 nm; and for the longer-wavelength device, at 1590 nm. As-fabricated, devices illuminated under monochromatic 975 nm illumination exhibited short-circuit external quantum efficiencies of 2.3% in the 1340 nm device and 0.3% in the 1590 nm nanocrystal device, in both cases with illumination intensities of 12 $mW/cm^2$.

Thermal treatment of the devices of an embodiment could offer the potential to improve transport within the quantum dot film, as well as charge separation across the quantum dot—ITO interface. Devices sintered in air for 3 hours increased to 9% EQE at 975 nm (1340 nm devices) and 16% EQE (1590 nm devices). FIG. 3*p* shows a table summarizing the effects of sintering on the performance of the devices.

Current-voltage traces were provided for the 1340 nm device in FIG. 3*q*. Data taken under 100 mW/cm$^2$ AM 1.5 illumination was included using an Oriel solar simulator. These devices showed AM1.5 power conversion efficiencies of 0.5%. Monochromatic power conversion efficiencies at 975 nm were 1.25% for 12 mW/cm$^2$ illumination and 0.95% for 70 mW/cm$^2$ illumination.

Illuminating the devices with monochromatic light and measuring the current generated under short circuit photovoltaic operation measured the external quantum efficiency of the devices. The plot in FIG. 3*r* shows the spectrally-resolved external quantum efficiency which reveals a photoresponse extending to more than 1700 nm in the device fabricated with 1590 nm first exciton transition nanocrystals. The spectral EQE for devices composed of both sizes of nanocrystals follows closely their respective absorption spectra. A peak EQE of 46% occurred at 500 nm in the sintered 1590 nm device while the sintered 1340 nm device exhibited a peak EQE of 15% at 590 nm. The decrease seen in EQE below about 500 nm is due primarily to increasing absorption in the ITO.

Devices fabricated in the manner described herein were subsequently left under ambient conditions in an open circuit configuration for approximately seven months. After this time it was observed that the top deposited contacts had oxidized, significantly degrading device performance. Once new contacts were deposited, however, the devices continued to function with photovoltaic efficiencies only slightly degraded from that obtained seven months earlier.

In embodiments, the QDPC 100 may be a part of an integrated system 2200, including structures 2202 and features 2204, that is utilized in applications and markets 2100, such as cameras 2102, sensors 2104, visible sensors 2108, IR/UV/X-Ray sensors 2110, multi-spectral sensors 2112, high gain imagers 2114, memory 2118 applications, commercial markets 2120, consumer markets 2122, medical markets 2124, civil markets 2128, military markets 2130, machine vision markets 2132, sensor markets 2134, and the like. In embodiments, the integration of the QDPC 100 with products and systems may provide improved performance, reduced cost, and innovative products that are applicable to new market segments.

The QDPC 100 may utilize a plurality of functional platform structures 2202, features 2204, and benefits. In embodiments, these features 2204 and benefits may be enabled through a set of properties for the colloidal quantum dots used in the detectors, such as no phase transitions between minus 40 to 350 degrees C., amenable to colloidal synthesis, simple etch chemistry, exciton radius such as to facilitate quantum-size effect tuning (2-20 nanometers), environmentally friendly materials, continuum band edge beyond 1.5 microns, no melting, controlled trap states through a facile means, long lifetime states (1 millisecond to 1 microsecond), transit time/mobility in a solid phase, no degradation in UV/VIS/IR exposure, no reaction with oxygen or water under relevant operating or processing conditions, no reaction with internal metals, thermal expansion coefficient matched to typical electronic materials, multi-spectral, broader placement options, small chips (lateral) thin chips, and the like.

In embodiments, these features 2204 and benefits may be enabled through a set of characteristics, such as the ability to use various sub-combinations of IR/X-Rays/UV/VIS 2108 2110 bands, self-powering using modulated IR 2110 source to harness spectral absorption, array size, chip size, detecting radiation 1000 with high responsively, tunable to different wavelengths, low noise, noise reduction, ease to manufacture, high sensitivity, high gain, and the like. Very high sensitivity of the QDPC 100 may allow for much faster stabilization time, high field-stop number and small aperture lens to give improved depth of field, no need for a flash, and the like. No need for a flash with the QDPC 100 may enable improved capabilities, such as pictures that are more pleasing because there is no need to use a flash, flash reflections are eliminated, natural radiation 1000 may be more frequently used, run exposure faster to eliminate camera 2102 shake, better action shots with the higher speed, long distance shots because of no shake, interactive video game applications, high-speed cameras 2102 for watching 2D or 3D motion (up to 120 frames per second).

In embodiments, the QDPC 100 may be able to store information in a frame buffer 2118 or memory 2118, read out or from memory, or write back into memory 2118. The ability to store information within a quantum dot pixel 1800 may enable a plurality of functions, such as having a frame buffer 2118 behind each quantum dot pixel 1800, multiple frames behind each quantum dot pixel 1800, compression engines for video, image manipulation, vector for guiding mpeg-based compression engines, processing to find something going across the image, or the like. The ability to write data back into the quantum dot pixel 1800 may enable a plurality of functions, such as using the frame buffer 2118 for storage, manipulation of the data in the buffer, providing flash memory 2118 behind each quantum dot pixel 1800 to note or detect dead quantum dot pixels 1800, user storage, store compressed multiple frames in buffer 2118 where a user views all and selects the best, execute an image rotation, use for high-rate video compression, provide a function for image stabilization, increase shot-to-shot speed with multiple shots stored into memory 2118, provide spatial Fourier transform right on the chip 2000, running an automatic exposure or automatic focus engine faster because of QDPCs 100 high gain 2114.

The ability to store information in quantum dot pixels 1800 may eliminate the need for exposure control. In embodiments, every quantum dot pixel 1800 could report exposure within a very large range. Values may be assigned, say with one indicating very bright radiation 1000 and the other indicating very low radiation 1000. The two may be converted with an analog-to-digital converter, and then combined. One responds to bias, the other is the value of photocurrent at that bias—same exposure on one quantum dot pixel 1800. One value is associated with the bias value and the other with how much current was collected at the bias value, where the bias is the gain set and the course information is associated with the intensity. The process may take the form of log compression, where the value is shifted around the center point of the dynamic range. In embodiments, having automatic gain control on each pixel, as opposed to across the entire quantum dot pixel 1800 array, may eliminate exposure control. In embodiments, there may be no need for exposure control or for auto-focus, which may provide an instant-acting camera 2102.

In embodiments, there may be automated gain 2114 control in a quantum dot pixel 1800, providing a pixel-by-quantum dot pixel 1800 local contrast that does not require a buffer 2118. It may be possible to achieve high dynamic range without any processing, with in-pixel auto-gain 2114 control. Gain level 2114 may be self-selected with the addition of pixel circuitry 1700. In a cluster of four pixels 1800, automatic gain 2114 control could be performed in a Bayer pattern group, where a shared bias pixel 1800 is at the center of the two-by-two quantum dot pixel 1800 configuration. With this configuration, it may be possible to report the dynamic range for the group, as opposed to for every quantum dot pixel 1800. In addition, with good post-processing, interpolation may be used to adjust the gain 2114 level. In embodiments, a self-selecting automatic gain 2114 level may be implemented, where the exposure is always set as fast as it can be while maintaining image quality. In this instance the auto-gain 2114 system may be associated with the exposure system. The system may provide for fast auto-exposure and auto-gain algorithms, which utilize the histogram and time history of the image using the frame buffer 2118. This may allow auto-gain 2114 and auto-exposure to look at histogram from an array of pixels 1800 (plus more) that gives radiation 1000 levels and a range of where the quantum dot pixel 1800 level is, in order to choose the best exposure setting.

In embodiments, an IR 2110 laser may be utilized to help eliminate camera 2102 shake, for example by taking an number of pictures in a quick sequence and averaging them to remove the shake. The IR 2110 laser may be used as the vector, and wouldn't show up in the visible 2108 picture. This may apply to a military application 2130, where shake is often an issue. Consumer products may only look at something with over a certain number of shakes, say over a limited number of quantum dot pixels 1800, and subtract the shake out. In embodiments there may be more blur at the edges due to lens effects, and so boarder pixels may be used to subtract out.

Anti-shake techniques may also be applied to taking video, where processing must be done in real-time. Video anti-shaking may require tracking how much shaking is taking place, and then to shift coordinates of the image in quantum dot pixel 1800 memory. Determining how much shaking is taking place may also require performing a correlation calculation. The technique may take advantage of the fact that video cameras 2102 typically already have IR 2110 range finders, laser range finder, or the like, to utilize in the process.

Range finding may be possible through measuring the time-of-flight of a laser out and back to the pixel 1800. In an embodiment, there could be a visible 2108 quantum dot pixel 1800 array overlaying one IR 2110 quantum dot pixel 1800 for range finding or time gating. The visible 2108 and IR 2110 could then be mixed and manipulated to determine the range, from IR 2110 and visible 2108 together, and the image, from the visible 2108 quantum dot pixel 1800 array. With the use of stacked pixels 1800, there can be a color layer on top and the IR 2110 layer below it. The IR 2110 may pass through the visible 2108 layer and absorbed in the IR 2110 layer, without effecting the visible 2108 layer image. A single layer RGB-IR may also be able to be used.

In embodiments, sensors 2104 may be made very thin, especially applicable to the commercial 2120 mobile phone market where the thickness of the display and camera may largely determine the thickness of the phone. Users always want higher resolutions, and higher resolutions may translate into bigger sensors 2104, which in turn may call for a taller lens, and this may drive cost up. Thin sensors 2104 may be better enabled because of a very steep angle relative to the sensor 2104, enabled by the quantum dot material 200. Low radiation 1000 sensors 2104 may also be enabled through the increased sensitivity of the QDPC 100 technology, may enable pictures with no flash, ambient and low radiation 1000 photography, low radiation 1000 monitoring camera for security, hand-shake reduction, and the like. In embodiments, the QDPC 100 technology's greater sensitivity to low radiation 1000 applications, and large chief angle and low refractive index for the development of thin sensors 2104, may provide for improved and innovative applications for new sensors 2104.

In embodiments, QDPC 100 sensors 2104 may be applied to the short-wavelength infrared (SWIR) (1-2 um) spectral regions, where real-time medical imaging in the low-autofluorescence tissue transparency windows are centered at 1100 and 1350 nm [6], enabling real-time guidance of surgeons leading to complete resection of lymph nodes in an animal model [7]. The transparency of pigments and of silicon wafers may make the SWIR critical to machine vision inspection, and the 1-2 um region contains up to seven times more optical power on a moonless than any other spectral band, enabling un-illuminated night vision [8].

In embodiments, the QDPC 100 may be applied to commercial markets 2120 such as laptops, cell phones, cameras 2102, wireless cameras, USB cameras 2102, scanners, pointers, video conferencing, and the like. For instance, a low radiation 1000 and multi-spectral 2112 application of a QDPC 100 cell phone may enable a user greater security by viewing dark places like an alley at night. Cameras 2102 can be no-flash night shot cameras 2102, or externally powered by a laser, multi-spectral 2112, self-configuring, and the like. Scanners may be used for fingerprinting, array scanners for film negatives or documents, read-write head scanners for DVD/Blu-Ray, and the like. QDPC 100 enabled pointers may replace 2D gyro enabled pointers by utilizing a mapping of objects of reference in the visual field or using GPS plus objects, camera-based addressing systems for lighting networks, GPS associated with imaging systems, delocalized collaborative mode where a user could make use while mobile at a desk (browse through the Eiffel tower), and the like. Cell phone enabled QDPC 100 may take advantage of the very thin nature of the QDPC 100 technology to create thinner phones.

In embodiments, the QDPC 100 may be applied to the consumer market 2122, such as applied to gaming, 2D and 3D positional imaging, edge detection, motion tracking, green screen effects, peer-to-peer communications, multi-spectral effects, eye tracking and pupil position tracking, wearable cameras 2102, dark room vision with reduced color, game station with camera 2102, and the like.

In embodiments, the QDPC 100 may be applied to the medical market 2124, such as with multi-spectral imagers 2112, X-ray imagers 2110, wearable X-Ray 2110, assaying systems, endoscopy, scopes, pill cameras 2102, bloodstream cameras 2102, disposable micro-cameras 2102, eye-tracking systems, pupil monitoring, diagnostics, machine vision 2132 processing systems, wearable cameras 2102 for tracking patient behavior, and the like.

In embodiments, the QDPC 100 may be applied to the civil market 2128, such as retinal scanning from a distance, facial recognition, home security, personal security, child and elderly monitoring, ambient radiation 1000 insensitive security applications with modulated IR 2110 and IR 2110 combined with multi-spectral 2112 color security camera 2102, ATM machine cameras 2102, store monitoring cameras 2102, and the like.

In embodiments, the QDPC 100 may be applied to the military market 2130, such as with night-vision cameras 2102, no-shake cameras 2102, low-radiation 1000 cameras 2102 that are black and white in low radiation 1000 and color in high radiation 1000, night-vision with range finding, multi-spectral 2112 cameras 2102, and the like. QDPC 100 enabled cameras 2102 may allow the military to view scenes under different conditions with a single camera 2102, such as under day, night, smoke, fog, rain, and the like conditions. These cameras 2102 may be used by individuals, or mounted on a vehicle to provide all-condition viewing, such as on an unmanned aerial vehicle (UAV). Multi-spectral 2112 viewing systems may be ultra-wideband optical device, viewing across a wide range of the spectrum, such as simultaneous viewing of IR 2110, visible 2108, and UV 2110.

In embodiments, the QDPC 100 may be applied to the machine vision market 2132, such as the integration of very small cameras 2102 onto a robotics arm, multi-spectral 2112 inspection of products, simultaneous image and edge detection during inspection and counting, low-radiation 1000 inspection, integrated image processing for control algorithms, high resolution high gain 2114 cameras 2102, pattern recognition and detection, stored calibration images in memory 2118, and the like.

In embodiments, the QDPC 100 may be applied to the sensor market 2132, such as used in combination with emitters, such as a quantum dot LED where the solution is applied to the top of a semiconductor element and radiation 1000 is emitted through a focusing lens, a camera 2102 that emits an image as it simultaneously views the scene, a single chip camera-light, and the like. In embodiments, radiation 1000 emitting quantum dot structures 1100 may be used in combination with existing detector technologies, such as CMOS and CCD detectors with an emitting detector surface.

In embodiments, an integrated fingerprint sensor may be implemented by combining (1) An array of photoconductive regions independent read using a read-out integrated circuit (2) A source of illumination in the visible, or in the infrared, or both, that illuminates the subject to be read, and provides a signal for the photoconductive regions of (1) to sense.

In embodiments, the QDPC 100 may provide unique solutions to a plurality of markets. These unique solutions may be enabled through QDPC 100 functional platform features and benefits, as described herein, that may provide technological advantages that help to generate product innovations across a wide range of market applications.

Although the QDs are solution-deposited in the described embodiments, the QDs may deposited in other ways. As mentioned above, one motivation for using solution-deposition is its ready compatibility with existing CMOS processes. However, satisfactory devices can be made by vacuum-depositing or otherwise depositing the QDs.

Numerous example embodiments follow, including example embodiments of or including one or more of the materials, systems, devices and methods, described above and/or within the scope of the teachings presented herein.

The embodiments described herein include a number of aspects including an image sensor which includes an optically sensitive detector layer formed on an underlying integrated circuit, patterned to measure radiation impinging upon the detector layer and to provide processing and control associated with the image. Various alternative embodiments of the image sensors and host devices described herein are not limited to including the quantum films described herein.

Other aspects of the embodiments associated with the application of quantum dot films to image sensors include quantum dot processing and ligand exchange, quantum dot film formation, puddle casting, ligand exchange during film formation, growth from solution patterning and ligand exchange during film formation, patterning, stacked layers of dot material with electrical interconnect to read through a dielectric layer, etched electrical interconnects, calibrating a signal relating to a received charge from a first layer of quantum dot material, multi-layered quantum dot pixel layout, filterless photodetector, quantum dot pixel chip, embedded pixel circuitry, integrated circuitry within the quantum dot pixel chip, and product applications thereof.

In embodiments described herein, post-synthetically processing quantum dots may include precipitating the quantum dots, centrifuging the quantum dots, decanting the supernatant above the quantum dots, drying the quantum dots, redispersing the quantum dots in a solvent, filtering the redispersed quantum dots by size, and the like. Precipitating the quantum dots may involve placing the quantum dots in a solvent selected from the group comprising methanol, acetonitrile, ethyl acetate, isopropanol, propanol, and the like. The solvent for redispersion facilitates ligand exchange may be selected from a group including amine-terminated ligands, carboxyl-terminated ligands, phosphine-terminated ligands, polymeric ligands, and the like, where the solvent for redispersion is one or more of chloroform and butyl amine.

In embodiments described herein, quantum dot film formation may include a substrate for a quantum dot film and depositing a film of quantum dots on the surface of the substrate by at least one of spin coating, puddle casting, electrodeposition, vapor deposition, air brush spraying, growth from solution, hydrophobic systems, acceleration/evaporation in gas phase, photocopying, and ink jet printing. Ligand exchange may also be exchanged by dipping the substrate into a ligand-containing solvent, where the ligand is at least one of benzenedithiol, methanethiol, ethanethiol, and ethanedithi, and the solvent is at least one of acetonitrile, methanol, and toluene. Electrodeposition may proceed until a photocurrent generated by the quantum dot film being formed reaches a threshold, where air brush spraying may include entrainment of the quantum dots in a solvent. Activating the quantum dot film by one or more of an air bake and a methanol dip, and disposing an encapsulant over a portion of the quantum dot film, an encapsulant over a portion of the substrate, a passivation layer over a portion of the quantum dot film, or the like.

In embodiments described herein, forming a quantum dot film may include a substrate for a quantum dot film, depositing a puddle of quantum dot solution onto the surface of the substrate, causing the quantum dots to precipitate out of solution and form a quantum dot film on the surface of the substrate, and the like. Precipitation may be facilitated by a crosslinker introduced to the puddle or by crosslinker deposited on the surface of the substrate, where the crosslinker may be one or more of dithiol, diamine, dicarboxylic acid, ethanedithiol, thioglycolic acid, or the like, and the crosslinker may be deposited in a pattern along the substrate. In addition, the precipitation may be facilitated by a temperature change, solvent volatility, pressure applied to the puddle, a duration of time, a gas blown onto the puddle, introduction of a non-solvent to the puddle where the non-solvent may be one or more of methanol, ethyl acetate, acetonitrile, propanol, iso-propanol, or the like. Further, the puddle may be confined to an area on the surface of the substrate.

In embodiments described herein, a quantum dot film may be formed by providing a substrate for a quantum dot film, immersing the substrate in a solution of ligand to form a ligand-coated substrate, dip-coating the ligand-coated substrate in a quantum dot solution, causing the quantum dots from solution to aggregate on the surface of the ligand coated substrate, and forming a quantum dot film on the surface of the ligand-coated substrate and causing ligand exchange at substantially the same time.

In embodiments described herein, a quantum dot film may be formed by providing a substrate for a quantum dot film, attaching a crosslinker to the surface of the substrate, dipping the substrate with attached crosslinker in a quantum dot solution, and causing growth of a quantum dot film at a location on the substrate with attached crosslinker. The crosslinker may be one or more of dithiol, diamine, dicarboxylic acid, ethanedithiol, thioglycolic acid, or the like, where the crosslinker is deposited in a pattern along the substrate. The ligand exchange may be caused by dipping the substrate with disposed quantum dot film into a ligand-containing solvent, where the ligand is one or more of benzenedithiol, methanethiol, ethanethiol, and ethanedithiol, and the solvent is one or more of acetonitrile, methanol, and toluene.

In embodiments described herein, patterning a quantum dot film may include providing a substrate for a quantum dot film, causing a pattern to be presented on the surface of the substrate, and disposing a quantum dot film on the surface of the patterned substrate. The quantum dot film may be disposed substantially along a pattern, where the quantum dot film is disposed substantially along a void in the pattern. The film may be treated to remove portions of the film disposed along the pattern or a void in the pattern, where the pattern may be created by etching the substrate. Etching may be one or more of dry etching, chlorine etching, and fluorine etching, where masking creates the pattern. Disposing a quantum dot film may include precipitating the quantum dots substantially at the surface of the substrate, activating the quantum dots at the surface of the substrate. The pattern may be created by depositing crosslinker in a pattern on the surface of the substrate, where the crosslinker may be one or more of dithiol, diamine, dicarboxylic acid, ethanedithiol, thioglycolic acid, or the like. Disposing a quantum dot film may include quantum dot epitaxy, where quantum dot epitaxy may be analogous to molecular beam epitaxy, metallorganic chemical vapor deposition, chemical beam epitaxy, or the like.

An image sensor is described herein comprising (1) a substrate (2) a nanocrystalline film over a portion of the substrate (3) a substantially continuous layer conformally covering the nanocrystalline film and the exposed portions of the substrate; such that gases, liquids, and solids do not permeate the nanocrystalline film.

In embodiments described herein, reading an electrical signal from a quantum dot structure may include providing a multi-layered quantum dot structure comprising at least two optically stacked quantum dot structure layers, a first layer and a second layer, separated by a dielectric, providing an electrical interconnect that passes through the first layer and is electrically associated with the second layer, wherein the electrical interconnect is substantially electrically isolated from the first layer, and reading a signal from the electrical interconnect as an indication of the amount of incident light on the second layer, where the signal is a charge, voltage, current, or the like. The pixel circuit may be associated with the reading of the signal and processing signals in response to the signal read. The first layer may be responsive to a first absorption radiation wavelength range and substantially transparent to a first transparent radiation wavelength range, where the second layer is responsive to at least a portion of the first transparent wavelength range.

In embodiments described herein, a quantum dot structure may include providing a first quantum dot structure layer, a dielectric on top of the first quantum dot structure layer, an isolated electrical interconnection that at least passes into the first quantum dot structure layer and the dielectric layer, etching the electrical interconnection such that an electrically conductive region extends passed the dielectric layer, and providing a second quantum dot structure layer on top of the dielectric layer such that it is electrically associated with the electrically conductive region of the electrical interconnection.

In embodiments described herein, a multi-layered quantum dot structure may be calibrated by reading a signal from a first layer of a multi-layered quantum dot structure, determining if the signal is representative of an incident light on the first layer, and applying a correction factor in relation to the signal to form a corrected signal such that the corrected signal represents a calibrated signal. The step of applying the correction factor further may include calculating the correction factor in relation to a signal read from a second layer of the multi-layered quantum dot structure.

In embodiments described herein, a quantum dot structure may include a first layer of first wavelength range responsive quantum dot material, a second layer of second wavelength range responsive quantum dot material, wherein the second layer is optically stacked on top of the first layer, where the first and second layers form at least a portion of a pixel. In embodiments, the pixel may be in a Bayer patter; include red, green, and blue layouts; have at least one of red, green, and blue provided in a disproportionate amount. The first wavelength responsive material is responsive to a prescribed range of wavelengths, where the first wavelength responsive material may be further responsive to the prescribed range of wavelengths without requiring the use of colored filters. The pixel may include a disproportionate amount of second layer material to increase the pixel sensitivity to the second wavelength range. The first layer may be spin coated onto an integrated circuit.

In embodiments described herein, a photodetector utilizing quantum dots may include a multi-layered quantum dot structure comprising at least two quantum dot structure layers, a first exposed layer and a second exposed layer, separated by a dielectric, wherein the at least two quantum dot structure layers are adapted to be responsive to different ranges of radiation wavelengths without requiring a colored filter on top of the first exposed layer.

In embodiments described herein, a camera utilizing quantum dots may include a multilayered photodetector, wherein the multilayered photodetector includes at least two optically stacked layers of photosensitive materials, a first radiation exposed layer and a second radiation exposed layer, wherein the first radiation exposed layer is made of a material that converts a first wavelength range into electrical current and transmits a substantial portion of a second wavelength range, wherein the second radiation exposed layer is made of a material that converts at least a portion of the second wavelength range into electrical current. The first radiation exposed layer material may include quantum dot structures. The dielectric layer may be between the first radiation exposed layer and the second radiation exposed layer. The electrical interconnection may be electrically isolated from the second radiation exposed layer and electrically associated with the first radiation exposed layer to draw an electric signal from the first radiation exposed layer in response to first radiation exposed layer incident light. The at least two optically stacked layers of photosensitive materials may include at least a portion of a pixel, where the first radiation exposed layer is spin coated onto an integrated circuit.

In embodiments described herein, a quantum dot pixel chip may include providing a multilayered quantum dot structure comprising at least two optically stacked layers of quantum dot materials, a first and second layer, wherein the at least two optically stacked layers are made from different quantum dot materials adapted to respond to different radiation wavelength ranges; providing a first electrical interconnect, wherein the first electrical interconnect is substantially electrically isolated from the second layer and is electrically associated with the first layer to draw an electric charge from the first layer in response to first layer incident light within a first layer responsive range; providing a second electrical interconnect, wherein the second electrical interconnect is substantially electrically isolated from the first layer and is electrically associated with the second layer to draw an electric charge from the second layer in response to second layer incident light within a second layer responsive range; providing a dielectric between the first and second layers to provide substantial electrical isolation of the two layers; providing pixel circuitry to read the electric charge from the first electrical interconnect; and providing an integrated circuit chip with a processing facility to process information relating to the electric charge from the first interconnect. The quantum dot pixel chip may be integrated into at least one of a camera, sensor, viable detector, IR detector, UV detector, x-ray detector, multi-spectral detector, and high gain detector. Memory may be associated with the pixel circuitry, where the memory provides a function such as image persistence, frame buffering, or the like. The first layer may be spin coated onto an integrated circuit.

In embodiments described herein, the quantum dot pixel may include embedded circuitry, associating the embedded circuitry with a function, and connecting quantum dot pixel embedded circuitry to other circuitry within the quantum dot pixel chip. The embedded circuitry may include at least one of a biasing circuit, voltage biasing circuit, current biasing circuit, charge transfer circuit, amplifier, reset circuit, sample and hold circuit, address logic circuit, decoder logic circuit, memory, TRAM cell, flash memory cell, gain circuit, analog summing circuit, analog-to-digital conversion circuit, and a resistance bridge. The function may include at least one of readout, sampling, correlated double sampling, sub-frame sampling, timing, persistence, integration, summing, gain control, automatic gain control, off-set adjustment, calibration, offset adjustment, memory storage, frame buffering, dark current subtraction, and binning. The other circuitry may be located in at least one of a second quantum dot pixel, column circuitry, row circuitry, circuitry within the functional components of the quantum dot pixel chip, and circuitry within an integrated system with which the quantum dot pixel chip is associated.

Embodiments of the image sensor described herein include a wafer-integrated system. The wafer-integrated system can include various combinations of components or elements, for example at least two components, selected from a group that includes: elements embodied in silicon, including but not limited to analog, mixed-signal, and/or digital circuit elements; QuantumFilm such as described herein; optical materials and elements, including but not limited to lenses, gratings, and/or filters; a component configured to provide autofocus functionality to the image sensor, including but not limited to liquid crystals and/or other optically-tunable materials; Microelectromechanical System (MEMS) elements, including but not limited to movable actuators, flowing or moving fluids or bubbles, such as those to enable the sensing of motion and acceleration.

Embodiments of the image sensor described herein include a bottom electronic layer that comprises CMOS silicon electronics. The image sensor also includes one or more additional layers above the CMOS electronics layer that are configured to include or provide one or more of the following functions: conversion of the energy contained in light into an electronic excitation, such as an electron-hole pair or exciton; retention, or storage, of one or both classes of electronic excitations for a known period of time (e.g., 1 nanosecond, 1 microsecond, 1 millisecond, 100 milliseconds, a period approximately in the range 1 nanosecond to 100 milliseconds; relaying or transferring an electronic signal, related in a known fashion to the electronic charge contained in a known portion of the material, to an electrical contact connected to the underlying CMOS silicon electronics, such that the incidence of photons over a known period may be estimated based on the electrical signal collected in the CMOS silicon electronics.

Embodiments of the image sensor described herein include one or more films configured to include or provide one or more of conversion of the energy contained in light into an electronic excitation, such as an electron-hole pair or exciton, and storage of the generated electrons and/or holes. The stored electrons or holes are transferred out of the film at readout time to a circuit node. In embodiments the storage is realized using potential wells that are formed with impurities inside the film. The impurities can be injected into the film using diffusion, implantation, self-assembling, and/or a combination of diffusion, implantation, and/or self-assembling. The potential well depth is controlled such that the well can be emptied with small amount of bias voltage, for example approximately 0.1V, approximately 1V, approximately 2V, or within a voltage approximately in a range of −5V to 10V. When the well is empty, the potential of the well is fixed at a level that is different from the potential of the circuit node. The potential difference between the film potential well and the circuit node is high enough, for example approximately 0.5V, approximately 0.7V or approximately in the range of 0.1V to 5V, for the transfer of electrons or holes to be complete before incurring charge sharing effects.

Embodiments of the image sensor described herein include an optical imaging system comprising non-flat focal plane arrays. The non-flat focal plane arrays can have one of numerous shaped configurations. As a more specific example of non-flat focal plane arrays, embodiments of the image sensor described herein include an optical imaging system comprising curved focal plane arrays configured to mimic the field curvature. The optical imaging system of an embodiment includes a read-out integrated circuit comprising a crystalline semiconductor such as silicon. The optical imaging system of an embodiment includes an electrical interconnect reaching or extending from the surface of the silicon chip to the top surface of the silicon-based integrated circuit. The optical imaging system of an embodiment includes a curved configuration of the top surface, corresponding to the field curvature of the image to be projected onto the photodetecting layer lying atop this surface. The optical imaging system of an embodiment includes a photodetector layer configured to approximate the curvature of the curved top surface, and to approximately correspond to the field curvature of the image to be projected onto the top surface. The optical imaging system of an embodiment can include one or more additional layers such as layers for passivation, planarization, encapsulation, and/or optical imaging operations to name a few.

Embodiments of the image sensor described herein include stacked pixels. For example, the image sensor includes color pixels comprising a stack of photodetectors, where members of the stack are configured to have differing sensitivity to different colors of light. For example, the photodetectors onto which incident light impinges first may absorb primarily shorter-wavelength light, while the photodetectors onto which incident light impinges only after passing through one or more photodetectors may absorb longer-wavelength light. Embodiments include stacked pixels configured to achieve signal-to-noise that is higher, for each color, relative to a signal-to-noise ratio realized using a Bayer pattern array of 2×2 pixels having the same a real footprint as the stacked pixel.

Embodiments of the image sensor described herein include a stack of semiconductor die, interconnected as appropriate to a configuration of the image sensor and/or a host device that includes the image sensor. The stacked die of an embodiment are configured to provide a suite of functions. The suite of functions of an embodiment includes but is not limited to image sensing, which may include a number of die, where one or multiple die are configured for some combination of x-ray, ultraviolet, visible, and/or infrared sensing, and where other die are configured for some other combination of imaging in these spectral regions. The suite of functions of an embodiment includes but is not limited to image processing including compression, demosaicing, auto white balance, autofocus, denoising, deconvolution of signals convoluted by lenses and deconvolution of time-of-flight signals. The suite of functions of an embodiment includes but is not limited to control of actuators such as those used in focus and/or zoom to name a few. The suite of functions of an embodiment includes but is not limited to the passive conveyance of heat away from die or the die stack or, alternatively, the active cooling of die or the die stack. The suite of functions of an embodiment includes but is not limited to the determination of spatial position such as implemented using Global Positioning System (GPS). The suite of functions of an embodiment includes but is not limited to the storage of image or other data in memory. The suite of functions of an embodiment includes but is not limited to communications, including wired or wireless communications, with other elements in the system, wherein the communications include the use of protocols such as Bluetooth, Machine Independent Parallel Interface (MIPI) protocol, etc.

Embodiments described herein include a color image sensor that does not require a separate, lossy color filter layer. Instead, these embodiments comprise a focal plane array that includes a patterned array of photosensitive materials, where different materials within this array possess different sensitivities to different colors of the x-ray, UV, visible, and infrared optical spectrum. A demosaicing algorithm is then employed to estimate the intensities associated with each spectral component.

Embodiments of the image sensor described herein include a circuit configured to incorporate, include, or integrate at least one combination of the following components or elements: a photosensitive layer configured to include quantum film; circuitry configured for collecting, storing, amplifying, and interconverting electronic signals from the photosensitive layer; circuitry configured for storing digital information.

Embodiments of the image sensor described herein are configured to provide autofocus functionality. The image sensor includes an array of circuitry, and a photosensitive layer, configured for image sensing, circuitry configured for the estimation of whether the resultant image is in focus, and circuitry configured for the conveyance of signals to an actuator, or actuators, that alter the focus of the system of lenses onto the image sensor.

Embodiments of the image sensor described herein are configured to provide antishake functionality. The embodiments configured for antishake include at least one combination of the following: an array of circuitry, and a photosensitive layer, configured for image sensing; a mechanism, such as an accelerometer, configured to provide signals from which it is possible to estimate the motion of the module; circuitry configured to estimate whether the module is in motion, and that may include estimation of the direction, velocity, and acceleration of the module; circuitry or software configured to combine, with the aid of certain spatial transformation operations, a series of images obtained under motion of the sensor, in such a way as to cancel, in some part, the influence of motion during the acquisition of frames.

Embodiments described herein include a deconvolution algorithm based on concurrent image data from multiple imaging planes, such that an improved image or picture is generated using image data captured at different depths of focus. In conventional optical imaging systems, the optical field projected onto a focal plane array is generally nonplanar. This necessitates the use of imaging optics that retain a depth of focus sufficient to capture an acceptable image using a single, planary focal plane array. In embodiments, a multiplicity of planar image sensors is stacked atop one another. The data of each image sensor can be independently read, including sequential read operations and/or parallel read operations. The curvature of the optical plane is known, and a single two-dimensional (X-Y) image is reconstituted by estimating the optical field intensity at the most-in-focus vertical position (Z-dimension) pixel at that X-Y coordinate. As a result, low-F-number (e.g., 2 and below) optics are employed, resulting in high optical collection efficiency, low-light-sensitivity, and enhanced signal-to-noise ration, while preserving an in-focus image.

Embodiments of the image sensor described herein include microlenses. The image sensors with microlenses of an embodiment include an array of circuitry. The image sensors with microlenses of an embodiment include a photosensitive layer. The image sensors with microlenses of an embodiment include one or more layers configured for passivation of the photosensitive layer. The image sensors with microlenses of an embodiment include one or more layers configured for altering the reflection of the system. The image sensors with microlenses of an embodiment include one or more layers configured for filtering certain portions of the optical spectrum. The image sensors with microlenses of an embodiment include an array of curved optical elements configured to concentrate optical power incident on each pixel into a primary region for sensing within the portion of the photosensitive layer associated with each pixel element.

Embodiments of the image sensor described herein provide reduced optical crosstalk. The embodiments offering reduced optical crosstalk include a top-surface photodetector configured so that light of a range of visible and other colors is substantially absorbed within a thin layer. The thin layer of an embodiment includes a layer with a thickness approximately in a range of from 200 to 500 nm. The thin layer of an embodiment includes a layer with a thickness approximately in a range of from 200 to 1 um. The thin layer or an embodiment includes a layer with a thickness approximately in a range of from 200 to 2 um. The embodiments minimize lateral crosstalk between adjacent pixel elements through the near-complete absorption of light within the relatively thin layer.

Embodiments of the image sensor described herein provide simplified color processing relative to conventional image sensors. The embodiments providing simplified color processing include circuitry, software, or a combination thereof, configured for the estimation of the intensity associated with certain colors incident on certain pixels. The reduction of optical crosstalk realized through use of the estimation of an embodiment allows for a color or intensity-estimation algorithm in embodiments that requires only the signal associated with a particular pixel, and does not require signal information for nearby pixels. The estimation also may provide higher photo response with a higher degree of uniformity.

Embodiments of the image sensor described herein provide watermark recognition. Embodiments include an imaging system, and an object to be imaged, wherein the object to be imaged is configured to include a distinctive spatial, chromatic, or spatial-chromatic pattern which marks the object as authentic, or which provides data for look-up in a database for authentication or asset classification or asset recognition. The imaging system of these embodiments is configured to possess the sensitivity, in all wavelengths of light (including ultraviolet, visible, and infrared), to enable the recognition of the distinctive spatial, chromatic, or spatial-chromatic pattern. The imaging system of an embodiment includes an illumination device configured to illuminate the object, including illuminating in a time-resolved and/or spectrally-resolved fashion.

The imaging system with the image sensor of an embodiment can also be configured to inject artificial marks into captured or processed images. Embodiments include an optical imaging system that includes an image sensor, collection and focusing optics, and an optical source. The optical source emits light of a wavelength that may or may not be visible to the human eye, but which may be detected using some portion of, or all, pixels that comprise the image sensor. The object, which possesses distinguishing chromatic features in the wavelength of the optical source, is illuminated using the optical source. In this manner the object is labeled for covert recognition and/or authentication.

Embodiments of the image sensor described herein provide stereoscopic imaging. Embodiments include an imaging system onto which a multiplicity of images may be projected, including using different wavelengths and/or at different points in time, from multiple perspectives. These embodiments include circuitry and software for the transformation of this multiplicity of images into a stereoscopic project, or into a form of image data that includes information on depth as well as lateral illuminance.

Embodiments of the image sensor described herein provide motion recognition of image elements (e.g., a baseball bat in gaming, etc.). Embodiments include an imaging system, and an object to be included at times in imaging. The object includes but is not limited to distinctive spatial-chromatic markings, such that the lateral, and/or depth, and/or rotational motion, of the objected may be accurately determined by the image sensor and associated components based on a series of images. The image system is configured to include the capacity to measure the spatio-temporal-chromatic patterns produced by the object.

In embodiments, integrated circuitry may be included in the quantum dot pixel chip, including a plurality of layers of integrated circuitry that underlie the quantum dot pixel array, and associated with image processing. The layers of integrated circuitry may be connected with the quantum dot pixel array, where the connection is such that the integrated circuitry and the quantum dot pixel array may form a single semiconductor chip. In embodiments, the quantum dot pixel array may be mounted onto the integrated circuitry to form a hybrid integrated circuit structure. The integrated circuitry may have a function, where the function includes at least one of high-speed readout, signal multiplexing, decoding, addressing, amplification, analog-to-digital conversion, binning, memory, image processing, and image sensor processing. The layers may include electrical interconnects, where the interconnects are between electrical components, where the electrical components may be within at least one of quantum dot pixel chip integrated circuitry, quantum dot pixel circuitry, integrated system circuitry, input to the quantum dot pixel chip, and output from the quantum dot pixel chip. The integrated circuitry may include improved characteristics, where the characteristics include at least one of high-speed readout, low-noise readout, small die area, larger process geometries, combined analog and digital circuitry, higher levels of integration, image processing capabilities, low power, single voltage designs, and increased detector fill factor.

In embodiments, the quantum dot pixel chip may be integrated into a device, where the device is selected from the group consisting of a camera, a cell phone handset, a digital still camera, a video camcorder, a security camera, a web camera, a night vision device, night vision goggles, a night vision scope, a no-shake camera, a low-light camera, a black and white in low light and color in high light camera and a multi-spectral camera. The device may include an image sensor with at least one a top-surface quantum dot photodetector, a high fill-factor arrangement of quantum dot pixels, a wide chief ray angle configuration of quantum dot pixels, and a high-sensitivity photodetector. The quantum dot pixel chip may provide automated gain control within the quantum dot photodetector. The device may include a tunable materials system for top-surface photodetection that responds to different energies of photons, where the different energies are selected from the group consisting of x-ray, ultraviolet, infrared, and visible energies. The device may be for at least of aircraft wing inspection, a machine vision application, integration of a camera on a robotic arm, multi-spectral inspection of products, simultaneous image and edge detection during inspection and counting, low-light inspection, integrated image processing for control algorithms, high resolution high gain cameras, pattern recognition, pattern detection, stored calibration of images in memory, medical image sensing, detection of laser targeting while simultaneously providing an image of an environment, all-condition viewing when used by an individual, and vehicle-based image-sensing.

In embodiments, regions of a photoconductive layer are electrically contacted by an array of electrodes. It is important to achieve consistent, robust mechanical and electrical contact between the photoconductive layer and the electrical contacts. Following fabrication of the electrical contacts, there may exist residual oxides, oxynitrides, or organic materials. In embodiments, it may be important to remove the organic materials; this may be accomplished using an oxygen plasma etch, an acid-alkaline clean, an alkaline-acid clean, or combinations thereof. In embodiments, it may be important to remove the oxides and/or the oxynitrides; this may be accomplished using a dry etch or a wet etch. thin barrier layer atop the electrical contacts, prior to the deposition of the photoconductive layer.

In embodiments, it may be important to achieve electrical contact through a thin barrier layer between the electrical contacts mentioned above and the photoconductive layer. In this instance, it is important to remove oxides, oxynitrides, and/or organic materials of unknown or uncontrolled thickness; and then to deposit, or otherwise form, a controlled thin barrier layer atop the electrical contacts, prior to the deposition of the photoconductive layer.

In embodiments, in order to achieve robust mechanical and electrical contact of the photoconductive layer to the electrical contacts, an adhesion material may be employed. This material may contain a moiety having an affinity to the materials at the surface of the electrical contacts, and another moiety having an affinity to the materials at the surface of the constituents of the photoconductive layer. As one example, if the electrical contacts are terminated with TiN (titanium nitride) or an oxynitride thereof, then one moiety in the adhesion layer may be an amine functional group. As another example, if the photoconductive layer includes a metal such as Pb, Cd, Cu, In, or Bi, then one moiety in the adhesion layer may be a thiol functional group. Such an adhesion, or anchor, layer may be applied by spin-casting, dip-coating prior to, during, or following deposition of some or all of the photoconductive layer.

In embodiments, electrical contacts having a deep work function, such as a work function lower than 4.4 eV or 4.6 eV or 4.8 eV below the vacuum level, may be employed. If a binary alloy such as TiN (titanium nitride) is employed, the work function may be deepened by controlling the ratio of Ti to N during formation of the alloy. For example, a high ratio (greater than 1:1) of N to Ti may be used.

In embodiments, electrical contacts having a specific work function may be desired. The work function of an already-patterned set of electrical contacts may be modified by first depositing a thin layer of another material, such as, for example, a 10 nm layer of Au, Pd, Pt, or Ni; and the continuity of this deposited layer may then be deliberately disrupted using a selective lift-off technique wherein deposited metals covering a region where the metals are not desired are lifted off through selective etching of the non-contacting material (e.g. buffered oxide etching of an oxide in the non-contacting regions)

In embodiments, electrical contacts having a specific work function may be desired. The work function of an already-patterned set of electrical contacts may be modified by (1) treating the sample, through spin-coating, dip-coating, spray-coating, or other method, with a material that adheres selectively to materials over which electrical contact is not desired; (2) depositing a thin layer of another material, such as, for example, a 10 nm layer of Au, Pd, Pt, or Ni; and (3) then cleaning the wafer to lift off the deposited layer in regions where contact is not desired.

In embodiments, pixel binning may be employed, wherein the signal corresponding to a multiplicity of smallest-patterned-pixels may be accumulated within a single superpixel. The accumulation can be achieved in digital domain, in analog domain, or at film level. Take the example of accumulating the signal corresponding to a 2×2 array into a single superpixel: It can be achieved using film binning by applying a bias across the entire set of 2×2 pixels and integrating into a single capacitor. It can also be achieved using analog binning by sum up the charge stored in the 4 individual capacitors, or using digital binning after the signal is digitized.

In embodiments, the photocurrent passing through the photoconductive layer, and collected in a given pixel, may have a nonlinear relationship with the intensity impinging on that pixel. In embodiments, this nonlinear relationship may be sublinear, thus the photoconductive gain may diminish with increasing intensity. In embodiments, it may be desired to provide an estimate of the intensity impinging on the pixel during the integration period based on the collected current. In embodiments, it may be desirable to estimate the functional relationship between intensity and photocurrent, Photocurrent=f(Intensity), and to determine, or estimate, the inverse of this function, Intensity=$f^{-1}$(Photocurrent). In embodiments, the functional relationship between intensity and photocurrent may be characterized during production or assembly and a representation be stored on or off device for use by a post processing digital algorithm that will invert ($f^{-1}$) the intensity-photocurrent mapping function(f). In embodiments, a signal proportional to the inferred intensity may be generated, by the implementation of an analog function that approximately inverts ($f^{-1}$) the intensity-photocurrent mapping function (f).

In embodiments, the voltage spacing among the levels of an analog-to-digital converter may be manipulated, including being made nonuniform, such as to compensate for the nonlinear photocurrent vs. intensity relationship mentioned above.

In embodiments, further arithmetic operations may be implemented in the digital domain to produce a revised digital estimate of the impinging intensity based on the observed digital estimate of the photocurrent or accumulated photocharge.

In embodiments, an integrated fingerprint sensor may be implemented by combining (1) An array of photoconductive regions independent read using a read-out integrated circuit (2) A source of illumination in the visible, or in the infrared, or both, that illuminates the subject to be read, and provides a signal for the photoconductive regions of (1) to sense.

In embodiments, pixel can change shapes from one layer to another layer, while maintaining the same pixel area. From example, in quantum film layer the pixel can have square shape while in silicon layer the pixel has rectangular shape. As another example, if the film layer pixel is 2 um×2 um, the silicon layer pixel can be 4 um×1 um: so putting together 4 silicon layer pixels in a row gives a total area of 4 um×4 um, which corresponds to 2×2 array of film layer pixels. Utilizing this pixel shape flexibility one can achieve very high pixel sharing such as 16-to-2 sharing, which means 16 pixels can be read out using 2 sets of readout transistors.

In embodiments, the film can be used in direct integration mode. Normally the film is treated as a photo-resistor that changes current or resistance with light level. In this direct integration mode, the film is biased to be a direct voltage output device. The voltage level direct indicates the incident light level.

In embodiments, the quantum film signal can be read out using transistors that have high noise factors. For example, thin oxide transistors can be used to read out quantum film signal, with the presence of large leakage current and other noise sources of the transistors themselves. This becomes possible because the film has intrinsic gain which helps suppress the transistor noise.

Further example embodiments follow, including example embodiments of or including one or more of the materials, systems, devices and methods, described above and/or within the scope of the teachings presented herein.

Embodiments include an optically sensitive layer having a photoconductive gain determined by a prior temperature excursion, wherein greater application of elevated temperatures decreases the gain; wherein the temperature excursion is determined by the photoconductive gain, wherein the elevation of the gain increases current flow and results in elevated temperature; and wherein, upon continuous fixed-intensity illumination for a time period, the photoconductive gain reaches a substantially same final value independent of an initial value of the gain.

Embodiments include a photovoltaic device for converting optical power into electrical power, comprising: a first electrode having a deep work function deeper than approximately −4.6 eV; a nanocrystalline layer comprising colloidal quantum dot cores connected using linker molecules that span the surfaces of the cores; and a shallow work function electrode having a work function shallower than approximately −4.4 eV.

Embodiments include a photovoltaic device for converting optical power into electrical power, comprising: a first junction device having a bandgap less than approximately 1.2 eV; a second junction device having a bandgap greater than approximately 1.5 eV; wherein the devices comprise the same chemical constituents, the chemical constituents arrayed to form nanoparticles having a diameter greater than approximately 4 nm in the first layer, and to form nanoparticles having a diameter less than approximately 3 nm in the second layer.

Embodiments include a method of making an optically sensitive layer, comprising: placing a nanoparticle-containing colloidal dispersion in proximity to a substrate; inducing graduate precipitation of the nanoparticle-containing dispersion onto the substrate through the addition of a precipitating or crosslinking moiety.

Embodiments include an optically sensitive layer having a conductance exceeding 3E-12 ohm*cm under approximately 1 lux green illumination, and the optically sensitive layer having a conductance of less than 1E-13 ohm*cm in the dark; and wherein, following turn-off of the illumination, conductance of the optically sensitive layer substantially returns to its dark conductance within less than 100 milliseconds.

Embodiments include an image sensor comprising: at least one optically sensitive layer; a periodic array of spectrally-selective filters; wherein an image possessing spectral information is constructed through knowledge of the absorption spectra, and spatial locations of, the spectrally-selective filters; wherein the spectral information includes at least one of red, green, blue, ultraviolet, and infrared spectral information.

Embodiments include an image sensor comprising: a first region of optically sensitive material; a second region of optically sensitive material; and wherein the first and second region possess substantially different spectral onset of absorption; and wherein an image possessing spectral information is constructed through knowledge of the absorption spectra, and spatial locations of, the first and second regions; wherein the spectral information includes at least one of red, green, blue, ultraviolet, and infrared spectral information.

Embodiments include an image sensor system-on-chip that includes: an optically sensitive layer; digital circuitry providing for a substantial reduction in the number of digital bits describing the resultant image relative to the raw digital pattern generated by the sensor.

Embodiments include an image sensor that includes: a first optically sensitive layer; a second optically sensitive layer; wherein the image sensor generates two overlaid images, the first image comprising a representation of the visible-spectral-domain content incident on the image sensor, and the second image comprising a representation of an interval-spectral-domain content incident on the image sensor, wherein the interval includes at least one of red, green, blue, ultraviolet, and infrared spectral information.

Embodiments include an image sensor including: at least one optically sensitive layer; an array of electrodes in contact with the optically sensitive layer which are arrayed in a hexagonal (honeycomb) pattern.

Embodiments include an image sensor including: at least one optically sensitive layer; an array of electrodes in contact with the optically sensitive layer which are arrayed in a triangular (honeycomb) pattern.

Embodiments include an image sensor including: at least one optically sensitive layer; at least one element that disperses incident radiation into spectral components whose angles of incidence on the optically sensitive layer are determined by their wavelengths.

Embodiments include an image sensor including: at least one optically sensitive layer; at least one element that disperses incident radiation into spectral components whose spatial positions of incidence onto the optically sensitive layer are determined by their wavelengths.

Embodiments include an image sensor including at least one optically sensitive layer, wherein light is substantially absorbed for angles of incidence ranging from approximately 0 to 35 degrees measured relative to a perpendicular to the optically sensitive layer.

Embodiments include a pixilated array including at least one optically sensitive layer, wherein the pixilated regions are optically isolated from one another using a substantially optically absorbing or reflecting intervening material.

Embodiments include an image sensor including at least one optically sensitive layer wherein: a first region of the optically sensitive layer provides electronic signals related to the intensity incident on that region and lying within a first spectral region; a second region of the optically sensitive layer provides electronic signals related to the intensity incident on that region and lying within a second spectral region; wherein digital representations of the results visible and x-ray images are conveyed from the sensor. The first spectral region of an embodiment is one or more of a visible spectral region, an X-ray spectral region, an ultraviolet (UV) spectral region, a near infrared (IR) (NIR) spectral region, a short-wavelength IR (SWIR) spectral region, and a mid-wavelength IR (MWIR) spectral region in any combination with the second spectral region of an embodiment, which is one or more of a visible spectral region, an X-ray spectral region, an ultraviolet (UV) spectral region, a near infrared (IR) (NIR) spectral region, a short-wavelength IR (SWIR) spectral region, and a mid-wavelength IR (MWIR) spectral region.

Embodiments include an imaging system including: at least one optically sensitive layer; at least one optical source; wherein a distance of objects in the imaging system's field of view may be ascertained to within 10 feet.

Embodiments include an imaging system including: at least one optically sensitive layer; at least one optically sensitive device capable of distinguishing optical signals space more than ten nanoseconds apart; wherein a distance of objects in the imaging system's field of view may be ascertained to within 10 feet.

Embodiments include an imaging system including at least one optically sensitive layer; wherein a three-dimensional spatial representation of objects lying within the system's field of view is conveyed from the imaging system.

Embodiments include an array of photodetecting elements integrated on an electronic circuit including at least one optically sensitive layer; wherein at least approximately 70% of photons incident on the array are absorbed within the optically sensitive layer.

Embodiments include an array of photodetecting elements integrated on an electronic circuit including at least one optically sensitive layer; wherein, for at least one wavelength of light, the power absorbed from light propagating back towards the source of illumination is greater than approximately 20% of the power absorbed from light propagating from the source of illumination forwards towards the array.

Embodiments include a device comprising at least one first optically sensitive region combined with at least one other optically sensitive region that is partially obscured by the first optically sensitive region; wherein an electronic signal related to the difference in conductance of the two regions is reported using an electronic circuit.

Embodiments include a device comprising at least one optically sensitive region combined with at least one other optically sensitive region that is partially or substantially obscured from illumination; wherein an electronic signal related to the difference in conductance of the two regions is reported using an electronic circuit.

Embodiments include an image sensor comprising an optically sensitive layer overlaid on an electronic circuit fabricated using a standard complementary metal oxide semiconductor (CMOS) process.

Embodiments include an image sensor comprising a first optically sensitive region adjacent to, but separated from, a second optically sensitive region.

Embodiments include an method of making a first optically sensitive region adjacent to, but separated from, a second optically sensitive region; wherein a single continuous optically sensitive region is first formed, and the region is then cloven into separate regions through a change in the volume of the optically sensitive region.

Embodiments include a photodetector comprising: an optically sensitive region; a first electrode pair across which a voltage bias approximately in a range of 0.1 to 10 v is applied; a second electrode pair; wherein a circuit is configured to measure the potential difference between the electrodes in the second electrode pair.

Embodiments include an image sensor comprising at least: one optically sensitive region; a substantially transparent material covering the optically sensitive region.

Embodiments include an image sensor comprising at least: one optically sensitive region; a substantially transparent material covering the optically sensitive layer and having a refractive index different by at least 0.5 compared to the refractive index of the optically sensitive layer.

Embodiments include an image sensor comprising: an optically sensitive layer; and an adhesion layer anchoring the constituents of the optically sensitive layer to an electronic circuit.

Embodiments include an image sensor comprising at least one optically sensitive layer and at least one electrode; wherein the electrode comprises titanium nitride; and wherein the optically sensitive layer is in electrical communication with the electrode.

Embodiments include an image sensor comprising at least one optically sensitive layer and at least one electrode; wherein the electrode includes a region comprising titanium oxynitride; and wherein the optically sensitive layer is in electrical communication with the electrode.

Embodiments include an image sensor comprising at least one optically sensitive layer and at least one electrode; wherein the electrode comprises platinum; and wherein the optically sensitive layer is in electrical communication with the electrode.

Embodiments include an image sensor comprising at least one optically sensitive layer and at least one electrode; wherein the electrode comprises nickel; and wherein the optically sensitive layer is in electrical communication with the electrode.

Embodiments include an image sensor comprising at least one optically sensitive layer and at least one electrode; wherein the electrode comprises copper; and wherein the optically sensitive layer is in electrical communication with the electrode.

Embodiments include an image sensor comprising at least one optically sensitive layer and at least one electrode; wherein the electrode comprises tantalum nitride; and wherein the optically sensitive layer is in electrical communication with the electrode.

Embodiments include an image sensor comprising at least one optically sensitive layer and at least one electrode; wherein the electrode comprises tantalum oxynitride; and wherein the optically sensitive layer is in electrical communication with the electrode.

Embodiments include an image sensor comprising at least one optically sensitive layer and at least one electrode; wherein the electrode comprises aluminum; and wherein the optically sensitive layer is in electrical communication with the electrode.

Embodiments include an image sensor comprising at least one optically sensitive layer and at least one electrode; wherein the electrode comprises aluminum oxide; and wherein the optically sensitive layer is in electrical communication with the electrode.

Embodiments include an image sensor comprising at least one optically sensitive layer and at least one electrode; wherein the electrode comprises gold; and wherein the optically sensitive layer is in electrical communication with the electrode.

Embodiments include an image sensor comprising at least one optically sensitive layer and at least one electrode; wherein the electrode comprises palladium; and wherein the optically sensitive layer is in electrical communication with the electrode.

Embodiments include an image sensor comprising at least one optically sensitive layer and at least one electrode; wherein the electrode comprises platinum Sulfide (PtS); and wherein the optically sensitive layer is in electrical communication with the electrode.

Embodiments include an image sensor comprising at least one optically sensitive layer and at least one electrode; wherein the electrode comprises palladium sulfide (PdS); and wherein the optically sensitive layer is in electrical communication with the electrode.

Embodiments include an image sensor comprising at least one optically sensitive layer and at least one electrode; wherein the electrode comprises Gold sulfide (AuS); and wherein the optically sensitive layer is in electrical communication with the electrode.

Embodiments include an image sensor comprising: at least one optically sensitive layer; a circuit, at least one node of which is in electrical communication with the optically sensitive layer; wherein the circuit provides for amplification of the electrical current traversing the optically sensitive layer.

Embodiments include an image sensor comprising: at least one optically sensitive layer; a circuit, at least one node of which is in electrical communication with the optically sensitive layer, wherein the circuit resets a charge store to a predetermined voltage.

Embodiments include an image sensor comprising: at least one optically sensitive layer; a circuit, at least one node of which is in electrical communication with the optically sensitive layer; wherein the circuit stores an electrical signal proportional to the integrated intensity falling on the optically sensitive layer over the course of a prescribed integration period.

Embodiments include an image sensor comprising: at least one optically sensitive layer; a circuit, at least one node of which is in electrical communication with the optically sensitive layer; wherein the circuit generates a digital representation related to the integrated intensity falling on the optically sensitive layer over the course of a prescribed integration period Embodiments include an image sensor comprising: at least one optically sensitive layer; a circuit which provides an electrical signal related to the difference between the voltage at a node immediately prior to the integration of current from the optically sensitive layer and the voltage at the same node immediately following the integration of current from the optically sensitive layer.

Embodiments include an image sensor comprising: at least one optically sensitive layer; and a circuit that sets the integration period to maximize the usable dynamic range of the image.

An image sensor comprising: at least one optically sensitive layer; and a circuit that sets the electronic gain to maximize the usable dynamic range of the image.

Embodiments include an image sensor comprising: at least one optically sensitive layer; and a circuit that subtracts from each pixel a value related to the dark current generated in that pixel.

Embodiments include an image sensor comprising: at least one optically sensitive layer; and a circuit that subtracts from each image a stored replica of a dark image.

Embodiments include an image sensor comprising: at least one optically sensitive layer; and a circuit that first subtracts from each image a stored replica of a dark image, and then divides the result by a stored replica of a light frame from which the same dark image has previously been subtracted.

Embodiments include an image sensor comprising: at least one optically sensitive layer; and a circuit that enables the storage of digital data.

Embodiments include an image sensor comprising: at least one optically sensitive layer; and a circuit that stores a dark frame.

Embodiments include an image sensor comprising: at least one optically sensitive layer; and a circuit that stores a light frame taken under known illumination.

Embodiments include an image sensor comprising: at least one optically sensitive layer; and a circuit that stores the difference between a light frame taken under known illumination and a dark frame.

Embodiments include an image sensor comprising: an optically sensitive layer; and a read-out circuit which reports an average over multiple samples of a voltage related to the intensity of illumination on the optically sensitive layer.

Embodiments include an optical system comprising: an optically sensitive layer; and a source of illumination in a wavelength band to which the optically sensitive layer is responsive.

Embodiments include an image sensor comprising: an optically sensitive layer; and a circuit that provides an output image related to the derivative in time of the illumination of the sensor.

Embodiments include an optically sensitive layer comprising closely-packed semiconductor nanoparticle cores, wherein each core is partially covered with an incomplete shell, where the shell produces trap states having substantially a single time constant.

Embodiments include an optically sensitive layer comprising nanocrystal cores passivated using ligands of at least two substantially different lengths.

Embodiments include an optically sensitive layer comprising nanocrystal cores passivated using at least one ligand of at least one length, and passivated and crosslinked using at least one crosslinking molecule of at least one length.

Embodiments include a semiconductor nanoparticles comprising PbS which are partially or completely covered with a shell of PbSO3.

Embodiments include a partially oxidized PbS core which is substantially lacking in PbSO4 (lead sulfate).

Embodiments include an a color-sensitive pixel comprising: a photoconductive material; and a wavelength-selective-light-absorbing material.

Embodiments include are directed to a method of making a color-sensitive pixel, wherein a photoconductive material and a wavelength-selective light-absorbing material substantially phase-segregate in the course of processing, resulting in a top portion of a pixel being constituted principally of the wavelength-selective-optically-absorbing material, and the bottom portion of the pixel being constituted principally of the photoconductive material.

Embodiments include a device comprising an optically sensitive layer and a circuit made using thin-oxide transistors.

Embodiments include an optically sensitive layer having responsivity greater than 1 A/W throughout the entire spectral region 400 nm to 1600 nm.

Embodiments include an imaging system including providing for passive night vision based on illumination due to the atmospheric nightglow.

Embodiments include an image sensor system-on-chip comprising: an optically sensitive layer; and a means of storing a plurality of frames.

Embodiments include an image sensor system-on-chip comprising: an optically sensitive layer; and a means of storing a plurality of frames; wherein the image sensor provides high-rate video compression.

Embodiments include an image sensor system-on-chip comprising: an optically sensitive layer; and a means of storing a plurality of frames; wherein the image sensor ascertains inter-frame motion and implements image stabilization by combining suitably x-y-shifted frames.

Embodiments include an image sensor system-on-chip comprising: an optically sensitive layer; and a means of ascertaining and storing the locations of nonresponsive pixels.

Embodiments include an image sensor system-on-chip comprising: an optically sensitive layer; a means of ascertaining and storing the locations of pixels having a leakage current higher than a predetermined threshold.

Embodiments include an image sensor system-on-chip comprising: an optically sensitive layer; a circuit and algorithm to generate a spatial Fourier transform of the image.

Embodiments include an image sensor system-on-chip comprising: an optically sensitive layer; a circuit and algorithm to optimize the exposure conditions.

Embodiments include an imaging system comprising: an image sensor including an optically sensitive layer; a circuit and algorithm to implement autofocus.

Embodiments include an image sensor comprising: a substrate; a nanocrystalline film over a portion of the substrate; a substantially continuous layer conformally covering the nanocrystalline film and the exposed portions of the substrate, wherein gases, liquids, and solids do not permeate the nanocrystalline film.

Embodiments are directed to an imaging system comprising: an image sensor circuit comprising an optically sensitive layer; at least one element, monolithically integrated with the image sensor circuit, and selected from a group consisting of: analog, mixed-signal, and/or digital circuit elements; optical materials and elements, including but not limited to lenses, gratings, and/or filters; a component configured to provide autofocus functionality to the image sensor, including but not limited to liquid crystals and/or other optically-tunable materials; Microelectromechanical System (MEMS) elements, including but not limited to movable actuators, flowing or moving fluids or bubbles, such as those to enable the sensing of motion and acceleration.

Embodiments include an image sensor comprising an optically sensitive layer which is nonplanar and which is conformably formed on the underlying substrate.

Embodiments include an optical system comprising: an image sensor comprising an optically sensitive layer; and at least one additional semiconductor die.

Embodiments include an imaging system comprising: an optically sensitive layer; circuitry configured for the estimation of whether the resultant image is in focus; and circuitry configured for the conveyance of signals to at least one actuator that alters the focus of the system of lenses onto the image sensor.

Embodiments include an imaging system comprising: an optically sensitive layer; a means of estimating the motion of the imaging system; circuitry configured to estimate imaging system motion including at least one of: the direction, velocity, and acceleration of the module; circuitry or software configured to combine, with the aid of certain spatial transformation operations, a series of images obtained under motion of the sensor, in such a way as to cancel, in some part, the influence of motion during the acquisition of frames.

Embodiments include an image sensor comprising: a first optically sensitive layer; a second optically sensitive layer; wherein the first and second optically sensitive layer are responsive to a similar spectral region; and where the second optically sensitive layer allows transmission of greater than approximately 50% of light incident on it down to the first optically sensitive layer.

Embodiments include an imaging system comprising: an image sensor comprising an optically sensitive layer; a plurality of lenses providing an f-number less than approximately 2.8.

Embodiments include an image sensor comprising: a first optically sensitive layer; at least one substantially transparent interlayer; and an array of curved optical elements that determine the distribution of intensity across the optically sensitive layer.

Embodiments include an imaging system, and an object to be imaged, wherein the object to be imaged is configured to include a distinctive spatial, chromatic, or spatial-chromatic pattern which marks the object as authentic, or which provides data for look-up in a database for authentication or asset classification or asset recognition.

Embodiments include an imaging system, wherein an object to be imaged includes a distinctive spatial, chromatic, or spatial-chromatic pattern which marks the object as authentic, or which provides data for look-up in a database for authentication or asset classification or asset recognition.

An imaging system onto which a multiplicity of images may be projected, including using different wavelengths and/or at different points in time, from multiple perspectives. These embodiments include circuitry and software for the transformation of this multiplicity of images into a stereoscopic project, or into a form of image data that includes information on depth as well as lateral illuminance.

Embodiments include an integrated fingerprint sensor comprising: an array of photoconductive regions independently read using a read-out integrated circuit; a source of illumination in one or more of a visible and infrared spectrum that illuminates the subject to be read, and provides a signal for sensing by the photoconductive regions.

Embodiments are directed to a photoconductive photodetector having responsivity greater than approximately 0.4 A/W and a substantially single-valued persistence time of less than approximately 100 ms.

Embodiments include a photoconductive photodetector having responsivity greater than approximately 0.4 A/W, and having photocurrent, following the turn-off of illumination, that returns substantially to its dark current value within less than approximately 200 ms.

Embodiments include a nanocrystalline solid substantially possessing a single trap state lifetime, or persistence time, in the range of approximately 1 ms to 100 ms.

Embodiments include a nanocrystalline solid in which a portion of the nanocrystal' surfaces are oxidized, wherein a first set of native oxides are excluded and a second set of native oxides are present. The first set of native oxides includes PbSO4, for example. The second set of native oxides includes PbSO3, for example.

Embodiments include a nanocrystalline solid in which trap states provide persistence, wherein the energy to escape from the predominant trap states is less than or equal to approximately 0.1 eV, wherein there exists a much lower concentration of trap states having energy greater than or equal to approximately 0.2 eV.

Embodiments include a photoconductive photodetector in which substantially a single chemical species has associated with it a substantially single energy depth and thus, at a given temperature, a substantially single trap state lifetime, and thus a substantially single temporal component associated with the rise and fall of photocurrent during incident optical transients.

Embodiments include a photoconductive photodetector in which substantially a single chemical species has associated with it a substantially single energy depth and thus, at a given temperature, a substantially single trap state lifetime, and thus a substantially single temporal component associated with the rise and fall of photocurrent during incident optical transients. The single chemical species of an embodiment is PbSO3 (lead sulfite). The single energy depth of an embodiment is approximately 0.1 eV. The substantially single trap state lifetime of an embodiment, at room temperature, is approximately 30 milliseconds. The substantially single temporal component associated with the rise and fall of photocurrent in an embodiment is approximately 30 milliseconds.

Embodiments include a photoconductive photodetector in which substantially a single chemical species has associated with it a substantially single energy depth and thus, at a given temperature, a substantially single trap state lifetime, and thus a substantially single temporal component associated with the rise and fall of photocurrent during incident optical transients. The photoconductive medium of the photodetector of an embodiment is substantially devoid of lead sulfate PbSO4, having depth 0.3 eV or greater, and having transient component of order seconds. The photoconductive medium of the photodetector of an embodiment is substantially devoid of lead carboxylate, having depth 0.2 eV or greater, and having transient component of order half a second or more. Other chemical species may be present in the photoconductive medium if they do not have associated with them trap states. For example PbS may be used as the basis for the photoconductive semiconductor medium; and organic ligands such as ethanethiol, ethanedithiol, butanethiol, butanedithiol, hexanethiol, hexanedithiol, dodecanethiol, and dodecanedithiol, and their complexes with Pb, may all be included.

Embodiments include an optically sensitive layer comprising substantially fused nanocrystal cores having a dark current density less than approximately 0.1 nA/cm2.

Embodiments include an optically sensitive layer comprising substantially fused nanocrystal cores, wherein the nanocrystals are passivated using a chemical functional group, wherein the passivating moiety includes a conductive crosslinker.

The nanocrystals of an embodiment are passivated using a chemical functional group including one or more of thiol, amine, and carboxylate. The passivating moiety of an embodiment is a conductive crosslinker including one or more of benzene, dibenzene, and tribenzene.

Embodiments include an optically sensitive layer including of substantially fused nanocrystal cores, wherein the nanoparticles surfaces are passivated to provide persistence less than approximately 100 microseconds duration.

Embodiments include an optically sensitive layer that overlies two electrodes, wherein one electrode includes a material having work function deeper than approximately −4.6 eV, and the other electrode includes a material having work function shallower than approximately −4.4 eV.

Embodiments include an image sensor in which the predominant direction of photocurrent flow within each pixel is parallel to the surface of the integrated circuit.

Embodiments include a colloidal quantum dot solid in which the predominance of minority carriers are able to diffuse over a distance of more than approximately 100 nm prior to recombining Embodiments include a colloidal quantum dot solid in which, under the application of an electric field exceeding approximately 10E4 V/um, the predominance of charge carriers of at least one type are able to drift over a distance of greater than approximately 400 nm prior to recombining. The predominance of charge carriers of an embodiment includes electrons. The predominance of charge carriers of an embodiment includes holes.

Embodiments include a nanocrystal device in which a substantial portion of the flowing current is contributed from each of drift and diffusion. A substantial portion of the flowing current of the nanocrystal device of an embodiment is contributed from drift due to a field. A substantial portion of the flowing current of the nanocrystal device of an embodiment is contributed from diffusion due to a charge carrier concentration gradient.

Embodiments include a region of a doped-nanocrystal nanocrystal device which is substantially depleted of free carriers.

Embodiments include a region of an unbiased doped-nanocrystal nanocrystal device which is substantially depleted of free carriers.

Embodiments are directed to an optoelectronic device comprising an integrated circuit comprising a silicon substrate, at least one diffusion layer, at least one polysilicon layer and at least two metal layers, including at least a first metal layer and a second metal layer, an optically sensitive layer in electrical communication with the second metal layer; and the at least one polysilicon layer and the at least one diffusion layer forming a plurality of transistors in electrical communication with the optically sensitive layer through at least the second metal layer.

In this embodiment, the integrated circuit may a complementary metal oxide semiconductor (CMOS) integrated circuit. The minimum feature spacing of the integrated circuit is in a range of approximately 100 nm to 200 um. The at least two metal layers include metal interconnect layers. The second metal layer forms contacts in electrical communication with the optically sensitive layer. The contacts comprise an aluminum body, a first coating and a second coating, the first coating comprising titanium nitride and positioned between the aluminum body and the optically sensitive layer, the second coating comprising titanium oxynitride and positioned between the first coating and the optically sensitive layer. The contacts comprise an aluminum body, a first coating and a second coating, the first coating comprising titanium nitride and positioned between the aluminum body and the optically sensitive layer, the second coating located between the first coating and the optically sensitive layer and comprising a metal selected from the group consisting of gold, platinum, palladium, nickel and tungsten. The contacts have a thickness less than approximately half the thickness of the first metal layer. The contacts have a thickness less than approximately 50 nanometers and a width in a range of approximately 100 nm to 500 nm. The contacts have an aspect ratio of thickness to width of at least 1:2 or 1:3 or 1:4. The contacts are formed from a plurality of metal sub-layers, each metal sub-layer having a thickness of less than approximately 50 nm, each metal sub-layer comprising a constituent selected from the group consisting of titanium nitride, titanium oxy nitride, gold, platinum, palladium, nickel and tungsten.

In one embodiment, the second metal layer consists of metal other than aluminum, the metal including at least one layer selected from the group consisting of titanium nitride, titanium oxynitride, gold, platinum, palladium, nickel and tungsten; or the second metal layer consists of metal other than copper, the metal including at least one layer selected from the group consisting of titanium nitride, titanium oxynitride, gold, platinum, palladium, nickel and tungsten; or the second metal layer comprises a constituent selected from the group consisting of titanium nitride, titanium oxynitride, gold, platinum, palladium, nickel and tungsten. The optically sensitive layer makes direct contact with the second metal layer. The optically sensitive layer comprises a coating on the second metal layer. The first metal layer has a thickness in the range of approximately 100 nm to 500 nm. The metal layers comprise at least one additional metal layer between the first metal layer and the second metal layer. Each of the first metal layer and the at least one additional metal layer comprises aluminum, wherein the at least one additional metal layer excludes aluminum; or each of the first metal layer and the at least one additional metal layer comprises aluminum and titanium nitride, wherein the at least one additional metal layer excludes aluminum. In one embodiment, each of the first metal layer and the at least one additional metal layer excludes aluminum; or each of the first metal layer and the at least one additional metal layer excludes copper; or wherein the metal layers comprise at least two additional metal layers between the first metal layer and the second metal layer.

In an embodiment, the metal layers comprise at least three additional metal layers between the first metal layer and the second metal layer; or the metal layers comprise at least four additional metal layers between the first metal layer and the second metal layer. The first metal layer has a first thickness dimension and the second metal layer has a second thickness dimension. The first thickness dimension may be less than the second thickness dimension, or the first thickness dimension may be greater than the second thickness dimension. or the first thickness dimension is approximately equivalent to the second thickness dimension. The first metal layer has a first aspect ratio and the second metal layer has a second aspect ratio. The first aspect ratio may be relatively high or relatively low. The second aspect ratio may be relatively high or relatively low, or the first aspect ratio is approximately equivalent to the second aspect ratio.

In an embodiment, the integrated circuit results from 0.13 um CMOS processing. The integrated circuit results from 0.18 um CMOS processing. In an embodiment, a non-linear relationship exists between electrical characteristics of the optically sensitive layer and intensity of light absorbed by the optically sensitive layer, wherein a continuous function represents the non-linear relationship. A rate of the current flow through the optically sensitive layer has a non-linear relationship with intensity of the light absorbed by the optically sensitive layer. The optically sensitive layer may have a non-linear relationship with intensity of the light absorbed by the optically sensitive layer. The optically sensitive layer has photoconductive gain when a voltage difference is applied across the optically sensitive layer and the optically sensitive layer is exposed to light.

In an embodiment, persistence of the optically sensitive layer is approximately in a range of 1 ms to 200 ms. The optically sensitive layer is a non-rectifying optically sensitive layer. The optically sensitive layer has a surface area determined by a width dimension and a length dimension. The width dimension may be approximately 2 um or less than approximately 2 um, and the length dimension may be approximately 2 um or less than approximately 2 um. The optically sensitive layer may comprise a continuous film of interconnected nanocrystal particles. The nanocrystal particles comprise a plurality of nanocrystal cores and a shell over the plurality of nanocrystal cores. The plurality of nanocrystal cores may be fused. The physical proximity of the nanocrystal cores of adjacent nanocrystal particles provides electrical communication between the adjacent nanocrystal particles. The physical proximity includes a separation distance of less than approximately 0.5 nm.

In an embodiment, the electrical communication includes a hole mobility of at least approximately 1E-5 square centimeter per volt-second across the nanocrystal particles. The plurality of nanocrystal cores are electrically interconnected with linker molecules. The linker molecules include bidentate linker molecules. The linker molecules can include ethanedithiol or benzenedithiol.

In an embodiment, the optically sensitive layer comprises a unipolar photoconductive layer including a first carrier type and a second carrier type, wherein a first mobility of the first carrier type is higher than a second mobility of the second carrier type. The first carrier type is electrons and the second carrier type is holes, or the first carrier type is holes and the second carrier type is electrons. The optically sensitive layer comprises a nanocrystal material having photoconductive gain and a responsivity of at least approximately 0.4 amps/volt (A/V). The responsivity is achieved under a bias approximately in a range of 0.5 volts to 5 volts.

The optically sensitive layer may comprise nanocrystals of a material having a bulk bandgap, and wherein the nanocrystals are quantum confined to have an effective bandgap more than twice the bulk bandgap; or the optically sensitive layer includes nanocrystals comprising nanoparticles, wherein a nanoparticle diameter of the nanoparticles is less than a Bohr exciton radius of bound electron-hole pairs within the nanoparticle. The optically sensitive layer comprises monodisperse nanocrystals or nanocrystals. The nanocrystals are colloidal quantum dots. The quantum dots include a first carrier type and a second carrier type, wherein the first carrier type is a flowing carrier and the second carrier type is one of a substantially blocked carrier and a trapped carrier. The colloidal quantum dots include organic ligands, wherein a flow of at least one of the first carrier type and the second carrier type is related to the organic ligands. The optically sensitive layer can be biased as both a current sink and a current source. The optically sensitive layer comprises closely-packed semiconductor nanoparticle cores. Each core may be partially covered with an incomplete shell, where the shell produces trap states having substantially a single time constant. The nanoparticle cores comprise PbS partially covered with a shell comprising PbSO3. The nanoparticle cores are passivated using ligands of at least two substantially different lengths, or the nanoparticle cores are passivated using at least one ligand of at least one length. The nanoparticle cores are passivated and crosslinked using at least one crosslinking molecule of at least one length. The crosslinking molecule is a conductive crosslinker.

In an embodiment, each nanoparticle core is covered with a shell, where the shell comprises PbSO3, or the nanoparticle cores comprise PbS that is partially oxidized and substantially lacking in PbSO4 (lead sulfate). The optically sensitive layer comprises a nanocrystalline solid, wherein at least a portion of a surface of the nanocrystalline solid is oxidized. A composition of the nanocrystalline solid excludes a first set of native oxides and includes a second set of native oxides. The first set of native oxides includes PbSO4 (lead sulfate) and the second set of native oxides includes PbSO3.

In a device of an embodiment, trap states of the nanocrystalline solid provide persistence, wherein an energy to escape from a predominant trap state is less than or equal to approximately 0.1 eV. In the device, a non-predominant trap state, wherein an energy to escape from the non-predominant trap state is greater than or equal to approximately 0.2 eV. The device of comprises a continuous transparent layer, the continuous transparent layer comprising substantially transparent material, wherein the continuous transparent layer at least partially covers the optically sensitive layer. An adhesion layer anchors constituents of the optically sensitive layer to circuitry of the integrated circuit. The optically sensitive layer comprises at least one of a wavelength-selective light-absorbing material and a photoconductive material. The device comprises an array of curved optical elements that determine a distribution of intensity across the optically sensitive layer. The optically sensitive layer comprises substantially fused nanocrystal cores having a dark current density less than approximately 0.1 nA/cm2.

Embodiments are directed to an optoelectronic device comprising: an integrated circuit comprising a silicon substrate, at least one diffusion layer, at least one polysilicon layer and at least two metal layers, including at least a first metal layer and a second metal layer, a coating on the second metal layer, the coating comprising an optically sensitive layer in electrical communication with the second metal layer, the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer, wherein the at least two metal layers include metal interconnect layers; an optically sensitive layer in electrical communication with the second metal layer; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer, wherein the integrated circuit is a complementary metal oxide semiconductor (CMOS) integrated circuit; an optically sensitive layer in electrical communication with the second metal layer; and the at least one polysilicon layer and the at least one diffusion layer forming a plurality of transistors in electrical communication with the optically sensitive layer through at least the second metal layer.

Embodiments include, an optoelectronic device comprising: an integrated circuit comprising a silicon substrate, at least one diffusion layer, at least one polysilicon layer and at least two metal layers, including at least a first metal layer and a second metal layer; an optically sensitive layer in electrical communication with the second metal layer, wherein the second metal layer forms contacts in electrical communication with the optically sensitive layer; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer; an optically sensitive layer in electrical communication with the second metal layer, wherein the second metal layer forms contacts in electrical communication with the optically sensitive layer, wherein the contacts comprise an aluminum body, a first coating and a second coating; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer; an optically sensitive layer in electrical communication with the second metal layer, wherein the second metal layer forms contacts in electrical communication with the optically sensitive layer, wherein the contacts comprise an aluminum body, a first coating and a second coating, the first coating comprising titanium nitride and positioned between the aluminum body and the optically sensitive layer, the second coating comprising titanium oxynitride and positioned between the first coating and the optically sensitive layer; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer; an optically sensitive layer in electrical communication with the second metal layer, wherein the second metal layer forms contacts in electrical communication with the optically sensitive layer, wherein the contacts comprise an aluminum body, a first coating and a second coating, the first coating comprising titanium nitride and positioned between the aluminum body and the optically sensitive layer, the second coating located between the first coating and the optically sensitive layer and comprising a metal selected from the group consisting of gold, platinum, palladium, nickel and tungsten; and the at least one polysilicon layer and the at least one diffusion layer forming a plurality of transistors in electrical communication with the optically sensitive layer through at least the second metal layer.

Embodiments include an optoelectronic device comprising:

an integrated circuit comprising a silicon substrate, at least one diffusion layer, at least one polysilicon layer and at least two metal layers, including at least a first metal layer and a second metal layer, the second metal layer comprising metal other than aluminum; an optically sensitive layer in electrical communication with the second metal layer; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer, the second metal layer comprising metal other than copper; an optically sensitive layer in electrical communication with the second metal layer; and the at least one polysilicon layer and the at least one diffusion layer forming a plurality of transistors in electrical communication with the optically sensitive layer through at least the second metal layer.

Embodiments include an optoelectronic device comprising: an integrated circuit comprising a silicon substrate, at least one diffusion layer, at least one polysilicon layer and at least two metal layers, including at least a first metal layer and a second metal layer, the second metal layer comprising a constituent selected from the group consisting of titanium nitride, titanium oxynitride, gold, platinum, palladium, nickel and tungsten; an optically sensitive layer in electrical communication with the second metal layer; and the at least one polysilicon layer and the at least one diffusion layer forming a plurality of transistors in electrical communication with the optically sensitive layer through at least the second metal layer.

Embodiments are directed to a method comprising: producing an integrated circuit comprising a silicon substrate, at least one diffusion layer, at least one polysilicon layer and at least two metal layers, including at least a first metal layer and a second metal layer; producing an optically sensitive layer in electrical communication with the second metal layer, wherein the at least one polysilicon layer and the at least one diffusion layer form a plurality of transistors in electrical communication with the optically sensitive layer through at least the second metal layer.

Embodiments are directed to a method comprising: exposing an optically sensitive material to light; providing a current flow through the optically sensitive material, wherein a rate of the current flow through the optically sensitive material has a non-linear relationship with intensity of the light absorbed by the optically sensitive material; using the current flow to discharge a portion of charge from a charge store over a period of time; and generating a signal from the charge store based on the amount of charge remaining in the charge store after the period of time.

Embodiments are directed to a method comprising: exposing an optically sensitive material to light; providing a current flow through the optically sensitive material, the current flow varying with a photoconductive gain of the optically sensitive material, wherein the photoconductive gain during the exposing period depends on the intensity of the light absorbed by the optically sensitive material; using the current flow to discharge a portion of charge from a charge store over a period of time; and generating a signal from the charge store based on the amount of charge remaining in the charge store after the period of time.

Embodiments are directed to a method comprising: exposing an optically sensitive material to light; applying a voltage to the optically sensitive material such that a voltage difference is formed across the optically sensitive material; changing the voltage over a period of time by flowing current through the optically sensitive material, wherein the rate of the current flow through the optically sensitive material has a non-linear relationship with intensity of the light absorbed by the optically sensitive material; and generating a signal based on the voltage remaining after the period of time.

Embodiments are directed to a photodetector comprising: a pixel region comprising an optically sensitive material; pixel circuitry electrically coupled to the optically sensitive material, the pixel circuitry establishing a voltage over an integration period of time, wherein the voltage has a non-linear relationship with intensity of light absorbed by the optically sensitive material of the respective pixel region, wherein a signal is generated based on the voltage after the integration period of time, the signal having a noise level; a converter configured to convert the signal into digital pixel data, wherein the converter has an input range; and at least one of the pixel circuitry and the optically sensitive layer providing a dynamic range more than at least twice the ratio of the input range of the converter divided by the noise level.

Embodiments include a photodetector comprising: a pixel region comprising an optically sensitive material; pixel circuitry in electrical communication with the optically sensitive material, the pixel circuitry establishing a voltage over an integration period of time, wherein the voltage has a non-linear relationship with intensity of light absorbed by the optically sensitive material of the respective pixel region; read out circuitry configured to generate a signal based on the voltage after the integration period of time; an analog-to-digital converter configured to convert the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level. The dynamic range is in a range of more than at least three times to approximately ten times the ratio of the input range divided by the noise level. The dynamic range is more than at least three times the ratio of the input range divided by the noise level. The dynamic range may be more than at least five or ten times the ratio of the input range divided by the noise level. The photodetector has a non-linear relationship between electrical characteristics of the optically sensitive material and intensity of light absorbed by the optically sensitive material, wherein a continuous function represents the non-linear relationship. The continuous function is a continuous polynomial function representing the non-linear relationship between photoconductive gain of the optically sensitive material and intensity of light absorbed by the optically sensitive material. A digital number corresponding to the digital pixel data has a linear relationship to the intensity.

Embodiments include an image sensor comprising: a photosensor array having a plurality of pixel regions, the pixel regions arranged into a plurality of rows and a plurality of columns, wherein each pixel region includes at least one optically sensitive material; pixel circuitry coupled to each of the respective pixel regions, wherein the pixel circuitry establishes a voltage over an integration period of time, the voltage having a non-linear relationship with intensity of light absorbed by the optically sensitive material of the respective pixel region, wherein output signals are generated based on the voltage; and signal processing circuitry coupled to the pixel circuitry and generating pixel data for a subset of pixel regions using the respective output signals, wherein the pixel data has a linear relationship with the intensity of the light absorbed by the optically sensitive material of each of the respective pixel regions in the selected subset of pixel regions. The pixel circuitry comprises read out circuitry that generates the output signals. Pixel select circuitry configured to select the pixel circuitry for a subset of the pixel regions to be read out.

Embodiments include a photodetector comprising: a photosensor array having a plurality of pixel regions, the pixel regions arranged into a plurality of rows and a plurality of columns; each pixel region comprising at least one optically sensitive material; pixel circuitry coupled to each of the respective pixel regions, wherein the pixel circuitry establishes a voltage over an integration period of time, the voltage having a non-linear relationship with intensity of light absorbed by the optically sensitive material of the respective pixel region; the pixel circuitry including read out circuitry configured to generate a signal based on the voltage; pixel select circuitry configured to select the pixel circuitry for a subset of the pixel regions to be read out; and signal processing circuitry configured to generate digital pixel data for the selected subset of pixel regions, wherein the digital pixel data for the subset of pixel regions has a linear relationship with the intensity of the light absorbed by the optically sensitive material of each of the respective pixel regions in the selected subset of pixel regions.

Embodiments include a method comprising: exposing an optically sensitive material to light; providing a current flow through the optically sensitive material, wherein a non-linear relationship exists between electrical characteristics of the optically sensitive material and intensity of light absorbed by the optically sensitive material, wherein a continuous function represents the non-linear relationship; using the current flow to discharge a portion of charge from a charge store over a single integration period; and generating a signal from the charge store based on the amount of charge remaining in the charge store after the single integration period. Anon-linear relationship exists between photoconductive gain of the optically sensitive material and intensity of light absorbed by the optically sensitive material. The continuous function is a continuous polynomial function representing the non-linear relationship between photoconductive gain of the optically sensitive material and intensity of light absorbed by the optically sensitive material. A digital number output corresponding to the signal has a linear relationship to the intensity.

Embodiments include a method comprising: exposing an optically sensitive material to light; providing a current flow through the optically sensitive material; controlling a charge store over a single integration period by discharging a portion of charge from the charge store in response to the current flow; and generating a data signal from the charge store based on the amount of charge remaining after the single integration period; wherein a continuous function represents a non-linear relationship between photoconductive gain of the optically sensitive material and intensity of light absorbed by the optically sensitive material.

Embodiments include a photodetector comprising: a pixel region comprising an optically sensitive material; circuitry in electrical communication with the optically sensitive material, the circuitry establishing a voltage using a single integration period of time for the pixel region, the circuitry generating a signal based on the voltage after the single integration period of time, wherein the photoconductive gain of the optically sensitive material has a continuous functional relationship with intensity of the light absorbed by the optically sensitive material; an analog-to-digital converter converting the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level.

Embodiments include a photodetector comprising: a pixel region comprising an optically sensitive material having a non-linear relationship between electrical characteristics of the optically sensitive material and intensity of light absorbed by the optically sensitive material circuitry in electrical communication with the optically sensitive material, the circuitry establishing a voltage using a single integration period of time for the pixel region, the circuitry generating a signal based on the voltage after the single integration period of time, wherein the photoconductive gain of the optically sensitive material has a continuous functional relationship with intensity of the light absorbed by the optically sensitive material; an analog-to-digital converter converting the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level.

Embodiments include a method comprising: exposing an optically sensitive material to light; providing a current flow through the optically sensitive material, wherein a rate of the current flow through the optically sensitive material has a non-linear relationship with intensity of the light absorbed by the optically sensitive material; collecting charge from the current flow over a period of time; and generating a signal from the charge collected over the period of time.

Embodiments include a photodetector comprising: a pixel region comprising an optically sensitive material; pixel circuitry electrically coupled to the optically sensitive material, the pixel circuitry providing a current flow through the optically sensitive material, wherein a rate of the current flow through the optically sensitive material has a non-linear relationship with intensity of the light absorbed by the optically sensitive material; charge collection circuitry that collects charge relating to the current flow over a period of time; and read out circuitry that generates a signal from the charge collected over the period of time. The photodetector has a converter configured to convert the signal into digital pixel data, wherein the converter has an input range. At least one of the pixel circuitry and the optically sensitive layer providing a dynamic range more than at least twice the ratio of the input range of the converter divided by the noise level.

Embodiments include a photodetector comprising: a pixel region comprising an optically sensitive material; pixel circuitry electrically coupled to the optically sensitive material, the pixel circuitry providing a current flow through the optically sensitive material, wherein a rate of the current flow through the optically sensitive material has a non-linear relationship with intensity of the light absorbed by the optically sensitive material; charge collection circuitry that collects charge relating to the current flow over a period of time; and read out circuitry configured to generate a signal based on the collected charge; an analog-to-digital converter configured to convert the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level. The dynamic range is in a range of more than at least three times to approximately ten times the ratio of the input range divided by the noise level. A non-linear relationship exists between electrical characteristics of the optically sensitive material and intensity of light absorbed by the optically sensitive material, wherein a continuous function represents the non-linear relationship. The continuous function is a continuous polynomial function representing the non-linear relationship. A digital number corresponding to the digital pixel data has a linear relationship to the intensity.

Embodiments include a photodetector comprising: a photosensor array having a plurality of pixel regions, the pixel regions arranged into a plurality of rows and a plurality of columns, wherein each pixel region includes at least one optically sensitive material; pixel circuitry electrically coupled to the optically sensitive material, the pixel circuitry providing a current flow through the optically sensitive material, wherein a rate of the current flow through the optically sensitive material has a non-linear relationship with intensity of the light absorbed by the optically sensitive material; signal processing circuitry coupled to the pixel circuitry and generating pixel data for a subset of pixel regions using output signals of the respective pixel regions, wherein the pixel data has a linear relationship with the intensity of the light absorbed by the optically sensitive material of each of the respective pixel regions in the selected subset of pixel regions. The pixel circuitry comprises read out circuitry that generates the output signals.

Pixel select circuitry is configured to select the pixel circuitry for a subset of the pixel regions to be read out.

Embodiments include a photodetector comprising: a plurality of electrodes, including at least a first electrode and a second electrode; an optically sensitive material between the first electrode and the second electrode; circuitry that applies a voltage difference between the first electrode and the second electrode such that current flows through the optically sensitive material during an integration period of time, wherein the rate of the current flow through the optically sensitive material has a non-linear relationship with intensity of light absorbed by the optically sensitive material; a charge store in electrical communication with at least one of the electrodes, the quantity of charge in the charge store based on the current flow through the optically sensitive material during the integration period of time; and read out circuitry configured to generate a signal based on the charge in the charge store after the integration period of time. A portion of the energy in the charge store is dissipated over the integration period of time. The charge store is charged by the current flow during the integration period of time.

Embodiments include a photodetector comprising: a photosensor array having a plurality of pixel regions, the pixel regions arranged into a plurality of rows and a plurality of columns; each pixel region comprising at least one optically sensitive material and a plurality of electrodes, including at least a first electrode and a second electrode; each pixel region comprising an optically sensitive material between the first electrode and the second electrode; pixel circuitry that applies a voltage difference between the first electrode and the second electrode such that current flows through the optically sensitive material during an integration period of time, wherein the rate of the current flow through the optically sensitive material has a non-linear relationship with intensity of light absorbed by the optically sensitive material; the pixel circuitry including a charge store in electrical communication with at least one of the electrodes, the charge store storing energy based on the current flow through the optically sensitive material during the integration period of time; and read out circuitry configured to generate a signal based on the energy of the charge store for the respective pixel region after the integration period of time; and pixel select circuitry to select the pixel circuitry for a subset of the pixel regions to be read out.

Embodiments include a photodetector comprising: a photosensor array having a plurality of pixel regions, the pixel regions arranged into a plurality of rows and a plurality of columns; each pixel region comprising at least one optically sensitive material; pixel circuitry for each of the respective pixel regions, the pixel circuitry for each respective pixel region applying a voltage difference across the optically sensitive material for the respective pixel region, wherein the rate of the current flow through the optically sensitive material has a non-linear relationship with intensity of light absorbed by the optically sensitive material of the respective pixel region; the pixel circuitry including a charge store to provide a charge related to the current flow through the optically sensitive material of the respective pixel region during the integration period of time; the pixel circuitry including read out circuitry to generate a signal based on the charge of the charge store for the respective pixel region after the integration period of time; and pixel select circuitry to select the pixel circuitry for a subset of the pixel regions to be read out. The pixel select circuitry selects the pixel circuitry for a subset of the pixel regions to be read out nearly simultaneously.

Embodiments include a method comprising: providing an optically sensitive material; causing a current to flow through the optically sensitive material during an integration period of time by providing a voltage difference across the optically sensitive material and exposing the optically sensitive material to light, wherein the rate of the current flow through the optically sensitive material depends upon the voltage difference across the optically sensitive material and intensity of the light absorbed by the optically sensitive material; using the current flow through the optically sensitive material to discharge a portion of charge from a charge store during the integration period of time; varying both the voltage difference across the optically sensitive material and the rate of the current flow through the optically sensitive material during at least a portion of the integration period while the intensity of the light substantially constant; and generating a signal based on the amount of charge remaining in the charge store after the integration period of time.

Embodiments include a photodetector comprising: a pixel region comprising an optically sensitive material; pixel circuitry electrically coupled to the optically sensitive material, the pixel circuitry causing a current to flow through the optically sensitive material during an integration period of time by providing a voltage difference across the optically sensitive material when the optically sensitive material is exposed to light, wherein the rate of the current flow through the optically sensitive material depends upon the voltage difference across the optically sensitive material and intensity of the light absorbed by the optically sensitive material, wherein the current flow through the optically sensitive material discharges a portion of charge from a charge store during the integration period of time, wherein both the voltage difference across the optically sensitive material and the rate of the current flow through the optically sensitive material vary during at least a portion of the integration period while the intensity of the light is substantially constant; and read out circuitry generating a signal based on the amount of charge remaining in the charge store after the integration period of time.

Embodiments include a method comprising: providing an optically sensitive material; causing a current to flow through the optically sensitive material during an integration period of time by providing a voltage difference across the optically sensitive material and exposing the optically sensitive material to light, wherein the rate of the current flow through the optically sensitive material depends upon the voltage difference across the optically sensitive material and intensity of the light absorbed by the optically sensitive material; collecting charge from the current flow during the integration period of time; varying both the voltage difference across the optically sensitive material and the rate of the current flow through the optically sensitive material during at least a portion of the integration period while maintaining the intensity of the light substantially constant; and generating a signal based on the charge collected during the integration period of time.

Embodiments include a photodetector comprising: a pixel region comprising an optically sensitive material; pixel circuitry electrically coupled to the optically sensitive material, the pixel circuitry causing a current to flow through the optically sensitive material during an integration period of time by providing a voltage difference across the optically sensitive material when the optically sensitive material is exposed to light, wherein the rate of the current flow through the optically sensitive material depends upon the voltage difference across the optically sensitive material and intensity of the light absorbed by the optically sensitive material; the pixel circuitry collecting charge from the current flow during the integration period of time, wherein both the voltage difference across the optically sensitive material and the rate of the current flow through the optically sensitive material vary during at least a portion of the integration period while maintaining the intensity of the light substantially constant; and read out circuitry generating a signal based on the charge collected during the integration period of time.

Embodiments include a photodetector comprising: a plurality of electrodes, including at least a first electrode and a second electrode; an optically sensitive material between the first electrode and the second electrode; circuitry configured to apply a voltage difference between the first electrode and the second electrode such that current flows through the optically sensitive material during an integration period of time, wherein the rate of the current flow through the optically sensitive material depends upon the voltage difference across the optically sensitive material and an intensity of light absorbed by the optically sensitive material; the circuitry configured to vary both the voltage difference across the optically sensitive material and the rate of the current flow through the optically sensitive material for a constant intensity of light during at least a portion of the integration period; a charge store in electrical communication with at least one of the electrodes, the charge store configured to provide a charge responsive to the current flow through the optically sensitive material during the integration period of time; and read out circuitry configured to generate a signal based on the charge of the charge store after the integration period of time.

Embodiments include a photodetector comprising: a photosensor array having a plurality of pixel regions, the pixel regions arranged into a plurality of rows and a plurality of columns; each pixel region comprising at least one optically sensitive material; pixel circuitry for each of the respective pixel regions, the pixel circuitry for each respective pixel region configured to apply a voltage difference across the optically sensitive material for the respective pixel region, wherein the rate of the current flow through the optically sensitive material depends upon the voltage difference across the optically sensitive material and an intensity of light absorbed by the optically sensitive material of the respective pixel region; the pixel circuitry configured to vary both the voltage difference across the optically sensitive material and the rate of the current flow through the optically sensitive material for a constant intensity of light during at least a portion of the integration period; the pixel circuitry including a charge store, the charge store configured to provide a charge in response to the current flow through the optically sensitive material of the respective pixel region during the integration period of time; the pixel circuitry including read out circuitry configured to generate a signal based on the charge of the charge store for the respective pixel region after the integration period of time; and pixel select circuitry configured to select the pixel circuitry for a subset of the pixel regions to be read out.

Embodiments include a method comprising: exposing an optically sensitive material to light; providing a current flow through the optically sensitive material, wherein optical sensitivity of the optically sensitive material depends upon intensity of light absorbed by the optically sensitive material; using the current flow to discharge a portion of charge from a charge store over a period of time; and generating a signal from the charge store based on the amount of charge remaining in the charge store after the period of time. The optical sensitivity of the optically sensitive material at an intensity of light less than approximately 1 lux is more than twice the optical sensitivity of the optically sensitive material at an intensity of light of at least 100 lux; or the optical sensitivity of the optically sensitive material at an intensity of light less than approximately 1 lux is more than ten times the optical sensitivity of the optically sensitive material at an intensity of light of at least 100 lux.

Embodiments include a method comprising: exposing an optically sensitive material to light; providing a current flow through the optically sensitive material, the current flow varying with a photoconductive gain of the optically sensitive material, wherein optical sensitivity of the optically sensitive material depends upon intensity of light absorbed by the optically sensitive material; using the current flow to discharge a portion of charge from a charge store over a period of time; and generating a signal from the charge store based on the amount of charge remaining in the charge store after the period of time.

Embodiments include a method comprising: exposing an optically sensitive material to light; applying a voltage to the optically sensitive material such that a voltage difference is formed across the optically sensitive material; changing the voltage over a period of time by flowing current through the optically sensitive material, wherein optical sensitivity of the optically sensitive material depends upon intensity of light absorbed by the optically sensitive material; and generating a signal based on the voltage remaining after the period of time.

Embodiments include a photodetector comprising: a pixel region comprising an optically sensitive material, wherein optical sensitivity of the optically sensitive material depends upon intensity of light absorbed by the optically sensitive material; pixel circuitry electrically coupled to the optically sensitive material, the pixel circuitry establishing a voltage over an integration period of time, wherein a signal is generated based on the voltage after the integration period of time, the signal having a noise level; a converter configured to convert the signal into digital pixel data, wherein the converter has an input range; and at least one of the pixel circuitry and the optically sensitive layer providing a dynamic range more than at least twice the ratio of the input range of the converter divided by the noise level. The voltage has a non-linear relationship with intensity of light absorbed by the optically sensitive material of the respective pixel region.

Embodiments include a photodetector comprising: a pixel region comprising an optically sensitive material, wherein optical sensitivity of the optically sensitive material depends upon intensity of light absorbed by the optically sensitive material; pixel circuitry in electrical communication with the optically sensitive material, the pixel circuitry establishing a voltage over an integration period of time; read out circuitry configured to generate a signal based on the voltage after the integration period of time; an analog-to-digital converter configured to convert the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level. The voltage has a non-linear relationship with intensity of light absorbed by the optically sensitive material of the respective pixel region. The dynamic range is in a range of more than at least three times to approximately ten times the ratio of the input range divided by the noise level, or it is more than at least three times the ratio of the input range divided by the noise level, or it is more than at least five times the ratio of the input range divided by the noise level, or it is more than at least ten times the ratio of the input range divided by the noise level. A non-linear relationship exists between electrical characteristics of the optically sensitive material and intensity of light absorbed by the optically sensitive material, wherein a continuous function represents the non-linear relationship. The continuous function is a continuous polynomial function representing the non-linear relationship between photoconductive gain of the optically sensitive material and intensity of light absorbed by the optically sensitive material. A digital number corresponding to the digital pixel data has a linear relationship to the intensity.

Embodiments include a photodetector comprising: a photosensor array having a plurality of pixel regions, the pixel regions arranged into a plurality of rows and a plurality of columns, wherein each pixel region includes at least one optically sensitive material, wherein optical sensitivity of the optically sensitive material depends upon intensity of light absorbed by the optically sensitive material; pixel circuitry coupled to each of the respective pixel regions, wherein the pixel circuitry establishes a voltage over an integration period of time, wherein output signals are generated based on the voltage; and signal processing circuitry coupled to the pixel circuitry and generating pixel data for a subset of pixel regions using the respective output signals, wherein the pixel data has a linear relationship with the intensity of the light absorbed by the optically sensitive material of each of the respective pixel regions in the selected subset of pixel regions. The voltage has a non-linear relationship with intensity of light absorbed by the optically sensitive material of the respective pixel region. The pixel circuitry comprises read out circuitry that generates the output signals. The pixel select circuitry selects the pixel circuitry for a subset of the pixel regions to be read out.

Embodiments include a photodetector comprising: a photosensor array having a plurality of pixel regions, the pixel regions arranged into a plurality of rows and a plurality of columns; each pixel region comprising at least one optically sensitive material, wherein optical sensitivity of the optically sensitive material depends upon intensity of light absorbed by the optically sensitive material; pixel circuitry coupled to each of the respective pixel regions, wherein the pixel circuitry establishes a voltage over an integration period of time; the pixel circuitry including read out circuitry configured to generate a signal based on the voltage; pixel select circuitry configured to select the pixel circuitry for a subset of the pixel regions to be read out; and signal processing circuitry configured to generate digital pixel data for the selected subset of pixel regions, wherein the digital pixel data for the subset of pixel regions has a linear relationship with the intensity of the light absorbed by the optically sensitive material of each of the respective pixel regions in the selected subset of pixel regions. The voltage has a non-linear relationship with intensity of light absorbed by the optically sensitive material of the respective pixel region.

Embodiments include a method comprising: exposing an optically sensitive material to light; providing a current flow through the optically sensitive material, wherein the rate of the current flow through the optically sensitive material varies with optical sensitivity of the optically sensitive material, wherein optical sensitivity depends upon intensity of light absorbed by the optically sensitive material; collecting charge from the current flow over a period of time; and generating a signal from the charge collected over the period of time. The optical sensitivity is more than 1000 mV/lux-s at relatively low light levels and less than 500 mV/lux-s at relatively high light levels, or it is more than 2000 mV/lux-s at relatively low light levels and less than 400 mV/lux-s at relatively high light levels, or it is more than 3000 mV/lux-s at relatively low light levels and less than 300 mV/lux-s at relatively high light levels.

Embodiments include a method comprising: exposing an optically sensitive material to light; providing a current flow through the optically sensitive material, wherein the rate of the current flow through the optically sensitive material varies with optical sensitivity of the optically sensitive material, wherein the optical sensitivity at an intensity of light less than approximately 1 lux is more than twice the optical sensitivity at an intensity of light of at least 100 lux; collecting charge from the current flow over a period of time; and generating a signal from the charge collected over the period of time.

Embodiments include a method comprising: exposing an optically sensitive material to light; providing a current flow through the optically sensitive material, wherein the rate of the current flow through the optically sensitive material varies with optical sensitivity of the optically sensitive material, wherein the optical sensitivity at an intensity of light less than approximately 1 lux is more than ten times the optical sensitivity at an intensity of light of at least 100 lux; collecting charge from the current flow over a period of time; and generating a signal from the charge collected over the period of time.

Embodiments include a method comprising: exposing an optically sensitive material to light; providing a current flow through the optically sensitive material, wherein the rate of the current flow through the optically sensitive material varies with optical sensitivity of the optically sensitive material, wherein the optical sensitivity is more than 600 mV/lux-s at an intensity of light less than 1 lux and the optical sensitivity is more than 600 mV/lux-s at an intensity of light of at least 100 lux; collecting charge from the current flow over a period of time; and generating a signal from the charge collected over the period of time.

Embodiments include a photodetector comprising: a plurality of electrodes, including at least a first electrode and a second electrode; an optically sensitive material between the first electrode and the second electrode; circuitry that applies a voltage difference between the first electrode and the second electrode such that current flows through the optically sensitive material during an integration period of time, wherein optical sensitivity of the optically sensitive material depends upon intensity of light absorbed by the optically sensitive material; a charge store in electrical communication with at least one of the electrodes, the charge store storing energy based on the current flow through the optically sensitive material during the integration period of time; and read out circuitry configured to generate a signal based on the energy of the charge store after the integration period of time. A portion of the energy in the charge store is dissipated over the integration period of time. The charge store is charged by the current flow during the integration period of time. A rate of the current flow through the optically sensitive material has a non-linear relationship with intensity of light absorbed by the optically sensitive material.

Embodiments include a photodetector comprising: a photosensor array having a plurality of pixel regions, the pixel regions arranged into a plurality of rows and a plurality of columns; each pixel region comprising at least one optically sensitive material; pixel circuitry for each of the respective pixel regions, the pixel circuitry for each respective pixel region applying a voltage difference across the optically sensitive material for the respective pixel region, wherein optical sensitivity of the optically sensitive material depends upon intensity of light absorbed by the optically sensitive material; the pixel circuitry including a charge store to provide a charge related to the current flow through the optically sensitive material of the respective pixel region during the integration period of time; the pixel circuitry including read out circuitry to generate a signal based on the charge of the charge store for the respective pixel region after the integration period of time; and pixel select circuitry to select the pixel circuitry for a subset of the pixel regions to be read out. A rate of the current flow through the optically sensitive material has a non-linear relationship with intensity of light absorbed by the optically sensitive material of the respective pixel region.

Embodiments include a method comprising: exposing an optically sensitive material to light; providing a current flow through the optically sensitive material; using the current flow to discharge a portion of stored charge from a charge store over a period of time; generating a signal from the charge store based on the amount of charge remaining in the charge store after the period of time; wherein a rate of the current flow through the optically sensitive material at relatively high light levels maintains the stored charge above a minimum threshold as a result of a non-linear relationship between the current flow and intensity of the light absorbed by the optically sensitive material, wherein generating of the signal occurs when the stored charge is greater than the minimum threshold.

Embodiments include a method comprising: exposing an optically sensitive material to light; providing a current flow through the optically sensitive material; using the current flow to discharge a portion of stored charge from a charge store over a period of time; generating a signal from the charge store based on the amount of charge remaining in the charge store after the period of time; wherein a rate of the current flow through the optically sensitive material at relatively high light levels causes the stored charge to remain above a minimum threshold as a result of a non-linear relationship between the current flow and intensity of the light absorbed by the optically sensitive material, wherein generating of the signal occurs when the stored charge is greater than the minimum threshold.

Embodiments include a method comprising: exposing an optically sensitive material to light; providing a current flow through the optically sensitive material; using the current flow to discharge a portion of stored charge from a charge store over a period of time; generating a signal from the charge store based on the amount of charge remaining in the charge store after the period of time; wherein a rate of the current flow through the optically sensitive material at relatively high light levels controls the discharge so that stored charge in the charge store remains above a minimum threshold as a result of a non-linear relationship between the current flow and intensity of the light absorbed by the optically sensitive material, wherein generating of the signal occurs when the charge stored is greater than the minimum threshold. The rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a method comprising: exposing an optically sensitive material to light; providing a current flow through the optically sensitive material, the current flow varying with a photoconductive gain of the optically sensitive material; using the current flow to discharge a portion of charge from a charge store over a period of time; generating a signal from the charge store based on the amount of charge remaining in the charge store after the period of time; wherein a rate of the current flow through the optically sensitive material at relatively high light levels causes the charge in the charge store to remain above a minimum threshold as a result of a non-linear relationship between the photoconductive gain of the optically sensitive material and intensity of the light absorbed by the optically sensitive material, wherein generating of the signal occurs when the stored charge is greater than the minimum threshold.

Embodiments include a method comprising: exposing an optically sensitive material to light; providing a current flow through the optically sensitive material, the current flow varying with a photoconductive gain of the optically sensitive material; using the current flow to discharge a portion of charge from a charge store over a period of time; generating a signal from the charge store based on the amount of charge remaining in the charge store after the period of time; wherein a rate of the current flow through the optically sensitive material at relatively high light levels controls the discharge so that stored charge in the charge store remains above a minimum threshold as a result of a non-linear relationship between the current flow and intensity of the light absorbed by the optically sensitive material, wherein generating of the signal occurs when the charge stored is greater than the minimum threshold.

Embodiments include a photodetector comprising: a pixel region comprising an optically sensitive material; pixel circuitry electrically coupled to the optically sensitive material, the pixel circuitry establishing a voltage over an integration period of time, wherein a signal is generated based on the voltage after the integration period of time, the signal having a noise level; wherein a rate of the current flow through the optically sensitive material at relatively high light levels causes the voltage to remain above a minimum threshold as a result of a non-linear relationship between the voltage and intensity of the light absorbed by the optically sensitive material of the respective pixel region, wherein generating of the signal occurs when the voltage is greater than the minimum threshold; a converter configured to convert the signal into digital pixel data, wherein the converter has an input range; and at least one of the pixel circuitry and the optically sensitive layer providing a dynamic range more than at least twice the ratio of the input range of the converter divided by the noise level. The rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a photodetector comprising: a pixel region comprising an optically sensitive material; pixel circuitry in electrical communication with the optically sensitive material, the pixel circuitry establishing a voltage over an integration period of time; read out circuitry configured to generate a signal based on the voltage after the integration period of time, wherein a rate of the current flow through the optically sensitive material at relatively high light levels causes the voltage to remain above a minimum threshold as a result of a non-linear relationship between the voltage and intensity of the light absorbed by the optically sensitive material, wherein generating of the signal occurs when the voltage is greater than the minimum threshold; an analog-to-digital converter configured to convert the signal into digital pixel data, wherein the analog-to-digital converter has an input range and wherein the signal from the pixel circuitry has a noise level; and wherein the pixel circuitry and the optically sensitive layer are configured to provide a dynamic range more than at least twice the ratio of the input range of the analog-to-digital converter divided by the noise level. The dynamic range is in a range of more than at least three times to approximately ten times the ratio of the input range divided by the noise level. The dynamic range is more than at least three times the ratio of the input range divided by the noise level, or it is more than at least five times the ratio of the input range divided by the noise level, or it is more than at least ten times the ratio of the input range divided by the noise level. A non-linear relationship exists between electrical characteristics of the optically sensitive material and intensity of light absorbed by the optically sensitive material, wherein a continuous function represents the non-linear relationship. The continuous function is a continuous polynomial function representing the non-linear relationship between photoconductive gain of the optically sensitive material and intensity of light absorbed by the optically sensitive material. A digital number corresponding to the digital pixel data has a linear relationship to the intensity. The rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a photodetector comprising: a photosensor array having a plurality of pixel regions, the pixel regions arranged into a plurality of rows and a plurality of columns, wherein each pixel region includes at least one optically sensitive material; pixel circuitry coupled to each of the respective pixel regions, wherein the pixel circuitry establishes a voltage over an integration period of time, wherein output signals are generated based on the voltage, wherein a rate of the current flow through the optically sensitive material at relatively high light levels causes the voltage to remain above a minimum threshold as a result of a non-linear relationship between the voltage and intensity of the light absorbed by the optically sensitive material, wherein generating of the output signals occurs when the voltage is greater than the minimum threshold; and signal processing circuitry coupled to the pixel circuitry and generating pixel data for a subset of pixel regions using the respective output signals, wherein the pixel data has a linear relationship with the intensity of the light absorbed by the optically sensitive material of each of the respective pixel regions in the selected subset of pixel regions. The pixel circuitry comprises read out circuitry that generates the output signals. The pixel select circuitry configured to select the pixel circuitry for a subset of the pixel regions to be read out.

Embodiments include a method comprising: exposing an optically sensitive material to light; providing a current flow through the optically sensitive material; collecting charge from the current flow over a period of time; generating a signal from the charge collected over the period of time; wherein a rate of the current flow through the optically sensitive material at relatively high light levels causes collected charge to remain above a minimum threshold as a result of a non-linear relationship between the current flow and intensity of the light absorbed by the optically sensitive material, wherein generating of the signal occurs when the collected charge is greater than the minimum threshold. The rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a photodetector comprising: a plurality of electrodes, including at least a first electrode and a second electrode; an optically sensitive material between the first electrode and the second electrode; circuitry that applies a voltage difference between the first electrode and the second electrode such that current flows through the optically sensitive material during an integration period of time; a charge store in electrical communication with at least one of the electrodes, the charge store storing energy based on the current flow through the optically sensitive material during the integration period of time; and read out circuitry configured to generate a signal based on the energy of the charge store after the integration period of time; wherein a rate of the current flow through the optically sensitive material at relatively high light levels causes the stored energy to remain above a minimum threshold as a result of a non-linear relationship between the current flow and intensity of the light absorbed by the optically sensitive material, wherein generating of the signal occurs when the stored energy is greater than the minimum threshold. A portion of the energy in the charge store is dissipated over the integration period of time. The charge store is charged by the current flow during the integration period of time. The read out circuitry is configured such that there is a minimum voltage level that can be read from the charge store. The charge store is reset to a first voltage level at the beginning of the integration period of time. the rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a photodetector comprising: a photosensor array having a plurality of pixel regions, the pixel regions arranged into a plurality of rows and a plurality of columns; each pixel region comprising at least one optically sensitive material; pixel circuitry for each of the respective pixel regions, the pixel circuitry for each respective pixel region applying a voltage difference across the optically sensitive material for the respective pixel region; the pixel circuitry including a charge store to provide a charge related to the current flow through the optically sensitive material of the respective pixel region during an integration period of time; the pixel circuitry including read out circuitry to generate a signal based on the charge of the charge store for the respective pixel region after the integration period of time; and pixel select circuitry to select the pixel circuitry for a subset of the pixel regions to be read out; wherein a rate of the current flow through the optically sensitive material at relatively high light levels causes the stored charge to remain above a minimum threshold as a result of a non-linear relationship between the current flow and intensity of the light absorbed by the optically sensitive material, wherein generating of the signal occurs when the stored charge is greater than the minimum threshold. The read out circuitry is configured such that there is a minimum voltage level that can be read from the charge store. The charge store is reset to a first voltage level at the beginning of the integration period of time. The rate of current flow is non-linear relative to light intensity such that the optical sensitivity of the optically sensitive material at 1 lux is more than twice the optical sensitivity at 100 lux. The rate of current flow is non-linear relative to light intensity such that the dynamic range of the optically sensitive material is greater than dynamic range of an optical material in which the optical sensitivity at 1 lux is substantially the same as the optical sensitivity at 100 lux.

Embodiments include a photodetector comprising: a semiconductor substrate;

a photosensor array having a plurality of pixel regions, the pixel regions arranged into a plurality of rows and a plurality of columns; each pixel region comprising at least one optically sensitive material over a portion of the semiconductor substrate; pixel circuitry formed on the semiconductor substrate for each of the respective pixel regions, the pixel circuitry for each respective pixel region configured to apply a voltage difference across the optically sensitive material for the respective pixel region and to read out a signal based on a flow of current through the optically sensitive material over a period of time; and at least a portion of the pixel circuitry for a first respective pixel region formed under the optically sensitive material for a different respective pixel region that is not read out by the pixel circuitry for the first respective pixel region. The pixel circuitry for the first respective pixel region includes a plurality of circuit elements, wherein at least one circuit element is formed under both the optically sensitive material for the first respective pixel region and optically sensitive material for the different respective pixel region. The first pixel circuitry for the first respective pixel region is formed in a first half of a first region of the semiconductor substrate and a first half of a second region of the semiconductor substrate, wherein second pixel circuitry for a second respective pixel region is formed in a second half of the first region of the semiconductor substrate and a second half of the second region of the semiconductor substrate. The first region forms a first rectangular region on the semiconductor substrate and the second region forms a second rectangular region on the semiconductor substrate, wherein a first size of the first region and a first size of the second region are related by a first aspect ratio. The first aspect ratio is 1:1, or 2:3, or 3:4. The first pixel circuitry is substantially contained in a third rectangular region and the second pixel circuitry is substantially contained in a fourth rectangular region, wherein a third size of the third rectangular region and a fourth size of the fourth rectangular region are related by a second aspect ratio. The second aspect ratio is higher than the first aspect ratio, and may be more than two times the first aspect ratio.

Embodiments include a photodetector comprising: a semiconductor substrate; a photosensor array having a plurality of pixel regions, the pixel regions arranged into a plurality of rows and a plurality of columns; each pixel region comprising at least one optically sensitive material over a portion of the semiconductor substrate; pixel circuitry formed on the semiconductor substrate for each of the respective pixel regions, the pixel circuitry for each respective pixel region configured to apply a voltage difference across the optically sensitive material for the respective pixel region and to read out a signal based on a level of light intensity absorbed by the optically sensitive layer for the respective pixel region; and at least a portion of the pixel circuitry for a first respective pixel region formed under the optically sensitive material for a different respective pixel region that is not read out by the pixel circuitry for the first respective pixel region.

Embodiments include a photodetector comprising: a semiconductor substrate; a photosensor array having a plurality of pixel regions, the pixel regions arranged into a plurality of rows and a plurality of columns and including at least a first pixel region adjacent to a second pixel region; each pixel region comprising at least one optically sensitive material over a portion of the semiconductor substrate, wherein the optically sensitive material for the first pixel region is over a first portion of the semiconductor substrate and the sensitive material for the second pixel region is over a second portion of the semiconductor substrate; and pixel circuitry formed on the semiconductor substrate for each of the respective pixel regions, the pixel circuitry for each respective pixel region configured to apply a voltage difference across the optically sensitive material for the respective pixel region and to read out a signal based on a flow of current through the optically sensitive material over a period of time; wherein the pixel circuitry for the first pixel region extends from the first portion of the semiconductor substrate to the second portion of the semiconductor substrate and the pixel circuitry for the second pixel region extends from the second portion of the semiconductor substrate to the first portion of the semiconductor substrate.

Embodiments include a photodetector comprising: a semiconductor substrate; a photosensor array having a plurality of pixel regions, the pixel regions arranged into a plurality of rows and a plurality of columns and including at least a first pixel region adjacent to a second pixel region; each pixel region comprising at least one optically sensitive material over a portion of the semiconductor substrate, wherein the optically sensitive material for the first pixel region is over a first portion of the semiconductor substrate and the sensitive material for the second pixel region is over a second portion of the semiconductor substrate; and pixel circuitry formed on the semiconductor substrate for each of the respective pixel regions, the pixel circuitry for each respective pixel region configured to apply a voltage difference across the optically sensitive material for the respective pixel region and to read out a signal based on a level of light intensity absorbed by the optically sensitive layer for the respective pixel region; wherein the pixel circuitry for the first pixel region extends from the first portion of the semiconductor substrate to the second portion of the semiconductor substrate and the pixel circuitry for the second pixel region extends from the second portion of the semiconductor substrate to the first portion of the semiconductor substrate. The pixel region includes a vertical stacked pixel, the vertical stacked pixel comprising at least two optically sensitive layers, a first optically sensitive layer and a second optically sensitive layer, the first optically sensitive layer over at least a portion of an integrated circuit and the second optically sensitive layer over the first optically sensitive layer. The integrated circuit includes at least a portion of the pixel circuitry. The optically sensitive layers can be configured as a current source or as a current sink. The pixel circuitry includes a charge store that is a storage element, wherein the charge store is coupled to the optically sensitive layers and establishes the voltage. The charge store is independent from the optically sensitive layers and isolated from a source of the light. The charge store is bound by the integrated circuit. The charge store can be a capacitor, or parasitic capacitance. The pixel circuitry includes a reset mechanism coupled to the optically sensitive layers. The reset mechanism resets the optically sensitive layers independent of the charge store. The pixel circuitry comprises a separation element coupled between the optically sensitive layers and the charge store. The separation element includes a non-linear element. The separation element can include a diode or a switch. The pixel circuitry includes a readout element, the readout element coupled to the optically sensitive layers and operating independently of common connected devices of the pixel circuitry and the optically sensitive material. The readout element is a transistor, and may operate as an amplifier, and the amplifier operates may operate as a source follower. The pixel circuitry may include at least one diode coupled to the optically sensitive layers. The diode can be an implicit diode, or a parasitic diode, and the diode may reset the optically sensitive material, or control the readout element.

The photodetector of an embodiment may comprise two electrodes, wherein each optically sensitive layer is interposed between the two electrodes, the electrodes including a respective first electrode and a respective second electrode. The respective first electrode and second electrode for the first optically sensitive layer are different electrodes than the respective first electrode and second electrode for the second optically sensitive layer. The respective first electrode for the first optically sensitive layer is a different electrode than the respective first electrode for the second optically sensitive layer. The second respective electrode for the second optically sensitive layer is a common electrode common to both the first optically sensitive layer and the second optically sensitive layer. The common electrode extends vertically from the first optically sensitive layer to the second optically sensitive layer. The common electrode extends vertically from the integrated circuit along a portion of the first optically sensitive layer and the second optically sensitive layer. The common electrode is coupled to a dynamic signaling component. The pixel region comprises a plurality of vertical stacked pixels, each of the plurality of vertical stacked pixels comprising at least two optically sensitive layers, a respective first optically sensitive layer and a respective second optically sensitive layer, the respective first optically sensitive layer over at least a portion of the integrated circuit and the respective second optically sensitive layer over the respective first optically sensitive layer. Each optically sensitive layer is interposed between two electrodes, the electrodes including a respective first electrode and a respective second electrode, wherein the integrated circuit is coupled to the electrodes and selectively applies a bias to the electrodes and reads signals from the optically sensitive layers, wherein the signals are related to the number of photons received by the respective optically sensitive layer. The second respective electrode for the second optically sensitive layer is a common electrode common to the respective second optically sensitive layer of the plurality of vertical stacked pixels. The respective second electrode as the common electrode comprises a mesh between at least two adjacent vertical stacked pixels of the plurality of vertical stacked pixels. At least a portion of the pixel circuitry for a first vertical stacked pixel is formed under the optically sensitive material for a second vertical stacked pixel that is not read out by the pixel circuitry for the first vertical stacked pixel. Each respective first electrode is in contact with the respective first optically sensitive layer, and each respective second electrode is in contact with the respective second optically sensitive layer. Each respective first electrode is positioned laterally relative to at least a portion of the respective second electrode, at least a portion of each respective second electrode is on the same layer of the integrated circuit as the respective first electrode and the respective optically sensitive layer. The respective second electrode for the first optically sensitive layer and the second optically sensitive layer comprises a common electrode disposed around the first electrode. The second electrode is at least partially transparent and is positioned over the respective optically sensitive layer. The respective first electrode and the respective second electrode are non-transparent and separated by a distance corresponding to a width dimension and a length dimension. The width dimension is approximately 2 um, and the length dimension is approximately 2 um; or the width dimension is less than approximately 2 um, and the length dimension is less than approximately 2 um. At least one of the optically sensitive layers comprises monodisperse nanocrystals. Each of the optically sensitive layers comprises nanocrystals of different materials.

The photodetector of this embodiment may have the first optically sensitive layer including a first material having a first bulk bandgap and the second optically sensitive layer includes a second material having a second bulk bandgap. The first optically sensitive layer comprises nanoparticles having a first diameter and the second optically sensitive layer comprises nanoparticles having a second diameter. At least one of the optically sensitive layers comprises nanocrystals comprising colloidal quantum dots. The quantum dots include a first carrier type and a second carrier type, wherein the first carrier type is a flowing carrier and the second carrier type is one of a substantially blocked carrier and a trapped carrier. The colloidal quantum dots include organic ligands, wherein a flow of at least one of the first carrier type and the second carrier type is related to the organic ligands. At least one optically sensitive layers comprises a continuous film of interconnected nanocrystal particles in contact with the respective first electrode and the respective second electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. At least one of the optically sensitive layers comprises a unipolar photoconductive layer including a first carrier type and a second carrier type, wherein a first mobility of the first carrier type is higher than a second mobility of the second carrier type. The persistence of each of the optically sensitive layers is approximately equal. The persistence of each of the optically sensitive layers is approximately in a range of 1 ms to 200 ms. The first optically sensitive layer comprises a first material having a first thickness, and the combination of the first material and the first thickness provides a first responsivity to light of a first wavelength, wherein the second optically sensitive layer comprises a second material having a second thickness, and the combination of the second material and the second thickness provides a second responsivity to light of a second wavelength, wherein the first responsivity and the second responsivity are approximately equal. The first responsivity and the second responsivity are approximately equal.

A photodetector of this embodiment has a first optically sensitive layer comprising a first material having a first thickness, and the combination of the first material and the first thickness provides a first photoconductive gain to light of a first wavelength, wherein the second optically sensitive layer comprises a second material having a second thickness, and the combination of the second material and the second thickness provides a second photoconductive gain to light of a second wavelength. The first photoconductive gain and the second photoconductive gain are approximately equal. The first optically sensitive layer comprises a first material having a first thickness, and the combination of the first material and the first thickness provides a first absorbance to light of a first wavelength, wherein the second optically sensitive layer comprises a second material having a second thickness, and the combination of the second material and the second thickness provides a second absorbance to light of a second wavelength, wherein the first absorbance and the second absorbance are approximately equal. The first absorbance and the second absorbance are approximately equal. The second optically sensitive layer is relatively completely absorbent of light in a first wavelength interval and relatively completely transmissive of light outside the first wavelength interval. The first optically sensitive layer is relatively completely absorbent of the light outside the at least one first wavelength interval. The first optically sensitive layer is relatively completely absorbent of light in the first wavelength interval. The first optically sensitive layer comprises a nanocrystal material having first photoconductive gain and the second optically sensitive layer comprises a nanocrystal material having a second photoconductive gain. At least one of the optically sensitive layers comprises a nanocrystal material having photoconductive gain and a responsivity of at least approximately 0.4 amps/volt (A/V). The responsivity is achieved when a bias is applied across the at least one of the optically sensitive layers, wherein the bias is approximately in a range of 1 volt to 5 volts.

The photodetector of one embodiment has a first optically sensitive layer comprises a nanocrystal material having first photoconductive gain and a first responsivity approximately in a range of 0.4 A/V to 100 A/V. The second optically sensitive layer comprises a nanocrystal material having a second photoconductive gain and a second responsivity approximately in a range of 0.4 A/V to 100 A/V. The second photoconductive gain is greater than the first photoconductive gain. At least one of the optically sensitive layers comprises nanocrystals of a material having a bulk bandgap, and wherein the nanocrystals are quantum confined to have an effective bandgap more than twice the bulk bandgap. At least one of the optically sensitive layers includes nanocrystals comprising nanoparticles, wherein a nanoparticle diameter of the nanoparticles is less than a Bohr exciton radius of bound electron-hole pairs within the nanoparticle. 1, wherein a first diameter of nanocrystals of the first optically sensitive layer is greater than a second diameter of nanocrystals of the second optically sensitive layer. A first diameter of nanocrystals of the first optically sensitive layer may be less than a second diameter of nanocrystals of the second optically sensitive layer. At least one of the optically sensitive layers comprises nanocrystals of a material having a bulk bandgap of less than approximately 0.5 electron volts (eV), and wherein the nanocrystals are quantum confined to have a bandgap more than 1.0 eV.

In an embodiment, the photodetector has a first optically sensitive layer comprises a first composition including one of lead sulfide (PbS), lead selenide (PbSe), lead tellurium sulfide (PbTe), indium phosphide (InP), indium arsenide (InAs), and germanium (Ge). In an embodiment, the photodetector has a second optically sensitive layer comprises a second composition including one of indium sulfide ($In_2S_3$), indium selenide ($In_2Se_3$), indium tellurium ($In_2Te_3$), bismuth sulfide ($Bi_2S_3$), bismuth selenide ($Bi_2Se_3$), bismuth tellurium ($Bi_2Te_3$), indium phosphide (InP), gallium arsenide (GaAs), silicon (Si), and germanium (Ge).

In an embodiment, each of the optically sensitive layers comprises different compound semiconductor nanocrystals, wherein the first optically sensitive layer comprises a composition including lead and the second optically sensitive layer comprises a composition including one of indium and bismuth. Each of the optically sensitive layers comprises nanocrystals of a material having a bulk bandgap of less than approximately 0.5 eV.

In an embodiment, the nanocrystals of at least one optically sensitive layer are quantum confined to a bandgap corresponding to: 490 nm wavelength. or approximately 2.5 eV, or 560 nm wavelength or approximately 2.2 eV, or approximately 1.8 eV, or 1.2 eV, or approximately 0.9 eV, or approximately 0.7 eV, or corresponding to 630 nm wavelength or corresponding to 650 nm wavelength. In an embodiment, the nanocrystals of at least one optically sensitive layer are quantum confined to a bandgap corresponding to 670 nm wavelength. In an embodiment, the nanocrystals of at least one optically sensitive layer are quantum confined to a bandgap corresponding to 700 nm wavelength. In an embodiment, the nanocrystals of at least one optically sensitive layer are quantum confined to a bandgap corresponding to 800 nm wavelength. In an embodiment, the nanocrystals of at least one optically sensitive layer are quantum confined to a bandgap corresponding to 900 nm wavelength.

In an embodiment, the nanocrystals the nanocrystals of at least one optically sensitive layer are quantum confined to a bandgap corresponding to 1000 nm wavelength. In an embodiment, the nanocrystals of at least one optically sensitive layer are quantum confined to a bandgap corresponding to 1300 nm wavelength. In an embodiment, the nanocrystals of at least one optically sensitive layer are quantum confined to a bandgap corresponding to 1650 nm wavelength. In an embodiment, the nanocrystals of at least one optically sensitive layer are quantum confined to a bandgap corresponding to 3 um wavelength. In an embodiment, the nanocrystals of at least one optically sensitive layer are quantum confined to a bandgap corresponding to 5 um wavelength.

In an embodiment, this photodetector has an optical sensitivity of at least one optically sensitive layer is at an intensity of light less than approximately 1 lux is more than twice the optical sensitivity of the optically sensitive material at an intensity of light of at least 100 lux. In an embodiment, this photodetector has an optical sensitivity of at least one optically sensitive layer at an intensity of light less than approximately 1 lux is more than ten times the optical sensitivity of the optically sensitive material at an intensity of light of at least 100 lux. In an embodiment, this photodetector has an optical sensitivity of at least one optically sensitive layer is more than 1000 mV/lux-s at relatively low light levels and less than 500 mV/lux-s at relatively high light levels. In an embodiment, this photodetector has an optical sensitivity of at least one optically sensitive layer is more than 2000 mV/lux-s at relatively low light levels and less than 400 mV/lux-s at relatively high light levels. In an embodiment, this photodetector has an optical sensitivity of at least one optically sensitive layer is more than 3000 mV/lux-s at relatively low light levels and less than 300 mV/lux-s at relatively high light levels.

In an embodiment, this photodetector has a sensitive layer comprising a first absorption band including at least one first set of colors and is devoid of a local absorption maximum. The second optically sensitive layer comprises a second absorption band including at least one second set of colors and is devoid of a local absorption maximum, wherein the second absorption band includes the first set of colors. The first optically sensitive layer comprises a nanocrystal material having an absorption onset at a first wavelength and the second optically sensitive layer comprises a nanocrystal material having an absorption onset at a second wavelength, wherein the first wavelength is shorter than the second wavelength, and a local absorption maximum is absent from an absorption spectrum of at least one of the first optically sensitive layer and the second optically sensitive layer. The photodetector has a dark current of at least one optically sensitive layer is different from a dark current of at least one other optically sensitive layer. At least one optically sensitive layer is a nanocrystal layer having a dark current approximately in a range of 10 nanoamps (nA) per square centimeter (cm) to 500 nA per square cm. A compensation applied to a signal from at least one optically sensitive layer is different from a compensation applied to a signal from at least one other optically sensitive layer.

In an embodiment, this photodetector comprises at least one black pixel, wherein a dark current compensation signal is received from a respective black pixel and used to apply dark current correction to the signal. The dark current compensation signal is separately and proportionally applied to signals of each optically sensitive layer. The dark current compensation signal corresponding to each respective optically sensitive layer is received from a respective black pixel and applied to a respective signal of the respective optically sensitive layer.

In an embodiment, the photodetector has at least two optically sensitive layers including a third optically sensitive layer, wherein the third optically sensitive layer is over at least a portion of the second optically sensitive layer. The at least two optically sensitive layers include a fourth optically sensitive layer, wherein the fourth optically sensitive layer is over at least a portion of the third optically sensitive layer. The fourth optically sensitive layer comprises a nanocrystal material absorptive to at least visible blue light and transmissive to visible green light, visible red light, and infrared light. The third optically sensitive layer comprises a nanocrystal material absorptive to at least visible blue light and visible green light and transmissive to visible red light and infrared light. The second optically sensitive layer comprises a nanocrystal material absorptive to at least visible blue light, visible green light, and visible red light. The first optically sensitive layer comprises a nanocrystal material absorptive to at least visible blue light, visible green light, visible red light and infrared light. It further comprises a fourth optically sensitive layer, the fourth optically sensitive layer comprising a doped silicon region on a substrate of the integrated circuit, the fourth optically sensitive layer positioned below the first optically sensitive layer, the second optically sensitive layer, and the third optically sensitive layer. In an embodiment, this photodetector has a fourth optically sensitive layer, the fourth optically sensitive layer comprises a doped silicon region integrated with a substrate of the integrated circuit, the fourth optically sensitive layer positioned below the first optically sensitive layer, the second optically sensitive layer, and the third optically sensitive layer. In an embodiment, a photodetector has a third optically sensitive layer, the third optically sensitive layer comprising a doped silicon region on a substrate of the integrated circuit, the third optically sensitive layer positioned below the first optically sensitive layer and the second optically sensitive layer. The third optically sensitive layer comprising a doped silicon region integrated with a substrate of the integrated circuit, the third optically sensitive layer positioned below the first optically sensitive layer and the second optically sensitive layer.

Embodiments are directed to a photodetector comprising conversion circuitry. An integrated circuit includes the conversion circuitry, the conversion circuitry located under the at least two optically sensitive layers. The conversion circuitry is coupled to the integrated circuit. The conversion circuitry converts the signals from a first type to a second type. The conversion circuitry converts the signal from an analog signal to a digital signal. The conversion circuitry converts the signal from a digital signal to a analog signal.

Embodiments are directed to a photodetector comprising compensation circuitry. The compensation circuitry is coupled to the integrated circuit. An integrated circuit includes the compensation circuitry, the compensation circuitry located under the at least two optically sensitive layers. The compensation circuitry adjusts the signal to compensate for different properties among the optically sensitive layers. The compensation circuitry at least partially compensates for nonlinearity of the signal output from the optically sensitive layers. The compensation circuitry at least partially linearizes digital data derived from the signal. The compensation circuitry at least partially linearizes the signal using a polynomial function. The compensation circuitry at least partially linearizes the signal using piecewise linear inversion of a relationship between intensity of the light and electrical properties of at least one optically sensitive layer. The compensation circuitry at least partially compensates for variance in a rate of current flow in at least one optically sensitive layer over an integration period for a constant intensity of light. The compensation circuitry at least partially compensates for variance in a rate of current flow in at least one optically sensitive layer over an integration period for differing intensities of light. The compensation circuitry at least partially compensates for variance in gain in at least one optically sensitive layer over an integration period for a constant intensity of light. The compensation circuitry at least partially compensates for variance in gain in at least one optically sensitive layer over an integration period for differing intensities of light. The compensation circuitry: at least partially compensates for nonlinearity of signals output from the optically sensitive layers; and at least partially compensates for a difference between dark currents of signals output from the optically sensitive layers.

In an embodiment, the compensation circuitry includes a read out circuit and demosaicing algorithm that outputs a corrected color matrix based on analog quantities read out from the respective optically sensitive layers. The corrected color matrix includes a red, green, blue (RGB) matrix. The compensation circuitry compensates for transmission leakage between layers of the optically sensitive layers. The compensation circuitry includes image circuitry to generate image data. The first optically sensitive layer comprises a nanocrystal material having first photoconductive gain and the second optically sensitive layer comprises a nanocrystal material having a second photoconductive gain, the image circuitry compensating for a difference between the first photoconductive gain and the second photoconductive gain. The compensation circuitry applies black level correction that compensates for a difference between dark currents among the at least two optically sensitive layers by applying a plurality of dark current compensations to the signal. The compensation circuitry applies a first dark current compensation to a first signal from the first optically sensitive layer and a second dark current compensation to a second signal from the second optically sensitive layer. The first dark current compensation is different from the second dark current compensation.

In an embodiment, a photodetector comprises at least one black pixel. The at least one black pixel comprises at least two optically sensitive opaque layers, a first optically sensitive opaque layer and a second optically sensitive opaque layer, the first optically sensitive opaque layer and the second optically sensitive opaque layer each comprising an optically sensitive layer covered with an opaque material, the first optically sensitive opaque layer over at least a portion of a black pixel integrated circuit and the second optically sensitive opaque layer over the first optically sensitive opaque layer, wherein each optically sensitive opaque layer is interposed between a respective first electrode of the black pixel and a respective second electrode of the black pixel, wherein the integrated circuit selectively applies a bias to the respective first and second electrodes of the black pixel and reads a dark current signal from the optically sensitive opaque layers, wherein the dark current signal is related to the number of photons received by the respective optically sensitive opaque layer. The black pixel generates a dark current. The dark current density is approximately in a range of 10 nanoamps (nA)/square centimeter (cm) to 500 nA/square cm. The dark current compensations include subtracting the dark current from the signals of the optically sensitive layers in different proportions. The dark current compensations include subtracting a first portion of the dark current from a first signal of the second optically sensitive layer and subtracting a second portion of the dark current from a second signal of the second optically sensitive layer.

The photodetector of an embodiment has a first portion is larger than the second portion. The at least one black pixel comprises a first black pixel corresponding to the first optically sensitive layer and a second black pixel corresponding to the second optically sensitive layer. The first black pixel generates a first dark current and the second black pixel that generates a second dark current. The dark current compensation includes subtracting the first dark current from a first signal of the first optically sensitive layer and subtracting the second dark current from a second signal of the second optically sensitive layer. The at least one black pixel comprises a plurality of black pixels generating a plurality of dark currents, wherein the compensation circuitry generates the plurality of dark current compensations from the plurality of dark currents. In an embodiment, the responsivities of each of the optically sensitive layers are approximately equal when a thickness of the second optically sensitive layer is less than a thickness of the first optically sensitive layer. Also included is bandgap reference circuitry that has at least one of integrated in the integrated circuit and coupled to the integrated circuit. The black level correction is based on temperature monitoring by tracking a voltage from the bandgap reference circuitry. A fill factor of the pixel region is at least 80 percent, wherein the fill factor is a ratio of absorbing area of each pixel region to a total area of the pixel region. The fill factor can also be approximately in a range of 80 percent to 100 percent.

Embodiments are directed to a photodetector comprising: a plurality of pixel regions, each pixel region having a respective first electrode and a respective second electrode; an optically sensitive material between the first electrode and the second electrode, wherein the resultant device is non-rectifying; a transistor coupled to one of electrodes in electrical communication with the optically-sensitive material, the transistor including a gate configured to store charge, wherein the respective first electrode of a pixel region electrically communicates with the gate, wherein charge stored at the gate is discharged by a flow of current through the optically sensitive material during an integration period of time; and circuitry generating a signal from the gate based on the amount of charge remaining in the charge store after the integration period of time.

Embodiments are directed to a photodetector comprising: a pixel region, each pixel region having a first electrode and a second electrode; a plurality of layers of optically sensitive material disposed between the first electrode and the second electrode to create a non-rectifying optically sensitive device; a transistor coupled to the optically sensitive material, the transistor including a gate configured to store charge, wherein the respective first electrode of the pixel region electrically communicates with the gate, wherein charge stored at the gate is discharged by a flow of current through the optically sensitive material during an integration period of time; and circuitry generating a signal from the gate based on the amount of charge remaining in the charge store after the integration period of time.

Embodiments include a photodetector comprising: a pixel region comprising an optically sensitive material between a first electrode and a second electrode, wherein the non-rectifying optically sensitive device is non-rectifying; pixel circuitry electrically coupled to the optically sensitive material, the pixel circuitry establishing a voltage over an integration period of time, wherein a signal is generated based on the voltage after the integration period of time; a converter configured to convert the signal into digital pixel data. The pixel circuitry comprises a charge store and integration circuitry to establish the voltage based on intensity of light absorbed by the optically sensitive material of the pixel region over the integration period of time. The pixel circuitry includes at least one transistor in electrical communication with the first electrode, wherein the charge store comprises parasitic capacitance of the at least one transistor. The pixel circuitry includes a source follower transistor having a gate in electrical communication with the first electrode.

In an embodiment, the parasitic capacitance comprises a parasitic capacitance between the gate and a source of the source follower transistor. The pixel circuitry includes a reset transistor having a gate in electrical communication with the first electrode. The parasitic capacitance comprises a parasitic capacitance between a source and structures of a substrate of the reset transistor. The parasitic capacitance comprises metal-to-metal parasitic capacitance between nodes of the pixel circuit. The parasitic capacitance comprises metal-to-substrate parasitic capacitance between the charge store node and a silicon substrate. The parasitic capacitance is approximately in a range of 0.5 to 3 Femto Farads. The parasitic capacitance is approximately in a range of 1 to 2 Femto Farads.

Embodiments are directed to a method comprising: exposing an optically sensitive material to light; generating a signal based on a current flow through the optically sensitive material; biasing the optically sensitive material to operate as a current sink during a first period of time; and biasing the optically sensitive material to operate as a current source during a second period of time. The first period of time is an integration period during which a voltage is established based on the current flow through the optically sensitive material. The second period of time is a period of time during which a reset is applied to the optically sensitive material, the reset including resetting a voltage difference across the optically sensitive material.

Embodiments include a method comprising: exposing an optically sensitive material to light; generating a signal based on a current flow through the optically sensitive material; applying at least one voltage to the optically sensitive material; biasing the optically sensitive material to operate as a current sink; biasing the optically sensitive material to operate as a current source during a second period of time. Applying at least one voltage comprises applying a first voltage to reset a voltage difference across the optically sensitive material. Applying at least one voltage comprises establishing a second voltage, the second voltage biasing the optically sensitive material as the current sink Applying at least one voltage comprises applying a third voltage to transfer a signal from the optically sensitive material for read out.

Embodiments are directed to a method comprising: providing a plurality of pixel regions, each pixel region having a respective first electrode and a common second electrode, wherein the common second electrode is a common electrode for the plurality of pixel regions; reading out a signal from each of the pixel regions based on the intensity of light absorbed by the optically sensitive layer for the respective pixel region during an integration period of time; and varying the voltage on the common second electrode. The varying includes varying the voltage on the common second electrode over the read out cycle.

Embodiments include a method comprising: providing a plurality of pixel regions, each pixel region having a respective first electrode and a common second electrode, wherein the common second electrode is a common electrode for the plurality of pixel regions; reading out a signal from each of the pixel regions based on the intensity of light absorbed by the optically sensitive layer for the respective pixel region during an integration period of time; and controlling the voltage on the common second electrode between a plurality of voltages.

Embodiments include a method comprising: providing a plurality of pixel regions, each pixel region having a respective first electrode and a respective second electrode; varying the voltage of the respective first electrode of each respective pixel region during an integration period of time independently of the voltage of the respective first electrode of other pixel regions in the plurality of pixel regions; reading out a signal from each of the pixel regions based on the intensity of light absorbed by the optically sensitive layer for the respective pixel region during the integration period of time; and varying the voltage of the respective second electrode for all of the pixel regions. The method further comprises simultaneously varying the voltage of the respective second electrode for all of the pixel regions. The method further comprises varying the voltage of the respective second electrode for all of the pixel regions during a time period that is outside the integration period of time. The respective second electrode is a common second electrode, and the common second electrode is a common electrode for the plurality of pixel regions. The respective second electrode of each pixel region is in electrical communication with the respective second electrode of each other pixel region in the plurality of pixel regions. The respective second electrode of each pixel region is maintained at substantially equivalent voltage as the respective second electrode of each other pixel region in the plurality of pixel regions. Varying the voltage of the respective first electrode and varying the voltage of the respective second electrode comprises varying the voltage between at least two different voltages, a first voltage and a second voltage. Varying the voltage of the respective first electrode comprises varying the voltage of the respective first electrode between the first voltage and the second voltage during the integration period of time. Varying the voltage of the respective second electrode comprises varying the voltage of the respective second electrode between the first voltage and the second voltage outside the integration period of time. The second voltage is provided to reset a voltage difference across the optically sensitive material. The method further comprises biasing the optically sensitive material to operate as a current sink. The method further comprises biasing the optically sensitive material to operate as a current source. The method further comprises applying a transfer voltage to transfer a signal from the optically sensitive material for read out.

Embodiments are directed to an image sensor comprising: a plurality of pixel regions, each pixel region including a respective first electrode and a common second electrode, wherein the common second electrode is a common electrode for the plurality of pixel regions; each pixel region comprising an optically sensitive material between the respective first electrode and the common second electrode; pixel circuitry for each pixel region in electrical communication with the respective first electrode of the pixel region, the pixel circuitry for each pixel region including integration circuitry to establish a voltage based on the intensity of light absorbed by the optically sensitive material of the respective pixel region over an integration period of time, the pixel circuitry including read out circuitry to read out a signal after the integration period of time; and bias circuitry in electrical communication with the common second electrode to vary the voltage of the common second electrode.

Embodiments are directed to an image sensor comprising: a plurality of pixel regions, each pixel region including a respective first electrode and a common second electrode, wherein the common second electrode is a common electrode for the plurality of pixel regions; each pixel region comprising an optically sensitive material between the respective first electrode and the common second electrode; pixel circuitry for each pixel region in electrical communication with the respective first electrode of the pixel region, the pixel circuitry for each pixel region including integration circuitry configured to establish a voltage based on current flow through the optically sensitive material during an integration period of time, the pixel circuitry including read out circuitry to read out a signal after the integration period of time; and bias circuitry in electrical communication with the common second electrode configured to vary the voltage of the common second electrode.

Embodiments are directed to an image sensor comprising: a plurality of pixel regions, each pixel region including a respective first electrode and a common second electrode; each pixel region comprising an optically sensitive material between the respective first electrode and the common second electrode; pixel circuitry for each pixel region in electrical communication with the respective first electrode of the pixel region, the pixel circuitry for each pixel region including integration circuitry to establish a voltage based on the intensity of light absorbed by the optically sensitive material of the respective pixel region over an integration period of time; and bias circuitry configured to vary the voltage of the respective second electrode of each pixel region outside of the integration period of time.

Embodiments are directed to an image sensor comprising: a plurality of pixel regions, each pixel region including a respective first electrode and a common second electrode; each pixel region comprising an optically sensitive material between the respective first electrode and the common second electrode; pixel circuitry for each pixel region in electrical communication with the respective first electrode of the pixel region, the pixel circuitry for each pixel region including integration circuitry configured to establish a voltage based on current flow through the optically sensitive material during an integration period of time; and bias circuitry configured to vary the voltage of the respective second electrode of each pixel region at the same time.

Embodiments are directed to an image sensor comprising: a plurality of pixel regions, each pixel region including a respective first electrode and a common second electrode; each pixel region comprising an optically sensitive material between the respective first electrode and the common second electrode; pixel circuitry for each pixel region in electrical communication with the respective first electrode of the pixel region, the pixel circuitry for each pixel region including integration circuitry configured to establish a voltage based on current flow through the optically sensitive material during an integration period of time; and bias circuitry configured to vary the voltage of the respective second electrode of each pixel region outside of the integration period of time.

Embodiments are directed to an image sensor comprising: a plurality of pixel regions, each pixel region including a respective first electrode and a common second electrode; each pixel region comprising an optically sensitive material between the respective first electrode and the common second electrode; pixel circuitry for each pixel region in electrical communication with the respective first electrode of the pixel region, the pixel circuitry for each pixel region including integration circuitry to establish a voltage based on the intensity of light absorbed by the optically sensitive material of the respective pixel region over an integration period of time; and bias circuitry configured to vary the voltage of the respective second electrode of each pixel region at the same time. Read out circuitry is used to read out a signal after the integration period of time. The respective second electrode of each pixel region is a common second electrode for each of the pixel regions. The respective second electrode of each pixel region is in electrical communication with the respective second electrode of each of the other pixel regions in the plurality of pixel regions. The circuitry is configured to maintain the respective second electrode of each pixel region at substantially the same voltage as the respective second electrode of each of the other pixel regions.

In an embodiment, the bias circuitry is configured to switch the voltage of the common electrode between a first voltage and a second voltage. The bias circuitry is configured to provide a first voltage during the integration period of time and to provide a second voltage after the integration period of time. The first voltage and the second voltage differ by at least 0.5 volts. The first voltage and the second voltage differ by at least 1 volt. The first voltage and the second voltage differ by at least 1.5 volts. The first voltage and the second voltage differ by at least 2 volts. The first voltage is selected to bias the optically sensitive material as a current source and a second voltage is selected to bias the optically sensitive material as a current sink. The bias circuitry is configured to switch the voltage of the common electrode between a first voltage, a second voltage and a third voltage. The first voltage, the second voltage and the third voltage can be different from one another. The bias circuitry provides the first voltage to reset a voltage across the optically sensitive material prior to the integration period of time. The bias circuitry provides the second voltage second voltage during the integration period of time. The bias circuitry provides the third voltage after the integration period of time when the signal is read out. The bias circuitry provides the third voltage to transfer the signal to the buffer circuitry and provides the first voltage to reset the voltage difference prior to the row select circuitry selecting the respective row to read out the signal from the buffer.

In an embodiment, the pixel circuitry can comprise a diode. The first voltage is below a threshold voltage for current flow across the diode and the second voltage is above a threshold voltage for current flow across the diode. The pixel circuitry and optically sensitive material comprise a parasitic diode. The first voltage is below a threshold voltage for current flow across the parasitic diode and the second voltage is above a threshold voltage for current flow across the parasitic diode. The respective first electrode for each pixel region is independent from the respective first electrodes for the other pixel regions. The pixel circuitry and bias circuitry repeat a cycle of operation in which a voltage difference is reset across the optically sensitive material. The pixel circuit establishes a voltage based on the current flow through the optically sensitive material during an integration period and the signal is read out.

The embodiment includes row select circuitry to select a respective row of pixel regions to be read out. It comprises a buffer to store a signal read out of the pixel circuitry. The pixel circuitry includes a read out transistor, the read out transistor comprising a charge store and a gate of a source follower transistor in electrical communication with the first electrode. Each pixel region comprises vertically stacked pixels with a common electrode that is common among vertical layers of the pixel region and common to other pixels, wherein a voltage of the common electrode is varied. The optically sensitive material has photoconductive gain when a voltage difference is applied across the optically sensitive material and the optically sensitive layer is exposed to the light.

In an embodiment, the optically sensitive material comprises monodisperse nanocrystals. The optically sensitive material comprises a continuous film of interconnected nanocrystal particles in contact with the respective first electrode and the common electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. The optically sensitive material comprises nanocrystals of a material having a bulk bandgap, and wherein the nanocrystals are quantum confined to have an effective bandgap more than twice the bulk bandgap. The optically sensitive material includes nanocrystals comprising nanoparticles, wherein a nanoparticle diameter of the nanoparticles is less than a Bohr exciton radius of bound electron-hole pairs within the nanoparticle.

In an embodiment, the image sensor has optically sensitive material that comprise nanocrystals of a material having a bulk bandgap of less than approximately 0.5 electron volts (eV), and wherein the nanocrystals are quantum confined to have a bandgap more than 1.0 eV. The optically sensitive material comprises a unipolar photoconductive layer including a first carrier type and a second carrier type, wherein a first mobility of the first carrier type is higher than a second mobility of the second carrier type. The optically sensitive material is part of a non-rectifying optically sensitive device. A rate of the current flow through the optically sensitive material has a non-linear relationship with intensity of the light absorbed by the optically sensitive material. The gain of the optically sensitive material has a non-linear relationship with intensity of the light absorbed by the optically sensitive material.

In an embodiment, each pixel region comprises a vertically stacked pixel. The vertically stacked pixel comprises a plurality of optically sensitive layers including a first optically sensitive layer and a second optically sensitive layer interposed between the respective first electrode and the common second electrode, the first optically sensitive layer overlying at least a portion of a first side of an integrated circuit and the second optically sensitive layer overlying at least a portion of a second side of the first optically sensitive layer, the plurality of optically sensitive layers comprising the optically sensitive material. It further comprises read out circuitry to read out a signal after the integration period of time, the signal including pixel information corresponding to light absorbed by the optically sensitive layers. A thickness of the second optically sensitive layer is different than a thickness of the first optically sensitive layer. A thickness of the second optically sensitive layer is less than a thickness of the first optically sensitive layer. The persistence of each of the optically sensitive layers is approximately equal, and may be in a range of 1 ms to 200 ms. The second optically sensitive layer is relatively completely absorbent of light in a first wavelength interval and relatively completely transmissive of light outside the first wavelength interval. The first optically sensitive layer is relatively completely absorbent of the light outside the first wavelength interval. The first wavelength interval corresponds to blue light. A first dark current of the first optically sensitive layer is different than a second dark current of the second optically sensitive layer.

In an embodiment, the first optically sensitive layer comprises a first material having a first thickness, and the combination of the first material and the first thickness provides a first responsivity to light of a first wavelength, wherein the second optically sensitive layer comprises a second material having a second thickness, and the combination of the second material and the second thickness provides a second responsivity to light of a second wavelength, wherein the first responsivity and the second responsivity are approximately equal. The first optically sensitive layer comprises a first material having a first thickness, and the combination of the first material and the first thickness provides a first photoconductive gain to light of a first wavelength, wherein the second optically sensitive layer comprises a second material having a second thickness, and the combination of the second material and the second thickness provides a second photoconductive gain to light of a second wavelength, wherein the first photoconductive gain and the second photoconductive gain are approximately equal. The first optically sensitive layer comprises a first material having a first thickness, and the combination of the first material and the first thickness provides a first absorbance to light of a first wavelength, wherein the second optically sensitive layer comprises a second material having a second thickness, and the combination of the second material and the second thickness provides a second absorbance to light of a second wavelength, wherein the first absorbance and the second absorbance are approximately equal. At least one of the optically sensitive layers comprises nanocrystals of a material having a bulk bandgap, and wherein the nanocrystals are quantum confined to have an effective bandgap more than twice the bulk bandgap.

In an embodiment, a first diameter of nanocrystals of the first optically sensitive layer is different than a second diameter of nanocrystals of the second optically sensitive layer. The first optically sensitive layer may comprise a first composition including one of lead sulfide (PbS), lead selenide (PbSe), lead tellurium sulfide (PbTe), indium phosphide (InP), indium arsenide (InAs), and germanium (Ge), and the second optically sensitive layer comprises a second composition including one of indium sulfide ($In_2S_3$), indium selenide ($In_2Se_3$), indium tellurium ($In_2Te_3$), bismuth sulfide ($Bi_2S_3$), bismuth selenide ($Bi_2Se_3$), bismuth tellurium ($Bi_2Te_3$), indium phosphide (InP), silicon (Si), and germanium (Ge).

Embodiments are directed to an image sensor comprising: a plurality of pixel regions, each pixel region including a respective first electrode and a common second electrode; each pixel region comprising an optically sensitive material between the respective first electrode and the common second electrode; pixel circuitry for each pixel region in electrical communication with the respective first electrode of the pixel region, the pixel circuitry for each pixel region generating a signal based on a current flow through the optically sensitive material; and bias circuitry controlling a voltage of the respective second electrode of each pixel region to bias the optically sensitive material to operate as a current sink during a first period of time and to bias the optically sensitive material to operate as a current source during a second period of time. The bias circuitry varies the voltage of the respective second electrode of each pixel region nearly simultaneously.

In an embodiment, the pixel circuitry for each pixel region comprises a charge store and integration circuitry to establish a voltage based on the intensity of light absorbed by the optically sensitive material of the respective pixel region over an integration period of time. The pixel circuitry includes at least one transistor in electrical communication with the respective first electrode, wherein the charge store comprises parasitic capacitance of the at least one transistor. The pixel circuitry includes a source follower transistor having a gate in electrical communication with the respective first electrode. The parasitic capacitance comprises a parasitic capacitance between the gate and a source of the source follower transistor. The pixel circuitry includes a reset transistor having a gate in electrical communication with the respective first electrode. The parasitic capacitance comprises a parasitic capacitance between a source and structures of a substrate of the reset transistor. The parasitic capacitance comprises metal-to-metal parasitic capacitance between nodes of the pixel circuit. The parasitic capacitance comprises metal-to-substrate parasitic capacitance between the charge store node and a silicon substrate. The parasitic capacitance is approximately in a range of 0.5 to 3 Femto Farads, or is approximately in a range of 1 to 2 Femto Farads. The integration circuitry establishes a voltage based on current flow through the optically sensitive material during the integration period of time. The bias circuitry switches a voltage of the common electrode between a first voltage and a second voltage. The first voltage biases the optically sensitive material as a current source and the second voltage biases the optically sensitive material as a current sink. The bias circuitry is configured to provide the first voltage during the integration period of time and to provide the second voltage after the integration period of time. The first voltage and the second voltage differ by at least 0.5 volts, or by at least 1 volt, or by at least 1.5 volts, or by at least 2 volts. The bias circuitry switches the voltage of the common electrode between a first voltage, a second voltage and a third voltage. The first voltage, the second voltage and the third voltage can be different from one another. The bias circuitry provides the first voltage to reset a voltage across the optically sensitive material prior to the integration period of time. The bias circuitry provides the second voltage second voltage during the integration period of time. The bias circuitry provides the third voltage after the integration period of time when the signal is read out. The embodiment also comprises read out circuitry to read out a signal after the integration period of time Embodiments are directed to an image sensor comprising: a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer. The pixel circuit for each pixel region comprises a charge store and an integration circuit to establish a voltage based on intensity of the light absorbed by the optically sensitive material of the respective pixel region over an integration period of time. The pixel circuit includes at least one transistor in electrical communication with a respective first electrode of the respective pixel region, wherein the charge store comprises parasitic capacitance of the at least one transistor. The pixel circuit includes a source follower transistor having a gate in electrical communication with the respective first electrode. The parasitic capacitance comprises a parasitic capacitance between the gate and a source of the source follower transistor. The pixel circuit includes a reset transistor having a gate in electrical communication with the respective first electrode. The parasitic capacitance comprises a parasitic capacitance between a source and structures of a substrate of the reset transistor. The parasitic capacitance comprises metal-to-metal parasitic capacitance between nodes of the pixel circuit. The parasitic capacitance comprises metal-to-substrate parasitic capacitance between the charge store node and a silicon substrate. The parasitic capacitance is approximately in a range of 0.5 to 3 Femto Farads or approximately in a range of 1 to 2 Femto Farads.

Embodiments include an image sensor comprising: a semiconductor substrate; a plurality of pixel regions, each pixel region comprising a first electrode, a second electrode, and an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region, the conductive material coupled to at least one electrode, the conductive material providing an opaque shield such that the respective charge store is shielded from the light incident on the optically sensitive layer when the light is in a wavelength band, wherein at least a portion of the conductive material is a metal layer in electrical communication with the optically sensitive layer.

Embodiments are directed to an image sensor comprising: a semiconductor substrate; a plurality of pixel regions, each pixel region comprising a first electrode, a second electrode, and an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and a plurality of conductive layers positioned between the charge store of the respective pixel region and the optically sensitive layer of the corresponding pixel region, the conductive layers providing an opaque shield such that the respective charge store is shielded from the light incident on the optically sensitive layer when the light is in a wavelength band, wherein a set of conductive layers of the plurality of conductive layers is in electrical communication with the optically sensitive layer. The plurality of conductive layers includes at least three metal layers, wherein the set of conductive layers includes two metal layers of the at least three metal layers. The second electrode is a common second electrode that is common to all pixel regions of the plurality of pixel regions, wherein the common second electrode is connected through an interconnect metal layer, wherein the plurality of conductive layers includes the interconnect metal layer. The charge store comprises capacitance or parasitic capacitance, parasitic capacitance between metal in an interconnect layer, or parasitic capacitance from a drain of a reset transistor and gate of a read out transistor.

The image sensor may comprise a transistor coupled between the charge store of each pixel circuit and the optically sensitive layer of the corresponding pixel region, or a diode coupled between the charge store of each pixel circuit and the optically sensitive layer of the corresponding pixel region, or a parasitic diode coupled between the charge store of each pixel circuit and the optically sensitive layer of the corresponding pixel region.

The image sensor of embodiments is configured such that each respective pixel circuit resets a voltage difference across the optically sensitive layer of the corresponding pixel region. Each respective pixel circuit independently resets a voltage of the charge store of the respective pixel circuit. Each respective pixel circuit comprises: a first reset circuit in electrical communication with the charge store of the respective pixel circuit; a switch between the respective charge store and a first electrode of the corresponding pixel region; and a second reset circuit in electrical communication with the first electrode of the respective pixel region when the switch electrically isolates the respective first electrode from the charge store. A distance between the first electrode and the second electrode of each pixel region is less than approximately 3 micrometers, or 2 micrometers, or 1.5 micrometers. The optically sensitive layer for each pixel region has a top surface area of less than approximately 6 square micrometers, or 5 square micrometers, or 4 square micrometers.

In an embodiment, the pixel circuit applies a voltage difference across the optically sensitive layer. The optically sensitive layer has a photoconductive gain when the voltage difference is applied and the optically sensitive layer is exposed to the light. The optically sensitive layer comprises a nanocrystal material having photoconductive gain and a responsivity of at least approximately 0.4 amps/volt (A/V). The responsivity is achieved when a bias is applied across the optically sensitive layer, wherein the bias is approximately in a range of 1 volt to 5 volts. The optically sensitive layer comprises monodisperse nanocrystals. The optically sensitive layer comprises a continuous film of interconnected nanocrystal particles in contact with the respective first electrode and the common electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. The optically sensitive layer comprises a unipolar photoconductive layer including a first carrier type and a second carrier type, wherein a first mobility of the first carrier type is higher than a second mobility of the second carrier type.

Embodiments are directed to a photodetector comprising: a semiconductor substrate; a plurality of pixel regions, each pixel region comprising an optically sensitive layer over the substrate, the optically sensitive layer positioned to receive light; and a pixel circuit for each pixel region, each pixel circuit comprising a charge store and a switching element between the charge store and the optically sensitive layer for the respective pixel region, the charge store and the switching element one or more of integrated on and integrated in the semiconductor substrate below the plurality of pixel regions. The switching element controls an integration period simultaneously for the plurality of pixel regions. Conductive material is positioned between the charge store of the respective pixel region and the optically sensitive layer of the corresponding pixel region such that the respective charge store is shielded from the light incident on the optically sensitive layer, wherein the light is in a wavelength band, wherein at least a portion of the conductive material is a metal layer in electrical communication with the optically sensitive layer. The switching element is a transistor, or a diode, or a parasitic diode.

In an embodiment, the photodetector comprises an opaque material between each pixel circuit and the corresponding pixel region, the opaque material shielding the charge store and the switching element from the light received by the optically sensitive layer. It comprises circuitry configured to simultaneously switch the switching element of each of the pixel regions. Each pixel region comprises a respective first electrode and a respective second electrode, wherein the optically sensitive layer of the respective pixel region is positioned between the respective first electrode and the respective second electrode of the respective pixel region. The pixel circuit transfers a voltage from the first electrode to the charge store when the switching element of the respective pixel region is in a first state and to block the transfer of the voltage from the first electrode to the charge store when the switching element of the respective pixel region is in a second state. It comprises circuitry to switch the switching element of each of the pixel circuits from a first state to a second state at the same time for each of the pixel circuits. It comprises circuitry to switch the switching element of each of the pixel circuits after an integration period of time.

In an embodiment, the photodetector comprises reset circuitry to reset a voltage difference across the optically sensitive layer while the switching element is in the second state. It comprises reset circuitry to initiate another integration period of time while the switching element is in the second state. The reset circuitry comprising at least one of a transistor, a diode, and a parasitic diode. The reset circuitry is configured to vary the voltage of the second electrode of each pixel region to reset the voltage difference across the optically sensitive layer. The reset circuitry resets the voltage difference across the optically sensitive layer after the end of a respective integration period and before all of the voltages transferred to the charge store for the respective integration period have been selected to be read out by the read out circuitry. The reset circuitry initiates a next subsequent integration period before all of the voltages transferred to the charge store for the prior integration period have been selected to be read out by the read out circuitry. It has a reset circuit having a first state to reset the voltage difference across the optically sensitive layer, a second state to integrate charge based on the flow of current across the optically sensitive layer, and a third state to transfer a voltage from the first electrode to the charge store. It has a first reset circuit to reset a voltage difference across the optically sensitive layer after the end of a respective integration period and a second reset circuit configured to reset the voltage of the charge store. The first reset circuit resets the voltage difference while the switching element is in the second state. The second reset circuit resets the charge store independently of the reset circuitry for the voltage difference across the optically sensitive layer. It has read out circuitry to read out a signal from the charge store for each pixel circuit corresponding to a selected row of pixel regions.

The photodetector has a read out circuit is one or more of integrated on and integrated in the semiconductor substrate below the plurality of pixel regions. The read out circuitry reads out sequential rows of the pixel regions. The optically sensitive layer of each pixel region is positioned between a respective first electrode and a respective second electrode. A distance between the first electrode and the second electrode of each pixel region is less than approximately 3 micrometers, or less than approximately 2 micrometers, or less than approximately 1.5 micrometers. In an embodiment, the optically sensitive layer for each pixel region has a top surface area of less than approximately 6 square micrometers, or 5 square micrometers, or 4 square micrometers. The pixel circuit applies a voltage difference across the optically sensitive layer. The optically sensitive layer has a photoconductive gain when the voltage difference is applied and the optically sensitive layer is exposed to the light. The optically sensitive layer comprises a nanocrystal material having photoconductive gain and a responsivity of at least approximately 0.4 amps/volt (A/V). The responsivity is achieved when a bias is applied across the optically sensitive layer, wherein the bias is approximately in a range of 1 volt to 5 volts.

In an embodiment of the photodetector, the optically sensitive layer comprises monodisperse nanocrystals. The optically sensitive layer comprises a continuous film of interconnected nanocrystal particles in contact with the respective first electrode and the common electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. The optically sensitive layer comprises a unipolar photoconductive layer including a first carrier type and a second carrier type, wherein a first mobility of the first carrier type is higher than a second mobility of the second carrier type.

Embodiments include a photodetector comprising: a semiconductor substrate; a plurality of pixel regions over the semiconductor substrate, each pixel region comprising a respective first electrode, a respective second electrode and an optically sensitive layer between the first electrode and the second electrode; a pixel circuit for each pixel region, each pixel circuit comprising a charge store, a switching element between the charge store and the optically sensitive layer for the respective pixel region, and a read out circuit to sample a voltage from the charge store, the pixel circuit formed on the semiconductor substrate below the plurality of pixel regions; circuitry to switch the switching element for all of the pixel circuits at substantially the same time; wherein the distance between the respective first electrode and the respective second electrode for each respective pixel region is less than approximately 2 micrometers, and a top surface area of each pixel region is less than approximately 4 square micrometers; and wherein each pixel circuit is formed on a region of the semiconductor substrate below the plurality of pixel regions having an area less than or equal to the top surface area of the corresponding pixel region. It has a via between each respective pixel circuit and the corresponding pixel region. Each pixel region has a corresponding pixel circuit with dedicated read out circuit, wherein the dedicated read out circuit is separate from the read out circuit of the other pixel circuits. The area of the semiconductor substrate for each respective pixel circuit is positioned under a portion of the corresponding pixel region and a portion of an other pixel region that is not in electrical communication the respective pixel circuit.

Embodiments include a photodetector comprising: a semiconductor substrate; a plurality of pixel regions over the substrate, each pixel region comprising a respective first electrode, a respective second electrode and an optically sensitive layer between the first electrode and the second electrode; a pixel circuit for each pixel region, each pixel circuit comprising a charge store and a switching element between the charge store and the first electrode for the respective pixel region; global shutter circuitry to switch the switching element for all of the pixel circuits at substantially the same time; and bias circuitry configured to change the voltage of the second electrode for each of the pixel regions at substantially the same time. The plurality of pixel regions includes pixel regions for a plurality of rows and a plurality of columns. Each pixel region includes a vertical stacked pixel, the vertical stacked pixel comprising at least two optically sensitive layers, the two optically sensitive layers comprising the optically sensitive layer and a second optically sensitive layer, the optically sensitive layer over at least a portion of the semiconductor substrate and the second optically sensitive layer over the optically sensitive layer. The global shutter circuitry switches the switching element for the two optically sensitive layers for all of the pixel circuits at substantially the same time. The global shutter circuitry controls an integration period simultaneously for the plurality of pixel regions. It has conductive material positioned between the charge store of the respective pixel region and the optically sensitive layer of the corresponding pixel region such that the respective charge store is shielded from the light incident on the optically sensitive layer, wherein the light is in a wavelength band, wherein at least a portion of the conductive material is a metal layer in electrical communication with the optically sensitive layer.

In an embodiment, the switching element is a transistor, a diode, or a parasitic diode. An opaque material between each pixel circuit and the corresponding pixel region, the opaque material shielding the charge store and the switching element from the light received by the optically sensitive layer. The pixel circuit transfers a voltage from the first electrode to the charge store when the switching element of the respective pixel region is in a first state and blocks the transfer of the voltage from the first electrode to the charge store when the switching element of the respective pixel region is in a second state. The global shutter circuitry controls switching of the switching element of each of the pixel circuits from a first state to a second state at the same time for each of the pixel circuits. The global shutter circuitry controls switching of the switching element of each of the pixel circuits after an integration period of time. It has reset circuitry to reset a voltage difference across the optically sensitive layer while the switching element is in the second state. It has reset circuitry to initiate another integration period of time while the switching element is in the second state. The reset circuitry comprising at least one of a transistor, a diode, and a parasitic diode. The reset circuitry is configured to vary the voltage of the second electrode of each pixel region to reset the voltage difference across the optically sensitive layer. The reset circuitry resets the voltage difference across the optically sensitive layer after the end of a respective integration period and before all of the voltages transferred to the charge store for the respective integration period have been selected to be read out by the read out circuitry. The reset circuitry initiates a next subsequent integration period before all of the voltages transferred to the charge store for the prior integration period have been selected to be read out by the read out circuitry.

In one embodiment, a photodetector has a reset circuit having a first state to reset the voltage difference across the optically sensitive layer, a second state to integrate charge based on the flow of current across the optically sensitive layer, and a third state to transfer a voltage from the first electrode to the charge store. It has a first reset circuit to reset a voltage difference across the optically sensitive layer after the end of a respective integration period and a second reset circuit configured to reset the voltage of the charge store. The first reset circuit resets the voltage difference while the switching element is in the second state. The second reset circuit resets the charge store independently of the reset circuitry for the voltage difference across the optically sensitive layer.

In one embodiment, a photodetector comprises read out circuitry to read out a signal from the charge store for each pixel circuit corresponding to a selected row of pixel regions. The read out circuit is one or more of integrated on and integrated in the semiconductor substrate below the plurality of pixel regions. The read out circuitry reads out sequential rows of the pixel regions. A distance between the first electrode and the second electrode of each pixel region is less than approximately 3 micrometers, or 2 micrometers, or 1.5 micrometers.

In an embodiment, the optically sensitive layer for each pixel region has a top surface area of less than approximately 6 square micrometers. The optically sensitive layer for each pixel region has a top surface area of less than approximately 5 square micrometers. The optically sensitive layer for each pixel region has a top surface area of less than approximately 4 square micrometers. The pixel circuit applies a voltage difference across the optically sensitive layer. The optically sensitive layer has a photoconductive gain when the voltage difference is applied and the optically sensitive layer is exposed to the light. The optically sensitive layer comprises a nanocrystal material having photoconductive gain and a responsivity of at least approximately 0.4 amps/volt (A/V). The responsivity is achieved when a bias is applied across the optically sensitive layer, wherein the bias is approximately in a range of 1 volt to 5 volts. The optically sensitive layer comprises monodisperse nanocrystals. The optically sensitive layer comprises a continuous film of interconnected nanocrystal particles in contact with the respective first electrode and the common electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. The optically sensitive layer comprises a unipolar photoconductive layer including a first carrier type and a second carrier type, wherein a first mobility of the first carrier type is higher than a second mobility of the second carrier type.

Embodiments include a photodetector comprising: a semiconductor substrate; a plurality of pixel regions over the substrate, each pixel region comprising a plurality of optically sensitive layers over the semiconductor substrate, each optically sensitive layer being positioned between a respective first electrode and a respective second electrode; a pixel circuit for each pixel region, each pixel circuit comprising a charge capture circuit for each optically sensitive layer of the corresponding pixel region, the charge capture circuit comprising a charge store and a switching element between the charge store and the first electrode for the respective optically sensitive layer of the corresponding pixel region; and global shutter circuitry to control the switching element of the charge capture circuit for each optically sensitive layer of each of the pixel regions at substantially the same time. Each pixel circuit is formed on the semiconductor substrate below the plurality of pixel regions. Each pixel circuit applies a voltage difference across the respective optically sensitive layer. The respective optically sensitive layer has a photoconductive gain when the voltage difference is applied and the optically sensitive layer is exposed to the light. The circuitry to control the switching element of the charge capture circuit for each optically sensitive layer of each of the pixel regions is global shutter circuitry. The global shutter circuitry controls an integration period simultaneously for the plurality of pixel regions. Conductive material positioned between the charge store of the respective pixel region and an optically sensitive layer of a corresponding pixel region such that the respective charge store is shielded from the light incident on the optically sensitive layer, wherein the light is in a wavelength band, wherein at least a portion of the conductive material is a metal layer in electrical communication with the optically sensitive layer.

In an embodiment, the photodetector comprises an opaque material between each pixel circuit and the corresponding pixel region, the opaque material shielding the charge store and the switching element from the light received by the optically sensitive layer. The pixel circuit transfers a voltage from the respective first electrode to the respective charge store when the switching element is in a first state and blocks the transfer of the voltage from the respective first electrode to the respective charge store when the switching element is in a second state. The global shutter circuitry controls switching of the switching element of each of the pixel circuits from a first state to a second state at the same time for each of the pixel circuits. The global shutter circuitry controls switching of the switching element of each of the pixel circuits after an integration period of time.

In one embodiment, a photodetector has reset circuitry to reset a voltage difference across each optically sensitive layer while the switching element is in the second state. It has reset circuitry to initiate another integration period of time while the switching element is in the second state. It has reset circuitry comprising at least one of a transistor, a diode, and a parasitic diode. The reset circuitry configured to vary the voltage of the respective second electrode of each corresponding pixel region to reset the voltage difference across the corresponding optically sensitive layer. The reset circuitry resets the voltage difference across the corresponding optically sensitive layer after the end of an integration period and before all of the voltages transferred to the charge store for the respective integration period have been selected to be read out by the read out circuitry. The reset circuitry initiates a next subsequent integration period before all of the voltages transferred to the charge store for the prior integration period have been selected to be read out by the read out circuitry. The reset circuit has a first state to reset the voltage difference across each optically sensitive layer, a second state to integrate charge based on the flow of current across each optically sensitive layer, and a third state to transfer a voltage from the respective first electrode to the respective charge store. It comprises read out circuitry to read out a signal from the charge store for each pixel circuit corresponding to a selected row of pixel regions. The read out circuit is one or more of integrated on and integrated in the semiconductor substrate below the plurality of pixel regions. The read out circuitry reads out sequential rows of the pixel regions. A distance between the first electrode and the second electrode of each pixel region is less than approximately 3 micrometers, or 2 micrometers, or 1.5 micrometers.

In an embodiment, the optically sensitive layer for each pixel region has a top surface area of less than approximately 6, or 5, or 4 square micrometers. The pixel circuit applies a voltage difference across an optically sensitive layer. At least one optically sensitive layer has a photoconductive gain when the voltage difference is applied and the optically sensitive layer is exposed to the light. At least one optically sensitive layer comprises a nanocrystal material having photoconductive gain and a responsivity of at least approximately 0.4 amps/volt (A/V).

In an embodiment, responsivity is achieved when a bias is applied across the optically sensitive layer, wherein the bias is approximately in a range of 1 volt to 5 volts. At least one optically sensitive layer comprises monodisperse nanocrystals. At least one optically sensitive layer comprises a continuous film of interconnected nanocrystal particles in contact with the respective first electrode and the common electrode. The nanocrystal particles comprise a plurality of nanocrystal cores and a shell over the plurality of nanocrystal cores. The plurality of nanocrystal cores are fused. A physical proximity of the nanocrystal cores of adjacent nanocrystal particles provides electrical communication between the adjacent nanocrystal particles. The physical proximity includes a separation distance of less than approximately 0.5 nm. The electrical communication includes a hole mobility of at least approximately 1E-5 square centimeter per volt-second across the nanocrystal particles. The plurality of nanocrystal cores are electrically interconnected with linker molecules. At least one optically sensitive layer comprises a unipolar photoconductive layer including a first carrier type and a second carrier type, wherein a first mobility of the first carrier type is higher than a second mobility of the second carrier type.

Embodiments are directed to an image sensor comprising: a semiconductor substrate; a plurality of pixel regions, each pixel region comprising an optically sensitive layer over the semiconductor substrate, the optically sensitive layer separated from the semiconductor substrate on a side by at least one adjacent layer, wherein vias couple the optically sensitive layer and the semiconductor substrate; and a pixel circuit for each pixel region, each pixel circuit comprising a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer creating a non-rectifying optically sensitive device, the optically sensitive layer separated from the semiconductor substrate on a side by at least one adjacent layer, wherein vias couple the optically sensitive layer and the semiconductor substrate; and a pixel circuit for each pixel region, each pixel circuit comprising a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer creating a non-rectifying optically sensitive device, the optically sensitive layer separated from the semiconductor substrate on a side by at least one adjacent layer, wherein vias couple the optically sensitive layer and the semiconductor substrate; a pixel circuit for each pixel region, each pixel circuit establishing a voltage over an integration period of time, wherein the voltage has a non-linear relationship with intensity of light absorbed by the optically sensitive layer of the respective pixel region. The pixel circuit comprises a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer separated from the semiconductor substrate on a side by at least one adjacent layer, wherein vias couple the optically sensitive layer and the semiconductor substrate; and a pixel circuit for each pixel region, each pixel circuit providing a current flow through the respective optically sensitive layer, wherein a rate of the current flow through the respective optically sensitive layer has a non-linear relationship with intensity of the light absorbed by the optically sensitive layer. The pixel circuit comprises a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer separated from the semiconductor substrate on a side by at least one adjacent layer, wherein vias couple the optically sensitive layer and the semiconductor substrate; and a pixel circuit for each pixel region, each pixel circuit providing a current flow through the respective optically sensitive layer, the current flow varying with a photoconductive gain of the optically sensitive layer, wherein the photoconductive gain has a non-linear relationship with intensity of the light absorbed by the optically sensitive layer. It has a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer comprising nanocrystals, the optically sensitive layer separated from the semiconductor substrate on a side by at least one adjacent layer, wherein vias couple the optically sensitive layer and the semiconductor substrate; and a pixel circuit for each pixel region, each pixel circuit comprising a charge store and a read out circuit, wherein the charge store is separate for each pixel region and wherein the read out circuit is common with the read out circuit for at least one set of other pixel regions.

Embodiments include a photodetector comprising: a semiconductor substrate; a plurality of pixel regions, each pixel region comprising an optically sensitive layer over the semiconductor substrate, the optically sensitive layer separated from the semiconductor substrate on a side by at least one adjacent layer, wherein vias couple the optically sensitive layer and the semiconductor substrate; and a pixel circuit for each pixel region, each pixel circuit comprising a charge store and a read out circuit, wherein the charge store is separate for each pixel region and wherein the read out circuit is common with the read out circuit for at least one set of other pixel regions; wherein a dark current of respective optically sensitive layers of respective pixel regions is different. The at least one adjacent layer comprises at least one metal. The at least one adjacent layer comprises at least one insulator. The at least one adjacent layer comprises at least one of a metal layer and an insulator layer. The at least one set of other pixel regions includes three other pixel regions. The at least one set of other pixel regions includes five other pixel regions. The at least one set of other pixel regions includes seven other pixel regions. Each pixel circuit is formed on the semiconductor substrate below the plurality of pixel regions.

In an embodiment each pixel circuit includes only a single transistor that is not shared with an other pixel circuit. Each pixel circuit shares an amplifier and at least one transistor to transfer a voltage from the pixel circuit. Each pixel circuit shares a source follower transistor and at least one transistor to transfer a voltage from the pixel circuit.

In an embodiment, each pixel circuit shares a read out transistor and at least one transistor to transfer a voltage from the pixel circuit.

In an embodiment, the pixel circuits corresponding to 16 pixel circuits comprise less than 25 transistors. The pixel circuits comprise a single non-shared transistor for each of 16 pixel regions and two read out transistors each shared by 8 pixel regions of the 16 pixel regions.

In an embodiment, the pixel circuits corresponding to 8 pixel circuits comprise less than 16 transistors. The pixel circuits comprise a single non-shared transistor for each of 8 pixel regions, and at least one read out transistor shared by the 8 pixel regions.

In an embodiment, the pixel circuits corresponding to 8 pixel circuits comprise at least two common transistors and each transistor has a single separate transistor between the optically sensitive layer and the at least two common transistors.

In an embodiment, the two common transistors comprise a reset transistor and a row select transistor to transfer a voltage to a row buffer.

In an embodiment, the two common transistors comprise a source follower transistor.

In an embodiment, each pixel region includes a respective first electrode and a common second electrode, wherein the optically sensitive layer adjoins the first electrode and the common second electrode, wherein the common second electrode is a common electrode for the plurality of pixel regions.

In an embodiment, the plurality of pixel regions including a vertical stacked pixel, the vertical stacked pixel comprising at least two optically sensitive layers, a first optically sensitive layer and a second optically sensitive layer, the first optically sensitive layer over at least a portion of the semiconductor substrate and the second optically sensitive layer over the first optically sensitive layer.

In an embodiment, a pixel circuit for each pixel region includes a plurality of sets of the pixel circuits for the at least two optically sensitive layers.

In an embodiment, the plurality of sets of pixel circuits includes two sets of pixel circuits for two optically sensitive layers.

Embodiments include a photodetector comprising a semiconductor substrate; a plurality of pixel regions, each pixel region comprising an optically sensitive layer over the substrate; a pixel circuit for each pixel region, each pixel circuit comprising a charge store and a read out circuit; and circuitry to select the charge store of a plurality of adjacent pixel regions for simultaneous reading to a shared read out circuit. The plurality of adjacent pixel regions includes two adjacent pixel regions. The plurality of adjacent pixel regions includes four adjacent pixel regions. The plurality of adjacent pixel regions includes 16 adjacent pixel regions.

In an embodiment, the plurality of adjacent pixel regions is a number of pixel regions, wherein the number is a multiple of two, or four, or eight, or sixteen.

Embodiments include a photodetector comprising: a semiconductor substrate; a plurality of pixel regions over the semiconductor substrate, each pixel region comprising a first electrode, a second electrode and an optically sensitive layer between the first electrode and the second electrode; a pixel circuit for each pixel region, each pixel circuit comprising a charge store and a read out circuit; circuitry to electrically connect the first electrode for a set of pixel regions to a shared charge store during an integration period of time, the plurality of pixel regions including the set of pixel regions, wherein the shared charge store is the charge store corresponding to one pixel circuit of one pixel region; circuitry to read out a signal from the shared charge store, the signal based on intensity of light absorbed by each pixel region of the set of pixel regions during the integration period of time. The set of pixel regions includes two pixel regions.

In an embodiment, the set of pixel regions includes four pixel regions, or 16 pixel regions.

In an embodiment, the set of pixel regions includes a number of pixel regions, wherein the number is a multiple of two or a multiple of four, or a multiple of eight, or a multiple of sixteen.

Embodiments include a photodetector comprising: a semiconductor substrate; a plurality of pixel regions over the semiconductor substrate, each pixel region comprising a first electrode, a second electrode and an optically sensitive layer between the first electrode and the second electrode; pixel circuitry configured in a first mode to read out a signal for each pixel region based on the intensity of light absorbed by the optically sensitive layer of the respective pixel region, and configured in a second mode to read out a signal for a plurality of sets of pixel regions based on the intensity of light absorbed by the optically sensitive layers of each set of pixel regions. The pixel circuitry electrically connects the first electrode of each set of pixel regions to a common charge store for the respective set of pixel regions for an integration period of time.

In an embodiment, the pixel circuitry is configured in the first mode to electrically connect the first electrode of each pixel region to a separate charge store for an integration period of time and is configured in the second mode to electrically connect the first electrodes for each set of pixel regions to a shared charge store for the integration period of time.

In an embodiment, each set of pixel regions includes two pixel regions or four pixel regions. In an embodiment, each set of pixel regions includes 16 pixel regions. Each set of pixel regions includes a number of pixel regions, wherein the number is a multiple of two, or four, or eight, or sixteen.

Embodiments include a method comprising: providing a plurality of pixel regions, each pixel region comprising a first electrode, a second electrode and an optically sensitive layer between the first electrode and the second electrode; electronically selecting a set of the pixel regions, wherein the plurality of pixel regions includes the set of pixel regions; and reading out a signal from the set of the pixel regions, wherein the signal is based on intensity of light collectively absorbed by the optically sensitive layers of the set of pixel regions during the integration period of time.

Embodiments include a method comprising: providing a plurality of pixel regions, each pixel region comprising a first electrode, a second electrode and an optically sensitive layer between the first electrode and the second electrode; and selectively reading out a signal from a set of the pixel regions, the plurality of pixel regions including the set of pixel regions, the signal based on intensity of light absorbed by the optically sensitive layers of the set of pixel regions during an integration period of time.

Embodiments include a method comprising: providing a plurality of pixel regions, each pixel region comprising a first electrode, a second electrode and an optically sensitive layer between the first electrode and the second electrode; providing a pixel circuit for each pixel region, each pixel circuit comprising a charge store and a read out circuit; selectively controlling connection of the first electrode for a set of pixel regions to a shared charge store during an integration period of time, the plurality of pixel regions including the set of pixel regions, wherein the shared charge store is a charge store corresponding to one pixel circuit of one pixel region; and reading a signal from the shared charge store, the signal based on intensity of light collectively absorbed by the set of pixel regions during the integration period of time.

Embodiments include a method comprising: providing a plurality of pixel regions, each pixel region comprising a first electrode, a second electrode and an optically sensitive layer between the first electrode and the second electrode; electronically selecting a set of the pixel regions, wherein the plurality of pixel regions includes the set of pixel regions; reading out signals from the set of the pixel regions; and generating an image using the signals, wherein the signals are based on intensity of light collectively absorbed by only the optically sensitive layers of the set of pixel regions and represent less than all pixel data available from the plurality of pixel regions.

Embodiments include a method comprising: exposing a plurality of pixel regions to light, each pixel region comprising a first electrode, a second electrode and an optically sensitive layer between the first electrode and the second electrode, wherein an intensity of the light is below a minimum threshold for signal generation in a first pixel region of the pixel regions; providing a pixel circuit for each pixel region, each pixel circuit comprising a charge store and a read out circuit; selectively controlling connecting of the first electrode for a first set of the pixel regions to a shared charge store during an integration period of time, the first set of the pixel regions including the first pixel region and at least one adjacent pixel region, wherein the shared charge store is a charge store corresponding to a pixel circuit of the first set of the pixel regions; and reading out a signal from the first set of the pixel regions, wherein the signal is based on the intensity of light collectively absorbed by the optically sensitive layers of the first set of pixel regions during the integration period of time, wherein the intensity of the light collectively absorbed is above the minimum threshold.

Embodiments include a sensor comprising: at least one optically sensitive layer; and a circuit comprising at least one node in electrical communication with the optically sensitive layer, wherein the circuit stores an electrical signal proportional to the intensity of light incident on the optically sensitive layer during an integration period, wherein a non-linear relationship exists between electrical characteristics of the optically sensitive layer and the intensity of light absorbed by the optically sensitive layer, wherein a continuous function represents the non-linear relationship.

In an embodiment, at least one optically sensitive layer comprises closely-packed semiconductor nanoparticle cores.

In an embodiment, each core is partially covered with an incomplete shell, where the shell produces trap states having substantially a single time constant.

In an embodiment, the nanoparticle cores comprise PbS partially covered with a shell comprising PbSO3.

In an embodiment, the nanoparticle cores are passivated using ligands of at least two substantially different lengths.

In an embodiment, the nanoparticle cores are passivated using at least one ligand of at least one length.

In an embodiment, the nanoparticle cores are passivated and crosslinked using at least one crosslinking molecule of at least one length.

In an embodiment, the crosslinking molecule is a conductive crosslinker.

In an embodiment, each nanoparticle core is covered with a shell, where the shell comprises PbSO3.

In an embodiment, the nanoparticle cores comprise PbS that is partially oxidized and substantially lacking in PbSO4 (lead sulfate).

In an embodiment, at least one optically sensitive layer comprises a nanocrystalline solid, wherein at least a portion of a surface of the nanocrystalline solid is oxidized.

In an embodiment, a composition of the nanocrystalline solid excludes a first set of native oxides and includes a second set of native oxides.

In an embodiment, the first set of native oxides includes PbSO4 (lead sulfate) and the second set of native oxides includes PbSO3.

In an embodiment, trap states of the nanocrystalline solid provide persistence, wherein an energy to escape from a predominant trap state is less than or equal to approximately 0.1 eV.

In an embodiment, a non-predominant trap state, wherein an energy to escape from the non-predominant trap state is greater than or equal to approximately 0.2 eV.

In an embodiment, a continuous transparent layer, the continuous transparent layer comprising substantially transparent material, wherein the continuous transparent layer at least partially covers the optically sensitive layer.

In an embodiment, an adhesion layer anchoring constituents of the optically sensitive layer to circuitry of the integrated circuit.

In an embodiment, the second optically sensitive layer comprises a wavelength-selective light-absorbing material, wherein the first optically sensitive layer comprises a photoconductive material.

In an embodiment, an array of curved optical elements that determine a distribution of intensity across the optically sensitive layers.

In an embodiment, at least one optically sensitive layer comprises substantially fused nanocrystal cores having a dark current density less than approximately 0.1 nA/cm2.

In an embodiment, the circuit is an integrated circuit.

In an embodiment, a minimum feature spacing of the integrated circuit is in a range of approximately 100 nm to 200 um.

In an embodiment, the circuit is a complementary metal oxide semiconductor (CMOS) integrated circuit.

In an embodiment, a rate of the current flow through the optically sensitive layer has a non-linear relationship with the intensity of light absorbed by the optically sensitive layer.

In an embodiment, a gain of the optically sensitive layer has a non-linear relationship with the intensity of light absorbed by the optically sensitive layer.

In an embodiment, the optically sensitive layer has photoconductive gain when a voltage difference is applied across the optically sensitive layer and the optically sensitive layer is exposed to light.

In an embodiment, persistence of the optically sensitive layer is approximately in a range of 1 ms to 200 ms.

In an embodiment, the sensor is a non-rectifying device.

In an embodiment, the optically sensitive layer has a surface area determined by a width dimension and a length dimension.

In an embodiment, the width and/or length dimension is approximately 2 um. In an embodiment, the width dimension and/or length is less than approximately 2 um.

In an embodiment, the optically sensitive layer comprises a continuous film of interconnected nanocrystal particles.

In an embodiment, the nanocrystal particles comprise a plurality of nanocrystal cores and a shell over the plurality of nanocrystal cores.

In an embodiment, the plurality of nanocrystal cores are fused.

In an embodiment, a physical proximity of the nanocrystal cores of adjacent nanocrystal particles provides electrical communication between the adjacent nanocrystal particles.

In an embodiment, the physical proximity includes a separation distance of less than approximately 0.5 nm.

In an embodiment, the electrical communication includes a hole mobility of at least approximately 1E-5 square centimeter per volt-second across the nanocrystal particles.

In an embodiment, the plurality of nanocrystal cores are electrically interconnected with linker molecules.

In an embodiment, the linker molecules include bidentate linker molecules. The linker molecules can include ethanedithiolor benzenedithiol.

In an embodiment, the optically sensitive layer comprises a unipolar photoconductive layer including a first carrier type and a second carrier type, wherein a first mobility of the first carrier type is higher than a second mobility of the second carrier type. The first carrier type is electrons or holes, and the second carrier type is holes or electrons.

In an embodiment, the optically sensitive layer comprises a nanocrystal material having photoconductive gain and a responsivity of at least approximately 0.4 amps/volt (A/V).

In an embodiment, the responsivity is achieved under a bias approximately in a range of 0.5 volts to 5 volts.

In an embodiment, the optically sensitive layer comprises nanocrystals of a material having a bulk bandgap, and wherein the nanocrystals are quantum confined to have an effective bandgap more than twice the bulk bandgap.

In an embodiment, the optically sensitive layer includes nanocrystals comprising nanoparticles, wherein a nanoparticle diameter of the nanoparticles is less than a Bohr exciton radius of bound electron-hole pairs within the nanoparticle.

In an embodiment, the optically sensitive layer comprises monodisperse nanocrystals.

In an embodiment, the optically sensitive layer comprises nanocrystals.

In an embodiment, the nanocrystals are colloidal quantum dots.

In an embodiment, the quantum dots include a first carrier type and a second carrier type, wherein the first carrier type is a flowing carrier and the second carrier type is one of a substantially blocked carrier and a trapped carrier.

In an embodiment, the colloidal quantum dots include organic ligands, wherein a flow of at least one of the first carrier type and the second carrier type is related to the organic ligands.

In an embodiment, the optically sensitive layer can be biased as both a current sink and a current source.

In an embodiment, at least a first metal layer and a second metal layer, the optically sensitive layer in electrical communication with the second metal layer.

In an embodiment, the at least two metal layers include metal interconnect layers.

In an embodiment, the second metal layer forms contacts in electrical communication with the optically sensitive layer.

In an embodiment, the contacts comprise an aluminum body, a first coating and a second coating, the first coating comprising titanium nitride and positioned between the aluminum body and the optically sensitive layer, the second coating comprising titanium oxynitride and positioned between the first coating and the optically sensitive layer.

In an embodiment, the contacts comprise an aluminum body, a first coating and a second coating, the first coating comprising titanium nitride and positioned between the aluminum body and the optically sensitive layer, the second coating located between the first coating and the optically sensitive layer and comprising a metal selected from the group consisting of gold, platinum, palladium, nickel and tungsten.

In an embodiment, the contacts are formed from a plurality of metal sub-layers, each metal sub-layer comprising a constituent selected from the group consisting of titanium nitride, titanium oxy nitride, gold, platinum, palladium, nickel and tungsten.

In an embodiment, the second metal layer consists of metal other than aluminum, the metal including at least one layer selected from the group consisting of titanium nitride, titanium oxynitride, gold, platinum, palladium, nickel and tungsten.

In an embodiment, the second metal layer consists of metal other than copper, the metal including at least one layer selected from the group consisting of titanium nitride, titanium oxynitride, gold, platinum, palladium, nickel and tungsten.

In an embodiment, the second metal layer comprises a constituent selected from the group consisting of titanium nitride, titanium oxynitride, gold, platinum, palladium, nickel and tungsten.

In an embodiment, the optically sensitive layer makes direct contact with the second metal layer.

In an embodiment, the optically sensitive layer comprises a coating on the second metal layer.

In an embodiment, the metal layers comprise at least one additional metal layer between the first metal layer and the second metal layer.

In an embodiment, the first metal layer and the at least one additional metal layer comprises aluminum, wherein the at least one additional metal layer excludes aluminum.

In an embodiment, each of the first metal layer and the at least one additional metal layer comprises aluminum and titanium nitride, wherein the at least one additional metal layer excludes aluminum.

In an embodiment, each of the first metal layer and the at least one additional metal layer excludes aluminum.

In an embodiment, each of the first metal layer and the at least one additional metal layer excludes copper.

In an embodiment, the first metal layer has a first thickness dimension and the second metal layer has a second thickness dimension.

In an embodiment, the first metal layer has a first aspect ratio and the second metal layer has a second aspect ratio.

Embodiments include a sensor comprising: a first region of an optically sensitive material; and a second region of the optically sensitive material, the second region covering at least a portion of the first region; wherein the optically sensitive material creates a non-rectifying optically sensitive device, wherein a non-linear relationship exists between electrical characteristics of the optically sensitive material and the intensity of light absorbed by the optically sensitive material; wherein the first region and the second region possess substantially different spectral onset of absorption.

Embodiments include a sensor comprising: at least one optically sensitive layer;

wherein a first region of the optically sensitive layer provides electronic signals corresponding to an intensity of light incident on the first region and lying within a first spectral region; wherein a second region of the optically sensitive layer provides electronic signals corresponding to the intensity of light incident on the second region and lying within a second spectral region. The first spectral region includes at least one of a visible spectral region, an X-ray spectral region, an ultraviolet (UV) spectral region, a near infrared (IR) (NIR) spectral region, a short-wavelength IR (SWIR) spectral region, and a mid-wavelength IR (MWIR) spectral region.

In an embodiment, the second spectral region includes at least one of a visible spectral region, an X-ray spectral region, an ultraviolet (UV) spectral region, a near infrared (IR) (NIR) spectral region, a short-wavelength IR (SWIR) spectral region, and a mid-wavelength IR (MWIR) spectral region Embodiments include photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer.

Embodiments include a vertically stacked pixel, comprising: a plurality of optically sensitive layers including a first optically sensitive layer and a second optically sensitive layer, the first optically sensitive layer overlying at least a portion of a first side of an integrated circuit and the second optically sensitive layer overlying at least a portion of a second side of the first optically sensitive layer; a plurality of electrodes, wherein the plurality of optically sensitive layers is interposed between a respective first electrode and a respective second electrode of the plurality of electrodes; and a coupling between the integrated circuit and the plurality of electrodes by which the integrated circuit selectively applies a bias and reads from the optically sensitive layers pixel information corresponding to light absorbed by the optically sensitive layers.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein at least one of the optically sensitive layers comprises nanocrystals of a material having a bulk bandgap, wherein the nanocrystals are quantum confined to have an effective bandgap more than twice the bulk bandgap.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein each of the at least two optically sensitive layers comprises nanocrystals of different materials and each of the different materials has a different bulk bandgap.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein each of the optically sensitive layers comprises nanocrystals having a different particle size.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a first increase in bandgap due to quantum confinement in the first optically sensitive layer is greater than a second increase in bandgap due to quantum confinement in the second optically sensitive layer.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a thickness of at least one optically sensitive layer is different from a thickness of at least one other optically sensitive layer.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein the first optically sensitive layer comprises a nanocrystal material having first photoconductive gain and the second optically sensitive layer comprises a nanocrystal material having a second photoconductive gain.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a dark current of at least one optically sensitive layer is different from a dark current of at least one other optically sensitive layer.

Embodiments are directed to a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a compensation applied to a signal from at least one optically sensitive layer is different from a compensation applied to a signal from at least one other optically sensitive layer.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a dark current compensation signal is received from a black pixel and separately and proportionally applied to signals of each optically sensitive layer.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a dark current compensation signal corresponding to each respective optically sensitive layer is received from a respective black pixel and applied to a respective signal of the respective optically sensitive layer.

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein a dark current of at least one optically sensitive layer is approximately in a range of 10 nanoamps (nA) per square centimeter (cm) to 500 nA per square cm.

Embodiments include a photodetector comprising: at least two optically sensitive layers, a first optically sensitive layer and a second optically sensitive layer, the first optically sensitive layer over at least a portion of a substrate and the second optically sensitive layer over the first optically sensitive layer; wherein at least one optically sensitive layer is a nanocrystal layer having a dark current approximately in a range of 10 nanoamps (nA) per square centimeter (cm) to 500 nA per square cm.

Embodiments are directed to a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein the first optically sensitive layer comprises a first composition including one of lead sulfide (PbS), lead selenide (PbSe), lead tellurium sulfide (PbTe), indium phosphide (InP), indium arsenide (InAs), and germanium (Ge), and the second optically sensitive layer comprises a second composition including one of indium sulfide ($In_2S_3$), indium selenide ($In_2Se_3$), indium tellurium ($In_2Te_3$), bismuth sulfide ($Bi_2S_3$), bismuth selenide ($Bi_2Se_3$), bismuth tellurium ($Bi_2Te_3$), indium phosphide (InP), silicon (Si), and germanium (Ge).

Embodiments include a photodetector comprising: an integrated circuit; and at least two optically sensitive layers, a first optically sensitive layer and a second optically sensitive layer, the first optically sensitive layer over at least a portion of the integrated circuit and the second optically sensitive layer over the first optically sensitive layer; wherein each optically sensitive layer is interposed between two electrodes, the electrodes including a respective first electrode and a respective second electrode; wherein the integrated circuit selectively applies a bias to the electrodes and reads signals from the optically sensitive layers, wherein the signal is related to the number of photons received by the respective optically sensitive layer; and wherein the first optically sensitive layer comprises a nanocrystal material having an absorption onset at a first wavelength and the second optically sensitive layer comprises a nanocrystal material having an absorption onset at a second wavelength, wherein the first wavelength is shorter than the second wavelength, and a local absorption maximum is absent from an absorption spectrum of at least one of the first optically sensitive layer and the second optically sensitive layer.

Embodiments include a photodetector comprising: at least two optically sensitive layers, a first optically sensitive layer and a second optically sensitive layer, the first optically sensitive layer over at least a portion of an integrated circuit and the second optically sensitive layer over the first optically sensitive layer; wherein the first optically sensitive layer comprises a first absorption band including at least one first set of colors and is devoid of a local absorption maximum, and the second optically sensitive layer comprises a second absorption band including at least one second set of colors and is devoid of a local absorption maximum, wherein the second absorption band includes the first set of colors; wherein each optically sensitive layer is interposed between a respective first electrode and a respective second electrode; and wherein the integrated circuit selectively applies a bias to the electrodes and reads signals from the optically sensitive layers.

Embodiments include a photodetector comprising: an integrated circuit; and a plurality of optically sensitive layers including a first optically sensitive layer and a vertically stacked set of optically sensitive layers, the first optically sensitive layer in at least a portion of the integrated circuit and the vertically stacked set of optically sensitive layers over the first optically sensitive layer; wherein the vertically stacked optically sensitive layer is interposed between a respective first electrode and a respective second electrode; wherein the integrated circuit selectively applies a bias to the electrodes and reads signals from the vertically stacked optically sensitive layers, wherein the signal is related to the number of photons received by the respective vertically stacked optically sensitive layer.

Embodiments include a pixel array comprising a plurality of photodetectors, wherein each photodetector is a vertically stacked pixel, the vertically stacked pixel comprising: at least two optically sensitive layers, a first optically sensitive layer and a second optically sensitive layer, the first optically sensitive layer over at least a portion of the integrated circuit and the second optically sensitive layer over the first optically sensitive layer; and a plurality of electrodes including at least two electrodes between which the two optically sensitive layers are interposed, the electrodes including a respective first electrode and a respective second electrode; a coupling between the integrated circuit and the plurality of electrodes by which the integrated circuit selectively applies a bias and reads from the optically sensitive layers pixel information corresponding to light absorbed by the optically sensitive layers.

Embodiments are directed to a photosensor array comprising: an integrated circuit; and a plurality of photodetectors over the integrated circuit, wherein each photodetector forms a vertically stacked pixel that comprises, at least two optically sensitive layers, a first optically sensitive layer and a second optically sensitive layer, the first optically sensitive layer over at least a portion of the integrated circuit and the second optically sensitive layer over the first optically sensitive layer; and wherein each optically sensitive layer is interposed between two electrodes, the electrodes including a respective first electrode and a respective second electrode, wherein the integrated circuit is coupled to the electrodes and selectively applies a bias to the electrodes and reads signals from the optically sensitive layers, wherein the signals are related to the number of photons received by the respective optically sensitive layer.

In an embodiment, the signal represents light absorbed by at least one optically sensitive layer. The signal can be a voltage proportional to light absorbed by at least one optically sensitive layer. The respective first electrode and second electrode for the first optically sensitive layer are different electrodes than the respective first electrode and second electrode for the second optically sensitive layer.

In an embodiment, the respective first electrode for the first optically sensitive layer is a different electrode than the respective first electrode for the second optically sensitive layer.

In an embodiment, the second respective electrode for the second optically sensitive layer is a common electrode common to both the first optically sensitive layer and the second optically sensitive layer.

In an embodiment, each respective first electrode is in contact with the respective first optically sensitive layer.

In an embodiment, each respective second electrode is in contact with the respective second optically sensitive layer.

In an embodiment, each respective first electrode is positioned laterally relative to at least a portion of the respective second electrode.

In an embodiment, at least a portion of each respective second electrode is on the same layer of the integrated circuit as the respective first electrode and the respective optically sensitive layer.

In an embodiment, the respective second electrode for the first optically sensitive layer and the second optically layer comprises a common electrode.

In an embodiment, the common electrode extends vertically from the first optically sensitive layer to the second optically sensitive layer.

In an embodiment, the common electrode extends vertically from the integrated circuit along a portion of the first optically sensitive layer and the second optically sensitive layer.

In an embodiment, each respective second electrode is disposed around the respective first electrode.

In an embodiment, the respective second electrode is configured to provide a barrier to carriers around the first electrode.

In an embodiment, the respective second electrode for the first optically sensitive layer and the second optically sensitive layer comprises a common electrode disposed around the first electrode.

In an embodiment, the common electrode extends vertically from the integrated circuit.

In an embodiment, the second electrode is at least partially transparent and is positioned over the respective optically sensitive layer.

In an embodiment, the respective first electrode and the respective second electrode are non-transparent and separated by a distance corresponding to a width dimension and a length dimension.

In an embodiment, the width and/or length dimension is approximately 2 um.

In an embodiment, the width and/or length dimension is less than approximately 2 um.

In an embodiment, the respective second electrode for the first optically sensitive layer and the second electrode for the second optically sensitive layer is a common electrode for both the first optically sensitive layer and the second optically sensitive layer.

In an embodiment, the at least two optically sensitive layers includes a third optically sensitive layer, wherein the third optically sensitive layer is over at least a portion of the second optically sensitive layer, wherein the respective second electrode for the first optically sensitive layer, the second electrode for the second optically sensitive layer and the third electrode for the third layer is a common electrode for the first optically sensitive layer, the second optically sensitive layer and the third layer, wherein the common electrode is non-transparent.

In an embodiment, a third optically sensitive layer integrated in the integrated circuit, wherein the respective second electrode for the first optically sensitive layer and the second electrode for the second optically sensitive layer is a common electrode for both the first optically sensitive layer and the second optically sensitive layer, wherein the respective second electrode for the third layer is different from the common electrode.

In an embodiment, at least one optically sensitive layer comprises a continuous film of interconnected nanocrystal particles in contact with the respective first electrode and the respective second electrode.

In an embodiment, the nanocrystal particles comprise a plurality of nanocrystal cores and a shell over the plurality of nanocrystal cores.

In an embodiment, the plurality of nanocrystal cores are fused.

In an embodiment, a physical proximity of the nanocrystal cores of adjacent nanocrystal particles provides electrical communication between the adjacent nanocrystal particles.

In an embodiment, the physical proximity includes a separation distance of less than approximately 0.5 nm.

In an embodiment, the electrical communication includes a hole mobility of at least approximately 1E-5 square centimeter per volt-second across the nanocrystal particles.

In an embodiment, the plurality of nanocrystal cores are electrically interconnected with linker molecules.

In an embodiment, the linker molecules include bidentate linker molecules.

In an embodiment, the linker molecules include ethanedithiol, or benzenedithiol.

In an embodiment, at least one of the optically sensitive layers comprises a unipolar photoconductive layer including a first carrier type and a second carrier type, wherein a first mobility of the first carrier type is higher than a second mobility of the second carrier type.

In an embodiment, the respective second electrode for the first optically sensitive layer and the second optically layer comprises a common electrode extending vertically from the first optically sensitive layer to the second optically sensitive layer.

In an embodiment, a thickness of the second optically sensitive layer is different than a thickness of the first optically sensitive layer.

In an embodiment, a thickness of the first optically sensitive layer is less than a thickness of the second optically sensitive layer.

In an embodiment, a thickness of the second optically sensitive layer is less than a thickness of the first optically sensitive layer.

In an embodiment, persistence of each of the optically sensitive layers is approximately equal.

In an embodiment, persistence of each of the optically sensitive layers is longer than approximately 1 millisecond (ms), or in a range of 1 ms to 30 ms, or in a range of 1 ms to 100 ms, or in a range of 1 ms to 200 ms, or in a range of 10 ms to 50 ms.

In an embodiment, at least one optically sensitive layer comprises closely-packed semiconductor nanoparticle cores. Each core is partially covered with an incomplete shell, where the shell produces trap states having substantially a single time constant. The nanoparticle cores comprise PbS partially covered with a shell comprising PbSO3. The nanoparticle cores are passivated using ligands of at least two substantially different lengths. The nanoparticle cores are passivated using at least one ligand of at least one length. The nanoparticle cores are passivated and crosslinked using at least one crosslinking molecule of at least one length. The crosslinking molecule is a conductive crosslinker. Each nanoparticle core is covered with a shell, where the shell comprises PbSO3. The nanoparticle cores comprise PbS that is partially oxidized and substantially lacking in PbSO4 (lead sulfate).

In an embodiment, at least one optically sensitive layer comprises a nanocrystalline solid, wherein at least a portion of a surface of the nanocrystalline solid is oxidized.

In an embodiment, a composition of the nanocrystalline solid excludes a first set of native oxides and includes a second set of native oxides.

In an embodiment, the first set of native oxides includes PbSO4 (lead sulfate) and the second set of native oxides includes PbSO3.

In an embodiment, trap states of the nanocrystalline solid provide persistence, wherein an energy to escape from a predominant trap state is less than or equal to approximately 0.1 eV.

In an embodiment, a non-predominant trap state, wherein an energy to escape from the non-predominant trap state is greater than or equal to approximately 0.2 eV.

In an embodiment, a continuous transparent layer, the continuous transparent layer comprising substantially transparent material, wherein the continuous transparent layer at least partially covers the optically sensitive layer.

In an embodiment, an adhesion layer anchoring constituents of the optically sensitive layer to circuitry of the integrated circuit.

In an embodiment, the second optically sensitive layer comprises a wavelength-selective light-absorbing material, wherein the first optically sensitive layer comprises a photoconductive material.

In an embodiment, an array of curved optical elements that determine a distribution of intensity across the optically sensitive layers.

In an embodiment, at least one optically sensitive layer comprises substantially fused nanocrystal cores having a dark current density less than approximately 0.1 nA/cm2.

In an embodiment, a thickness of the second optically sensitive layer is less than a thickness of the first optically sensitive layer.

In an embodiment, the second optically sensitive layer is relatively completely absorbent of light in a first wavelength interval and relatively completely transmissive of light outside the first wavelength interval.

In an embodiment, the first optically sensitive layer is relatively completely absorbent of the light outside the first wavelength interval. The first wavelength interval corresponds to blue light. A second dark current of the second optically sensitive layer is less than a first dark current of the first optically sensitive layer.

In an embodiment, responsivities of each of the optically sensitive layers are approximately equal.

In an embodiment, the first optically sensitive layer comprises a first material having a first thickness, and the combination of the first material and the first thickness provides a first responsivity to light of a first wavelength, wherein the second optically sensitive layer comprises a second material having a second thickness, and the combination of the second material and the second thickness provides a second responsivity to light of a second wavelength, wherein the first responsivity and the second responsivity are approximately equal.

In an embodiment, the first optically sensitive layer comprises a first material having a first thickness, and the combination of the first material and the first thickness provides a first photoconductive gain to light of a first wavelength, wherein the second optically sensitive layer comprises a second material having a second thickness, and the combination of the second material and the second thickness provides a second photoconductive gain to light of a second wavelength, wherein the first photoconductive gain and the second photoconductive gain are approximately equal.

In an embodiment, the first optically sensitive layer comprises a first material having a first thickness, and the combination of the first material and the first thickness provides a first absorbance to light of a first wavelength, wherein the second optically sensitive layer comprises a second material having a second thickness, and the combination of the second material and the second thickness provides a second absorbance to light of a second wavelength, wherein the first absorbance and the second absorbance are approximately equal.

In an embodiment, gains of each of the optically sensitive layers are approximately equal. The persistence of each of the optically sensitive layers is approximately equal.

In an embodiment, a thickness of the first optically sensitive layer is less than a thickness of the second optically sensitive layer.

In an embodiment, the at least two optically sensitive layers includes a third optically sensitive layer, wherein the third optically sensitive layer is over at least a portion of the second optically sensitive, wherein a thickness of the third optically sensitive layer is less than a thickness of the first optically sensitive layer and the second optically sensitive layer.

In an embodiment, a thickness of the third optically sensitive layer is less than a thickness of the first optically sensitive layer and the second optically sensitive layer.

In an embodiment, a thickness of the second optically sensitive layer is less than a thickness of the first optically sensitive layer.

In an embodiment, the third optically sensitive layer is relatively completely absorbent of light in a first wavelength interval and relatively completely transmissive of light outside the first wavelength interval In an embodiment, the second optically sensitive layer is relatively completely absorbent of light in a second wavelength interval and relatively completely transmissive of light outside the second wavelength interval, wherein the second wavelength interval includes and is larger than the first wavelength interval.

In an embodiment, the first optically sensitive layer is relatively completely absorbent of light in a third wavelength interval, wherein the third wavelength interval includes and is larger than the second wavelength interval.

In an embodiment, a third dark current of the third optically sensitive layer is less than a second dark current of the second optically sensitive layer.

In an embodiment, a third dark current of the third optically sensitive layer is less than a first dark current of the first optically sensitive layer.

In an embodiment, a second dark current of the second optically sensitive layer is less than a first dark current of the first optically sensitive layer.

In an embodiment, at least two optically sensitive layers includes a fourth optically sensitive layer, wherein the fourth optically sensitive layer is over at least a portion of the third optically sensitive layer, wherein a thickness of the fourth optically sensitive layer is less than a thickness of one of the first optically sensitive layer, the second optically sensitive layer, and the third optically sensitive layer.

In an embodiment, a thickness of the fourth optically sensitive layer is less than a thickness of the third optically sensitive layer.

In an embodiment, a thickness of the third optically sensitive layer is less than a thickness of the second optically sensitive layer.

In an embodiment, a thickness of the second optically sensitive layer is less than a thickness of the first optically sensitive layer.

In an embodiment, the fourth optically sensitive layer is relatively completely absorbent of light in a first wavelength interval and relatively completely transmissive of light outside the first wavelength interval In an embodiment, the third optically sensitive layer is relatively completely absorbent of light in a third wavelength interval and relatively completely transmissive of light outside the third wavelength interval, wherein the third wavelength interval includes and is larger than the fourth wavelength interval.

In an embodiment, the second optically sensitive layer is relatively completely absorbent of light in a second wavelength interval, wherein the second wavelength interval includes and is larger than the third wavelength interval.

In an embodiment, the first optically sensitive layer is relatively completely absorbent of light in a first wavelength interval, wherein the first wavelength interval includes and is larger than the second wavelength interval.

In an embodiment, a fourth dark current of the fourth optically sensitive layer is less than at least one of a third dark current of the third optically sensitive layer, a second dark current of the second optically sensitive layer, and a first dark current of the first optically sensitive layer.

In an embodiment, a third dark current of the third optically sensitive layer is less than at least one of a fourth dark current of the fourth optically sensitive layer, a second dark current of the second optically sensitive layer, and a first dark current of the first optically sensitive layer.

In an embodiment, a second dark current of the second optically sensitive layer is less than at least one of a fourth dark current of the fourth optically sensitive layer, a third dark current of the third optically sensitive layer, and a first dark current of the first optically sensitive layer.

In an embodiment, a first dark current of the first optically sensitive layer is less than at least one of a fourth dark current of the fourth optically sensitive layer, a third dark current of the third optically sensitive layer, and a second dark current of the second optically sensitive layer.

In an embodiment, at least one of the optically sensitive layers comprises a unipolar photoconductive layer including a first carrier type and a second carrier type, wherein a first mobility of the first carrier type is higher than a second mobility of the second carrier type.

In an embodiment, the first carrier type is electrons and the second carrier type is holes.

In an embodiment, the first carrier type is holes and the second carrier type is electrons.

In an embodiment, each of the optically sensitive layers comprises a unipolar photoconductive layer including a first carrier type and a second carrier type, wherein a first mobility of the first carrier type is higher than a second mobility of the second carrier type.

In an embodiment, the first carrier type is electrons and the second carrier type is holes.

In an embodiment, the first carrier type is holes and the second carrier type is electrons.

In an embodiment, the first optically sensitive layer comprises a nanocrystal material having first photoconductive gain and the second optically sensitive layer comprises a nanocrystal material having a second photoconductive gain.

In an embodiment, at least one of the optically sensitive layers comprises a nanocrystal material having photoconductive gain and a responsivity of at least approximately 0.4 amps/volt (A/V).

In an embodiment, the responsivity is achieved when a bias is applied between the respective first electrode and the respective second electrode, wherein the bias is approximately in a range of 1 volt to 5 volts. In an embodiment, the bias is approximately 0.5 volts, 1 volt, 1.2 volts, or 1.5 volts.

In an embodiment, the first optically sensitive layer comprises a nanocrystal material having first photoconductive gain and a first responsivity approximately in a range of 0.4 A/V to 100 A/V.

In an embodiment, the second optically sensitive layer comprises a nanocrystal material having a second photoconductive gain and a second responsivity approximately in a range of 0.4 A/V to 100 A/V.

In an embodiment, the second photoconductive gain is greater than the first photoconductive gain.

In an embodiment, at least one of the optically sensitive layers comprises nanocrystals of a material having a bulk bandgap, and wherein the nanocrystals are quantum confined to have an effective bandgap more than twice the bulk bandgap.

In an embodiment, at least one of the optically sensitive layers includes nanocrystals comprising nanoparticles, wherein a nanoparticle diameter of the nanoparticles is less than a Bohr exciton radius of bound electron-hole pairs within the nanoparticle.

In an embodiment, a first diameter of nanocrystals of the first optically sensitive layer is greater than a second diameter of nanocrystals of the second optically sensitive layer.

In an embodiment, a first diameter of nanocrystals of the first optically sensitive layer is less than a second diameter of nanocrystals of the second optically sensitive layer.

In an embodiment, at least one of the optically sensitive layers comprises nanocrystals of a material having a bulk bandgap of less than approximately 0.5 electron volts (eV), and wherein the nanocrystals are quantum confined to have a bandgap more than 1.0 eV.

In an embodiment, at least one of the optically sensitive layers comprises nanocrystals quantum confined to a bandgap corresponding to 490 nm wavelength and approximately 2.5 eV.

In an embodiment, at least one of the optically sensitive layers comprises nanocrystals quantum confined to a bandgap corresponding to 560 nm wavelength and approximately 2.2 eV.

In an embodiment, at least one of the optically sensitive layers comprises nanocrystals quantum confined to a bandgap corresponding to 700 nm wavelength and approximately 1.8 eV.

In an embodiment, at least one of the optically sensitive layers comprises nanocrystals quantum confined to a bandgap corresponding to 1000 nm wavelength and approximately 1.2 eV.

In an embodiment, at least one of the optically sensitive layers comprises nanocrystals quantum confined to a bandgap corresponding to 1400 nm wavelength and approximately 0.9 eV.

In an embodiment, at least one of the optically sensitive layers comprises nanocrystals quantum confined to a bandgap corresponding to 1700 nm wavelength and approximately 0.7 eV.

In an embodiment, at least one of the optically sensitive layers comprises nanocrystals of a material having a bulk bandgap approximately in a spectral range of 700 nanometer (nm) wavelength to 10 micrometer (um) wavelength, and wherein the nanocrystals are quantum confined to have a bandgap approximately in a spectral range of 400 nm to 700 nm.

In an embodiment, at least one of the optically sensitive layers comprises quantum confined nanocrystals having a diameter of less than approximately 1.5 nm.

In an embodiment, each of the optically sensitive layers comprises nanocrystals of a material having a bulk bandgap of less than 0.5 eV, and wherein the nanocrystals in the first optically sensitive layer are quantum confined to have a bandgap of approximately 2.2 eV and the nanocrystals in the second optically sensitive layer are quantum confined to have a bandgap of more than approximately 2.5 eV.

In an embodiment, each of the optically sensitive layers comprises nanocrystals of a material having a bulk bandgap of less than approximately 0.5 eV.

In an embodiment, the nanocrystals of the second optically sensitive layer are quantum confined to a bandgap corresponding to 490 nm wavelength.

In an embodiment, the nanocrystals of the second optically sensitive layer are quantum confined to a bandgap of approximately 2.5 eV.

In an embodiment, the nanocrystals of the first optically sensitive layer are quantum confined to a bandgap corresponding to 560 nm wavelength.

In an embodiment, the nanocrystals of the first optically sensitive layer are quantum confined to a bandgap of approximately 2.2 eV.

In an embodiment, a photoconductive component in the integrated circuit, wherein the photoconductive component is optically sensitive in a spectral range of 700 nm to 10 um wavelength.

In an embodiment, the at least two optically sensitive layers include a third optically sensitive layer.

In an embodiment, the third optically sensitive layer is on the integrated circuit.

In an embodiment, the third optically sensitive layer is integrated with the integrated circuit.

In an embodiment, each of the optically sensitive layers comprises nanocrystals of a material having a bulk bandgap of less than 0.5 eV.

In an embodiment, the nanocrystals in the first optically sensitive layer are quantum confined to have a bandgap of approximately 2.2 eV and the nanocrystals in the second optically sensitive layer are quantum confined to have a bandgap of more than approximately 2.5 eV.

In an embodiment, the third optically sensitive layer senses light approximately in a spectral range of 700 nm to 10 um wavelength and the nanocrystals in the third optically sensitive layer are quantum confined to have a bandgap of more than approximately 1.8 eV.

In an embodiment, the third optically sensitive layer is a silicon photodiode.

In an embodiment, the at least two optically sensitive layers includes a third optically sensitive layer, wherein the third optically sensitive layer is over at least a portion of the second optically sensitive layer.

In an embodiment, each of the optically sensitive layers comprises nanocrystals of a material having a bulk bandgap of less than 0.5 eV, and wherein the nanocrystals in the first optically sensitive layer are quantum confined to have a bandgap of approximately 1.8 eV, the nanocrystals in the second optically sensitive layer are quantum confined to have a bandgap of approximately 2.2 eV, and the nanocrystals in the third optically sensitive layer are quantum confined to have a bandgap of more than approximately 2.5 eV.

In an embodiment, each of the optically sensitive layers comprises nanocrystals of a material having a bulk bandgap of less than approximately 0.5 eV.

In an embodiment, the nanocrystals of the third optically sensitive layer are quantum confined to a bandgap corresponding to 490 nm wavelength.

In an embodiment, the nanocrystals of the third optically sensitive layer are quantum confined to a bandgap of approximately 2.5 eV.

In an embodiment, the nanocrystals of the second optically sensitive layer are quantum confined to a bandgap corresponding to 560 nm wavelength.

In an embodiment, nanocrystals of the second optically sensitive layer are quantum confined to a bandgap of approximately 2.2 eV.

In an embodiment, the nanocrystals of the first optically sensitive layer are quantum confined to a bandgap of approximately 1.8 eV, or 1.2 eV, or 0.9 eV, or 0.7 eV.

In an embodiment, the nanocrystals of the first optically sensitive layer are quantum confined to a bandgap corresponding to 650, or 700, or 800, or 900, or 1000, or 1300, or 1650 nm wavelength.

In an embodiment, the nanocrystals of the first optically sensitive layer are quantum confined to a bandgap corresponding to 3 um or 5 um wavelength.

In an embodiment, the at least two optically sensitive layers includes a third optically sensitive layer and a fourth optically sensitive layer, wherein the third optically sensitive layer is over at least a portion of the second optically sensitive layer and the fourth optically sensitive layer is over at least a portion of the third optically sensitive layer.

In an embodiment, each of the optically sensitive layers comprises nanocrystals of a material having a bulk bandgap of less than 0.5 eV, and wherein the nanocrystals in the first optically sensitive layer are quantum confined to have a bandgap corresponding to approximately 800 nm wavelength, the nanocrystals in the second optically sensitive layer are quantum confined to have a bandgap corresponding to approximately 630 nm wavelength, the nanocrystals in the third optically sensitive layer are quantum confined to have a bandgap corresponding to approximately 560 nm wavelength, and the nanocrystals in the fourth optically sensitive layer are quantum confined to have a bandgap corresponding to approximately 490 nm wavelength.

In an embodiment, each of the optically sensitive layers comprises nanocrystals of a material having a bulk bandgap of less than approximately 0.5 eV.

In an embodiment, the nanocrystals of the fourth optically sensitive layer are quantum confined to a bandgap corresponding to 490 nm wavelength.

In an embodiment, the nanocrystals of the fourth optically sensitive layer are quantum confined to a bandgap of approximately 2.5 eV.

In an embodiment, the nanocrystals of the third optically sensitive layer are quantum confined to a bandgap corresponding to 560 nm wavelength.

In an embodiment, the nanocrystals of the third optically sensitive layer are quantum confined to a bandgap of approximately 2.2 eV.

In an embodiment, the nanocrystals of the second optically sensitive layer are quantum confined to a bandgap corresponding to 630, or 650, or 670, or 700 nm wavelength.

In an embodiment, the nanocrystals of the second optically sensitive layer are quantum confined to a bandgap of approximately 1.8 eV.

In an embodiment, the nanocrystals of the first optically sensitive layer are quantum confined to a bandgap corresponding to 800, or 900, or 1000, or 1300, or 1650 nm wavelength.

In an embodiment, the nanocrystals of the first optically sensitive layer are quantum confined to a bandgap corresponding to 3 um or 5 um wavelength.

In an embodiment, the nanocrystals of the first optically sensitive layer are quantum confined to a bandgap of approximately 1.2 eV, 0.9 eV, or 0.7 eV.

In an embodiment, each of the optically sensitive layers comprises nanocrystals of the same material.

In an embodiment, at least one of the optically sensitive layers comprises monodisperse nanocrystals.

In an embodiment, the nanocrystals are colloidal quantum dots.

In an embodiment, the quantum dots include a first carrier type and a second carrier type, wherein the first carrier type is a flowing carrier and the second carrier type is one of a substantially blocked carrier and a trapped carrier.

In an embodiment, the colloidal quantum dots include organic ligands, wherein a flow of at least one of the first carrier type and the second carrier type is related to the organic ligands.

In an embodiment, each of the optically sensitive layers comprises nanocrystals of different materials, wherein the first optically sensitive layer includes a first material having a first bulk bandgap and the second optically sensitive layer includes a second material having a second bulk bandgap.

In an embodiment, the first material comprises nanoparticles having a first diameter and the second material comprises nanoparticles having a second diameter.

In an embodiment, the first diameter is greater than or less than the second diameter.

In an embodiment, the first bulk bandgap is higher than the second bulk bandgap.

In an embodiment, the first optically sensitive layer comprises a composition including lead sulfide (PbS), or lead selenide (PbSe), or lead tellurium (PbTe), or indium phosphide (InP), or indium arsenide (InAs), or germanium (Ge).

In an embodiment, the second optically sensitive layer comprises a composition including indium sulfide ($In_2S_3$), or indium selenide ($In_2Se_3$), or indium tellurium ($In_2Te_3$), or bismuth sulfide ($Bi_2S_3$), or bismuth selenide ($Bi_2Se_3$), or bismuth tellurium ($Bi_2Te_3$), or indium phosphide (InP), or silicon (Si), or germanium (Ge), or gallium arsenide (GaAs).

In an embodiment, the first optically sensitive layer comprises a first composition including one of lead sulfide (PbS), lead selenide (PbSe), lead tellurium sulfide (PbTe), indium phosphide (InP), indium arsenide (InAs), and germanium (Ge), and the second optically sensitive layer comprises a second composition including one of indium sulfide ($In_2S_3$), indium selenide ($In_2Se_3$), indium tellurium ($In_2Te_3$), bismuth sulfide ($Bi_2S_3$), bismuth selenide ($Bi_2Se_3$), bismuth tellurium ($Bi_2Te_3$), indium phosphide (InP), silicon (Si), and germanium (Ge).

In an embodiment, each of the optically sensitive layers comprises different compound semiconductor nanocrystals, wherein the first optically sensitive layer comprises a composition including lead and the second optically sensitive layer comprises a composition including one of indium and bismuth.

In an embodiment, each of the optically sensitive layers comprises different compound semiconductor nanocrystals, wherein the second optically sensitive layer comprises a composition including cadmium selenide (CdSe).

In an embodiment, the first optically sensitive layer comprises a composition including lead sulfide (PbS), or lead selenide (PbSe), or indium phosphide (InP), or germanium (Ge).

In an embodiment, each of the optically sensitive layers comprises different compound semiconductor nanocrystals, wherein the first optically sensitive layer comprises a composition including one of lead sulfide (PbS), lead selenide (PbSe), indium phosphide (InP), and germanium (Ge), wherein the second optically sensitive layer comprises a composition including cadmium selenide (CdSe).

In an embodiment, each of the optically sensitive layers comprises nanocrystals of a different particle size.

In an embodiment, nanocrystal particles of the first optically sensitive layer are larger than nanocrystal particles of the second optically sensitive layer.

In an embodiment, nanocrystal particles of the first optically sensitive layer are smaller than nanocrystal particles of the second optically sensitive layer.

In an embodiment, a first bulk bandgap of the first optically sensitive layer is higher than a second bulk bandgap of the second optically sensitive layer.

In an embodiment, a first increase in bandgap due to quantum confinement in the first optically sensitive layer is greater than a second increase in bandgap due to quantum confinement in the second optically sensitive layer.

In an embodiment, the first optically sensitive layer comprises a composition including lead sulfide (PbS), or lead selenide (PbSe), or tellurium sulfide (TeS), or indium phosphide (InP), or indium arsenide (InAs), or germanium (Ge).

In an embodiment, the second optically sensitive layer comprises a composition including indium sulfide ($In_2S_3$), or indium selenide ($In_2Se_3$), or indium tellurium ($In_2Te_3$), or bismuth sulfide ($Bi_2S_3$), or bismuth selenide ($Bi_2Se_3$), or bismuth tellurium ($Bi_2Te_3$), or indium phosphide (InP), or silicon (Si), or germanium (Ge), or gallium arsenide (GaAs).

In an embodiment, the first optically sensitive layer comprises a first composition including one of lead sulfide (PbS), lead selenide (PbSe), lead tellurium sulfide (PbTe), indium phosphide (InP), indium arsenide (InAs), and germanium (Ge), and the second optically sensitive layer comprises a second composition including one of indium sulfide ($In_{253}$), indium selenide ($In_2Se_3$), indium tellurium ($In_2Te_3$), bismuth sulfide ($Bi_2S_3$), bismuth selenide ($Bi_2Se_3$), bismuth tellurium ($Bi_2Te_3$), indium phosphide (InP), silicon (Si), and germanium (Ge).

In an embodiment, the second optically sensitive layer comprises a nanocrystal material having an absorption onset at approximately 490 nm wavelength and the first optically sensitive layer comprises a nanocrystal material having an absorption onset of less than approximately 560 nm wavelength, wherein a local absorption maximum is absent from an absorption spectrum of at least one of the first optically sensitive layer and the second optically sensitive layer.

In an embodiment, the second optically sensitive layer comprises a nanocrystal material absorptive to at least visible blue light and transmissive to visible red light, and the first optically sensitive layer comprises a nanocrystal material absorptive to at least visible red light, visible green light and visible blue light.

In an embodiment, the at least two optically sensitive layers includes a third optically sensitive layer, wherein the third optically sensitive layer is over at least a portion of the second optically sensitive layer, wherein a local absorption maximum is absent from an absorption spectrum of at least one of the first optically sensitive layer, the second optically sensitive layer, and the third optically sensitive layer.

In an embodiment, the third optically sensitive layer comprises a nanocrystal material having an absorption onset at approximately 490 nm wavelength and the second optically sensitive layer comprises a nanocrystal material having an absorption onset of less than approximately 560 nm wavelength.

In an embodiment, the first optically sensitive layer comprises a nanocrystal material having an absorption onset at approximately 650, or 700, or 750, or 800, or 900, or 1000, or 1300, or 1650 nm wavelength.

In an embodiment, the first optically sensitive layer comprises a nanocrystal material having an absorption onset at approximately 3 um or 5 um wavelength.

In an embodiment, the third optically sensitive layer comprises a nanocrystal material absorptive to at least visible blue light and transmissive to visible green light, visible red light, and infrared light, the second optically sensitive layer comprises a nanocrystal material absorptive to at least visible blue light and visible green light and transmissive to visible red light and infrared light, and the first optically sensitive layer comprises a nanocrystal material absorptive to at least visible blue light, visible green light, and visible red light.

In an embodiment, the first optically sensitive layer is absorptive to infrared light. The embodiment further comprising a fourth optically sensitive layer over at least a portion of the third optically sensitive layer In an embodiment, a local absorption maximum is absent from an absorption spectrum of at least one of the first optically sensitive layer, the second optically sensitive layer, the third optically sensitive layer, and the fourth optically sensitive layer.

In an embodiment, the fourth optically sensitive layer comprises a nanocrystal material having an absorption onset at approximately 490 nm wavelength.

In an embodiment, the third optically sensitive layer comprises a nanocrystal material having an absorption onset of less than approximately 560 nm wavelength.

In an embodiment, the second optically sensitive layer comprises a nanocrystal material having an absorption onset at approximately 630 nm, or 650 nm, or 670, or 700 nm wavelength.

In an embodiment, the first optically sensitive layer comprises a nanocrystal material having an absorption onset at approximately 800 nm, or 900 nm, or 1000 nm, or 1300, or 1650 nm wavelength.

In an embodiment, the first optically sensitive layer comprises a nanocrystal material having an absorption onset at approximately 3 um or 5 um wavelength.

In an embodiment, the fourth optically sensitive layer comprises a nanocrystal material absorptive to at least visible blue light and transmissive to visible green light, visible red light, and infrared light.

In an embodiment, the third optically sensitive layer comprises a nanocrystal material absorptive to at least visible blue light and visible green light and transmissive to visible red light and infrared light.

In an embodiment, the second optically sensitive layer comprises a nanocrystal material absorptive to at least visible blue light, visible green light, and visible red light.

In an embodiment, the first optically sensitive layer comprises a nanocrystal material absorptive to at least visible blue light, visible green light, visible red light and infrared light.

In an embodiment, a third optically sensitive layer, the third optically sensitive layer comprising a doped silicon region on a substrate of the integrated circuit, the third optically sensitive layer positioned below the first optically sensitive layer and the second optically sensitive layer.

In an embodiment, a third optically sensitive layer, the third optically sensitive layer comprising a doped silicon region integrated with a substrate of the integrated circuit, the third optically sensitive layer positioned below the first optically sensitive layer and the second optically sensitive layer.

In an embodiment, a rate of the current flow through an optically sensitive material of at least one optically sensitive layer has a non-linear relationship with intensity of the light absorbed by the optically sensitive material.

In an embodiment, gain of an optically sensitive material of at least one optically sensitive layer has a non-linear relationship with intensity of the light absorbed by the optically sensitive material.

Embodiments are directed to a photodetector wherein the bias comprises:

biasing the optically sensitive layers to operate as a current sink during a first period of time; and biasing the optically sensitive material to operate as a current source during a second period of time.

In an embodiment, the first period of time is an integration period during which a voltage is established based on the current flow through the optically sensitive material.

In an embodiment, the second period of time is a period of time during which a reset is applied to the optically sensitive material, the reset including resetting a voltage difference across the optically sensitive material.

In an embodiment, the optically sensitive layers comprise a non-rectifying optically sensitive device.

In an embodiment, the integrated circuit comprises for each pixel region a charge store and an integration circuit to establish a voltage based on intensity of light absorbed by the optically sensitive layers over an integration period of time.

In an embodiment, the integrated circuit includes at least one transistor in electrical communication with the respective first electrode, wherein the charge store comprises parasitic capacitance of the at least one transistor.

In an embodiment, the integrated circuit includes a source follower transistor having a gate in electrical communication with the respective first electrode.

In an embodiment, the parasitic capacitance comprises a parasitic capacitance between the gate and a source of the source follower transistor.

In an embodiment, the integrated circuit includes a reset transistor having a gate in electrical communication with the respective first electrode.

In an embodiment, the parasitic capacitance comprises a parasitic capacitance between a source and structures of a substrate of the reset transistor.

In an embodiment, the parasitic capacitance comprises metal-to-metal parasitic capacitance between nodes of the pixel circuit.

In an embodiment, the parasitic capacitance comprises metal-to-substrate parasitic capacitance between the charge store node and a silicon substrate.

In an embodiment, the parasitic capacitance is approximately in a range of 0.5 to 3 Femto Farads, or approximately in a range of 1 to 2 Femto Farads.

In an embodiment, charge stored at the charge store is discharged by a flow of current through the optically sensitive layers during the integration period of time.

In an embodiment, the photodetector comprises at least one color filter. It also comprises conversion circuitry.

In an embodiment, the integrated circuit includes the conversion circuitry, the conversion circuitry located under the at least two optically sensitive layers.

In an embodiment, the conversion circuitry is coupled to the integrated circuit.

In an embodiment, the conversion circuitry converts the signals from a first type to a second type.

In an embodiment, the conversion circuitry converts the signals from analog signals to digital signals.

In an embodiment, the conversion circuitry converts the signals from digital signals to analog signals.

In an embodiment, the photodetector further comprises compensation circuitry.

In an embodiment, the compensation circuitry is coupled to the integrated circuit.

In an embodiment, the integrated circuit includes the compensation circuitry, the compensation circuitry located under the at least two optically sensitive layers.

In an embodiment, the compensation circuitry adjusts the signal to compensate for different properties among the optically sensitive layers.

In an embodiment, the compensation circuitry at least partially compensates for nonlinearity of signals output from the optically sensitive layers.

In an embodiment, the compensation circuitry at least partially linearizes digital data derived from the signals.

In an embodiment, the compensation circuitry at least partially linearizes the signals using a polynomial function.

In an embodiment, the compensation circuitry at least partially linearizes the signals using piecewise linear inversion of a relationship between intensity of the light and electrical properties of at least one optically sensitive layer.

In an embodiment, the compensation circuitry at least partially compensates for variance in a rate of current flow in at least one optically sensitive layer over an integration period for a constant intensity of light.

In an embodiment, the compensation circuitry at least partially compensates for variance in a rate of current flow in at least one optically sensitive layer over an integration period for differing intensities of light.

In an embodiment, the compensation circuitry at least partially compensates for variance in gain in at least one optically sensitive layer over an integration period for a constant intensity of light.

In an embodiment, the compensation circuitry at least partially compensates for variance in gain in at least one optically sensitive layer over an integration period for differing intensities of light.

In an embodiment, the compensation circuitry: at least partially compensates for nonlinearity of signals output from the optically sensitive layers; and at least partially compensates for a difference between dark currents of signals output from the optically sensitive layers. The compensation circuitry includes a read out circuit and demosaicing algorithm that outputs a corrected color matrix based on analog quantities read out from the respective optically sensitive layers.

In an embodiment, the corrected color matrix includes a red, green, blue (RGB) matrix.

In an embodiment, the compensation circuitry compensates for transmission leakage between layers.

In an embodiment, the compensation circuitry includes image circuitry to generate image data.

In an embodiment, the first optically sensitive layer comprises a nanocrystal material having first photoconductive gain and the second optically sensitive layer comprises a nanocrystal material having a second photoconductive gain, the image circuitry compensating for a difference between the first photoconductive gain and the second photoconductive gain.

In an embodiment, the compensation circuitry applies black level correction that compensates for a difference between dark currents among the at least two optically sensitive layers by applying a plurality of dark current compensations to the signal.

In an embodiment, the compensation circuitry applies a first dark current compensation to a first signal from the first optically sensitive layer and a second dark current compensation to a second signal from the second optically sensitive layer.

In an embodiment, the first dark current compensation is different from the second dark current compensation. The photodetector comprises at least one black pixel. The at least one black pixel comprises at least two optically sensitive opaque layers, a first optically sensitive opaque layer and a second optically sensitive opaque layer, the first optically sensitive opaque layer and the second optically sensitive opaque layer each comprising an optically sensitive layer covered with an opaque material, the first optically sensitive opaque layer over at least a portion of a black pixel integrated circuit and the second optically sensitive opaque layer over the first optically sensitive opaque layer, wherein each optically sensitive opaque layer is interposed between a respective first electrode of the black pixel and a respective second electrode of the black pixel, wherein the integrated circuit selectively applies a bias to the respective first and second electrodes of the black pixel and reads a dark current signal from the optically sensitive opaque layers, wherein the dark current signal is related to the number of photons received by the respective optically sensitive opaque layer.

In an embodiment, the black pixel generates a dark current.

In an embodiment, the dark current density is approximately in a range of 10 nanoamps (nA)/square centimeter (cm) to 500 nA/square cm.

In an embodiment, the dark current compensations include subtracting the dark current from the signals of the optically sensitive layers in different proportions.

In an embodiment, the dark current compensations include subtracting a first portion of the dark current from a first signal of the second optically sensitive layer and subtracting a second portion of the dark current from a second signal of the second optically sensitive layer.

In an embodiment, the first portion is larger than the second portion.

In an embodiment, the at least one black pixel comprises a first black pixel corresponding to the first optically sensitive layer and a second black pixel corresponding to the second optically sensitive layer.

In an embodiment, the first black pixel generates a first dark current and the second black pixel that generates a second dark current.

In an embodiment, the dark current compensation includes subtracting the first dark current from a first signal of the first optically sensitive layer and subtracting the second dark current from a second signal of the second optically sensitive layer.

In an embodiment, the at least one black pixel comprises a plurality of black pixels generating a plurality of dark currents, wherein the compensation circuitry generates the plurality of dark current compensations from the plurality of dark currents.

In an embodiment, responsivities of each of the optically sensitive layers are approximately equal when a thickness of the second optically sensitive layer is less than a thickness of the first optically sensitive layer.

In an embodiment, a photodetector comprises bandgap reference circuitry, the bandgap reference circuitry at least one of integrated in the integrated circuit and coupled to the integrated circuit.

In an embodiment, the black level correction is based on temperature monitoring by tracking a voltage from the bandgap reference circuitry.

In an embodiment, a fill factor is at least 80 percent, wherein the fill factor is a ratio of absorbing area of each photodetector to a total area of the photodetector.

In an embodiment, the fill factor is approximately in a range of 80 percent to 100 percent.

In an embodiment, the respective second electrode for the first optically sensitive layer and the second optically sensitive layer comprises a mesh between at least two adjacent photodetectors of the plurality of photodetectors.

In an embodiment, each photodetector comprises the first respective electrode, wherein the respective second electrode for the first optically sensitive layer and the second optically sensitive layer of each photodetector of the plurality of photodetectors comprises a common electrode disposed around the respective first electrode, wherein the common electrode forms a mesh interposed between the plurality of photodetectors and is a common electrode for each optically sensitive layer in the plurality of photodetectors.

What is claimed is:

1. A method comprising:

providing an optically sensitive material;

causing a current to flow through the optically sensitive material during an integration period of time by providing a voltage difference across the optically sensitive material and exposing the optically sensitive material to light, wherein the rate of the current flow through the optically sensitive material depends upon the voltage difference across the optically sensitive material and intensity of the light absorbed by the optically sensitive material;

using the current flow through the optically sensitive material to discharge a portion of charge from a charge store during the integration period of time;

varying both the voltage difference across the optically sensitive material and the rate of the current flow through the optically sensitive material during at least a portion of the integration period; and generating a signal based on the amount of charge remaining in the charge store after the integration period of time.

2. A photodetector comprising:

a pixel region comprising an optically sensitive material;

pixel circuitry electrically coupled to the optically sensitive material, the pixel circuitry causing a current to flow through the optically sensitive material during an integration period of time by providing a voltage difference across the optically sensitive material when the optically sensitive material is exposed to light, wherein the rate of the current flow through the optically sensitive material depends upon the voltage difference across the optically sensitive material and intensity of the light absorbed by the optically sensitive material, wherein the current flow through the optically sensitive material discharges a portion of charge from a charge store during the integration period of time, wherein both the voltage difference across the optically sensitive material and the rate of the current flow through the optically sensitive material vary during at least a portion of the integration period while the intensity of the light is substantially constant; and read out circuitry generating a signal based on the amount of charge remaining in the charge store after the integration period of time.

* * * * *